US012765431B2

(12) United States Patent
Lin et al.

(10) Patent No.: US 12,765,431 B2
(45) Date of Patent: Oct. 13, 2026

(54) 3D CHIP PACKAGE BASED ON THROUGH-SILICON-VIA INTERCONNECTION ELEVATOR

(71) Applicant: iCometrue Company Ltd., Zhubei City (TW)

(72) Inventors: Mou-Shiung Lin, Hsinchu City (TW); Jin-Yuan Lee, Hsinchu City (TW)

(73) Assignee: iCometrue Company Ltd., Hsinchu County (TW)

( * ) Notice: Subject to any disclaimer, the term of this patent is extended or adjusted under 35 U.S.C. 154(b) by 0 days.

(21) Appl. No.: 18/129,840

(22) Filed: Apr. 1, 2023

(65) Prior Publication Data

US 2023/0343689 A1 Oct. 26, 2023

Related U.S. Application Data

(63) Continuation of application No. 17/026,186, filed on Sep. 19, 2020, now Pat. No. 11,637,056.

(Continued)

(51) Int. Cl.
*H10W 90/00* (2026.01)
*H10W 70/09* (2026.01)
(Continued)

(52) U.S. Cl.
CPC ......... *H10W 90/401* (2026.01); *H10W 70/09* (2026.01); *H10W 70/60* (2026.01);
(Continued)

(58) Field of Classification Search
CPC ............... H01L 25/065; H01L 25/0652; H01L 25/0655; H01L 25/0657; H01L 24/18–25;
(Continued)

(56) References Cited

U.S. PATENT DOCUMENTS 4,870,302 A 9/1989 Freeman
5,272,368 A 12/1993 Turner et al.
(Continued)

FOREIGN PATENT DOCUMENTS

CN 103681367 3/2014
CN 104078453 10/2014
(Continued)

*Primary Examiner* — William Henry Anderson
(74) *Attorney, Agent, or Firm* — Min-Lee Teng

(57) ABSTRACT

A chip package includes a first interconnection scheme; a plurality of first metal contacts under and on the first interconnection scheme and at a bottom surface of the chip package; a first semiconductor IC chip over the first interconnection scheme; a first connector over the first interconnection scheme and at a same horizontal level as the first semiconductor IC chip, wherein the first connector comprises a first substrate and a plurality of first through vias vertically extending through the first substrate of the first connector; a first polymer layer over the first interconnection scheme, wherein the first polymer layer has a top surface coplanar with a top surface of the first semiconductor IC chip, a top surface of the first substrate of the first connector and a top surface of each of the plurality of first through vias; and a second interconnection scheme on the top surface of the first polymer layer, the top surface of the first semiconductor IC chip, the top surface of the first connector and the top surface of each of the plurality of first through vias, wherein the second interconnection scheme comprises a plurality of second metal contacts at a top surface of the chip package.

44 Claims, 91 Drawing Sheets

Related U.S. Application Data

(60) Provisional application No. 63/023,235, filed on May 11, 2020, provisional application No. 63/012,072, filed on Apr. 17, 2020, provisional application No. 62/983,634, filed on Feb. 29, 2020, provisional application No. 62/964,627, filed on Jan. 22, 2020, provisional application No. 62/903,655, filed on Sep. 20, 2019.

(51) Int. Cl.
*H10W 70/60* (2026.01)
*H10W 70/66* (2026.01)

(52) U.S. Cl.
CPC ........... *H10W 70/66* (2026.01); *H10W 90/00* (2026.01); *H10W 90/701* (2026.01)

(58) Field of Classification Search
CPC ..... H01L 24/82; H01L 2224/18–22505; H01L 2224/24151–24155; H01L 2224/24221–24226; H01L 2224/24246; H01L 21/4857; H01L 23/49822; H01L 23/522; H01L 23/5226; H01L 23/528; H01L 23/5283; H01L 23/5383–5384; H01L 2224/02335; H01L 2924/1517–152; H01L 23/5381; H05K 3/4644
See application file for complete search history.

(56) References Cited

U.S. PATENT DOCUMENTS

| | | | |
|---|---|---|---|
| 5,587,603 | A | 12/1996 | Kowshik |
| 5,592,102 | A | 1/1997 | Lane et al. |
| 5,689,195 | A | 11/1997 | Cliff et al. |
| 5,796,662 | A | 8/1998 | Kalter et al. |
| 6,020,633 | A | 2/2000 | Erikson |
| 6,034,542 | A | 3/2000 | Ridgeway |
| 6,167,558 | A | 12/2000 | Trimberger |
| 6,356,478 | B1 | 3/2002 | McCollum |
| 6,388,466 | B1 | 5/2002 | Wittig et al. |
| 6,404,226 | B1 | 6/2002 | Schadt |
| 6,687,167 | B2 | 2/2004 | Guaitini et al. |
| 6,798,240 | B1 | 9/2004 | Pedersen |
| 6,812,086 | B2 | 11/2004 | Murthy et al. |
| 6,828,823 | B1 | 12/2004 | Tsui |
| 6,943,580 | B2 | 9/2005 | Lewis et al. |
| 6,952,114 | B2 | 10/2005 | Turner |
| 6,998,872 | B1 | 2/2006 | Chirania et al. |
| 7,030,652 | B1 | 4/2006 | Lewis et al. |
| 7,061,271 | B1 | 6/2006 | Young et al. |
| 7,126,214 | B2 | 10/2006 | Huppenthal et al. |
| 7,190,190 | B1 | 3/2007 | Camarota et al. |
| 7,193,433 | B1 | 3/2007 | Young |
| 7,219,237 | B1 | 5/2007 | Trimberger |
| 7,366,306 | B1 | 4/2008 | Trimberger |
| 7,385,417 | B1 | 6/2008 | Agrawal et al. |
| 7,420,390 | B1 | 9/2008 | Hutton et al. |
| 7,477,073 | B1 | 1/2009 | Tuan et al. |
| 7,511,299 | B1 | 3/2009 | Alexander et al. |
| 7,550,994 | B1 | 6/2009 | Camarota |
| 7,579,681 | B2 | 8/2009 | Chia et al. |
| 7,598,555 | B1 | 10/2009 | Papworth Parkin |
| 7,653,891 | B1 | 1/2010 | Anderson et al. |
| 7,747,025 | B1 | 6/2010 | Trimberger |
| 7,853,799 | B1 | 12/2010 | Trimberger |
| 7,933,140 | B2 | 4/2011 | Wang et al. |
| 7,944,231 | B2 | 5/2011 | Javerliac |
| 7,948,266 | B2 | 5/2011 | Schmit et al. |
| 7,973,556 | B1 | 7/2011 | Noguera Serra et al. |
| 7,977,783 | B1 | 7/2011 | Park et al. |
| 8,064,224 | B2 | 11/2011 | Mahajan et al. |
| 8,081,079 | B1 | 12/2011 | Camarota |
| 8,159,268 | B1 | 4/2012 | Madurawe |
| 8,243,527 | B2 | 8/2012 | Hung et al. |
| 8,354,297 | B2 | 1/2013 | Pagaila et al. |
| 8,378,407 | B2 | 2/2013 | Audzeyeu et al. |
| 8,531,032 | B2 | 9/2013 | Yu et al. |
| 8,546,955 | B1 | 10/2013 | Wu |
| 8,592,886 | B2 | 11/2013 | Hsu et al. |
| 8,709,865 | B2 | 4/2014 | Hu et al. |
| 8,742,579 | B2 | 6/2014 | Pagaila et al. |
| 8,786,060 | B2 | 7/2014 | Yen et al. |
| 8,796,137 | B2 | 8/2014 | Pagaila et al. |
| 8,855,452 | B2 | 10/2014 | Andry et al. |
| 8,866,292 | B2 | 10/2014 | Beer et al. |
| 8,872,349 | B2 | 10/2014 | Chiu et al. |
| 8,878,360 | B2 | 11/2014 | Meyer et al. |
| 8,883,561 | B2 | 11/2014 | Park et al. |
| 8,885,334 | B1 | 11/2014 | Baxter |
| 8,895,440 | B2 | 11/2014 | Choi et al. |
| 8,912,822 | B2 | 12/2014 | Yasuda |
| 8,916,421 | B2 | 12/2014 | Gong et al. |
| 8,941,230 | B2 | 1/2015 | Kyozuka et al. |
| 8,952,489 | B2 | 2/2015 | Elian et al. |
| 8,952,521 | B2 | 2/2015 | Wojnowski et al. |
| 8,987,918 | B2 | 3/2015 | Razdan et al. |
| 8,993,377 | B2 | 3/2015 | Koo et al. |
| 9,003,221 | B1 | 4/2015 | Abugharbieh et al. |
| 9,082,806 | B2 | 7/2015 | Lin et al. |
| 9,106,229 | B1 | 8/2015 | Hutton |
| 9,135,185 | B2 | 9/2015 | Loh et al. |
| 9,147,638 | B2 | 9/2015 | Liu et al. |
| 9,224,647 | B2 | 12/2015 | Koo et al. |
| 9,225,512 | B1 | 12/2015 | Trimberger |
| 9,252,127 | B1 | 2/2016 | Shen et al. |
| 9,263,370 | B2 | 2/2016 | Shenoy et al. |
| 9,281,254 | B2 | 3/2016 | Yu et al. |
| 9,281,292 | B2 | 3/2016 | Hu et al. |
| 9,324,672 | B2 | 4/2016 | Pagaila et al. |
| 9,331,060 | B2 | 5/2016 | Otremba et al. |
| 9,331,062 | B1 | 5/2016 | Lane et al. |
| 9,343,442 | B2 | 5/2016 | Chen et al. |
| 9,349,703 | B2 | 5/2016 | Chiu et al. |
| 9,349,713 | B2 | 5/2016 | Kim et al. |
| 9,362,187 | B2 | 6/2016 | Ossimitz |
| 9,368,458 | B2 | 6/2016 | Wu et al. |
| 9,385,006 | B2 | 7/2016 | Lin |
| 9,385,009 | B2 | 7/2016 | Lin et al. |
| 9,385,105 | B2 | 7/2016 | Meyer et al. |
| 9,396,998 | B2 | 7/2016 | Kurita et al. |
| 9,397,050 | B2 | 7/2016 | Shin et al. |
| 9,406,619 | B2 | 8/2016 | Pagaila et al. |
| 9,406,658 | B2 | 8/2016 | Lee et al. |
| 9,437,260 | B2 | 9/2016 | Prenat et al. |
| 9,449,930 | B2 | 9/2016 | Kim et al. |
| 9,455,218 | B2 | 9/2016 | Ooi et al. |
| 9,508,626 | B2 | 11/2016 | Pagaila et al. |
| 9,524,955 | B2 | 12/2016 | Huang et al. |
| 9,543,276 | B2 | 1/2017 | Jee et al. |
| 9,583,431 | B1 | 2/2017 | Rahman |
| 9,593,009 | B2 | 3/2017 | Fuergut et al. |
| 9,601,471 | B2 | 3/2017 | Zhai et al. |
| 9,607,967 | B1 | 3/2017 | Shih |
| 9,612,615 | B2 | 4/2017 | Lin et al. |
| 9,615,453 | B2 | 4/2017 | Yang |
| 9,627,365 | B1 | 4/2017 | Yu et al. |
| 9,640,259 | B2 | 5/2017 | Li et al. |
| 9,679,863 | B2 | 6/2017 | Lin et al. |
| 9,704,843 | B2 | 7/2017 | Kilger et al. |
| 9,722,584 | B1 | 8/2017 | Chang et al. |
| 9,735,113 | B2 | 8/2017 | Chi et al. |
| 9,763,329 | B1 | 9/2017 | Mason |
| 9,768,145 | B2 | 9/2017 | Yu et al. |
| 9,773,757 | B2 | 9/2017 | Yu et al. |
| 9,806,058 | B2 | 10/2017 | Wei et al. |
| 9,812,337 | B2 | 11/2017 | Chen et al. |
| 9,818,720 | B2 | 11/2017 | Wei et al. |
| 9,831,148 | B2 | 11/2017 | Yu et al. |
| 9,859,896 | B1 | 1/2018 | Gaide et al. |
| 9,881,850 | B2 | 1/2018 | Yu et al. |
| 9,887,206 | B2 | 2/2018 | Su et al. |
| 9,893,732 | B1 | 2/2018 | Lewis |
| 9,899,248 | B2 | 2/2018 | Yu et al. |

(56) References Cited

U.S. PATENT DOCUMENTS 9,899,355 B2 2/2018 Yuan et al.
9,935,113 B2 4/2018 Wu et al.
9,966,325 B2 5/2018 Beyne
9,985,006 B2 5/2018 Jeng et al.
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,559 B2 10/2018 Lin et al.
10,109,588 B2 10/2018 Jeong et al.
10,109,617 B2 10/2018 Lee et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,262,974 B2 4/2019 Yeh et al.
10,276,382 B2 4/2019 Hunt et al.
10,290,611 B2 5/2019 Yu et al.
10,325,882 B2 6/2019 Kang et al.
10,333,623 B1 6/2019 Liao et al.
10,340,249 B1 7/2019 Yu et al.
10,347,606 B2 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,476,505 B2 11/2019 Ngai
10,490,521 B2 11/2019 Hu et al.
10,490,540 B2 11/2019 Yu et al.
10,504,835 B1 12/2019 Wang et al.
10,510,634 B2 12/2019 Lin et al.
10,510,647 B2 12/2019 Heo
10,510,650 B2 12/2019 Yu et al.
10,510,721 B2 12/2019 Bhagavat et al.
10,522,449 B2 12/2019 Chen et al.
10,529,666 B2 1/2020 Yu et al.
10,535,638 B2 1/2020 Yeh et al.
10,541,227 B2 1/2020 Yeh et al.
10,541,228 B2 1/2020 Chen et al.
10,622,310 B2 4/2020 Yang
10,622,321 B2 4/2020 Yu et al.
10,741,537 B2 8/2020 Lu et al.
10,784,248 B2 9/2020 Yu et al.
10,797,031 B2 10/2020 Liao et al.
10,867,965 B2 12/2020 Shih et al.
10,867,978 B2 12/2020 Bhagavat et al.
10,892,011 B2 1/2021 Lin et al.
10,892,291 B2 1/2021 Chhun et al.
10,943,869 B2 3/2021 Zhai et al.
11,056,463 B2 7/2021 Takahashi et al.
11,114,408 B2 9/2021 Shen et al.
11,133,254 B2 9/2021 Lai et al.
11,158,580 B2 10/2021 Sio et al.
11,211,334 B2 12/2021 Lin et al.
11,217,368 B2 1/2022 Choa et al.
11,276,661 B2 3/2022 Fang
11,545,438 B2 1/2023 Hsieh et al.
11,587,894 B2 2/2023 Chen et al.
11,676,941 B2 * 6/2023 Hiner .................... H10W 74/01
257/737
11,728,254 B2 8/2023 Hou et al.
12,051,692 B2 7/2024 Shi et al.
12,369,365 B2 7/2025 Yu et al.
2001/0045844 A1 11/2001 New et al.
2001/0051426 A1 12/2001 Pozder et al.
2002/0092307 A1 7/2002 Ghoshal
2003/0122578 A1 7/2003 Masui et al.
2004/0041584 A1 3/2004 Sunaga et al.
2004/0145850 A1 7/2004 Fukumoto et al.
2004/0222817 A1 11/2004 Madurawe
2005/0046002 A1 3/2005 Lee et al.
2005/0185457 A1 8/2005 Kim et al.
2005/0218929 A1 10/2005 Wang et al.
2006/0138509 A1 6/2006 Lee et al.
2007/0037379 A1 2/2007 Enquist et al.
2007/0164279 A1 7/2007 Lin et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0133704 A1 6/2010 Marimuthu et al.
2010/0157669 A1 6/2010 Audzeyeu
2010/0283085 A1 11/2010 Bemanian
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2013/0037802 A1 * 2/2013 England .............. H01L 25/0657
257/E23.179
2013/0082399 A1 4/2013 Kim et al.
2013/0257477 A1 10/2013 Yasuda et al.
2013/0285253 A1 10/2013 Aoki et al.
2014/0017882 A1 1/2014 Lei
2014/0070380 A1 3/2014 Chiu et al.
2014/0070403 A1 3/2014 Pan et al.
2014/0112066 A1 4/2014 Chow et al.
2014/0131858 A1 5/2014 Pan et al.
2014/0183731 A1 7/2014 Lin et al.
2014/0185264 A1 7/2014 Chen et al.
2014/0203412 A1 7/2014 Wang et al.
2014/0210097 A1 7/2014 Chen
2014/0254232 A1 9/2014 Wu
2014/0302659 A1 10/2014 Phatak
2014/0339692 A1 11/2014 Kim et al.
2015/0008957 A1 1/2015 Olgiati et al.
2015/0014844 A1 1/2015 Wu et al.
2015/0085560 A1 3/2015 Candelier et al.
2015/0116965 A1 4/2015 Kim et al.
2015/0227662 A1 8/2015 Lepercq
2015/0287672 A1 10/2015 Yazdani
2015/0327367 A1 11/2015 Shen
2016/0079205 A1 3/2016 Lin et al.
2016/0093572 A1 3/2016 Chen
2016/0118390 A1 4/2016 Liaw
2016/0133571 A1 5/2016 Lee et al.
2016/0141228 A1 5/2016 Leobandung
2016/0173101 A1 6/2016 Gao et al.
2016/0190113 A1 6/2016 Sharan et al.
2016/0217835 A1 7/2016 Blott et al.
2016/0322330 A1 * 11/2016 Lin ..................... H01L 25/0652
2016/0351626 A1 12/2016 McCollum
2016/0372449 A1 12/2016 Rusu et al.
2017/0071552 A1 3/2017 Harpe et al.
2017/0117263 A1 4/2017 Yeh et al.
2017/0271248 A1 9/2017 Che et al.
2017/0301650 A1 10/2017 Yu
2017/0358557 A1 12/2017 Chen et al.
2018/0047571 A1 * 2/2018 Hunt ....................... H01L 23/16
2018/0053730 A1 2/2018 Shao
2018/0061742 A1 3/2018 Ananiev
2018/0068937 A1 3/2018 Marimuthu et al.
2018/0076179 A1 3/2018 Hsu et al.
2018/0102776 A1 4/2018 Chandrasekar et al.
2018/0138101 A1 * 5/2018 Yu ......................... H01L 23/481

(56) References Cited

U.S. PATENT DOCUMENTS

2018/0150667 A1 5/2018 Yu et al.
2018/0151477 A1 5/2018 Yu et al.
2018/0151501 A1 5/2018 Yu et al.
2018/0158746 A1 6/2018 Lin
2018/0165396 A1* 6/2018 Lin ........................ H10B 20/65
2018/0174865 A1 6/2018 Yu et al.
2018/0204810 A1 7/2018 Yu et al.
2018/0204828 A1 7/2018 Yu et al.
2018/0210799 A1 7/2018 Gao
2018/0226349 A1 8/2018 Yu et al.
2018/0226371 A1 8/2018 Enquist
2018/0247905 A1 8/2018 Yu et al.
2018/0254260 A1* 9/2018 Wei ..................... H01L 25/0652
2018/0269188 A1 9/2018 Yu et al.
2018/0275193 A1 9/2018 Rouge et al.
2018/0284186 A1 10/2018 Chadha
2018/0286776 A1 10/2018 Yu et al.
2018/0301351 A1 10/2018 Yu et al.
2018/0301376 A1 10/2018 Shih et al.
2018/0350629 A1 12/2018 Liu et al.
2018/0350763 A1 12/2018 Yu et al.
2018/0358312 A1 12/2018 Yu et al.
2018/0374824 A1 12/2018 Yu et al.
2019/0013276 A1 1/2019 Lee et al.
2019/0019756 A1 1/2019 Yu et al.
2019/0020343 A1 1/2019 Lin et al.
2019/0051641 A1 2/2019 Lin et al.
2019/0057931 A1 2/2019 Hsu et al.
2019/0057932 A1 2/2019 Wu et al.
2019/0067152 A1 2/2019 Wuu et al.
2019/0097304 A1 3/2019 Hsiao et al.
2019/0129817 A1 5/2019 Zhuo
2019/0131273 A1* 5/2019 Chen ....................... H01L 24/92
2019/0164834 A1 5/2019 Or-Bach et al.
2019/0221547 A1 7/2019 Drab et al.
2019/0238134 A1 8/2019 Lin et al.
2019/0238135 A1 8/2019 Lin et al.
2019/0245543 A1 8/2019 Lin et al.
2019/0253056 A1 8/2019 Lin et al.
2019/0304803 A1 10/2019 Hu et al.
2019/0333871 A1 10/2019 Chen et al.
2019/0347790 A1 11/2019 Lin et al.
2019/0363715 A1 11/2019 Lin et al.
2019/0371763 A1 12/2019 Agarwal et al.
2019/0372574 A1 12/2019 Lin et al.
2019/0393153 A1* 12/2019 Wang .................. H01L 21/6835
2020/0006274 A1 1/2020 Chiang et al.
2020/0035604 A1* 1/2020 Rubin ................. H01L 23/5383
2020/0043853 A1 2/2020 Kim et al.
2020/0058617 A1 2/2020 Wu et al.
2020/0058626 A1 2/2020 Tai et al.
2020/0058627 A1* 2/2020 Chen ................... H01L 23/5384
2020/0082885 A1 3/2020 Lin et al.
2020/0111734 A1 4/2020 Lin et al.
2020/0144224 A1 5/2020 Lin et al.
2020/0161242 A1 5/2020 Lin et al.
2020/0161266 A1* 5/2020 Shim ................... H10W 70/611
2020/0211922 A1 7/2020 Chun et al.
2020/0243422 A1* 7/2020 Kim ...................... H10W 20/20
2020/0294923 A1 9/2020 Bhagavat et al.
2020/0373215 A1 11/2020 Wu et al.
2020/0395313 A1* 12/2020 Mallik ................ H10W 42/121
2020/0395350 A1 12/2020 Wu et al.
2020/0411443 A1 12/2020 Guo et al.
2021/0005592 A1 1/2021 Lin et al.
2021/0043557 A1 2/2021 Lin et al.
2021/0050300 A1 2/2021 Lin et al.
2021/0057332 A1* 2/2021 Chen ................... H01L 21/6836
2021/0090983 A1 3/2021 Lin et al.
2021/0104551 A1 4/2021 Lin et al.
2021/0159180 A1 5/2021 Zhai et al.
2021/0217702 A1 7/2021 Dabral et al.
2021/0225708 A1 7/2021 Lee et al.
2021/0232744 A1 7/2021 Lin et al.
2021/0265284 A1 8/2021 Yu et al.
2021/0358901 A1 11/2021 Liu
2022/0013504 A1 1/2022 Dabral et al.
2022/0020729 A1 1/2022 Gao et al.
2022/0130823 A1 4/2022 Su et al.
2022/0223494 A1 7/2022 Lee et al.
2022/0384326 A1 12/2022 Yang et al.
2023/0014913 A1 1/2023 Chen et al.
2023/0095330 A1 3/2023 Lee et al.
2023/0161120 A1 5/2023 Yu et al.
2023/0187365 A1 6/2023 Lee et al.
2023/0352439 A1 11/2023 Chen et al.
2023/0352471 A1 11/2023 Yu et al.
2023/0353151 A1 11/2023 Lee et al.
2023/0363182 A1 11/2023 Lin et al.
2023/0387038 A1 11/2023 Hsieh et al.
2024/0014111 A1 1/2024 Han et al.
2024/0055336 A1 2/2024 Lin et al.
2024/0056082 A1 2/2024 Lin et al.
2025/0081600 A1 3/2025 Lee et al.
2025/0105238 A1 3/2025 Lin et al.
2025/0125273 A1 4/2025 Lin et al.
2025/0336907 A1 10/2025 Lin et al.

FOREIGN PATENT DOCUMENTS

CN 104282650 1/2015
CN 105745752 7/2016
CN 104064556 4/2019
TW 200623398 7/2006
TW 201413842 4/2014
WO WO00/36748 6/2000
WO WO2005010976 2/2005
WO WO2016160063 10/2016
WO WO2018004092 1/2018

* cited by examiner

300

3D CHIP PACKAGE BASED ON THROUGH-SILICON-VIA INTERCONNECTION ELEVATOR

PRIORITY CLAIM

This application is a continuation of application Ser. No. 17/026,186, filed Sep. 19, 2020, now U.S. Pat. No. 11,637,056, which claims priority benefits from U.S. provisional application No. 62/903,655, filed on Sep. 20, 2019 and entitled "3D CHIP PACKAGE BASED ON THROUGH-SILICON-VIA INTERCONNECTION ELEVATOR", U.S. provisional application No. 62/964,627, filed on Jan. 22, 2020 and entitled "3D chiplet system-in-a-package using vertical-through-via connector", U.S. provisional application No. 62/983,634, filed on Feb. 29, 2020 and entitled "A Non-volatile Programmable Logic Device Based On Multichip Package", U.S. provisional application No. 63/012,072, filed on Apr. 17, 2020 and entitled "VERTICAL INTERCONNECT ELEVATOR BASED ON THROUGH SILICON VIAS" and U.S. provisional application No. 63/023,235, filed on May 11, 2020 and entitled "3D Chip Package based on Through-Silicon-Via Interconnection Elevator". The present application incorporates the foregoing disclosures herein by reference.

BACKGROUND OF THE DISCLOSURE

Field of the Disclosure

The present invention relates to a 3D IC chip packaging technology, and more specifically relates to a 3D single-chip or multi-chip package based on a vertical interconnect elevator (VIE) chip or component including through-silicon-via interconnect elevators (TSVIE), through-glass-via interconnect elevators (TGVIE) or through-polymer-via interconnect elevators (TPVIE).

SUMMARY OF THE DISCLOSURE

One aspect of the disclosure provides a Vertical Interconnect Elevator (VIE) chip or component including a Through-Silicon-Via Interconnect Elevator (TSVIE), Through-Glass-Via Interconnect Elevator (TGVIE) or Through-Polymer-Via Interconnect Elevator (TPVIE). The VIE chip or component is for use in a chip package, wherein the chip package may be (i) a single-chip package (comprising only one semiconductor IC chip), (ii) single-COC package (chip-on-chip components or packages) or (iii) a multichip package (comprising a plurality of semiconductor IC chips or a plurality of COCs). The formation and structures of the COCs package will be described and specified below. The chip package may comprise one or a plurality of semiconductor IC chips (or COCs) and one or a plurality of VIE chips or components, wherein one or the plurality of semiconductor IC chips (or COCs) and one or the plurality of VIE chips or components are disposed on a same horizontal plane. The chip package comprising the VIE chips or components provides vertical interconnection for connecting the circuits at the bottom side (frontside) of the chip package to the top side (backside) of the chip package, wherein the through vias in the VIE chips or components are used for signal, clock, power and/or ground interconnection. The one or the plurality of semiconductor IC chips may not comprise any TSV. Alternatively, the one or the plurality of semiconductor IC chips may comprise TSVs, used for signal, clock, power supply (Vcc) and/or ground reference (Vss) interconnection. The VIE chip or component may comprise only passive elements and no active devices (for example, transistors). The standard wafer for the VIE chips is diced or sawed to form the separated VIE chips. The VIE chip or component may be manufactured by the packaging manufacturing companies or facilities without front-end of line (for fabrication of circuits including transistors) manufacturing capability. The chip package comprises contact copper pads or pillars, or solder bumps at the frontside (i.e., the side of the semiconductor IC chip or chips with transistors is facing) of the chip package and contact copper or nickel pads, copper pillars or solder bumps at the backside side (i.e., the side of the semiconductor IC chip or chips without transistors is facing) of the chip package. The contact copper pads or pillars, or solder bumps at the frontside of the chip package may be coupled or connected to the contact copper or nickel pads, copper pillars or solder bumps at the backside side of the chip package through the through vias of the VIE chips or components, wherein the through vias of the VIE chips or components are used for signal, clock, power and/or ground interconnection. The transistors or circuits of the semiconductor IC chip or chips may be coupled or connected to the external circuits outside of the frontside and/or the backside of the chip package. The transistors or circuits of the semiconductor IC chip or chips may be coupled or connected to the external circuits outside of the backside of the chip package, through vias of the VIE chips or components and the contact copper or nickel pads, copper pillars or solder bumps at the backside side of the chip package, wherein the through vias of the VIE chips or components are used for signal, clock, power supply (Vcc) and/or ground reference (Vss) interconnection. The locations or layout in a horizontal plane of contact copper pads or pillars, or solder bumps at the frontside of the chip package may be the same as that of the contact copper or nickel pads, copper pillars or solder bumps at the backside side of the chip package. In this case, the chip package is a chiplet or package in a standard format. The standard format of the chiplets or packages provides capability for stacking them vertically in a stacked 3D chip package. A second chip package may be stacked on the top of a first chip package using Package-On-Package (POP) assembly methods to form the 3D stacked chip package, wherein the first and second chip packages may be the chip packages as described and specified above.

Another aspect of the disclosure provides a standard common wafer for the VIE chips or components, as described and specified above. The VIE chip or component is for use in the chip package comprising (i) a single-chip package (comprising only one semiconductor IC chip), (ii) single-COC package or (iii) a multichip package (comprising a plurality of semiconductor IC chips or a plurality of COCs), as described above and to be described and specified below. The standard common wafers for the VIE chips or components may have a fixed pattern of design and layout for locations of the TSVs, and may be diced or separated into VIE chips or components each with different dimensions or shapes and different numbers of TSVs. In some applications, the aspect ratio of length to width for a diced or separated VIE chip or component may be between 2 and 10, between 4 and 10 or between 2 and 40. Assume that the width of a scribe line is $W_{sb}$, the space or separation between the scribe line and the TSV at the edge or boundary of the VIE chip or component is $W_{sbt}$, and the space or separation between two neighboring TSVs is $W_{sptsv}$. $W_{sptsv}$ is smaller than 50, 40 or 30 micrometers. In a case, if $W_{sptsv}$ is greater than $W_{sb}$+2 $W_{sbt}$, the standard common wafer is designed and layout with TSVs populated regularly in the whole wafer with a fixed pitch and separation (space $W_{sptsv}$) between two neighboring TSVs in x-direction and y-direction, respectively. The standard common VIE wafer may be cut or diced, through the space between two neighboring TSVs, to form separated or diced VIE chips or components each in a square or rectangular shape and with any dimension, and the separated or diced VIE chip or component may comprise any number of TSVs. In this case, in each separated or diced VIE chip or component, $W_{sbt}$ is smaller than $W_{sptsv}$ For example, a standard common VIE wafer with a given TSV layout may be cut or diced into separated or diced VIE chips or components each with an array of M1 by N1 (M1×N1) TSVs, M1 and N1 are positive integers, and wherein N1<M1, 1<=N1<=15, and 50<=M1<=500; or N1<M1, 1<=N1<=10, and 30<=M1<=200. For example, a separated or diced VIE chip or component may comprise an array of 100 by 5, 200 by 5, or 300 by 10 TSVs. In another case, if $W_{sptsv}$ is equal to or smaller than $W_{sb}+2W_{sbt}$, the standard common wafer is designed and layout with two alternatives: (1) with islands or regions of TSV arrays populated regularly in the whole wafer with reserved scribe lines. Each of the reserved scribe line has a fixed space or separation $W_{spild}$ between two neighboring islands or regions of TSV arrays (that is between two neighboring TSVs across the reserved scribe line) in x-direction and y-direction, respectively, that is, there are two different separation spaces, $W_{spild}$ and $W_{sptsv}$, between two neighboring TSVs in a separated or diced VIE chip or component. $W_{spild}$ is greater than $W_{sptsv}$. As an example, $W_{spild}$ is greater than 50, 40 or 30 micrometers, and $W_{sptsv}$ is smaller than 50, 40 or 30 micrometers. The reserved scribe line between two neighboring islands or regions of TSV arrays may be used as a scribe line for dicing and cutting. The standard common VIE wafer may be cut or diced, through the reserved scribe lines, to form separated or diced VIE chips or components in square or rectangular shape and with various dimensions. In this case, the separated or diced chip or component comprises M×N islands or regions of TSV arrays (wherein M and N are positive integers, wherein N<=M, 1<=N<=10, and 1<=M<=20) with the fixed space or separation $W_{spild}$ between two neighboring islands or regions of TSV arrays, wherein, for example, $W_{spild}$ is greater than 50, 40 or 30 micrometers, and $W_{sptsv}$ is smaller than 50, 40 or 30 micrometers. As example, the standard common VIE wafer with a given design and layout of islands or regions of TSV arrays may be cut or diced into a plurality of VIE chips or components, wherein each separated or diced VIE chip or component comprises one or a plurality of islands or regions of TSV arrays, for example, 3 by 1, 6 by 1, 4 by 2, 8 by 2, or 10 by 3 islands or regions of TSV arrays. If the separated or diced VIE chip or component comprises a plurality of (more than one) islands or regions of TSV arrays, there is the reserved scribe line between two neighboring islands or regions of TSV arrays therein. The diced or separated VIE chip or component may comprise repetitive islands or regions of TSV arrays with each island or region of TSV arrays comprising M2 by N2 TSVs, M2 and N2 are positive integers, and wherein N2<M2, 1<=N2<=15, and 25<=M2<=250; or N2<M2, 1<=N2<=10, and 15<=M2<=100. For example, a separated or diced VIE chip or component comprises repetitive islands or regions of TSV arrays with each island or region of TSV arrays comprising an array of 50 by 5, 150 by 5, 150 by 10, or 250 by 10 TSVs; (2) with TSVs populated regularly in the whole wafer with a fixed pitch and separation (space $W_{sptsv}$) between two neighboring TSVs in x-direction and y-direction, respectively. The standard common VIE wafer may be cut or diced through the TSVs to form separated or diced VIE chips or components in a square or rectangular shape and with any dimension, and the separated or diced VIE chip or component may comprise any number of TSVs. In this case, for each separated or diced VIE chip or component, $W_{sbt}$ may be equal to or greater than zero and is smaller than $W_{sptsv}$, and $W_{sptsv}$ is smaller than 50, 40 or 30 micrometers.

The above specifications for TSVs in the silicon substrate of the VIE chip or component (TSVIE) are applied to the specifications for TGVs in the glass substrate of the VIE chip or component (TGVIE).

Another aspect of the disclosure provides a standard common wafer for the VIE chips or components. The VIE chip or component is for use in the chip package comprising (i) a single-chip package (comprising only one semiconductor IC chip), (ii) single-COC package or (iii) a multichip package (comprising a plurality of semiconductor IC chips or a plurality of COCs), as described above and to be described and specified below. The standard common wafers for the VIE chips or components may have a fixed pattern of design and layout for locations of the micro metal pads or bumps on the TSVs, and may be diced or separated into VIE chips or components each with different dimensions or shapes and different numbers of the micro metal pads or bumps on the TSVs. In some applications, the aspect ratio of length to width for a deiced or separated VIE chip or component may be between 2 and 10, between 4 and 10 or between 2 and 40. Assume that the width of a scribe line is $W_{sb}$, the space or separation between the scribe line and the micro metal pad or bump on the TSV at the edge or boundary of the VIE chip is $WB_{sbt}$, and the space or separation between two neighboring micro metal pads or bumps on the TSVs is $WB_{sptsv}$. $WB_{sptsv}$ is smaller than 50, 40 or 30 micrometers. In a case, if $WB_{sptsv}$ is greater than $W_{sb}+2WB_{sbt}$, the standard common wafer is designed and layout with micro metal pads or bumps on the TSVs populated regularly in the whole wafer with a fixed pitch and separation (space $WB_{sptsv}$) between two neighboring micro metal pads or bumps on the TSVs in x-direction and y-direction, respectively. The standard common VIE wafer may be cut or diced, through the space between two neighboring micro metal pads or bumps on the TSVs, to form a separated or diced VIE chip or component in a square or rectangular shape and with any dimension, and the separated or diced VIE chip may comprise any number of micro metal pads or bumps on the TSVs. In this case, in each separated or diced VIE chip or component, the distance between the edge of the diced VIE chip or component to the nearest micro metal pad or bump on the TSV ($WB_{sbt}$) is smaller than $WB_{sptsv}$. For example, a standard common VIE wafer with a layout of given micro metal pads or bumps on the TSVs may be cut or diced into separated or diced VIE chips or components each with an array of M2 by N2 (M2×N2) micro metal pads or bumps on the TSVs, M2 and N2 are positive integers, and wherein N2<M2, 1<=N2<=15, and 25<=M2<=250; or N2<M2, 1<=N2<=10, and 15<=M2<=100. For example, a separated or diced VIE chip or component may comprise an array of 50 by 5, 150 by 5, 150 by 10, or 250 by 10 micro metal pads or bumps on the TSVs. In another case, if $WB_{sptsv}$ is equal to or smaller than $W_{sb}+2WB_{sbt}$, the standard common wafer is designed and layout with two alternatives: (1) with islands or regions of arrays of micro metal pads or bumps on the TSVs populated regularly in the whole wafer with reserved scribe lines. Each of the reserved scribe line has a fixed space or separation $WB_{spild}$ (equal to $W_{sb}+2WB_{sbt}$) between two neighboring islands or regions of arrays of micro metal pads or bumps on the TSVs (that is between two neighboring micro metal pads or bumps on the TSVs across the reserved scribe line) in x-direction and y-direction, respectively, that is, there are two different separation spaces, $WB_{spild}$ and $WB_{sptsv}$, between two neighboring micro metal pads or bumps on the TSVs in a separated or diced VIE chip or component. $WB_{spild}$ is greater than $WB_{sptsv}$. As an example, $WB_{spild}$ is greater than 50, 40 or 30 micrometers, and $WB_{sptsv}$ is smaller than 50, 40 or 30 micrometers. The reserved scribe line between two neighboring islands or regions of arrays of micro metal pads or bumps on the TSVs may be used as a scribe line for dicing and cutting. The standard common VIE wafer may be cut or diced, through the reserved scribe lines, to form separated or diced VIE chips or components in square or rectangular shape and with various dimensions. In this case, the separated or diced chip or component comprises M×N islands or regions of arrays of micro metal pads or bumps on the TSVs (wherein M and N are positive integers, wherein N<M, 1<=N<=10, and 2<=M<=20) with the fixed space or separation $WB_{spild}$ between two neighboring islands or regions of arrays of micro metal pads or bumps on the TSVs, wherein, for example, $WB_{spild}$ is greater than 50, 40 or 30 micrometers, and $WB_{sptsv}$ is smaller than 50, 40 or 30 micrometer. As an example, the standard common VIE wafer with a given design and layout of islands or regions of arrays of micro metal pads or bumps on the TSVs may be cut or diced into a plurality of VIE chips or components, wherein each separated or diced VIE chip or component comprises one or a plurality of islands or regions of arrays of micro metal pads or bumps on the TSVs, for example, 3 by 1 islands or regions of arrays of micro metal pads or bumps on the TSVs, 6 by 1 islands or regions of arrays of micro metal pads or bumps on the TSVs, 4 by 2 islands or regions of arrays of micro metal pads or bumps on the TSVs, 8 by 2 islands or regions of arrays of micro metal pads or bumps on the TSVs, or 10 by 3 islands or regions of arrays of micro metal pads or bumps on the TSVs. If the separated or diced VIE chip or component comprises a plurality of (more than one) islands or regions of arrays of micro metal pads or bumps on the TSVs, there is the reserved scribe line between two neighboring islands or regions of arrays of micro metal pads or bumps on the TSVs therein. The diced or separated VIE chip or component may comprise repetitive islands or regions of arrays of micro metal pads or bumps on the TSVs with each island or region of arrays of micro metal pads or bumps on the TSVs comprising an array of 30 by 2 micro metal pads or bumps on the TSVs, an array of 60 by 2 micro metal pads or bumps on the TSVs, an array of 50 by 5 micro metal pads or bumps on the TSVs, or an array of 100 by 5 micro metal pads or bumps on the TSVs; (2) with micro metal pads or bumps on the TSVs populated regularly in the whole wafer with a fixed pitch and separation (space $WB_{sptsv}$) between two neighboring micro metal pads or bumps on the TSVs in x-direction and y-direction, respectively. The standard common VIE wafer may be cut or diced through the micro metal pads or bumps on the TSVs to form separated or diced VIE chips or components in a square or rectangular shape and with any dimension, and the separated or diced VIE chip or component may comprise any number of micro metal pads or bumps on the TSVs. In this case, for each separated or diced VIE chip or component, $WB_{sbt}$ may be equal to or greater than zero, and is smaller than $WB_{sptsv}$, and $WB_{sptsv}$ is smaller than 50, 40 or 30 micrometers.

The above specifications for TSVs in the silicon substrate of the VIE chip or component (TSVIE) are applied to the specifications for TGVs in the glass substrate of the VIE chip or component (TGVIE).

Another aspect of the disclosure provides a standard common wafer for the VIE chips or components. The VIE chip or component is for use in the chip package comprising (i) a single-chip package (comprising only one semiconductor IC chip), or (ii) a multichip package (comprising a plurality of semiconductor IC chips, single-COC package, or a plurality of COC (chip-on-chip components or packages)), as described above and to be described and specified below. The standard common wafers for the VIE chips or components may have a fixed pattern of design and layout for locations of the micro metal pads or bumps on the TSVs, and may be diced or separated into VIE chips or components each with different dimensions or shapes and different numbers of the micro metal pads or bumps on the TSVs. In some applications, the aspect ratio of length to width for a deiced or separated VIE chip or component may be between 2 and 10, between 4 and 10 or between 2 and 40. Assume that the width of a scribe line is $W_{sb}$, the space or separation between the scribe line and the micro metal pad or bump on the TSV at the edge or boundary of the VIE chip is $WB_{sbt}$ and the space or separation between two neighboring micro metal pads or bumps on the TSVs is $WB_{sptsv}$. $WB_{sptsv}$ is smaller than 50, 40 or 30 micrometers. In a case, if $WB_{sptsv}$ is greater than $W_{sb}+2WB_{sbt}$, the standard common wafer is designed and layout with micro metal pads or bumps on the TSVs populated regularly in the whole wafer with a fixed pitch and separation (space $WB_{sptsv}$) between two neighboring micro metal pads or bumps on the TSVs in x-direction and y-direction, respectively. The standard common VIE wafer may be cut or diced, through the space between two neighboring micro metal pads or bumps on the TSVs, to form a separated or diced VIE chip or component in a square or rectangular shape and with any dimension, and the separated or diced VIE chip may comprise any number of micro metal pads or bumps on the TSVs. In this case, in each separated or diced VIE chip or component, the distance between the edge of the diced VIE chip or component to the nearest micro metal pad or bump on the TSV ($WB_{sbt}$) is smaller than $WB_{sptsv}$. For example, a standard common VIE wafer with a layout of given micro metal pads or bumps on the TSVs may be cut or diced into separated or diced VIE chips or components each with an array of M2 by N2 (M2×N2) micro metal pads or bumps on the TSVs, M2 and N2 are positive integers, and wherein N2<M2, 1<=N2<=15, and 25<=M2<=250; or N2<M2, 1<=N2<=10, and 15<=M2<=100. For example, a separated or diced VIE chip or component may comprise an array of 50 by 5, 150 by 5, 150 by 10, or 250 by 10 micro metal pads or bumps on the TSVs. In another case, if $WB_{sptsv}$ is equal to or smaller than $W_{sb}+2WB_{sbt}$, the standard common wafer is designed and layout with two alternatives: (1) with islands or regions of arrays of micro metal pads or bumps on the TSVs populated regularly in the whole wafer with reserved scribe lines. Each of the reserved scribe line has a fixed space or separation $WB_{spild}$(equal to $W_{sb}+2WB_{sbt}$) between two neighboring islands or regions of arrays of micro metal pads or bumps on the TSVs (that is between two neighboring micro metal pads or bumps on the TSVs across the reserved scribe line) in x-direction and y-direction, respectively, that is, there are two different separation spaces, $WB_{spild}$ and $Wb_{sptsv}$ between two neighboring micro metal pads or bumps on the TSVs in a separated or diced VIE chip or component. $WB_{spild}$ is greater than $WB_{sptsv}$. As an example, $WB_{spild}$ is greater than 50, 40 or 30 micrometers, and $WB_{sptsv}$ is smaller than 50, 40 or 30 micrometers. The reserved scribe line between two neighboring islands or regions of arrays of micro metal pads or bumps on the TSVs may be used as a scribe line for dicing and cutting. The standard common VIE wafer may be cut or diced, through the reserved scribe lines, to form separated or diced VIE chips or components in square or rectangular shape and with various dimensions. In this case, the separated or diced chip or component comprises M×N islands or regions of arrays of micro metal pads or bumps on the TSVs (wherein M and N are positive integers, wherein N<M, 1<=N<=10, and 2<=M<=20) with the fixed space or separation $WB_{spild}$ between two neighboring islands or regions of arrays of micro metal pads or bumps on the TSVs, wherein, for example, $WB_{spildv}$ is greater than 50, 40 or 30 micrometers, and $WB_{sptsv}$ is smaller than 50, 40 or 30 micrometer. As an example, the standard common VIE wafer with a given design and layout of islands or regions of arrays of micro metal pads or bumps on the TSVs may be cut or diced into a plurality of VIE chips or components, wherein each separated or diced VIE chip or component comprises one or a plurality of islands or regions of arrays of micro metal pads or bumps on the TSVs, for example, 3 by 1 islands or regions of arrays of micro metal pads or bumps on the TSVs, 6 by 1 islands or regions of arrays of micro metal pads or bumps on the TSVs, 4 by 2 islands or regions of arrays of micro metal pads or bumps on the TSVs, 8 by 2 islands or regions of arrays of micro metal pads or bumps on the TSVs, or 10 by 3 islands or regions of arrays of micro metal pads or bumps on the TSVs. If the separated or diced VIE chip or component comprises a plurality of (more than one) islands or regions of arrays of micro metal pads or bumps on the TSVs, there is the reserved scribe line between two neighboring islands or regions of arrays of micro metal pads or bumps on the TSVs therein. The diced or separated VIE chip or component may comprise repetitive islands or regions of arrays of micro metal pads or bumps on the TSVs with each island or region of arrays of micro metal pads or bumps on the TSVs comprising an array of 30 by 2 micro metal pads or bumps on the TSVs, an array of 60 by 2 micro metal pads or bumps on the TSVs, an array of 50 by 5 micro metal pads or bumps on the TSVs, or an array of 100 by 5 micro metal pads or bumps on the TSVs; (2) with micro metal pads or bumps on the TSVs populated regularly in the whole wafer with a fixed pitch and separation (space $WB_{sptsv}$) between two neighboring micro metal pads or bumps on the TSVs in x-direction and y-direction, respectively. The standard common VIE wafer may be cut or diced through the micro metal pads or bumps on the TSVs to form separated or diced VIE chips or components in a square or rectangular shape and with any dimension, and the separated or diced VIE chip or component may comprise any number of micro metal pads or bumps on the TSVs. In this case, for each separated or diced VIE chip or component, $WB_{sbt}$ may be equal to or greater than zero, and is smaller than $WB_{sptsv}$, and $WB_{sptsv}$ is smaller than 50, 40 or 30 micrometers.

The above specifications for micro metal pads or bumps on TSVs in the silicon substrate of the VIE chip or component (TSVIE) are applied to the specifications for that of TGVs in the glass substrate of the VIE chip or component (TGVIE).

Another aspect of the disclosure provides a chip-on-chip component or package (COC) configured in a format like the one or the plurality of semiconductor IC chips in the chip package, for packaging in the chip package as described above, or to be described and specified below. The COC has micro metal pads, pillars or bumps exposed at a surface thereof, like micro metal pads, pillars or bumps at the surface of the semiconductor IC chips. The micro metal pads, pillars or bumps exposed at the surface of the (COC) are configured for the chip package as described above, or to be described and specified below.

A first type COC comprises a first semiconductor IC chip with the frontside (with transistors) facing up, and a second semiconductor IC chip with the frontside (with transistors) facing down, wherein the second semiconductor IC chip is on or over and bonded to the first semiconductor IC chip, wherein the area of the second semiconductor IC chip is smaller than that of the first semiconductor IC chip, and the boundary (four edges) of the second semiconductor IC chip is within the boundary (four edges) of the first semiconductor IC chip. The first semiconductor IC chip comprises through silicon vias (TSVs) in its silicon substrate, and micro metal pads, pillars or bumps at the bottom of the TSVs, same as the micro metal pads, pillars or bumps at the frontside of the one or the plurality of second semiconductor IC chips in the chip packages described above or to be described and specified below. The first and second semiconductor IC chips may comprise (i) the standard commodity FPGA chip, (ii) an auxiliary or supporting (AS) IC chip, wherein the AS IC chip comprises a cryptography or security IC chip, I/O or control IC chip, power management IC chip, and/or Innovated ASIC or COT (abbreviated as IAC below) IC chip (the AS IC chips to be described and specified below), (iii) processing and/or computing IC chip, for example CPU, GPU, DSP, TPU, APU or ASIC chip, and/or (iv) memory IC chip, for a first example, the non-volatile NAND and/or NOR flash chip, and/or High Bandwidth DRAM or SRAM Memory (HBM) chip. For a first example, a first type COC may comprise (a) the first semiconductor chip comprising the standard commodity FPGA chip, or the processing and/or computing IC chip, for example CPU, GPU, DSP, TPU, APU or ASIC chip, and (b) the second semiconductor IC chip comprising the AS IC chip comprising the cryptography or security IC chip, I/O or control IC chip, power management IC chip, and/or Innovated ASIC or COT (abbreviated as IAC below) IC chip, or the memory IC chip, for example, the non-volatile NAND and/or NOR flash chip, and/or High Bandwidth DRAM or SRAM Memory (HBM) chip. In the first example, the COC may be a (i) FPGA/AS COC or logic/AS COC, or (ii) a FPGA/HBM COC or logic/HBM COC. The functions and purposes of the AS chip or the memory chip (the second semiconductor IC chip), and its relationship to the standard commodity FPGA chip, or the processing and/or computing IC chip (the first semiconductor IC chip) in the same first type COC will be described and specified below. For a second example, a first type chip-on-chip component or package may comprise (a) the first semiconductor chip comprising the AS IC chip comprising the cryptography or security IC chip, I/O or control IC chip, power management IC chip, or Innovated ASIC or COT (abbreviated as IAC below) IC chip, or the memory IC chip, for example, the non-volatile NAND and/or NOR flash chip, and/or High Bandwidth DRAM or SRAM Memory (HBM) chip, and (b) the second semiconductor IC chip comprising the standard commodity FPGA chip, or the processing and/or computing IC chip, for example CPU, GPU, DSP, TPU, APU or ASIC chip. In the second example, the COC may be a (i) FPGA/AS COC or logic/AS COC, or (ii) a FPGA/HBM COC or logic/HBM COC. In the second example, the COC may be a (i) FPGA/AS COC or logic/AS COC, or (ii) a FPGA/HBM COC or logic/HBM COC. In the second example, the functions and purposes of the AS chip or the memory chip (the first chip), and its relationship to the standard commodity FPGA chip, or the processing and/or computing IC chip (the second chip) in the same first type COC will be described and specified below.

The key process steps of forming the first type COC are: (i) flip-chip bonding the separated or diced second semiconductor IC chip on a wafer comprising the first semiconductor IC chips by flip-chip solder reflow bonding, thermal compression bonding, or oxide-to-oxide metal-to-metal direct bonding, wherein the first semiconductor IC chip with the frontside (with transistors) facing up, and the second semiconductor IC chip with the frontside (with transistors) facing down. The pitch between two micro metal bonds (based on the pitch of the micro metal pads, pillars or bumps at the frontside of the first and second semiconductor IC chips) formed by the thermal compression bonding may be between 5 and 30 micrometers or between 10 and 25 micrometers. The pitch between two micro metal bonds (based on the pitch of the micro metal pads, pillars or bumps at the frontside of the first and second semiconductor IC chips) formed by the oxide-to-oxide metal-to-metal direct bonding may be between 3 and 10 micrometers or 4 and 7 micrometers; (ii) applying a material, resin, or compound (a) on or over the wafer comprising the first semiconductor IC chips, and (b) between the second semiconductor IC chips. The polymer material includes, for example, polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan; (iii) polishing, grinding or CMP to planarize the top surface of the applied material, resin, or compound. The backside of the second semiconductor IC chip (at the top) may be exposed after the polishing, grinding or CMP process; (iv) polishing, grinding or CMP the surface at the backside of the wafer until the bottom surface of TSVs in the substrate of the wafer is exposed; (v) forming micro metal pads, pillars or bumps at the bottom of the TSVs; (iv) the wafer is then separated or diced to from the separated first type COC.

A second type COC comprises a first semiconductor IC chip with the frontside (with transistors) facing up, a second semiconductor IC chip with the frontside (with transistors) facing down, and a VIE chip or component; wherein the first semiconductor IC chip and the VIE chip or component are disposed on a same horizontal plane, and the second semiconductor IC chip is on or over the first semiconductor IC chip and the VIE chip or component, wherein the second semiconductor IC chip has a portion extending from at least an edge of the first semiconductor IC chip in a horizontal direction, and the VIE chip or component is vertically under the portion. The first semiconductor IC chip and the VIE chip or component may comprise through silicon vias (TSVs) in their silicon substrates, and micro metal pads, pillars or bumps at the bottom of the TSVs, same as the micro metal pads, pillars or bumps at the frontside of the one or the plurality of second semiconductor IC chips in the chip packages described above or to be described and specified below. The signal, clock, power supply (Vcc) or ground reference (Vss) for the second semiconductor IC chip may be through the TSVs of VIE chip or component. The second type COC is to be used in the chip package to be described and specified in the chip packages below. As a first example, a second type COC may comprise (a) the first semiconductor chip comprising the standard commodity FPGA chip, or the processing and/or computing IC chip, for example CPU, GPU, DSP, TPU, or APU chip, and (b) the second semiconductor IC chip comprising the AS IC chip comprising the cryptography or security IC chip, I/O or control IC chip, power management IC chip, and/or Innovated ASIC or COT (abbreviated as IAC below) IC chip, or the memory IC chip, for example, the non-volatile NAND and/or NOR flash chip, and/or High Bandwidth DRAM or SRAM Memory (HBM) chip. In the first example, the COC may be a (i) FPGA/AS COC or logic/AS COC, or (ii) FPGA/HBM COC or logic/HBM COC. In the first example, the functions and purposes of the AS chip or the memory chip (the second semiconductor IC chip), and its relationship to the standard commodity FPGA chip, or the processing and/or computing IC chip (the first semiconductor IC chip) in the same second type COC will be described and specified below. For a second example, a second type COC may comprise (a) the first semiconductor chip comprising the AS IC chip comprising the cryptography or security IC chip, I/O or control IC chip, power management IC chip, or Innovated ASIC or COT (abbreviated as IAC below) IC chip, or the memory IC chip, for example, the non-volatile NAND and/or NOR flash chip, and/or High Bandwidth DRAM or SRAM Memory (HBM) chip, and (b) the second semiconductor IC chip comprising the standard commodity FPGA chip, or the processing and/or computing IC chip, for example CPU, GPU, DSP, TPU, or APU chip. In the second example, the COC may be a (i) FPGA/AS COC or logic/AS COC, or (ii) a FPGA/HBM COC or logic/HBM COC. In the second example, the COC may be a (i) FPGA/AS COC or logic/AS COC, or (ii) FPGA/HBM COC or logic/HBM COC. In the second example, the functions and purposes of the AS chip or the memory chip (the first semiconductor IC chip), and its relationship to the standard commodity FPGA chip, or the processing and/or computing IC chip (the second semiconductor IC chip) in the same second type COC will be described and specified below.

The key process steps of forming the second type COC are: (i) flip-chip bonding the separated or diced first semiconductor IC chip and the separated or diced VIE chips or components on a wafer comprising the second semiconductor IC chips by flip-chip solder reflow bonding, thermal compression bonding, or oxide-to-oxide metal-to-metal direct bonding. The pitch between two micro metal bonds (based on the pitch of the micro metal pads, pillars or bumps at the frontside of the first and second semiconductor IC chips, and at the surface of the VIE chips or components) formed by the thermal compression bonding may be between 5 and 30 micrometers or 10 and 25 micrometers. The pitch between two micro metal bonds (based on the pitch of the micro metal pads, pillars or bumps at the frontside of the first and second semiconductor IC chips, and at the surface of the VIE chips or components) formed by the oxide-to-oxide metal-to-metal direct bonding may be between 3 and 10 micrometers or 4 and 7 micrometers; (ii) applying a material, resin, or compound (a) on or over the wafer comprising the second semiconductor IC chips, and (b) between the first semiconductor IC chips and the VIE chips or components. The polymer material includes, for example, polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan; (iii) polishing, grinding or CMP to planarize the top surface of the applied material, resin, or compound until the surface of TSVs in the silicon substrates of the first semiconductor IC chips and the VIE chips or components is exposed; (iii) formed micro metal pads, pillars or bumps at the exposed surface of the TSVs of the first semiconductor IC chips and the VIE chips or components; (iv) the wafer is then separated or diced, and then turn the separated or diced units upside down to obtain the separated or diced second type COC, as described and specified above. The second type COCs are to be used in the chip package to be described and specified in the chip packages below.

Another aspect of the disclosure provides methods for forming a chip package (including single-chip package or multichip package) using the VIE chips or components (including TSVIEs, TGVIEs or TPVIEs). The chip package including a Fan-Out Interconnection Technology (FOIT) package, a Chip-On-Interposer (COIP) package, or a Chip-On-an-Interconnection-Substrate (COIS) package. The chip package comprises one or a plurality of semiconductor IC chips, one or a plurality of the first type chip-on-chip components or packages (COCs), and/or one or a plurality of the second type chip-on-chip components or packages (COCs). The methods of forming FOIT, COIP and COIS packages will be described and specified below.

Another aspect of the disclosure provides a method of thermal compression bump bonding for bonding the semiconductor IC chip or chips (and/or the first type COC or the second type COC) and the VIE chips or components to a substrate (for example, an interposer in a Chip-On-Interposer (COIP) package, or a temporary substrate with Fan-Out redistribution layer in the Fan-Out Interconnection Technology (FOIT) package), both are to be described below.

Another aspect of the disclosure provides a method of oxide-to-oxide/metal-to-metal direct bonding for bonding the semiconductor IC chip or chips (and/or the first type COC or the second type COC) and the VIE chips or components to a substrate. (for example, an interposer in a Chip-On-Interposer (COIP) package with First Interconnection Scheme of the InterPoser (FISIP)), to be described below.

Another aspect of the disclosure provides a Fan-Out Interconnection Technology (FOIT) with Frontside Interconnection Scheme of logic Drive or device (abbreviated as FISD) and Backside metal Interconnection Scheme at the backside of the multichip-packaged logic drive or device (abbreviated as BISD) for making or fabricating a multi-chip package using the VIE chips or components. The multichip package may be used for a logic drive comprising one or a plurality of standard commodity Field Programmable Gate Array (FPGA) IC chips. The multichip package is formed by the following process steps:

(1) Providing a chip carrier, holder, molder or substrate, semiconductor IC chips and VIE chips or components, or COCs and VIE chips or components; wherein the semiconductor IC chips may comprise TSVs; alternatively, the semiconductor IC chips may not comprise TSVs; and the COCs comprise the first type COC or the second type COC. The semiconductor IC chip or COC will be abbreviated as SIC/COC. The semiconductor IC chip, and the first type COC or the second type COC have the same format with micro metal pads, pillars or bumps at their frontside surface (for the semiconductor IC chip, the frontside is the side with transistors; for the first type COC or the second type COC, the frontside is the backside of the first semiconductor IC chip (with TSVs) in the COC). Then placing, fixing or attaching the SIC/COCs and VIE chips or components to and on the carrier, holder, molder or substrate. The carrier, holder, molder or substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the chip carrier, holder, molder or substrate may be silicon, metal, ceramics, glass, steel, plastics, polymer, epoxy-based polymer, or epoxy-based compound. The SIC/COCs and the VIE chips or components are placed, fixed or attached (with the backside of the SIC/COCs and the VIE chips or components without micro metal pads, pillars or bumps facing down) to the carrier, holder, molder or substrate. The VIE chips or components and the SIC/COCs are on a same horizontal plane (coplanar). Each of the VIE chips or components is located in a space between two neighboring SIC/COCs. The semiconductor IC chips comprise (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) processing and/or computing IC chip, for example CPU, GPU, DSP, TPU, APU or ASIC chip, and/or (iv) memory IC chip, for example, the non-volatile NAND and/or NOR flash chip, and/or High Bandwidth DRAM or SRAM Memory (HBM) chip. The COCs are as described and specified above. All the SIC/COCs and the VIE chips or components packaged in the multichip package comprise micro metal pads, pillars or bumps, (for example, copper pads or pillars, or solder bumps) on their surfaces (the front sides); wherein the frontside of the one or the plurality of the semiconductor IC chips have transistors, and the frontside of the one or the plurality of the first type COC or the second type COC is the backside (without transistors) of the first semiconductor IC chips at the bottom of the chip-on-chip units or components. The frontside of the SIC/COCs (the side or surface with micro metal pads, pillars or bumps) is facing up, and the backside of the SIC/COCs (the side or surface without micro metal pads, pillars or bumps) is placed, fixed, held or attached on or to the carrier, holder, molder or substrate.

(2) Applying a material, resin, or compound to fill the gaps or spaces between the SIC/COCs, between the VIE chips or components, and between the SIC/COCs and the VIE chips or components, up to a level sufficiently at a horizontal level as the top-most frontside surfaces of the SIC/COCs and the VIE chips or components by methods, for example, spin-on coating, screen-printing, dispensing or molding in the wafer or panel format. The molding method includes the compress molding (using top and bottom pieces of molds) or the casting molding (using a dispenser). The material, resin, or compound used may be a polymer material includes, for example, polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the carrier, holder, molder or substrate to a level to: (i) fill gaps or spaces between SIC/COCs and VIE chips or components, (ii) sufficiently at a horizontal level as the top-most frontside surface of the SIC/COCs and VIE chips or components.

Applying a CMP, polishing or grinding process to planarize the surface of the applied material, resin or compound, and until a level where the micro metal pads, pillars or bumps of the SIC/COCs and VIE chips or components are fully exposed.

(3) Depositing by a wafer or panel processing a first insulating dielectric layer (for example, a polymer layer) on or over (i) the front side (the side with micro metal pads, pillars or bumps) of the SIC/COCs and the VIE chips or components, (ii) exposed micro copper pads or pillars, or solder bumps at the front side of the SIC/COCs and the VIE chips or components, and (iii) the material, resin or compound in the spaces or gaps between the SIC/COCs, between the VIE chips or components, and between the SIC/COCs and the VIE chips or components. Then forming openings in the first insulating dielectric layer to expose the micro copper pads or pillars, or solder bumps at the front side of the SIC/COCs and the VIE chips or components. The first insulating dielectric layer comprises a polymer material includes, for example, polyimide, BenzoCycloButene (BCB), parylene, polybenzoxazole (PBO), epoxy-based material or compound, photo epoxy SU-8, elastomer, or silicone.

(4) Forming a Frontside Interconnection Scheme in, on or of the logic Drive or Device (FISD) on or over (i) the first insulating dielectric layer deposited as described above, (ii) exposed the micro copper pads or pillars, or solder bumps at the front side of the SIC/COCs and the VIE chips or components by a wafer or panel processing. The FISD comprises one or a plurality of interconnection metal layers, (for example, 1 to 5 or 1 to 8 interconnection metal layers) with inter-metal dielectric layers between two neighboring layers of the plurality of interconnection metal layers. The metal lines or traces of the interconnection metal layers of the FISD are over the SIC/COCs and the VIE chips or components and extend horizontally across the edges of the SIC/COCs or the VIE chips or components. The metal lines or traces of the interconnection metal layers of the FISD are formed using embossing copper electroplating processes. The interconnection metal lines or traces of FISD have an adhesion layer (Ti or TiN, for example) and the copper seed layer at the bottom of the metal lines or traces, but not at a sidewall of metal lines or traces of the interconnection metal layers of the FISD. The inter-metal dielectric layers may comprise polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan.

The thickness of the metal lines or traces of the FISD is between, for example, 0.3 μm and 30 μm, 0.5 μm and 20 μm, 1 μm and 10 μm, or 0.5 μm to 5 μm, or thicker than or equal to 0.3 μm, 0.5 μm, 0.7 μm, 1 μm, 1.5 μm, 2 μm, 3 μm or 5 μm. The width of the metal lines or traces of the FISD is between, for example, 0.3 μm and 30 μm, 0.5 μm and 20 μm, 1 μm and 10 μm, or 0.5 μm to 5 μm, or wider than or equal to 0.3 μm, 0.5 μm, 0.7 μm, 1 μm, 1.5 μm, 2 μm, 3 μm or 5 μm. The thickness of the inter-metal dielectric layer of the FISD is between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm.

(5) Applying a CMP, polishing or grinding process at the backside of the SIC/COCs and VIE chips or components to expose the surfaces of the TSVs, TGVs or TPVs in the SIC/COCs and VIE chips or components;

(6) (now turning the whole structure upside down) Depositing a second insulating dielectric layer (for example a polymer layer) on the top side (the opposite side of the side with FISD) of the multichip package; that is, on or over (i) the exposed backside of the semiconductor IC chips (or COCs), (ii) the exposed backside of the VIE chips or components and (iii) the spaces or gaps between the semiconductor IC chips (or COCs), between the VIE chips or components, and between the semiconductor IC chips (or COCs) and the VIE chips or components. Forming openings in the second insulating dielectric layer to expose the surfaces of the TSVs, TGVs or TPVs in the VIE chips or components;

(7) Forming a Backside metal Interconnection Scheme at the backside of the multichip-packaged logic drive or device (abbreviated as BISD in below) on or over the second insulating dielectric layer, and the exposed surfaces (of the TSVs, TGVs or TPVs in the VIE chips or components) in the openings in the second insulating dielectric layer. The BISD is over (i) the exposed backside of the semiconductor IC chips (or COCs), (ii) the exposed backside of the VIE chips or components and (iii) the spaces or gaps between the semiconductor IC chips (or COCs), between the VIE chips or components, and between the semiconductor IC chips (or COCs) and the VIE chips or components. The BISD may comprise metal lines, traces, or planes in one or a plurality of interconnection metal layers (for example, 1 to 6 or 1 to 4 interconnection metal layers), and is formed on or over the backsides of the semiconductor IC chips and the VIE chips or components, or, on or over the backsides of the COC and the VIE chips or components. The metal lines or traces of the interconnection metal layers of the BISD are over the SIC/COCs and the VIE chips or components and extend horizontally across the edges of the SIC/COCs or the VIE chips or components. The BISD may be formed using the same or similar process steps and materials as in forming the FISD as described above. The BISD provides additional interconnection metal layer or layers at the top or the backside of the multichip package.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

(8) Forming copper or nickel pads, copper pillars, or solder bumps on or over exposed surfaces of the top-most metal interconnection layer (of the BISD) at the bottom of openings in the top-most insulting dielectric layer of the BISD. The copper or nickel pads, copper pillars, or solder bumps in an area array at the top of the multichip package including at locations vertically over the backside of the SIC/COCs of the multichip package. The copper or nickel pads, copper pillars, or solder bumps are formed by performing an embossing electroplating copper process.

(9) (now turning the whole structure upside down) Forming copper pads or pillars, or solder bumps (for example, copper pads, pillars or bumps, solder bumps, or gold bumps) on or over the top-most insulating dielectric layer of the FISD, and the exposed top surfaces of the top-most interconnection metal layer of the FISD in openings of the top-most insulating dielectric layer of the FISD, by performing an embossing electroplating copper process.

(10) Separating, cutting or dicing the finished wafer or panel, including separating, cutting or dicing through materials or structures between two neighboring multichip packages. The material (for example, polymer) filling gaps or spaces between chips or components of two neighboring multichip packages is separated, cut or diced to form individual unit of the multichip package.

In the separated, cut or diced individual unit of the multichip package, the copper or nickel pads, copper pillars, or solder bumps in an area array at the top (the opposite side of FISD side, that is, the backside side of SIC/COCs having micro metal pads, pillars or bumps are facing down) are connected or coupled to a transistor of the SIC/COCs through the TSVs, TGVs or TPVs of the VIE chips or components. The TSVs, TGVs or TPVs of the VIE chips or components are used for connecting or coupling circuits or components (for example, the FISD) at the frontside of the multichip to that (for example, the BISD) at the backside of the multichip package. A copper pad or pillar, or solder bump of the copper pads or pillars, or solder bumps in an area array at the bottom (the FISD side, that is, the front sides of SIC/COCs having micro metal pads, pillars or bumps are facing down) of the separated or diced multichip package may be vertically under a SIC/COCs of the SIC/COCs, and couple or connect (for signal, clock, power supply Vcc, or ground reference Vss) to a copper or nickel pad, copper pillar, or solder bump of the copper or nickel pads, copper pillars, or solder bumps vertically over the SIC/COC through a metal interconnect of the FISD, the TSV, TGV or TPV of the VIE chip or component and a metal interconnect of the BISD, wherein the copper pad or pillar, or solder bump at the bottom of the separated or diced multichip package may couple to a transistor of the SIC/COC. Each separated or diced multichip package may comprise a plurality of SIC/COCs and one or a plurality of VIE chips or components.

Another aspect of the disclosure provides a Fan-Out Interconnection Technology (FOIT) with FISD and BISD for making or fabricating a single-chip package or single-COC package using the VIE chips or components. The single-chip or single-COC package may comprise only one semiconductor IC chip and at least one of the VIE chips or components; or, only one first type chip-on-chip component or package and at least one of the VIE chips or components; or, only one second type chip-on-chip component or package and at least one of the VIE chips or components. The single-chip or single-COC package is formed using the same or similar process steps as forming the multichip package with FISD and BISD as described and specified above, except:

(A) In Step (1), the SIC/COCs placed, fixed or attached to the carrier, holder, molder or substrate for a process batch may be of the same product or device of the semiconductor IC chip, of the same product or device of the first type chip-on-chip component or package, or, of the same product or device of the second type chip-on-chip component or package. For example, the semiconductor IC chips used in one wafer or panel process batch may be of only one of following products or devices: (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) processing or computing IC chip, for example, the CPU, GPU, DSP, TPU, or APU chip, or (iv) the memory IC chip, for example, the non-volatile NAND or NOR flash chip, or High Bandwidth DRAM or SRAM Memory (HBM) chip.

(B) In Step (10), separating, cutting or dicing the finished wafer or panel, to form a separated single-chip or single-COC package, wherein the single-chip or single-COC package may comprise only one semiconductor IC chip and one or a plurality of VIE chips or components; wherein the single-COC package may comprise only one first type chip-on-chip component or package and one or a plurality of VIE chips or components, or, only one second type chip-on-chip component or package and one or a plurality of VIE chips or components. The single-chip or single-COC package has the copper pads or pillars, or solder bumps in an area array at the bottom (the side which the frontside having micro metal pads, pillars or bumps of SIC/COC is facing), and the copper or nickel pads, copper pillars, or solder bumps also in an area array at the top (the side which the backside of SIC/COC without micro metal pads, pillars or bumps is facing). The copper or nickel pads, copper pillars, or solder bumps may be at locations vertically over or under the SIC/COC and may be connecting or coupling to the transistors of the SIC/COC. A copper pad or pillar, or solder bump of the copper pads or pillars, or solder bumps at the bottom (the FISD side, that is, the frontside of the SIC/COC with micro metal pads, pillars or bumps are facing down) of the separated or diced single-chip or single-COC package may be vertically under the SIC/COC, and couple or connect (for signal, clock, power supply Vcc, or ground reference Vss) to a copper or nickel pad, copper pillar, or solder bump of the copper or nickel pads, copper pillars, or solder bumps vertically over the SIC/COC through a metal interconnect of the FISD, the TSV, TGV or TPV of one of the VIE chips or components and a metal interconnect of the BISD, wherein the copper pad or pillar, or solder bump at the bottom of the separated or diced single-chip or single-COC package may couple to a transistor of the SIC/COC.

Another aspect of the disclosure provides a Fan-Out Interconnection Technology (FOIT) with a Fan-Out Interconnection Scheme of the logic Drive or Device (FOISD) and the BISD (as described and specified above) for making or fabricating a multi-chip package using the VIE chips or components. The multichip package may be used for a logic drive comprising one or a plurality of standard commodity Field Programmable Gate Array (FPGA) IC chips. The multichip package is formed by providing a Temporary Substrate (T-Sub) with a Fan-Out Interconnection Scheme of the logic Drive or Device (FOISD) on it. The FOISD comprises fan-out interconnection metal lines or traces and micro copper pads or pillars, or solder bumps on or over the T-Sub. The semiconductor IC chips or the COCs (SIC/COCs), and the VIE chips or components are flip-chip packaged on the T-Sub using the micro copper pads or pillars, or solder bumps on the FOISD. The T-Sub may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The T-Sub is served as a temporary support for the wafer-level or panel-level processes. The T-Sub will be removed or released after the processes. The IC chips, packages or components to be flip-chip assembled, bonded or packaged, to the substrate (T-Sub) include the semiconductor IC chips or the COCs (SIC/COCs), and the VIE chips or components. The FOISD comprises one or multiple interconnection metal layers, with an inter-metal dielectric layer between two neighboring interconnection metal layers. The metal lines or traces and the metal vias are formed by the embossing electroplating copper processes. The inter-metal dielectric layer may comprise polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The FOISD may comprise 1 to 8 layers, or 1 to 5 layers of interconnection metal layers. Micro copper pads or pillars, or solder bumps are formed on or over the top most interconnection metal layer of the FOISD.

The thickness of the metal lines or traces of FOISD is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of FOISD is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm.

The process steps for forming the FOIT multi-chip package with the FOISD are described as below:

(1) Performing flip-chip assembling, bonding or packaging: (a) First providing the substrate with FOISD, semiconductor IC chips (or COCs) and the VIE chips or components. The substrate (T-Sub) with FOISD is formed as described and specified above; (b) The micro metal pads, pillars or bumps of the semiconductor IC chips (or COCs) and the VIE chips or components are then flip-chip assembled, bonded or packaged on or to corresponding micro copper pads or pillars, or solder bumps of the FOISD on or over the substrate with the side or surface of the semiconductor IC chips with transistors faced down, or with the side of the COCs having micro metal pads, pillars or bumps faced down. The backside of the semiconductor IC chips (the side or surface without transistors) is facing up, or the backside of the COCs (the side or surface without micro metal pads, pillars or bumps) is facing up. All the semiconductor IC chips (or COCs) and the VIE chips or components to be flip-chip packaged in the multichip package comprise micro metal pads, pillars or bumps. The semiconductor IC chips comprise (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) processing and/or computing IC chip, for example CPU, GPU, DSP, TPU, APU or ASIC chip, and/or (iv) memory IC chip, for example, the non-volatile NAND and/or NOR flash chip, and/or High Bandwidth DRAM or SRAM Memory (HBM) chip. The COCs are as described and specified above.

(2) Applying a material, resin, or compound to fill the gaps or spaces between the semiconductor IC chips (or COCs), the gaps or spaces between the VIE chips or components, and the gaps or spaces between the semiconductor IC chips (or COCs) and the VIE chips or components, covering the backside surfaces of semiconductor IC chips (or COCs) and the VIE chips or components by methods, for example, spin-on coating, screen-printing, dispensing or molding in the wafer or panel format. The molding method includes the compress molding (using top and bottom pieces of molds) or the casting molding (using a dispenser). The material, resin, or compound used may be a polymer material includes, for example, polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the substrate and on or over the backside of the semiconductor IC chips (or COCs) to a level to: (i) fill gaps or spaces between semiconductor IC chips (or COCs) and VIE chips or components, (ii) cover the top-most backside surface of the semiconductor IC chips (or COCs) and VIE chips or components. Applying a CMP, polishing or grinding process to planarize the surface of the applied material, resin or compound, and until a level where the backside surfaces of TSVs, TGVs or TPVs of the VIE chips or components are fully exposed.

(3) Depositing an insulating dielectric layer (for example a polymer layer) on the top side (the opposite side of the side with FOISD) of the multichip package, that is, on or over (i) the exposed backside of the semiconductor IC chips (or COCs), (ii) the exposed backside of the VIE chips or components and (iii) the material, resin, or compound in the spaces or gaps between the semiconductor IC chips (or COCs), between the VIE chips or components, and between the semiconductor IC chips (or COCs) and the VIE chips or components. Forming openings in the insulating dielectric layer, exposing the top (backside) surfaces of the TSVs, TGVs or TPVs in the VIE chips or components.

(4) Forming a Backside metal Interconnection Scheme at the backside of the multichip-packaged logic drive or device (abbreviated as BISD in below) on or over the second insulating dielectric layer, and the exposed surfaces (of the TSVs, TGVs or TPVs in the VIE chips or components) in the openings in the second insulating dielectric layer. The BISD may comprise metal lines, traces, or planes in one or a plurality of interconnection metal layers, and is formed on or over the backsides of the semiconductor IC chips and the VIE chips or components, or, on or over the backsides of the COC and the VIE chips or components. The metal lines or traces of the interconnection metal layers of the BISD are over the SIC/COCs and the VIE chips or components and extend horizontally across the edges of the SIC/COCs or the VIE chips or components. The BISD may be formed using the same or similar process steps, materials and specification as in forming the BISD in the FOIT multichip package (with the FISD) described above. The BISD provides additional interconnection metal layer or layers at the top or the backside of the multichip package.

(5) Forming copper or nickel pads, copper pillars, or solder bumps on or over exposed surfaces of the top-most metal interconnection layer (of the BISD) at the bottom of openings in the top-most insulting dielectric layer of the BISD. The copper or nickel pads, copper pillars, or solder bumps in an area array at the top of the multichip package including at locations vertically over the backside of the SIC/COCs of the multichip package. The copper or nickel pads, copper pillars, or solder bumps are formed by performing an embossing electroplating copper process.

(6) Removing or releasing the temporary substrate (the T-Sub only, not including FOISD) from the structures on or over it. The bottom surfaces of the metal via contacts in the openings in the bottom-most dielectric insulating layer of the FOISD are then exposed (the side of the semiconductor IC chips with transistors are facing down, or the side of the micro metal pads, pillars or bumps of COCs are facing down).

(7) (now turning the whole structure upside down) Forming copper pads or pillars, or solder bumps on or over the exposed top surfaces of the metal via contacts of the FOISD, (here side of the semiconductor IC chips with transistors are facing up, or the side of the micro metal pads, pillars or bumps of COCs are facing up) by performing an embossing electroplating copper process.

(8) Separating, cutting or dicing the molding material, including separating, cutting or dicing through materials or structures between two neighboring multichip packaged logic drives. The material (for example, polymer) filling gaps between chips of two neighboring multichip packages is separated, cut or diced to from an individual unit of multichip package.

The BISD provides additional interconnection metal layer or layers at the top or the backside of the multichip package, and provides the copper or nickel pads, copper pillars, or solder bumps in an area array at the top of the multichip package including at locations vertically over the backside of the SIC/COCs of the multichip package, wherein the copper or nickel pads, copper pillars, or solder bumps are connected or coupled to a transistor of the SIC/COCs through the TSVs, TGVs or TPVs of the VIE chips or components. The TSVs, TGVs or TPVs of the VIE chips or components are used for connecting or coupling circuits or components (for example, the FOISD) at the frontside of the multichip to that (for example, the BISD) at the backside of the multichip package. A copper pad or pillar, or solder bump of the copper pads or pillars, or solder bumps at the bottom (the FOISD side, that is, the front sides of SIC/COCs having micro metal pads, pillars or bumps are facing down) of the separated or diced multichip package may be vertically under a SIC/COCs of the SIC/COCs, and couple or connect (for signal, clock, power supply Vcc, or ground reference Vss) to a copper or nickel pad, copper pillar, or solder bump of the copper or nickel pads, copper pillars, or solder bumps vertically over the SIC/COC through a metal interconnect of the FOISD, the TSV, TGV or TPV of the VIE chip or component and a metal interconnect of the BISD, wherein the copper pad or pillar, or solder bump at the bottom of the separated or diced multichip package may couple to a transistor of the SIC/COC. Each separated or diced multichip package may comprise (a) a plurality of semiconductor IC chips and one or a plurality of VIE chips or components; (b) a plurality of COCs and one or a plurality of VIE chips or components: or, (c) one or a plurality of semiconductor IC chips, one or a plurality of COCs, and one or a plurality of VIE chips or components.

Another aspect of the disclosure provides a Fan-Out Interconnection Technology (FOIT) with FOISD and BISD for making or fabricating a single-chip package or single-COC package using the VIE chips or components. The single-chip package or single-COC package comprises the FOISD and BISD. The single-chip or single-COC package may comprise only one semiconductor IC chip and at least one of the VIE chips or components; or, only one first type chip-on-chip component or package and at least one of the VIE chips or components; or, only one second type chip-on-chip component or package and at least one of the VIE chips or components. The single-chip package or single-COC package is formed using the same or similar process steps as forming the multichip package with the FOISD and BISD as described and specified above, except:

(A) In Step (1), the semiconductor IC chips flip chip bonded or assembled to the FOISD on the temporary substrate for a process batch may be of the same product or device of the semiconductor IC chips (or CIOCs). For example, the semiconductor IC chips (or COCs) used in one wafer or panel process batch may be of only one of following products or devices: (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) the processing or computing IC chip, for example CPU, GPU, DSP, TPU, APU or ASIC chip, or (iv) the memory IC chip, for example, the non-volatile NAND or NOR flash chip, or High Bandwidth DRAM or SRAM Memory (HBM) chip.

(B) In Step (8), separating, cutting or dicing the finished wafer or panel, to form a unit of single-chip package or single-COC package, wherein the unit of single-chip package or single-COC package may comprise only one semiconductor IC chip and one or a plurality of VIE chips or components; or, only one COC and one or a plurality of VIE chips or components. The single-chip or single-COC package (SIC/COC) has copper pads or pillars, or solder bumps in an area array at the bottom (the side which the frontside of the SIC/COC with micro metal pads, pillars or bumps is facing), wherein the copper pads or pillars, or solder bumps connecting or coupling to the SIC/COC may be vertically under the SIC/COC. The single-chip or single-COC package has copper or nickel pads, copper pillars, or solder bumps in the area array at the top (the backside of the SIC/COC without micro metal pads, pillars or bumps). For an example, a copper pad or pillar, or solder bump of the copper pads or pillars, or solder bumps at the bottom (the FOISD side, that is, the frontside of the SIC/COC with micro metal pads, pillars or bumps is facing down) of the separated or diced single-chip or single-COC package may couple or connect to a copper or nickel pad, copper pillar, or solder bump of the copper or nickel pads, copper pillars, or solder bumps on or over the exposed top surfaces of the TSVs, TGVs or TPVs of the VIE chips or components through a metal interconnect of the FOISD and a TSV, TGV or TPV of one of the VIE chips or components (for signal, clock, power supply Vcc and/or ground reference Vss), wherein the copper pad or pillar, or solder bump at the bottom of the separated or diced single-chip or single-COC package may be vertically under the SIC/COC, and couple to a transistor of the SIC/COC. For another example, a copper or nickel pad, copper pillar, or solder bump of the copper or nickel pads, copper pillars, or solder bumps on or over the exposed top surfaces of the TSVs, TGVs or TPVs of the VIE chips or components may couple or connect (for signal, clock, power supply Vcc and/or ground reference Vss) to the transistors of the SIC/COC through one of the TSVs, TGVs or TPVs in one of the VIE chips or components and a metal interconnect of the FOISD, for signal, clock, power supply Vcc and/or ground reference Vss.

Another aspect of the disclosure provides an interposer for flip-chip assembly or packaging in forming the multichip package comprising the semiconductor IC chips or COCs (SIC/COCs) and the VIE chips or components. The multi-chip package may comprise one or a plurality of standard commodity FPGA chips and be used for the logic drive. The multi-chip package is based on multiple-Chips-On-an-Interposer (COIP) flip-chip packaging method. The interposer or substrate in the COIP multi-chip package comprises: (1) high density interconnects for fan-out and interconnection between the semiconductor IC chips (or COCs), between the VIE chips or components and/or between the semiconductor IC chip (or COCs) and the VIE chip or component, wherein the semiconductor IC chips (or COICs) and the VIE chips or components are to be flip-chip-assembled, bonded or packaged on or over the interposer, (2) micro copper pads or pillars, or solder bumps on or over the high density interconnects, (3) deep metal vias or shallow metal vias in the interposer. The process steps for forming the interposer of multichip packages are as follows:

(1) Providing a substrate. The substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the substrate may be silicon, metal, ceramics, glass, steel, plastics, polymer, epoxy-based polymer, or epoxy-based compound. As an example, a silicon wafer may be used, in the following paragraphs, as a substrate in forming a silicon interposer.

(2) Forming metal vias in the substrate. Silicon wafer is used as an example in forming the metal vias in the substrate. The bottom surface of the metal vias in the silicon wafer are exposed in a latter process steps in forming the multichip package of the logic drive, therefore, the metal vias become through vias, and the through vias are the Trough-Silicon-Vias (TSVs).

(3) Forming a First Interconnection Scheme on or of the Interposer (FISIP). The metal lines or traces, and metal vias (between two neighboring metal layers) of the FISIP are formed by the single damascene copper processes or the double damascene copper processes. The FISIP may comprise 2 to 10 layers, or 3 to 6 layers of interconnection metal layers. The metal lines or traces of the interconnection metal layers of FISIP have the adhesion layer (Ti or TiN, for example) and the copper seed layer at both the bottom and the sidewalls of the metal lines or traces.

The metal lines or traces in the FISIP are coupled or connected to the micro copper bumps or pillars of the IC chips in or of the logic drive, and coupled or connected to the TSVs in the substrate of the interposer. The thickness of the metal lines or traces of the FISIP, either formed by the single-damascene process or by the double-damascene process, is, for example, between 3 nm and 500 nm, between 10 nm and 1,000 nm, or between 10 nm and 2,000 nm, or, thinner than or equal to 50 nm, 100 nm, 200 nm, 300 nm, 500 nm, 1,000 nm, 1,500 nm or 2,000 nm. The minimum width of the metal lines or traces of the FISIP is, for example, equal to or smaller than 50 nm, 100 nm, 150 nm, 200 nm, 300 nm, 500 nm, 1,000 nm, 1,500 nm or 2,000 nm. The minimum space between two neighboring metal lines or traces of the FISIP is, for example, equal to or smaller than 50 nm, 100 nm, 150 nm, 200 nm, 300 nm, 500 nm, 1,000 nm, 1,500 nm or 2,000 nm. The minimum pitch of the metal lines or traces of the FISIP is, for example, equal to or smaller than 100 nm, 200 nm, 300 nm, 400 nm, 600 nm, 1,000 nm, 3,000 nm or 4,000 nm. The thickness of the inter-metal dielectric layer has a thickness, for example, between 3 nm and 500 nm, between 10 nm and 1,000 nm, or between 10 nm and 2,000 nm, or, thinner than or equal to 50 nm, 100 nm, 200 nm, 300 nm, 500 nm, 1,000 nm or 2,000 nm. The metal lines or traces of the FISIP may be used as the programmable interconnection.

(4) Forming a Second Interconnection Scheme of the Interposer (SISIP) on or over the FISIP structure. The SISIP comprises multiple interconnection metal layers, with an inter-metal dielectric layer between two neighboring interconnection metal layers. The metal lines or traces, and the metal vias are formed by the embossing electroplating copper processes. The SISIP may comprise 1 to 5 layers, or 1 to 3 layers of interconnection metal layers. The metal lines or traces of the interconnection metal layers of SISIP have the adhesion layer (Ti or TiN, for example) and the copper seed layer at the bottoms of the metal lines or traces, but not at a sidewall of the metal lines or traces. Alternatively, the SISIP on or of the interposer may be omitted, and the COIP only has FISIP interconnection scheme on the substrate of the interposer. Alternatively, the FISIP on or of the interposer may be omitted, and the COIP only has SISIP interconnection scheme on the substrate of the interposer.

The thickness of the metal lines or traces of SISIP is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISIP is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISIP may be used as the programmable interconnection.

(5) Forming micro copper pads, pillars or bumps: (i) on the top surface of the top-most interconnection metal layer of SISIP, exposed in openings in the topmost insulating dielectric layer of the SISIP, or (ii) on the top surface of the top-most interconnection metal layer of FISIP, exposed in openings in the topmost insulating dielectric layer of the FISIP in the case that the SISIP is omitted. An embossing electroplating copper process, as described and specified in above paragraphs, is performed to form the micro copper pillars or bumps on or over the interposer.

Another aspect of the disclosure provides a method for forming a COIP multi-chip package using an interposer comprising the FISIP, the SISIP, micro copper pads, bumps or pillars and TSVs based on a flip-chip assembled multi-chip packaging technology and process. The multichip package may comprise one or a plurality of standard commodity FPGA chips and be used for the logic drive. The process steps for forming the COIP multi-chip package with the BISD are described as below:

(1) Performing flip-chip assembling, bonding or packaging: (a) First providing the interposer comprising the FISIP, the SISIP, micro copper pads, bumps or pillars and TSVs, the semiconductor IC chips (or COCs), and the VIE chips or components; then flip-chip assembling, bonding or packaging the semiconductor IC chips (or COCs) and the VIE chips or components to and on the interposer. The interposer is formed as described and specified above. The semiconductor IC chips comprise (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) processing and/or computing IC chip, for example CPU, GPU, DSP, TPU, APU or ASIC chip, and/or (iv) memory IC chip, for example, the non-volatile NAND and/or NOR flash chip, and/or High Bandwidth DRAM or SRAM Memory (HBM) chip. The COCs are as described and specified above. All the semiconductor IC chips (or COCs) and the VIE chips or components to be flip-chip packaged in the multichip package comprise micro metal pads, pillars or bumps on their surface; (b) The micro metal pads, pillars or bumps of the semiconductor IC chips (or COCs) and the VIE chips or components are flip-chip assembled, bonded or packaged on or to corresponding micro copper pads, bumps or pillar on or of the interposer with the side or surface of the chip with transistors of the semiconductor IC chips faced down, or the side or surface of the COC with micro metal pads, pillars or bumps faced down. The backside of the silicon substrate of the chips (the side or surface without transistors) or the COCs (the side or surface without micro metal pads, pillars or bumps) is faced up; (c) Filling the spaces or gaps between the interposer and the semiconductor IC chips or COCs (and between micro copper bumps or pillars of the semiconductor IC chips (or COCs) and the interposer), and between the interposer and the VIE chips or components (and between micro metal pads, pillars or bumps of the VIE chips or components and the interposer) with an underfill material by, for example, a dispensing method using a dispenser.

(2) Applying a material, resin, or compound to fill the spaces or gaps between the semiconductor IC chips (or COCs), between the VIE chips or components, and between the semiconductor IC chips (or COCs) and the VIE chips or components, to cover the backside surfaces of the semiconductor IC chips (or COCs) and the VIE chips or components by methods, for example, spin-on coating, screen-printing, dispensing or molding in the wafer or panel format. The molding method includes the compress molding (using top and bottom pieces of molds) or the casting molding (using a dispenser). The material, resin, or compound used may be a polymer material includes, for example, polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. Applying a CMP, polishing or grinding process to planarize the surface of the applied material, resin or compound, until a level where the backside surfaces of all TSVs of the VIE chips or components are fully exposed.

(3) Depositing an insulating dielectric layer (for example a polymer layer) on the top side (the opposite side of the side with interposer) of the multichip package; that is, on or over (i) the exposed backside of the semiconductor IC chips (or COCs), (ii) the exposed backside of the VIE chips or components and (iii) the spaces or gaps between the semiconductor IC chips (or COCs), between the VIE chips or components, and between the semiconductor IC chips (or COCs) and the VIE chips or components. Forming openings in the insulating dielectric layer to expose the top surfaces of the TSVs, TGVs or TPVs in the VIE chips or components.

(4) Forming a Backside metal Interconnection Scheme at the backside of the multichip-packaged logic drive or device (abbreviated as BISD in below) on or over the second insulating dielectric layer, and the exposed surfaces (of the TSVs, TGVs or TPVs in the VIE chips or components) in the openings in the second insulating dielectric layer. The BISD may comprise metal lines, traces, or planes in one or a plurality of interconnection metal layers, and is formed on or over the backsides of the semiconductor IC chips and the VIE chips or components, or, on or over the backsides of the COC and the VIE chips or components. The metal lines or traces of the interconnection metal layers of the BISD are over the SIC/COCs and the VIE chips or components and extend horizontally across the edges of the SIC/COCs or the VIE chips or components. The BISD may be formed using the same or similar process steps, materials and specification as in forming the BISD in the FOIT multichip package (with the FISD) described above. The BISD provides additional interconnection metal layer or layers at the top or the backside of the multichip package.

(5) Forming copper or nickel pads, copper pillars, or solder bumps on or over exposed surfaces of the top-most metal interconnection layer (of the BISD) at the bottom of openings in the top-most insulting dielectric layer of the BISD. The copper or nickel pads, copper pillars, or solder bumps in an area array at the top of the multichip package including at locations vertically over the backside of the SIC/COCs of the multichip package. The copper or nickel pads, copper pillars, or solder bumps are formed by performing an embossing electroplating copper process.

(6) Thinning the interposer to expose the surfaces of the metal vias (in the silicon substrate) at the backside of the interposer. A wafer or panel thinning process, for example, a CMP process, a polishing process or a wafer backside grinding process, may be performed to remove portion of the wafer or panel to make the wafer or panel thinner, in a wafer or panel process, to expose the surfaces of the metal vias (in the silicon substrate) at the backside of the interposer; the metal vias in the silicon substrate are therefore become through silicon vias (TSVs).

(7) (now turning the whole structure upside down) Depositing an insulating dielectric layer (for example a polymer layer) on the top side (the side of the side with interposer) of the multichip package, forming openings in the insulating dielectric layer to expose the top surfaces of TSVs in the silicon substrate of the interposer. Forming copper pads or pillars, or solder bumps on or over the exposed top surfaces of the TSVs in the interposer. (the side of the semiconductor IC chips with transistors is facing up, or the side of the COCs with micro metal pads, pillars or bumps is facing up) by performing an embossing electroplating copper process.

(8) Separating, cutting or dicing the molding material, including separating, cutting or dicing through materials or structures between two neighboring multichip packages. The material (for example, polymer) filling gaps between chips of two neighboring multichip packages is separated, cut or diced to from an individual unit of multichip package.

The BISD provides additional interconnection metal layer or layers at the top or the backside of the multichip package, and provides the copper or nickel pads, copper pillars, or solder bumps in an area array at the top of the multichip package including at locations vertically over the backside of the SIC/COCs of the multichip package, wherein the copper or nickel pads, copper pillars, or solder bumps are connected or coupled to a transistor of the SIC/COCs through the TSVs, TGVs or TPVs of the VIE chips or components. The TSVs, TGVs or TPVs of the VIE chips or components are used for connecting or coupling circuits or components (for example, the FISIP and/or SISIP of the interposer) at the frontside of the multichip to that (for example, the BISD) at the backside of the multichip package. A copper pad or pillar, or solder bump of the copper pads or pillars, or solder bumps at the bottom (the interposer side, that is, the front sides of SIC/COCs having micro metal pads, pillars or bumps are facing down) of the separated or diced multichip package may be vertically under a SIC/COCs of the SIC/COCs, and couple or connect (for signal, clock, power supply Vcc, or ground reference Vss) to a copper or nickel pad, copper pillar, or solder bump of the copper or nickel pads, copper pillars, or solder bumps vertically over the SIC/COC through a metal interconnect of the FISIP and/or SISIP of the interposer, the TSV, TGV or TPV of the VIE chip or component and a metal interconnect of the BISD, wherein the copper pad or pillar, or solder bump at the bottom of the separated or diced multichip package may couple to a transistor of the SIC/COC. Each separated or diced multichip package may comprise (a) a plurality of semiconductor IC chips and one or a plurality of VIE chips or components; (b) a plurality of COCs and one or a plurality of VIE chips or components: or, (c) one or a plurality of semiconductor IC chips, one or a plurality of COCs, and one or a plurality of VIE chips or components.

Another aspect of the disclosure provides a Chip-On-Interposer (COIP) with the interposer and the BISD for making or fabricating a single-chip package or single-COC package using the VIE chips or components. The single-chip package or single-COC package comprises the interposer and the BISD. The single-chip package may comprise only one semiconductor IC chip and at least one of the VIE chips or components; the single-COC package may comprise only one COC and at least one of the VIE chips or components. The single-chip package or single-COC package is formed using the same or similar process steps as forming the COIP multichip package with BISD as described and specified above, except:

(A) In Step (1), the semiconductor IC chips (or COCs) flip chip assembled to the interposer for a process batch may be of the same product or device of the semiconductor IC chip (or COC). For example, the semiconductor IC chips used in one wafer or panel process batch may be of only one of following products or devices: (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) the processing or computing IC chip, for example CPU, GPU, DSP, TPU, APU or ASIC chip, or (iv) the memory IC chip, for example, the non-volatile NAND or NOR flash chip, or High Bandwidth DRAM or SRAM Memory (HBM) chip.

(B) In Step (8), separating, cutting or dicing the finished wafer or panel, to form a unit of single-chip package or single-COC package, wherein the unit of single-chip package (or single-COC package) may comprise only one semiconductor IC chip (or COC) and one or a plurality of VIE chips or components. The single-chip or single-COC package (SIC/COC) has copper pads or pillars, or solder bumps in an area array at the bottom (the side which the frontside of the SIC/COC with micro metal pads, pillars or bumps is facing), wherein the copper pads or pillars, or solder bumps connecting or coupling to the SIC/COC may be vertically under the SIC/COC. The single-chip or single-COC package has copper or nickel pads, copper pillars, or solder bumps in the area array at the top (the backside of the SIC/COC without micro metal pads, pillars or bumps). For an example, a copper pad or pillar, or solder bump of the copper pads or pillars, or solder bumps at the bottom (the interposer side, that is, the frontside of the SIC/COC with micro metal pads, pillars or bumps is facing down) of the separated or diced single-chip or single-COC package may couple or connect to a copper or nickel pad, copper pillar, or solder bump of the copper or nickel pads, copper pillars, or solder bumps on or over the exposed top surfaces of the TSVs, TGVs or TPVs of the VIE chips or components through a metal interconnect of the FISIP and/or SISIP of the interposer and a TSV, TGV or TPV of one of the VIE chips or components (for signal, clock, power supply Vcc and/or ground reference Vss), wherein the copper pad or pillar, or solder bump at the bottom of the separated or diced single-chip or single-COC package may be vertically under the SIC/COC, and couple to a transistor of the SIC/COC. For another example, a copper or nickel pad, copper pillar, or solder bump of the copper or nickel pads, copper pillars, or solder bumps on or over the exposed top surfaces of the TSVs, TGVs or TPVs of the VIE chips or components may couple or connect (for signal, clock, power supply Vcc and/or ground reference Vss) to the transistors of the SIC/COC through one of the TSVs, TGVs or TPVs in one of the VIE chips or components and a metal interconnect of the FISIP and/or SISIP of the interposer, for signal, clock, power supply Vcc and/or ground reference Vss.

Another aspect of the disclosure provides an Interconnection Substrate (IS) for flip-chip assembly or packaging in forming the multi-chip package. The multi-chip package is based on multiple-Chips (or COCs)-On-an-Interconnection-Substrate (COIS) flip-chip packaging method. The multichip package comprising one or a plurality of standard commodity FPGA chips may be used as a logic drive. The Interconnection Substrate (IS) in the COIS multi-chip package comprises: (1) Fineline Interconnection Bridges (FIB) comprising a silicon substrate with high density interconnects, metal vias and fine pitch metal pads, on or over the silicon substrate, for fan-out and interconnection between the semiconductor IC chips (or COCs), between the semiconductor IC chips (or COCs) and the VIE chips, between a semiconductor IC chip and a VIE chip or component, wherein the semiconductor IC chips (or COCs) and the VIE chips or components are flip-chip-assembled, bonded or packaged on or over the IS, (2) The Printed Circuit Board, for example, Ball-Grid-Array substrates (BGA), with lower density interconnects, metal vias and coarse metal pads, wherein the FIBs are embedded in the PCBs or BGAs. The PCBs or BGAs comprise bismaleimide triazine (BT) and/or Ajinomoto Build-up Film (ABF). The semiconductor IC chips or COCs (SIC/COCs), and the VIE chips or components to be flip-chip assembled, bonded or packaged to the IS are mentioned, described and specified above. The semiconductor IC chips comprise (i) the standard commodity FPGA chip, (ii) the dedicated control chip, (iii) the dedicated I/O chip, (iv) the dedicated control and I/O chip, (v) the ASIC chip, (vi) the processing and/or computing IC chip, for example CPU, GPU, DSP, TPU, APU and/or ASIC chip, and/or (vii) the memory IC chip, for example, the nonvolatile NAND and/or NOR flash chip, and/or High Bandwidth DRAM or SRAM Memory (HBM) chip. The Fineline Interconnection Bridge (FIB) embedded in PCBs or BGAs comprises: (1) a silicon substrate; (2) a First Interconnection Scheme on or of the Interconnection Bridge (FISIB) on or over the silicon substrate formed by the damascene copper electroplating process, same or similar to that of the FISIP of the interposer described and specified above; (3) a Second Interconnection Scheme of the Interconnection Bridge (SISIB) on or over the FISIB structure, formed by the embossing copper electroplating process, same or similar to that of the SISIP of the interposer described and specified above; (4) micro copper pads, pillars or bumps on or over the SISIB.

The Interconnect Substrate (IS) is a Printing Circuit Board, for example, a BGA, based on the process steps of forming printing circuit boards. One or a plurality of Fineline Interconnection Bridges (FIBs) specified and described above are embedded in an IS in processes of forming the IS. The IS comprises: (1) a base structure, for example, a 5-2-5 BGA, two metal layers of the hard core (comprising BT), and five build-up layers (comprising ABF) on each side of the hard core with openings, dips or holes therein; (2) the FIB embedded or housed in the openings, dips or holes in the base structure; (3) multiple metal interconnection layers on or over the base structure and the FIBs; (4) a plurality of copper pads, pillars or bumps on or over a top surface of the top-most interconnection metal layer of IS.

Another aspect of the disclosure provides a method for forming the multichip package in a COIS multi-chip package comprising the semiconductor IC chips (or COCs) and one or a plurality of the VIE chips or components. The multichip package comprising one or a plurality of standard commodity of the FPGA chips may be used as the logic drive. The COIS multi-chip package uses the IS comprising the FISIB, the SISIB, copper pads or pillars, or solder bumps based on a flip-chip assembled multi-chip packaging technology and process. The process steps for forming the COIS multi-chip package are described as below:

(1) Performing flip-chip assembling, bonding or packaging: (a) First providing the interconnection substrate (IS) comprising the FISIS, the SISIB, copper pads or pillars at the top, semiconductor IC chips or COCs (SIC/COCs), and the VIE chips or components; then flip-chip assembling, bonding or packaging the SIC/COC, and the VIE chips or components to the copper pads or pillars at the top of the IS. The IS is formed as described and specified above. The SIC/COCs and the VIE chips or components to be assembled, bonded or packaged to the IS include the semiconductor IC chips or COCs mentioned, described and specified above. The semiconductor IC chips comprise (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) processing and/or computing IC chip, for example CPU, GPU, DSP, TPU, APU or ASIC chip, and/or (iv) memory IC chip, for example, the non-volatile NAND and/or NOR flash chip, and/or High Bandwidth DRAM or SRAM Memory (HBM) chip. The COCs are as described and specified above. All semiconductor IC chips (or COCs) and the VIE chips or components to be flip-chip packaged in the multi-chip package comprise micro metal pads, pillars or bumps; (b) The SIC/COC and the VIE chips or components are flip-chip assembled, bonded or packaged on or to corresponding copper pads or pillars on the top of the IS with the side or surface of the semiconductor chip with transistors faced down, and the side or surface of the COC with the micro metal pads, pillars or bumps faced down. That is, the high density, small size micro metal pads, pillars or bumps (HDB) on the IC chips (or COCs) and the VIE chips or components are flip-chip assembled to the corresponding high density, small size copper pads or pillars (HDP) on the top of the IS; and, the low density, large size micro metal pads, pillars or bumps (LDB) on the IC chips (or COCs) and the VIE chips or components are flip-chip assembled to the corresponding low density, large size copper pads or pillars (LDP) on the top of the IS. The backside of the silicon substrate of the semiconductor IC chips (the side or surface without transistors) is faced up, or the backside of the silicon substrate of the COCs (the side or surface without micro metal pads, pillars or bumps) is faced up; (c) Filling an underfill material in the gaps (i) between the IS and the IC chips (or COCs) (and between micro copper pillars or bumps of the IC chips (or COCs) on the IS) (ii) between the IS and the VIE chips or components (and between micro copper pillars or bumps of the VIE chips or components on the IS).

(2) Applying a material, resin, or compound to fill the gaps or spaces (i) between the semiconductor IC chips (or COCs), (ii) between the VIE chips or components and (iii) between the semiconductor IC chip (or COC) and the VIE chip or component, and cover the backside surfaces of semiconductor IC chips (or COCs) and the VIE chips or components by methods, for example, spin-on coating, screen-printing, dispensing or molding in the wafer or panel format. The material, resin, or compound used may be a polymer material includes, for example, polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. Applying a CMP, polishing or grinding process to planarize the surface of the applied material, resin or compound. The CMP, or grinding process is performed until a level where the backside surfaces of all of the semiconductor IC chips (or COCs) and the VIE chips or components are fully exposed, and the backside surfaces of TSVs, TGVs or TPVs of the VIE chips or components are fully exposed.

(3) Depositing an insulating dielectric layer (for example a polymer layer) on the top side (the opposite side of the side with IS) of the multichip package, forming openings in the insulating dielectric layer, exposing the top (backside) surfaces of the TSVs, TGVs or TPVs in the VIE chips or components, and forming copper or nickel pads, copper pillars, or solder bumps on or over the exposed top surfaces of the TSVs, TGVs or TPVs in the VIE chips or components, by performing an embossing electroplating copper process.

(4) Forming a Backside metal Interconnection Scheme at the backside of the multichip-packaged logic drive or device (abbreviated as BISD in below) on or over the second insulating dielectric layer, and the exposed surfaces (of the TSVs, TGVs or TPVs in the VIE chips or components) in the openings in the second insulating dielectric layer. The BISD may comprise metal lines, traces, or planes in one or a plurality of interconnection metal layers, and is formed on or over the backsides of the semiconductor IC chips and the VIE chips or components, or, on or over the backsides of the COC and the VIE chips or components. The metal lines or traces of the interconnection metal layers of the BISD are over the SIC/COCs and the VIE chips or components and extend horizontally across the edges of the SIC/COCs or the VIE chips or components. The BISD may be formed using the same or similar process steps, materials and specification as in forming the BISD in the FOIT multichip package (with the FISD) described above. The BISD provides additional interconnection metal layer or layers at the top or the backside of the multichip package.

(5) Forming copper or nickel pads, copper pillars, or solder bumps on or over exposed surfaces of the top-most metal interconnection layer (of the BISD) at the bottom of openings in the top-most insulting dielectric layer of the BISD. The copper or nickel pads, copper pillars, or solder bumps in an area array at the top of the multichip package including at locations vertically over the backside of the SIC/COCs of the multichip package. The copper or nickel pads, copper pillars, or solder bumps are formed by performing an embossing electroplating copper process.

(6) (now turning the whole structure upside down) Forming copper pads or pillars, or solder bumps on or over the exposed top surfaces of the metal contacts of the IS, (here side of the semiconductor IC chips with transistors are facing up, or the side of the micro metal pads, pillars or bumps of COCs are facing up) by performing an embossing electroplating copper process.

(7) Separating, cutting or dicing the finished panel, including separating, cutting or dicing through materials or structures between two neighboring multichip packaged logic drives. The material (for example, polymer) filling gaps or spaces between two neighboring multichip packaged logic drives is separated, cut or diced to form individual unit of logic drives.

The BISD provides additional interconnection metal layer or layers at the top or the backside of the multichip package, and provides the copper or nickel pads, copper pillars, or solder bumps in an area array at the top of the multichip package including at locations vertically over the backside of the SIC/COCs of the multichip package, wherein the copper or nickel pads, copper pillars, or solder bumps are connected or coupled to a transistor of the SIC/COCs through the TSVs, TGVs or TPVs of the VIE chips or components. The TSVs, TGVs or TPVs of the VIE chips or components are used for connecting or coupling circuits or components (for example, the FISIB and/or SISIB of the IS) at the frontside of the multichip to that (for example, the BISD) at the backside of the multichip package. A copper pad or pillar, or solder bump of the copper pads or pillars, or solder bumps at the bottom (the IS side, that is, the front sides of SIC/COCs having micro metal pads, pillars or bumps are facing down) of the separated or diced multichip package may be vertically under a SIC/COCs of the SIC/COCs, and couple or connect (for signal, clock, power supply Vcc, or ground reference Vss) to a copper or nickel pad, copper pillar, or solder bump of the copper or nickel pads, copper pillars, or solder bumps vertically over the SIC/COC through a metal interconnect of the FISIB and/or SISIB of the IS, the TSV, TGV or TPV of the VIE chip or component and a metal interconnect of the BISD, wherein the copper pad or pillar, or solder bump at the bottom of the separated or diced multichip package may couple to a transistor of the SIC/COC. Each separated or diced multichip package may comprise (a) a plurality of semiconductor IC chips and one or a plurality of VIE chips or components; (b) a plurality of COCs and one or a plurality of VIE chips or components: or, (c) one or a plurality of semiconductor IC chips, one or a plurality of COCs, and one or a plurality of VIE chips or components.

Another aspect of the disclosure provides a Chip-On-Interconnection-Substrate Technology (COIS) with IS and BISD for making or fabricating a single-chip package or single-COC package using the VIE chips or components. The single-chip package comprises the IS and BISD. The single-chip package single-chip package is formed using the same or similar process steps as forming the multichip package with the IS and BISD as described and specified above, except:

(A) In Step (1), the semiconductor IC chips (or COC) flip chip bonded or assembled to the IS for a process batch may be of the same product or device of the semiconductor IC chip (or COC). For example, the semiconductor IC chips used in one wafer or panel process batch may be of only one of following products or devices: (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) the processing or computing IC chip, for example CPU, GPU, DSP, TPU, APU or ASIC chip, or (iv) the memory IC chip, for example, the non-volatile NAND or NOR flash chip, or High Bandwidth DRAM or SRAM Memory (HBM) chip.

(B) In Step (7), separating, cutting or dicing the finished wafer or panel, to form a unit of single-chip package or single-COC package, wherein the unit of single-chip package may comprise only one semiconductor IC chip and one or a plurality of VIE chips or components, and single-chip package may comprise only one COC and one or a plurality of VIE chips or components. The single-chip or single-COC package (SIC/COC) has copper pads or pillars, or solder bumps in an area array at the bottom (the side which the frontside of the SIC/COC with micro metal pads, pillars or bumps is facing), wherein the copper pads or pillars, or solder bumps connecting or coupling to the SIC/COC may be vertically under the SIC/COC. The single-chip or single-COC package has copper or nickel pads, copper pillars, or solder bumps in the area array at the top (the backside of the SIC/COC without micro metal pads, pillars or bumps). For an example, a copper pad or pillar, or solder bump of the copper pads or pillars, or solder bumps at the bottom (the IS side, that is, the frontside of the SIC/COC with micro metal pads, pillars or bumps is facing down) of the separated or diced single-chip or single-COC package may couple or connect to a copper or nickel pad, copper pillar, or solder bump of the copper or nickel pads, copper pillars, or solder bumps on or over the exposed top surfaces of the TSVs, TGVs or TPVs of the VIE chips or components through a metal interconnect of the FISIB and/or SISIB of the IS and a TSV, TGV or TPV of one of the VIE chips or components (for signal, clock, power supply Vcc and/or ground reference Vss), wherein the copper pad or pillar, or solder bump at the bottom of the separated or diced single-chip or single-COC package may be vertically under the SIC/COC, and couple to a transistor of the SIC/COC. For another example, a copper or nickel pad, copper pillar, or solder bump of the copper or nickel pads, copper pillars, or solder bumps on or over the exposed top surfaces of the TSVs, TGVs or TPVs of the VIE chips or components may couple or connect (for signal, clock, power supply Vcc and/or ground reference Vss) to the transistors of the SIC/COC through one of the TSVs, TGVs or TPVs in one of the VIE chips or components and a metal interconnect of the FISIB and/or SISIB of the IS, for signal, clock, power supply Vcc and/or ground reference Vss.

Another aspect of the disclosure provides the multichip package with a plurality of the semiconductor IC chips (or COCs) and one or a plurality of the VIE chips or components for use in a 3D stacked chip package, wherein the multichip package may be in a standard format, layout or having a standard size. The standard multichip package is formed using one of the methods described and specified above: (i) the FOIT multichip package with the FISD and BISD, (ii) the FOIT multichip package with the FOISD and BISD, (iii) the COIP multichip package using the interposer and with the BISD, or (iv) the COIS multichip package using the IS (comprising FIBs) and with the BISD. The standard multichip package may be in a shape of square or rectangle, with a certain widths, lengths and thicknesses; and/or with a standard layout of the locations of the copper pads or pillars, or solder bumps at its bottom, and a standard layout of the locations of the copper or nickel pads, copper pillars, or solder bumps at its top. An industry standard may be set for the shape and dimensions of the standard multichip package. For example, the standard shape of the standard multichip package may be a square, with a width smaller than or equal to 4 mm, 7 mm, 10 mm, 12 mm, 15 mm, 20 mm, 25 mm, 30 mm, 35 mm or 40 mm, and having a thickness thinner than or equal to 0.03 mm, 0.05 mm, 0.1 mm, 0.3 mm, 0.5 mm, 1 mm, 2 mm, 3 mm, 4 mm, or 5 mm. Alternatively, the standard shape of the standard multichip package may be a rectangle, with a width smaller than or equal to 3 mm, 5 mm, 7 mm, 10 mm, 12 mm, 15 mm, 20 mm, 25 mm, 30 mm, 35 mm or 40 mm, and a length smaller than or equal to 5 mm, 7 mm, 10 mm, 12 mm, 15 mm, 20 mm, 25 mm, 30 mm, 35 mm, 40 mm, 45 mm or 50 mm; and having a thickness thinner than or equal to 0.03 mm, 0.05 mm, 0.1 mm, 0.3 mm, 0.5 mm, 1 mm, 2 mm, 3 mm, 4 mm, or 5 mm. The copper pads or pillars, or solder bumps at the bottom (the side the semiconductor IC chips with transistors is facing, or the side the COCs with micro metal pads, pillars or bumps is facing) may be in an area array with a standard layout, wherein the locations of the copper pads or pillars, or solder bumps are at standard coordinates in a horizontal plane. The copper or nickel pads, copper pillars, or solder bumps at the top (the side the semiconductor IC chips without transistors is facing, or the side the COCs without micro metal pads, pillars or bumps is facing) of the standard multichip package may be also in the area array with a standard layout, wherein the locations of the copper or nickel pads, copper pillars, or solder bumps are at standard coordinates in a horizontal plane, wherein the copper or nickel pads, copper pillars, or solder bumps may be at locations vertically over the semiconductor IC chips (or COCs) and may be connecting or coupling to the frontside of the semiconductor IC chips (or COCs). Each of all or more than 10, 20, 30, 50, or 100 copper pads or pillars, or solder bumps at the bottom of a standard multichip package has a copper or nickel pads, copper pillars, or solder bumps at the top of the standard multichip package vertically over it. The standard layout or locations of the copper pads or pillars, or solder bumps at the bottom of a standard multichip package are the same as the standard layout or locations of the copper or nickel pads, copper pillars, or solder bumps at the top of the standard multichip package; therefore the bottom of a standard multichip package may be stacked on the top of another standard multichip package.

Another aspect of the disclosure provides the standard single-chip package or single-COC package with a semiconductor IC chip (or COC) and one or a plurality of the VIE chips or components for use in the 3D stacked chip package, wherein the single-chip package or single-COC package may be in a standard format, layout or having a standard size. The standard single-chip package is formed using one of the methods described and specified above: (i) the FOIT single-chip package or single-COC package with the FISD and BISD, (ii) the FOIT single-chip package or single-COC package with the FOISD and BISD, (iii) the COIP single-chip package or single-COC package using the interposer and with the BISD, or (iv) the COIS single-chip package or single-COC package using the IS (comprising FIBs) and with the BISD. The standard single-chip package or single-COC package may be in a shape of square or rectangle, with a certain widths, lengths and thicknesses; and/or with a standard layout of the locations of the copper pads or pillars, or solder bumps at its bottom and with a standard layout of the locations of the copper or nickel pads, copper pillars, or solder bumps at its top. An industry standard may be set for the shape and dimensions of the standard single-chip package. For example, the standard shape of the standard single-chip package or single-COC package may be a square, with a width smaller than or equal to 3 mm, 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the standard single-chip package or single-COC package may be a rectangle, with a width smaller than or equal to 2 mm, 3 mm, 5 mm, 7 mm, 10 mm, 12 mm, 15 mm, 20 mm, 25 mm, 30 mm, 35 mm or 40 mm, and a length smaller than or equal to 4 mm, 5 mm, 7 mm, 10 mm, 12 mm, 15 mm, 20 mm, 25 mm, 30 mm, 35 mm, 40 mm, 45 mm or 50 mm; and having a thickness thinner than or equal to 0.03 mm, 0.05 mm, 0.1 mm, 0.3 mm, 0.5 mm, 1 mm, 2 mm, 3 mm, 4 mm, or 5 mm. The copper pads or pillars, or solder bumps at the bottom (the side the semiconductor IC chips with transistors is facing down, or the side the COCs with micro metal pads, pillars or bumps is facing down) may be in an area array with a standard layout, wherein the locations of the copper pads or pillars, or solder bumps are at standard coordinates in a horizontal plane. The copper or nickel pads or pillars, or solder bumps at the top (the side the semiconductor IC chips without transistors is facing up, or the side the COCs without micro metal pads, pillars or bumps is facing up) of the standard single chip package may be may be also in an area array with a standard layout, wherein the locations of the copper or nickel pads, copper pillars, or solder bumps are at standard coordinates in a horizontal plane, wherein the copper or nickel pads, copper pillars, or solder bumps may be at locations vertically over the semiconductor IC chip (or COC) and may be connecting or coupling to the frontside of the semiconductor IC chip (or COC). Each of all or more than 10, 20, 30, 50, or 100 copper pads or pillars, or solder bumps at the bottom of a standard multichip package has a copper or nickel pad, copper pillar, or solder bump at the top of the standard multichip package vertically over and aligned with it. The standard layout or locations of the copper pads or pillars, or solder bumps at the bottom of a standard multichip package are the same as the standard layout or locations of the copper or nickel pads, copper pillars, or solder bumps at the top of the standard multichip package; therefore the bottom of a standard multichip package may be stacked on the top of another standard multichip package.

Another aspect of the disclosure provides the standard single-chip package (or single-COC package) and multichip package for use in the 3D chip stacked package, wherein the standard single-chip package (or single-COC package) and the multichip package are as described and specified above. The standard layout or locations are the same for: (i) the copper pads or pillars, or solder bumps at the bottom of a standard multi-chip package; (ii) the copper pads or pillars, or solder bumps at the bottom of a standard single-chip package or single-COC package, (iii) the copper or nickel pads, copper pillars, or solder bumps at the bottom of the standard multi-chip package; and (iv) the copper or nickel pads, copper pillars, or solder bumps at the bottom of the standard single-chip package or single-COC package. Therefore, the bottom of a standard single-chip package or single-COC package may be stacked on the top of a standard multi-chip package to form the 3D stacked chip package. Alternatively, the bottom of a standard multi-chip package may be stacked on the top of a standard single-chip package or single-COC package to form the 3D stacked chip package.

Another aspect of the disclosure provides a multichip package comprising a plurality of semiconductor IC chips and one or more VIE chips or components disposed on a same horizontal plane, wherein the plurality of semiconductor IC chips deliver or achieve a specific function, task, operation or purpose collectively. The multichip package may be the FOIT multichip package based on the FISD interconnection scheme, the FOIT multichip package based on the FOISD interconnection scheme, the COIP multichip package based on the FISIP and/or SISIP interconnection schemes of the interposer, or the COIS multichip package based on the IS interconnection scheme (comprising the FIBs). The multichip package described and specified above may comprise a plurality of semiconductor IC chips, wherein the plurality of semiconductor IC chips may be of different types of products and designs. The different types of semiconductor IC chips in the multichip package provide, collectively, a certain function, operation or purpose for a certain application, innovation or task. For example, the multichip package may comprise: (i) two or more than two FPGA chips for enlargement of the number of logic blocks or cells; (ii) a FPGA chip and a CPU chip for flexibility (provided by the FPGA chip) and programmability (provided by the CPU chip); (iii) a FPGA chip and a GPU chip for flexibility (provided by the FPGA chip) and efficiency (provided by the GPU chip); (iv) a CPU chip and a GPU chip for programmability (provided by the CPU chip) and efficiency (provided by the GPU chip); or (v) a FPGA chip, a CPU chip and a GPU chip for flexibility (provided by the FPGA chip), programmability (provided by the CPU chip) and efficiency (provided by the GPU chip), wherein the multichip package may optionally comprise, in addition, a NAND and/or NOR flash non-volatile memory chip, a High-Bandwidth DRAM Memory (HBM) chip, a High-Bandwidth SRAM Memory (HBM) chip, a High-Bandwidth (HBM) Magnetoresistive Random Access Memory (MRAM) chip, and/or a High-Bandwidth (HBM) Resistive Random Access Memory (RRAM) chip. The multichip package may comprise the FPGA chip or the plurality of FPGA chips, and the NAND and/or NOR flash non-volatile memory chip, and/or, the MRAM or RRAM chip, wherein the NAND and/or NOR flash non-volatile memory chip, and/or, the MRAM or RRAM chip may be used for configuring functions of the FPGA chip or the plurality of FPGA chips, for example, configuring (i) the programmable logic functions or operations, or (ii) the programmable interconnection. For configuring the programmable logic functions or operations, a first data stored in a non-volatile memory cell of the NAND and/or NOR flash non-volatile memory chip, and/or, the MRAM or RRAM chip is used for configuring the FPGA chip to perform a logic operation, wherein the FPGA chip comprises a static-random-access-memory (SRAM) cell of a Look-Up-Table (LUT), configured to store a second data associated with the first data, and a multiplexer comprising a first set of input points for a first input data set for the logic operation and a second set of input points for a second input data set having a data associated with the second data, wherein the multiplexer is configured to select, in accordance with the first input data set, an input data from the second input data set as an output data for the logic operation. For the programmable interconnection, a third data stored in a non-volatile memory cell of the NAND and/or NOR flash non-volatile memory chip, and/or, the MRAM or RRAM chip is used for configuring the FPGA chip to perform programmable interconnection, wherein the FPGA chip comprises a static-random-access-memory (SRAM) cell configured to store a fourth data associated with the third data, a switch having an input point for an input data associated with the fourth data, and first and second programmable interconnects coupling to the switch, wherein the switch is configured to control, in accordance with the input data, connection between the first and second programmable interconnects. In this case the 3D stacked chip package may be used as the logic drive.

Another aspect of the disclosure provides a 3D stacked chip package comprising first and second chip packages (each comprising a single-chip package or a multichip package), wherein the first and second chip packages each comprises one or a plurality of semiconductor IC chips and one or a plurality of VIE chips or components, wherein the plurality of semiconductor IC chips deliver or achieve a specific function, task, operation or purpose collectively. The second chip package may be stacked on the first chip package to form the 3D stacked chip package based on a package-on-package assembly method. Alternatively, the first chip package may be stacked on the second chip package to form the 3D stacked chip package. The first and second chip packages may be the FOIT chip package based on the FISD interconnection scheme, the FOIT chip package based on the FOISD interconnection scheme, the COIP chip package based on the FISIP and/or SISIP interconnection schemes of the interposer, or the COIS chip package based on the IS interconnection scheme (comprising the FIBs). The first and second chip packages described and specified above may comprise one or a plurality of semiconductor IC chips. The different types of semiconductor IC chips in the 3D stacked chip package provide, collectively, a certain function, operation or purpose for a certain application, innovation or task. For example, the first chip package may comprise one or more following logic products or devices: (i) the standard commodity FPGA chip, (ii) an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip, The AS IC chips will be described or specified below, (iii) processing and/or computing IC chip, for example CPU, GPU, DSP, TPU, APU or ASIC chip. The second chip package may comprise one or more following memory products or devices: (i) a NAND and/or NOR flash non-volatile memory chip, (ii) a High-Bandwidth DRAM Memory (HBM) chip, (iii) a High-Bandwidth SRAM Memory (HBM) chip, (iv) a High-Bandwidth (HBM) Magnetoresistive Random Access Memory (MRAM) chip, and/or (v) a High-Bandwidth (HBM) Resistive Random Access Memory (RRAM) chip. The different types of semiconductor IC chips in the first and second chip packages of the 3D stacked chip package may provide, collectively, a certain function, operation or purpose for a certain application, innovation or task, through the through vias in the one or the plurality of VIE chips or components. The first chip package may comprise a FPGA chip and the second chip package may comprise a NAND and/or NOR flash non-volatile memory chip, a High-Bandwidth (HBM) Magnetoresistive Random Access Memory (MRAM) chip, and/or a High-Bandwidth (HBM) Resistive Random Access Memory (RRAM) chip, wherein the NAND and/or NOR flash non-volatile memory chip, and/or, the MRAM or RRAM chip in the second chip package may be used for configuring functions of the FPGA chip in the first chip package, for example, configuring (i) the programmable logic functions or operations, or (ii) the programmable interconnection, of the FPGA chip in the first chip package. For configuring the programmable logic functions or operations, a first data stored in a non-volatile memory cell of the NAND and/or NOR flash non-volatile memory chip, and/or, the MRAM or RRAM chip is used, through the through vias in the one or the plurality of VIE chips or components, for configuring the FPGA chip to perform a logic operation, wherein the FPGA chip comprises a static-random-access-memory (SRAM) cell of a Look-Up-Table (LUT), configured to store a second data associated with the first data (through the through vias in the one or the plurality of VIE chips or components), and a multiplexer comprising a first set of input points for a first input data set for the logic operation and a second set of input points for a second input data set having a data associated with the second data, wherein the multiplexer is configured to select, in accordance with the first input data set, an input data from the second input data set as an output data for the logic operation. For the programmable interconnection, a third data stored in a non-volatile memory cell of the NAND and/or NOR flash non-volatile memory chip, and/or, the MRAM or RRAM chip is used, through the through vias in the one or the plurality of VIE chips or components, for configuring the FPGA chip to perform programmable interconnection, wherein the FPGA chip comprises a static-random-access-memory (SRAM) cell configured to store a fourth data associated with the third data (through the through vias in the one or the plurality of VIE chips or components), a switch having an input point for an input data associated with the fourth data, and first and second programmable interconnects coupling to the switch, wherein the switch is configured to control, in accordance with the input data, connection between the first and second programmable interconnects. In this case the 3D stacked chip package may be used as the logic drive.

Another aspect of the disclosure provides a logic drive in a 3D stacked chip package comprising a standard commodity FPGA IC chip, an NVM (non-volatile memory) IC chip, and an auxiliary or supporting (AS) IC chip, wherein the auxiliary or supporting IC chip comprises a cryptography or security IC chip, I/O or control IC chip, power management IC chip, and/or Innovated ASIC or COT (abbreviated as IAC below) IC chip. The 3D stacked chip package is a FPGA/AS 3D stacked chip package based on the chip packages (single-chip packages or multi-chip packages using the FOIT, COIP or COIS technology) as described and specified above.

The 3D stacked chip package comprising first and second chip packages (comprising a single-chip packages or a multichip packages), wherein the first and second chip packages comprise one or a plurality of semiconductor IC chips and one or more VIE chips or components. The second chip package may be stacked on the first chip package to form the 3D stacked chip package based on a package-on-package assembly method. Alternatively, the first chip package may be stacked on the second chip package to form the 3D stacked chip package. The first and second chip packages may be the FOIT chip package based on the FISD interconnection scheme, the FOIT chip package based on the FOISD interconnection scheme, the COIP chip package based on the FISIP and/or SISIP interconnection schemes of the interposer, or the COIS chip package based on the IS interconnection scheme (comprising the FIBs). As an example, when the 3D stacked chip package comprises the first chip package and the second chip package on or over the first chip package, wherein the first chip package may comprise one or a plurality of FPGA IC chips and one or more VIE chips or components, and the second chip package may comprise one or a plurality of semiconductor IC chips of the AS IC chips. The one or the plurality of semiconductor IC chips of the AS IC chips couples to one or a plurality of FPGA IC chips through the through vias in the one or the plurality of VIE chips or components. Alternatively, the second chip package may be replaced by a bare-die chip or chips comprising one or a plurality of semiconductor IC chips of the AS IC chips, wherein the bare-die chip or chips are flip-chip assembled on the first chip package comprising one or a plurality of FPGA IC chips and one or more VIE chips or components; and wherein an underfill material may be filled in between the first chip package and the AS chip or chips. As another example, when the 3D stacked chip package comprises the first chip package and the second chip package, wherein the first chip package is on or over the second chip package, wherein the first chip package may comprise one or a plurality of FPGA IC chips, and the second chip package may comprise one or a plurality of semiconductor IC chips of the AS IC chips and one or more VIE chips or components. The one or the plurality of semiconductor IC chips of the AS IC chips couples to one or a plurality of FPGA IC chips through the through vias in the one or the plurality of VIE chips or components. Alternatively, the first chip package may be replaced by a bare-die chip or chips comprising one or a plurality of FPGA IC chips, wherein the bare-die chip or chips (FPGA IC chip or chips) are flip-chip assembled on the second chip package comprising one or a plurality of semiconductor IC chips of the AS IC chips; and wherein an underfill material may be filled in between the bare-die FPGA IC chip or chips and the second chip package comprising the AS chip or chips. The different types of the AS IC chips in the 3D stacked chip package provide a certain function, operation or purpose collectively with the one or the plurality of FPGA IC chips in the 3D stacked chip package for a certain application, innovation or task.

Another aspect of the disclosure provides a logic drive in a 3D stacked chip package comprising a standard commodity FPGA IC chip, an NVM (non-volatile memory) IC chip, and an auxiliary or supporting (AS) IC chip, wherein the auxiliary or supporting IC chip is a cryptography or security IC chip. The 3D stacked chip package is a FPGA/AS 3D stacked chip package based on the chip packages (single-chip packages or multi-chip packages using the FOIT, COIP or COIS technology) as described and specified above. The NVM IC chip is packaged using the same method as that of the AS IC chip. The FPGA IC chip may be configured to perform a logic function by configuring data or information in the memory cells thereof (for example, SRAM cells) of LUTs for logic operations, and/or of configurable cross-point switches for programmable interconnections in the FPGA IC chips, wherein the configuring data or information in the memory cells of the FPGA IC chip may be stored, saved and backup in the non-volatile memory cells of the NVM IC chip in the same 3D stacked chip package. When the power supply of the logic drive is turned on, the configuring data or information in the non-volatile memory cells of the NVM IC chip is passing or transferring to the SRAM memory cells of the FPGA IC chip through the TSVs, TGVs or TPVs of the VIE chip component in the 3D stacked chip package. The logic drive may comprise cryptography or security circuits (encryption/decryption circuits and cryptography key or password) for protection of the developed configuration data or information (related to the innovation, architecture, algorithm and/or applications) for the FPGA IC chip in the logic drive, wherein the encryption/decryption circuits is controlled and secured by the cryptography key or password. In some cases, the cryptography key or password is stored in non-volatile memory cells comprising the FGMOS (Floating-Gate MOS) NVM cells, MRAM cells, RRAM cells, FRAM cells, e-fuses or anti-fuses on the FPGAIC chip. While in this aspect of disclosure, the cryptography or security circuits are included in the auxiliary or supporting IC chip, that is the cryptography or security IC chip. The cryptography or security IC chip comprises non-volatile memory cells comprising the FGMOS NVM cells, MRAM cells, RRAM cells, FRAM cells, e-fuses or anti-fuses for saving or storing the cryptography key or password for security purpose. The cryptography or security IC chip couples to the FPGA IC chip through the TSVs, TGVs or TPVs of the VIE chip or component in the 3D stacked chip package. The auxiliary or supporting IC chip (the cryptography or security IC chip) may be designed and implemented using a technology node more mature or less advanced than the FPGA IC chip. For example, the FPGA IC chip may be designed and implemented using a technology node more advanced than 20 nm or 10 nm, while the cryptography or security IC chip may be designed and implemented using a technology node less advanced than 20 nm or 30 nm. The semiconductor technology node used to fabricate the FPGA IC chip is more advanced than that used to fabricate the cryptography or security IC chip. For example, the FPGA IC chip may be designed and implemented using FINFET or GAAFET (Gate-All-Around Field-Effect-Transistor) transistors, while the cryptography or security IC chip may be designed and implemented using conventional planar MOSFET transistors. The purposes, functions and specifications of the FPGA IC chip, NVM IC chip and the cryptography or security IC chip in the FPGA/AS 3D stacked chip package are as described above. The logic drive in the FPGA/AS 3D stacked chip package becomes a nonvolatile programmable device with security when comprising (i) the FPGA IC chip; (ii) the NVM IC chip to store, save and backup the configuration data for configuring the standard commodity FPGA IC chip; and (iii) the cryptography or security IC chip comprising the cryptography or security circuits (including the encryption/decryption circuit and the cryptography key or password).

Another aspect of the disclosure provides a logic drive in a 3D stacked chip package comprising a standard commodity FPGA IC chip, an NVM IC chip, and an auxiliary or supporting IC chip, wherein the auxiliary or supporting IC chip is an I/O or control IC chip. The I/O or control circuits on the FPGA IC chip (as described and specified above) may be separated from the FPGA IC chip to form the auxiliary or supporting IC chip, that is the I/O or control IC chip. The FPGA IC chip, NVM IC chip, and auxiliary or supporting IC chip (the I/O or control IC chip) may be packaged in a FPGA/AS 3D stacked chip package, as described and specified above. The 3D stacked chip package is a FPGA/AS 3D stacked chip package based on the chip packages (single-chip packages or multi-chip packages using the FOIT, COIP or COIS technology) as described and specified above. The NVM IC chip is packaged using the same method as that of the AS IC chip. The purposes, functions and specifications of the FPGA IC chip, NVM IC chip and the I/O or control IC chip in the multichip package are as described above.

When the I/O or control circuits on the FPGA IC chip (as described and specified above) are separated from the FPGA IC chip to form the auxiliary or supporting IC chip (the I/O or control IC chip), the FPGA IC chip may become a standard commodity product. None or minimal area of the standard commodity FPGA IC chip is used for the control or I/O circuits, for example, less than 15%, 10%, 5%, 2% or 1% area (not counting the seal ring of the scribe line and the dicing area of the chip; that means, only including area up to the inner boundary of the seal ring) is used for the control or IO circuits; or, none or minimal transistors of the standard commodity FPGA IC chip are used for the control or I/O circuits, for example, less than 15%, 10%, 5%, 2% or 1% of the total number of transistors are used for the control or I/O circuits. All or most area of the standard commodity FPGA IC chip is used for (i) logic blocks comprising logic gate arrays, computing units or operators, and/or Look-Up-Tables (LUTs) and multiplexers, and/or (ii) programmable interconnection. For example, greater than 85%, 90%, 95% or 99% area of the standard commodity FPGA IC chip (not counting the seal ring and the dicing area of the chip; that means, only including area up to the inner boundary of the seal ring) is used for logic blocks, and/or programmable interconnection; or, all or most transistors of the standard commodity FPGA IC chip are used for logic blocks or repetitive arrays, and/or programmable interconnection, for example, greater than 85%, 90%, 95% or 99% of the total number of transistors are used for logic blocks, and/or programmable interconnection.

The auxiliary or supporting chip (the I/O or control IC chip) is designed, implemented and fabricated using varieties of semiconductor technology nodes or generations, including old or matured technology nodes or generations, for example, a semiconductor node or generation less advanced than or equal to, or above or equal to 20 nm, 30 nm, 40 nm, 50 nm, 90 nm, 130 nm, 250 nm, 350 nm, or 500 nm. The semiconductor technology node or generation used in the I/O or control chip is 1, 2, 3, 4, 5 or greater than 5 nodes or generations older, more matured or less advanced than that used in the standard commodity FPGA IC chip packaged in the same logic drive. Transistors used in the I/O or control IC chip may be a Fully Depleted Silicon-on-insulator (FDSOI) MOSFET, a Partially Depleted Silicon-on-insulator (PDSOI) MOSFET or a conventional planar MOSFET.

Transistors used in the I/O or control IC chip may be different from that used in the standard commodity FPGA IC chip packaged in the same logic drive; for example; the I/O or control IC chip may use the conventional planar MOSFET, while the standard commodity FPGA IC chip packaged in the same logic drive may use the FINFET or GAAFET. The power supply voltage (Vcc) used in the I/O or control IC chip may be greater than or equal to 1.5V, 2.0 V, 2.5V, 3 V, 3.3V, 4V, or 5V, while the power supply voltage (Vcc) used in the standard commodity FPGA IC chip packaged in the same logic drive may be smaller than or equal to 1.8V, 1.5V, or 1 V. The power supply voltage used in the I/O or control IC chip may be higher than that that used in the standard commodity FPGA IC chip packaged in the same logic drive; for example, the I/O or control IC chip may use a power supply of 3.3V, while the standard commodity FPGA IC chip packaged in the same logic drive may use a power supply voltage of 1V; or the I/O or control IC chip may use a power supply of 2.5V, while the standard commodity FPGA IC chip packaged in the same logic drive may use a power supply of 0.75V. The gate oxide (physical) thickness of the Field-Effect-Transistors (FETs) used in the I/O or control IC chip may be thicker than or equal to 5 nm, 6 nm, 7.5 nm, 10 nm, 12.5 nm, or 15 nm, while the gate oxide (physical) thickness of FETs used in the standard commodity FPGA IC chip packaged in the same logic drive may be thinner than 4.5 nm, 4 nm, 3 nm or 2 nm. The gate oxide (physical) thickness of FETs used in the I/O or control IC chip may be thicker than that used in the standard commodity FPGA IC chip packaged in the same logic drive; for example, the I/O or control IC chip may use a FET having a gate oxide with a (physical) thickness of 10 nm, while the standard commodity FPGA IC chip packaged in the same logic drive may use a FET having a gate oxide with a (physical) thickness of 3 nm; or the I/O or control IC chip may use a FET having a gate oxide with a (physical) thickness of 7.5 nm, while the standard commodity FPGA IC chip packaged in the same logic drive may use a FET having a gate oxide with a (physical) thickness of 2 nm. The I/O or control IC chip provides input and output circuits, and ESD protection circuits for the logic drive. The I/O or control IC chip provides (i) large drivers or receivers, or I/O circuits for connecting or coupling to external or outside (of the logic drive) circuits, and (ii) small drivers or receivers, or I/O circuits for connecting or coupling to IC chips in or of the logic drive. The large drivers or receivers, or I/O circuits for connecting or coupling to external or outside (of the logic drive) circuits have driving capability, loading, output capacitance or input capacitance lager or bigger than that of the small drivers or receivers, or I/O circuits for connecting or coupling to IC chips in or of the logic drive. The FPGA IC chip provides only the small drivers or receivers, or I/O circuits for connecting or coupling to the small drivers or receivers, or I/O circuits on the I/O or control IC chip and other IC chips in or of the logic drive. The driving capability, loading, output capacitance, or input capacitance of each of the large I/O drivers or receivers, or I/O circuits for connecting or coupling to external or outside (of the logic drive) circuits may be between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. Each of the large input/output (I/O) circuits may have an I/O power efficiency greater than 3, 5 or 10 pico-Joules per bit, per switch or per voltage swing. The driving capability, loading, output capacitance, or input capacitance of each of the small I/O drivers or receivers, or I/O circuits for connecting or coupling to IC chips in or of the logic drive may be between 0.1 pF and 5 pF, 0.1 pF and 2 pF or 0.1 pF and 1 pF; or smaller than 10 pF, 5 pF, 3 pF, 2 pF or 1 pF. Each of the small input/output (I/O) circuits may have an I/O power efficiency smaller than 0.5 pico-Joules per bit, per switch or per voltage swing, or between 0.01 and 0.5 pico-Joules per bit, per switch or per voltage swing. The size of ESD protection device on the I/O or control IC chip is larger than that on the standard commodity FPGA IC chip in the same logic drive. The size of the ESD device in the large I/O circuits on the I/O or control IC chip may be between 0.5 pF and 20 pF, 0.5 pF and 15 pF, 0.5 pF and 10 pF, 0.5 pF and 5 pF or 0.5 pF and 2 pF; or larger than 0.5 pF, 1 pF, 2 pF, 3 pF, 5 pF or 10 pF. The size of the ESD device in the small I/O circuits on the I/O or control IC chip and the standard commodity FPGA IC chip may be between 0.1 pF and 2 pF, or 0.1 pF and 1 pF; or smaller than 0.5 pF, 1 pF, or 2 pF. For example, a bi-directional (or tri-state) I/O pad or circuit on the I/O or control IC chip may be used for the large I/O drivers or receivers, or I/O circuits for connecting or coupling to external or outside (of the logic drive) circuits, and may comprise an ESD circuit, a receiver, and a driver, and each may have an input capacitance, output capacitance or driving capability between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. The bi-directional (or tri-state) I/O pad or circuit used for the large I/O drivers or receivers, or I/O circuits may have an I/O power efficiency greater than 3, 5 or 10 pico-Joules per bit, per switch or per voltage swing. For example, a bi-directional (or tri-state) I/O pad or circuit on the I/O or control IC chip and the standard commodity FPGA IC chip may be used for the small I/O drivers or receivers, or I/O circuits for connecting or coupling to IC chips in or of the logic drive, and may comprise an ESD circuit, a receiver, and a driver, and may have an input capacitance, output capacitance or driving capability between 0.1 pF and 2 pF or 0.1 pF and 2 pF; or smaller than 2 pF or 1 pF. The bi-directional (or tri-state) I/O pad or circuit used for the small I/O drivers or receivers, or I/O circuits may have an I/O power efficiency smaller than 0.5 pico-Joules per bit, per switch or per voltage swing, or between 0.01 and 0.5 pico-Joules per bit, per switch or per voltage swing.

The I/O or control IC chip in the multichip package of the standard commodity logic drive may comprise a buffer and/or driver circuits for (i) downloading the programing codes from the non-volatile memory cells on the non-volatile IC chip in the logic drive to the 5T or 6T SRAM cells of the programmable interconnection on the standard commodity FPGA IC chip through the TSVs, TGVs or TPVs of the VIE chip or component. The programming codes from the non-volatile IC chip in the logic drive may go through the buffer or driver in or of the I/O or control IC chip before getting into the 5T or 6T SRAM cells of the programmable interconnection on the standard commodity FPGA IC chips. The buffer in or of the I/O or control IC chip may latch the data from the non-volatile IC chip and increase the bit-width of the data. For example, the data bit-width (in a SATA standard) from the non-volatile IC chip is 1 bit, and the buffer may latch the 1 bit data in each of the plurality of SRAM cells in the buffer on the non-volatile IC chip, and output the data stored or latched in the plurality of SRAM cells (on the I/O or control IC chip) in parallel and simultaneously to increase the data bit-width; for example, equal to or greater than 4, 8, 16, 32, or 64 data bit-width. For another example, the data bit-width (in a PCIe standard) from the non-volatile IC chip is 32 bits, the buffer on the non-volatile IC chip may increase the data bit-width to equal to or greater than 64, 128, or 256 data bit-width. The driver in or of the I/O or control IC chip may further amplify the data signals from the non-volatile IC chip; (ii) downloading data from the non-volatile memory cells on the non-volatile IC chip in the logic drive to the 5T or 6T SRAM cells of the LUTs on the standard commodity FPGA IC chip through the TSVs, TGVs or TPVs of the VIE chip component. The data from the non-volatile IC chip in the logic drive may go through the buffer or driver in or of the I/O or control IC chip before getting into the 5T or 6T SRAM cells of LUTs on the standard commodity FPGA IC chip. The buffer in or of the I/O or control IC chip may latch the data from the non-volatile IC chip and increase the bit-width of the data. For example, the data bit-width (in a SATA standard) from the non-volatile IC chip is 1 bit, the buffer on the non-volatile IC chip may latch the 1 bit data in each of the plurality of SRAM cells in the buffer, and output the data stored or latched in the plurality of SRAM cells (on the I/O or control IC chip) in parallel and simultaneously to increase the data bit-width; for example, equal to or greater than 4, 8, 16, 32, or 64 data bit-width. For another example, the data bit-width (in a PCIe standard) from the non-volatile IC chip is 32 bits, the buffer may increase the data bit-width to equal to or greater than 64, 128, or 256 data bit-width. The driver in or of the I/O or control IC chip may further amplify the data signals from the non-volatile IC chip.

The I/O or control IC chip in the multichip package of the standard commodity logic drive may comprise I/O circuits or pads (and micro metal pads, pillars or bumps) for I/O ports comprising one or more than one (2, 3, 4, or more than 4) Universal Serial Bus (USB) ports, one or more than one wide-bit I/O ports, one or more than one SerDes ports, one or more than one thunderbolt ports, one or more than one Serial Advanced Technology Attachment (SATA) ports, one or more than one Peripheral Components Interconnect express (PCIe) ports, one or more IEEE 1394 ports, one or more Ethernet ports, one or more than one audio ports or serial ports, RS-232 or COM (communication) ports, wireless transceiver I/O ports, and/or Bluetooth transceiver I/O ports. The I/O or control IC chip may comprise I/O circuits or pads (or micro copper pillars or bumps) for connecting or coupling to Serial Advanced Technology Attachment (SATA) ports, Peripheral Components Interconnect express (PCIe) ports, wide-bit I/O ports for communicating, connecting or coupling with the memory storage drive.

Another aspect of the disclosure provides a logic drive in a 3D stacked chip package comprising a standard commodity FPGA IC chip, an NVM IC chip, and an auxiliary or supporting IC chip, wherein the auxiliary or supporting IC chip is a power management IC chip. The power management IC chip, comprising a voltage regulator, provides power supply voltages for the FPGA IC chip through the TSVs, TGVs or TPVs of the VIE chip component. The FPGA IC chip, NVM IC chip, and auxiliary or supporting IC chip may be packaged in a FPGA/AS 3D stacked chip package as described and specified above. The 3D stacked chip package is a FPGA/AS 3D stacked chip package based on the chip packages (single-chip packages or multi-chip packages using the FOIT, COIP or COIS technology) as described and specified above. The NVM IC chip is packaged using the same method as that of the AS IC chip. The auxiliary or supporting IC chip (the power management IC chip) may be designed and implemented using a technology node more mature or less advanced than the FPGA IC chip. For example, the FPGA IC chip may be designed and implemented using a technology node more advanced than 20 nm or 10 nm, while the power management IC chip may be designed and implemented using a technology node less advanced than 20 nm or 30 nm. The semiconductor technology node used to fabricate the FPGA IC chip is more advanced than that used to fabricate the power management IC chip. For example, the FPGA IC chip may be designed and implemented using FINFET or GAAFET transistors, while the power management IC chip may be designed and implemented using conventional planar MOSFET transistors. The purposes, functions and specifications of the FPGA IC chip, NVM IC chip and the power management IC chip in the 3D stacked chip package are as described above.

Another aspect of the disclosure provides a logic drive in a 3D stacked chip package comprising a standard commodity FPGA IC chip, an NVM IC chip, and an auxiliary or supporting IC chip, wherein the auxiliary or supporting IC chip is an Innovated ASIC or COT (abbreviated as IAC below) IC chip. The FPGA IC chip, NVM IC chip and IAC IC chip, may be packaged in a FPGA/AS 3D stacked chip package as described and specified above, wherein the IAC IC chip couples to the standard commodity FPGA IC chip through the TSVs, TGVs or TPVs in the VIE chip component. The 3D stacked chip package is a FPGA/AS 3D stacked chip package based on the chip packages (single-chip packages or multi-chip packages using the FOIT, COIP or COIS technology) are as described and specified above. The NVM IC chip is packaged using the same method as that of the AS IC chip. As described above, the innovators may implement their innovation using the standard commodity FPGA IC chip (fabricated in the advanced technology nodes more advanced than 20 nm or 10 nm). The IAC IC chip, in addition to the standard commodity FPGA IC chip, provides innovators further freedom to implement their innovation with further customized or personalized capability using less expensive technology nodes less advanced than 20 nm or 30 nm. The semiconductor technology node used to fabricate the FPGA IC chip is more advanced than that used to fabricate the IAC IC chip. For example, the IAC IC chip provides innovators an affordable expense for realizing or implementing their innovated Intellectual Property (IP) circuits, Application Specific circuits, analog circuits, mixed-mode signal circuits, Radio-Frequency (RF) circuits, and/or transmitter, receiver, transceiver circuits, etc. The purposes, functions and specifications of the FPGA IC chip, NVM IC chip and the IAC IC chip in the multichip package are as described above.

The IAC IC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the IAC IC chip is 1, 2, 3, 4, 5 or greater than 5 nodes or generations older, more matured or less advanced than that used in the standard commodity FPGA IC chip packaged in the same logic drive. Transistors used in the IAC IC chip may be a FINFET, a Fully Depleted Silicon-on-insulator (FDSOI) MOSFET, a Partially Depleted Silicon-On-Insulator (PDSOI) MOSFET or a conventional planar MOSFET. Transistors used in the IAC IC chip may be different from that used in the standard commodity FPGA IC chip packaged in the same logic drive; for example, the IAC IC chip may use the conventional planar MOSFET, while the standard commodity FPGA IC chip packaged in the same logic drive may use the FINFET or GAAFET; or the IAC IC chip may use the Fully Depleted Silicon-on-insulator (FDSOI) MOSFET, while the standard commodity FPGA IC chips packaged in the same logic drive may use the FINFET. Since the IAC IC chip in this aspect of disclosure may be designed and fabricated using older or less advanced technology nodes or generations, its NRE cost is cheaper than or less than that of the current ASIC or COT IC chip designed and fabricated using an advanced IC technology node or generation. The NRE cost for designing a current ASIC or COT IC chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT IC chip at the 16 nm technology node or generation is over US $2M, US $5M, or US $10M. Implementing the same or similar innovation and/or application using the logic drive including the IAC IC chip designed and fabricated using more matured or less advanced technology nodes or generations may reduce NRE cost down to less than US $10M, US $7M, US $5M, US $3M or US $1M. Compared to the implementation by developing the current logic ASIC or COT IC chip, the NRE cost of developing the IAC IC chip for use in the standard commodity logic drive to achieve the same or similar innovation and/or application may be reduced by a factor of 2, 5, 10, 20, or 30.

Another aspect of the disclosure provides a logic drive in a 3D stacked chip package comprising a standard commodity FPGA IC chip, a NVM IC chip, and one or a plurality of auxiliary or supporting IC chips, wherein the one or the plurality of auxiliary or supporting IC chips provide one or more than one of any combined functions provided by the cryptography or security IC chip, the I/O or control IC chip, the power management IC chip, and/or the IAC IC chip, as described and specified above. The functions of cryptography or security, I/O or control, the power management and the IAC may be combined in one auxiliary or supporting IC chip, or partitioned into two or three auxiliary or supporting IC chips, or separated in four auxiliary or supporting IC chips. Any of the functions of cryptography or security, I/O or control, the power management and the IAC not included in the one or the plurality of auxiliary or supporting IC chips may be included and kept in the standard commodity FPGA IC chip in the logic drive. The FPGA IC chip, NVM IC chip, and the one or the plurality of auxiliary or supporting IC chips may be packaged in a FPGA/AS 3D stacked chip package as described and specified above, wherein the one or the plurality of auxiliary or supporting IC chips couple to the FPGA IC chip through the TSVs, TGVs or TPVs in the VIE chip or component in the 3D stacked chip package. The purposes, functions and specifications of the FPGA IC chip, NVM IC chip and the one or a plurality auxiliary or supporting IC chips in the 3D stacked chip package are as described above.

Another aspect of the disclosure provides the FPGA/AS 3D stacked chip package, as described and specified above, for use as the logic drive. The logic drive may be in 3 types of the 3D stacked chip packages: (i) the first type of the 3D stacked chip package comprises a standard commodity FPGA IC chip and a NVM IC chip, wherein the standard commodity FPGA IC chip may comprise circuits providing functions of cryptography or security, I/O or control, power management and/or the IAC; (ii) the second type of the 3D stacked chip package comprises the standard commodity FPGA IC chip, the NVM IC chip and an auxiliary or supporting IC chip, wherein the auxiliary or supporting IC chip is one of the cryptography or security IC chip, the I/O or control IC chip, the power management IC chip, or the IAC IC chip, as described and specified above. For this second type, functions of cryptography or security, I/O or control, the power management and the IAC not included in the auxiliary or supporting IC chip may be included and kept in the standard commodity FPGA IC chip in the logic drive; or (iii) the third type of the 3D stacked chip package comprises the standard commodity FPGA IC chip, the NVM IC chip and a plurality of auxiliary or supporting IC chips, wherein the plurality of auxiliary or supporting IC chips provide one or more than one of any combined functions provided by the cryptography or security IC chip, the I/O or control IC chip, the power management IC chip, and/or the IAC IC chip, as described and specified above. For the third type, functions of cryptography or security, I/O or control, the power management and the IAC not included in the plurality of auxiliary or supporting IC chips may be included and kept in the standard commodity FPGA IC chip in the logic drive. The functions of cryptography or security, I/O or control, the power management and the IAC may be combined in one auxiliary or supporting IC chip, or partitioned into two or three auxiliary or supporting IC chips, or separated in four auxiliary or supporting IC chips.

Another aspect of the disclosure provides a standardized commodity logic drive in the chip package or 3D stacked chip package comprising (i) one or a plurality of the standard commodity FPGA chips, (ii) one or a plurality of auxiliary or supporting (AS) IC chips comprising a cryptography or security IC chip, I/O or control IC chip, power management IC chip, and/or Innovated ASIC or COT (abbreviated as IAC below) IC chip, (iii) one or a plurality of the processing or computing IC chips comprising a CPU, GPU, DSP, TPU, APU and/or ASIC chip, or (iv) one or a plurality of the memory IC chips or CSPs (Chip-Scale-Package) comprising a non-volatile NAND or NOR flash chip, or High Bandwidth DRAM or SRAM Memory (HBM) chip or HBM stacked CSP (SCSP). The standardized commodity logic drive is for use in different algorithms, architectures and/or applications requiring logic, computing and/or processing functions by field programming, wherein data stored in the one or the plurality of non-volatile memory IC chips are used for configuring the one or the plurality of FPGA IC chips in the same chip package. The chip package comprises the single-COC package or multichip package, as described and specified above. The 3D stacked chip package is as described or specified above. Uses of the standardized commodity logic drive is analogues to uses of a standardized commodity data storage device or drive, for example, solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

Another aspect of the disclosure provides a method to reduce Non-Recurring Engineering (NRE) expenses for implementing (i) an innovation, (ii) an innovation process or application, and/or (iii) accelerating workload processing or application in semiconductor IC chips by using the standardized commodity logic drive, FIG. 51. The standardized commodity logic drive may comprise: (i) one or a plurality of the standard commodity FPGA chips, (ii) one or a plurality of auxiliary or supporting (AS) IC chips comprising a cryptography or security IC chip, I/O or control IC chip, power management IC chip, and/or Innovated ASIC or COT (abbreviated as IAC below) IC chip, (iii) one or a plurality of the processing or computing IC chips comprising a CPU, GPU, DSP, TPU, APU and/or ASIC chip, or (iv) one or a plurality of the memory IC chips or CSPs (Chip-Scale-Package) comprising a non-volatile NAND or NOR flash chip, or High Bandwidth DRAM or SRAM Memory (HBM) chip or HBM stacked CSP (SCSP). The standardized commodity logic drive may be packaged in a chip package or 3D stacked chip package, wherein the chip package comprises the single-COC package or multichip package, as described and specified above. The 3D stacked chip package is as described or specified above. A person, user, or developer with an innovation and/or an application concept or idea or an aim for accelerating workload processing may purchase the standardized commodity logic drive and develop or write software codes or programs to load into the standardized commodity logic drive to implement his/her innovation and/or application concept or idea; wherein said innovation and/or application (maybe abbreviated as innovation below) comprises (i) innovative algorithms and/or architectures of computing, processing, learning and/or inferencing, and/or (ii) innovative and/or specific applications. The developed software codes or programs related to the innovation are used for configuring the one or a plurality of FPGA IC chips in the chip package or 3D stacked chip package, and may be stored in the one or a plurality of non-volatile memory IC chips in the same chip package or 3D stacked chip package. With non-volatile memory cells in the one or a plurality of non-volatile memory IC chips in the chip package or 3D stacked chip package, the logic drive may be used as an alternative of the ASIC chip fabricated using advanced technology nodes. The standard commodity logic drive comprises one or a plurality of FPGA IC chips fabricated by using advanced technology nodes or generations more advanced than 20 nm or 10 nm. The innovation is implemented in the logic drive by configuring the hardware of FPGA IC chips by altering the data in the 5T or 6T SRAM cells of the programmable interconnection (configurable switches including pass/no-pass switching gates and multiplexers) and/or programmable logic circuits, cells or blocks (including LUTs and multiplexers) therein using the data stored in the non-volatile memory cells in the one or a plurality of non-volatile memory IC chips or the one or a plurality of FPGA IC chips in the chip package or 3D stacked chip package. Compared to the implementation by developing a logic ASIC or COT IC chip, implementing the same or similar innovation and/or application using the logic drive may reduce the NRE cost down to smaller than US $1M by developing a software and installing it in the purchased or rented standard commodity logic drive. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" by using logic drives for innovators to easily and cheaply implement or realize their innovation (algorithms, architectures and/or applications) in semiconductor IC chips fabricated using advanced IC technology nodes more advanced than 20 nm or 10 nm, and for example, using a technology node of 16 nm, 10 nm, 7 nm, 5 nm or 3 nm, FIG. 51. In early days, 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm or 10 nm, and for example to the technology node of 16 nm, 10 nm, 7 nm, 5 nm or 3 nm, only a few giant system or IC design companies, not the public innovators, can afford to use the semiconductor IC foundry fab. It costs about or over 5 million US dollars to develop and implement an IC chip using these advanced technology nodes. The semiconductor IC foundry fab is now not "public innovation platform" anymore, it is "club innovation platform" for club innovators only. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives (comprising FPGA IC chips fabricated using advanced than 20 nm or 10 nm technology nodes) and writing software programs in common programing languages, for example, C, Java, C++, C#, Scala, Swift, Matlab, Assembly Language, Pascal, Python, Visual Basic, PL/SQL or JavaScript languages, at a cost of less than 500K or 300K US dollars. The innovators can install their developed software using their own standard commodity logic drives or rented standard commodity logic drives in data centers or clouds through networks.

Another aspect of the disclosure provides a method to change the current logic ASIC or COT IC chip business into a commodity logic IC chip business, like the current commodity DRAM, or commodity NAND flash memory IC chip business, by using the standardized commodity logic drive. Since the performance, power consumption, and engineering and manufacturing costs of the standardized commodity logic drive may be better than that of the ASIC or COT IC chip for a same innovation (algorithms, architectures and/or applications) or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or NAND flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies.

Another aspect of the disclosure provides the standardized commodity logic drive, wherein a person, user, customer, or software developer, or algorithm/architecture/application developer may purchase the standardized commodity logic drive and write software codes to program the logic drive for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 3B is a schematically top view showing a decoupling capacitor between four vertical through vias (VTVs) in accordance with an embodiment of the present application, wherein FIG. 3A is a schematically cross-sectional view along a cross-sectional line A-A on FIG. 3B.

FIG. 3D is a schematically top view showing a decoupling capacitor among four through silicon vias (TSVs) in accordance with another embodiment of the present application, wherein FIG. 3C is a schematically cross-sectional view along a cross-sectional line B-B on FIG. 3D.

FIG. 23C is a schematically top view showing a second type of multichip package in accordance with a first embodiment of the present application, wherein FIG. 23B is a schematically cross-sectional view along a cross-sectional line C-C on FIG. 23C.

Figure 1A:
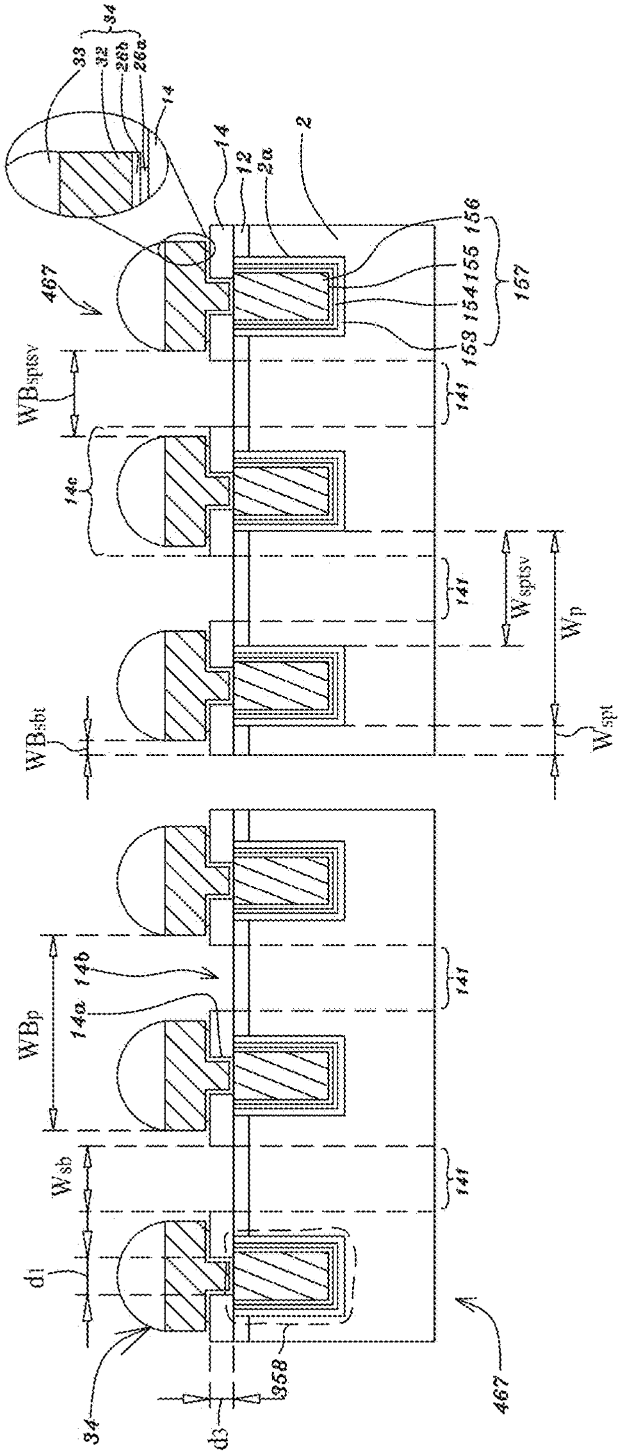
FIGS. 1A and 1B are schematically cross-sectional views showing first and second types of vertical-through-via (VTV) connectors for a first alternative for a first case in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for First and Second Types of Vertical-Through-Via (VTV) Connectors (Vertical-Interconnect-Elevator (VIE) Chips or Components)

A vertical-through-via (VTV) connector is provided with multiple vertical through vias (VTVs) for vertical connection to transmit signals or clocks or deliver power or ground in a vertical direction. The vertical-through-via (VTV) connector may be of a first or second type mentioned as below:

1. First Alternative for First and Second Types of Vertical-Through-Via (VTV) Connectors for Through-Silicon-Via Interconnect Elevators (TSVIEs)

Figure 1B:
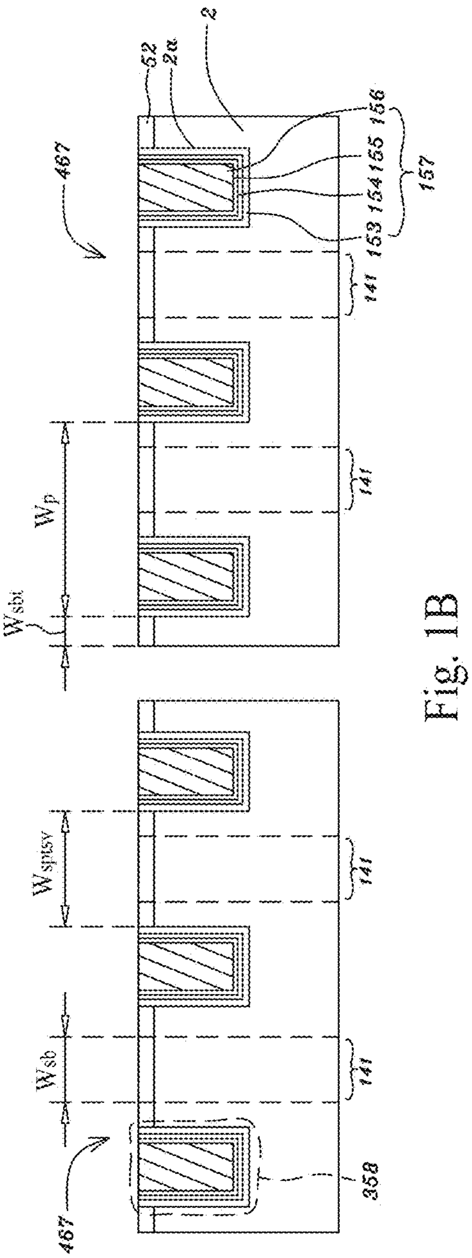
Figure 1C:
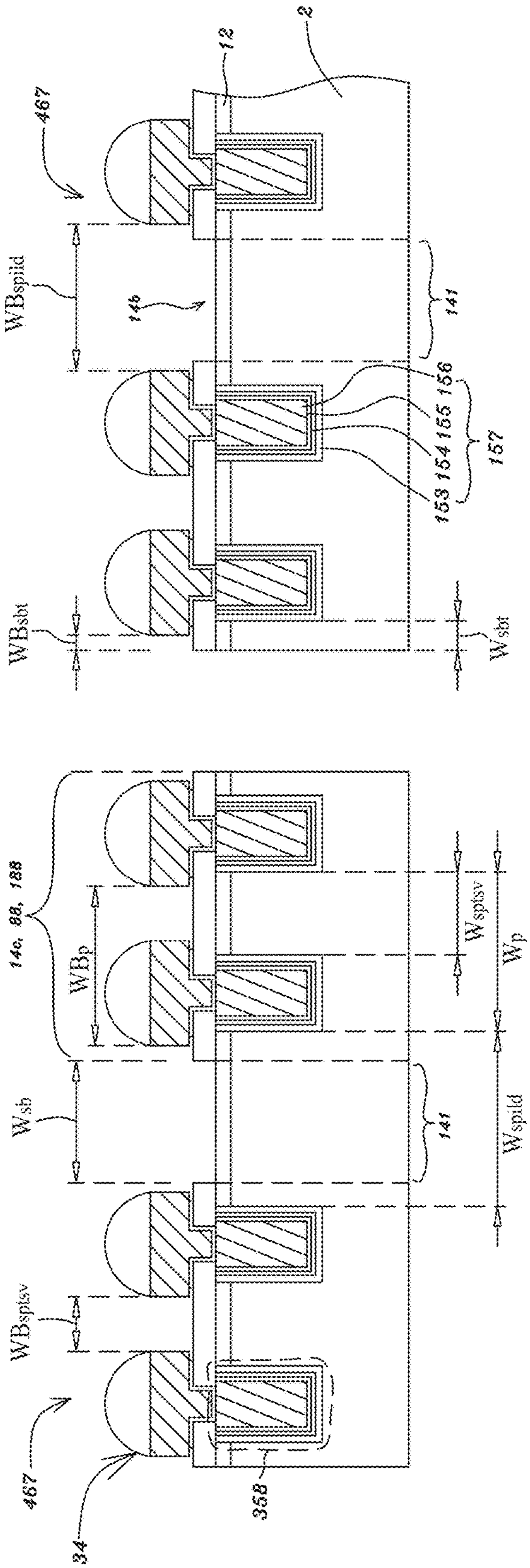
FIGS. 1C and 1D are schematically cross-sectional views showing first and second types of vertical-through-via (VTV) connectors for a first alternative for a second case in accordance with an embodiment of the present application.
Figure 1D:
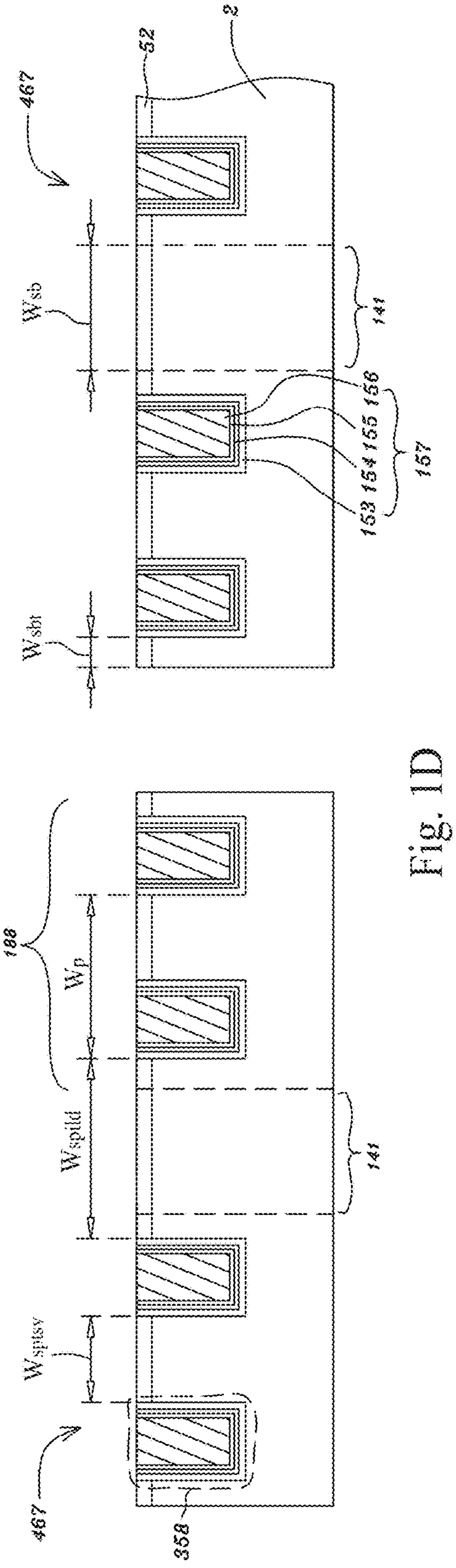
Figure 1E:
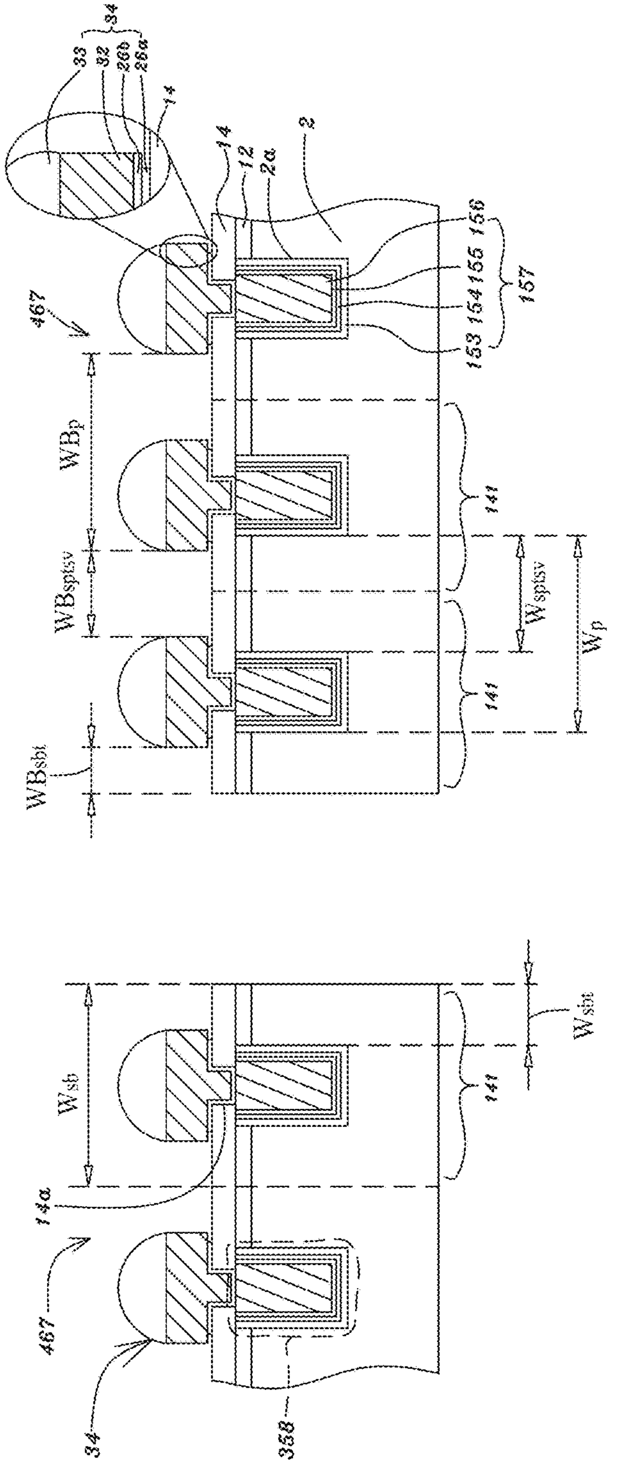
FIGS. 1E and 1F are schematically cross-sectional views showing first and second types of vertical-through-via (VTV) connectors for a first alternative for a third case in accordance with an embodiment of the present application.
Figure 1F:
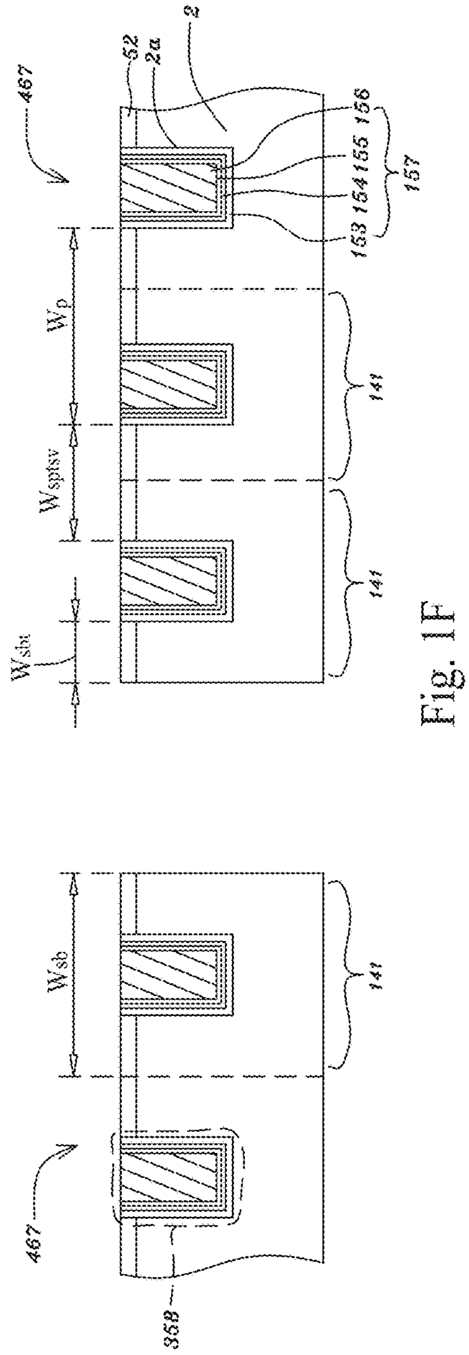

FIGS. 1A and 1B are schematically cross-sectional views showing first and second types of vertical-through-via (VTV) connectors for a first alternative for a first case in accordance with an embodiment of the present application. FIGS. 1C and 1D are schematically cross-sectional views showing first and second types of vertical-through-via (VTV) connectors for a first alternative for a second case in accordance with an embodiment of the present application. FIGS. 1E and 1F are schematically cross-sectional views showing first and second types of vertical-through-via (VTV) connectors for a first alternative for a third case in accordance with an embodiment of the present application.

In a first alternative, referring to each of FIGS. 1A, 1C and 1E, a first type of vertical-through-via (VTV) connectors 467 may include (1) a semiconductor substrate 2, i.e., silicon substrate, (2) an insulating dielectric layer 12 on the semiconductor substrate 2, wherein the insulating dielectric layer 12 may include a silicon-oxide layer having a thickness between 0.1 and 2 μm, and wherein multiple blind holes 2*a* may be formed in the insulating dielectric layer 12 and semiconductor substrate 2, and each of the blind holes 2*a* may have a depth between 30 μm and 2,000 μm and a diameter or largest transverse dimension between 2 μm and 20 μm or between 4 μm and 10 μm, and (3) multiple through silicon vias (TSVs) 157 each in one of the blind holes 2*a*, wherein each of the through silicon vias (TSVs) 157 may vertically extend in one of the blind holes 2*a* in the semiconductor substrate 2 and through the insulating dielectric layer 12. Each of the through silicon vias (TSVs) 157 may include (1) an insulating lining layer 153, such as a layer of thermally grown silicon oxide ($SiO_2$), a layer of CVD silicon nitride ($Si_3N_4$) or a combination thereof, on a sidewall and bottom of one of the blind holes 2*a*, (2) a copper layer 156 electroplated in said one of the blind holes 2*a*, wherein the copper layer 156 may have a top surface coplanar with a top surface of the insulating dielectric layer 12, (3) an adhesion layer 154, such as a layer of titanium (Ti) or titanium nitride (TiN) having a thickness between 1 nm to 50 nm, on the insulating lining layer 153, between the insulating lining layer 153 and copper layer 156 and at a sidewall and bottom of the copper layer 156, and (4) a seed layer 155, such as a layer of copper having a thickness between 3 nm and 200 nm, between the adhesion layer 154 and copper layer 156 and at a sidewall and bottom of the copper layer 156. Each of the through silicon vias (TSVs) 157 may be used as a vertical through via (VTV) 358 for a dedicated vertical path. Each of the vertical through vias (VTVs) 358 formed by the through silicon vias (TSVs) may have a depth between 30 μm and 200 μm and a largest transverse dimension, such as diameter or width, between 2 μm and 20 μm or between 4 μm and 10 μm.

Referring to each of FIGS. 1A, 1C and 1E, each of the first type of vertical-through-via (VTV) connectors 467 may further include a passivation layer 14 on a top surface of the insulating dielectric layer 12. The passivation layer 14 may include a mobile ion-catching layer or layers, for example, a combination of silicon nitride, silicon oxynitride, and/or silicon carbon nitride layer or layers deposited by a chemical vapor deposition (CVD) process. For example, the passivation layer 14 may include a silicon-nitride layer having a thickness of more than 0.3 micrometers. Alternatively, the passivation layer 14 may include a polymer layer, such as polyimide, having a thickness between 1 and 5 micrometers. Next, multiple openings 14*a* may be formed in the passivation layer 14 and each of the openings 14*a* may expose the copper layer 156 of one of the through silicon vias (TSVs) 157. Each of the openings 14*a* may have a transverse dimension d, from a top view, between 0.5 and 20 micrometers or between 20 and 200 micrometers. The shape of the opening 14*a* from a top view may be a circle, and the diameter of the circle-shaped opening 14*a* may be between 0.5 and 20 micrometers or between 20 and 200 micrometers. Alternatively, the shape of the opening 14*a* from a top view may be a square, and the width of the square-shaped opening 14*a* may be between 0.5 and 20 micrometers or between 20 and 200 micrometers. Alternatively, the shape of the opening 14*a* from a top view may be a polygon, such as hexagon or octagon, and the polygon-shaped opening 14*a* may have a width between 0.5 and 20 micrometers or between 20 and 200 micrometers. Alternatively, the shape of the opening 14*a* from a top view may be a rectangle, and the rectangle-shaped opening 14*a* may have a shorter width between 0.5 and 20 micrometers or between 20 and 200 micrometers.

Referring to each of FIGS. 1A, 1C and 1E, each of the first type of vertical-through-via (VTV) connectors 467 may further include multiple micro-bumps or micro-pads 34, i.e., metal bumps, pads or conductive interconnects, each on the copper layer 156 of one of the through silicon vias (TSVs) 157 at a bottom of one of the openings 14*a* in the passivation layer 14. The micro-bumps or micro-pads 34 may be of various types. A first type of micro-bump or micro-pad 34 may include (1) an adhesion layer 26*a*, such as titanium (Ti) or titanium nitride (TiN) layer having a thickness between 1 nm and 50 nm, on the copper layer 156 of the through silicon vias (TSVs) 157, (2) a seed layer 26*b*, such as copper, on its adhesion layer 26*a* and (3) a copper layer 32 having a thickness between 1 μm and 60 μm on its seed layer 26*b*.

Alternatively, a second type of micro-bump or micro-pad 34 may include the adhesion layer 26*a*, seed layer 26*b* and copper layer 32 as mentioned above, and may further include, as seen in FIG. 1B, a tin-containing solder cap 33 made of tin or a tin-silver alloy having a thickness between 1 μm and 50 μm on its copper layer 32.

Alternatively, a third type of micro-bump or micro-pad 34 may be a thermal compression bump, including the adhesion layer 26*a* and seed layer 26*b* as mentioned above, and may further include, as seen in any of FIGS. 16A, 18A, 28A, 29A, 35A and 36A, a copper layer 37 having a thickness t3 between 2 μm and 20 μm and a largest transverse dimension w3, such as diameter in a circular shape, between 1 μm and 25 μm on its seed layer 26*b* and a solder cap 38 made of a tin-silver alloy, a tin-gold alloy, a tin-copper alloy, a tin-indium alloy, indium or tin, which has a thickness between 1 μm and 15 μm and a largest transverse dimension, such as diameter in a circular shape, between 1 μm and 15 μm on its copper layer 37. A pitch between neighboring two of the third type of micro-bumps or micro-pads 34 may be between 5 and 30 micrometers or between 10 and 25 micrometers.

Alternatively, a fourth type of micro-bump or micro-pad 34 may be a thermal compression pad, including the adhesion layer 26*a* and seed layer 26*b* as mentioned above, and may further include, as seen in FIG. 18A, a copper layer 48 having a thickness t2 between 1 μm and 20 μm or between 2 μm and 10 μm and a largest transverse dimension w2, such as diameter in a circular shape, between 5 μm and 50 μm, on its seed layer 26*b* and a solder cap 49 made of a tin-silver alloy, a tin-gold alloy, a tin-copper alloy, a tin-indium alloy, indium, tin or gold, which has a thickness between 0.1 μm and 5 μm on its copper layer 48. A pitch between neighboring two of the fourth type of micro-bumps or micro-pads 34 may be between 5 and 30 micrometers or between 10 and 25 micrometers.

In the first alternative, a second type of vertical-through-via (VTV) connector 467 as seen in FIG. 1B, 1D or 1F is similar to the first type of vertical-through-via (VTV) connector 467 as illustrated in FIG. 1A, 1C or 1E respectively, but has none of the passivation layer 14 and micro-bumps or micro-pads 34 as illustrated in FIG. 1A, 1C or 1E and the insulating dielectric layer 12 of the second type of vertical-through-via (VTV) connector 467 as seen in each of FIGS. 1B, 1D and 1F may act as an insulating bonding layer 52.

In the first alternative, for the first case, referring to FIGS. 1A and 1B, a pitch $W_p$ between each neighboring two of the vertical through vias (VTVs) 358 in the semiconductor substrate 2 may range from 20 to 150 micrometers or from 40 to 100 micrometers or may be smaller than 50, 40 or 30 micrometers; and a space $WB_{sptsv}$ between each neighboring two of the vertical through vias (VTVs) 358 in the semiconductor substrate 2 may range from 20 to 150 micrometers or from 40 to 100 micrometers or may be smaller than 50, 40 or 30 micrometers. Multiple trenches 14*b* for reserved scribe lines may be formed in the passivation layer 14 to form multiple insulating-material islands 14*c* between neighboring two of the trenches 14*b*. The vertical through vias (VTVs) 358 arranged in only one line are arranged between neighboring two of the reserved scribe lines 141. Each of the insulating-material islands 14*c* may be aligned with only one of the vertical through vias (VTVs) 358, and one of the openings 14*a* in said each of the insulating-material islands 14*c* may be arranged over said only one of the vertical through vias (VTVs) 358. None of the vertical through vias (VTVs) 358 may be arranged under each of the trenches 14*b*. Accordingly, the pitch $W_p$ and space $W_{sptsv}$ between each neighboring two of the vertical through vias (VTVs) 358 may be greater than a width $W_{sb}$ of the reserved scribe lines 141 or greater than the width $W_{sb}$ of the reserved scribe lines 141 plus two times of a predetermined space $W_{sbt}$ between one of the reserved scribe lines 141 and one of said each neighboring two of the vertical through vias (VTVs) 358 adjacent to said one of the first reserved scribe lines 141. For each of the first and second types of vertical-through-via (VTV) connectors 467, the distance $W_{sbt}$ between its edge and one of its vertical through vias (VTVs) 358 may be smaller than the space $WB_{sptsv}$ between neighboring two of its vertical through vias (VTVs) 358 and optionally its edge may be aligned with an edge of said one of its vertical through vias (VTVs) 358.

In the first alternative, for the second case, referring to FIGS. 1C and 1D, the vertical through vias (VTVs) 358 may be populated regularly in multiple islands or regions 188 of arrays of vertical through vias (VTVs) with the reserved scribe lines 141 each between neighboring two of the islands or regions 188 of arrays of vertical through vias (VTVs). A pitch $W_p$ between each neighboring two of the vertical through vias (VTVs) 358 aligned with one of the islands or regions 188 of arrays of vertical through vias (VTVs) may range from 5 to 50 micrometers or from 5 to 20 micrometers or may be smaller than 50, 40 or 30 micrometers; and a space $WB_{sptsv}$ between neighboring two of the vertical through vias (VTVs) 358 aligned with one of the islands or regions 188 of arrays of vertical through vias (VTVs) may range from 5 to 50 micrometers or from 5 to 20 micrometers or may be smaller than 50, 40 or 30 micrometers. For each of the islands or regions 188 of arrays of vertical through vias (VTVs), its vertical through vias (VTVs) 358 may be arranged in multiple columns and in multiple rows; its insulating-material island 14*c* may be aligned with its vertical through vias (VTVs) 358, and multiple of the openings 14*a* in its insulating-material island 14*c* may be arranged over its vertical through vias (VTVs) 358 respectively. The pitch $W_p$ and space $WB_{sptsv}$ between each neighboring two of the vertical through vias (VTVs) 358 aligned with one of the islands or regions 188 of arrays of vertical through vias (VTVs) may be smaller than the width $W_{sb}$ of the reserved scribe lines 141 and/or smaller than a first space $W_{spild}$ between neighboring two of the vertical through vias (VTVs) 358 aligned with neighboring two of the islands or regions 188 of arrays of vertical through vias (VTVs) respectively and across one of the reserved scribe lines 141 between said neighboring two of the islands or regions 188 of arrays of vertical through vias (VTVs). The space $W_{spild}$ or a width of the trench 14*b* between neighboring two of the insulating-material islands 14*c* may be greater than 50, 40 or 30 micrometers. The space $W_{spild}$ may be greater than the width $W_{sb}$ of the reserved scribe lines 141 or greater than the width $W_{sb}$ of the reserved scribe lines 141 plus two times of a predetermined space $W_{sbt}$ between one of the reserved scribe lines 141 and one of the vertical through vias (VTVs) 358 adjacent to said one of the reserved scribe lines 141. For each of the first and second types of vertical-through-via (VTV) connectors 467, each of its first and second spaces $W_{spild}$ between neighboring two of its vertical through vias (VTVs) 358 and across one of its first and second reserved scribe lines 141 and 142 between said neighboring two of its vertical through vias (VTVs) 358 may be greater than 50 or 40 micrometers, and the distance $W_{sbt}$ between its edge and one of its vertical through vias (VTVs) 358 may be smaller than the space $WB_{sptsv}$ between neighboring two of its vertical through vias (VTVs) 358 and optionally its edge may be aligned with an edge of said one of its vertical through vias (VTVs) 358.

In the first alternative, for the third case, referring to FIGS. 1E and 1F, a pitch $W_p$ between each neighboring two of the vertical through vias (VTVs) 358 in the semiconductor substrate 2 may range from 5 to 50 micrometers or from 5 to 20 micrometers or may be smaller than 50, 40 or 30 micrometers; and a space $WB_{sptsv}$ between neighboring two of the vertical through vias (VTVs) 358 may range from 5 to 50 micrometers or from 5 to 20 micrometers or may be smaller than 50, 40 or 30 micrometers. Each reserved scribe line 141 may extend in line with multiple of the vertical through vias (VTVs) 358 arranged in a line. Accordingly, the pitch $W_p$ and space $W_{sptsv}$ between each neighboring two of the vertical through vias (VTVs) 358 may be smaller than a width $W_{sb}$ of the reserved scribe lines 141 or smaller than the width $W_{sb}$ of the reserved scribe lines 141 plus two times of a predetermined space $W_{sbt}$ between one of the reserved scribe lines 141 and one of the vertical through vias (VTVs) 358 adjacent to said one of the reserved scribe lines 141. For each of the first and second types of vertical-through-via (VTV) connectors 467, the distance $W_{sbt}$ between its edge and one of its vertical through vias (VTVs) 358 may be smaller than the space $WB_{sptsv}$ between neighboring two of its vertical through vias (VTVs) 358 and optionally its edge may be aligned with an edge of said one of its vertical through vias (VTVs) 358, wherein the space $W_{sptsv}$ between neighboring two of its vertical through vias (VTVs) 358 may be smaller than 50, 40 or 30 micrometers.

In the first alternative, for the first case, referring to FIG. 1A, a pitch $WB_p$ between each neighboring two of the first, second, third or fourth type of micro-bumps or micro-pads 34 may range from 20 to 150 micrometers or from 40 to 100 micrometers; and a space $WB_{sptsv}$ between each neighboring two of the first, second, third or fourth type of micro-bumps or micro-pads 34 may range from 20 to 150 micrometers or from 40 to 100 micrometers. The first, second, third or fourth type of micro-bumps or micro-pads 34 arranged in only one line are arranged between neighboring two of the reserved scribe lines 141. Each of the insulating-material islands 14*c* may be aligned with only one of the first, second, third or fourth type of micro-bumps or micro-pads 34, and one of the openings 14*a* in said each of the insulating-material islands 14*c* may be arranged under said only one of the first, second, third or fourth type of micro-bumps or micro-pads 34. Accordingly, the pitch $WB_p$ and space $WB_{sptsv}$ between each neighboring two of the first, second, third or fourth type of micro-bumps or micro-pads 34 may be greater than the width $W_{sb}$ of the second reserved scribe lines 142 or greater than the width $W_{sb}$ of the reserved scribe lines 141 plus two times of a predetermined space $WB_{sbt}$ between one of the reserved scribe lines 141 and one of said each neighboring two of the first, second, third or fourth type of micro-bumps or micro-pads 34 adjacent to said one of the reserved scribe lines 141. For the first type of vertical-through-via (VTV) connector 467, the distance $WB_{sbt}$ between its edge and one of its first, second, third or fourth type of micro-bumps or micro-pads 34 may be smaller than the space $WB_{sptsv}$ between neighboring two of its first, second, third or fourth type of micro-bumps or micro-pads 34 and optionally its edge may be aligned with an edge of said one of its first, second, third or fourth type of micro-bumps or micro-pads 34; alternatively, the distance $WB_{sbt}$ between its edge and one of its first, second, third or fourth type of micro-bumps or micro-pads 34 may be smaller than 50, 40 or 30 micrometers.

In the first alternative, for the second case, referring to FIG. 1C, the first, second, third or fourth type of micro-bumps or micro-pads 34 may be populated regularly in multiple islands or regions 88 of arrays of micro-bumps or micro-pads with the reserved scribe lines 141 each between neighboring two of the islands or regions 88 of arrays of micro-bumps or micro-pads. A pitch $WB_p$ between each neighboring two of the first, second, third or fourth type of micro-bumps or micro-pads 34 aligned with one of the islands or regions 88 of arrays of micro-bumps or micro-pads may range from 5 to 50 micrometers or from 5 to 20 micrometers or may be smaller than 50, 40 or 30 micrometers; and a space $WB_{sptsv}$ between neighboring two of the first, second, third or fourth type of micro-bumps or micro-pads 34 aligned with one of the islands or regions 88 of arrays of micro-bumps or micro-pads may range from 5 to 50 micrometers or from 5 to 20 micrometers or may be smaller than 50, 40 or 30 micrometers. For each of the islands or regions 88 of arrays of micro-bumps or micro-pads, its first, second, third or fourth type of micro-bumps or micro-pads 34 may be arranged in multiple columns and in multiple rows; its insulating-material island 14*c* may be aligned with its first, second, third or fourth type of micro-bumps or micro-pads 34, and multiple of the openings 14*a* in its insulating-material island 14*c* may be arranged under its first, second, third or fourth type of micro-bumps or micro-pads 34 respectively. The pitch $WB_p$ and space $WB_{sptsv}$ between each neighboring two of the first, second, third or fourth type of micro-bumps or micro-pads 34 aligned with one of the islands or regions 88 of arrays of micro-bumps or micro-pads may be smaller than the width $W_{sb}$ of the reserved scribe lines 141 and/or smaller than a space $WB_{spild}$ between neighboring two of the first, second, third or fourth type of micro-bumps or micro-pads 34 aligned with neighboring two of the islands or regions 88 of arrays of micro-bumps or micro-pads respectively and across one of the reserved scribe lines 141 between said neighboring two of the islands or regions 88 of arrays of micro-bumps or micro-pads. The space $WB_{spild}$ or a width of the trench 14*b* between neighboring two of the insulating-material islands 14*c* may be greater than 50, 40 or 30 micrometers. The space $WB_{spild}$ may be greater than the width $W_{sb}$ of the reserved scribe lines 141 or greater than the width $W_{sb}$ of the reserved scribe lines 141 plus two times of a predetermined space $WB_{sbt}$ between one of the reserved scribe lines 141 and one of the first, second, third or fourth type of micro-bumps or micro-pads 34 adjacent to said one of the reserved scribe lines 141. The first type of vertical-through-via (VTV) connector 467 may include the insulating-material islands 14*c* having the trench 14*b* therebetween having a width greater than 50 or 40 micrometers; each of its spaces $WB_{spild}$ each between neighboring two of its first, second, third or fourth type of micro-bumps or micro-pads 34 and across one of its reserved scribe lines 141 between said neighboring two of its first, second, third or fourth type of micro-bumps or micro-pads 34 may be greater than 50, 40 or 30 micrometers; the distance $WB_{sbt}$ between its edge and one of its first, second, third or fourth type of micro-bumps or micro-pads 34 may be smaller than the space $WB_{sptsv}$ between neighboring two of its first, second, third or fourth type of micro-bumps or micro-pads 34 and optionally its edge may be aligned with an edge of said one of its first, second, third or fourth type of micro-bumps or micro-pads 34; alternatively, the distance $WB_{sbt}$ between its edge and one of its first, second, third or fourth type of micro-bumps or micro-pads 34 may be smaller than 50, 40 or 30 micrometers.

In the first alternative, for the third case, referring to FIG. 1E, a pitch $WB_p$ between each neighboring two of the first, second, third or fourth type of micro-bumps or micro-pads 34 may range from 5 to 50 micrometers or from 5 to 20 micrometers or may be smaller than 50, 40 or 30 micrometers; and a space $WB_{sptsv}$ between neighboring two of the first, second, third or fourth type of micro-bumps or micro-pads 34 may range from 5 to 50 micrometers or from 5 to 20 micrometers or may be smaller than 50, 40 or 30 micrometers. Each of the reserved scribe lines 141 may extend in line with multiple of the first, second, third or fourth type of micro-bumps or micro-pads 34 arranged in a line. Accordingly, the pitch $WB_p$ and space $WB_{sptsv}$, between each neighboring two of the first, second, third or fourth type of micro-bumps or micro-pads 34 may be smaller than the width $W_{sb}$ of the reserved scribe lines 141 or smaller than the width $W_{sb}$ of the reserved scribe lines 141 plus two times of a predetermined space $W_{sbt}$ between one of the reserved scribe lines 141 and one of the first, second, third or fourth type of micro-bumps or micro-pads 34 adjacent to said one of the reserved scribe lines 141. For the first type of vertical-through-via (VTV) connector 467, the distance $WB_{sbt}$ between its edge and one of its first, second, third or fourth type of micro-bumps or micro-pads 34 may be smaller than the space $WB_{sptsv}$ between neighboring two of its first, second, third or fourth type of micro-bumps or micro-pads 34 and optionally its edge may be aligned with an edge of said one of its first, second, third or fourth type of micro-bumps or micro-pads 34; alternatively, the distance $WB_{sbt}$ between its edge and one of its first, second, third or fourth type of micro-bumps or micro-pads 34 may be smaller than 50, 40 or 30 micrometers; the space $WB_{sptsv}$ between neighboring two of its first, second, third or fourth type of micro-bumps or micro-pads 34 may be smaller than 50, 40 or 30 micrometers.

Referring to FIGS. 1A-1F for the first alternative, the aspect ratio of the length to the width for each of its first and second types of vertical-through-via (VTV) connectors 467 may be between 2 and 10, between 4 and 10 or between 2 and 40. Each of the first and second types of vertical-through-via (VTV) connectors 467 may be provided with passive elements, such as capacitors, but without any active device, i.e., transistor, therein. Each of the first and second types of vertical-through-via (VTV) connectors 467 may be manufactured by packaging manufacturing companies or facilities without front-end of line manufacturing capability.

Accordingly, in the first alternative, for each of the first, second and third cases as seen in FIGS. 1A-1F, each of the first and second types of vertical-through-via (VTV) connectors 467 may be arranged with a size for containing the vertical through vias (VTVs) 358 arranged in an array with M1 row(s) by N1 column(s); furthermore, for each of the first, second and third cases as seen in FIGS. 1A, 1C and 1E, the first type of vertical-through-via (VTV) connector 467 may be arranged with a size for containing the first, second, third or fourth type of micro-bumps or micro-pads 34 arranged in an array with M2 row(s) by N2 column(s), wherein M1, M2, N1 and N2 are integers, M1 is greater than N1 and M2 is greater than N2. For an example, each of the numbers M1 and M2 may be greater than or equal to 50 and smaller than or equal to 500, and each of the numbers N1 and N2 may be greater than or equal to 1 and smaller than or equal to 15. For another example, each of the numbers N1 and N2 may be greater than or equal to 30 and smaller than or equal to 200, and each of the numbers M1 and M2 may be greater than or equal to 1 and smaller than or equal to 10.

2. Second Alternative for First and Second Types of Vertical-Through-Via (VTV) Connectors for Through-Silicon-Via Interconnect Elevators (TSVIEs)

Figure 2A:
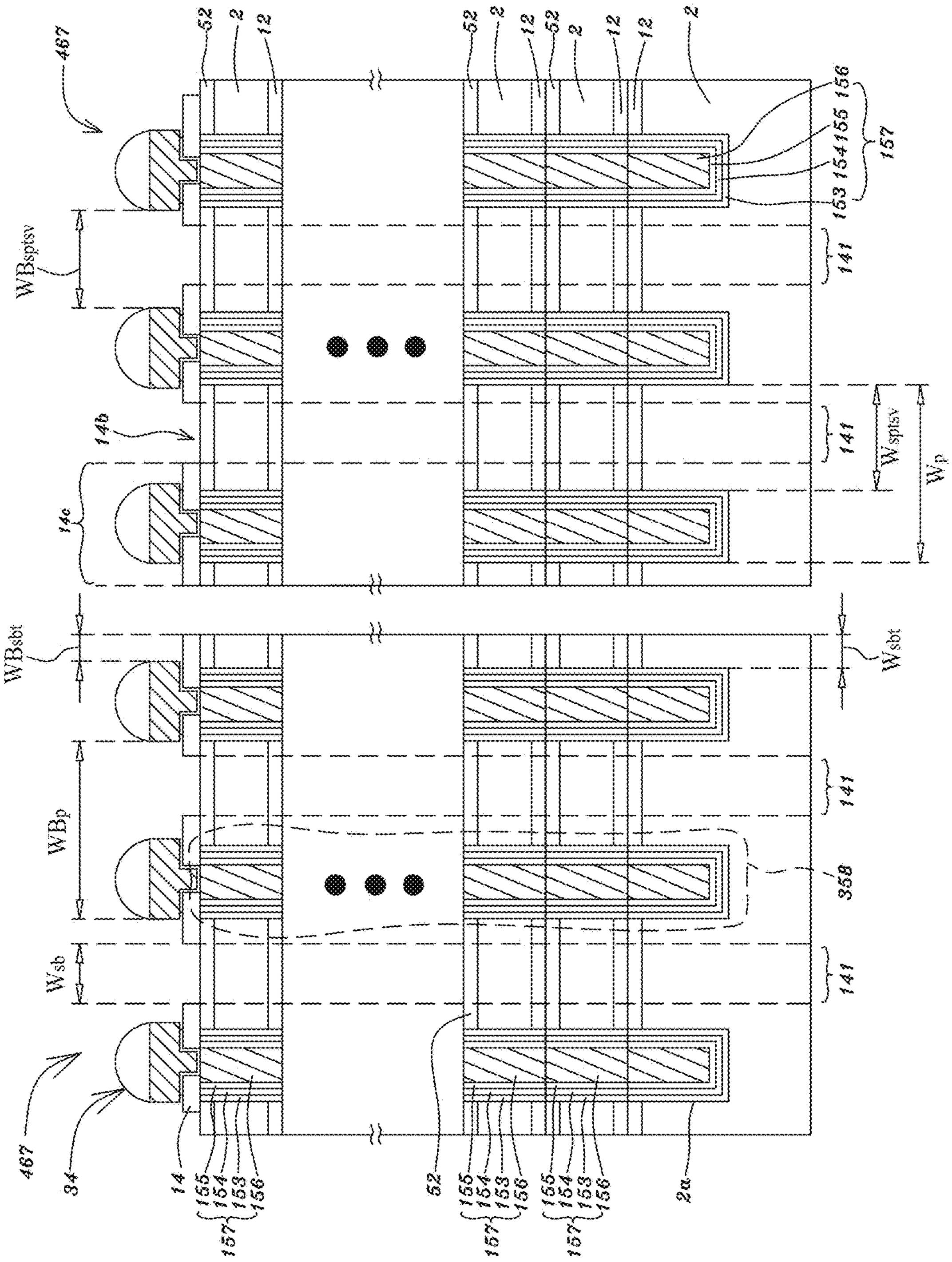
FIGS. 2A and 2B are schematically cross-sectional views showing first and second types of vertical-through-via (VTV) connectors for a second alternative for the first case in accordance with an embodiment of the present application.
Figure 2B:
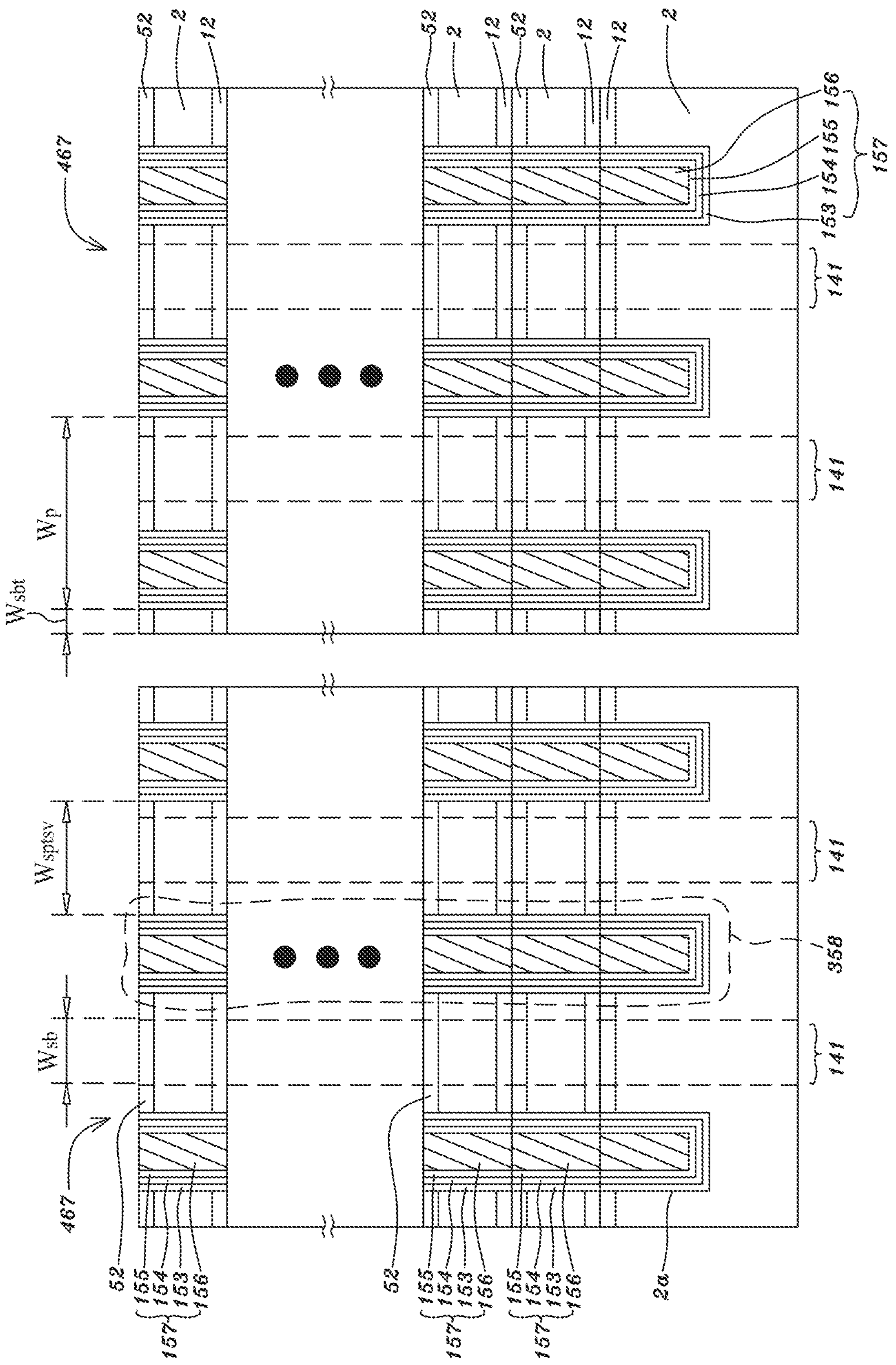
Figure 2C:
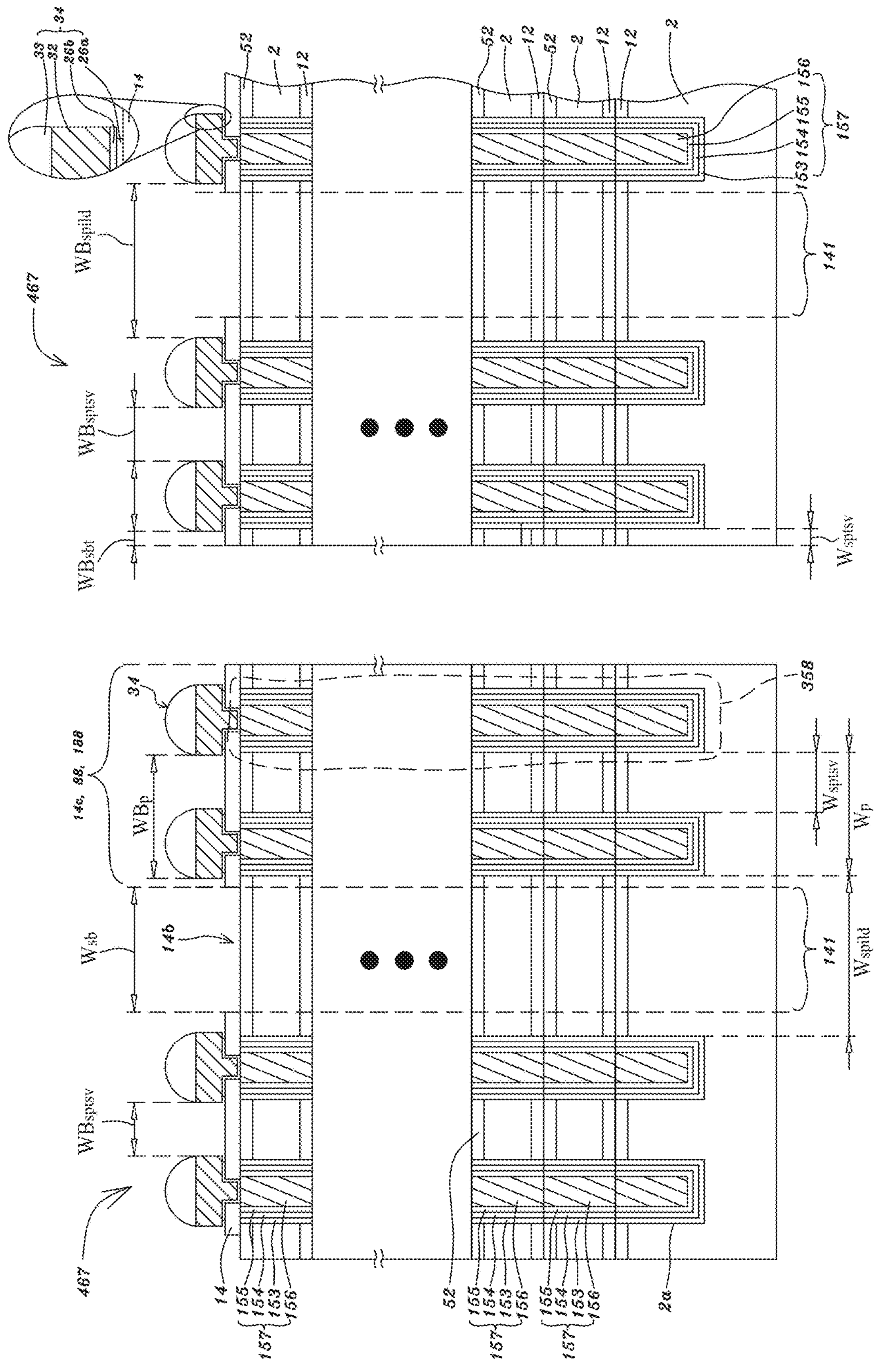
FIGS. 2C and 2D are schematically cross-sectional views showing a process for forming first and second types of vertical-through-via (VTV) connectors for a second alternative for the second case in accordance with an embodiment of the present application.
Figure 2D:
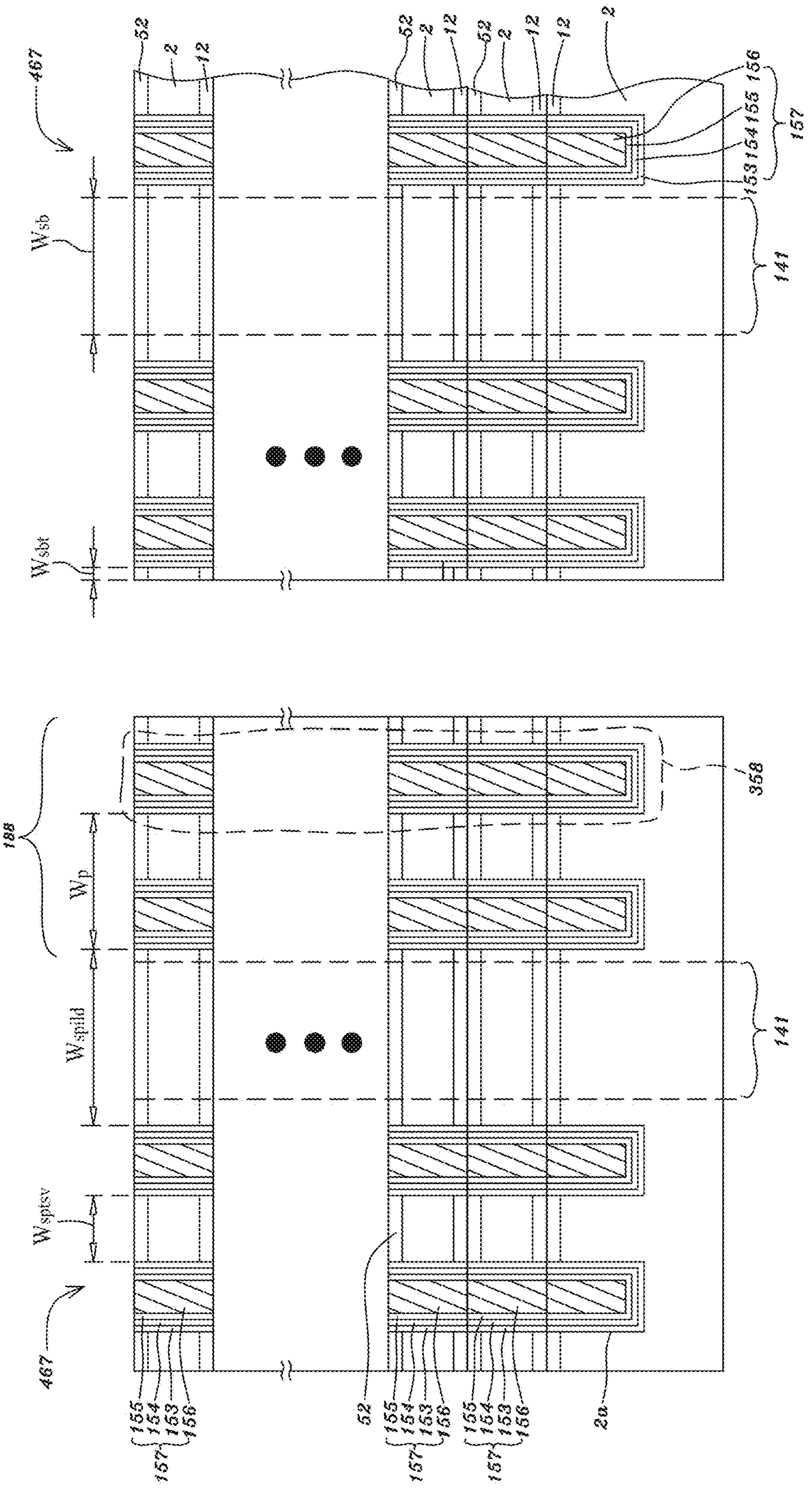
Figure 2E:
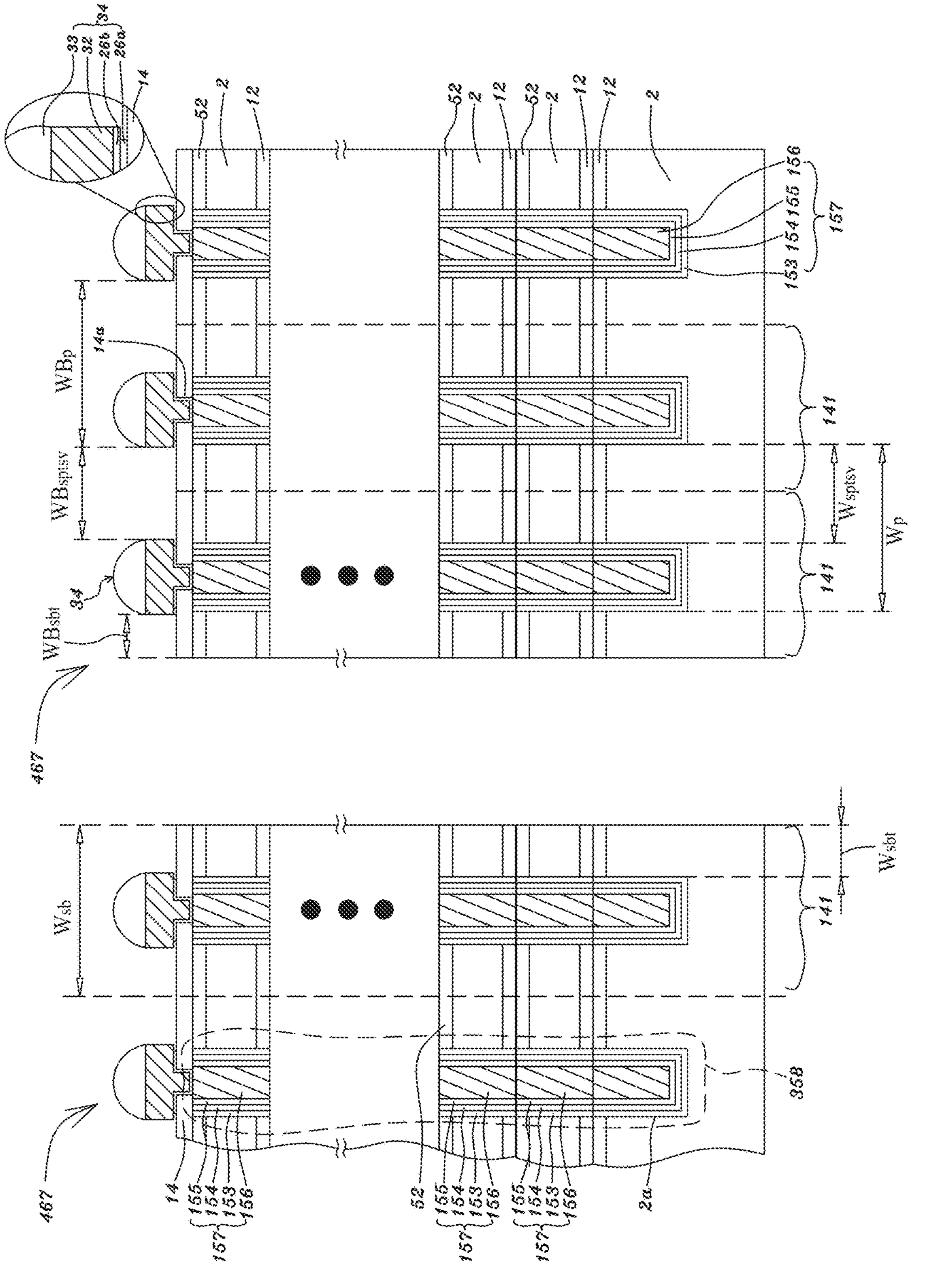
FIGS. 2E and 2F are schematically cross-sectional views showing a process for forming first and second types of vertical-through-via (VTV) connectors for a second alternative for the third case in accordance with an embodiment of the present application.
Figure 2F:
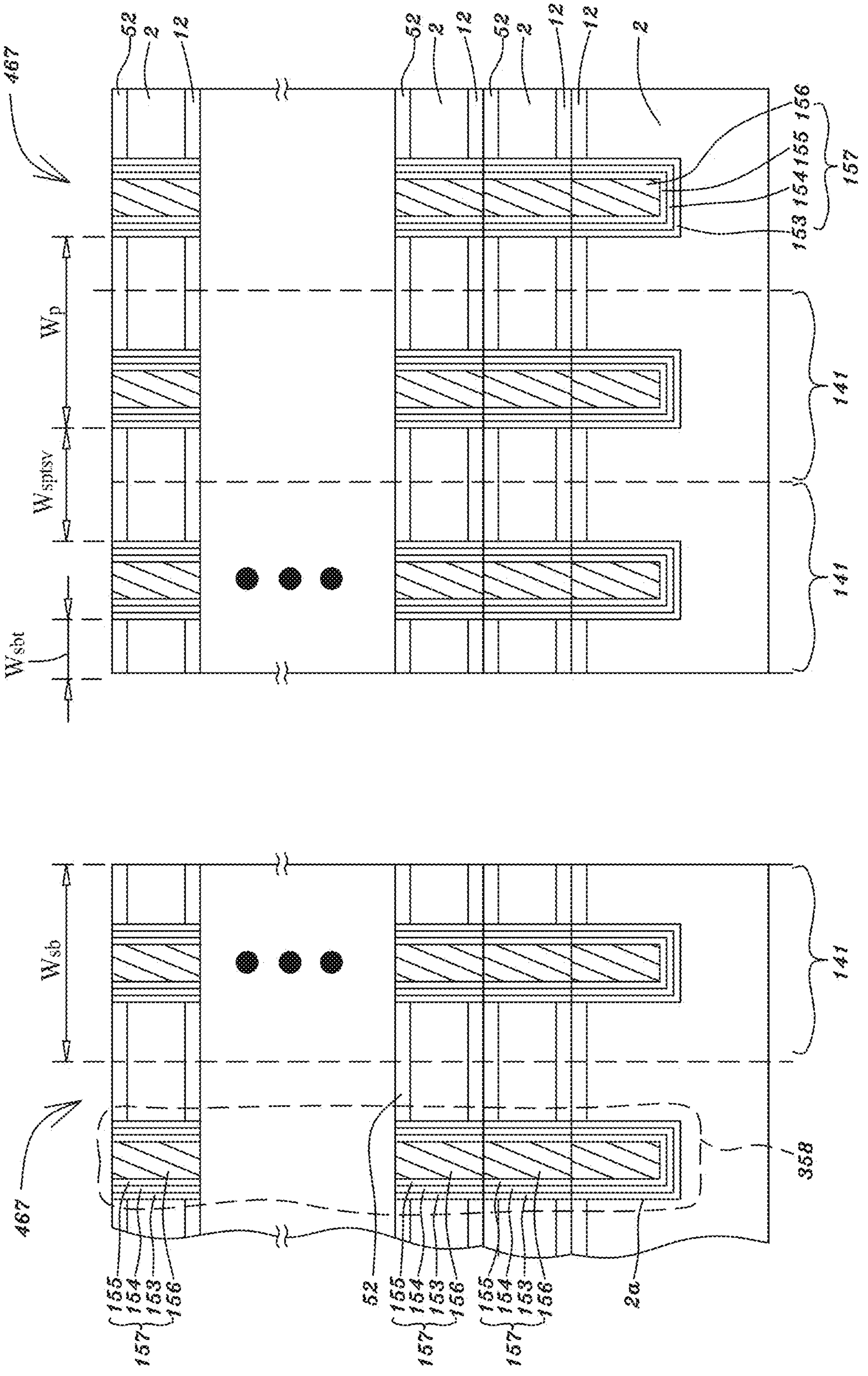

FIGS. 2A and 2B are schematically cross-sectional views showing first and second types of vertical-through-via (VTV) connectors for a second alternative for the first case in accordance with an embodiment of the present application. FIGS. 2C and 2D are schematically cross-sectional views showing a process for forming first and second types of vertical-through-via (VTV) connectors for a second alternative for the second case in accordance with an embodiment of the present application. FIGS. 2E and 2F are schematically cross-sectional views showing a process for forming first and second types of vertical-through-via (VTV) connectors for a second alternative for the third case in accordance with an embodiment of the present application. In a second alternative, referring to each of FIGS. 2A, 2C and 2E, a first type of vertical-through-via (VTV) connectors 467 may include (1) multiple semiconductor substrates 2, i.e., silicon substrates, (2) multiple insulating dielectric layers 12 each on a first surface of one of the semiconductor substrates 2, wherein each of the insulating dielectric layers 12 may include a silicon-oxide layer having a thickness between 0.1 and 2 μm, wherein one of the insulating dielectric layers 12 on the first surface of the bottommost one of the semiconductor substrates 2 may be attached to one of the insulating dielectric layers 12 on the first surface of the second bottommost one of the semiconductor substrates 2, (3) one or more insulating bonding layers 52 each on a second surface of one of the second bottommost through topmost ones of the semiconductor substrates 2, wherein the second surface of said one of the second bottommost through topmost ones of the semiconductor substrates 2 is opposite to the first surface of said one of the second bottommost through topmost ones of the semiconductor substrates 2, wherein each of the insulating bonding layers 52 may be made a layer of silicon oxide having a thickness between 1 and 1,000 nanometers, and wherein one of the insulating bonding layers 52 on the second surface of a lower one of the second bottommost through topmost ones of the semiconductor substrates 2 may have silicon oxide bonded to silicon oxide of one of the insulating dielectric layers 12 on the first surface of an upper one of the second bottommost through topmost ones of the semiconductor substrates 2, and (4) multiple through silicon vias (TSVs) 157 in each of the semiconductor substrates 2 and extending vertically through one of the insulating dielectric layers 12 on the first surface of said each of the semiconductor substrates 2 and/or one of the insulating bonding layers 52 on the second surface of said each of the semiconductor substrates 2.

In the second alternative, referring to each of FIGS. 2A, 2C and 2E, each of the through silicon vias (TSVs) 157 in the bottommost one of the semiconductor substrates 2 and extending vertically through one of the insulating dielectric layers 12 on the first surface of the bottommost one of the semiconductor substrates 2 may include (1) an insulating lining layer 153, such as a layer of thermally grown silicon oxide ($SiO_2$), a layer of CVD silicon nitride ($Si_3N_4$) or a combination thereof, on a sidewall and bottom of one of blind holes 2*a* in the bottommost one of the semiconductor substrates 2, (2) a copper layer 156 electroplated in said one of the blind holes 2*a*, wherein the copper layer 156 may have a top surface coplanar with a top surface of the insulating dielectric layer 12 on the first surface of the bottommost one of the semiconductor substrates 2, (3) an adhesion layer 154, such as a layer of titanium (Ti) or titanium nitride (TiN) having a thickness between 1 nm to 50 nm, on the insulating lining layer 153, between the insulating lining layer 153 and copper layer 156 and at a sidewall and bottom of the copper layer 156, and (4) a seed layer 155, such as a layer of copper having a thickness between 3 nm and 200 nm, between the adhesion layer 154 and copper layer 156 and at a sidewall and bottom of the copper layer 156.

In the second alternative, referring to each of FIGS. 2A, 2C and 2E, each of the through silicon vias (TSVs) 157 in each of the second bottommost through topmost ones of the semiconductor substrates 2 and extending vertically through one of the insulating dielectric layers 12 on the first surface of said each of the second bottommost through topmost ones of the semiconductor substrates 2 and one of the insulating bonding layers 52 on the second surface of said each of the second bottommost through topmost ones of the semiconductor substrates 2 may include (1) an insulating lining layer 153, such as a layer of thermally grown silicon oxide ($SiO_2$), a layer of CVD silicon nitride ($Si_3N_4$) or a combination thereof, on a sidewall of one of through holes in said each of the second bottommost through topmost ones of the semiconductor substrates 2, (2) a copper layer 156 electroplated in said one of the through holes, wherein the copper layer 156 may have a bottom surface coplanar with a bottom surface of the insulating dielectric layer 12 on the first surface of said each of the second bottommost through topmost ones of the semiconductor substrates 2 and a top surface coplanar with a top surface of the insulating bonding layer 52 on the second surface of said each of the second bottommost through topmost ones of the semiconductor substrates 2, (3) an adhesion layer 154, such as a layer of titanium (Ti) or titanium nitride (TiN) having a thickness between 1 nm to 50 nm, on the insulating lining layer 153, between the insulating lining layer 153 and copper layer 156 and at a sidewall of the copper layer 156, and (4) a seed layer 155, such as a layer of copper having a thickness between 3 nm and 200 nm, between the adhesion layer 154 and copper layer 156 and at a sidewall of the copper layer 156.

In the second alternative, referring to each of FIGS. 2A, 2C and 2E, multiple of the through silicon vias (TSVs) 157 may be stacked with each other or one another to form a vertical through via (VTV) 358 for a dedicated vertical path, wherein the copper layer 156 of an upper one of the through silicon vias (TSVs) 157 may have the bottom surface bonded to the top surface of the copper layer 156 of a lower one of the through silicon vias (TSVs) 157. Each of the vertical through vias (VTVs) 358 may include multiple of the through silicon vias (TSVs) 157 stacked up to a total height between 100 and 2,000 micrometers, between 100 and 1,000 micrometers or between 100 and 500 micrometers.

In the second alternative, referring to each of FIGS. 2A, 2C and 2E, the first type of vertical-through-via (VTV) connectors 467 may further include (1) a passivation layer 14, which may have the same specification as that as illustrated in each of FIGS. 1A, 1C and 1E, on the top surface of the insulating bonding layer 52 on the second surface of the topmost one of the semiconductor substrates 2, wherein each opening 14*a* in the passivation layer 14 may be vertically over the top surface of the copper layer 156 of one of the vertical through vias (VTVs) 358, wherein each of the openings 14*a* may have the same specification as that as illustrated in each of FIGS. 1A, 1C and 1E, and (2) multiple micro-bump or micro-pad 34, which may be of one of the first through fourth types having the same specifications as the first through fourth types of micro-bumps or micro-pads 34 as illustrated in each of FIGS. 1A, 1C and 1E respectively, each on the top surface of the copper layer 156 of one of the vertical through vias (VTVs) 358.

In the second alternative, a second type of vertical-through-via (VTV) connector 467 as seen in FIG. 2B, 2D or 2F is similar to the first type of vertical-through-via (VTV) connector 467 as illustrated in FIG. 2A, 2C or 2E respectively, but has none of the passivation layer 14 and micro-bumps or micro-pads 34 as illustrated in FIG. 2A, 2C or 2E.

In the second alternative, referring to FIGS. 2A and 2B for the first case, the arrangements for the vertical through vias (VTVs) 358 for each of the first and second types of vertical-through-via (VTV) connectors 467 may be the same as those as illustrated in FIGS. 1A and 1B for the first case for the first alternative; the arrangements for the trenches

14*b*, insulating-material islands 14*c* and first, second, third or fourth type of micro-bumps or micro-pads 34 for the first type of vertical-through-via (VTV) connector 467 may be the same as those as illustrated in FIG. 1A for the first case for the first alternative.

Alternatively, in the second alternative, referring to FIGS. 2C and 2D for the second case, the arrangements for the vertical through vias (VTVs) 358 and islands or regions 188 of arrays of vertical through vias (VTVs) for each of the first and second types of vertical-through-via (VTV) connectors 467 may be the same as those as illustrated in FIGS. 1C and 1D for the second case for the first alternative; the arrangements for the islands or regions of arrays 88 of micro-bumps or micro-pads, trenches 14*b*, insulating-material islands 14*c* and first, second, third or fourth type of micro-bumps or micro-pads 34 for the first type of vertical-through-via (VTV) connector 467 may be the same as those as illustrated in FIG. 1C for the second case for the first alternative.

Alternatively, in the second alternative, referring to FIGS. 2E and 2F for the third case, the arrangements for the vertical through vias (VTVs) 358 for each of the first and second types of vertical-through-via (VTV) connectors 467 may be the same as those as illustrated in FIGS. 1E and 1F for the third case for the first alternative; the arrangements for the first, second, third or fourth type of micro-bumps or micro-pads 34 for the first type of vertical-through-via (VTV) connector 467 may be the same as those as illustrated in FIG. 1E for the third case for the first alternative.

Referring to FIGS. 2A-2F for the second alternative, the aspect ratio of the length to the width for each of the first and second types of vertical-through-via (VTV) connectors 467 may be between 2 and 10, between 4 and 10 or between 2 and 40. Each of the first and second types of vertical-through-via (VTV) connector 467 may be provided with passive elements, such as capacitors, but without any active device, i.e., transistor, therein.

3. Decoupling Capacitors in First Type of Vertical-Through-Via (VTV) Connector for Through-Silicon-Via Interconnect-Elevator (TSVIE)

Figure 3A:
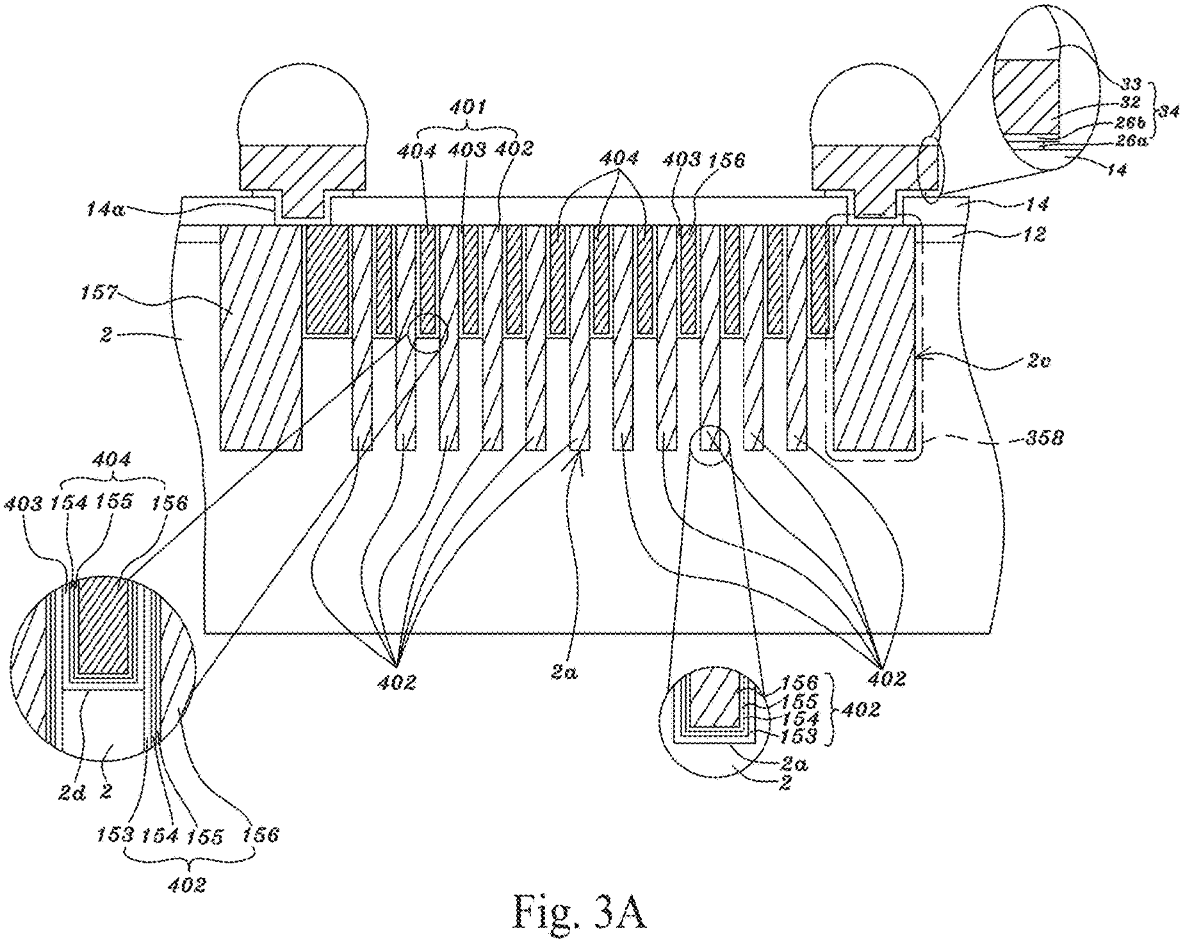
FIG. 3A is a schematically cross-sectional view showing a decoupling capacitor in a first type of vertical-through-via (VTV) connector in accordance with an embodiment of the present application.
Figure 3B:
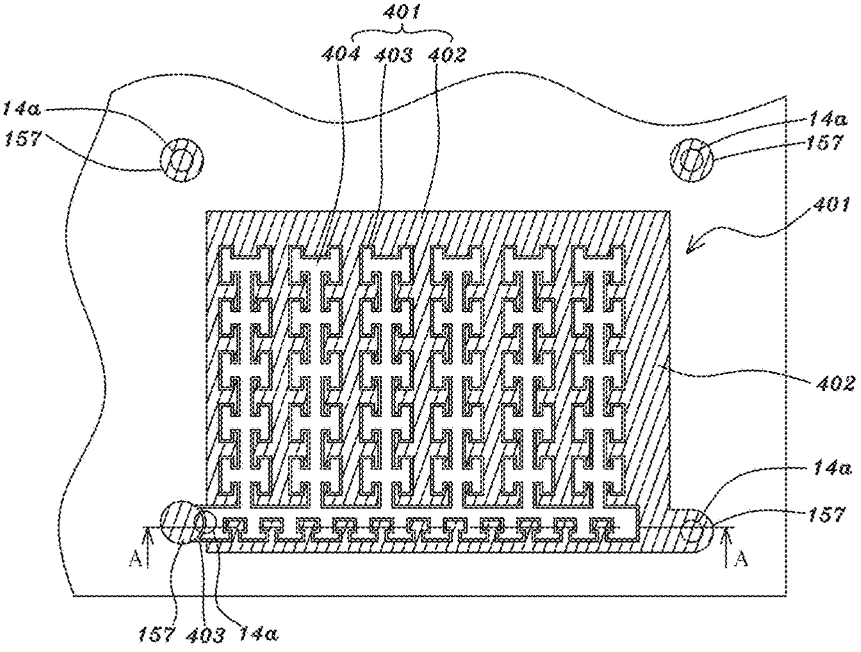

FIG. 3A is a schematically cross-sectional view showing a decoupling capacitor in a first type of vertical-through-via (VTV) connector in accordance with an embodiment of the present application. FIG. 3B is a schematically top view showing a decoupling capacitor between four vertical through vias (VTVs) in accordance with an embodiment of the present application, wherein FIG. 3A is a schematically cross-sectional view along a cross-sectional line A-A on FIG. 3B. For the first alternative for the first through third cases as illustrated in each of FIGS. 1A, 1C and 1E, the first type of vertical-through-via (VTV) connector 467 may further include a decoupling capacitor 401 therein as seen in FIGS. 3A and 3B, provided with (1) a first electrode 402 in a deep trench 2*c* having a depth between 30 μm and 2,000 μm in the semiconductor substrate 2 and vertically extending through the insulating dielectric layer 12, (2) a second electrode 404 in a shallow trench 2*d* having a depth between 5 μm and 30 μm or between 5 and 20 micrometers and less than the depth of the deep trenches 2*c* in the semiconductor substrate 2 and vertically extending through the insulating dielectric layer 12, and (3) a dielectric layer 403 between the first and second electrodes 402 and 404 and at a sidewall and bottom of the shallow trench 2*d*. The first electrode 402 of the decoupling capacitor 401 may include (1) an insulating lining layer 153, such as a layer of thermally grown silicon oxide ($SiO_2$), a layer of CVD silicon nitride ($Si_3N_4$) or a combination thereof, on a sidewall and bottom of the deep trench 2*c*, (2) a copper layer 156 electroplated in the deep trench 2*c*, wherein the copper layer 156 of the first electrode 402 may have a top surface coplanar with a top surface of the insulating dielectric layer 12, (3) an adhesion layer 154, such as a layer of titanium (Ti) or titanium nitride (TiN) having a thickness between 1 nm to 50 nm, on the insulating lining layer 153 of the first electrode 402, between the insulating lining layer 153 and copper layer 156 of the first electrode 402 and at a sidewall and bottom of the copper layer 156 of the first electrode 402, and (4) a seed layer 155, such as a layer of copper having a thickness between 3 nm and 200 nm, between the adhesion layer 154 and copper layer 156 of the first electrode 402 and at a sidewall and bottom of the copper layer 156 of the first electrode 402. The dielectric layer 403 of the decoupling capacitor 401 may be a layer of tantalum oxide ($Ta_2O_5$), hafnium oxide ($HfO_2$), zirconium oxide ($ZrO_2$), titanium oxide ($TiO_2$) or silicon nitride ($Si_3N_4$) having a thickness between 100 and 1,000 angstroms on a sidewall and bottom of the shallow trench 2*d*. The second electrode 404 of the decoupling capacitor 401 may include (1) a copper layer 156 electroplated in the shallow trench 2*d*, wherein the copper layer 156 of the second electrode 404 may have a top surface coplanar with the top surface of the insulating dielectric layer 12, (2) an adhesion layer 154, such as a layer of titanium (Ti) or titanium nitride (TiN) having a thickness between 1 nm to 50 nm, on the dielectric layer 403 of the decoupling capacitor 401, between the dielectric layer 403 of the decoupling capacitor 401 and the copper layer 156 of the second electrode 404 and at a sidewall and bottom of the copper layer 156 of the second electrode 404, and (3) a seed layer 155, such as a layer of copper having a thickness between 3 nm and 200 nm, between the adhesion layer 154 and copper layer 156 of the second electrode 404 and at a sidewall and bottom of the copper layer 156 of the second electrode 404.

Accordingly, referring to FIGS. 3A and 3B, the decoupling capacitor 401 may be provided with the dielectric layer 403 between the first and second electrodes 402 and 404 thereof, wherein the first electrode 402 of the decoupling capacitor 401 may have a depth between 30 and 2,000 micrometers and the second electrode 404 of the decoupling capacitor 401 may have a depth between 5 and 30 micrometers or between 5 and 20 micrometers. It is noted that one of the first, second, third or fourth type of micro-bumps or micro-pads 34 may be formed on the copper layer 156 of one of the through silicon vias (TSVs) 157 and the second electrode 404 of the decoupling capacitor 401 beside the copper layer 156 of said one of the through silicon vias (TSVs) 157 to couple said one of the through silicon vias (TSVs) 157 to the second electrode 404 of the decoupling capacitor 401. Each of the through silicon vias (TSVs) 157 may be used as a vertical through via (VTV) 358 for a dedicated vertical path. For an element indicated by the same reference number shown in FIGS. 1A, 1C, 1E, 3A and 3B, the specification of the element as seen in FIGS. 3A and 3B may be referred to that of the element as illustrated in FIGS. 1A, 1C and 1E.

Figure 3C:
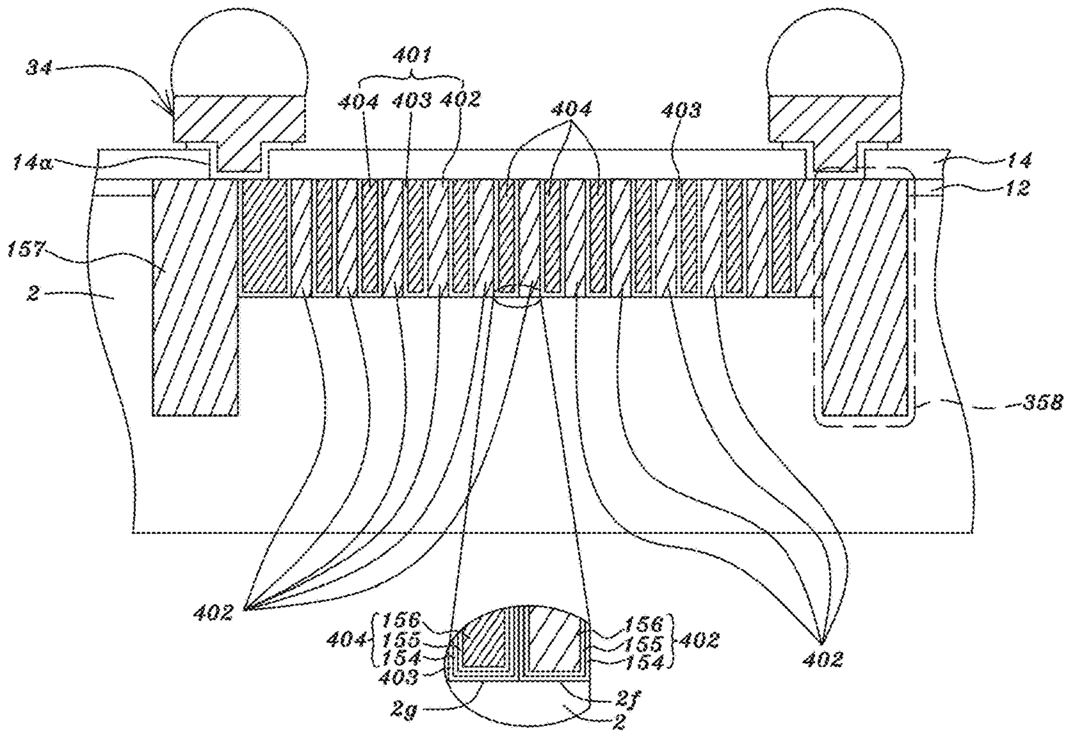
FIG. 3C is a schematically cross-sectional view showing a decoupling capacitor in a first type of vertical-through-via (VTV) connector in accordance with another embodiment of the present application.
Figure 3D:
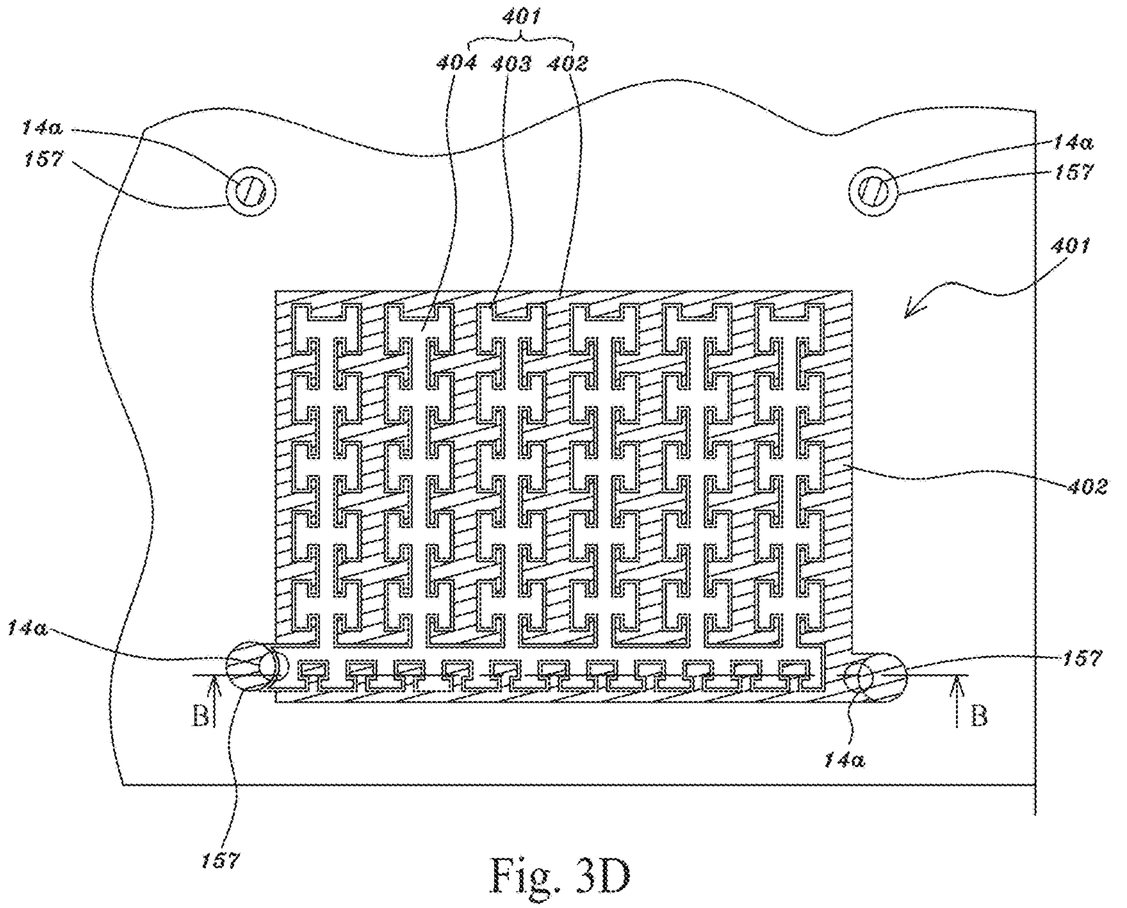

Alternatively, FIG. 3C is a schematically cross-sectional view showing a decoupling capacitor in a first type of vertical-through-via (VTV) connector in accordance with another embodiment of the present application. FIG. 3D is a schematically top view showing a decoupling capacitor among four through silicon vias (TSVs) in accordance with another embodiment of the present application, wherein FIG. 3C is a schematically cross-sectional view along a cross-sectional line B-B on FIG. 3D. For the first alternative for the first through third cases as illustrated in each of FIGS. 1A, 1C and 1E, the first type of vertical-through-via (VTV)

connector 467 may further include a decoupling capacitor 401 therein as seen in FIGS. 3C and 3D, provided with (1) a first electrode 402 in a first shallow trench 2*f*, which has a depth between 5 μm and 30 μm or between 5 μm and 20 μm and less than the depth of the blind holes 2*a*, in the semiconductor substrate 2 and vertically extending through the insulating dielectric layer 12, (2) a second electrode 404 in a second shallow trench 2*g*, which has a depth between 5 μm and 30 μm or between 5 μm and 20 μm and less than the depth of the blind holes 2*a*, in the semiconductor substrate 2 and vertically extending through the insulating dielectric layer 12, and (3) a dielectric layer 403 between the first and second electrodes 402 and 404 and at a sidewall and bottom of the second shallow trench 2*g*. The first electrode 402 of the decoupling capacitor 401 may include (1) a copper layer 156 electroplated in the first shallow trench 2*f*, wherein the copper layer 156 of the first electrode 402 may have a top surface coplanar with a top surface of the insulating dielectric layer 12, (2) an adhesion layer 154, such as a layer of titanium (Ti) or titanium nitride (TiN) having a thickness between 1 nm to 50 nm, on a sidewall and bottom of the first shallow trench 2*f* and at a sidewall and bottom of the copper layer 156 of the first electrode 402, and (3) a seed layer 155, such as a layer of copper having a thickness between 3 nm and 200 nm, between the adhesion layer 154 and copper layer 156 of the first electrode 402 and at a sidewall and bottom of the copper layer 156 of the first electrode 402. The dielectric layer 403 of the decoupling capacitor 401 may be a layer of tantalum oxide ($Ta_2O_5$), hafnium oxide ($HfO_2$), zirconium oxide ($ZrO_2$), titanium oxide ($TiO_2$) or silicon nitride ($Si_3N_4$) having a thickness between 100 and 1,000 angstroms on a sidewall and bottom of the second shallow trench 2*g*. The second electrode 404 of the decoupling capacitor 401 may include (1) a copper layer 156 electroplated in the second shallow trench 2*g*, wherein the copper layer 156 of the second electrode 404 may have a top surface coplanar with the top surface of the insulating dielectric layer 12, (2) an adhesion layer 154, such as a layer of titanium (Ti) or titanium nitride (TiN) having a thickness between 1 nm to 50 nm, on the dielectric layer 403 of the decoupling capacitor 401, between the dielectric layer 403 of the decoupling capacitor 401 and the copper layer 156 of the second electrode 404 and at a sidewall and bottom of the copper layer 156 of the second electrode 404, and (4) a seed layer 155, such as a layer of copper having a thickness between 3 nm and 200 nm, between the adhesion layer 154 and copper layer 156 of the second electrode 404 and at a sidewall and bottom of the copper layer 156 of the second electrode 404.

Accordingly, referring to FIGS. 3C and 3D, the decoupling capacitor 401 may be provided with the dielectric layer 403 between the first and second electrodes 402 and 404 thereof, wherein The first and second electrodes 402 and 404 of the decoupling capacitor 401 may have substantially the same depth between 5 and 30 μm or between 5 and 20 μm and less than the depth of the through silicon vias (TSVs) 157, wherein the depth of the through silicon vias (TSVs) 157 may range from 30 to 2,000 μm. It is noted that a first one of the first, second, third or fourth type of micro-bumps or micro-pads 34 may be formed on the copper layer 156 of a first one of the through silicon vias (TSVs) 157 and the first electrode 402 of the decoupling capacitor 401 beside the copper layer 156 of the first one of the through silicon vias (TSVs) 157 to couple the first one of the through silicon vias (TSVs) 157 to the first electrode 402 of the decoupling capacitor 401; a second one of the first, second, third or fourth type of micro-bumps or micro-pads 34 may be formed on the copper layer 156 of a second one of the through silicon vias (TSVs) 157 and the second electrode 404 of the decoupling capacitor 401 beside the copper layer 156 of the second one of the through silicon vias (TSVs) 157 to couple the second one of the through silicon vias (TSVs) 157 to the second electrode 404 of the decoupling capacitor 401. The first electrode 402 of the decoupling capacitor 401 is configured to electrically couple to the semiconductor substrate 2 and configured to electrically couple to a voltage Vss of ground reference via the first one of the first, second, third or fourth type of micro-bumps or micro-pads 34. Each of the through silicon vias (TSVs) 157 may be used as a vertical through via (VTV) 358 for a dedicated vertical path. For an element indicated by the same reference number shown in FIGS. 1A, 1C, 1E, 3C and 3D, the specification of the element as seen in FIGS. 3C and 3D may be referred to that of the element as illustrated in FIGS. 1A, 1C and 1E.

For example, the decoupling capacitor 401 as illustrated in each of FIGS. 3A and 3C may have capacitance between 10 and 5,000 nF. The decoupling capacitor 401 as illustrated in each of FIGS. 3A and 3C may be formed (1) for the first case among any four of the vertical through vias (VTVs) 358 and in the semiconductor substrate 2 of the first or second type of vertical-through-via (VTV) connector 467 as seen in FIG. 1A or 1B, (2) for the second case among any four of the vertical through vias (VTVs) 358 and in the semiconductor substrate 2 of the first or second type of vertical-through-via (VTV) connector 467 as seen in FIG. 1C or 1D, or (3) for the third case among any four of the vertical through vias (VTVs) 358 and in the semiconductor substrate 2 of the first or second type of vertical-through-via (VTV) connector 467 as seen in FIG. 1E or 1F. Alternatively, the decoupling capacitor 401 as illustrated in each of FIGS. 3A and 3C may be formed (1) for the first case among any four of the vertical through vias (VTVs) 358, i.e., among any four of the through silicon vias (TSVs) 157, and in one of the semiconductor substrates 2 of the first or second type of vertical-through-via (VTV) connector 467 as seen in FIG. 2A or 2B, (2) for the second case among any four of the vertical through vias (VTVs) 358, i.e., among any four of the through silicon vias (TSVs) 157, and in one of the semiconductor substrates 2 of the first or second type of vertical-through-via (VTV) connector 467 as seen in FIG. 2C or 2D, or (3) for the third case among any four of the vertical through vias (VTVs) 358, i.e., among any four of the through silicon vias (TSVs) 157, and in one of the semiconductor substrates 2 of the first or second type of vertical-through-via (VTV) connector 467 as seen in FIG. 2E or 2F.

4. Third Alternative for First Type of Vertical-Through-Via (VTV) Connector for Through-Glass-Via Interconnect Elevator (TGVIE)

Figure 4A:
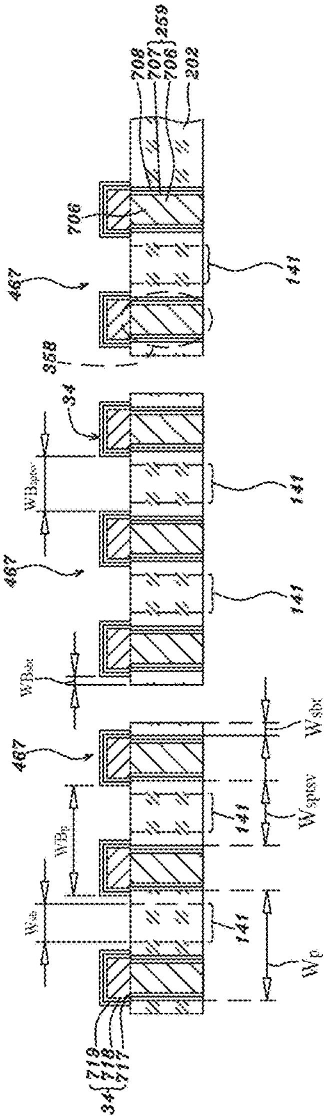
FIG. 4A is a schematically cross-sectional view showing a first type of vertical-through-via (VTV) connector for a third alternative for the first case in accordance with an embodiment of the present application.
Figure 4B:
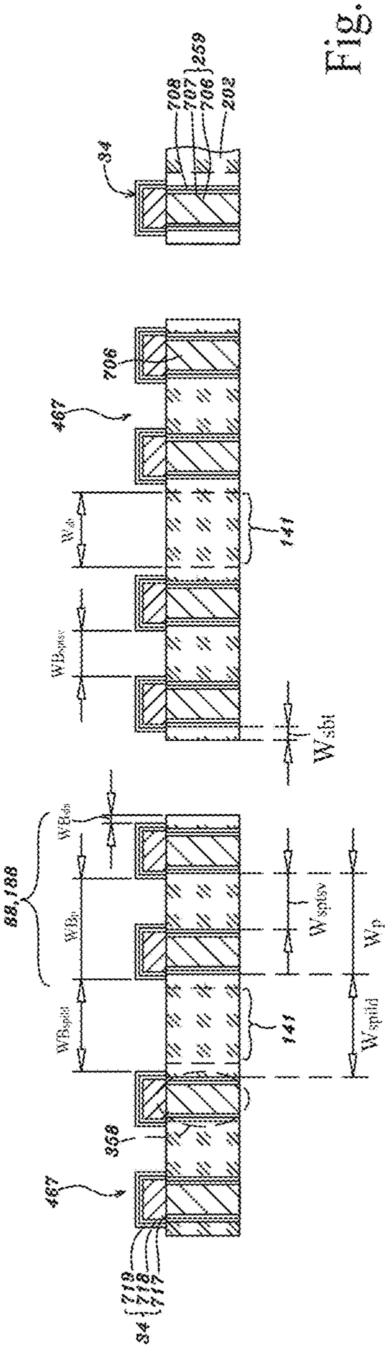
FIG. 4B is a schematically cross-sectional view showing a first type of vertical-through-via (VTV) connector for a third alternative for the second case in accordance with an embodiment of the present application.
Figure 4C:
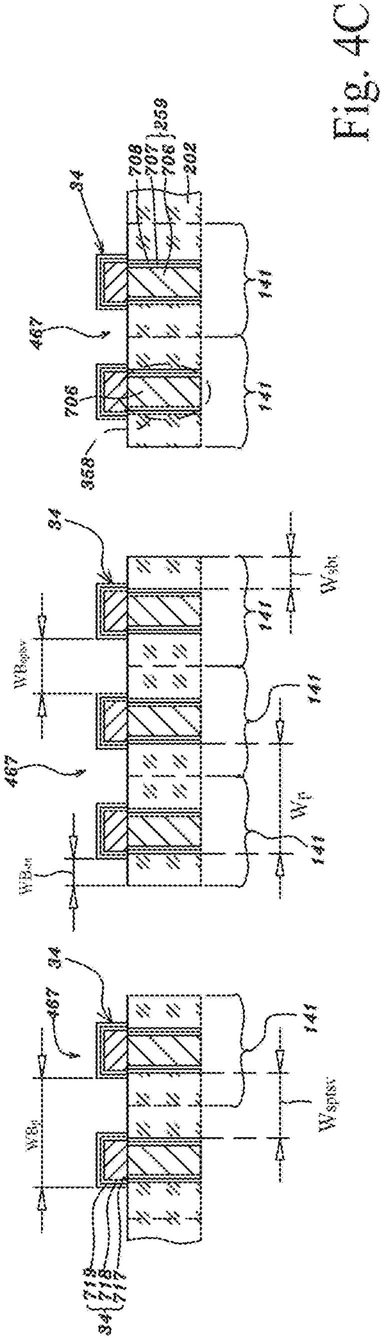
FIG. 4C is a schematically cross-sectional view showing a first type of vertical-through-via (VTV) connector for a third alternative for the third case in accordance with an embodiment of the present application.

FIG. 4A is a schematically cross-sectional view showing a first type of vertical-through-via (VTV) connector for a third alternative for the first case in accordance with an embodiment of the present application. FIG. 4B is a schematically cross-sectional view showing a first type of vertical-through-via (VTV) connector for a third alternative for the second case in accordance with an embodiment of the present application. FIG. 4C is a schematically cross-sectional view showing a first type of vertical-through-via (VTV) connector for a third alternative for the third case in accordance with an embodiment of the present application. In a third alternative, referring to each of FIGS. 4A-4C, a first type of vertical-through-via (VTV) connector 467 may include (1) a glass substrate 202 made of silicon oxide, (2) multiple through glass vias (TGVs) 259 each in the glass substrate 202 and vertically extending through the glass substrate 202, and (3) a glass wetting layer 708, such as a layer of silicon oxide having a thickness between 0.01 and 1 micrometers, at a sidewall of each of the through glass vias (TGVs) 259, around said each of the through glass vias (TGVs) 259 and between said each of the through glass vias (TGVs) 259 and the glass substrate 202. Each of the through glass vias (TGVs) 259 may include (1) a copper post 706 having a circular shape with a diameter or largest transverse dimension between 3 and 30 micrometers and a height between 30 and 100 micrometers in the glass substrate 202 and vertically extending through the glass substrate 202, wherein the glass wetting layer 708 may surround the copper post 706, and wherein the copper post 706 may have a top surface coplanar with a top surface of the glass substrate 202 and a bottom surface coplanar with a bottom surface of the glass substrate 202, and (2) a metal lining layer 707, such as a layer of a titanium-tungsten alloy, tungsten, titanium nitride or a high melting-point metal having a melting temperature greater than 1,100 or 1,500 degrees Celsius, having a thickness between 0.1 and 2 micrometers at a sidewall of the copper post 706, around the copper post 706 and between the copper post 706 and the glass wetting layer 708. Each of the through glass vias (TGVs) 259 may have a thickness between 30 and 100 micrometers to be used as a vertical through via (VTV) 358 for a dedicated vertical path.

In the third alternative, referring to each of FIGS. 4A-4C, the first type of vertical-through-via (VTV) connector 467 may further include multiple fifth type of micro-bumps or micro-pads 34, i.e., metal bumps or pads, each on the top surface of the copper post 706 of one of the through glass vias (TGVs) 259. Each of the fifth type of micro-bumps or micro-pads 34 may include (1) a coper layer 717 having a thickness between 3 and 10 micrometers on the top surface of the copper post 706 of one of the through glass vias (TGVs) 259, (2) a nickel layer 718 having a thickness between 1 and 5 micrometers on a top and sidewall of the copper layer 717, and (3) a solder layer 719, such as a tin-silver alloy or a tin-lead alloy, having a thickness between 1 and 20 micrometers on a top surface and side surface of the nickel layer 718.

In the third alternative, referring to FIG. 4A for the first case, the arrangements for the vertical through vias (VTVs) 358 for the first type of vertical-through-via (VTV) connector 467 may be the same as those as illustrated in FIG. 1A for the first case for the first alternative; the arrangements for the fifth type of micro-bumps or micro-pads 34 for the first type of vertical-through-via (VTV) connector 467 may be the same as those for the first, second, third or fourth type of micro-bumps or micro-pads 34 as illustrated in FIG. 1A for the first case for the first alternative.

In the third alternative, referring to FIG. 4B for the second case, the arrangements for the vertical through vias (VTVs) 358 for the first type of vertical-through-via (VTV) connector 467 may be the same as those as illustrated in FIG. 1C for the second case for the first alternative; the arrangements for the fifth type of micro-bumps or micro-pads 34 for the first type of vertical-through-via (VTV) connector 467 may be the same as those for the first, second, third or fourth type of micro-bumps or micro-pads 34 as illustrated in FIG. 1C for the second case for the first alternative.

In the third alternative, referring to FIG. 4C for the third case, the arrangements for the vertical through vias (VTVs) 358 for the first type of vertical-through-via (VTV) connector 467 may be the same as those as illustrated in FIG. 1A for the third case for the first alternative; the arrangements for the fifth type of micro-bumps or micro-pads 34 for the first type of vertical-through-via (VTV) connector 467 may be the same as those for the first, second, third or fourth type of micro-bumps or micro-pads 34 as illustrated in FIG. 1A for the third case for the first alternative.

Referring to each of FIGS. 4A-4C for the third alternative, the aspect ratio of the length to the width for the first type of vertical-through-via (VTV) connector 467 may be between 2 and 10, between 4 and 10 or between 2 and 40. The first type of vertical-through-via (VTV) connector 467 may be provided with passive elements, such as capacitors, but without any active device, i.e., transistor, therein.

5. Fourth Alternative for First Type of Vertical-Through-Via (VTV) Connector for Through-Glass-Via Interconnect Elevator (TGVIE)

Figure 5A:
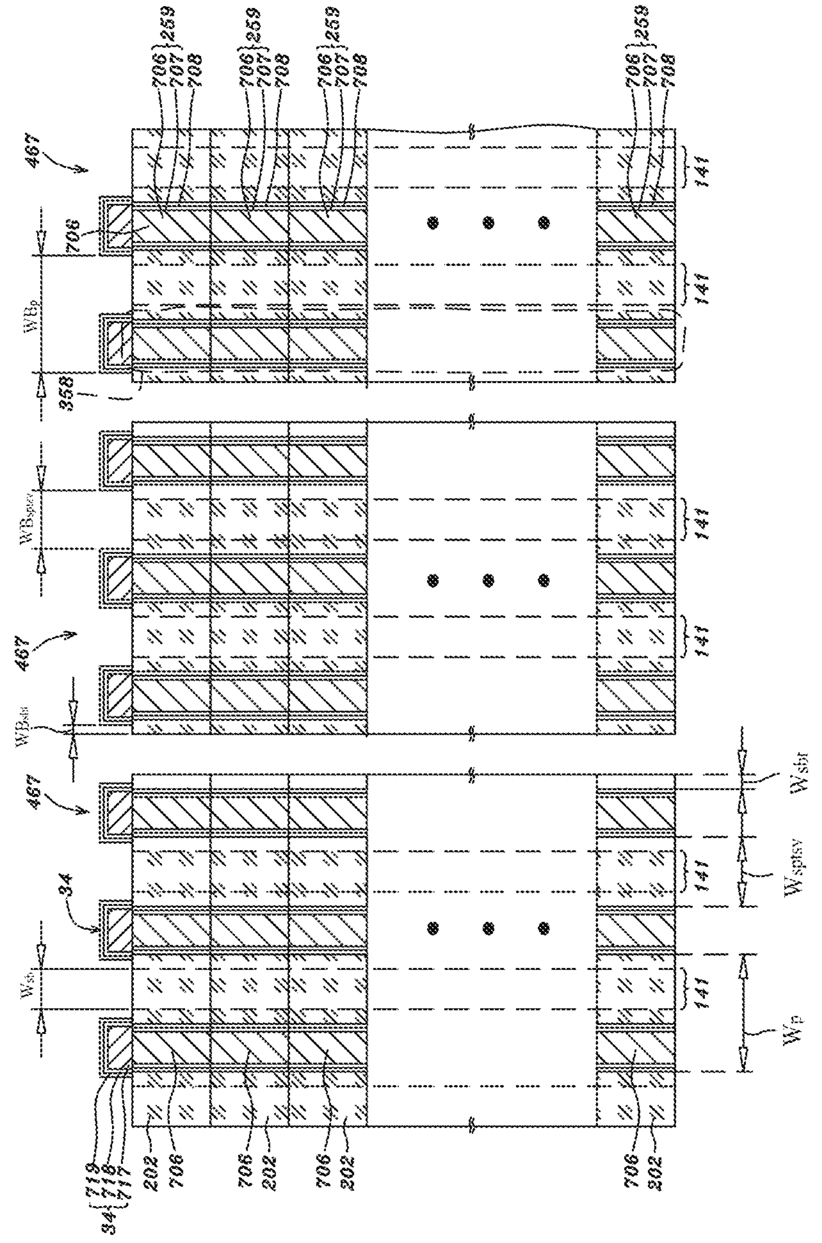
FIG. 5A is a schematically cross-sectional view showing a first type of vertical-through-via (VTV) connector for a fourth alternative for the first case in accordance with an embodiment of the present application.
Figure 5B:
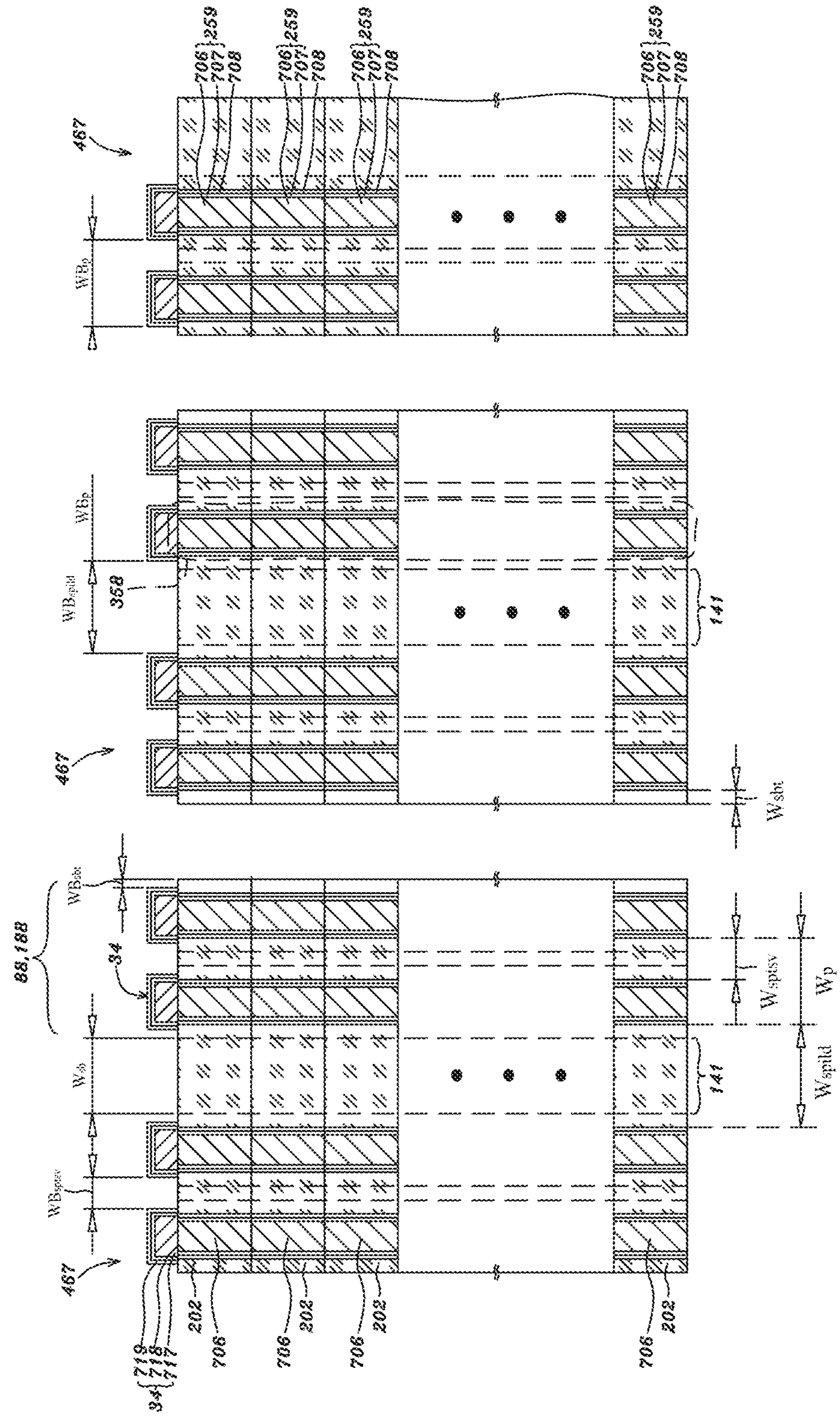
FIG. 5B is a schematically cross-sectional view showing a first type of vertical-through-via (VTV) connector for a fourth alternative for the second case in accordance with an embodiment of the present application.
Figure 5C:
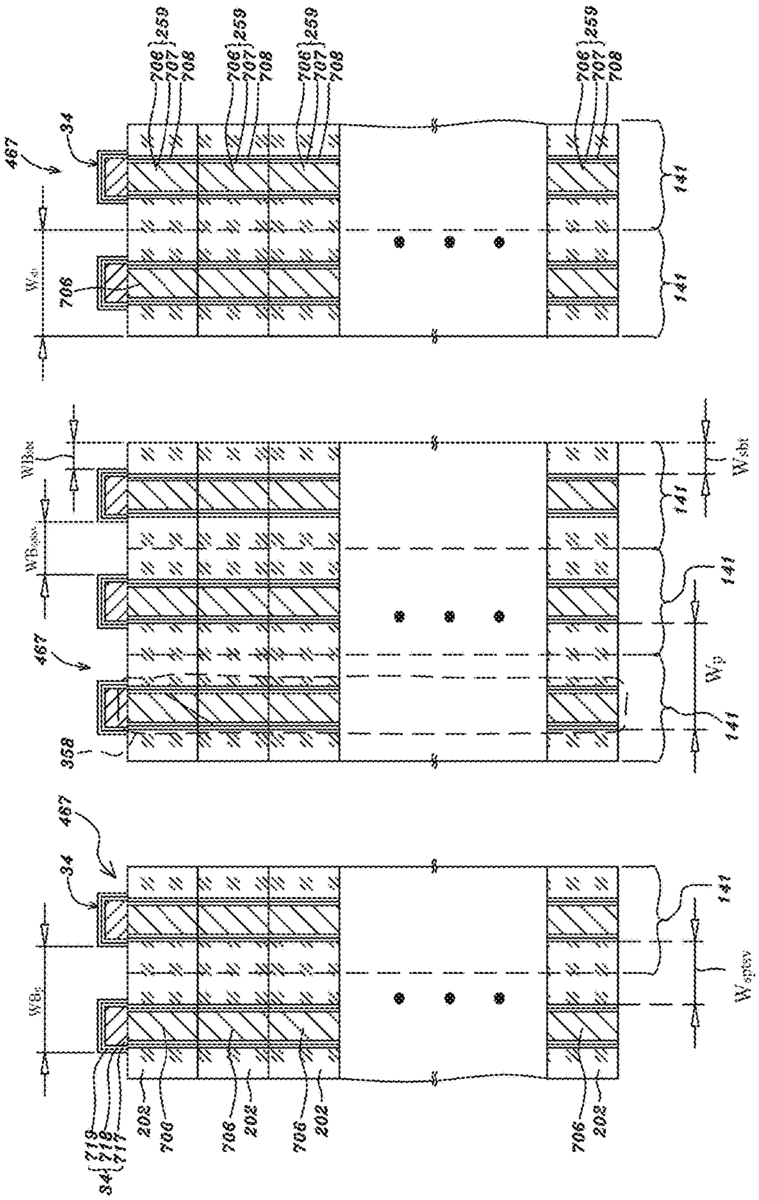
FIG. 5C is a schematically cross-sectional view showing a first type of vertical-through-via (VTV) connector for a fourth alternative for the third case in accordance with an embodiment of the present application.

FIG. 5A is a schematically cross-sectional view showing a first type of vertical-through-via (VTV) connector for a fourth alternative for the first case in accordance with an embodiment of the present application. FIG. 5B is a schematically cross-sectional view showing a first type of vertical-through-via (VTV) connector for a fourth alternative for the second case in accordance with an embodiment of the present application. FIG. 5C is a schematically cross-sectional view showing a first type of vertical-through-via (VTV) connector for a fourth alternative for the third case in accordance with an embodiment of the present application.

In a fourth alternative, referring to each of FIGS. 5A, 5B and 5C, a first type of vertical-through-via (VTV) connectors 467 may include (1) multiple glass substrates 202, an upper of which may have a bottom surface bonded onto a top surface of a lower one of which, (2) multiple through glass vias (TGVs) 259 in each of the glass substrates 202 and extending vertically through said each of the glass substrates 202, wherein each of the through glass vias (TGVs) 259 may have a thickness between 30 and 100 micrometers, and (3) a glass wetting layer 708, such as a layer of silicon oxide having a thickness between 0.01 and 1 micrometers, at a sidewall of each of the through glass vias (TGVs) 259 in each of the glass substrates 202, around said each of the through glass vias (TGVs) 259 and between said each of the through glass vias (TGVs) 259 and said each of the glass substrates 202. Each of the through glass vias (TGVs) 259 in each of the glass substrates 202 and vertically extending through said each of the glass substrates 202 may include (1) a copper post 706 having a circular shape with a diameter or largest transverse dimension between 3 and 30 micrometers and a height between 30 and 100 micrometers in said each of the glass substrates 202 and vertically extending through said each of the glass substrates 202, wherein the glass wetting layer 708 in said each of the glass substrates 202 may surround the copper post 706, and wherein the copper post 706 may have a top surface coplanar with a top surface of said each of the glass substrates 202 and a bottom surface coplanar with a bottom surface of said each of the glass substrates 202, and (2) a metal lining layer 707, such as a layer of a titanium-tungsten alloy, tungsten, titanium nitride or a high melting-point metal having a melting temperature greater than 1,100 or 1,500 degrees Celsius, having a thickness between 0.1 and 2 micrometers at a sidewall of the copper post 706, around the copper post 706 and between the copper post 706 and the glass wetting layer 708.

In the fourth alternative, referring to each of FIGS. 5A, 5B and 5C, multiple of the through glass vias (TGVs) 259 may be stacked with each other or one another to form a vertical through via (VTV) 358 for a dedicated vertical path, wherein the copper post 706 of an upper one of the through glass vias (TGVs) 259 may have the bottom surface directly bonded to the top surface of the copper post 706 of a lower one of the through glass vias (TGVs) 259. Each of the vertical through vias (VTVs) 358 may include multiple of the through glass vias (TGVs) 259 stacked up to a total height between 100 and 2,000 micrometers, between 100 and 1,000 micrometers or between 100 and 500 micrometers.

In the fourth alternative, referring to each of FIGS. 5A, 5B and 5C, the first type of vertical-through-via (VTV) connectors 467 may further include multiple micro-bump or micro-pad 34, which may be of the fifth type having the same specifications as the fifth type of micro-bumps or micro-pads 34 as illustrated in each of FIGS. 4A, 4B and 4C, each on the top surface of the copper post 706 of one of the vertical through vias (VTVs) 358.

In the fourth alternative, referring to FIG. 5A for the first case, the arrangements for the vertical through vias (VTVs) 358 for the first type of vertical-through-via (VTV) connector 467 may be the same as those as illustrated in FIG. 1A for the first case for the first alternative; the arrangements for the fifth type of micro-bumps or micro-pads 34 for the first type of vertical-through-via (VTV) connector 467 may be the same as those for the first, second, third or fourth type of micro-bumps or micro-pads 34 as illustrated in FIG. 1A for the first case for the first alternative.

In the fourth alternative, referring to FIG. 5B for the second case, the arrangements for the vertical through vias (VTVs) 358 for the first type of vertical-through-via (VTV) connector 467 may be the same as those as illustrated in FIG. 1C for the second case for the first alternative; the arrangements for the fifth type of micro-bumps or micro-pads 34 for the first type of vertical-through-via (VTV) connector 467 may be the same as those for the first, second, third or fourth type of micro-bumps or micro-pads 34 as illustrated in FIG. 1C for the second case for the first alternative.

In the fourth alternative, referring to FIG. 5C for the third case, the arrangements for the vertical through vias (VTVs) 358 for the first type of vertical-through-via (VTV) connector 467 may be the same as those as illustrated in FIG. 1A for the third case for the first alternative; the arrangements for the fifth type of micro-bumps or micro-pads 34 for the first type of vertical-through-via (VTV) connector 467 may be the same as those for the first, second, third or fourth type of micro-bumps or micro-pads 34 as illustrated in FIG. 1A for the third case for the first alternative.

Referring to each of FIGS. 5A-5C for the fourth alternative, the aspect ratio of the length to the width for the first type of vertical-through-via (VTV) connector 467 may be between 2 and 10, between 4 and 10 or between 2 and 40. The first type of vertical-through-via (VTV) connector 467 may be provided with passive elements, such as capacitors, but without any active device, i.e., transistor, therein.

6. Fifth Alternative for First Type of Vertical-Through-Via (VTV) Connector for Through-Polymer-Via Interconnect Elevator (TPVIE)

Figure 6:
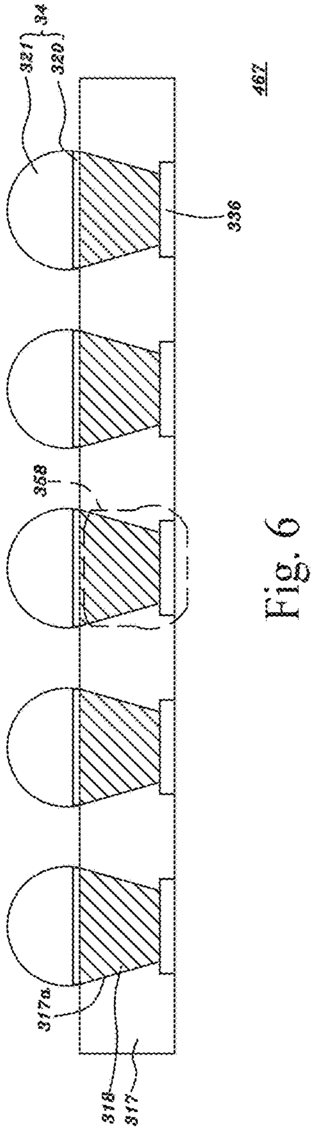
FIG. 6 is a schematically cross-sectional view showing a first type of vertical-through-via (VTV) connector for a fifth alternative in accordance with an embodiment of the present application.

FIG. 6 is a schematically cross-sectional view showing a first type of vertical-through-via (VTV) connector for a fifth alternative in accordance with an embodiment of the present application. In a fifth alternative, referring to FIG. 6, a first type of vertical-through-via (VTV) connectors 467 may include (1) an epoxy-based polymer layer 317, (2) multiple metal pads 336 at a bottom of the epoxy-based polymer layer 317, wherein each of the metal pads 336 may be made of a nickel layer having a thickness between 1 and 5 micrometers, having a bottom surface coplanar with a bottom surface of the epoxy-based polymer layer 317 and being aligned with one of openings in the epoxy-based polymer layer 317 and at a bottom of said one of the openings in the epoxy-based polymer layer 317, (3) multiple copper posts 318 each in one of the openings in the epoxy-based polymer layer 317 and on a top surface of one of the metal pads 336, wherein each of the copper posts 318 may have a top surface coplanar with a top surface of the epoxy-based polymer layer 317, and (4) multiple sixth type of micro-bumps or micro-pads 34 each on the top surface of one of the copper posts 318, wherein each of the sixth type of micro-bumps or micro-pads 34 may include a nickel layer 320 having a thickness between 1 and 5 micrometers on the top surface of said one of the copper posts 318 and a solder ball 321, such as a tin-silver alloy, having a thickness between 1 and 20 micrometers on a top and side surface of the nickel layer 320. Each of the copper posts 318 and underlying one of the metal pads 336 may be used as a vertical through via (VTV) 358, i.e., through polymer via (TPV), for a dedicated vertical path.

Referring to each of FIG. 6 for the fifth alternative, the aspect ratio of the length to the width for the first type of vertical-through-via (VTV) connector 467 may be between 2 and 10, between 4 and 10 or between 2 and 40. The first type of vertical-through-via (VTV) connector 467 may be provided with passive elements, such as capacitors, but without any active device, i.e., transistor, therein.

Specification for Programmable Logic Blocks

Figure 7:
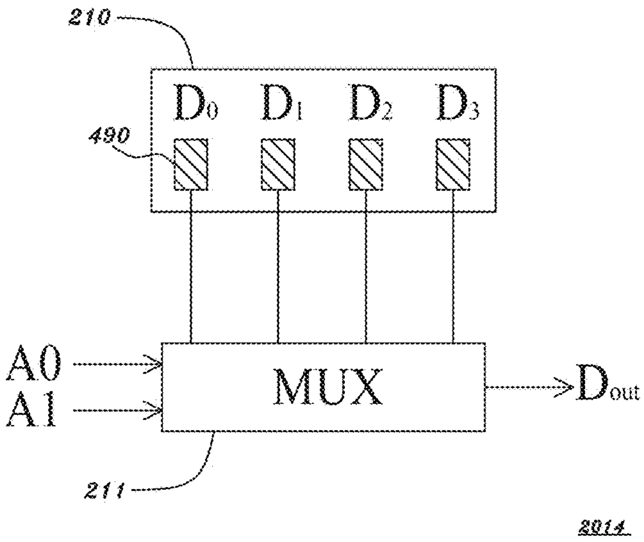
FIG. 7 is a schematic view showing a block diagram of a programmable logic cell in accordance with an embodiment of the present application.

FIG. 7 is a schematic view showing a block diagram of a programmable logic cell in accordance with an embodiment of the present application. Referring to FIG. 7, a programmable logic block (LB) or element may include one or a plurality of programmable logic cells (LC) 2014 each configured to perform logic operation on its input data set at its input points. Each of the programmable logic cells (LC) 2014 may include multiple memory cells 490, i.e., configuration-programming-memory (CPM) cells, each configured to save or store one of resulting values of a look-up table (LUT) 210 and a selection circuit 211, such as multiplexer (MUXER), having a first set of two input points arranged in parallel for a first input data set, e.g., A0 and A1, and a second set of four input points arranged in parallel for a second input data set, e.g., D0, D1, D2 and D3, each associated with one of the resulting values or programming codes of the look-up table (LUT) 210. The selection circuit 211 is configured to select, in accordance with its first input data set associated with the input data set of said each of the programmable logic cells (LC) 2014, a data input, e.g., D0, D1, D2 or D3, from its second input data set as a data output Dout at its output point acting as a data output of said each of the programmable logic cells (LC) 2014 at an output point of said each of the programmable logic cells (LC) 2014.

Referring to FIG. 7, the selection circuit 211 may have the second input data set, e.g., D0, D1, D2 and D3, each associated with a data output, i.e., configuration-programming-memory (CPM) data, of one of the memory cells 490, i.e., configuration-programming-memory (CPM) cells. For each of the programmable logic cells (LC) 2014, each of the resulting values or programing codes of its look-up table (LUT) 210 stored in one of its memory cells 490 that may be of a first type, i.e., volatile memory cell such as static random-access memory (SRAM) cell, may be associated with data saved or stored in a non-volatile memory cell, such as ferroelectric random-access-memory (FRAM) cell, magnetoresistive random access memory (MRAM) cell, resistive random access memory (RRAM) cell, anti-fuse or e-fuse. Alternatively, for each of the programmable logic cells (LC) 2014, each of its memory cells 490 may be of a second type, i.e., non-volatile memory cell composed of one or more magnetoresistive random access memory (MRAM) cells, one or more resistive random access memory (RRAM)

cells, one or more anti-fuses, one or more e-fuses, or a floating gate of a metal-oxide-semiconductor (MOS) transistor.

Referring to FIG. 7, each of the programmable logic cells (LC) 2014 may have the memory cells 490, i.e., configuration-programming-memory (CPM) cells, configured to be programed to store or save the resulting values or programing codes of the look-up table (LUT) 210 to perform the logic operation, such as AND operation, NAND operation, OR operation, NOR operation, EXOR operation or other Boolean operation, or an operation combining two or more of the above operations. For this case, each of the programmable logic cells (LC) 2014 may perform the logic operation on its input data set, e.g., A0 and A1, at its input points as a data output Dout at its output point. For more elaboration, each of the programmable logic cells (LC) 2014 may include the number $2^n$ of memory cells 490, i.e., configuration-programming-memory (CPM) cells, each configured to save or store one of resulting values of the look-up table (LUT) 210 and the selection circuit 211 having a first set of the number n of input points arranged in parallel for a first input data set, e.g., A0-A1, and a second set of the number $2^n$ of input points arranged in parallel for a second input data set, e.g., D0-D3, each associated with one of the resulting values or programming codes of the look-up table (LUT) 210, wherein the number n may range from 2 to 8, such as 2 for this case. The selection circuit 211 is configured to select, in accordance with its first input data set associated with the input data set of said each of the programmable logic cells (LC) 2014, a data input, e.g., one of D0-D3, from its second input data set as a data output Dout at its output point acting as a data output of said each of the programmable logic cells (LC) 2014 at an output point of said each of the programmable logic cells (LC) 2014.

Specification for Programmable or Configurable Switch Cell

Figure 8:
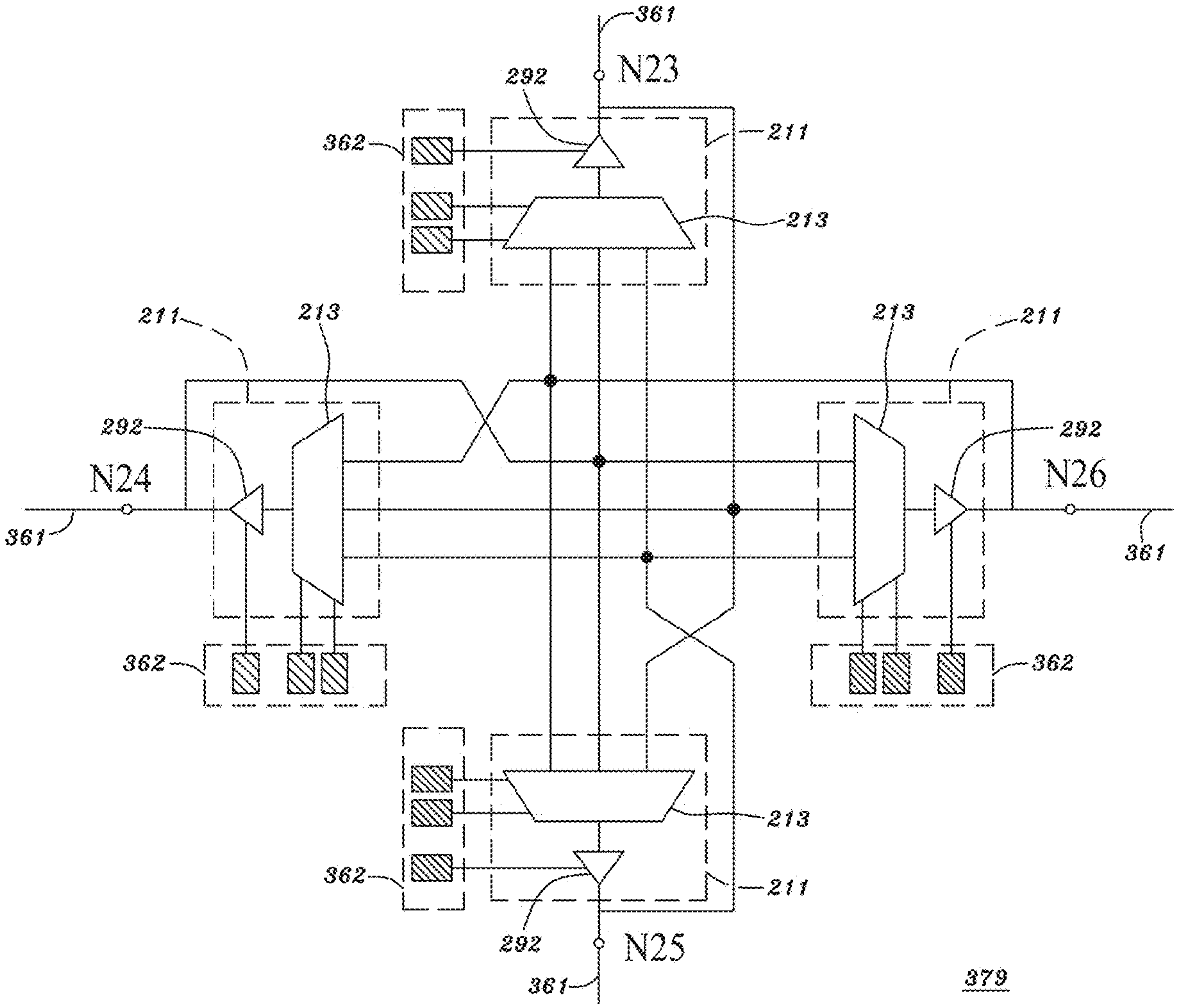
FIG. 8 is a circuit diagram illustrating programmable interconnects controlled by a programmable switch cell in accordance with an embodiment of the present application.

FIG. 8 is a circuit diagram illustrating programmable interconnects controlled by a programmable switch cell in accordance with an embodiment of the present application. Referring to FIG. 8, a cross-point switch may be provided for a programmable switch cell 379, i.e., configurable switch cell, including four selection circuits 211 at its top, bottom, left and right sides respectively, each having a multiplexer 213 and a pass/no-pass switch or switch buffer 292 coupling to the multiplexer 213 thereof, and four sets of memory cells 362 each configured to save or store programming codes to control the multiplexer 213 and pass/no-pass switch or switch buffer 292 of one of its four selection circuits 211. For the programmable switch cell 379, the multiplexer 213 of each of its four selection circuits 211 may be configured to select, in accordance with the first input data set thereof at the first set of input points thereof each associated with one of the programming codes saved or stored in its memory cells 362, a data input from the second input data set thereof at the second set of input points thereof as the data output thereof. The pass/no-pass switch 292 of each of its four selection circuits 211 is configured to control, in accordance with a first data input thereof associated with another of the programming codes saved or stored in its memory cells 362, coupling between the input point thereof for a second data input thereof associated with the data output of the multiplexer 213 of said each of its four selection circuits 211 and the output point thereof for a data output thereof and amplify the second data input thereof as the data output thereof to act as a data output of said each of its four selection circuits 211. Each of the second set of three input points of the multiplexer 213 of one of its four selection circuits 211 may couple to one of the second set of three input points of the multiplexer 213 of each of another two of its four selection circuits 211 and to one of the four programmable interconnects 361 coupling to the output point of the other of its four selection circuits 211. Each of the four programmable interconnects 361 may couple to the output point of one of its four selection circuits 211 and one of the second set of three input points of the multiplexer 213 of each of the other three of its four selection circuits 211. Thereby, for each of the four selection circuits 211 of the programmable switch cell 379, its multiplexer 213 may select, in accordance with the first input data set thereof at the first set of input points thereof, a data input from the second input data set thereof at the second set of three input points thereof coupling to respective three of four nodes N23-N26 coupling to respective three of four programmable interconnects 361 extending in four different directions respectively, and its second type of pass/no-pass switch 292 is configured to generate the data output of said each of the four selection circuits 211 at the other of the four nodes N23-N26 coupling to the other of the four programmable interconnects 361.

For example, referring to FIG. 8, for the top one of the four selection circuits 211 of the programmable switch cell 379, its multiplexer 213 may select, in accordance with the first input data set thereof at the first set of input points thereof each associated with one of the programming codes saved or stored in the memory cells 362 of the programmable switch cell 379, a data input from the second input data set thereof at the second set of three input points thereof coupling to the respective three nodes N24-N26 coupling to the respective three programmable interconnects 361 extending in left, down and right directions respectively, and its pass/no-pass switch 292 is configured, in accordance with another of the programming codes saved or stored in the memory cells 362 of the programmable switch cell 379, to or not to generate the data output of the top one of the four selection circuits 211 of the programmable switch cell 379 at the node N23 coupling to the programmable interconnect 361 extending in an up direction. Thereby, data from one of the four programmable interconnects 361 may be switched by the programmable switch cell 379 to be passed to another one, two or three of the four programmable interconnects 361.

Referring to FIG. 8, for the programmable switch cell 379, each of the programming codes saved or stored in one of the memory cells 362 that may be of a first type, i.e., volatile memory cell such as static random-access memory (SRAM) cell, may be associated with data saved or stored in a non-volatile memory cell, such as ferroelectric random-access-memory (FRAM) cell, magnetoresistive random access memory (MRAM) cell, resistive random access memory (RRAM) cell, anti-fuse or e-fuse. Alternatively, for the programmable switch cell 379, each of its memory cells 362 may be of a second type, i.e., non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor.

Figure 9:
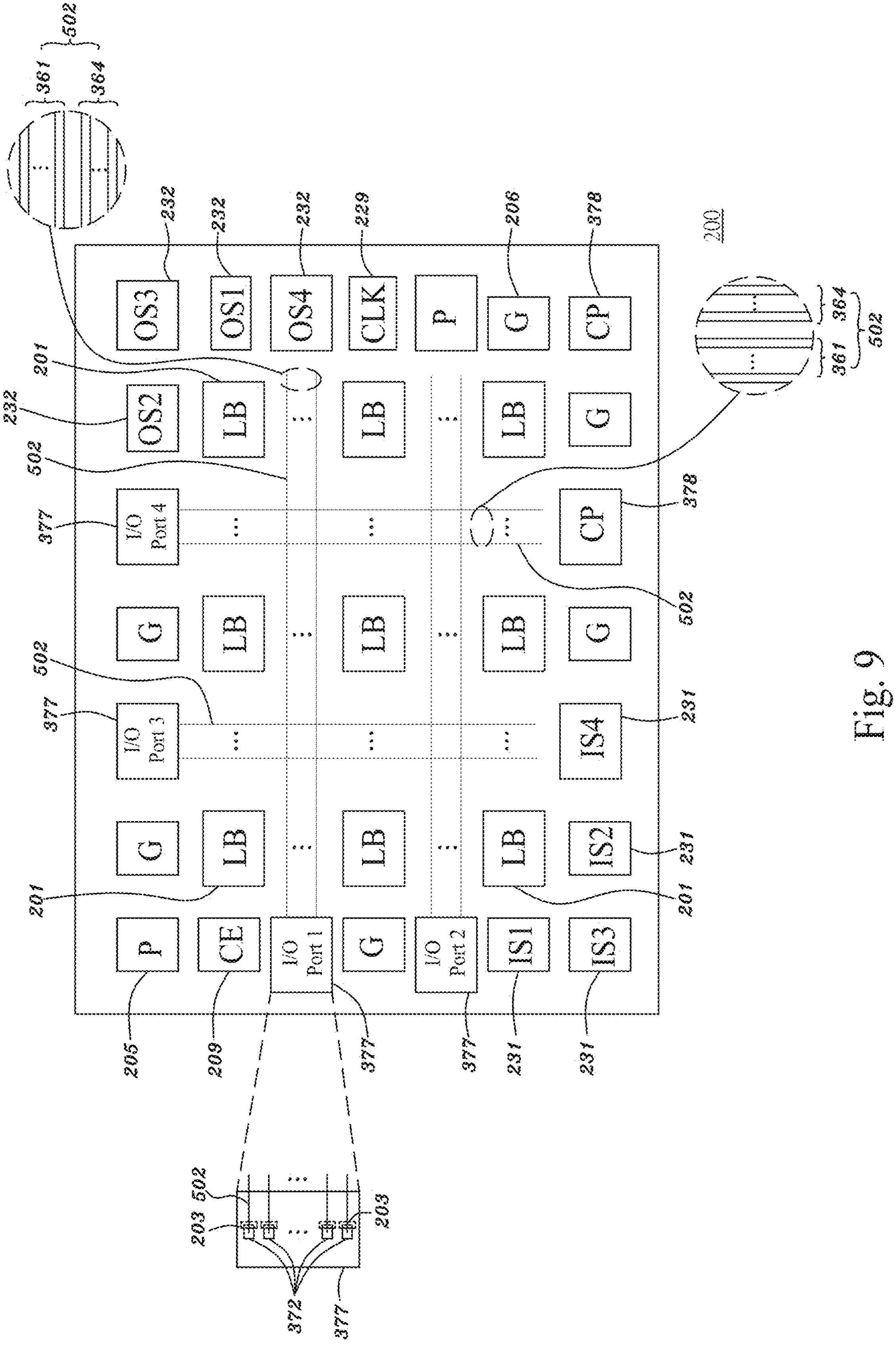
FIG. 9 is a schematically top view showing a block diagram of a standard commodity FPGA IC chip in accordance with an embodiment of the present application.

Specification for Standard Commodity Field-Programmable-Gate-Array (FPGA) Integrated-Circuit (IC) Chip FIG. 9 is a schematically top view showing a block diagram of a standard commodity FPGA IC chip in accordance with an embodiment of the present application. Referring to FIG. 9, the standard commodity FPGA IC chip 200 may include (1) a plurality of programmable logic blocks 201 arranged in an array in a central region thereof, wherein each of the programmable logic blocks 201 may be arranged with multiple programmable logic cells (LC) 2014 as illustrated in FIG. 7 coupling to one another, (2) a plurality of programmable switch cells 379 as illustrated in FIG. 8 arranged around each of the programmable logic blocks (LB) 201, (3) multiple intra-chip interconnects 502 each extending over spaces between neighboring two of the programmable logic blocks 201, wherein the intra-chip interconnects 502 may include the programmable interconnects 361 as seen in FIG. 8 configured to be programmed for interconnection by its memory cells 362 and the non-programmable interconnects 364 as illustrated in FIG. 8 configured not to be programmable for interconnection, and (4) multiple I/O ports 377 having the number ranging from 2 to 64 for example, such as I/O Port 1, I/O Port 2, I/O Port 3 and I/O Port 4 for this case. Each of the I/O ports 377 may include (1) the small I/O circuits 203 having the number ranging from 4 to 256, such as 64 for this case, arranged in parallel for data transmission with bit width ranging from 4 to 256, such as 64 for this case, and (2) the I/O pads 372 having the number ranging from 4 to 256, such as 64 for this case, arranged in parallel and vertically over the small I/O circuits 203 respectively. Each of its small input/output (I/O) circuits 203 may include a small driver configured to drive data to its external circuits in the same chip package and a small receiver configured to receive data from its external circuits in the same chip package, wherein each of its small input/output (I/O) circuits 203 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively, each of its small input/output (I/O) circuits 203 may have an I/O power efficiency smaller than 0.5 pico-Joules per bit, per switch or per voltage swing, or between 0.01 and 0.5 pico-Joules per bit, per switch or per voltage swing.

Referring to FIG. 9, in a first clock cycle, for one of the small input/output (I/O) circuits 203 of the standard commodity FPGA IC chip 200, its small driver may be enabled by a data input at a first input point of its small driver and its small receiver may be inhibited by a data input at a first input point of its small receiver. Thereby, its small driver may amplify a data input at a second input point of its small driver, associated with the resulting value or programming code from one of the memory cells 490 of one of the programmable logic cells 2014 of the standard commodity FPGA IC chip 200 or one of the memory cells 362 of one of the programmable switch cells 379 of the standard commodity FPGA IC chip 200, as a data output of its small driver at an output point of its small driver to be transmitted to one of the I/O pads 372 vertically over said one of the small input/output (I/O) circuits 203 for external connection to the external circuits of the standard commodity FPGA IC chip 200, such as non-volatile memory (NVM) integrated-circuit (IC) chip.

In a second clock cycle, for said one of the small input/output (I/O) circuits 203 of the standard commodity FPGA IC chip 200, its small driver may be disabled by a data input at the first input point of its small driver and its small receiver may be activated by a data input at the first input point of its small receiver. Thereby, its small receiver may amplify a data input, i.e., a resulting value or programming code, at a second input point of its small receiver associated with data passed from the external circuits of the standard commodity FPGA IC chip 200, such as non-volatile memory (NVM) integrated-circuit (IC) chip, through said one of the I/O pads 372 as an data output of its small receiver at an output point of its small receiver to be passed to and stored in one of the memory cells 490 of one of the programmable logic cells 2014 of the standard commodity FPGA IC chip 200 or one of the memory cells 362 of one of the programmable switch cells 379 of the standard commodity FPGA IC chip 200.

In a third clock cycle, for said one of the small input/output (I/O) circuits 203 of the standard commodity FPGA IC chip 200, its small driver may be enabled by a data input at the first input point of its small driver and its small receiver may be inhibited by a data input at the first input point of its small receiver. Thereby, its small driver may amplify a data input at the second input point of its small driver, associated with the data output of one of the programmable logic cells 2014 of the standard commodity FPGA IC chip 200 as illustrated in FIG. 7 for example through first one or more of the programmable interconnects 361 of the standard commodity FPGA IC chip 200 and/or one or more of the programmable switch cells 379 of the standard commodity FPGA IC chip 200 each coupled between two of said first one or more of the programmable interconnects 361, as a data output of its small driver at the output point of its small driver to be transmitted to said one of the I/O pads 372 vertically over said one of the small input/output (I/O) circuits 203 for external connection to circuits outside the standard commodity FPGA IC chip 200, such as non-volatile memory (NVM) integrated-circuit (IC) chip.

In a fourth clock cycle, for said one of the small input/output (I/O) circuits 203 of the standard commodity FPGA IC chip 200, its small driver may be disabled by a data input at the first input point of its small driver and its small receiver may be activated by a data input at the first input point of its small receiver. Thereby, its small receiver may amplify a data input at the second input point of its small receiver transmitted from circuits, such as non-volatile memory (NVM) integrated-circuit (IC) chip, outside the standard commodity FPGA IC chip 200 through said one of the I/O pads 372 as a data output of its small receiver at the output point of its small driver associated with a data input of the input data set of one of the programmable logic cells 2014 of the standard commodity FPGA IC chip 200 as illustrated in FIG. 7 for example through second one or more of the programmable interconnects 361 of the standard commodity FPGA IC chip 200 and/or one or more of the programmable switch cells 379 of the standard commodity FPGA IC chip 200 each coupled between two of said second one or more of the programmable interconnects 361.

Referring to FIG. 9, the standard commodity FPGA IC chip 200 may further include a chip-enable (CE) pad 209 configured for enabling or disabling the standard commodity FPGA IC chip 200. For example, when the chip-enable (CE) pad 209 is at a logic level of “0”, the standard commodity FPGA IC chip 200 may be enabled to process data and/or operate with circuits outside of the standard commodity FPGA IC chip 200; when the chip-enable (CE) pad 209 is at a logic level of “1”, the standard commodity FPGA IC chip 200 may be disabled not to process data and/or operate with circuits outside of the standard commodity FPGA IC chip 200.

Referring to FIG. 9, the standard commodity FPGA IC chip 200 may further include multiple input selection (IS) pads 231, e.g., IS1, IS2, IS3 and IS4 pads, each configured to receive a data input associated with the data input at the first input point of the small receiver of each of the small I/O circuits 203 of one of its I/O ports 377, e.g., I/O Port 1, I/O Port 2, I/O Port 3 and I/O Port 4. For more elaboration, for the standard commodity FPGA IC chip 200, its IS1 pad 231 may receive a data input associated with the data input at the first input point of the small receiver of each of the small I/O circuits 203 of its I/O Port 1; its IS2 pad 231 may receive a data input associated with the data input at the first input point of the small receiver of each of the small I/O circuits 203 of its I/O Port 2; its IS3 pad 231 may receive a data input associated with the data input at the first input point of the small receiver of each of the small I/O circuits 203 of its I/O Port 3; and its IS4 pad may receive a data input associated with the data input at the first input point of the small receiver of each of the small I/O circuits 203 of its I/O Port 4. The standard commodity FPGA IC chip 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4, to pass data for its input operation. For each of the small I/O circuits 203 of each of the one or more I/O ports 377 selected in accordance with the logic levels at the input selection (IS) pads 231, its small receiver may be activated by the data input at the first input point of its small receiver transmitted from circuits outside of the standard commodity FPGA IC chip 200 through one of the input selection (IS) pads 231 to amplify or pass the data input at the second input point of its small receiver, transmitted from circuits outside the standard commodity FPGA IC chip 200 through one of the I/O pads 372 of said each of the one or more I/O ports 377 selected in accordance with the logic levels at the input selection (IS) pads 231, as the data output of its small receiver associated with a data input of the input data set of one of the programmable logic cells 2014 as seen in FIG. 7 of the standard commodity FPGA IC chip 200 through one or more of the programmable interconnects 361 as seen in FIG. 8 of the standard commodity FPGA IC chip 200, for example. For each of the small I/O circuits 203 of each of the I/O ports 377, not selected in accordance with in accordance with the logic levels at the input selection (IS) pads 231, of the standard commodity FPGA IC chip 200, its small receiver 375 may be inhibited by the data input at the first input point of its small receiver associated with the logic level at one of the input selection (IS) pads 231 of the standard commodity FPGA IC chip 200.

For example, referring to FIG. 9, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the standard commodity FPGA IC chip 200 may be enabled in accordance with the logic level at its chip-enable (CE) pad 209 and may select, in accordance with the logic levels at its IS1, IS2, IS3 and IS4 pads 231, one or more I/O port, e.g., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver may be activated by the data input at the first input point of its small receiver associated with the logic level at the IS1 pad 231 of the standard commodity FPGA IC chip 200. For each of the small I/O circuits 203 of each of the unselected I/O ports, i.e., I/O Port 2, I/O Port 3 and I/O Port 4, of the standard commodity FPGA IC chip 200, its small receiver may be inhibited by the data input at the first input point of its small receiver associated with the logic level at one of the IS2, IS3 and IS4 pads 231 of the standard commodity FPGA IC chip 200.

For example, referring to FIG. 9, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the standard commodity FPGA IC chip 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of each of the selected I/O ports 377, i.e., I/O Port 1, I/O Port 2, I/O Port 3 and I/O Port 4, of the standard commodity FPGA IC chip 200, its small receiver may be activated by the data input at the first input point of its small receiver associated with the logic level at one of the IS1, IS2, IS3 and IS4 pads 231 of the standard commodity FPGA IC chip 200.

Referring to FIG. 9, the standard commodity FPGA IC chip 200 may include multiple output selection (OS) pads 232, e.g., OS1, OS2, OS3 and OS4 pads, each configured to receive a data input associated with the data input at the first input point of the small driver of each of the small I/O circuits 203 of one of its I/O ports 377, e.g., I/O Port 1, I/O Port 2, I/O Port 3 and I/O Port 4. For more elaboration, for the standard commodity FPGA IC chip 200, its OS1 pad 232 may receive a data input associated with the data input at the first input point of the small driver of each of the small I/O circuits 203 of its I/O Port 1; its OS2 pad 232 may receive a data input associated with the data input at the first input point of the small driver of each of the small I/O circuits 203 of its I/O Port 2; its OS3 pad 232 may receive a data input associated with the data input at the first input point of the small driver of each of the small I/O circuits 203 of its I/O Port 3; its OS4 pad 232 may receive a data input associated with the data input at the first input point of the small driver of each of the small I/O circuits 203 of its I/O Port 4. The standard commodity FPGA IC chip 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4, to pass data for its output operation. For each of the small I/O circuits 203 of each of the one or more I/O ports 377 selected in accordance with the logic levels at the output selection (OS) pads 232, its small driver may be enabled by the data input at the first input point of its small driver transmitted from circuits outside of the standard commodity FPGA IC chip 200 through one of the output selection (OS) pads 232 to amplify or pass the data input at the second input point of its small driver, associated with the data output of one of the programmable logic cells 2014 as seen in FIG. 7 of the standard commodity FPGA IC chip 200 through one or more of the programmable interconnects 361 as seen in FIG. 8 of the standard commodity FPGA IC chip 200, as the data output of its small driver to be transmitted to circuits outside the standard commodity FPGA IC chip 200 through one of the I/O pads 372 of said each of the one or more I/O ports 377 selected in accordance with the logic levels at the output selection (OS) pads 232, for example. For each of the small I/O circuits 203 of each of the I/O ports 377, not selected in accordance with in accordance with the logic levels at the output selection (OS) pads 232, of the standard commodity FPGA IC chip 200, its small driver may be disabled by the data input at the first input point of its small driver associated with the logic level at one of the output selection (OS) pads 232 of the standard commodity FPGA IC chip 200.

For example, referring to FIG. 9, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the standard commodity FPGA IC chip 200 may be enabled in accordance with the logic level at its chip-enable (CE) pad 209 and may select, in accordance with the logic levels at its OS1, OS2, OS3 and OS4 pads 232, one or more I/O port, e.g., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver may be enabled by the data input at the first input point of its small driver associated with the logic level at the OS1 pad 232 of the standard commodity FPGA IC chip 200. For each of the small I/O circuits 203 of each of the unselected I/O ports, i.e., I/O Port 2, I/O Port 3 and I/O Port 4, of the standard commodity FPGA IC chip 200, its small driver may be disabled by the data input at the first input point of its small driver associated respectively with the logic level at one of the OS2, OS3 and OS4 pads 232 of the standard commodity FPGA IC chip 200.

For example, referring to FIG. 9, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the standard commodity FPGA IC chip 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation at the same clock cycle. For each of the small I/O circuits 203 of each of the selected I/O ports 377, i.e., I/O Port 1, I/O Port 2, I/O Port 3 and I/O Port 4, of the standard commodity FPGA IC chip 200, its small driver may be enabled by the data input at the first input point of its small driver associated with the logic level at one of the OS1, OS2, OS3 and OS4 pads 232 of the standard commodity FPGA IC chip 200.

Thereby, referring to FIG. 9, in a clock cycle, for the standard commodity FPGA IC chip 200, one or more of its I/O ports 377, i.e., I/O Port 1, I/O Port 2, I/O Port 3 and I/O Port 4, may be selected, in accordance with the logic levels at its IS1, IS2, IS3 and IS4 pads 231, to pass data for its input operation, while another one or more of its I/O ports 377, i.e., I/O Port 1, I/O Port 2, I/O Port 3 and I/O Port 4, may be selected, in accordance with the logic levels at its OS1, OS2, OS3 and OS4 pads 232, to pass data for its output operation. Its input selection (IS) pads 231 and output selection (OS) pads 232 may be provided as I/O-port selection pads.

Referring to FIG. 9, the standard commodity FPGA IC chip 200 may further include (1) multiple power pads 205 for applying the voltage Vcc of power supply to its memory cells 490 for the look-up tables (LUT) 210 of its programmable logic cells (LC) 2014 as illustrated in FIG. 7, the selection circuits 211 of its programmable logic cells (LC) 2014, the memory cells 362 of its programmable switch cells 379 as illustrated in FIG. 8, the selection circuits 211 of its programmable switch cells 379 and/or the small drivers and receivers of its small I/O circuits 203 through one or more of its non-programmable interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to its memory cells 490 for the look-up tables (LUT) 210 of its programmable logic cells (LC) 2014 as illustrated in FIG. 7, the selection circuits 211 of its programmable logic cells (LC) 2014, the memory cells 362 of its programmable switch cells 379 as illustrated in FIG. 8, the selection circuits 211 of its programmable switch cells 379 and/or the small drivers 374 and receivers 375 of its small I/O circuits 203 through one or more of its non-programmable interconnects 364.

Referring to FIG. 9, the standard commodity FPGA IC chip 200 may further include a clock pad (CLK) 229 configured to receive a clock signal from circuits outside of the standard commodity FPGA IC chip 200 and multiple control pads (CP) 378 configured to receive control commands to control the standard commodity FPGA IC chip 200.

Referring to FIG. 9, for the standard commodity FPGA IC chip 200, its programmable logic cells (LC) 2014 as seen in FIG. 7 may be reconfigurable for artificial-intelligence (AI) application. For example, in a clock cycle, one of the programmable logic cells (LC) 2014 of the standard commodity FPGA IC chip 200 may have the memory cells 490 to be programmed to perform OR operation; however, after one or more events happens, in another clock cycle said one of its programmable logic cells (LC) 2014 of the standard commodity FPGA IC chip 200 may have the memory cells 490 to be programmed to perform NAND operation for better AI performance.

Referring to FIG. 9, the standard commodity FPGA IC chip 200 may include a cryptography block or circuit configured to decrypt, in accordance with a password or key stored or saved in a non-volatile memory cell of its cryptography block or circuit, which may be composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor, encrypted data from a memory integrated-circuit (IC) chip as decrypted data to be passed to the memory cells 490 for the look-up tables (LUT) 210 of its programmable logic cells (LC) 2014 or the memory cells 362 of its programmable switch cells 379 and to encrypt, in accordance with the password or key, data from the memory cells 490 for the look-up tables (LUT) 210 of its programmable logic cells (LC) 2014 or the memory cells 362 of its programmable switch cells 379 as encrypted data to be passed to the memory integrated-circuit (IC) chip.

Referring to FIG. 9, the standard commodity FPGA IC chip 200 may include a plurality of large input/output (I/O) circuits each having a large driver configured to drive data to its external circuits in a different chip package and a large receiver configured to receive data from its external circuits in a different chip package, wherein each of its large input/output (I/O) circuits may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF; alternatively, each of its large input/output (I/O) circuits may have an I/O power efficiency greater than 3, 5 or 10 pico-Joules per bit, per switch or per voltage swing.

Figure 10:
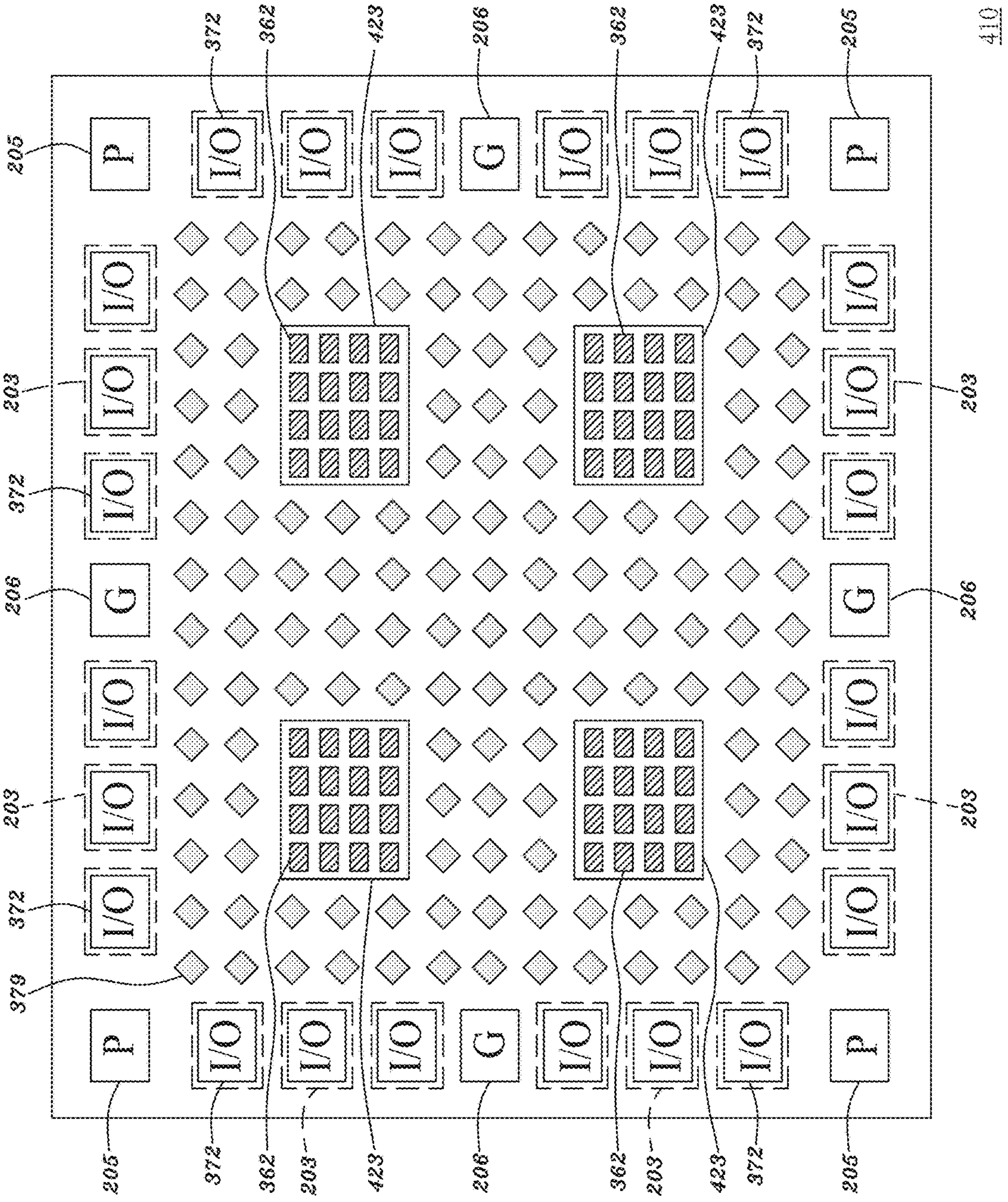
FIG. 10 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 10 is a schematically top view showing a block diagram of a dedicated programmable interconnection (DPI) integrated-circuit (IC) chip in accordance with an embodiment of the present application. Referring to FIG. 10, a dedicated programmable interconnection (DPI) integrated-circuit (IC) chip 410 may include (1) multiple memory-array blocks 423 arranged in an array in a central region thereof, (2) multiple groups of programmable switch cells 379 as illustrated in FIG. 8, each group of which is arranged in one or more rings around one of the memory-array blocks 423, and (3) multiple small input/output (I/O) circuits 203 each having a small receiver configured to generate a data output associated with a data input at one of the nodes N23-N26 of one of its programmable switch cells 379 as illustrated in FIG. 8 through one or more of its programmable interconnects 361 and a small driver configured to receive a data input associated with a data output at one of the nodes N23-N26 of another of its programmable switch cells 379 as illustrated in FIG. 8 through another one or more of its programmable interconnects 361, wherein each of its small input/output (I/O) circuits 203 may include a small driver configured to drive data to its external circuits in the same chip package and a small receiver configured to receive data from its external circuits in the same chip package, and each of its small input/output (I/O) circuits 203 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively, each of its small input/output (I/O) circuits 203 may have an I/O power efficiency smaller than 0.5 pico-Joules per bit, per switch or per voltage swing, or between 0.01 and 0.5 pico-Joules per bit, per switch or per voltage swing.

Referring to FIG. 10, for the DPIIC chip 410, each of its programmable switch cells 379 as seen in FIG. 8 may include the memory cells 362 in one of its four memory-array blocks 423 arranged in an array and the selection circuits 211 close to said one of its memory-array blocks 423, wherein each of the selection circuits 211 of said each of its programmable switch cells 379 may have the first set of input points for multiple data inputs of the first input data set of said each of its selection circuits 211 each associated with a data output, i.e., configuration-programming-memory (CPM) data, of one of the memory cells 362, i.e., configuration-programming-memory (CPM) cells, of said each of its programmable switch cells 379.

Referring to FIG. 10, the DPIIC chip 410 may include the I/O pads 372 each vertically over one of its small input/output (I/O) circuits 203. For one of the small input/output (I/O) circuits 203 of the DPIIC chip 410, in a first clock cycle, data from one of the nodes N23-N26 of one of the programmable switch cells 379 of the DPIIC chip 410 as illustrated in FIG. 8 may be associated with the data input of its small driver through one or more of the programmable interconnects 361 programmed by a first group of the programmable switch cells 379 of the DPIIC chip 410 and then its small driver may amplify or pass the data input of its small driver as a data output of its small driver to be transmitted to one of the I/O pads 372 of the DPIIC chip 410 vertically over said one of the small input/output (I/O) circuits 203 of the DPIIC chip 410 for external connection to circuits outside the DPIIC chip 410. In a second clock cycle, data from circuits outside the DPIIC chip 410 may be associated with a data input of its small receiver through said one of the I/O pads 372 of the DPIIC chip 410, and then its small receiver may amplify or pass the data input of its small receiver as a data output of its small receiver to be passed to one of the nodes N23-N26 of another of the programmable switch cells 379 of the DPIIC chip 410 as illustrated in FIG. 8 through another one or more of the programmable interconnects 361 programmed by a second group of the programmable switch cells 379 of the DPIIC chip 410.

Referring to FIG. 10, the DPIIC chip 410 may further include (1) multiple power pads 205 for applying the voltage Vcc of power supply to the memory cells 362 of its programmable switch cells 379 as illustrated in FIG. 8 and/or the selection circuits 211 of its programmable switch cells 379, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to the memory cells 362 of its programmable switch cells 379 as illustrated in FIG. 8 and/or the selection circuits 211 of its programmable switch cells 379.

Referring to FIG. 10, the DPIIC chip 410 may further include multiple SRAM cells used as cache memory for data latch or storage and a sense amplifier configured for reading, amplifying or detecting data from its SRAM cells acting as the cache memory.

Referring to FIG. 10, the DPIIC chip 410 may include a plurality of large input/output (I/O) circuits each having a large driver configured to drive data to its external circuits in a different chip package and a large receiver configured to receive data from its external circuits in a different chip package, wherein each of its large input/output (I/O) circuits may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF; alternatively, each of its large input/output (I/O) circuits may have an I/O power efficiency greater than 3, 5 or 10 pico-Joules per bit, per switch or per voltage swing.

Specification for Auxiliary and Supporting (AS) Integrated-Circuit (IC) Chip

Figure 11:
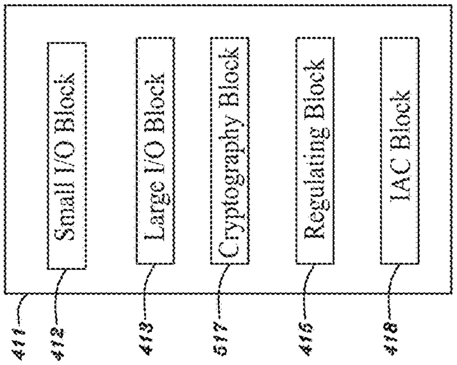
FIG. 11 is a schematically top view showing a block diagram of an auxiliary and supporting (AS) integrated-circuit (IC) chip in accordance with an embodiment of the present application.

FIG. 11 is a schematically top view showing a block diagram of an auxiliary and supporting (AS) integrated-circuit (IC) chip in accordance with an embodiment of the present application. Referring to FIG. 11, the auxiliary and supporting (AS) integrated-circuit (IC) chip 411 may include one, more or all of the following circuit blocks: (1) a large-input/output (I/O) block 412 configured for serial-advanced-technology-attachment (SATA) ports or peripheral-components-interconnect express (PCIe) ports each having a plurality of large input/output (I/O) circuits configured to couple to a memory integrated-circuit (IC) chip, such as non-volatile memory (NVM) integrated-circuit (IC) chip, NAND flash memory integrated-circuit (IC) chip or NOR flash memory integrated-circuit (IC) chip, for data transmission between the auxiliary and supporting (AS) integrated-circuit (IC) chip 411 and the memory integrated-circuit (IC) chip, wherein each of the large input/output (I/O)

circuits may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example, and alternatively each of the large input/output (I/O) circuits may have an I/O power efficiency greater than 3, 5 or 10 pico-Joules per bit, per switch or per voltage swing, (2) a small-input/output (I/O) block 413 having a plurality of small input/output (I/O) circuits configured to couple to a logic integrated-circuit (IC) chip, such as field-programmable-gate-array (FPGA) integrated-circuit (IC) chip, central-processing-unit (CPU) integrated-circuit (IC) chip, graphic-processing-unit (GPU) integrated-circuit (IC) chip, application-processing-unit (APU) chip or digital-signal-processing (DSP) integrated-circuit (IC) chip, for data transmission between the auxiliary and supporting (AS) integrated-circuit (IC) chip 411 and the logic integrated-circuit (IC) chip, wherein each of the small input/output (I/O) circuits may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF for example, and alternatively each of the small input/output (I/O) circuits may have an I/O power efficiency smaller than 0.5 pico-Joules per bit, per switch or per voltage swing, or between 0.01 and 0.5 pico-Joules per bit, per switch or per voltage swing, (3) a cryptography block or circuit 517 configured to decrypt, in accordance with a password or key stored or saved in a non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor, encrypted data from the memory integrated-circuit (IC) chip as decrypted data to be passed to the logic integrated-circuit (IC) chip and to encrypt, in accordance with the password or key, data from the logic integrated-circuit (IC) chip as encrypted data to be passed to the memory integrated-circuit (IC) chip, (4) a regulating block 415 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to the logic integrated-circuit (IC) chip, and (5) an innovated application-specific-integrated-circuit (ASIC) or customer-owned tooling (COT) block 418, i.e., IAC block, configured to implement intellectual-property (IP) circuits, application-specific (AS) circuits, analog circuits, mixed-mode signal circuits, radio-frequency (RF) circuits, and/or transmitter, receiver, transceiver circuits for customers.

Specification for Logic Drive

Figure 12A:
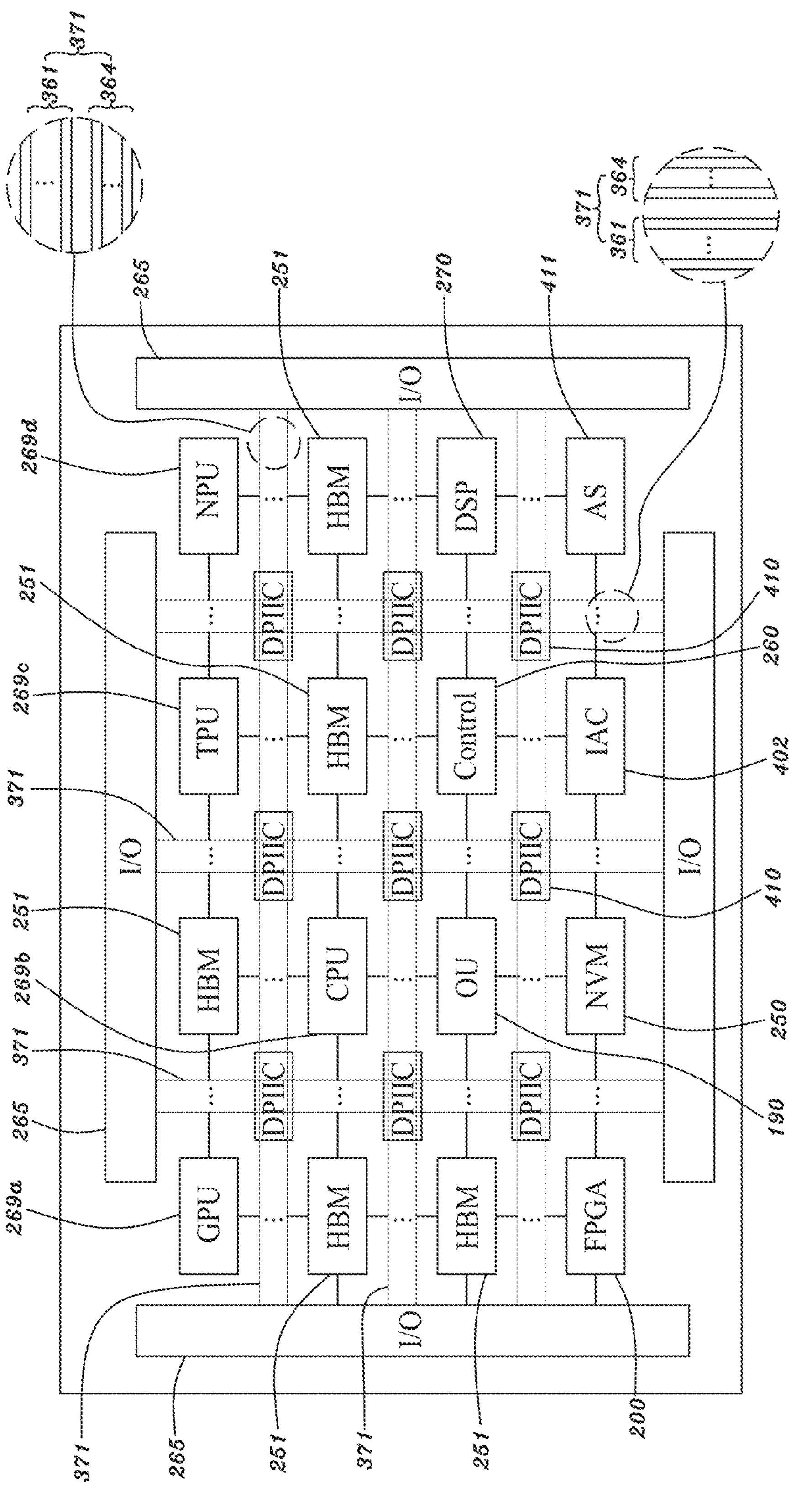
FIG. 12A is a schematically top view showing arrangement for various semiconductor integrated-circuit (IC) chips or operation units packaged in a standard commodity logic drive in accordance with an embodiment of the present application.

FIG. 12A is a schematically top view showing arrangement for various semiconductor integrated-circuit (IC) chips or operation units packaged in a standard commodity logic drive in accordance with an embodiment of the present application. Referring to FIG. 12A, a standard commodity logic drive 300 may be packaged with a standard commodity FPGA IC chip 200, graphic-processing-unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d* and digital-signal-processing (DSP) integrated-circuit (IC) chip 270 each assembled in a single-die type or in an operation unit (OU) 190 as seen in FIG. 17F, 17G, 19G, 19H, 20A, 20B, 21A, 21B, 22H, 23B, 27G, 30C, 34H, 37C, 38B, 39A, 42E, 45B and 48A. Further, the standard commodity logic drive 300 may be packaged with one or more auxiliary and supporting (AS) integrated-circuit (IC) chips 411 (only one is shown therein) each assembled in a single-die type or in an operation unit (OU) 190 as seen in FIG. 17F, 17G, 19G, 19H, 20A, 20B, 21A, 21B, 22H, 23B, 27G, 30C, 34H, 37C, 38B, 39A, 42E, 45B and 48A. Further, the standard commodity logic drive 300 may be packaged with multiple high-bandwidth-memory (HBM) integrated-circuit (IC) chips 251 each assembled in a single-die type or in an operation unit (OU) 190 as seen in FIG. 17F, 17G, 19G, 19H, 20A, 20B, 21A, 21B, 22H, 23B, 27G, 30C, 34H, 37C, 38B, 39A, 42E, 45B and 48A. Each of the HBM IC chips 251 in the standard commodity logic drive 300 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip, high speed, high bandwidth, wide bitwidth resistive random-access-memory (RRAM) chip or high speed, high bandwidth, wide bitwidth phase change random access memory (PCM) chips. For the standard commodity logic drive 300, each of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d* and digital-signal-processing (DSP) integrated-circuit (IC) chip 270 in the single-die type may be arranged horizontally adjacent to one of its HBM IC chips 251 in the single-die type for communication therebetween in a high speed, high bandwidth and wide bitwidth. The standard commodity logic drive 300 may be further packaged with one or more non-volatile memory (NVM) IC chips 250, such as NAND flash integrated-circuit (IC) chips, NOR flash integrated-circuit (IC) chips, ferro-electric random-access-memory (FRAM) integrated-circuit (IC) chips, magnetoresistive random access memory (MRAM) integrated-circuit (IC) chips or resistive random access memory (RRAM) integrated-circuit (IC) chips, (only one is shown therein) configured to store the resulting values or programming codes in a non-volatile manner for programming or configuring the programmable logic cells 2014 and programmable switch cells 379 of its standard commodity FPGA IC chip 200 as seen in FIGS. 7 and 8 and for programming or configuring the cross-point switches 379 of its DPIIC chips 410 as seen in FIG. 10, and to store data in a non-volatile manner from its HBM IC chips 251. The standard commodity logic drive 300 may be further packaged with an innovated application-specific-IC (ASIC) or customer-owned-tooling (COT) (abbreviated as IAC below) integrated-circuit (IC) chip 402 including therein intellectual-property (IP) circuits, application-specific (AS) circuits, analog circuits, mixed-mode signal circuits, radio-frequency (RF) circuits, and/or transmitter, receiver or transceiver circuits, etc. The standard commodity logic drive 300 may be further packaged with a dedicated control and input/output (I/O) chip 260 to control data transmission between any two of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC IC chip 402 and non-volatile memory (NVM) IC chip 250.

Referring to FIG. 12A, for the standard commodity logic drive, its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC IC chip 402, non-volatile memory (NVM) IC chip 250 and dedicated control and I/O chip 260 may be arranged in an array. The standard commodity logic drive 300 may include multiple inter-chip interconnects 371 each extending alone edges of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC IC chip 402, non-volatile memory (NVM) IC chip 250 and dedicated control and I/O chip 260.

Referring to FIG. 12A, the standard commodity logic drive 300 may include a plurality of DPIIC chips 410 aligned with a cross of a vertical bundle of inter-chip interconnects 371 and a horizontal bundle of inter-chip interconnects 371. For the standard commodity logic drive 300, each of its DPIIC chips 410 may be arranged at corners of four of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC IC chip 402, non-volatile memory (NVM) IC chip 250 and dedicated control and I/O chip 260 around said each of its DPIIC chips 410. The inter-chip interconnects 371 may be formed for the programmable interconnect 361. Data transmission may be built (1) between one of the programmable interconnects 361 of the inter-chip interconnects 371 and one of the programmable interconnects 361 of the standard commodity FPGA IC chip 200 via one of the small input/output (I/O) circuits 203 of the standard commodity FPGA IC chip 200, and (2) between one of the programmable interconnects 361 of the inter-chip interconnects 371 and one of the programmable interconnects 361 of one of the DPIIC chips 410 via one of the small input/output (I/O) circuits 203 of said one of the DPIIC chips 410.

Referring to FIG. 12A, for the standard commodity logic drive 300, one or more of the programmable interconnects 361 of its inter-chip interconnects 371 may couple from its standard commodity FPGA IC chip 200 in a single-die type or in the operation unit 190 to all of the DPIIC chips 410. One or more of the programmable interconnects 361 of its inter-chip interconnects 371 may couple from the standard commodity FPGA IC chip 200 in a single-die type or in the operation unit 190 to its dedicated control and input/output (I/O) chip 260. One or more of the programmable interconnects 361 of its inter-chip interconnects 371 may couple from its standard commodity FPGA IC chip 200 in a single-die type or in the operation unit 190 to its NVM IC chip 250. One or more of the programmable interconnects 361 of its inter-chip interconnects 371 may couple from its standard commodity FPGA IC chip 200 in a single-die type or in the operation unit 190 to its GPU chip 269*a* in a single-die type or in the operation unit 190. One or more of the programmable interconnects 361 of its inter-chip interconnects 371 may couple from its standard commodity FPGA IC chip 200 in a single-die type or in the operation unit 190 to its CPU chip 269*b* in a single-die type or in the operation unit 190. One or more of the programmable interconnects 361 of its inter-chip interconnects 371 may couple from its standard commodity FPGA IC chip 200 in a single-die type or in the operation unit 190 to its DSP chip 270 in a single-die type or in the operation unit 190. One or more of the programmable interconnects 361 of its inter-chip interconnects 371 may couple from its standard commodity FPGA IC chip 200 in a single-die type to one of its HBMIC chips 251 in a single-die type next to its standard commodity FPGA IC chip 200 and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its standard commodity FPGA IC chip 200 in a single-die type or in the operation unit 190 to its IAC IC chip 402. One or more of the programmable interconnects 361 of its inter-chip interconnects 371 may couple from its standard commodity FPGA IC chip 200 in a single-die type or in the operation unit 190 to its TPU chip 269*c* in a single-die type or in the operation unit 190. One or more of the programmable interconnects 361 of its inter-chip interconnects 371 may couple from its standard commodity FPGA IC chip 200 in a single-die type or in the operation unit 190 to its NPU chip 269*d* in a single-die type or in the operation unit 190. One or more of the programmable interconnects 361 of its inter-chip interconnects 371 may couple from its standard commodity FPGA IC chip 200 in a single-die type to its standard commodity FPGA IC chip 200 in the operation unit 190.

Referring to FIG. 12A, for the standard commodity logic drive 300, one or more of the programmable interconnects 361 of its inter-chip interconnects 371 may couple from each of its DPIIC chips 410 to its dedicated control and input/output (I/O) chip 260. One or more of the programmable interconnects 361 of its inter-chip interconnects 371 may couple from each of its DPIIC chips 410 to its NVM IC chip 250. One or more of the programmable interconnects 361 of its inter-chip interconnects 371 may couple from each of its DPIIC chips 410 to its GPU chip 269*a* in a single-die type or in the operation unit 190. One or more of the programmable interconnects 361 of its inter-chip interconnects 371 may couple from each of its DPIIC chips 410 to its CPU chip 269*b* in a single-die type or in the operation unit 190. One or more of the programmable interconnects 361 of its inter-chip interconnects 371 may couple from each of its DPIIC chips 410 to its DSP chip 270 in a single-die type or in the operation unit 190. One or more of the programmable interconnects 361 of its inter-chip interconnects 371 may couple from each of its DPIIC chips 410 to all of its HBM IC chips 251 each in a single-die type or in the operation unit 190. One or more of the programmable interconnects 361 of its inter-chip interconnects 371 may couple from each of its DPIIC chips 410 to the others of the DPIIC chips 410. One or more of the programmable interconnects 361 of its inter-chip interconnects 371 may couple from each of its DPIIC chips 410 to its IAC IC chip 402. One or more of the programmable interconnects 361 of its inter-chip interconnects 371 may couple from each of its DPIIC chips 410 to its TPU chip 269*c* in a single-die type or in the operation unit 190. One or more of the programmable interconnects 361 of its inter-chip interconnects 371 may couple from each of its DPIIC chips 410 to its NPU chip 269*d* in a single-die type or in the operation unit 190.

Referring to FIG. 12A, for the standard commodity logic drive 300, one or more of the programmable interconnects 361 of its inter-chip interconnects 371 may couple from its CPU chip 269*b* in a single-die type or in the operation unit 190 to its GPU chip 269*a* in a single-die type or in the operation unit 190. One or more of the programmable interconnects 361 of its inter-chip interconnects 371 may couple from its TPU chip 269*c* in a single-die type or in the operation unit 190 to its GPU chip 269*a* in a single-die type or in the operation unit 190. One or more of the programmable interconnects 361 of its inter-chip interconnects 371 may couple from its NPU chip 269*d* in a single-die type or in the operation unit 190 to its GPU chip 269*a* in a single-die type or in the operation unit 190. One or more of the programmable interconnects 361 of its inter-chip interconnects 371 may couple from its DSP chip 270 in a single-die type or in the operation unit 190 to its GPU chip 269*a* in a single-die type or in the operation unit 190. One or more of the programmable interconnects 361 of its inter-chip interconnects 371 may couple from its CPU chip 269*b* in a single-die type or in its operation unit 190 to its NVM IC chip 250. One or more of the programmable interconnects 361 of its inter-chip interconnects 371 may couple from its TPU chip 269*c* in a single-die type or in its operation unit 190 to its NVM IC chip 250. One or more of the programmable interconnects 361 of its inter-chip interconnects 371 may couple from its NPU chip 269*d* in a single-die type or in its operation unit 190 to its NVM IC chip 250. One or more of the programmable interconnects 361 of its inter-chip interconnects 371 may couple from its DSP chip 270 in a single-die type or in its operation unit 190 to its NVM IC chip 250. One or more of the programmable interconnects 361 of its inter-chip interconnects 371 may couple from its CPU chip 269*b* in a single-die type to one of its HBM IC chips 251 in a single-die type next to its CPU chip 269*b* and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its TPU chip 269*c* in a single-die type to one of its HBM IC chips 251 in a single-die type next to its TPU chip 269*c* and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its NPU chip 269*d* in a single-die type to one of its HBM IC chips 251 in a single-die type next to its NPU chip 269*d* and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its DSP chip 270 in a single-die type to one of its HBM IC chips 251 in a single-die type next to its DSP chip 270 and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its CPU chip 269*b* in a single-die type or in its operation unit 190 to the IAC IC chip 402. One or more of the programmable interconnects 361 of its inter-chip interconnects 371 may couple from its TPU chip 269*c* in a single-die type or in its operation unit 190 to the IAC IC chip 402. One or more of the programmable interconnects 361 of its inter-chip interconnects 371 may couple from its NPU chip 269*d* in a single-die type or in its operation unit 190 to the IAC IC chip 402. One or more of the programmable interconnects 361 of its inter-chip interconnects 371 may couple from its DSP chip 270 in a single-die type or in its operation unit 190 to its IAC IC chip 402. One or more of the programmable interconnects 361 of its inter-chip interconnects 371 may couple from its CPU chip 269*b* in a single-die type or in its operation unit 190 to its DSP chip 270 in a single-die type or in its operation unit 190. One or more of the programmable interconnects 361 of its inter-chip interconnects 371 may couple from its CPU chip 269*b* in a single-die type or in its operation unit 190 to its TPU chip 269*c* in a single-die type or in its operation unit 190. One or more of the programmable interconnects 361 of its inter-chip interconnects 371 may couple from its CPU chip 269*b* in a single-die type or in its operation unit 190 to its NPU chip 269*d* in a single-die type or in its operation unit 190. One or more of the programmable interconnects 361 of its inter-chip interconnects 371 may couple from its TPU chip 269*c* in a single-die type or in its operation unit 190 to its NPU chip 269*d* in a single-die type or in its operation unit 190. One or more of the programmable interconnects 361 of its inter-chip interconnects 371 may couple from its GPU chip 269*a* in a single-die type to one of its HBM IC chips 251 in a single-die type next to its GPU chip 269*a* and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its GPU chip 269*a* in a single-die type or in its operation unit 190 to its NVM IC chip 250. One or more of the programmable interconnects 361 of its inter-chip interconnects 371 may couple from its GPU chip 269*a* in a single-die type to its GPU chip 269*a* in its operation unit 190. One or more of the programmable interconnects 361 of its inter-chip interconnects 371 may couple from its GPU chip 269*a* in a single-die type or in its operation unit 190 to its IAC IC chip 402. One or more of the programmable interconnects 361 of its inter-chip interconnects 371 may couple from its NVM IC chip 250 to its dedicated control and input/output (I/O) chip 260. One or more of the programmable interconnects 361 of its inter-chip interconnects 371 may couple from each of its HBM IC chips 251 in a single-die type or in its operation unit 190 to its dedicated control and input/output (I/O) chip 260. One or more of the programmable interconnects 361 of its inter-chip interconnects 371 may couple from its GPU chip 269*a* in a single-die type or in its operation unit 190 to its dedicated control and input/output (I/O) chip 260. One or more of the programmable interconnects 361 of its inter-chip interconnects 371 may couple from its CPU chip 269*b* in a single-die type or in its operation unit 190 to its dedicated control and input/output (I/O) chip 260. One or more of the programmable interconnects 361 of its inter-chip interconnects 371 may couple from its TPU chip 269*c* in a single-die type or in its operation unit 190 to its dedicated control and input/output (I/O) chip 260. One or more of the programmable interconnects 361 of its inter-chip interconnects 371 may couple from its NPU chip 269*d* in a single-die type or in its operation unit 190 to its dedicated control and input/output (I/O) chip 260. One or more of the programmable interconnects 361 of its inter-chip interconnects 371 may couple from its DSP chip 270 in a single-die type or in its operation unit 190 to its dedicated control and input/output (I/O) chip 260. One or more of the programmable interconnects 361 of its inter-chip interconnects 371 may couple from its NVM IC chip 250 to each of its HBM IC chips 251 in a single-die type or in its operation unit 190. One or more of the programmable interconnects 361 of its inter-chip interconnects 371 may couple from its NVM IC chip 250 to its IAC IC chip 402. One or more of the programmable interconnects 361 of its inter-chip interconnects 371 may couple from each of its HBM IC chips 251 in a single-die type or in its operation unit 190 to its IAC IC chip 402. One or more of the programmable interconnects 361 of its inter-chip interconnects 371 may couple from its IAC IC chip 402 to its dedicated control and input/output (I/O) chip 260. One or more of the programmable interconnects 361 of its inter-chip interconnects 371 may couple from each of its HBM IC chips 251 in a single-die type or in its operation unit 190 to one of the others of the HBM IC chips 251 in a single-die type or in its operation unit 190.

Referring to FIG. 12A, the standard commodity logic drive 300 may include multiple dedicated input/output (I/O) chips 265 in a peripheral region thereof surrounding a central region thereof, in which its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, HBM IC chips 251, IAC IC chip 402, non-volatile memory (NVM) IC chip 250, dedicated control and I/O chip 260 and DPIIC chips 410 are located. For the standard commodity logic drive 300, one or more of the programmable interconnects 361 of its inter-chip interconnects 371 may couple from its standard commodity FPGA IC chip 200 in a single-die type or in its operation unit 190 to all of its dedicated input/output (I/O) chips 265. One or more of the programmable interconnects 361 of its inter-chip interconnects 371 may couple from each of its DPIIC chips 410 to all of its dedicated input/output (I/O) chips 265. One or more of the programmable interconnects 361 of its inter-chip interconnects 371 may couple from its NVM IC chip 250 to all of its dedicated input/output (I/O) chips 265. One or more of the programmable interconnects 361 of its inter-chip interconnects 371 may couple from its dedicated control and input/output (I/O) chip 260 to all of its dedicated input/output (I/O) chips 265. One or more of the programmable interconnects 361 of its inter-chip interconnects 371 may couple from its GPU chip 269*a* in a single-die type or in its operation unit 190 to all of its dedicated input/output (I/O) chips 265. One or more of the programmable interconnects 361 of its inter-chip interconnects 371 may couple from its CPU chip 269*b* in a single-die type or in its operation unit 190 to all of its dedicated input/output (I/O) chips 265. One or more of the programmable interconnects 361 of its inter-chip interconnects 371 may couple from its TPU chip 269*c* in a single-die type or in its operation unit 190 to all of its dedicated input/output (I/O) chips 265. One or more of the programmable interconnects 361 of its inter-chip interconnects 371 may couple from its NPU chip 269*d* in a single-die type or in its operation unit 190 to all of its dedicated input/output (I/O) chips 265. One or more of the programmable interconnects 361 of its inter-chip interconnects 371 may couple from its DSP chip 270 in a single-die type or in its operation unit 190 to all of its dedicated input/output (I/O) chips 265. One or more of the programmable interconnects 361 of its inter-chip interconnects 371 may couple from each of its HBM IC chips 251 in a single-die type or in its operation unit 190 to all of its dedicated input/output (I/O) chips 265. One or more of the programmable interconnects 361 of its inter-chip interconnects 371 may couple from its IAC IC chip 402 to all of its dedicated input/output (I/O) chips 265. For the standard commodity logic drive 300, its dedicated control and input/output (I/O) chip 260 is configured to control data transmission between each of its dedicated input/output (I/O) chips 265 and one of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, HBM IC chips 251, IAC IC chip 402, non-volatile memory (NVM) IC chip 250, dedicated control and I/O chip 260 and DPIIC chips 410.

Referring to FIG. 12A, for the standard commodity logic drive 300 being in operation, each of its DPIIC chips 410 may be arranged with the SRAM cells acting as cache memory to store data from any of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC IC chip 402, non-volatile memory (NVM) IC chip 250, dedicated control and I/O chip 260 and DPIIC chips 410.

Referring to FIG. 12A, for the standard commodity logic drive 300, its non-volatile memory (NVM) IC chip 250 may include multiple large input/output (I/O) circuits each having an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its non-volatile memory (NVM) IC chip 250 may have an I/O power efficiency greater than 3, 5 or 10 pico-Joules per bit, per switch or per voltage swing. Alternatively, its non-volatile memory (NVM) IC chip 250 may include a cryptography block or circuit configured to decrypt, in accordance with a password or key stored or saved in a non-volatile memory cell of the cryptography block or circuit of its non-volatile memory (NVM) IC chip 250, which may be composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor, encrypted data from multiple non-volatile memory cells of its non-volatile memory (NVM) IC chip 250 as decrypted data and to encrypt, in accordance with the password or key, data as encrypted data to be stored in multiple non-volatile memory cells of its non-volatile memory (NVM) IC chip 250.

Referring to FIG. 12A, for a first aspect of the standard commodity logic drive 300, a first one of the large I/O circuits of its NVM IC chip 250 may have a large driver coupling to a large receiver of a second one of the large I/O circuits of one of the AS IC chip 411 via one of the non-programmable interconnects 364 of the inter-chip interconnects 371 for passing first encrypted CPM data from the large driver of the first one of the large I/O circuits to the large receiver of the second one of the large I/O circuits. Next, the first encrypted CPM data may be decrypted as illustrated in FIG. 11, in accordance with a password or key, by the cryptography block or circuit 517 of its AS IC chip 411 as first decrypted CPM data. Next, a first one of the small I/O circuits of its AS IC chip 411 may have a small driver coupling to a small receiver of a second one of the small I/O circuits of its standard commodity FPGA IC chip 200 via another of the non-programmable interconnects 364 of the inter-chip interconnects 371 for passing the first decrypted CPM data from the small driver of the first one of the small I/O circuits to the small receiver 375 of the second one of the small I/O circuits. Next, one of the first type of memory cells 490 of one of the programmable logic cells (LC) 2014 of its standard commodity FPGA IC chip 200 as seen in FIG. 7 may be programmed or configured in accordance with the first decrypted CPM data, or one of the first type of memory cells 362 of one of the programmable switch cells 379 of its standard commodity FPGA IC chip 200 as seen in FIG. 8 may be programmed or configured in accordance with the first decrypted CPM data. Alternatively, a third one of the small I/O circuits of its standard commodity FPGA IC chip 200 may have a small driver coupling to a small receiver of a fourth one of the small I/O circuits of its AS IC chip 411 via another of the non-programmable interconnects 364 of the inter-chip interconnects 371 for passing second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chip 200 from the small driver of the third one of the small I/O circuits to the small receiver of the fourth one of the small I/O circuits. Next, the second CPM data may be encrypted as illustrated in FIG. 11, in accordance with the password or key, by the cryptography block or circuit 517 of its AS IC chip 411 as second encrypted CPM data. Next, a third one of the large I/O circuits of its AS IC chip 411 may have a large driver coupling to a large receiver of a fourth one of the large I/O circuits of its NVM IC chip 250 via another of the non-programmable interconnects 364 of the inter-chip interconnects 371 for passing the second encrypted CPM data from the large driver of the third one of the large I/O circuits to the large receiver of the fourth one of the large I/O circuits to be stored in its NVM IC chip 250.

Referring to FIG. 12A, for a second aspect of the standard commodity logic drive 300, a first one of the large I/O circuits of its NVM IC chip 250 may have a large driver coupling to a large receiver of a second one of the large I/O circuits of its AS IC chip 411 via one of the non-programmable interconnects 364 of the inter-chip interconnects 371 for passing first encrypted CPM data from the large driver 274 of the first one of the large I/O circuits to the large receiver 275 of the second one of the large I/O circuits 341. Next, a first one of the small I/O circuits of its AS IC chip 411 may have a small driver coupling to a small receiver of a second one of the small I/O circuits of its standard commodity FPGA IC chip 200 via another of the non-programmable interconnects 364 of the inter-chip interconnects 371 for passing the first encrypted CPM data from the small driver 374 of the first one of the small I/O circuits to the small receiver of the second one of the small I/O circuits. Next, its standard commodity FPGA IC chip 200 may include the cryptography block or circuit as illustrated in FIG. 9 configured to decrypt, in accordance with a password or key, the first encrypted CPM data as first decrypted CPM data. Next, one of the first type of memory cells 490 of one of the programmable logic cells (LC) 2014 of its standard commodity FPGA IC chip 200 as seen in FIG. 7 may be programmed or configured in accordance with the first decrypted CPM data, or one of the first type of memory cells 362 of one of the programmable switch cells 379 of its standard commodity FPGA IC chip 200 as seen in FIG. 8 may be programmed or configured in accordance with the first decrypted CPM data. Alternatively, second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chip 200 may be encrypted, in accordance with the password or key, by the cryptography block or circuit of its standard commodity FPGA IC chip 200 as second encrypted CPM data. Next, a third one of the small I/O circuits 203 of its standard commodity FPGA IC chips 200 may have a small driver coupling to a small receiver of a fourth one of the small I/O circuits of its AS IC chip 411 via another of the non-programmable interconnects 364 of the inter-chip interconnects 371 for passing the second encrypted CPM data from the small driver 374 of the third one of the small I/O circuits 203 to the small receiver 375 of the fourth one of the small I/O circuits 203. Next, a third one of large I/O circuits of its AS IC chip 411 may have a large driver coupling to a large receiver of a fourth one of the large I/O circuits of its NVM IC chip 250 via another of the non-programmable interconnects 364 of the inter-chip interconnects 371 for passing the second encrypted CPM data from the large driver of the third one of the large I/O circuits to the large receiver 275 of the fourth one of the large I/O circuits to be stored in its NVM IC chip 250.

Referring to FIG. 12A, for a third aspect of the standard commodity logic drive 300, a first one of the large I/O circuits of its NVM IC chip 250 may have a large driver coupling to a large receiver of a second one of the large I/O circuits of its standard commodity FPGA IC chip 200 via one of the non-programmable interconnects 364 of the inter-chip interconnects 371 for passing first encrypted CPM data from the large driver of the first one of the large I/O circuits to the large receiver of the second one of the large I/O circuits. Next, its standard commodity FPGA IC chip 200 may include the cryptography block or circuit as illustrated in FIG. 9 configured to decrypt, in accordance with a password or key, the first encrypted CPM data as first decrypted CPM data. Next, one of the first type of memory cells 490 of one of the programmable logic cells (LC) 2014 of its standard commodity FPGA IC chip 200 as seen in FIG. 7 may be programmed or configured in accordance with the first decrypted CPM data, or one of the first type of memory cells 362 of one of the programmable switch cells 379 of its standard commodity FPGA IC chip 200 as seen in FIG. 8 may be programmed or configured in accordance with the first decrypted CPM data. Alternatively, second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chip 200 may be encrypted, in accordance with the password or key, by the cryptography block or circuit of its standard commodity FPGA IC chip 200 as second encrypted CPM data. Next, a third one of the large I/O circuits of its standard commodity FPGA IC chip 200 may have a large driver coupling to a large receiver of a fourth one of the large I/O circuits of its NVM IC chip 250 via another of the non-programmable interconnects 364 of the inter-chip interconnects 371 for passing the second encrypted CPM data from the large driver of the third one of the small I/O circuits 203 to the large receiver of the fourth one of the small I/O circuits 203 to be stored in its NVM IC chip 250.

Referring to FIG. 12A, for a fourth aspect of the standard commodity logic drive 300, its NVM IC chip 250 may include the cryptography block or circuit configured to decrypt, in accordance with a password or key, first encrypted CPM data stored therein as first decrypted CPM data. A first one of the large I/O circuits of its NVM IC chip 250 may have a large driver coupling to a large receiver of a second one of the large I/O circuits of its AS IC chip 411 via one of the non-programmable interconnects 364 of the inter-chip interconnects 371 for passing the first decrypted CPM data from the large driver of the first one of the large I/O circuits to the large receiver of the second one of the large I/O circuits. Next, a first one of the small I/O circuits of its AS IC chip 411 may have a small driver coupling to a small receiver of a second one of the small I/O circuits of its standard commodity FPGA IC chip 200 via another of the non-programmable interconnects 364 of the inter-chip interconnects 371 for passing the first decrypted CPM data from the small driver of the first one of the small I/O circuits to the small receiver of the second one of the small I/O circuits. Next, one of the first type of memory cells 490 of one of the programmable logic cells (LC) 2014 of its standard commodity FPGA IC chip 200 as seen in FIG. 7 may be programmed or configured in accordance with the first decrypted CPM data, or one of the first type of memory cells 362 of one of the programmable switch cells 379 of its standard commodity FPGA IC chip 200 as seen in FIG. 8 may be programmed or configured in accordance with the first decrypted CPM data. Alternatively, a third one of the small I/O circuits 203 of its standard commodity FPGA IC chip 200 may have a small driver coupling to a small receiver of a fourth one of the small I/O circuits of its AS IC chip 411 via another of the non-programmable interconnects 364 of the inter-chip interconnects 371 for passing second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chip 200 from the small driver of the third one of the small I/O circuits to the small receiver of the fourth one of the small I/O circuits. Next, a third one of the large I/O circuits of its AS IC chip 411 may have a large driver coupling to a large receiver of a fourth one of the large I/O circuits of its NVM IC chip 250 via another of the non-programmable interconnects 364 of the inter-chip interconnects 371 for passing the second CPM data from the large driver of the third one of the large I/O circuits to the large receiver of the fourth one of the large I/O circuits. The second CPM data may be encrypted, in accordance with the password or key, by the cryptography block or circuit of its NVM IC chip 250 as second encrypted CPM data to be stored in its NVM IC chip 250.

Referring to FIG. 12A, for a fifth aspect of the standard commodity logic drive 300, its NVM IC chip 250 may include the cryptography block or circuit configured to decrypt, in accordance with a password or key, first encrypted CPM data stored therein as first decrypted CPM data. A first one of the large I/O circuits of its NVM IC chip 250 may have a large driver coupling to a large receiver of a second one of the large I/O circuits of its standard commodity FPGA IC chip 200 via one of the non-programmable interconnects 364 of the inter-chip interconnects 371 for passing the first decrypted CPM data from the large driver of the first one of the large I/O circuits to the large receiver of the second one of the large I/O circuits. Next, one of the first type of memory cells 490 of one of the programmable logic cells (LC) 2014 of its standard commodity FPGA IC chip 200 as seen in FIG. 7 may be programmed or configured in accordance with the first decrypted CPM data, or one of the first type of memory cells 362 of one of the programmable switch cells 379 of its standard commodity FPGA IC chip 200 as seen in FIG. 8 may be programmed or configured in accordance with the first decrypted CPM data. Alternatively, a third one of the large I/O circuits of its standard commodity FPGA IC chips 200 may have a large driver coupling to a large receiver of a fourth one of the large I/O circuits of its NVM IC chip 250 via another of the non-programmable interconnects 364 of the inter-chip interconnects 371 for passing second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chips 200 from the large driver of the third one of the large I/O circuits to the large receiver of the fourth one of the large I/O circuits. The second CPM data may be encrypted, in accordance with the password or key, by the cryptography block or circuit of its NVM IC chip 250 as second encrypted CPM data to be stored in its NVM IC chip 250.

Figure 12B:
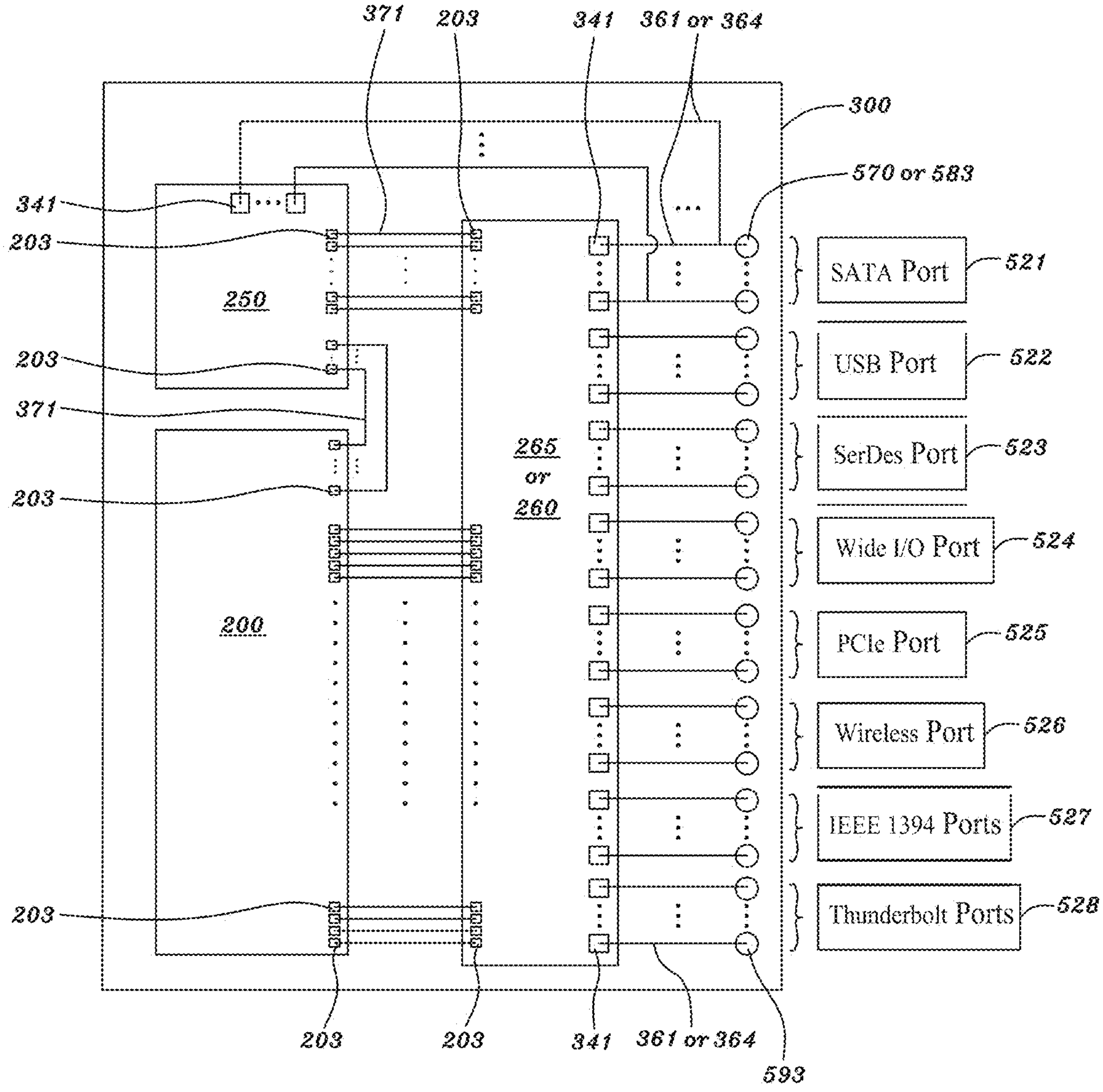
FIG. 12B is a block diagram showing interconnection in a standard commodity logic drive in accordance with an embodiment of the present application.

FIG. 12B is a block diagram showing interconnection in a standard commodity logic drive in accordance with an embodiment of the present application. Referring to FIG. 12B, for the standard commodity logic drive 300 as illustrated in FIG. 12A, each of its dedicated I/O chips 265 and control and I/O chip 260 may include a first group of small I/O circuits 203 each coupling to one of a first group of small I/O circuits 203 of its FPGA IC chip 200 through one of its inter-chip interconnect 371, i.e., programmable or non-programmable interconnect 361 or 364, and a second group of small I/O circuits 203 each coupling to one of a first group of small I/O circuits 203 of its NVM IC chip 250 through one of its inter-chip interconnect 371, i.e., programmable or non-programmable interconnect 361 or 364. Its FPGA IC chip 200 may include a second group of small I/O circuits 203 each coupling to one of a second group of small I/O circuits 203 of its NVM IC chip 250 through one of its inter-chip interconnect 371, i.e., programmable or non-programmable interconnect 361 or 364. Each of its dedicated I/O chips 265 and control and I/O chip 260 may include (1) a first group of large I/O circuits 341 each coupling to one of its metal bumps, pillars or pads 570 or metal pads 583 as seen in FIGS. 22H, 23B, 27G, 30C, 34H, 37C, 38B, 39A, 42E, 45B and 48A for one or more serial-advanced-technology-attachment (SATA) ports 521 and one of the large I/O circuits 341 of its NVM IC chip 250 through one of its programmable or non-programmable interconnects 361 or 364, (2) a second group of large I/O circuits 341 each coupling to one of its metal bumps, pillars or pads 570 or metal pads 583 for one or more universal serial bus (USB) ports 522 through one of its programmable or non-programmable interconnects 361 or 364, (3) a third group of large I/O circuits 341 each coupling to one of its metal bumps, pillars or pads 570 or metal pads 583 for one or more serializer/deserializer (SerDes) ports 523 through one of its programmable or non-programmable interconnects 361 or 364, (4) a fourth group of large I/O circuits 341 each coupling to one of its metal bumps, pillars or pads 570 or metal pads 583 for one or more wide input/output (I/O) ports 523 through one of its programmable or non-programmable interconnects 361 or 364, (5) a fifth group of large I/O circuits 341 each coupling to one of its metal bumps, pillars or pads 570 or metal pads 583 for one or more peripheral-components-interconnect express (PCIe) ports 525 through one of its programmable or non-programmable interconnects 361 or 364, (6) a sixth group of large I/O circuits 341 each coupling to one of its metal bumps, pillars or pads 570 or metal pads 583 for one or more wireless ports 526 through one of its programmable or non-programmable interconnects 361 or 364, (7) a seventh group of large I/O circuits 341 each coupling to one of its metal bumps, pillars or pads 570 or metal pads 583 for one or more IEEE 1394 ports 527 through one of its programmable or non-programmable interconnects 361 or 364 and (8) an eighth group of large I/O circuits 341 each coupling to one of its metal bumps, pillars or pads 570 or metal pads 583 for one or more thunderbolt ports 528 through one of its programmable or non-programmable interconnects 361 or 364.

Embodiment for Fine-line Interconnection Bridge (FIB)

Figure 13A:
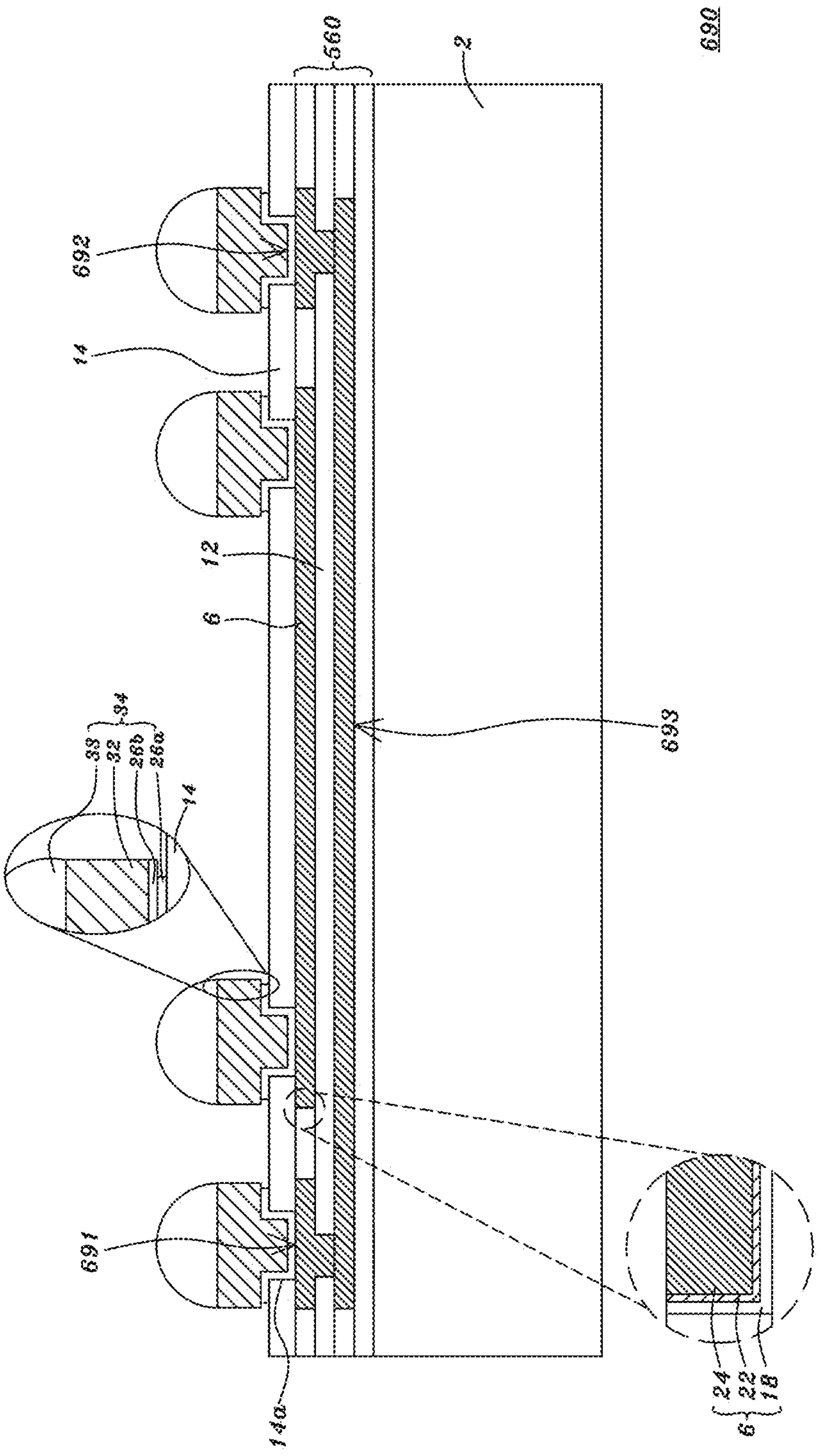
FIGS. 13A and 13B are schematically cross-sectional views showing various fine-line interconnection bridges in accordance with an embodiment of the present application.
Figure 13B:
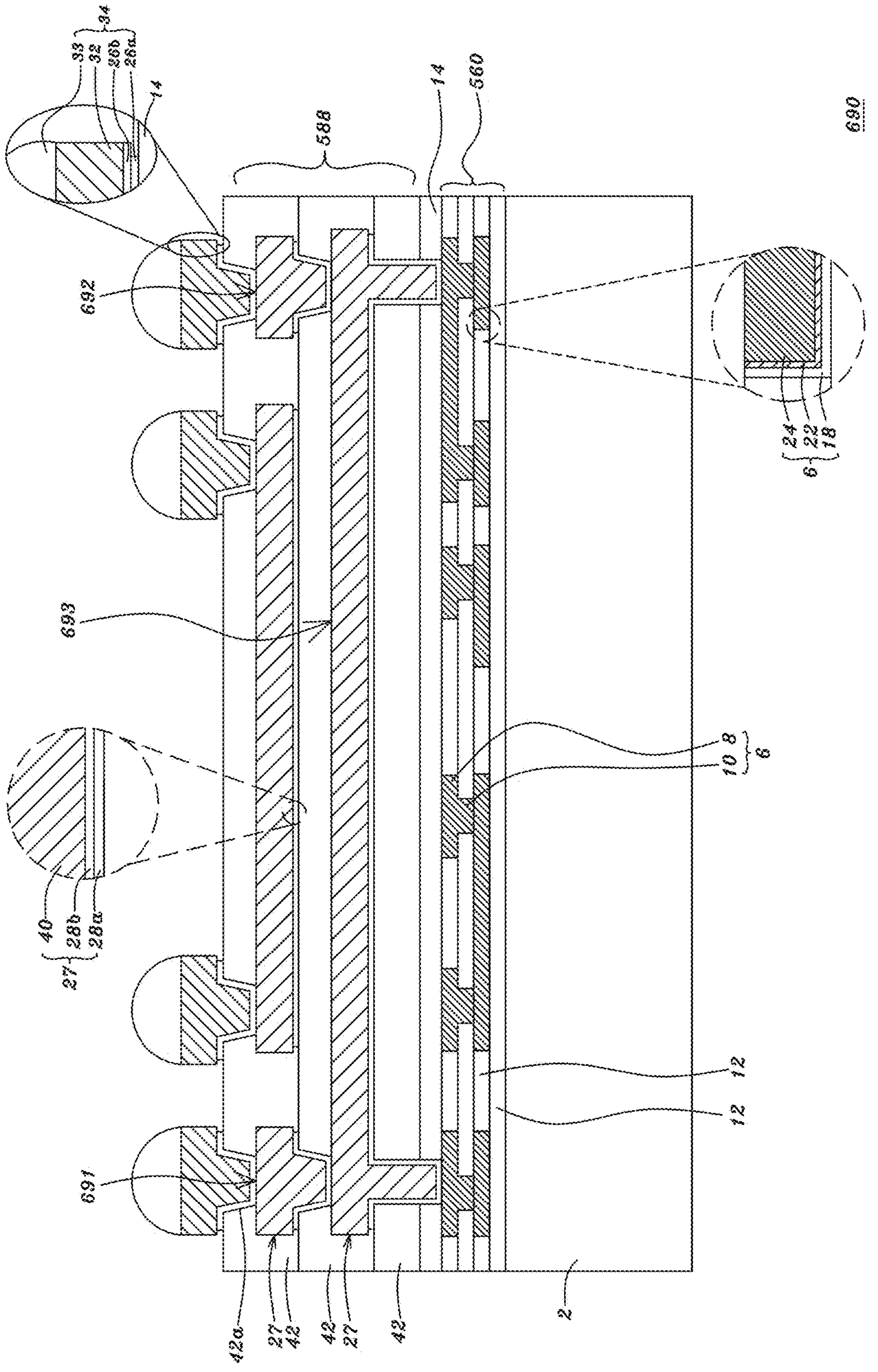

FIGS. 13A and 13B are schematically cross-sectional views showing various fine-line interconnection bridges in accordance with an embodiment of the present application. Referring to FIGS. 13A and 13B, a first or second type of fine-line interconnection bridge (FIB) 690 is provided for horizontal connection to transmit signals in a horizontal direction.

1. First Type of Fine-line Interconnection Bridge (FIB)

Referring to FIGS. 13A, a first type of fine-line interconnection bridge (FIB) 690 may include (1) a semiconductor substrate 2, (2) a first interconnection scheme 560 on the semiconductor substrate 2, wherein its first interconnection scheme 560 may include multiple insulating dielectric layers 12 and multiple interconnection metal layers 6 each in neighboring two of the insulating dielectric layers 12, wherein each of the interconnection metal layers 6 of its first interconnection scheme 560 is patterned with multiple metal pads, lines or traces 8 in an upper one of the neighboring two of the insulating dielectric layers 12 of its first interconnection scheme 560 and multiple metal vias 10 in a lower one of the neighboring two of the insulating dielectric layers 12 of its first interconnection scheme 560, wherein between each neighboring two of the interconnection metal layers 6 of its first interconnection scheme 560 is provided one of the insulating dielectric layers 12 of its first interconnection scheme 560, wherein an upper one of the interconnection metal layers 6 of its first interconnection scheme 560 may couple to a lower one of the interconnection metal layers 6 of its first interconnection scheme 560 through an opening in one of the insulating dielectric layers 12 of its first interconnection scheme 560 between the upper and lower ones of the interconnection metal layers 6 of its first interconnection scheme 560, (3) a passivation layer 14 as illustrated in FIG. 1A, 1C or 1E on its first interconnection scheme 560, wherein the topmost one of the interconnection metal layers 6 of its first interconnection scheme 560 may have the metal pads 8 at bottoms of multiple openings 14*a* in the passivation layer 14, and (4) multiple micro-bumps or micro-pads 34, which may be of one of the first through fourth types having the same specifications as the first through fourth types of micro-bumps or micro-pads 34 respectively as illustrated in FIG. 1A, 1C or 1E, on the metal pads 8 of the topmost one of the interconnection metal layers 6 of its first interconnection scheme 560 at the bottoms of the openings 14*a* in its passivation layer 14.

Referring to FIG. 13A, for the first interconnection scheme 560, one of the metal pads, lines or traces 8 of each of its interconnection metal layers 6 may have a thickness between 3 nm and 500 nm and may have a width between 3 nm and 500 nm. A space or pitch between neighboring two of the metal pads, lines or traces 8 of each of its interconnection metal layers 6 may be between 3 nm and 500 nm. Each of its insulating dielectric layers 12 may include a layer of silicon oxide, silicon oxynitride or silicon oxycarbide having a thickness between 3 nm and 500 nm. Each of its interconnection metal layers 6 may include (1) a copper layer 24 having lower portions in openings in a lower one of the insulating dielectric layers 12, such as SiOC layer having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12. For an example, the first interconnection scheme 560 may be formed with one or more passive devices, such as resistors, capacitors or inductors.

2. Second Type of Fine-line Interconnection Bridge (FIB)

Referring to FIGS. 13B, a second type of fine-line interconnection bridge (FIB) 690 may have a structure similar to that as illustrated in FIG. 13A. For an element indicated by the same reference number shown in FIGS. 13A and 13B, the specification of the element as seen in FIG. 13B may be referred to that of the element as illustrated in FIG. 13A. The difference between the first and second types of fine-line interconnection bridges (FIB) 690 is that the second type of fine-line interconnection bridge (FIB) 690 may further include a second interconnection scheme 588 over the passivation layer 14, wherein the second interconnection scheme 588 may include one or more interconnection metal layers 27 coupling to the metal pads 8 of the topmost one of the interconnection metal layers 6 of its first interconnection scheme 560 through the openings 14*a* in its passivation layer 14, and one or more polymer layers 42, i.e., insulating dielectric layers, each between neighboring two of the interconnection metal layers 27 of its second interconnection scheme 588, under a bottommost one of the interconnection metal layers 27 of its second interconnection scheme 588 or over a topmost one of the interconnection metal layers 27 of its second interconnection scheme 588, wherein an upper one of the interconnection metal layers 27 of its second interconnection scheme 588 may couple to a lower one of the interconnection metal layers 27 of its second interconnection scheme 588 through an opening in one of the polymer layers 42 of its second interconnection scheme 588 between the upper and lower ones of the interconnection metal layers 27 of its second interconnection scheme 588, wherein the topmost one of the interconnection metal layers 27 of its second interconnection scheme 588 may have multiple metal pads at bottoms of multiple openings 42*a* in the topmost one of the polymer layers 42 of its second interconnection scheme 588, and multiple micro-bumps or micro-pads 34 as illustrated in FIG. 1A, 1C or 1E may be formed on the metal pads of the topmost one of the interconnection metal layers 27 of its second interconnection scheme 588 at the bottoms of the openings 42*a* in the topmost one of the polymer layers 42 of its second interconnection scheme 588.

Referring to FIG. 13B, for the second interconnection scheme 588, each of its interconnection metal layers 27 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. For an example, each of the first and second interconnection schemes 560 and 588 may be formed with one or more passive devices, such as resistors, capacitors or inductors.

Specification for Semiconductor Integrated-circuit (IC) Chip

FIGS. 14A-14F are schematically cross-sectional views showing various semiconductor integrated-circuit (IC) chips in accordance with an embodiment of the present application. Referring to FIGS. 14A-14F, either type of semiconductor integrated-circuit (IC) chip 100 may be provided for the standard commodity FPGA IC chip 200, DPIIC chip 410, dedicated I/O chip 265, dedicated control and I/O chip 260, NVM IC chip 250, IAC IC chip 402, HBM IC chips 251, GPU chip 269*a*, CPU chip 269*b*, TPU chip 269*c*, NPU chip 269*d*, digital-signal-processing (DSP) integrated-circuit (IC) chip 270 and auxiliary and supporting (AS) integrated-circuit (IC) chip 411 as seen in FIG. 12A.

1. First Type of Semiconductor Integrated-Circuit (IC) Chip

Figure 14A:
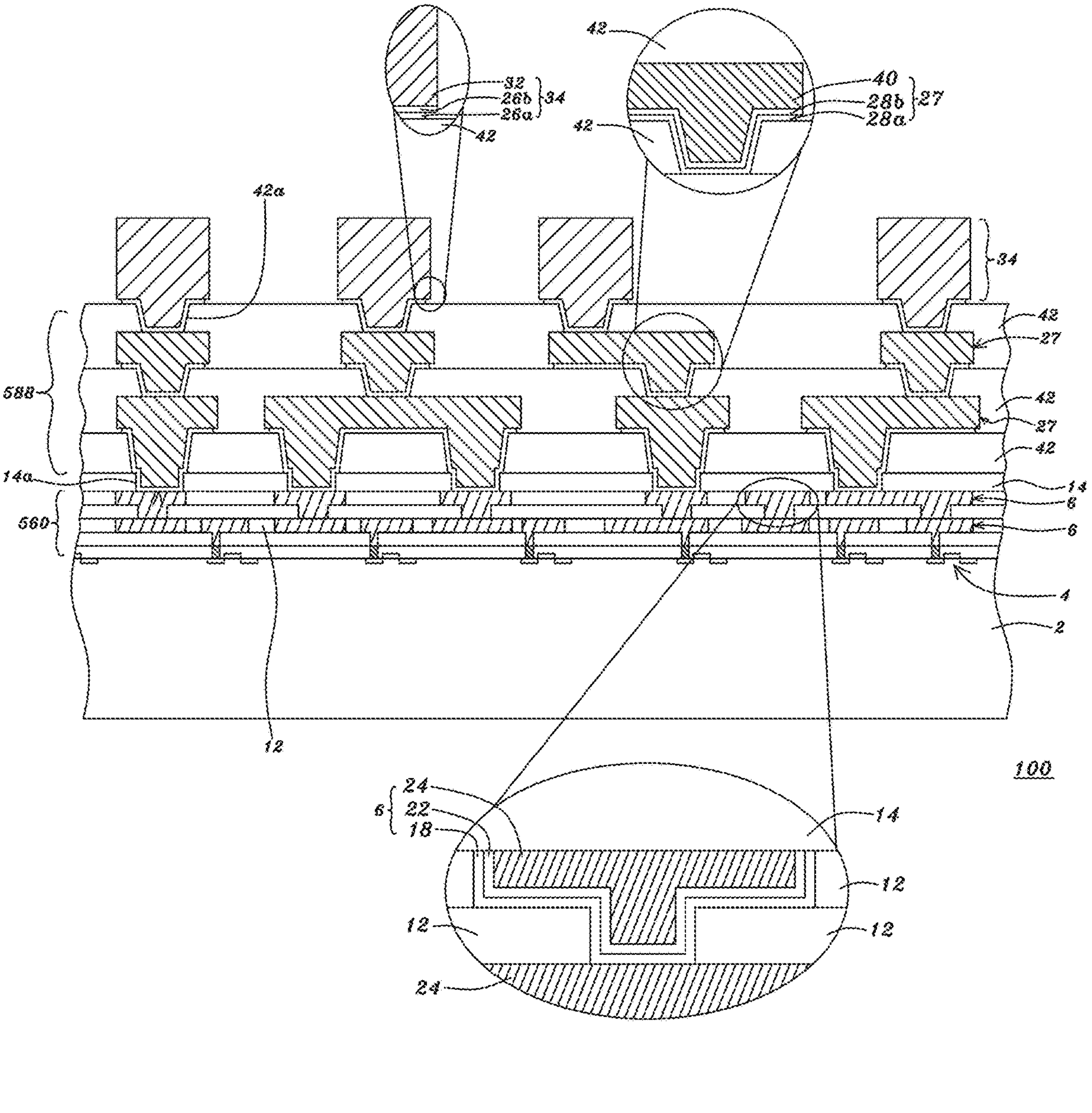
FIGS. 14A-14F are schematically cross-sectional views showing various semiconductor integrated-circuit (IC) chips in accordance with an embodiment of the present application.

Referring to FIG. 14A, a first type of semiconductor integrated-circuit (IC) chip 100 may have the structure as illustrated in FIG. 13A or 13B. For an element indicated by the same reference number shown in FIGS. 13A, 13B and 14A, the specification of the element as seen in FIG. 14A may be referred to that of the element as illustrated in FIG. 13A or 13B. The difference between the first type of semiconductor integrated-circuit (IC) chip 100 and the second type of fine-line interconnection bridge (FIB) 690 is that the first type of semiconductor integrated-circuit (IC) chip 100 as seen in FIG. 14A may further include multiple semiconductor devices 4 at an active surface of its semiconductor substrate 2 and under its first interconnection scheme 560, wherein each of its semiconductor devices 4 may couple to the interconnection metal layers 6 of its first interconnection scheme 560. For the first type of semiconductor integrated-circuit (IC) chip 100, its semiconductor devices 4 may include a memory cell, logic circuit, passive device, such as resistor, capacitor, inductor or filter, or active device, such as P-type or N-type metal-oxide-semiconductor (MOS) transistor. Multiple of the semiconductor devices 4 may compose the selection circuits 211 of the programmable logic cells (LC) 2014, memory cells 490 of the programmable logic cells (LC) 2014, memory cells 362 for the cross-point switches 379, small I/O circuits 203, large I/O circuits and/or cryptography block or circuit as illustrated in FIGS. 7, 8 and 9, for the standard commodity FPGA IC chip 200 of the standard commodity logic drive 300 as seen in FIG. 12A. The semiconductor devices 4 may compose the memory cells 362 for the programmable switch cells 379 and small I/O circuits 203, as illustrated in FIGS. 8 and 10, for each of the DPIIC chips 410 of the standard commodity logic drive 300 as seen in FIG. 12A. Multiple of the semiconductor devices 4 may compose the large I/O circuits of large-input/output (I/O) block 412, small I/O circuits of the small-input/output (I/O) block 413, cryptography block or circuit 517, regulating block 415 and innovated application-specific-integrated-circuit (ASIC) or customer-owned tooling (COT) block 418, as illustrated in FIG. 11, for the auxiliary and supporting (AS) integrated-circuit (IC) chip 411 of the standard commodity logic drive 300 as seen in FIG. 12A.

2. Second Type of Semiconductor Integrated-Circuit (IC) Chip

Figure 14B:
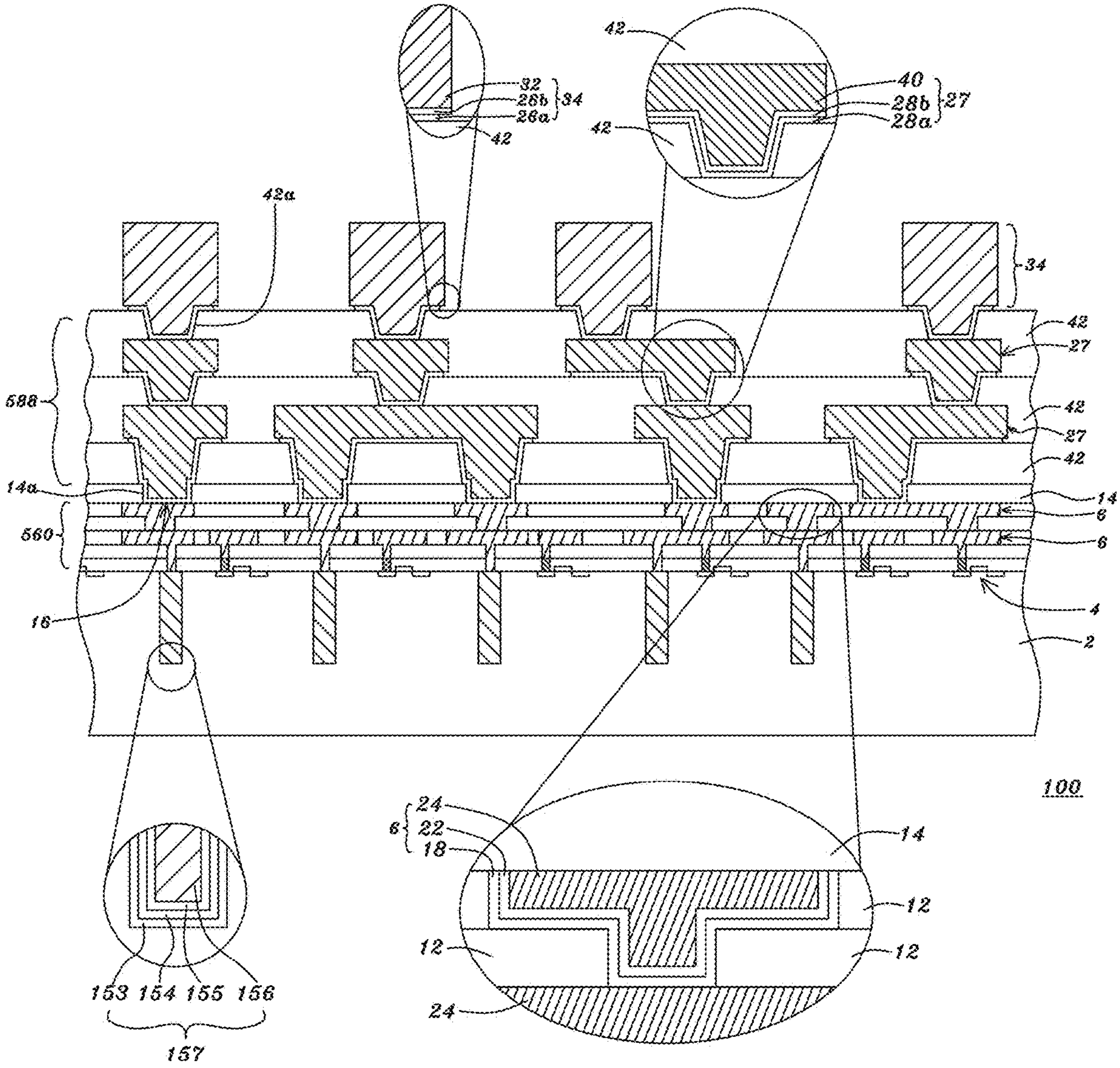

Referring to FIG. 14B, a second type of semiconductor integrated-circuit (IC) chip 100 may have similar structure as illustrated in FIG. 14A. For an element indicated by the same reference number shown in FIG. 1A-1F, 13A, 13B, 14A or 14B, the specification of the element as seen in FIG. 14B may be referred to that of the element as illustrated in FIG. 1A-1F, 13A, 13B or 14A. The difference between the first and second types of semiconductor integrated-circuit (IC) chips 100 is that the second type of semiconductor integrated-circuit (IC) chip 100 may further include multiple through silicon vias (TSVs) 157 as illustrated in FIGS. 1A-1F in its semiconductor substrate 2, wherein each of its through silicon vias (TSVs) 157 may couple to one or more of its semiconductor devices 4 through one or more of the interconnection metal layers 6 of its first interconnection scheme 560.

3. Third Type of Semiconductor Integrated-Circuit (IC) Chip

Figure 14C:
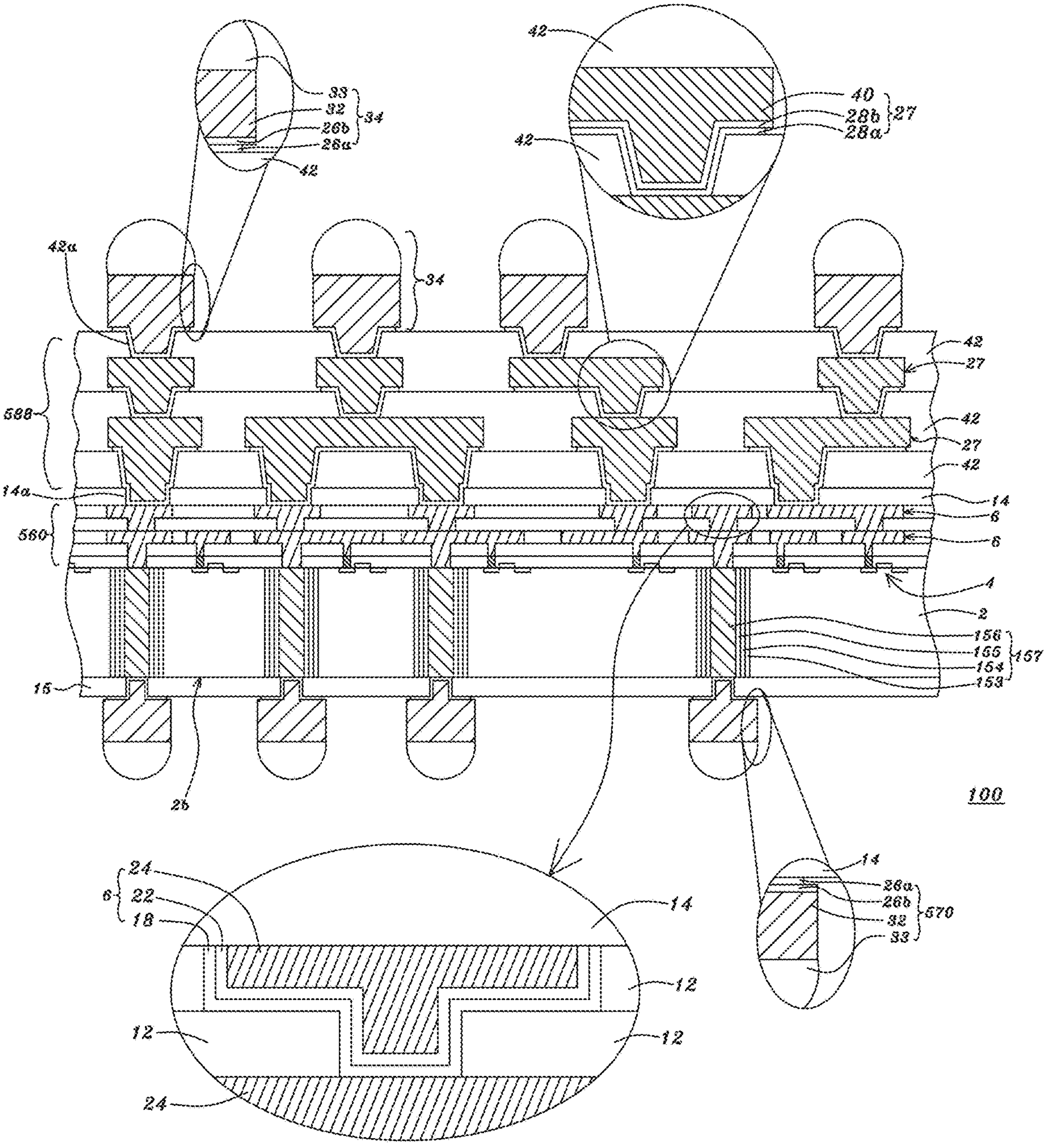

Referring to FIG. 14C, a third type of semiconductor integrated-circuit (IC) chip 100 may have similar structure as illustrated in FIG. 14B. For an element indicated by the same reference number shown in FIG. 1A-1F, 13A, 13B, 14A, 14B or 14C, the specification of the element as seen in FIG. 14C may be referred to that of the element as illustrated in FIG. 1A-1F, 13A, 13B, 14A or 14B. The difference between the second and third types of semiconductor integrated-circuit (IC) chips 100 is that each of the through silicon vias (TSVs) 157 of the third type of semiconductor integrated-circuit (IC) chip 100 may have the copper layer 156 having a backside surface coplanar with a backside 2*b* of the semiconductor substrate 2 of the third type of semiconductor integrated-circuit (IC) chip 100 and have the insulating lining 153 surrounding the adhesion layer 154, seed layer 155 and copper layer 156 of said each of the through silicon vias (TSVs) 157. The third type of semiconductor integrated-circuit (IC) chip 100 may further include a passivation layer 15 on the backside 2*b* of its semiconductor substrate 2, wherein each opening 15*a* in its passivation layer 15 may be aligned with the backside of the copper layer 156 of one of its through silicon vias (TSVs) 157. The passivation layer 15 may have the same specifications as those of the passivation layer 14 as illustrated in FIG. 1A, 1C or 1E. The third type of semiconductor integrated-circuit (IC) chip 100 may further include multiple micro-bumps or micro-pads 570 each on the backside of copper layer 156 of one of its through silicon vias (TSVs) 157. The micro-bumps or micro-pads 570 may be of one of the first through fourth types having the same specifications as the first through fourth types of micro-bumps or micro-pads 34 as illustrated in FIG. 1A, 1C or 1E, respectively.

4. Fourth Type of Semiconductor Integrated-circuit (IC) Chip

Figure 14D:
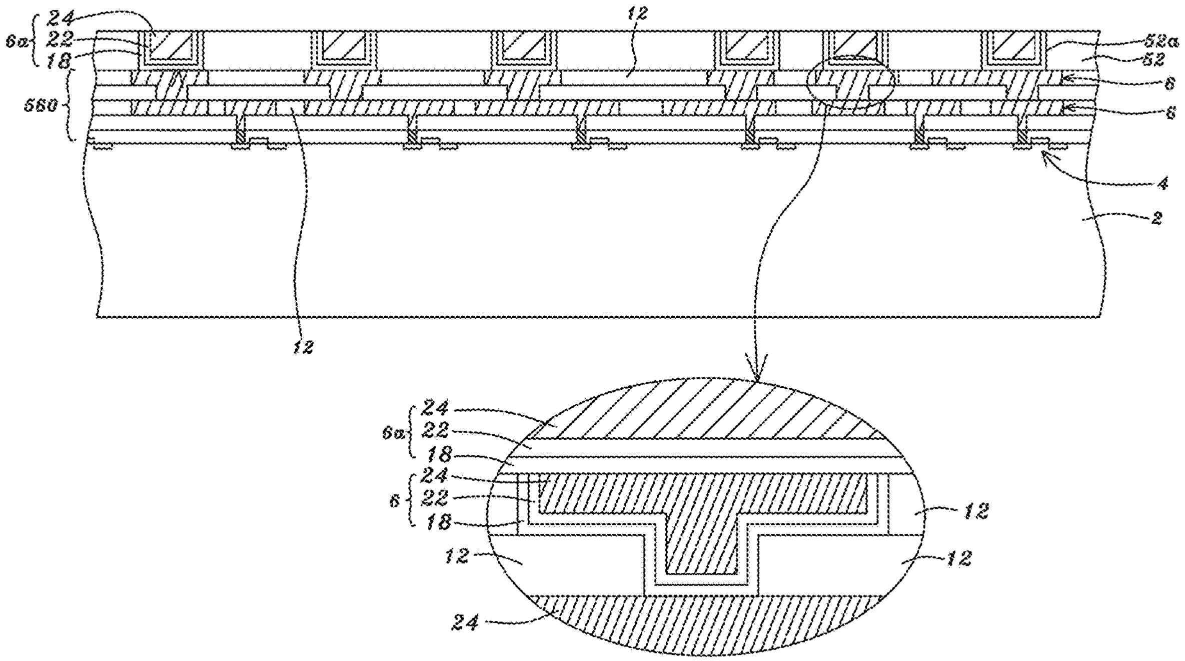

Referring to FIGS. 14D, a fourth type of semiconductor integrated-circuit (IC) chip 100 may have similar structure as illustrated in FIG. 14A. For an element indicated by the same reference number shown in FIG. 13A, 14A or 14D, the specification of the element as seen in FIG. 14D may be referred to that of the element as illustrated in FIG. 13A or 14A. The difference between the first and fourth types of semiconductor integrated-circuit (IC) chips 100 is that the fourth type of semiconductor integrated-circuit (IC) chip 100 may be provided with (1) an insulating bonding layer 52 at its active side and on the topmost one of the insulating dielectric layers 12 of its first interconnection scheme 560 and (2) multiple metal pads 6*a* at its active side and in multiple openings 52*a* in its insulating bonding layer 52 and on the topmost one of the interconnection metal layers 6 of its first interconnection scheme 560, instead of the passivation layer 14 and micro-bumps or micro-pads 34 as seen in FIG. 14A. For the fourth type of semiconductor integrated-circuit (IC) chip 100, its insulating bonding layer 52 may include a silicon-oxide layer having a thickness between 0.1 and 2 μm. Each of its metal pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*a*, and (3) a seed layer 22, such as copper, between the copper layer 24 and adhesion layer 18 of said each of its metal pads 6*a*, wherein the copper layer 24 of said each of its metal pads 6*a* may have a top surface substantially coplanar with a top surface of the silicon-oxide layer of its insulating bonding layer 52.

5. Fifth Type of Semiconductor Integrated-Circuit (IC) Chip

Figure 14E:
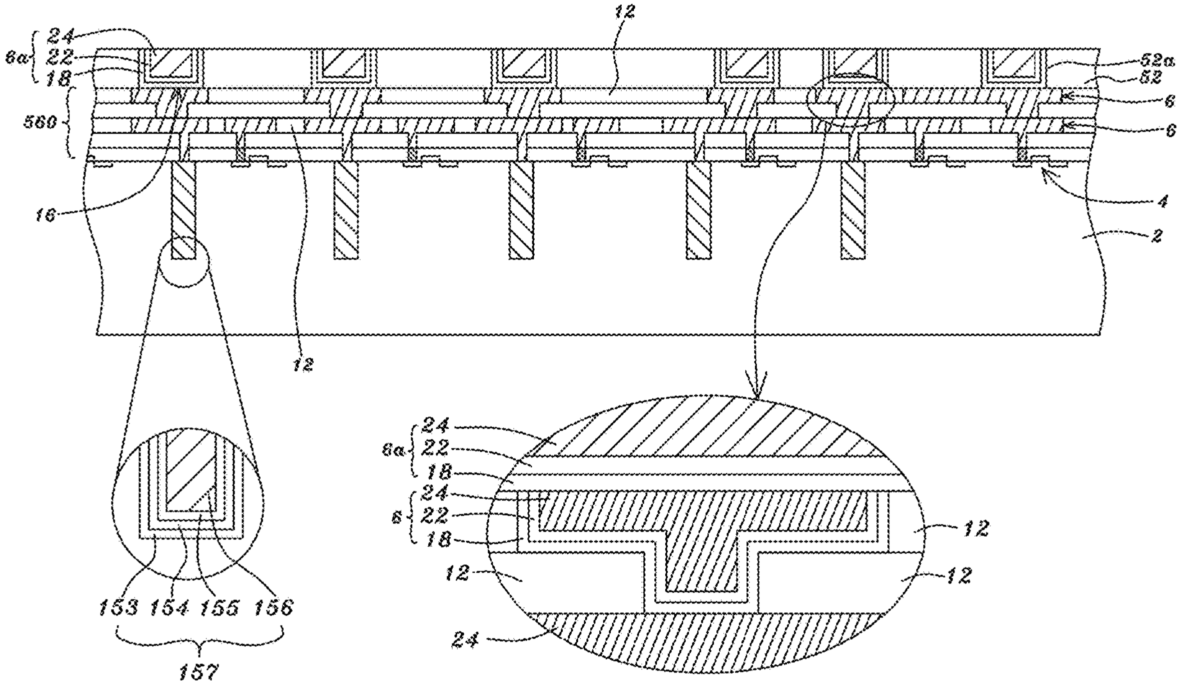

Referring to FIGS. 14E, a fifth type of semiconductor integrated-circuit (IC) chip 100 may have similar structure as illustrated in FIG. 14D. For an element indicated by the same reference number shown in FIG. 1A-1F, 13A, 14A, 14B, 14D or 14E, the specification of the element as seen in FIG. 14E may be referred to that of the element as illustrated in FIG. 1A-1F, 13A, 14A, 14B or 14D. The difference between the fourth and fifth types of semiconductor integrated-circuit (IC) chips 100 is that the fifth type of semiconductor integrated-circuit (IC) chip 100 may further include multiple through silicon vias (TSVs) 157 as illustrated in FIG. 1A-1F in its semiconductor substrate 2, wherein each of its through silicon vias (TSVs) 157 may couple to one or more of its semiconductor devices 4 through one or more the interconnection metal layers 6 of its first interconnection scheme 560.

6. Sixth Type of Semiconductor Integrated-Circuit (IC) Chip

Figure 14F:
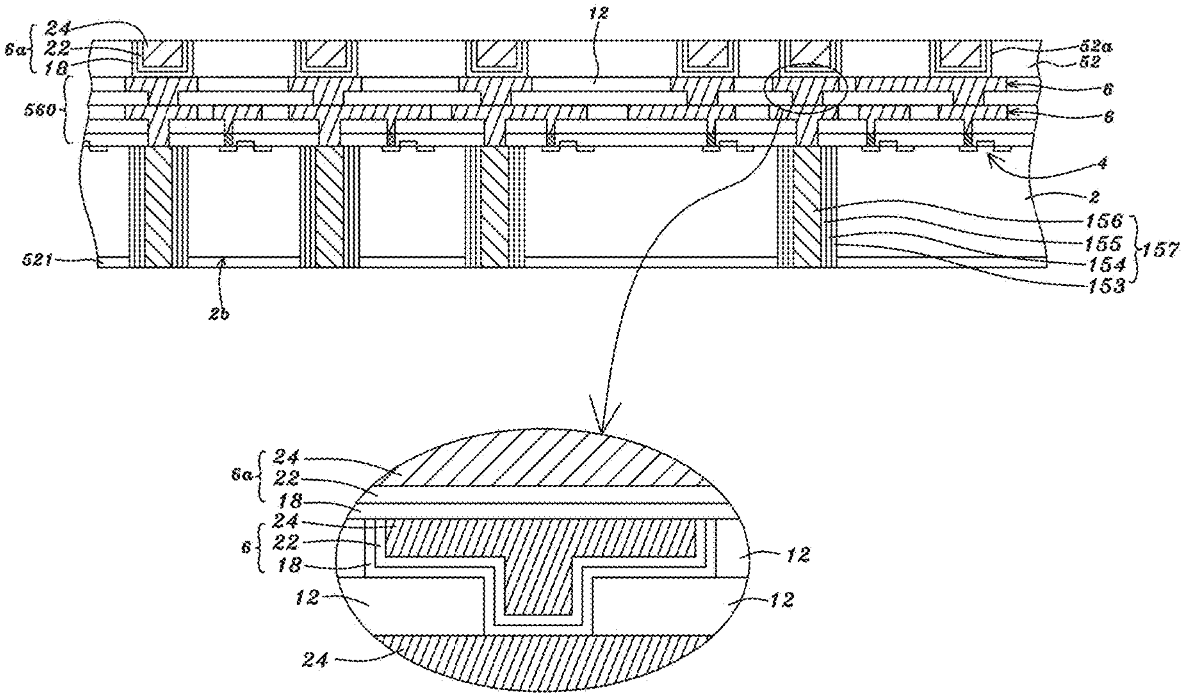

Referring to FIG. 14F, a sixth type of semiconductor integrated-circuit (IC) chip 100 may have similar structure as illustrated in FIG. 14E. For an element indicated by the same reference number shown in FIG. 1A-1F, 13A, or 14A-14F, the specification of the element as seen in FIG. 14F may be referred to that of the element as illustrated in FIG. 1A-1F, 13A, or 14A-14E. The difference between the fifth and sixth types of semiconductor integrated-circuit (IC) chips 100 is that the sixth type of semiconductor integrated-circuit (IC) chip 100 may be provided with an insulating bonding layer 521 on a backside 2*b* of its semiconductor substrate 2, wherein the insulating bonding layer 521 may include a silicon-oxide layer having a thickness between 0.1 and 2 μm. For the sixth type of semiconductor integrated-circuit (IC) chip 100, each of its through silicon vias (TSVs) 157 may include the copper layer 156 having a backside substantially coplanar with a bottom surface of its insulating bonding layer 521 and the insulating lining 153 surrounding the adhesion layer 154, seed layer 155 and copper layer 156 of said each of its through silicon vias (TSVs) 157.

Specification for Memory Module (HBM stacked 3D Chip-Scale-Package (CSP)

1. First Type of Memory Module

Figure 15A:
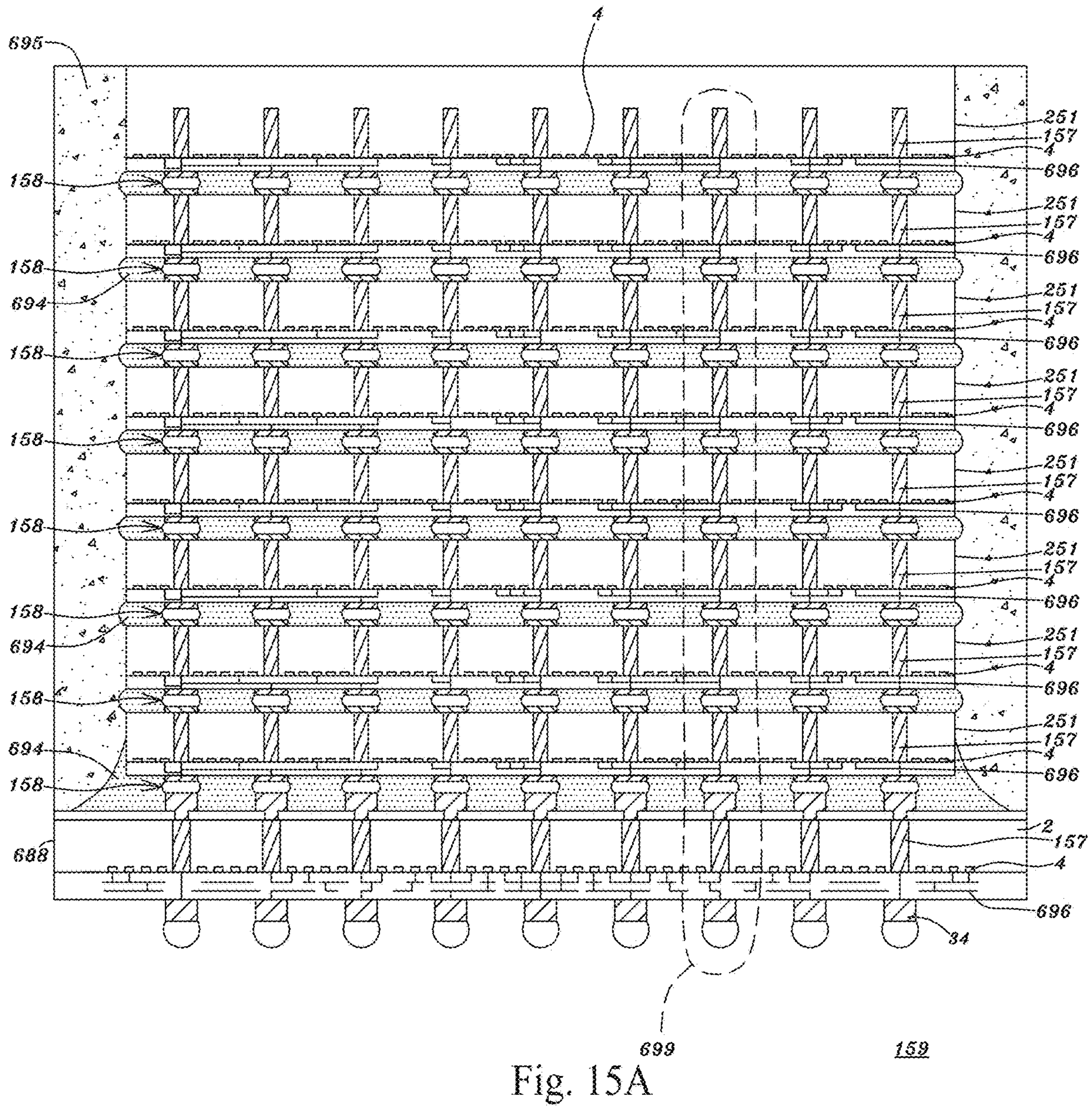
FIGS. 15A and 15C are schematically cross-sectional views showing various first type of memory modules in accordance with an embodiment of the present application.

FIG. 15A is a schematically cross-sectional view showing a first type of memory module in accordance with an embodiment of the present application. Referring to FIG. 15A, a memory module 159 may include (1) multiple memory chips 251, such as volatile-memory (VM) integrated circuit (IC) chips for a VM module, dynamic-random-access-memory (DRAM) IC chips for a high-bitwidth memory (HBM) module, statistic-random-access-memory (SRAM) IC chips for a SRAM module, magnetoresistive random-access-memory (MRAM) IC chips for a MRAM module, resistive random-access-memory (RRAM) IC chips for a RRAM module, ferroelectric random-access-memory (FRAM) IC chips for a FRAM module or phase change random access memory (PCM) IC chips for a PCM module, vertically stacked together, wherein the number of the memory chips 251 in the memory module 159 may have the number equal to or greater than 2, 4, 8, 16, 32, (2) a control chip 688, i.e., ASIC or logic chip, under the stacked memory chips 251, (3) multiple bonded metal contacts 158 between neighboring two of the memory chips 251 and between the bottommost one of the memory chips 251 and the control chip 688, and (4) multiple micro-bumps or micro-pads 34 on a bottom surface of the control chip 688.

Referring to FIG. 15A, each of the memory chips 251 may have the structure as illustrated in FIG. 14C, which may include the through silicon vias (TSVs) 157 in its semiconductor substrate 2, each aligned with and connected to one of the bonded metal contacts 158 at its backside.

Figure 16B:
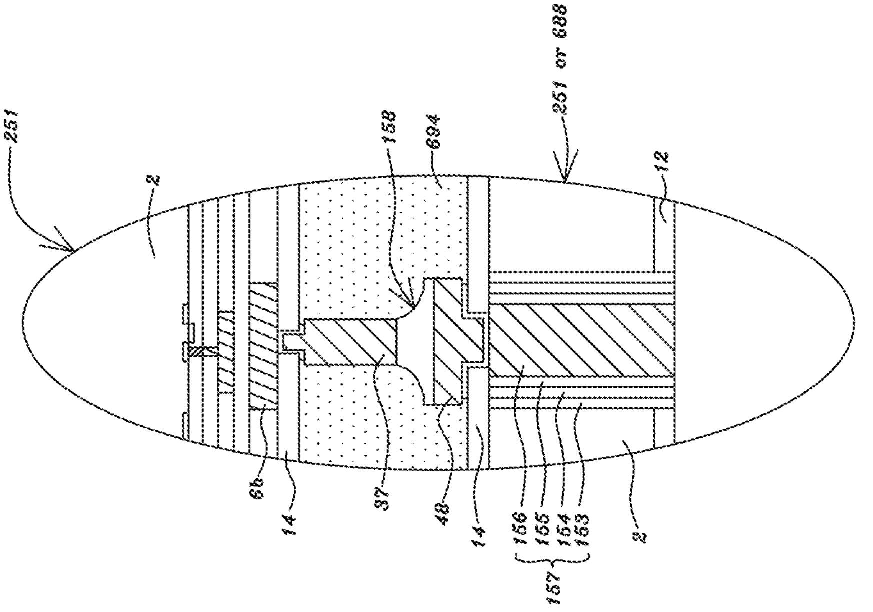
FIGS. 16A and 16B are schematically cross-sectional views showing a process of bonding a thermal compression bump to a thermal compression pad in accordance with an embodiment of the present application.
Figure 16A:
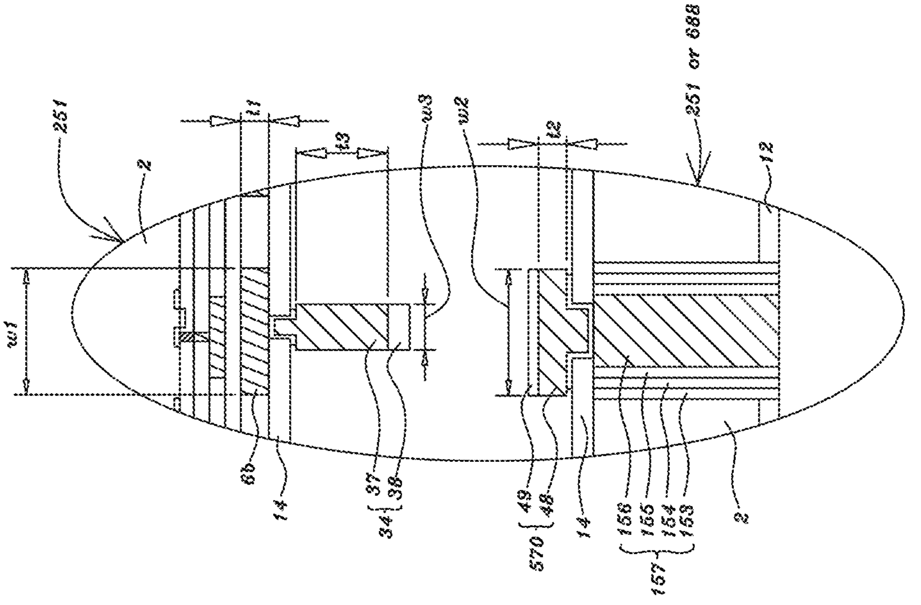

FIGS. 16A and 16B are schematically cross-sectional views showing a process of bonding a thermal compression bump to a thermal compression pad in accordance with an embodiment of the present application. For a first case, referring to FIGS. 15A, 16A and 16B, an upper one of the memory chips 251 may have the third type of micro-bumps or micro-pads 34 to be bonded to the fourth type of micro-bumps or micro-pads 570 of a lower one of the memory chips 251. For example, the third type of micro-bumps or micro-pads 34 of the upper one of the memory chips 251 may have the solder caps 38 to be thermally compressed, at a temperature between 240 and 300 degrees Celsius, at a pressure between 0.3 and 3 MPa and for a time period between 3 and 15 seconds, onto the metal caps 49 of the fourth type of micro-bumps or micro-pads 570 of the lower one of the memory chips 251 into multiple bonded metal contacts 158 between the upper and lower ones of the memory chips 251. A force applied to the upper one of the memory chips 251 in the thermal compression process may be substantially equal to the pressure times a contact area between one of the third type of micro-bumps or micro-pads 34 and one of the fourth type of micro-bumps or micro-pads 570 times the total number of the third type of micro-bumps or micro-pads 34 of the upper one of the memory chips 251. Each of the third type of micro-bumps or micro-pads 34 of the upper one of the memory chips 251 may have the copper layer 37 having the thickness t3 greater than the thickness t2 of the copper layer 48 of each of the fourth type of micro-bumps or micro-pads 570 of the lower one of the memory chips 251 and having the largest transverse dimension w3 equal to between 0.7 and 0.1 times of the largest transverse dimension w2 of the copper layer 48 of each of the fourth type of micro-bumps or micro-pads 570 of the lower one of the memory chips 251. Alternatively, each of the third type of micro-bumps or micro-pads 34 may be provided with the copper layer 37 having a cross-sectional area equal to between 0.5 and 0.01 times of the cross-sectional area of the copper layer 48 of each of the fourth type of micro-bumps or micro-pads 570 of the lower one of the memory chips 251. For example, for the upper one of the memory chips 251, its third type of micro-bumps or micro-pads 34 may be formed respectively on a front surface of the metal pads 6*b* provided by the frontmost one of the interconnection metal layers 27 of its second interconnection scheme 588 or by, if the second interconnection scheme 588 is not provided, the frontmost one of the interconnection metal layers 6 of its first interconnection scheme 560, wherein each of the metal pads 6*b* may have a thickness t1 between 1 and 10 micrometers or between 2 and 10 micrometers and a largest transverse dimension w1, such as diameter in a circular shape, between 1 μm and 25 μm and each of its third type of micro-bumps or micro-pads 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pads 34 may be provided with the copper layer 37 having a cross-sectional area equal to between 0.5 and 0.01 times of the cross-sectional area of its metal pads 6*b*. A bonded solder between the copper layers 37 and 48 of each of the bonded metal contacts 158 may be mostly kept on a top surface of the copper layer 48 of one of the fourth type of micro-bumps or micro-pads 570 of the lower one of the memory chips 251 and extends out of the edge of the copper layer 48 of said one of the fourth type of micro-bumps or micro-pads 570 of the lower one of the memory chips 251 less than 0.5 micrometers. Thus, a short between neighboring two of the bonded metal contacts 158 even in a fine-pitched fashion may be avoided.

Alternatively, for a second case, referring to FIG. 15A, an upper one of the memory chips 251 may have the second type of micro-bumps or micro-pads 34 to be bonded to the first type of micro-bumps or micro-pads 570 of a lower one of the memory chips 251. For example, the second type of micro-bumps or micro-pads 34 of the upper one of the memory chips 251 may have the solder caps 33 to be bonded onto the copper layer 32 of the first type of micro-bumps or micro-pads 570 of the lower one of the memory chips 251 into multiple bonded metal contacts 158 between the upper and lower ones of the memory chips 251. Each of the second type of micro-bumps or micro-pads 34 of the upper one of the memory chips 251 may have the copper layer 32 having a thickness greater than that of the copper layer 32 of each of the first type of micro-bumps or micro-pads 570 of the lower one of the memory chips 251.

Alternatively, for a third case, referring to FIG. 15A, an upper one of the memory chips 251 may have the first type of micro-bumps or micro-pads 34 to be bonded to the second type of micro-bumps or micro-pads 570 of a lower one of the memory chips 251. For example, the first type of micro-bumps or micro-pads 34 of the upper one of the memory chips 251 may have the electroplated metal layer 32, e.g. copper layer, to be bonded onto the solder caps 33 of the second type of micro-bumps or micro-pads 570 of the lower one of the memory chips 251 into multiple bonded metal contacts 158 between the upper and lower ones of the memory chips 251. Each of the first type of micro-bumps or micro-pads 34 of the upper one of the memory chips 251 may have the copper layer 32 having a thickness greater than that of the copper layer 32 of each of the second type of micro-bumps or micro-pads 570 of the lower one of the memory chips 251.

Alternatively, for a fourth case, referring to FIG. 15A, an upper one of the memory chips 251 may have the second type of micro-bumps or micro-pads 34 to be bonded to the second type of micro-bumps or micro-pads 570 of a lower one of the memory chips 251. For example, the second type of micro-bumps or micro-pads 34 of the upper one of the memory chips 251 may have the solder caps 33 to be bonded onto the solder caps 33 of the second type of micro-bumps or micro-pads 570 of the lower one of the memory chips 251 into multiple bonded metal contacts 158 between the upper and lower ones of the memory chips 251. Each of the second type of micro-bumps or micro-pads 34 of the upper one of the memory chips 251 may have the copper layer 32 having a thickness greater than that of the copper layer 32 of each of the second type of micro-bumps or micro-pads 570 of the lower one of the memory chips 251.

Referring to FIG. 15A, each of the through silicon vias (TSVs) 157 of the topmost one of the memory chips 251 may have its sidewall and backside enclosed by its semiconductor substrate 2. The bottommost one of the memory chips 251 may provide the micro-bumps or micro-pads 34 on its bottom surface to be bonded to the micro-bumps or micro-pads 570 on a top surface of the control chip 688 into multiple bonded metal contacts 158 between the control chip 688 and the bottommost one of the memory chips 251. The specification of the bonded metal contacts 158 between the control chip 688 and the bottommost one of the memory chips 251 and the process for forming the same may be referred to the specification of those between the upper and lower ones of the memory chips 251 as above illustrated in FIGS. 15A, 16A and 16B and the above-mentioned process for forming the same.

Referring to FIG. 15A, the through silicon vias (TSVs) 157 in the memory chips 251, which are aligned in a vertical direction, may couple to each other or one another through the bonded metal contacts 158 therebetween aligned in the vertical direction and with the through silicon vias (TSVs) 157 therein in the vertical direction. Each of the memory chips 251 and control chip 688 may include multiple interconnects 696 each provided by the interconnection metal layers 6 of its first interconnection scheme 560 and/or the interconnection metal layers 27 of its second interconnection scheme 588 to connect one or more of its through silicon vias (TSVs) 157 to one or more of the bonded metal contacts 158 at its bottom surface. An underfill 694, e.g., a polymer layer, may be provided between each neighboring two of the memory chips 251 to enclose the bonded metal contacts 158 therebetween and between the bottommost one of the memory chips 251 and the control chip 688 to enclose the bonded metal contacts 158 therebetween. A molding compound 695, e.g. a polymer, may be formed around the memory chips 251 and over the control chip 688, wherein the topmost one of the memory chips 251 may have a top surface coplanar with a top surface of the molding compound 695.

Referring to FIG. 15A, for the first type of memory module 159, each of its memory chips 251 may have a data bit-width, equal to or greater than 64, 128, 256, 512, 1024, 2048, 4096, 8K, or 16K, with external circuits of the first type of memory module 159 via its micro-bumps or micro-pads 34. The first type of memory module 159 may include multiple vertical interconnects 699 each composed of one of the through silicon vias (TSVs) 157 in each of the memory chips 251 of the first type of memory module 159, wherein for each of the vertical interconnects 699 of the first type of memory module 159, its through silicon vias (TSVs) 157 in the memory chips 251 of the first type of memory module 159 are aligned with each other or one another and are connected to one or more transistors of the semiconductor devices 4 of the memory chips 251 of the first type of memory module 159. Each of the memory chips 251 and control chip 688 may be provided with one or more small I/O circuits, each having driving capability, loading, output capacitance or input capacitance between 0.05 pF and 2 pF, or 0.05 pF and 1 pF, or smaller than 2 pF or 1 pF, coupling to one of the vertical interconnects 699 of the first type of memory module 159. alternatively each of the small input/output (I/O) circuits may have an I/O power efficiency smaller than 0.5 pico-Joules per bit, per switch or per voltage swing, or between 0.01 and 0.5 pico-Joules per bit, per switch or per voltage swing, Referring to FIG. 15A, the control chip 688 may be configured to control data access to the memory chips 251. The control chip 688 may be used for buffering and controlling the memory chips 251. The control chip 688 may include the through silicon vias (TSVs) 157 in its semiconductor substrate 2, each aligned with and connected to one or more of its micro-bumps or micro-pads 34 on its bottom surface.

Figure 15B:
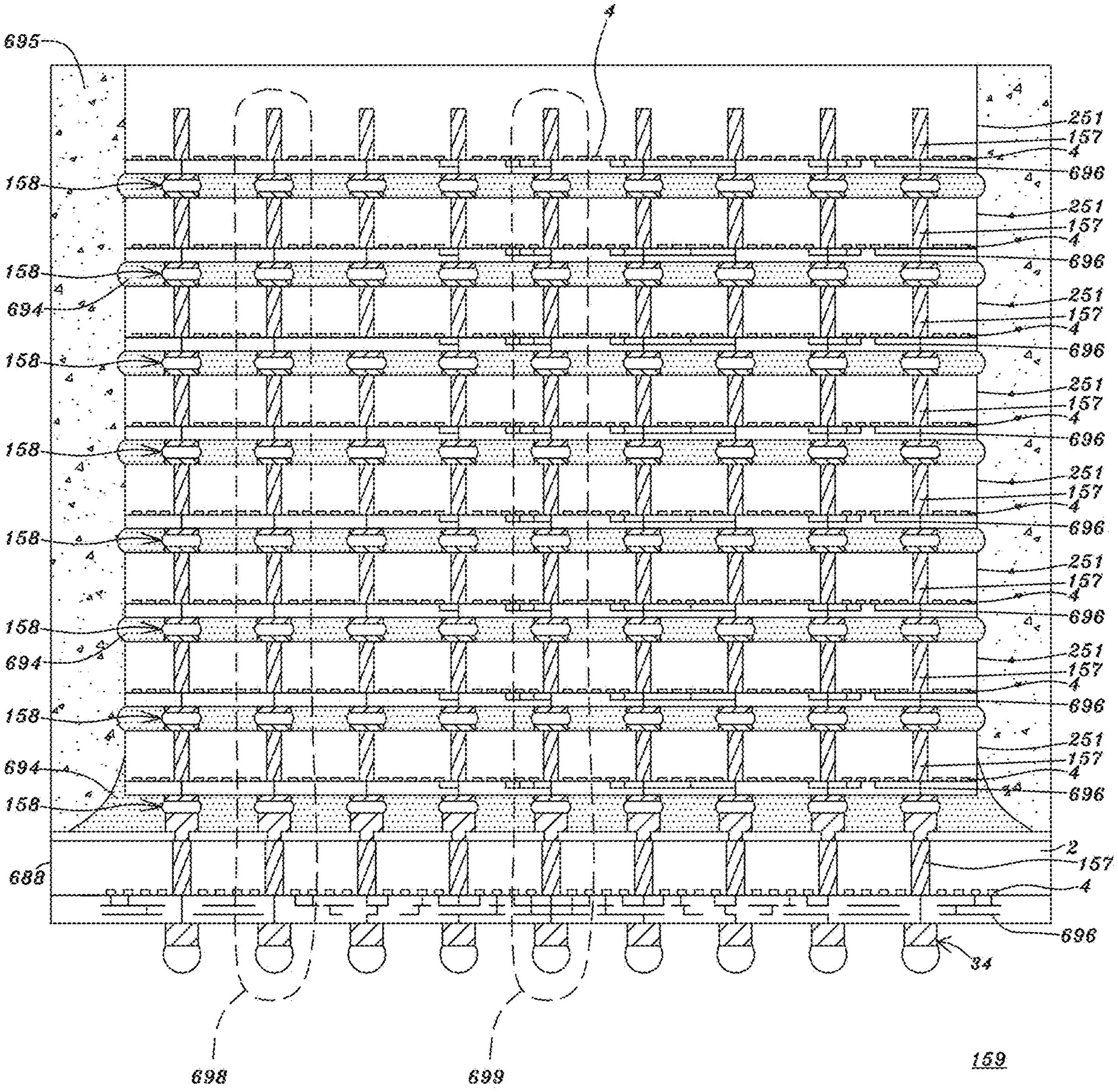
FIGS. 15B and 15D are schematically cross-sectional views showing various second type of memory modules in accordance with an embodiment of the present application.
Figure 15C:
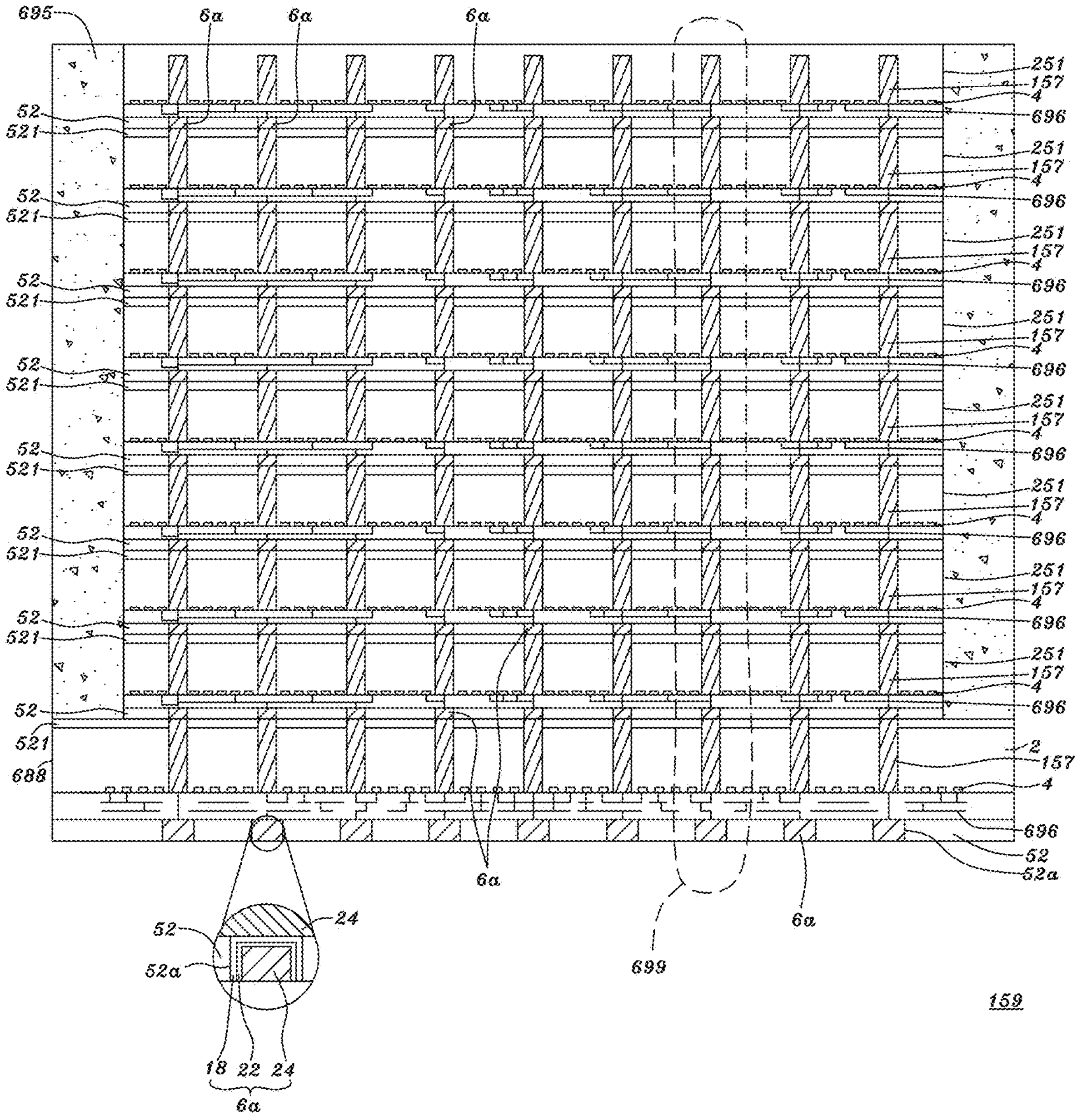
Figure 16C:
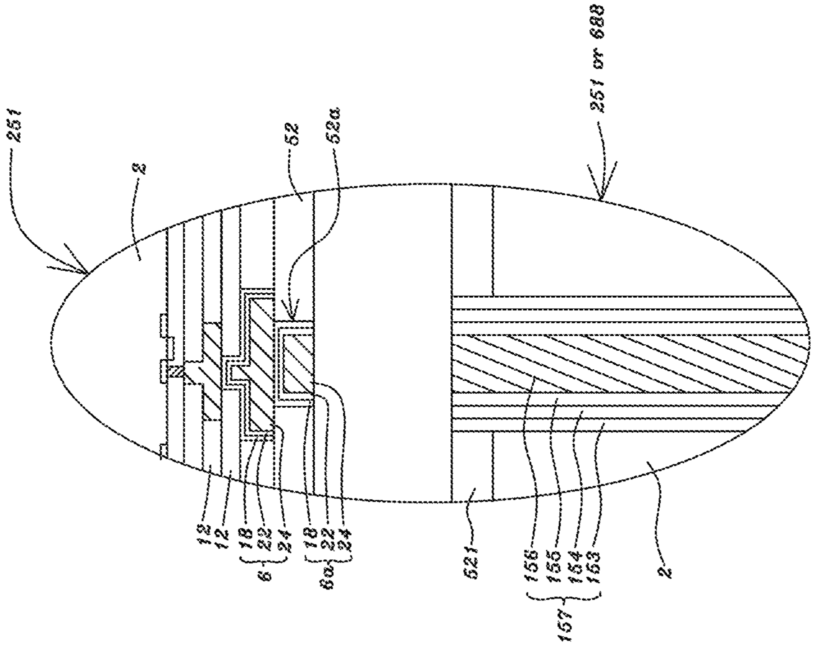
FIGS. 16C and 16D are schematically cross-sectional views showing a direct bonding process in accordance with an embodiment of the present application.
Figure 16D:
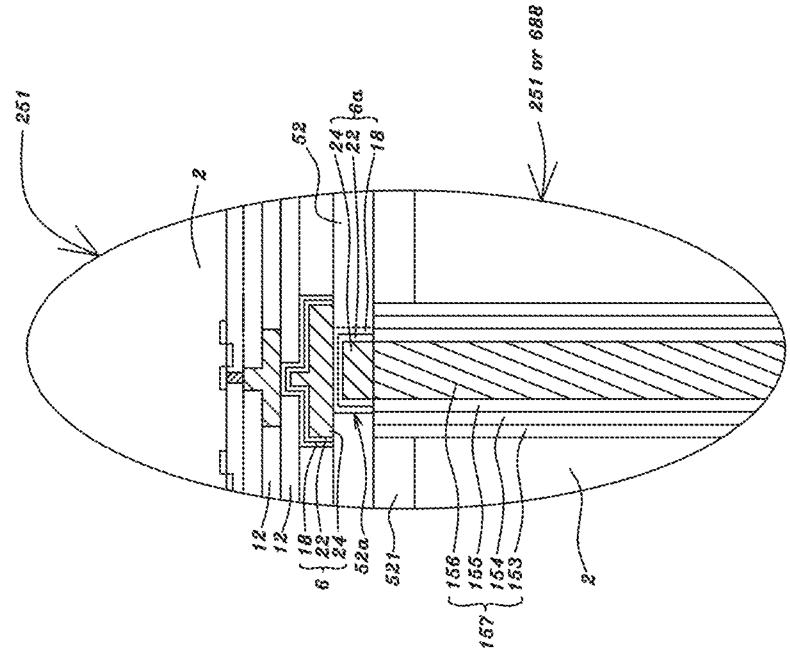

Alternatively, FIG. 15C is a schematically cross-sectional view showing a first type of memory module in accordance with another embodiment of the present application. Referring to FIG. 15C, the first type of memory module 159 may have a structure similar to that as illustrated in FIG. 15A. For an element indicated by the same reference number shown in FIGS. 15A and 15C, the specification of the element as seen in FIG. 15C may be referred to that of the element as illustrated in FIG. 15A. The difference between the first type of memory modules 159 as seen in FIGS. 15A and 15C is that a direct bonding process may be performed for the first type of memory module 159 as seen in FIG. 15C. FIGS. 16C and 16D are schematically cross-sectional views showing a direct bonding process in accordance with an embodiment of the present application. Referring to FIGS. 15C, 16C and 16D, each of the memory chips 251 and control chip 688 may have the structure as illustrated in FIG. 14F, which may include the through silicon vias (TSVs) 157 in its semiconductor substrate 2 each aligned with its metal pads 6*a* at its active side. An upper one of the memory chips 251 may join a lower one of the memory chips 251 and control chip 688 by (1) activating a joining surface, i.e., silicon oxide, of the insulating bonding layer 52 at the active side of the upper one of the memory chips 251 and a joining surface, i.e., silicon oxide, of the insulating bonding layer 521 at the backside of the lower one of the memory chips 251 and control chip 688 with nitrogen plasma for increasing hydrophilic property thereof, (2) next rinsing the joining surface of the insulating bonding layer 52 at the active side of the upper one of the memory chips 251 and the joining surface of the insulating bonding layer 521 at the backside of the lower one of the memory chips 251 and control chip 688 with deionized water for water adsorption and cleaning, (3) next placing the upper one of the memory chips 251 onto the lower one of the memory chips 251 and control chip 688 with each of the metal pads 6*a* at the active side of the upper one of the memory chips 251 in contact with one of the through silicon vias (TSVs) 157 of the lower one of the memory chips 251 and control chip 688 and with the joining surface of the insulating bonding layer 52 at the active side of the upper one of the memory chips 251 in contact with the joining surface of the insulating bonding layer 521 at the backside of the lower one of the memory chips 251 and control chip 688, and (4) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the upper one of the memory chips 251 to the joining surface of the insulating bonding layer 521 at the backside of the lower one of the memory chips 251 and control chip 688 and (b) copper-to-copper bonding at a temperature between 300 and 350 degrees Celsius and for a time period between 10 and 60 minutes to bond the copper layer 24 of each of the metal pads 6*a* at the active side of the upper one of the memory chips 251 to the copper layer 156 of one of the through silicon vias (TSVs) 157 of the lower one of the memory chips 251 and control chip 688, wherein the oxide-to-oxide bonding may be caused by water desorption from reaction between the joining surface of the insulating bonding layer 52 at the active side of the upper one of the memory chips 251 and the joining surface of the insulating bonding layer 521 at the backside of the lower one of the memory chips 251, and the copper-to-copper bonding may be caused by metal inter-diffusion between the copper layer 24 of the metal pads 6*a* at the active side of the upper one of the memory chips 251 and the copper layer 156 of the through silicon vias (TSVs) 157 of the lower one of the memory chips 251 and control chip 688.

2. Second Type of Memory Module

Figure 15D:
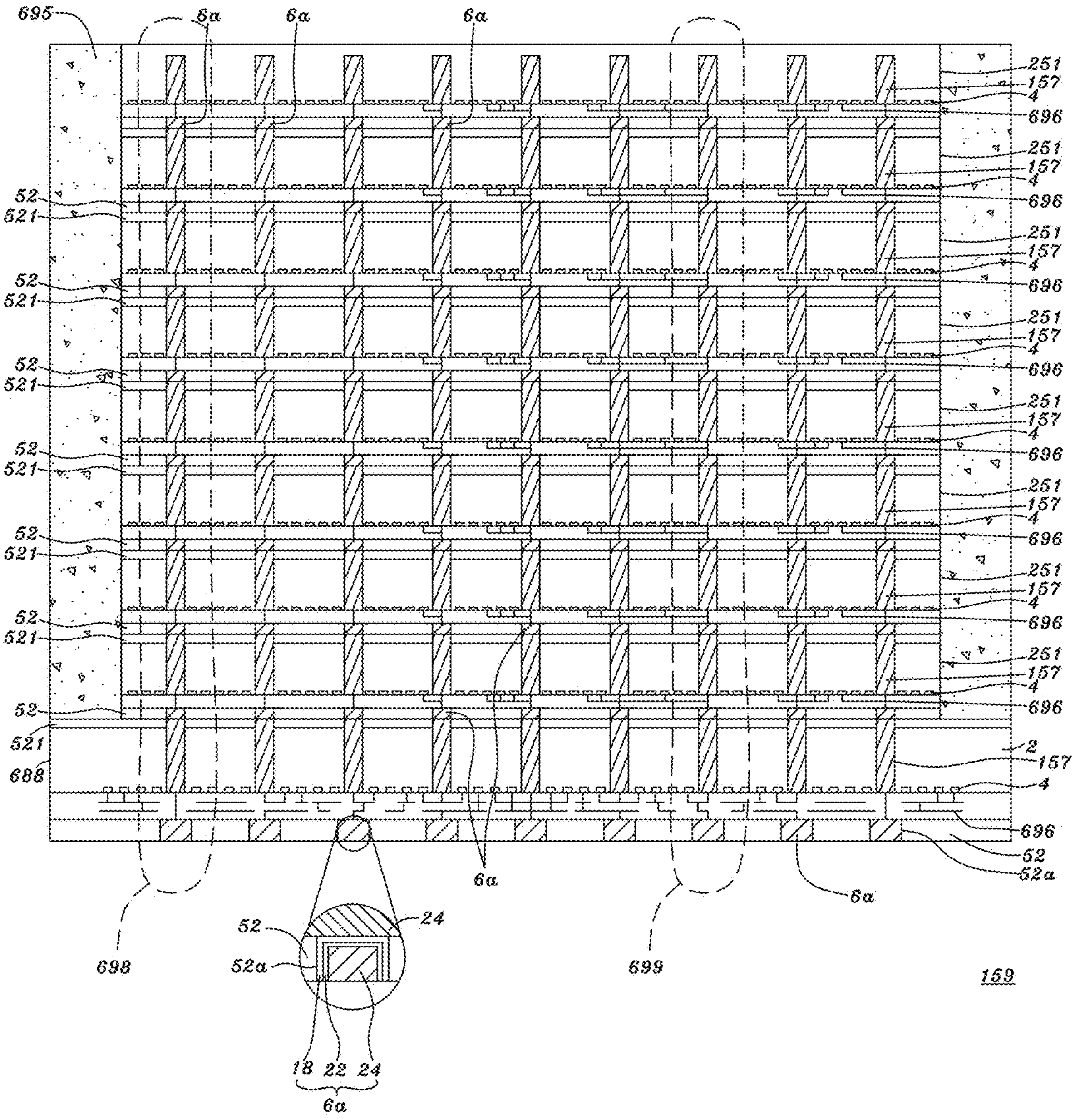

FIGS. 15B and 15D are schematically cross-sectional views showing various second type of memory modules in accordance with an embodiment of the present application. Referring to FIG. 15B, the second type of memory module 159 may have a structure similar to that as illustrated in FIG. 15A. For an element indicated by the same reference number shown in FIGS. 15A and 15B, the specification of the element as seen in FIG. 15B may be referred to that of the element as illustrated in FIG. 15A. Referring to FIG. 15D, the second type of memory module 159 may have a structure similar to that as illustrated in FIG. 15C. For an element indicated by the same reference number shown in FIGS. 15A, 15C and 15D, the specification of the element as seen in FIG. 15D may be referred to that of the element as illustrated in FIG. 15A or 15C. The difference between the first and second types of memory modules 159 is that the second type of memory module 159 may further include multiple dedicated vertical bypasses 698 each composed of one of the through silicon vias (TSVs) 157 in each of the memory chips 251 and control chip 688 of the second type of memory module 159, wherein for each of the dedicated vertical bypasses 698 of the second type of memory module 159, its through silicon vias (TSVs) 157 in the memory chips 251 and control chip 688 of the second type of memory module 159 are aligned with each other or one another and are not connected to any transistor of the memory chips 251 or control chip 688 of the second type of memory module 159.

Process for Fabricating Operation Unit

Figure 17A:
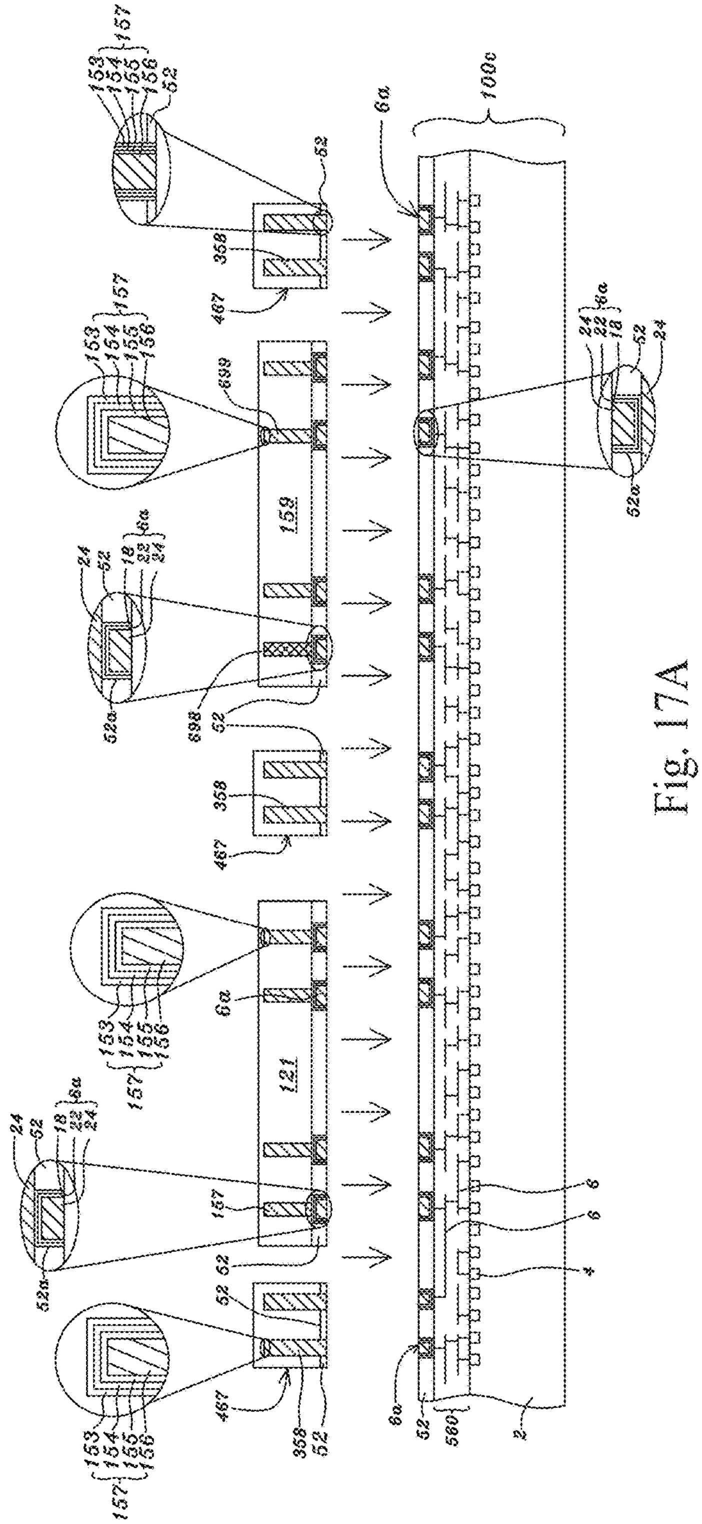
FIGS. 17A-17F are schematically cross-sectional views showing a process for fabricating a first type of operation unit in accordance with an embodiment of the present application.

1. First Type of Operation Unit for Second Type of Chip-on-chip (COC) Component or Package FIGS. 17A-17F are schematically cross-sectional views showing a process for fabricating a first type of operation unit in accordance with an embodiment of the present application. Referring to FIG. 17A, a semiconductor wafer 100*c* may be provided at an active side thereof with the insulating bonding layer 52 and metal pads 6*a* as illustrated in FIG. 14D, wherein neighboring two of the metal pads 6*a* of the semiconductor wafer 100*c* may have a pitch between 3 and 10 micrometers or between 4 and 7 micrometers. Next, referring to FIGS. 17A and 17B, each of first or second type of memory modules 159 may have the same structure as illustrated in FIG. 15C or 15D provided with the insulating bonding layer 52 to be bonded to the insulating bonding layer 52 of the semiconductor wafer 100*c* and the metal pads 6*a*, neighboring two of which may have a pitch between 3 and 10 micrometers or between 4 and 7 micrometers, to be bonded to the metal pads 6*a* of the semiconductor wafer 100*c*. Each of known-good memory, logic or application-specific-integrated-circuit (ASIC) chips 121 may have the structure as illustrated in FIG. 14E provided at an active side thereof with the insulating bonding layer 52 to be bonded to the insulating bonding layer 52 of the semiconductor wafer 100*c* and the metal pads 6*a*, neighboring two of which may have a pitch between 3 and 10 micrometers or between 4 and 7 micrometers, to be bonded to the metal pads 6*a* of the semiconductor wafer 100*c*. For example, each of the known-good memory, logic or application-specific-integrated-circuit (ASIC) chips 121 may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip. Multiple second type of vertical-through-via (VTV) connectors 467, each of which may be one as illustrated in any of FIGS. 1B, 1D, 1F, 2B, 2D and 2F, may be provided with the insulating bonding layer 52 to be bonded to the insulating bonding layer 52 of the semiconductor wafer 100*c* and the vertical through vias (VTVs) 358, neighboring two of which may have a pitch between 3 and 10 micrometers or between 4 and 7 micrometers, to be bonded to the metal pads 6*a* of the semiconductor wafer 100*c*.

Figure 17B:
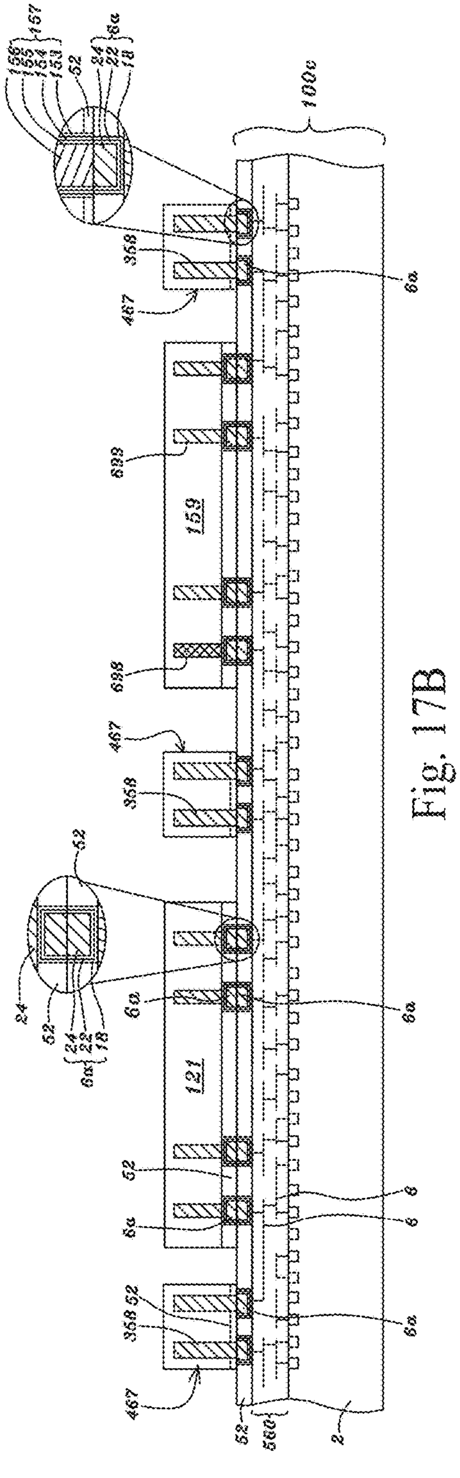

Referring to FIGS. 17A and 17B, before the first or second type of memory modules 159, the known-good memory, logic or ASIC chips 121 and the second type of vertical-through-via (VTV) connectors 467 are bonded to the semiconductor wafer 100*c*, a joining surface, i.e., silicon oxide, of the insulating bonding layer 52 at the active side of the semiconductor wafer 100*c* may be activated with nitrogen plasma for increasing a hydrophilic property thereof, and then the joining surface of the insulating bonding layer 52 at the active side of the semiconductor wafer 100*c* may be rinsed with deionized water for water adsorption and cleaning. Further, a joining surface, i.e., silicon oxide, of the insulating bonding layer 52 at the active side of the control chip 688 of each of the first or second type of memory modules 159, a joining surface, i.e., silicon oxide, of the insulating bonding layer 52 at the active side of each of the known-good memory, logic or ASIC chips 121 and a joining surface, i.e., silicon oxide, of the insulating bonding layer 52 of each of the second type of vertical-through-via (VTV) connectors 467 may be activated with nitrogen plasma for increasing a hydrophilic property thereof, and then the joining surface of the insulating bonding layer 52 at the active side of the control chip 688 of each of the first or second type of memory modules 159, the joining surface of the insulating bonding layer 52 at the active side of each of the known-good memory, logic or ASIC chips 121, and the joining surface of the insulating bonding layer 52 of each of the second type of vertical-through-via (VTV) connectors 467 may be rinsed with deionized water for water adsorption and cleaning.

Next, referring to FIGS. 17A and 17B, the first or second type of memory modules 159, the known-good memory, logic or ASIC chips 121 and the second type of vertical-through-via (VTV) connectors 467 may be bonded to the semiconductor wafer 100*c* by (1) picking up each of the first or second type of memory modules 159 to be placed on the semiconductor wafer 100*c* with each of the metal pads 6*a* at the active side of the control chip 688 of each of the first or second type of memory modules 159 in contact with one of the metal pads 6*a* at the active side of the semiconductor wafer 100*c* and with the joining surface of the insulating bonding layer 52 at the active side of the control chip 688 of each of the first or second type of memory modules 159 in contact with the joining surface of the insulating bonding layer 52 at the active side of the semiconductor wafer 100*c*, (2) picking up each of the known-good memory, logic or ASIC chips 121 to be placed on the semiconductor wafer 100*c* with each of the metal pads 6*a* at the active side of each of the known-good memory, logic or ASIC chips 121 in contact with one of the metal pads 6*a* at the active side of the semiconductor wafer 100*c* and with the joining surface of the insulating bonding layer 52 at the active side of each of the known-good memory, logic or ASIC chips 121 in contact with the joining surface of the insulating bonding layer 52 at the active side of the semiconductor wafer 100*c*, (3) picking up each of the second type of vertical-through-via (VTV) connectors 467 to be placed on the semiconductor wafer 100*c* with each of the vertical through vias (VTVs) 358 of each of the second type of vertical-through-via (VTV) connectors 467 in contact with one of the metal pads 6*a* at the active side of the semiconductor wafer 100*c* and with the joining surface of the insulating bonding layer 52 of each of the second type of vertical-through-via (VTV) connectors 467 in contact with the joining surface of the insulating bonding layer 52 at the active side of the semiconductor wafer 100*c*, and (4) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the control chip 688 of each of the first or second type of memory modules 159, the joining surface of the insulating bonding layer 52 at the active side of each of the known-good memory, logic or ASIC chips 121 and the joining surface of the insulating bonding layer 52 of each of the second type of vertical-through-via (VTV) connectors 467 to the joining surface of the insulating bonding layer 52 at the active side of the semiconductor wafer 100*c* and (b)

copper-to-copper bonding at a temperature between 300 and 350 degrees Celsius and for a time period between 10 and 60 minutes to bond the copper layer 24 of each of the metal pads 6*a* at the active side of the control chip 688 of each of the first or second type of memory modules 159 to the copper layer 24 of one of the metal pads 6*a* at the active side of the semiconductor wafer 100*c*, to bond the copper layer 24 of each of the metal pads 6*a* at the active side of each of the known-good memory, logic or ASIC chips 121 to the copper layer 24 of one of the metal pads 6*a* at the active side of the semiconductor wafer 100*c* and to bond the copper layer 24 of each of the vertical through vias (VTVs) 358 of each of the second type of vertical-through-via (VTV) connectors 467 to the copper layer 24 of one of the metal pads 6*a* at the active side of the semiconductor wafer 100*c*. The oxide-to-oxide bonding may be caused by water desorption from reaction between the joining surface of the insulating bonding layer 52 at the active side of the control chip 688 of each of the first or second type of memory modules 159 and the joining surface of the insulating bonding layer 52 at the active side of the semiconductor wafer 100*c*, between the joining surface of the insulating bonding layer 52 at the active side of each of the known-good memory, logic or ASIC chips 121 and the joining surface of the insulating bonding layer 52 at the active side of the semiconductor wafer 100*c* and between the joining surface of the insulating bonding layer 52 of each of the second type of vertical-through-via (VTV) connectors 467 and the joining surface of the insulating bonding layer 52 at the active side of the semiconductor wafer 100*c*. The copper-to-copper bonding may be caused by metal inter-diffusion between the copper layer 24 of the metal pads 6*a* at the active side of the control chip 688 of each of the first or second type of memory modules 159 and the copper layer 24 of the metal pads 6*a* at the active side of the semiconductor wafer 100*c*, between the copper layer 24 of the metal pads 6*a* at the active side of each of the known-good memory, logic or ASIC chips 121 and the copper layer 24 of the metal pads 6*a* at the active side of the semiconductor wafer 100*c* and between the copper layer 24 of the vertical through vias (VTVs) 358 of each of the second type of vertical-through-via (VTV) connectors 467 and the copper layer 24 of the metal pads 6*a* at the active side of the semiconductor wafer 100*c*.

Figure 17C:
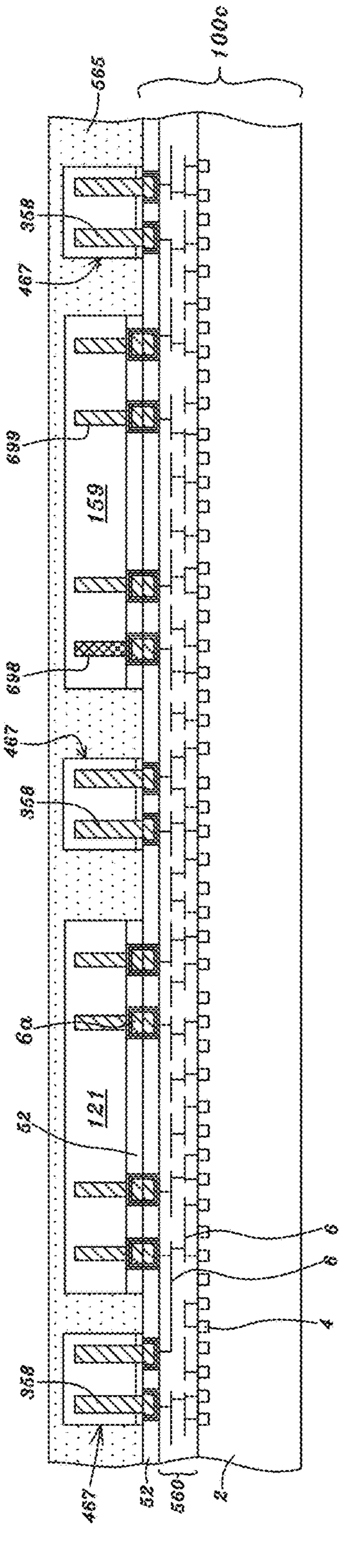

Next, referring to FIG. 17C, a polymer layer 565, e.g., resin or compound, may be applied to fill a gap between each neighboring two of the first or second type of memory modules 159, the known-good memory, logic or ASIC chips 121 and the second type of vertical-through-via (VTV) connectors 467 and to cover a backside of each of the first or second type of memory modules 159, a backside of each of the known-good memory, logic or ASIC chips 121 and a backside of each of the second type of vertical-through-via (VTV) connectors 467 by methods, for example, spin-on coating, screen-printing, dispensing or molding. The polymer layer 565 may be, for example, polyimide, BenzoCycloButene (BCB), parylene, parylene, polybenzoxazole (PBO), epoxy-based material or compound, photo epoxy SU-8, elastomer, or silicone. The polymer layer 565 may be, for example, photosensitive polyimide/PBO PIMEL™ supplied by Asahi Kasei Corporation, Japan, or epoxy-based molding compounds, resins or sealants provided by Nagase ChemteX Corporation, Japan. The polymer layer 565 may be cured or cross-linked at a temperature higher than or equal to 50, 70, 90, 100, 125, 150, 175, 200, 225, 250, 275 or 300 degrees Celsius.

Figure 17D:
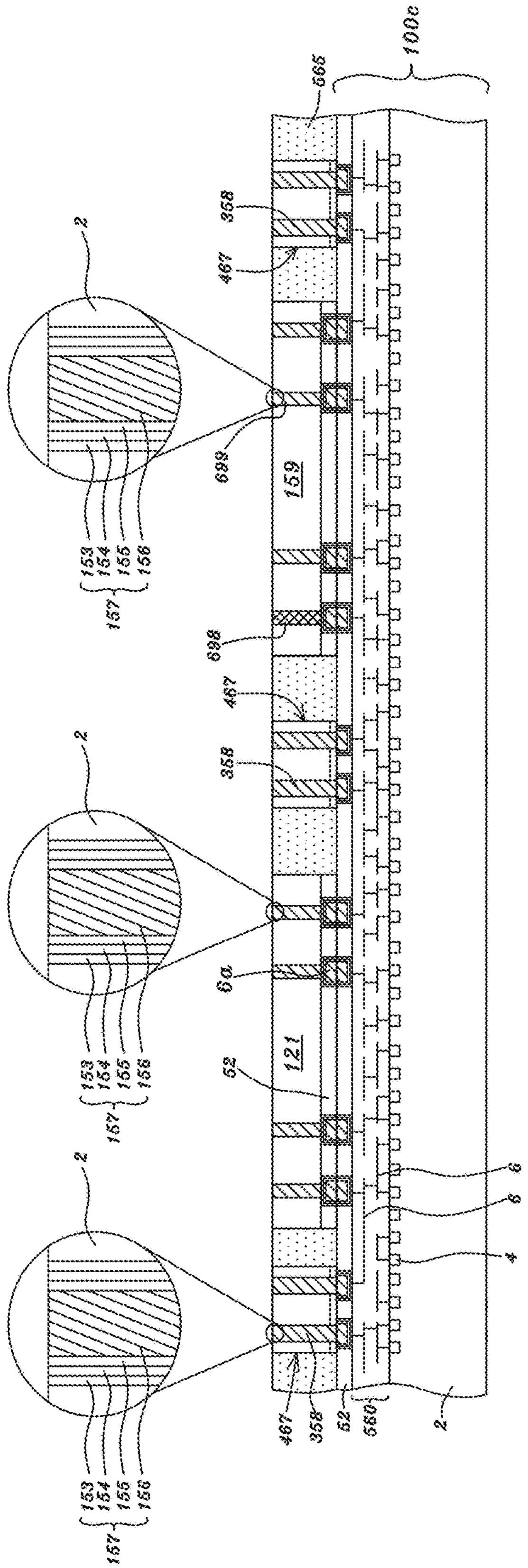

Next, referring to FIG. 17D, a chemical mechanical polishing (CMP), polishing or grinding process may be applied to remove a top portion of the polymer layer 565, a top portion of each of the first or second type of memory modules 159, a top portion of each of the known-good memory, logic or ASIC chips 121 and a top portion of each of the second type of vertical-through-via (VTV) connectors 467, to planarize a top surface of the polymer layer 565, a top surface of each of the first or second type of memory modules 159, a top surface of each of the known-good memory, logic or ASIC chips 121 and a top surface of each of the second type of vertical-through-via (VTV) connectors 467 and to expose a backside of each of the vertical through vias (VTVs) 358 of each of the second type of vertical-through-via (VTV) connectors 467, a backside of the copper layer 156 of each of the through silicon vias (TSVs) 157 of the topmost one of the memory chips 251 of each of the first or second type of memory modules 159 and a backside of the copper layer 156 of each of the through silicon vias (TSVs) 157 of each of the known-good memory, logic or ASIC chips 121.

For each of the through silicon vias (TSVs) 157 of the topmost one of the memory chips 251 of said each of the first or second type of memory modules 159 and the through silicon vias (TSVs) 157 of said each of the known-good memory, logic or ASIC chips 121, its insulating lining layer 153, adhesion layer 154 and seed layer 155 at its backside may be removed to expose a backside of its copper layer 156, which may be coplanar with a backside of said each of the first or second type of memory modules 159, a backside of said each of the known-good memory, logic or ASIC chips 121 and a top surface of the polymer layer 565, and its insulating lining layer 153, adhesion layer 154 and seed layer 155 at a sidewall of its copper layer 156 may be left. For each of the vertical through vias (VTVs) 358 of said each of the second type of vertical-through-via (VTV) connectors 467, if made of one or more of the through silicon vias (TSVs) 157 as illustrated in one of FIGS. 1B, 1D, 1E, 2B, 2D and 2E, its insulating lining layer 153, adhesion layer 154 and seed layer 155 at its backside may be removed to expose a backside of its copper layer 156, which may be coplanar with a backside of said each of the second type of vertical-through-via (VTV) connectors 467 and a top surface of the polymer layer 565, and its insulating lining layer 153, adhesion layer 154 and seed layer 155 at a sidewall of its copper layer 156 may be left.

Figure 17E:
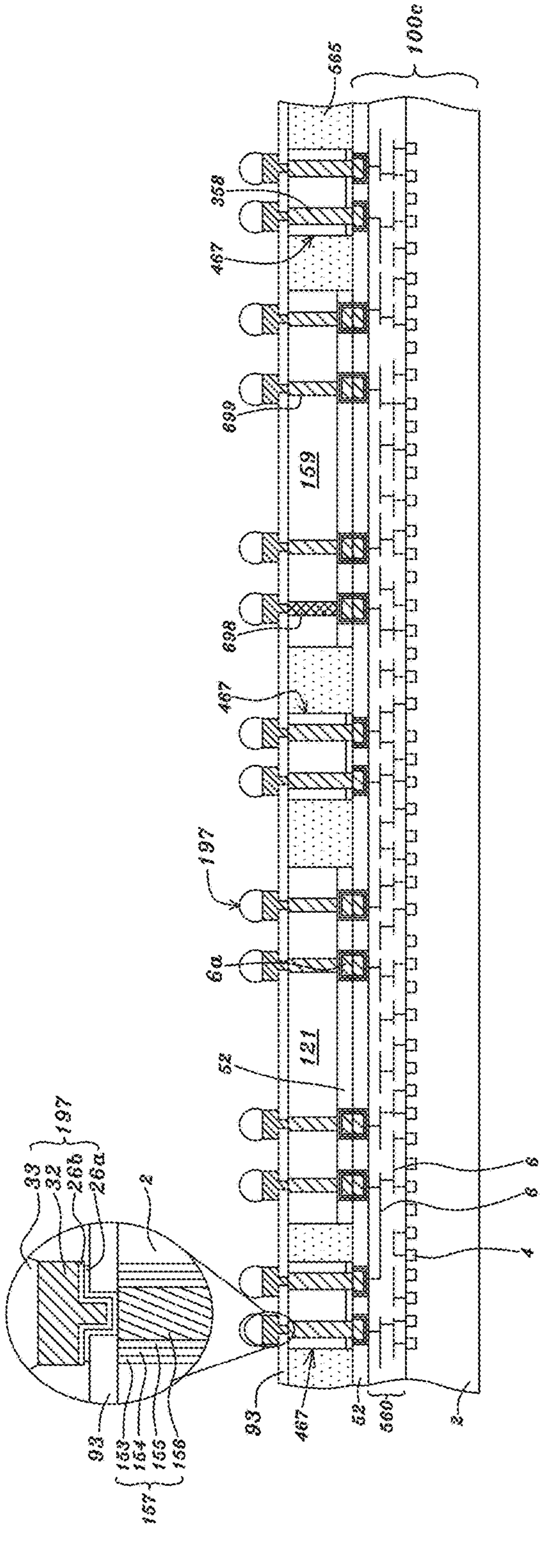

Next, referring to FIG. 17E, an insulating dielectric layer 93 may be formed on the top surface of the polymer layer 565, the backside of each of the first or second type of memory modules 159, the backside of each of the known-good memory, logic or ASIC chips 121 and the backside of each of the second type of vertical-through-via (VTV) connectors 467. Each opening in the insulating dielectric layer 93 may be vertically over the backside of the copper layer 156 of one of the through silicon vias (TSVs) 157 of the topmost one of the memory chips 251 of one of the first or second type of memory modules 159, the backside of the copper layer 156 of one of the through silicon vias (TSVs) 157 of one of the known-good memory, logic or ASIC chips 121 or the backside of one of the vertical through vias (VTVs) 358 of one of the second type of vertical-through-via (VTV) connectors 467. The insulating dielectric layer 93 may be a layer of polymer, such as polyimide, BenzoCycloButene (BCB), parylene, polybenzoxazole (PBO), epoxy-based material or compound, photo epoxy SU-8, elastomer or silicone, having a thickness between 3 and 30 micrometers or between 5 and 15 micrometers.

Next, referring to FIG. 17E, each micro-bump or micro-pad 197, which may be of one of the first through fourth types having the same specifications as the first through fourth types of micro-bumps or micro-pads 34 as illustrated in FIG. 1A, 1C or 1E respectively, may be formed on the backside of the copper layer 156 of one of the through silicon vias (TSVs) 157 of the topmost one of the memory chips 251 of one of the first or second type of memory modules 159, the backside of the copper layer 156 of one of the through silicon vias (TSVs) 157 of one of the known-good memory, logic or ASIC chips 121 or the backside of one of the vertical through vias (VTVs) 358 of one of the second type of vertical-through-via (VTV) connectors 467. Said each micro-bump or micro-pad 197 may be of the first type, including (1) an adhesion layer 26*a*, such as titanium (Ti) or titanium nitride (TiN) layer having a thickness between 1 nm and 50 nm, on the backside of the copper layer 156 of one of the through silicon vias (TSVs) 157 of the topmost one of the memory chips 251 of one of the first or second type of memory modules 159, the backside of the copper layer 156 of one of the through silicon vias (TSVs) 157 of one of the known-good memory, logic or ASIC chips 121 or the backside of the copper layer 156 of one of the vertical through vias (VTVs) 358 of one of the second type of vertical-through-via (VTV) connectors 467, (2) a seed layer 26*b*, such as copper, on its adhesion layer 26*a* and (3) a copper layer 32 having a thickness between 1 μm and 60 μm on its seed layer 26*b*.

Alternatively, referring to FIG. 17E, said each micro-bump or micro-pad 197 may be of the second type, including the adhesion layer 26*a*, seed layer 26*b* and copper layer 32 as mentioned above, and further including, as seen in FIG. 17E, a tin-containing solder cap 33 made of tin or a tin-silver alloy having a thickness between 1 μm and 50 μm on its copper layer 32.

Alternatively, referring to FIG. 17E, said each micro-bump or micro-pad 197 may be of the third type used as a thermal compression bump, including the adhesion layer 26*a* and seed layer 26*b* as mentioned above, and further including, as seen in any of 16A, 18A, 28A, 29A, 35A and 36A, a copper layer 37 having a thickness t3 between 2 μm and 20 μm and a largest transverse dimension w3, such as diameter in a circular shape, between 1 μm and 25 μm on its seed layer 26*b* and a solder cap 38 made of a tin-silver alloy, a tin-gold alloy, a tin-copper alloy, a tin-indium alloy, indium or tin, which has a thickness between 1 μm and 15 μm and a largest transverse dimension, such as diameter in a circular shape, between 1 μm and 15 μm on its copper layer 37. A pitch between neighboring two of the third type of micro-bumps or micro-pads 197 may be between 5 and 30 micrometers or between 10 and 25 micrometers.

Alternatively, referring to FIG. 17E, said each micro-bump or micro-pad 197 may be of the fourth type used as a thermal compression pad, including the adhesion layer 26*a* and seed layer 26*b* as mentioned above, and further including, as seen in FIG. 18A, a copper layer 48 having a thickness t2 between 1 μm and 20 μm or between 2 μm and 10 μm and a largest transverse dimension w2, such as diameter in a circular shape, between 5 μm and 50 μm, on its seed layer 26*b* and a solder cap 49 made of a tin-silver alloy, a tin-gold alloy, a tin-copper alloy, a tin-indium alloy, indium, tin or gold, which has a thickness between 0.1 μm and 5 μm on its copper layer 48. A pitch between neighboring two of the fourth type of micro-bumps or micro-pads 197 may be between 5 and 30 micrometers or between 10 and 25 micrometers.

Figure 17F:
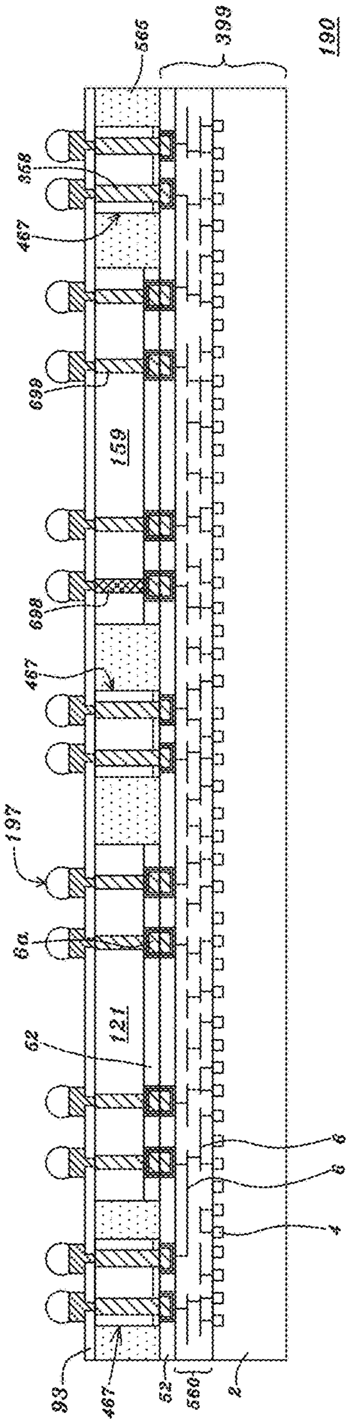

Next, referring to FIG. 17E, the semiconductor wafer 100*c*, polymer layer 565 and insulating dielectric layer 93 may be cut or diced to form multiple first type of operation units 190 each for a second type of chip-on-chip (COC) component or package, as shown in FIG. 17F by a laser cutting process or by a mechanical cutting process. At this time, the semiconductor wafer 100*c* may be cut or diced into multiple semiconductor integrated-circuit (IC) chips 399, each of which may have the same specification as the semiconductor integrated-circuit (IC) chip 100 as illustrated in FIG. 14D and may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (IRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip.

Figure 17G:
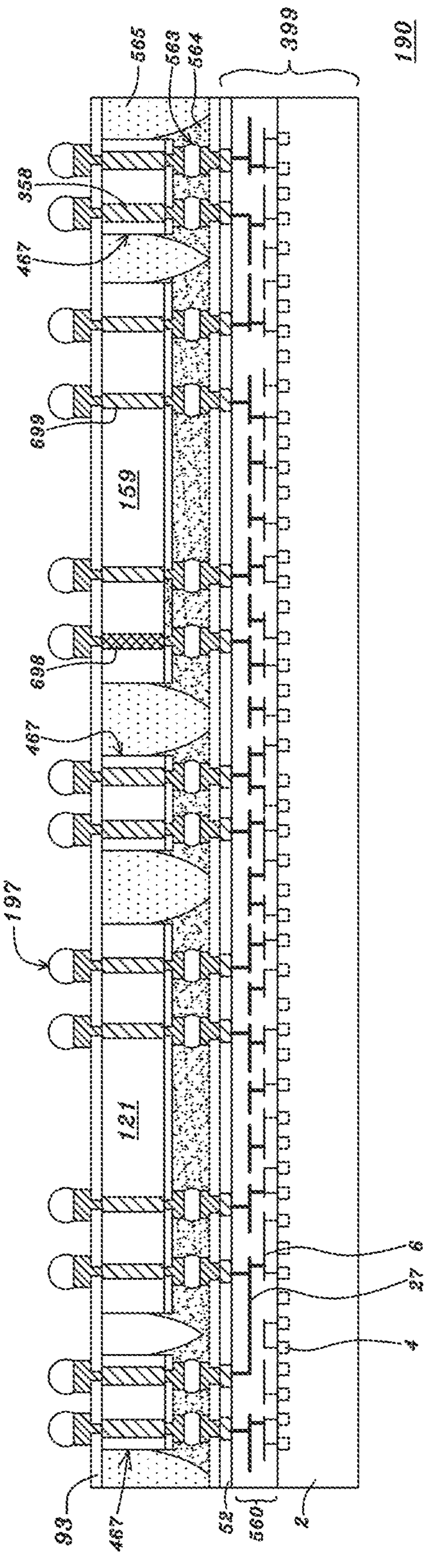
FIG. 17G is a schematically cross-sectional view showing a first type of operation unit in accordance with another embodiment of the present application.

Alternatively, FIG. 17G is a schematically cross-sectional view showing a first type of operation unit in accordance with another embodiment of the present application. For an element indicated by the same reference number shown in FIGS. 17A-17G, the specification of the element as seen in FIG. 17G may be referred to that of the element as illustrated in FIGS. 17A-17F. Referring to FIG. 17G, the semiconductor wafer 100*c* may be provided at an active side thereof with the first, second or fourth type of micro-bumps or micro-pads 34, as illustrated in FIG. 14A, instead of the insulating bonding layer 52 and metal pads 6*a*. Each of the first or second type of memory modules 159 (only one is shown) formed as illustrated in FIG. 15A or 15B respectively may have the first, second or third type of micro-bumps or micro-pads 34 to be bonded to the first, second or fourth type of micro-bumps or micro-pads 34 preformed at an active side of the semiconductor wafer 100*c* into multiple bonded metal contacts 563 respectively therebetween. Each of the known-good memory, logic or ASIC chips 121 (only one is shown) may have the structure as illustrated in FIG. 14B provided at an active side thereof with the first, second or third type of micro-bumps or micro-pads 34 to be bonded to the first, second or fourth type of micro-bumps or micro-pads 34 preformed at an active side of the semiconductor wafer 100*c* into multiple bonded metal contacts 563 respectively therebetween. Each of the first type of vertical-through-via (VTV) connectors 467 as illustrated in any of FIGS. 1A, 1C, 1E, 2A, 2C, 2E, 4A, 4B, 4C, 5A, 5B, 5C and 6 may be provided with the first, second, third, fifth or sixth type of micro-bumps or micro-pads 34 to be bonded to the first, second or fourth type of micro-bumps or micro-pads 34 preformed at the active side of the semiconductor wafer 100*c* into multiple bonded metal contacts 563 respectively therebetween.

Figure 18B:
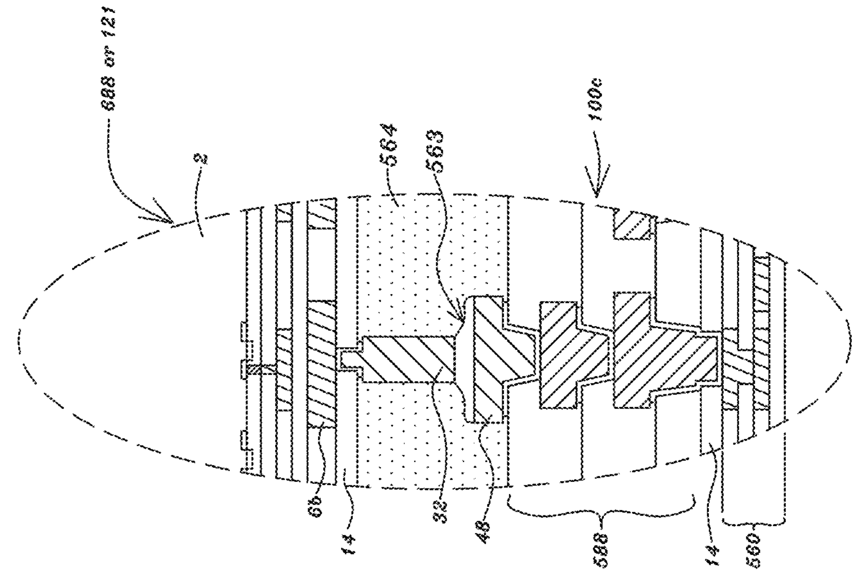
FIGS. 18A and 18B are schematically cross-sectional views showing a process of bonding a thermal compression bump to a thermal compression pad in accordance with an embodiment of the present application.
Figure 18A:
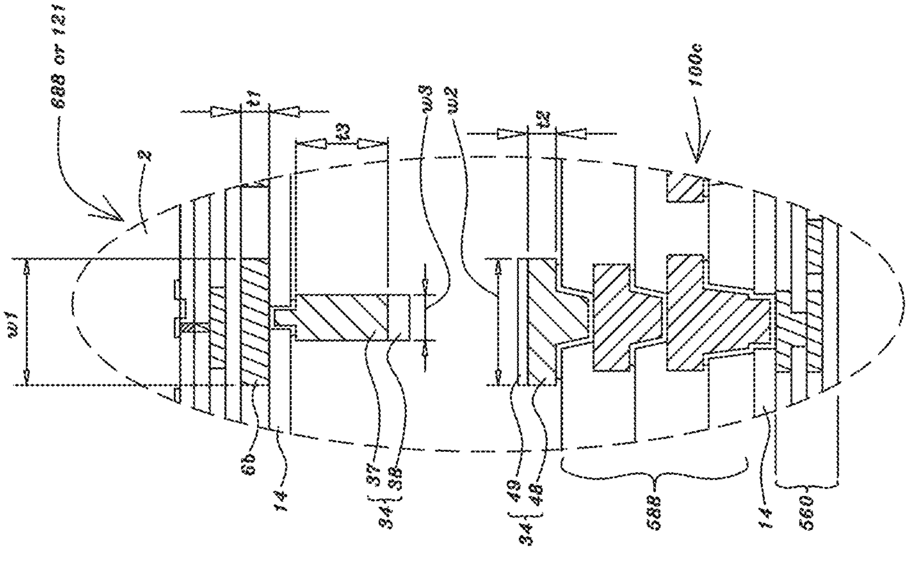

FIGS. 18A and 18B are schematically cross-sectional views showing a process of bonding a thermal compression bump to a thermal compression pad in accordance with an embodiment of the present application. For a first case, referring to FIGS. 17G, 18A and 18B, each of the first or second type of memory modules 159, the known-good memory, logic or ASIC chips 121 and the first type of vertical-through-via (VTV) connectors 467 may have the third type of micro-bumps or micro-pads 34 to be bonded to the fourth type of micro-bumps or micro-pads 34 of the semiconductor wafer 100*c*. For example, the third type of micro-bumps or micro-pads 34 of said each of the first or second type of memory modules 159, the known-good memory, logic or ASIC chips 121 and the first type of vertical-through-via (VTV) connectors 467 may have the solder caps 38 to be thermally compressed, at a temperature between 240 and 300 degrees Celsius, at a pressure between 0.3 and 3 Mpa and for a time period between 3 and 15 seconds, onto the metal caps 49 of the fourth type of micro-bumps or micro-pads 34 of the semiconductor wafer 100*c* into multiple bonded metal contacts 563 between said each of the first or second type of memory modules 159, the known-good memory, logic or ASIC chips 121 and the first type of vertical-through-via (VTV) connectors 467 and the semiconductor wafer 100*c*, wherein neighboring two of the bonded metal contacts 563 may have a pitch between 5 and 30 micrometers or 10 and 25 micrometers. Each of the third type of micro-bumps or micro-pads 34 of said each of the first or second type of memory modules 159, the known-good memory, logic or ASIC chips 121 and the first type of vertical-through-via (VTV) connectors 467 may have the copper layer 37 having the thickness t3 greater than the thickness t2 of the copper layer 48 of each of the fourth type of micro-bumps or micro-pads 34 of the semiconductor wafer 100*c* and having the largest transverse dimension w3 equal to between 0.7 and 0.1 times of the largest transverse dimension w2 of the copper layer 48 of each of the fourth type of micro-bumps or micro-pads 34 of the semiconductor wafer 100*c*. Alternatively, each of the third type of micro-bumps or micro-pads 34 of said each of the first or second type of memory modules 159, the known-good memory, logic or ASIC chips 121 and the first type of vertical-through-via (VTV) connectors 467 may be provided with the copper layer 37 having a cross-sectional area equal to between 0.5 and 0.01 times of the cross-sectional area of the copper layer 48 of each of the fourth type of micro-bumps or micro-pads 34 of the semiconductor wafer 100*c*.

For example, referring to FIGS. 17G, 18A and 18B, for each of the first or second type of memory modules 159, its third type of micro-bumps or micro-pads 34 may be formed respectively on a front surface of the metal pads 6*b* provided by the frontmost one of the interconnection metal layers 27 of the second interconnection scheme 588 of its control chip 688 or by, if the second interconnection scheme 588 is not provided for its control chip 688, the frontmost one of the interconnection metal layers 6 of the first interconnection scheme 560 of its control chip 688, wherein each of its third type of micro-bumps or micro-pads 34 may be provided with the copper layer 37 having the thickness t3 greater than the thickness t1 of each of the metal pads 6*b* of its control chip 688 and having the largest transverse dimension w3 equal to between 0.7 and 0.1 times of the largest transverse dimension w1 of each of the metal pads 6*b* of its control chip 688; alternatively, each of its third type of micro-bumps or micro-pads 34 may be provided with the copper layer 37 having a cross-sectional area equal to between 0.5 and 0.01 times of the cross-sectional area of each of the metal pads 6*b* of its control chip 688; each of the metal pads 6*b* of its control chip 688 may have a thickness t1 between 1 and 10 micrometers or between 2 and 10 micrometers and a largest transverse dimension w1, such as diameter in a circular shape, between 1 μm and 25 μm. For each of the known-good memory, logic or ASIC chips 121, its third type of micro-bumps or micro-pads 34 may be formed respectively on a front surface of the metal pads 6*b* provided by the frontmost one of the interconnection metal layers 27 of its second interconnection scheme 588 or by, if its second interconnection scheme 588 is not provided, the frontmost one of the interconnection metal layers 6 of its first interconnection scheme 560, wherein each of its third type of micro-bumps or micro-pads 34 may be provided with the copper layer 37 having the thickness t3 greater than the thickness t1 of each of its metal pads 6*b* and having the largest transverse dimension w3 equal to between 0.7 and 0.1 times of the largest transverse dimension w1 of each of its metal pads 6*b*; alternatively, each of its third type of micro-bumps or micro-pads 34 may be provided with the copper layer 37 having a cross-sectional area equal to between 0.5 and 0.01 times of the cross-sectional area of each of its metal pads 6*b*; each of its metal pads 6*b* may have a thickness t1 between 1 and 10 micrometers or between 2 and 10 micrometers and a largest transverse dimension w1, such as diameter in a circular shape, between 1 μm and 25 μm. A bonded solder between the copper layers 37 and 48 of each of the bonded metal contacts 563 may be mostly kept on a top surface of the copper layer 48 of one of the fourth type of micro-bumps or micro-pads 34 of the semiconductor wafer 100*c* and extends out of the edge of the copper layer 48 of said one of the fourth type of micro-bumps or micro-pads 34 of the semiconductor wafer 100*c* less than 0.5 micrometers. Thus, a short between neighboring two of the bonded metal contacts 563 even in a fine-pitched fashion may be avoided.

Alternatively, for a second case, referring to FIG. 17G, each of the first or second type of memory modules 159, the known-good memory, logic or ASIC chips 121 and the first type of vertical-through-via (VTV) connectors 467 may have the second type of micro-bumps or micro-pads 34 to be bonded to the first type of micro-bumps or micro-pads 34 of the semiconductor wafer 100*c*. For example, the second type of micro-bumps or micro-pads 34 of said each of the first or second type of memory modules 159, the known-good memory, logic or ASIC chips 121 and the first type of vertical-through-via (VTV) connectors 467 may have the solder caps 33 to be bonded onto the copper layer 32 of the first type of micro-bumps or micro-pads 34 of the semiconductor wafer 100*c* into multiple bonded metal contacts 563 between said each of the first or second type of memory modules 159, the known-good memory, logic or ASIC chips 121 and the first type of vertical-through-via (VTV) connectors 467 and the semiconductor wafer 100*c*. Each of the second type of micro-bumps or micro-pads 34 of said each of the first or second type of memory modules 159, the known-good memory, logic or ASIC chips 121 and the first type of vertical-through-via (VTV) connectors 467 may have the copper layer 32 having a thickness greater than that of the copper layer 32 of each of the first type of micro-bumps or micro-pads 34 of the semiconductor wafer 100*c*.

Alternatively, for a third case, referring to FIG. 17G, each of the first or second type of memory modules 159, the known-good memory, logic or ASIC chips 121 and the first type of vertical-through-via (VTV) connectors 467 may have the first type of micro-bumps or micro-pads 34 to be bonded to the second type of metal bumps or pillars 34 of the semiconductor wafer 100*c*. For example, the first type of micro-bumps or micro-pads 34 of said each of the first or second type of memory modules 159, the known-good memory, logic or ASIC chips 121 and the first type of vertical-through-via (VTV) connectors 467 may have the electroplated metal layer 32, e.g. copper layer, to be bonded onto the solder caps 33 of the second type of micro-bumps or micro-pads 34 of the semiconductor wafer 100*c* into multiple bonded metal contacts 563 between said each of the first or second type of memory modules 159, the known-good memory, logic or ASIC chips 121 and the first type of vertical-through-via (VTV) connectors 467 and the semiconductor wafer 100*c*. Each of the first type of micro-bumps or micro-pads 34 of said each of the first or second type of memory modules 159, the known-good memory, logic or ASIC chips 121 and the first type of vertical-through-via (VTV) connectors 467 may have the copper layer 32 having a thickness greater than that of the copper layer 32 of each of the second type of micro-bumps or micro-pads 34 of the semiconductor wafer 100*c*.

Alternatively, for a fourth case, referring to FIG. 17G, each of the first or second type of memory modules 159, the known-good memory, logic or ASIC chips 121 and the first type of vertical-through-via (VTV) connectors 467 may have the second type of micro-bumps or micro-pads 34 to be bonded to the second type of micro-bumps or micro-pads 34 of the semiconductor wafer 100*c*. For example, the second type of micro-bumps or micro-pads 34 of said each of the first or second type of memory modules 159, the known-good memory, logic or ASIC chips 121 and the first type of vertical-through-via (VTV) connectors 467 may have the solder caps 33 to be bonded onto the solder caps 33 of the second type of micro-bumps or micro-pads 34 of the semiconductor wafer 100*c* into multiple bonded metal contacts 563 between said each of the first or second type of memory modules 159, the known-good memory, logic or ASIC chips 121 and the first type of vertical-through-via (VTV) connectors 467 and the semiconductor wafer 100*c*. Each of the second type of micro-bumps or micro-pads 34 of said each of the first or second type of memory modules 159, the known-good memory, logic or ASIC chips 121 and the first type of vertical-through-via (VTV) connectors 467 may have the copper layer 32 having a thickness greater than that of the copper layer 32 of each of the second type of micro-bumps or micro-pads 34 of the semiconductor wafer 100*c*.

Next, referring to FIG. 17G, an underfill 564, such as a layer of polymer or epoxy resins or compounds, may be filled into a gap between each of the first or second type of memory modules 159 and the semiconductor wafer 100*c* to enclose the bonded metal contacts 563 therebetween, into a gap between each of the known-good memory, logic or ASIC chips 121 and the semiconductor wafer 100*c* to enclose the bonded metal contacts 563 therebetween and into a gap between each of the first type of vertical-through-via (VTV) connectors 467 and the semiconductor wafer 100*c* to enclose the bonded metal contacts 563 therebetween. The underfill 564 may be cured at temperature equal to or above 100, 120 or 150 degrees Celsius.

Referring to FIG. 17G, the following process may be referred to the process as illustrated in FIGS. 17C-17F. When the chemical mechanical polishing (CMP), polishing or grinding process as illustrated in FIG. 17D is performed, for each of the vertical through vias (VTVs) 358 of said each of the first type of vertical-through-via (VTV) connectors 467, if made of one or more of the through silicon vias (TSVs) 157 as illustrated in one of FIGS. 1A, 1C, 1E, 2A, 2C and 2E for the first and second alternatives, its insulating lining layer 153, adhesion layer 154 and seed layer 155 at its backside may be removed to expose a backside of its copper layer 156, which may be coplanar with a backside of said each of the first type of vertical-through-via (VTV) connectors 467 and a top surface of the polymer layer 565, and its insulating lining layer 153, adhesion layer 154 and seed layer 155 at a sidewall of its copper layer 156 may be left; for each of the vertical through vias (VTVs) 358 of said each of the first type of vertical-through-via (VTV) connectors 467, if made of one or more of the through glass vias (TGVs) 259 as illustrated in one of FIGS. 4A, 4B, 4C, 5A, 5B and 5C for the third and fourth alternatives, a backside of its copper post 706 may be exposed with being coplanar with a backside of said each of the first type of vertical-through-via (VTV) connectors 467 and the top surface of the polymer layer 565; for each of the vertical through vias (VTVs) 358 of said each of the first type of vertical-through-via (VTV) connectors 467, if made of one or more of the through polymer vias (TPVs) 318 as illustrated in FIG. 6 for the fifth alternative, a backside of its metal pad 336 or copper post 318 may be exposed with being coplanar with a backside of said each of the first type of vertical-through-via (VTV) connectors 467 and the top surface of the polymer layer 565.

Next, referring to FIG. 17G, each of the micro-bumps or micro-pads 197, which may be of one of the first through fourth types having the same specifications as the first through fourth types of micro-bumps or micro-pads 197 as illustrated in FIG. 17E respectively, may include the adhesion layer 26*a* on the backside of the copper layer 156 of one of the through silicon vias (TSVs) 157 of the topmost one of the memory chips 251 of one of the first or second type of memory modules 159, the backside of the copper layer 156 of one of the through silicon vias (TSVs) 157 of one of the known-good memory, logic or ASIC chips 121 or the backside of one of the vertical through vias (VTVs) 358 of one of the first type of vertical-through-via (VTV) connectors 467. Said each micro-bump or micro-pad 197 may be any of the first through fourth types, including (1) the adhesion layer 26*a*, such as titanium (Ti) or titanium nitride (TiN) layer having a thickness between 1 nm and 50 nm, on the backside of the copper layer 156 of one of the through silicon vias (TSVs) 157 of the topmost one of the memory chips 251 of one of the first or second type of memory modules 159, the backside of the copper layer 156 of one of the through silicon vias (TSVs) 157 of one of the known-good memory, logic or ASIC chips 121, the backside of the copper layer 156 of one of the vertical through vias (VTVs) 358 of one of the first type of vertical-through-via (VTV) connectors 467 for the first and second alternatives, the backside of the copper post 706 of one of the vertical through vias (VTVs) 358 of one of the first type of vertical-through-via (VTV) connectors 467 for the third and fourth alternatives or the backside of the metal pad 336 or copper post 318 of one of the vertical through vias (VTVs) 358 of one of the first type of vertical-through-via (VTV) connectors 467 for the fifth alternative.

Next, the semiconductor wafer 100*c*, polymer layer 565 and insulating dielectric layer 93 may be cut or diced to form multiple first type of operation units 190 each for a second type of chip-on-chip (COC) component or package, as shown in FIG. 17G by a laser cutting process or by a mechanical cutting process. At this time, the semiconductor wafer 100*c* may be cut or diced into multiple semiconductor integrated-circuit (IC) chips 399, each of which may have the same specification as the semiconductor integrated-circuit (IC) chip 100 as illustrated in FIG. 14A or 14B and may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip.

Figure 19A:
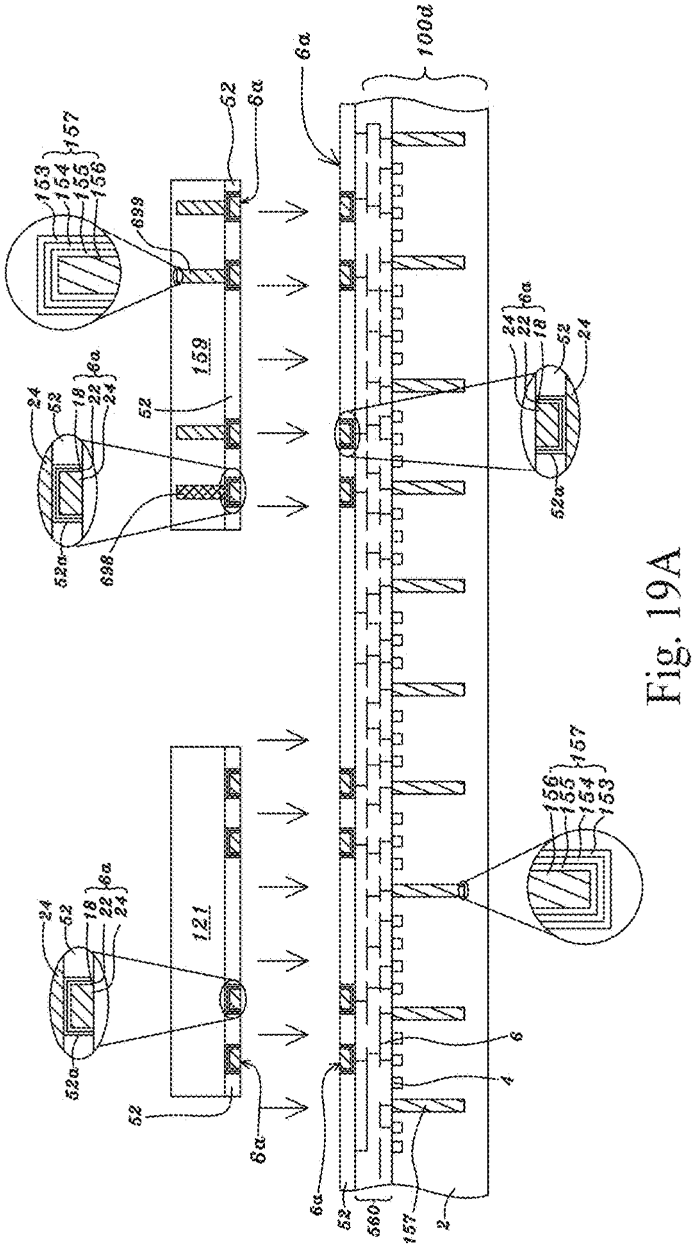
FIGS. 19A-19G are schematically cross-sectional views showing a process for fabricating a first type of operation unit in accordance with another embodiment of the present application.

2. First Type of Operation Unit for First Type of Chip-On-Chip (COC) Component or Package FIGS. 19A-19G are schematically cross-sectional views showing a process for fabricating a first type of operation unit in accordance with another embodiment of the present application. Referring to FIG. 19A, a semiconductor wafer 100*d* may be provided at an active side thereof with the insulating bonding layer 52 and metal pads 6*a* and provided with the through silicon vias (TSVs) 157 in the silicon substrate 2 thereof as illustrated in FIG. 14E, wherein neighboring two of the metal pads 6*a* of the semiconductor wafer 100*d* may have a pitch between 3 and 10 micrometers or between 4 and 7 micrometers. Next, referring to FIGS. 19A and 19B, each of first or second type of memory modules 159 may have the same structure as illustrated in FIG. 15C or 15D provided with the insulating bonding layer 52 to be bonded to the insulating bonding layer 52 of the semiconductor wafer 100*d* and the metal pads 6*a*, neighboring two of which may have a pitch between 3 and 10 micrometers or between 4 and 7 micrometers, to be bonded to the metal pads 6*a* of the semiconductor wafer 100*d*. Each of known-good memory, logic or application-specific-integrated-circuit (ASIC) chips 121 may have the structure as illustrated in FIG. 14D provided at an active side thereof with the insulating bonding layer 52 to be bonded to the insulating bonding layer 52 of the semiconductor wafer 100*d* and the metal pads 6*a*, neighboring two of which may have a pitch between 3 and 10 micrometers or between 4 and 7 micrometers, to be bonded to the metal pads 6*a* of the semiconductor wafer 100*d*. For example, each of the known-good memory, logic or application-specific-integrated-circuit (ASIC) chips 121 may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip.

Figure 19B:
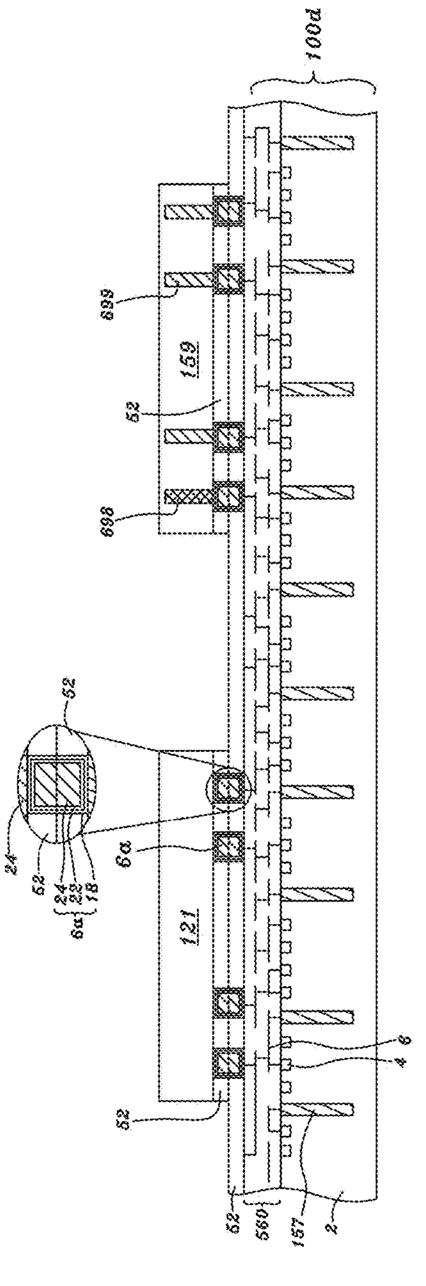

Next, referring to FIGS. 19A and 19B, each of the first or second type of memory modules 159 and the known-good memory, logic or ASIC chips 121 may have the insulating bonding layer 52 bonded to the insulating bonding layer 52 of the semiconductor wafer 100*d* and the metal pads 6*a* each bonded to one of the metal pads 6*a* of the semiconductor wafer 100*d*. The process for joining each of the first or second type of memory modules 159 and the known-good memory, logic or ASIC chips 121 with the semiconductor wafer 100*d* by providing each of the first or second type of memory modules 159 and the known-good memory, logic or ASIC chips 121 with the insulating bonding layer 52 bonded to the insulating bonding layer 52 of the semiconductor wafer 100*d* and with the metal pads 6*a* each bonded to one of the metal pads 6*a* of the semiconductor wafer 100*d* may be referred to that for joining each of the first or second type of memory modules 159 and the known-good memory, logic or ASIC chips 121 with the semiconductor wafer 100*c* as illustrated in FIGS. 17A and 17B.

Figure 19C:
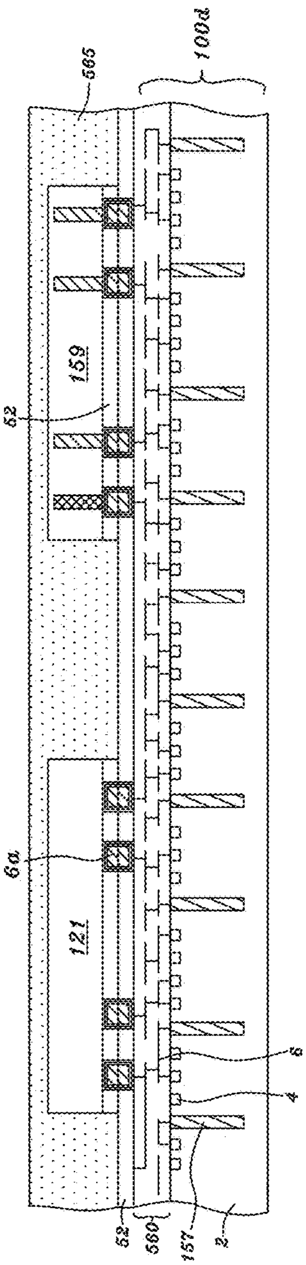

Next, referring to FIG. 19C, a polymer layer 565, e.g., resin or compound, may be applied to fill a gap between each neighboring two of the first or second type of memory modules 159 and the known-good memory, logic or ASIC chips 121 and to cover a backside of each of the first or second type of memory modules 159 and a backside of each of the known-good memory, logic or ASIC chips 121 by methods, for example, spin-on coating, screen-printing, dispensing or molding. The polymer layer 565 may be, for example, polyimide, BenzoCycloButene (BCB), parylene, polybenzoxazole (PBO), epoxy-based material or compound, photo epoxy SU-8, elastomer, or silicone. The polymer layer 565 may be, for example, photosensitive polyimide/PBO PIMEL™ supplied by Asahi Kasei Corporation, Japan, or epoxy-based molding compounds, resins or sealants provided by Nagase ChemteX Corporation, Japan. The polymer layer 565 may be cured or cross-linked at a temperature higher than or equal to 50, 70, 90, 100, 125, 150, 175, 200, 225, 250, 275 or 300 degrees Celsius.

Figure 19D:
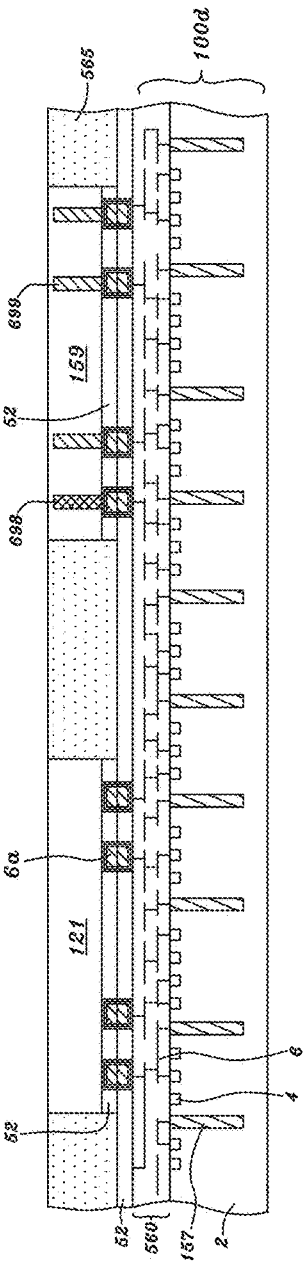

Next, referring to FIG. 19D, a chemical mechanical polishing (CMP), polishing or grinding process may be applied to remove a top portion of the polymer layer 565 to planarize a top surface of the polymer layer 565, a top surface of each of the first or second type of memory modules 159 and a top surface of each of the known-good memory, logic or ASIC chips 121 and to expose a backside of the topmost one of the memory chips 251 of each of the first or second type of memory modules 159 and a backside of each of the known-good memory, logic or ASIC chips 121.

Figure 19E:
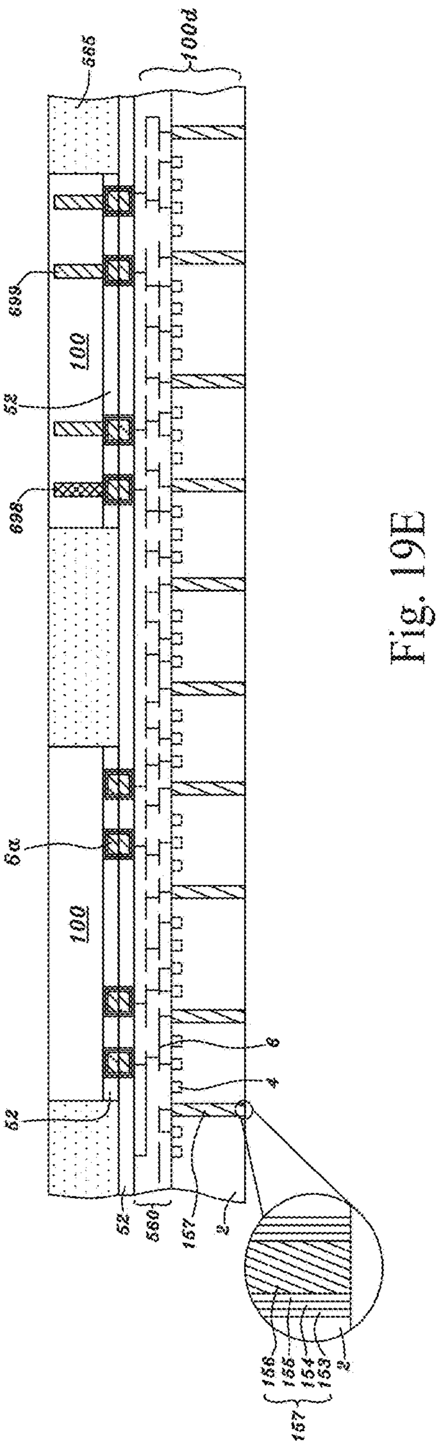

Next, referring to FIG. 19E, a chemical mechanical polishing (CMP), polishing or grinding process may be applied to remove a bottom portion of the semiconductor substrate 2 of the semiconductor wafer 100*d* and to expose a backside of the copper layer 156 of each of the through silicon vias (TSVs) 157 of the semiconductor wafer 100*d*. For each of the through silicon vias (TSVs) 157 of the semiconductor wafer 100*d*, its insulating lining layer 153, adhesion layer 154 and seed layer 155 at its backside may be removed to expose a backside of its copper layer 156, which may be coplanar with a backside of the semiconductor substrate 2 of the semiconductor wafer 100*d*, and its insulating lining layer 153, adhesion layer 154 and seed layer 155 at a sidewall of its copper layer 156 may be left.

Figure 19F:
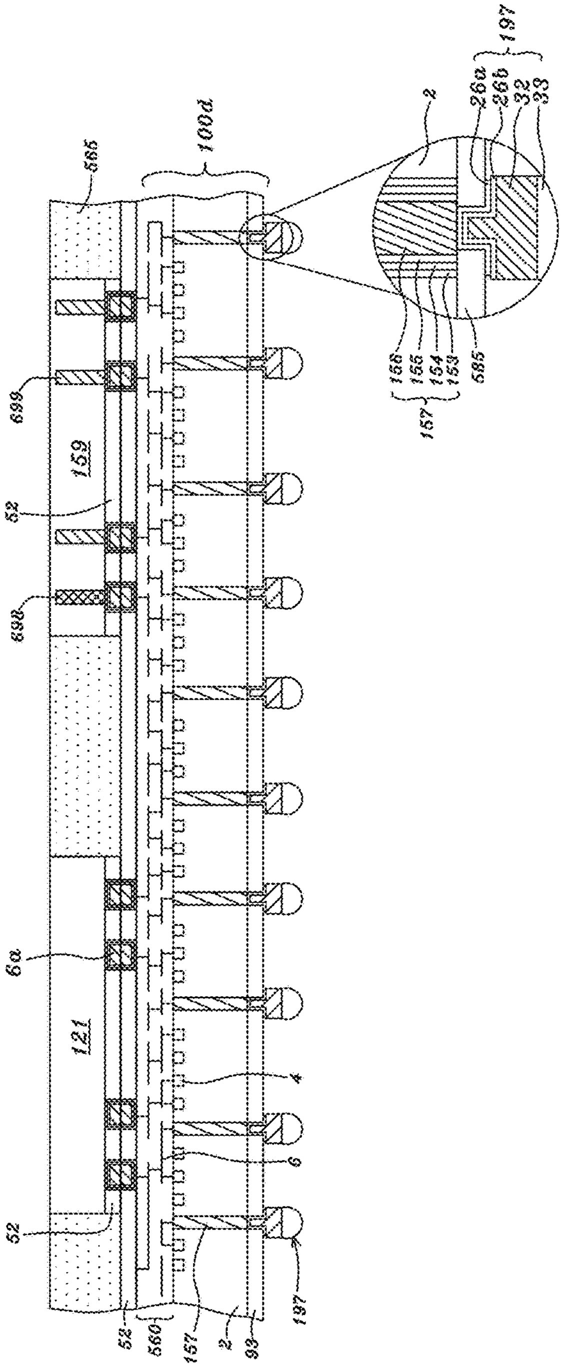

Next, referring to FIG. 19F, an insulating dielectric layer 93 may be formed on the backside of the semiconductor substrate 2 of the semiconductor wafer 100*d*. Each opening in the insulating dielectric layer 93 may be vertically under the backside of the copper layer 156 of one of the through silicon vias (TSVs) 157 of the semiconductor wafer 100*d*. The insulating dielectric layer 93 may be a layer of polymer, such as polyimide, BenzoCycloButene (BCB), parylene, polybenzoxazole (PBO), epoxy-based material or compound, photo epoxy SU-8, elastomer or silicone, having a thickness between 3 and 30 micrometers or between 5 and 15 micrometers.

Next, referring to FIG. 19F, each of the micro-bumps or micro-pads 197, which may be of one of the first through fourth types having the same specifications as the first through fourth types of micro-bumps or micro-pads 197 as illustrated in FIG. 17E respectively, may include the adhesion layer 26*a* on the backside of the copper layer 156 of one of the through silicon vias (TSVs) 157 of the semiconductor wafer 100*d*. Said each micro-bump or micro-pad 197 may be any of the first through fourth types, including (1) the adhesion layer 26*a*, such as titanium (Ti) or titanium nitride (TiN) layer having a thickness between 1 nm and 50 nm, on the backside of the copper layer 156 of one of the through silicon vias (TSVs) 157 of the semiconductor wafer 100*d*.

Figure 19G:
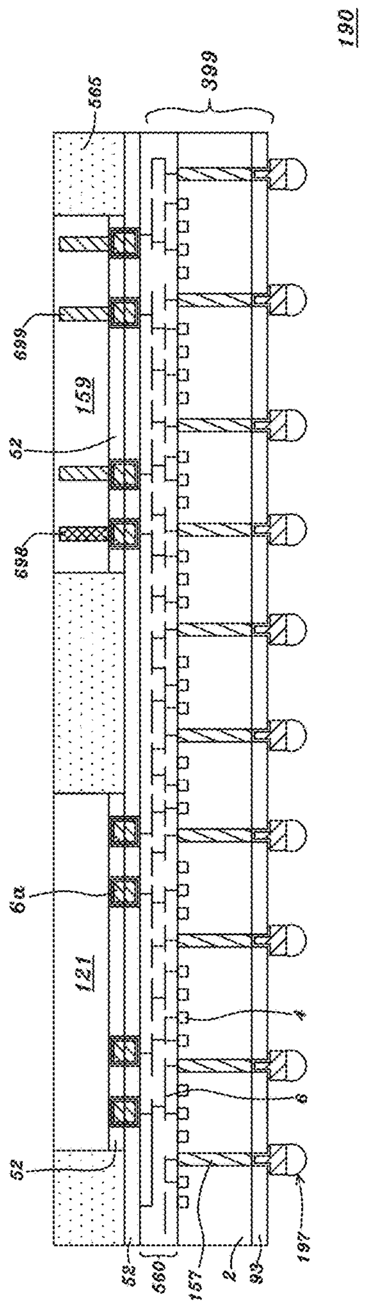

Next, the semiconductor wafer 100*d* and polymer layer 565 may be cut or diced to form multiple first type of operation units 190 each for a first type of chip-on-chip (COC) components or package as shown in FIG. 19G by a laser cutting process or by a mechanical cutting process. At this time, the semiconductor wafer 100*d* may be cut or diced into multiple semiconductor integrated-circuit (IC) chips 399, each of which may have the same specification as the semiconductor integrated-circuit (IC) chip 100 as illustrated in FIG. 14F and may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip.

Figure 19H:
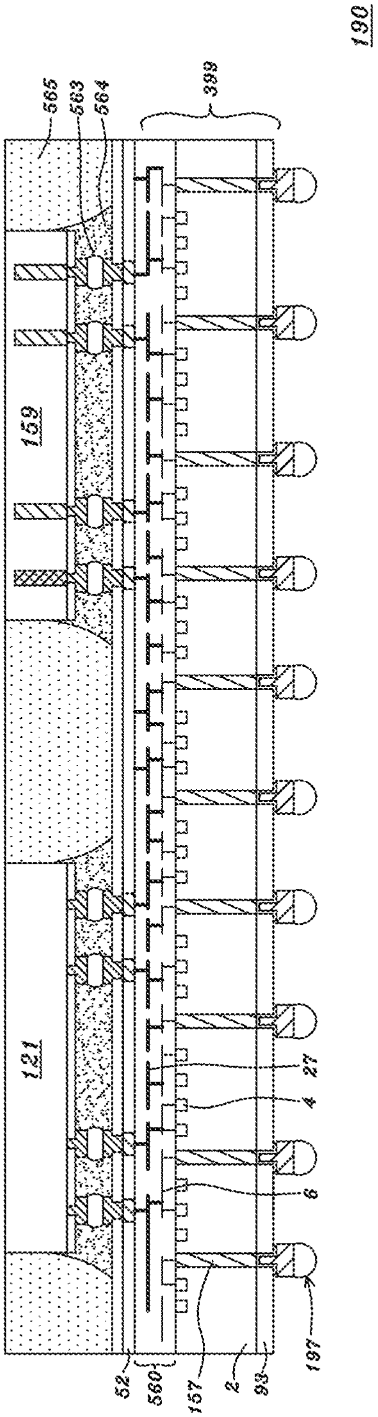
FIG. 19H is a schematically cross-sectional view showing a first type of operation unit in accordance with another embodiment of the present application.

Alternatively, FIG. 19H is a schematically cross-sectional view showing a first type of operation unit in accordance with another embodiment of the present application. For an element indicated by the same reference number shown in FIGS. 19A-19H, the specification of the element as seen in FIG. 19H may be referred to that of the element as illustrated in FIG. 19A-19G. Referring to FIG. 19H, the semiconductor wafer 100*d* may be provided at an active side thereof with the first, second or fourth type of micro-bumps or micro-pads 34, as illustrated in FIG. 14B, instead of the insulating bonding layer 52 and metal pads 6*a*. Each of the first or second type of memory modules 159 (only one is shown) formed as illustrated in FIG. 15A or 15B respectively may have the first, second or third type of micro-bumps or micro-pads 34 to be bonded to the first, second or fourth type of micro-bumps or micro-pads 34 preformed at an active side of the semiconductor wafer 100*d* into multiple bonded metal contacts 563 respectively therebetween, which may have the same specifications or details as those illustrated in FIGS. 17G, 18A and 18B for the first through fourth cases. Each of the known-good memory, logic or ASIC chips 121 (only one is shown) may have the structure as illustrated in FIG. 14B provided at an active side thereof with the first, second or third type of micro-bumps or micro-pads 34 to be bonded to the first, second or fourth type of micro-bumps or micro-pads 34 preformed at an active side of the semiconductor wafer 100*d* into multiple bonded metal contacts 563 respectively therebetween, which may have the same specifications or details as those illustrated in FIGS. 17G, 18A and 18B for the first through fourth cases.

Next, referring to FIG. 19H, an underfill 564, such as a layer of polymer or epoxy resins or compounds, may be filled into a gap between each of the first or second type of memory modules 159 and the semiconductor wafer 100*d* to enclose the bonded metal contacts 563 therebetween and into a gap between each of the known-good memory, logic or ASIC chips 121 and the semiconductor wafer 100*c* to enclose the bonded metal contacts 563 therebetween. The underfill 564 may be cured at temperature equal to or above 100, 120 or 150 degrees Celsius. The following process may be referred to the process as illustrated in FIGS. 19C-19G.

Figure 20A:
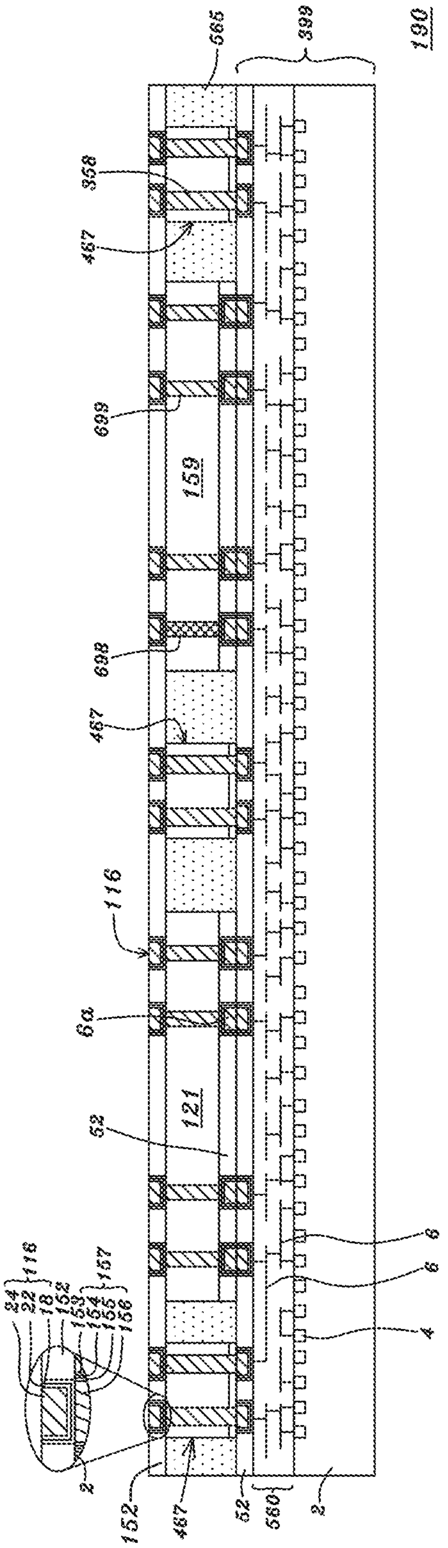
FIGS. 20A and 20B are schematically cross-sectional views showing various second type of operation units in accordance with an embodiment of the present application.
Figure 20B:
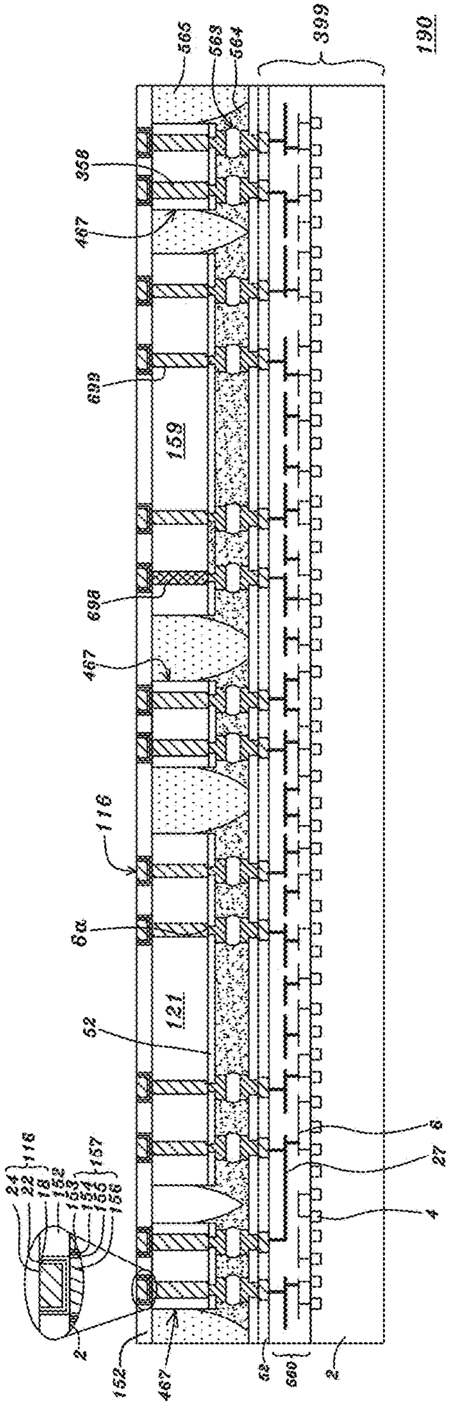

3. Second Type of Operation Unit for Second Type of Chip-on-chip (COC) Component or Package FIGS. 20A and 20B are schematically cross-sectional views showing various second type of operation units in accordance with an embodiment of the present application. The second type of operation unit 190 for the second type of chip-on-chip (COC) component or package as seen in FIG. 20A is similar to the first type of operation unit 190 for the second type of chip-on-chip (COC) component or package as illustrated in FIG. 17F, but the difference between the first and second types of operation units 190 for the second type of chip-on-chip (COC) components or packages as seen in FIGS. 17F and 20A is that the second type of operation unit 190 for the second type of chip-on-chip (COC) component or package as seen in FIG. 20A includes (1) an insulating bonding layer 152 on the top surface of the polymer layer 565, the backside of each of the first or second type of memory modules 159, the backside of each of the known-good memory, logic or ASIC chips 121 and the backside of each of the second type of vertical-through-via (VTV) connectors 467 and (2) multiple metal pads 116 each in one of multiple openings in the insulating bonding layer 152 and on the backside of the copper layer 156 of one of the through silicon vias (TSVs) 157 of the topmost one of the memory chips 251 of one of the first or second type of memory modules 159, the backside of the copper layer 156 of one of the through silicon vias (TSVs) 157 of one of the known-good memory, logic or ASIC chips 121 or the backside of the copper layer 156 of one of the vertical through vias (VTVs) 358 of one of the second type of vertical-through-via (VTV) connectors 467 for the first and second alternatives, instead of the insulating dielectric layer 93 and the first through fourth types of micro-bumps or micro-pads 197 as illustrated in FIG. 17F. The second type of operation unit 190 for the second type of chip-on-chip (COC) component or package as seen in FIG. 20B is similar to the first type of operation unit 190 for the second type of chip-on-chip (COC) component or package as illustrated in FIG. 17G, but the difference between the first and second types of operation units 190 for the second type of chip-on-chip (COC) components or packages as seen in FIGS. 17G and 20B is that the second type of operation unit 190 for the second type of chip-on-chip (COC) component or package as seen in FIG. 20B includes (1) an insulating bonding layer 152 on the top surface of the polymer layer 565 and (2) multiple metal pads 116 each in one of multiple openings in the insulating bonding layer 152 and on the backside of the copper layer 156 of one of the through silicon vias (TSVs) 157 of the topmost one of the memory chips 251 of one of the first or second type of memory modules 159, the backside of the copper layer 156 of one of the through silicon vias (TSVs) 157 of one of the known-good memory, logic or ASIC chips 121, the backside of the copper layer 156 of one of the vertical through vias (VTVs) 358 of one of the first type of vertical-through-via (VTV) connectors 467 for the first and second alternatives, the backside of the copper post 706 of one of the vertical through vias (VTVs) 358 of one of the first type of vertical-through-via (VTV) connectors 467 for the third and fourth alternatives or the backside of the metal pad 336 or copper post 318 of one of the vertical through vias (VTVs) 358 of one of the first type of vertical-through-via (VTV) connectors 467 for the fifth alternative, instead of the insulating dielectric layer 93 and the first through fourth types of micro-bumps or micro-pads 197 as illustrated in FIG. 17G.

For each of the second type of operation units 190 for the second type of chip-on-chip (COC) components or packages as seen in FIGS. 20A and 20B, its insulating bonding layer 152 may be a silicon-oxide layer having a thickness between 0.1 and 2 μm. Each of its metal pads 116 may include (1) a copper layer 24 having a thickness of between 3 nm and 500 nm in one of the openings in its insulating bonding layer 152, (2) an adhesion layer 18, such as titanium or titanium nitride having a thickness of between 1 nm and 50 nm, at a bottom and sidewall of the copper layer 24 of said each of its metal pads 116 and (3) a seed layer 22, such as copper, between the copper layer 24 and adhesion layer 18 of said each of its metal pads 116, wherein the copper layer 24 of said each of its metal pads 116 may have a top surface substantially coplanar with a top surface of the silicon-oxide layer of its insulating bonding layer 152.

Figure 21A:
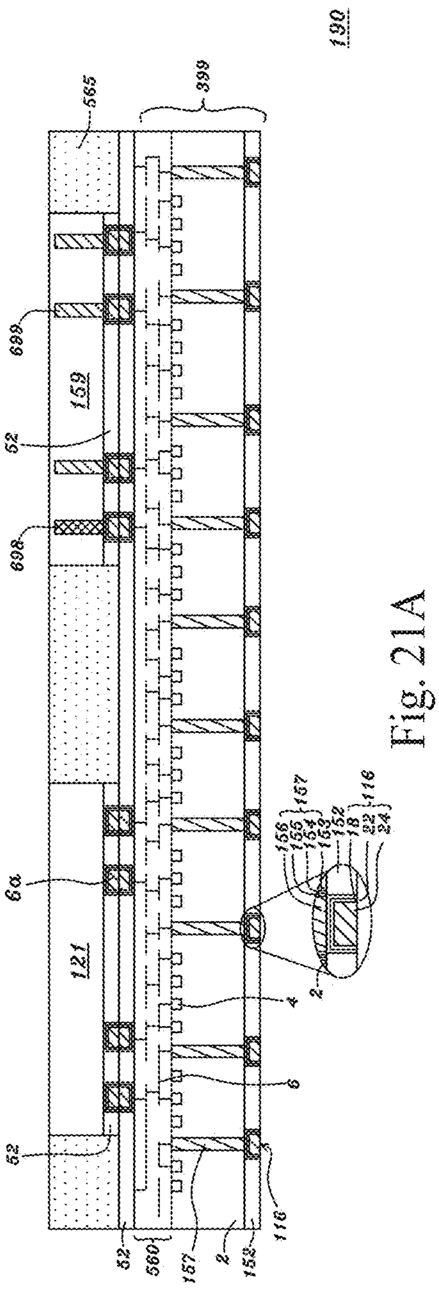
FIGS. 21A and 21B are schematically cross-sectional views showing various second type of operation units in accordance with another embodiment of the present application.
Figure 21B:
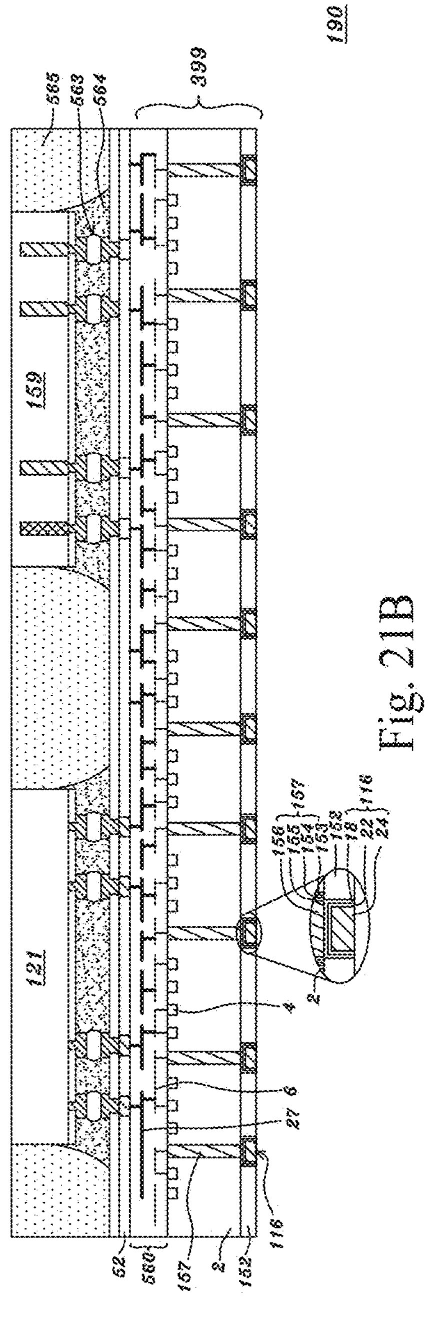

4. Second Type of Operation Unit for First Type of Chip-on-chip (COC) Component or Package FIGS. 21A and 21B are schematically cross-sectional views showing various second type of operation units in accordance with another embodiment of the present application. The second type of operation unit 190 for the first type of chip-on-chip (COC) component or package as seen in FIG. 21A is similar to the first type of operation unit 190 for the first type of chip-on-chip (COC) component or package as illustrated in FIG. 19G, but the difference between the first and second types of operation units 190 for the first type of chip-on-chip (COC) components or packages as seen in FIGS. 19G and 21A is that the second type of operation unit 190 for the first type of chip-on-chip (COC) component or package as seen in FIG. 21A includes (1) an insulating bonding layer 152 on the backside of the semiconductor substrate 2 of its semiconductor integrated-circuit (IC) chip 399 and (2) multiple metal pads 116 each in one of multiple openings in the insulating bonding layer 152 and on the backside of the copper layer 156 of one of the through silicon vias (TSVs) 157 of its semiconductor integrated-circuit (IC) chip 399. The second type of operation unit 190 for the first type of chip-on-chip (COC) component or package as seen in FIG. 21B is similar to the first type of operation unit 190 for the first type of chip-on-chip (COC) component or package as illustrated in FIG. 19H, but the difference between the first and second types of operation units 190 for the first type of chip-on-chip (COC) components or packages as seen in FIGS. 19H and 21B is that the second type of operation unit 190 for the first type of chip-on-chip (COC) component or package as seen in FIG. 21B includes (1) an insulating bonding layer 152 on the backside of the semiconductor substrate 2 of its semiconductor integrated-circuit (IC) chip 399 and (2) multiple metal pads 116 each in one of multiple openings in the insulating bonding layer 152 and on the backside of the copper layer 156 of one of the through silicon vias (TSVs) 157 of its semiconductor integrated-circuit (IC) chip 399.

For each of the second type of operation units 190 for the first type of chip-on-chip (COC) components or packages as seen in FIGS. 21A and 21B, its insulating bonding layer 152 may be a silicon-oxide layer having a thickness between 0.1 and 2 μm. Each of its metal pads 116 may include (1) a copper layer 24 having a thickness of between 3 nm and 500 nm in one of the openings in its insulating bonding layer 152, (2) an adhesion layer 18, such as titanium or titanium nitride having a thickness of between 1 nm and 50 nm, at a top and sidewall of the copper layer 24 of said each of its metal pads 116 and (3) a seed layer 22, such as copper, between the copper layer 24 and adhesion layer 18 of said each of its metal pads 116, wherein the copper layer 24 of said each of its metal pads 116 may have a bottom surface substantially coplanar with a bottom surface of the silicon-oxide layer of its insulating bonding layer 152.

5. Remarks for First and Second Types of Operation Units for First and Second Types of Chip-on-chip (COC) Components or Packages For each of the first and second type of operation units 190 for the second type of chip-on-chip (COC) components or packages as seen in FIGS. 17F and 20A, its semiconductor integrated-circuit (IC) chip 399 may have the semiconductor devices 4 such as transistors at the active surface of the semiconductor substrate 2 thereof as illustrated in FIG. 14D, and the active surface of the semiconductor substrate 2 of its semiconductor integrated-circuit (IC) chip 399 may face an active surface of the semiconductor substrate 2 of each of its known-good memory, logic ASIC chips 121, wherein said each of its known-good memory, logic or ASIC chips 121 may have the semiconductor devices 4 such as transistors at the active surface of the semiconductor substrate 2 thereof as illustrated in FIG. 14E. For each of the first and second type of operation units 190 for the second type of chip-on-chip (COC) components or packages as seen in FIGS. 17G and 20B, its semiconductor integrated-circuit (IC) chip 399 may have the semiconductor devices 4 such as transistors at the active surface of the semiconductor substrate 2 thereof as illustrated in FIG. 14A or 14B, and the active surface of the semiconductor substrate 2 of its semiconductor integrated-circuit (IC) chip 399 may face an active surface of the semiconductor substrate 2 of each of its known-good memory, logic ASIC chips 121, wherein said each of its known-good memory, logic or ASIC chips 121 may have the semiconductor devices 4 such as transistors at the active surface of the semiconductor substrate 2 thereof as illustrated in FIG. 14B. For each of the first and second type of operation units 190 for the first type of chip-on-chip (COC) components or packages as seen in FIGS. 19G and 21A, its semiconductor integrated-circuit (IC) chip 399 may have the semiconductor devices 4 such as transistors at the active surface of the semiconductor substrate 2 thereof as illustrated in FIG. 14E, and the active surface of the semiconductor substrate 2 of its semiconductor integrated-circuit (IC) chip 399 may face an active surface of the semiconductor substrate 2 of each of its known-good memory, logic ASIC chips 121, wherein said each of its known-good memory, logic or ASIC chips 121 may have the semiconductor devices 4 such as transistors at the active surface of the semiconductor substrate 2 thereof as illustrated in FIG. 14D. For each of the first and second type of operation units 190 for the first type of chip-on-chip (COC) components or packages as seen in FIGS. 19H and 21B, its semiconductor integrated-circuit (IC) chip 399 may have the semiconductor devices 4 such as transistors at the active surface of the semiconductor substrate 2 thereof as illustrated in FIG. 14B, and the active surface of the semiconductor substrate 2 of its semiconductor integrated-circuit (IC) chip 399 may face an active surface of the semiconductor substrate 2 of each of its known-good memory, logic ASIC chips 121, wherein said each of its known-good memory, logic or ASIC chips 121 may have the semiconductor devices 4 such as transistors at the active surface of the semiconductor substrate 2 thereof as illustrated in FIG. 14A or 14B. For each of the first and second type of operation units 190 for the first and second types of chip-on-chip (COC) components or packages as seen in FIGS. 17F, 17G, 19G, 19H, 20A, 20B, 21A and 21B, the active surface of the semiconductor substrate 2 of its semiconductor integrated-circuit (IC) chip 399 may face each of its first or second type of memory modules 159. For each of the first and second types of operation units 190 for the first types of chip-on-chip (COC) components or packages as seen in FIGS. 17F and 20A, the active surface of the semiconductor substrate 2 of its semiconductor integrated-circuit (IC) chip 399 may face each of its second type of vertical-through-via (VTV) connectors 467. For each of the first and second types of operation units 190 for the first types of chip-on-chip (COC) components or packages as seen in FIGS. 17G and 20B, the active surface of the semiconductor substrate 2 of its semiconductor integrated-circuit (IC) chip 399 may face each of its first type of vertical-through-via (VTV) connectors 467.

For each of the first and second type of operation units 190 for the first and second types of chip-on-chip (COC) components or packages as seen in FIGS. 17F, 17G, 19G, 19H, 20A, 20B, 21A and 21B, the control chip 688 of each of its first or second type of memory modules 159 may have multiple small I/O circuits coupling respectively to multiple small I/O circuits of its semiconductor integrated-circuit (IC) chip 399 through the bonded metal pads 6*a* of the control chip 688 of said each of its second type of memory modules 159 and the bonded metal pads 6*a* of its semiconductor integrated-circuit (IC) chip 399 as seen in FIG. 17F, 19G, 20A or 21A or through its bonded metal contacts 563 therebetween as seen in FIG. 17G, 19H, 20B or 21B for data transmission therebetween with a data bit width of equal to or greater than 64, 128, 256, 512, 1024, 2048, 4096, 8K, or 16K, wherein each of the small I/O circuits of the control chip 688 of said each of its first or second type of memory modules 159 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively each of the small input/output (I/O) circuits of the control chip 688 of said each of its first or second type of memory modules 159 may have an I/O power efficiency smaller than 0.5 pico-Joules per bit, per switch or per voltage swing, or between 0.01 and 0.5 pico-Joules per bit, per switch or per voltage swing. Each of its known-good memory, logic or ASIC chips 121 may have multiple small I/O circuits coupling respectively to multiple small I/O circuits of its semiconductor integrated-circuit (IC) chip 399 through the bonded metal pads 6*a* of said each of its known-good memory, logic or ASIC chips 121 and the bonded metal pads 6*a* of its semiconductor integrated-circuit (IC) chip 399 as seen in FIG. 17F, 19G, 20A or 21A or through its bonded metal contacts 563 therebetween as seen in FIG. 17G, 19H, 20B or 21B for data transmission therebetween with a data bit width of equal to or greater than 64, 128, 256, 512, 1024, 2048, 4096, 8K, or 16K, wherein each of the small I/O circuits of said each of its known-good memory, logic or ASIC chips 121 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively each of the small input/output (I/O) circuits of said each of its known-good memory, logic or ASIC chips 121 may have an I/O power efficiency smaller than 0.5 pico-Joules per bit, per switch or per voltage swing, or between 0.01 and 0.5 pico-Joules per bit, per switch or per voltage swing. Each of the small I/O circuits of its semiconductor integrated-circuit (IC) chip 399 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively each of the small input/output (I/O) circuits of its semiconductor integrated-circuit (IC) chip 399 may have an I/O power efficiency smaller than 0.5 pico-Joules per bit, per switch or per voltage swing, or between 0.01 and 0.5 pico-Joules per bit, per switch or per voltage swing.

Further, for each of the first and second type of operation units 190 for the first and second types of chip-on-chip (COC) components or packages as seen in FIGS. 17F, 17G, 19G, 19H, 20A, 20B, 21A and 21B, the control chip 688 of one of its first or second type of memory modules 159 or one of its known-good memory, logic or ASIC chips 121 may include multiple non-volatile memory cells configured to store a password or key and a cryptography block or circuit configured (1) to encrypt, in accordance with the password or key, CPM data from the memory cells 490 for the look-up tables (LUT) 210 of the programmable logic cells (LC) 2014 of its semiconductor integrated-circuit (IC) chip 399 or the memory cells 362 of the programmable switch cells 379 of its semiconductor integrated-circuit (IC) chip 399 as encrypted CPM data to be passed to its micro-bumps or micro-pads 197 as seen in FIG. 17F, 17G, 19G or 19H or to its metal pads 116 as seen in FIG. 20A, 20B, 21A or 21B, and (2) to decrypt, in accordance with the password or key, encrypted CPM data from its micro-bumps or micro-pads 197 as seen in FIG. 17F, 17G, 19G or 19H or from its metal pads 116 as seen in FIG. 20A, 20B, 21A or 21B as decrypted CPM data to be passed to the memory cells 490 for the look-up tables (LUT) 210 of the programmable logic cells (LC) 2014 of its semiconductor integrated-circuit (IC) chip 399 or the memory cells 362 of the programmable switch cells 379 of its semiconductor integrated-circuit (IC) chip 399. Further, one of its known-good memory, logic or ASIC chips 121 may include a regulating block configured to regulate a voltage of power supply from an input voltage of 12, 5, 3.3 or 2.5 volts to an output voltage of 3.3, 2.5, 1.8, 1.5, 1.35, 1.2, 1.0, 0.75 or 0.5 volts to be delivered to its semiconductor integrated-circuit (IC) chip 399. Further, one of its known-good memory, logic or ASIC chips 121 may include multiple non-volatile memory cells, such as NAND memory cells, NOR memory cells, RARM cells, MRAM cells, FRAM cells or PCM cells, configured to store CPM data to be passed to the memory cells 490 for the look-up tables (LUT) 210 of the programmable logic cells (LC) 2014 of its semiconductor integrated-circuit (IC) chip 399 for programming or configuring the programmable logic cells (LC) 2014 of its semiconductor integrated-circuit (IC) chip 399 or to the memory cells 362 of the programmable switch cells 379 of its semiconductor integrated-circuit (IC) chip 399 for programming or configuring the programmable switch cells 379 of its semiconductor integrated-circuit (IC) chip 399.

Further, for each of the first and second type of operation units 190 for the second type of chip-on-chip (COC) components or packages as seen in FIGS. 17F, 17G, 20A and 20B, its semiconductor integrated-circuit (IC) chip 399 may have a large input/output (I/O) circuit coupling to one of its micro-bumps or micro-pads 197 as seen in FIG. 17F or 17G or one of its metal pads 116 as seen in FIG. 20A or 20B for signal or clock transmission or power supply (Vcc) or ground reference (Vss) delivery through one of the dedicated vertical bypasses 698 in one of its second type of memory module 159 as illustrated in FIGS. 15B and 15D, one of the through silicon vias (TSVs) 157 of one of its known-good memory, logic ASIC chips 121 or one of the vertical through vias (VTVs) 358 of one of its first or second type of vertical-through-via (VTV) connectors 467, wherein said one of the dedicated vertical bypasses 698 is not connected to any transistor in the memory chips 251 and control chip 688 of said one of its second type of memory module 159 and said one of the through silicon vias (TSVs) 157 may not be connected to any transistor in said one of its known-good memory, logic or ASIC chips 121, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, the large input/output (I/O) circuit may have an I/O power efficiency greater than 3, 5 or 10 pico-Joules per bit, per switch or per voltage swing. One of the vertical interconnects 699 of its first or second type of memory module 159 as illustrated in FIGS. 15A-15D may couple to one of its micro-bumps or micro-pads 197 as seen in FIG. 17F or 17G or to one of its metal pads 116 as seen in FIG. 20A or 20B and couple to its semiconductor integrated-circuit (IC) chip 399 through one of the metal pads 6*a* of the control chip 688 of its first or second type of memory module 159 as seen in FIG. 17F or 20A or through one of its bonded metal contacts 563 as seen in FIG. 17G or 20B.

Further, for each of the first and second type of operation units 190 for the first type of chip-on-chip (COC) components or packages as seen in FIGS. 19G, 19H, 21A and 21B, its semiconductor integrated-circuit (IC) chip 399 may have a large input/output (I/O) circuit coupling to one of its micro-bumps or micro-pads 197 as seen in FIG. 19G or 19H or one of its metal pads 116 as seen in FIG. 21A or 21B for signal or clock transmission or power supply (Vcc) or ground reference (Vss) delivery through one of the through silicon vias (TSVs) 157 of its semiconductor integrated-circuit (IC) chip 399, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, the large input/output (I/O) circuit may have an I/O power efficiency greater than 3, 5 or 10 pico-Joules per bit, per switch or per voltage swing.

Further, for each of the first and second type of operation units 190 for the first and second types of chip-on-chip (COC) components or packages as seen in FIGS. 17F, 17G, 19G, 19H, 20A, 20B, 21A and 21B, each of the memory chips 251 and control chip 688 of each of its first or second type of memory modules 159 and each of its known-good memory, logic or ASIC chips 121 may be implemented using a semiconductor note or generation less advanced than or equal to, or above or equal to 20 nm, 30 nm, 40 nm, 50 nm, 90 nm, 130 nm, 250 nm, 350 nm or 500 nm. The semiconductor technology node or generation used in each of the memory chips 251 and control chip 688 of each of its first or second type of memory modules 159 and each of its known-good memory, logic or ASIC chips 121 may be 1, 2, 3, 4, 5 or greater than 5 nodes or generations older, more matured or less advanced than that used in its semiconductor integrated-circuit (IC) chip 399. Transistors used in each of the memory chips 251 and control chip 688 of each of its first or second type of memory modules 159 and each of its known-good memory, logic or ASIC chips may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory chips 251 and control chip 688 of each of its first or second type of memory modules 159 and each of its known-good memory, logic or ASIC chips 121 may be different from those used in its semiconductor integrated-circuit (IC) chip 399; each of the memory chips 251 and control chip 688 of each of its first or second type of memory modules 159 and each of its known-good memory, logic or ASIC chips 121 may use planar MOSFETs, while its semiconductor integrated-circuit (IC) chip 399 may use fin field effect transistors (FINFETs) or gate-all-around field effect transistors (GAAFETs). A power supply voltage (Vcc) applied in each of the memory chips 251 and control chip 688 of each of its first or second type of memory modules 159 and each of its known-good memory, logic or ASIC chips 121 may be greater than or equal to 1.5, 2.0, 2.5, 3, 3.3, 4, or 5 voltages, while a power supply voltage (Vcc) applied in its semiconductor integrated-circuit (IC) chip 399 may be smaller than or equal to 1.8, 1.5 or 1 voltage. The power supply voltage applied in each of the memory chips 251 and control chip 688 of each of its first or second type of memory modules 159 and each of its known-good memory, logic or ASIC chips 121 may be higher than that applied in its semiconductor integrated-circuit (IC) chip 399. A gate oxide of a field effect transistor (FET) of each of the memory chips 251 and control chip 688 of each of its first or second type of memory modules 159 and a gate oxide of a field effect transistor (FET) of each of its known-good memory, logic or ASIC chips 121 may have a physical thickness greater than or equal to 5 nm, 6 nm, 7.5 nm, 10 nm, 12.5 nm, or 15 nm, while a gate oxide of afield effect transistor (FET) of its semiconductor integrated-circuit (IC) chip 399 may have a physical thickness less than 4.5 nm, 4 nm, 3 nm or 2 nm. The thickness of the gate oxide of the field effect transistor (FET) of each of the memory chips 251 and control chip 688 of each of its first or second type of memory module 159 and the thickness of the gate oxide of the field effect transistor (FET) of each of its known-good memory, logic or ASIC chips 121 may be greater than that of its semiconductor integrated-circuit (IC) chip 399.

First Embodiment for Chip Package Based on Frontside Interconnection Scheme for Logic Drive or Device (FISD)

1. First Type of Chip Package for First Embodiment

Figure 22A:
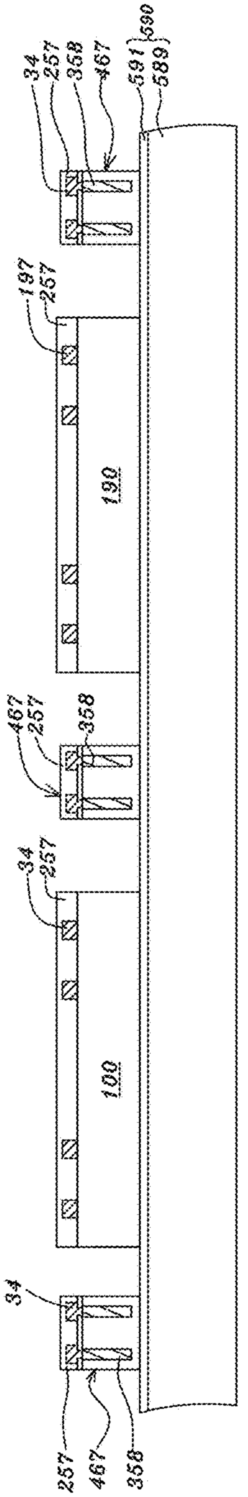
FIGS. 22A-22H are schematically cross-sectional views showing a process for forming a first type of multichip package in accordance with a first embodiment of the present application.

FIGS. 22A-22H are schematically cross-sectional views showing a process for forming a first type of multichip package in accordance with a first embodiment of the present application. Referring to FIG. 22A, a temporary substrate 590 may be provided with a glass or silicon substrate 589 and a sacrificial bonding layer 591 formed on the glass or silicon substrate 589. The sacrificial bonding layer 591 may have the glass or silicon substrate 589 to be easily debonded or released from a structure subsequently formed on the sacrificial bonding layer 591. For example, the sacrificial bonding layer 591 may be a material of light-to-heat conversion (LTHC) that may be deposited on the glass or silicon substrate 589 by printing or spin-on coating and then cured or dried with a thickness of about 1 micrometer or between 0.5 and 2 micrometers. The LTHC material may be a liquid ink containing carbon black and binder in a mixture of solvents.

Next, referring to FIG. 22A, multiple semiconductor integrated-circuit (IC) chips 100, each of which may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip, each may have the same specification as illustrated in FIG. 14A or 14B, provided with the first type of micro-bumps or micro-pads 34. Each of the semiconductor integrated-circuit (IC) chips 100 may further include an insulating dielectric layer 257, such as polymer layer, over its first and/or second interconnection scheme(s) 560 and/or 588, covering a top surface and sidewall of the copper layer 32 of each of its first type of micro-bumps or micro-pads 34, wherein the insulating dielectric layer 257 may be, for example, polyimide, BenzoCycloButene (BCB), parylene, polybenzoxazole (PBO), epoxy-based material or compound, photo epoxy SU-8, elastomer, or silicone; the insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan. Each of the semiconductor integrated-circuit (IC) chips 100 may have a backside attached to the sacrificial bonding layer 591 of the temporary substrate 590.

Further, referring to FIG. 22A, multiple first type of operation units 190, each of which may have the same specification as illustrated in FIG. 17F, 17G, 19G or 19H, each may be provided with the first type of micro-bumps or micro-pads 197. Each of the semiconductor integrated-circuit (IC) chips 100 may further include an insulating dielectric layer 257, such as polymer layer, on its insulating dielectric layer 93, covering a top surface and sidewall of the copper layer 32 of its first type of micro-bumps or micro-pads 197, wherein the insulating dielectric layer 257 may be, for example, polyimide, BenzoCycloButene (BCB), parylene, polybenzoxazole (PBO), epoxy-based material or compound, photo epoxy SU-8, elastomer, or silicone; the insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan. Each of the first type of operation units 190 may have a backside attached to the sacrificial bonding layer 591 of the temporary substrate 590.

Further, referring to FIG. 22A, multiple first type of vertical-through-via (VTV) connectors 467, each of which may have the same specification as illustrated in FIG. 1A, 1C, 1E, 2A, 2C or 2E, each may be provided with the first type of micro-bumps or micro-pads 34. Alternatively, each of the first type of vertical-through-via (VTV) connectors 467 may have the same specification as illustrated in FIG. 4A, 4B, 4C, 5A, 5B or 5C, but its fifth type of micro-bumps or micro-pads 34 is replaced with the first type of micro-bumps or micro-pads 34 as illustrated in FIG. 1A. Alternatively, each of the first type of vertical-through-via (VTV) connectors 467 may have the same specification as illustrated in FIG. 6, but its sixth type of micro-bumps or micro-pads 34 is replaced with the first type of micro-bumps or micro-pads 34 as illustrated in FIG. 1A. Each of the first type of vertical-through-via (VTV) connectors 467 may further include an insulating dielectric layer 257, such as polymer, at a top thereof, covering a top surface and sidewall of the copper layer 32 of its first type of micro-bumps or micro-pads 34, wherein the insulating dielectric layer 257 may be, for example, polyimide, BenzoCycloButene (BCB), parylene, polybenzoxazole (PBO), epoxy-based material or compound, photo epoxy SU-8, elastomer, or silicone; the insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan. Each of the first type of vertical-through-via (VTV) connectors 467 may have a backside attached to the sacrificial bonding layer 591 of the temporary substrate 590.

Next, referring to FIG. 22A, a polymer layer 92, e.g., resin or compound, may be applied to fill a gap between each neighboring two of the semiconductor integrated-circuit (IC) chips 100, first type of operation units 190 and first type of vertical-through-via (VTV) connectors 467 and to cover the insulating dielectric layer 257 of each of the semiconductor integrated-circuit (IC) chips 100, first type of operation units 190 and first type of vertical-through-via (VTV) connectors 467 by methods, for example, spin-on coating, screen-printing, dispensing or molding. The polymer layer 92 may be, for example, polyimide, BenzoCycloButene (BCB), parylene, polybenzoxazole (PBO), epoxy-based material or compound, photo epoxy SU-8, elastomer, or silicone. The polymer layer 92 may be, for example, photosensitive polyimide/PBO PIMEL™ supplied by Asahi Kasei Corporation, Japan, or epoxy-based molding compounds, resins or sealants provided by Nagase ChemteX Corporation, Japan. The polymer layer 92 may be cured or cross-linked at a temperature higher than or equal to 50, 70, 90, 100, 125, 150, 175, 200, 225, 250, 275 or 300 degrees Celsius.

Figure 22B:
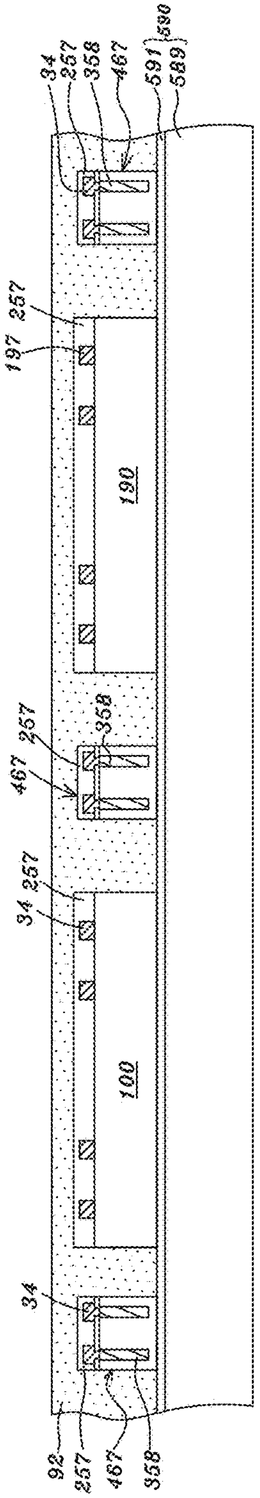
Figure 22C:
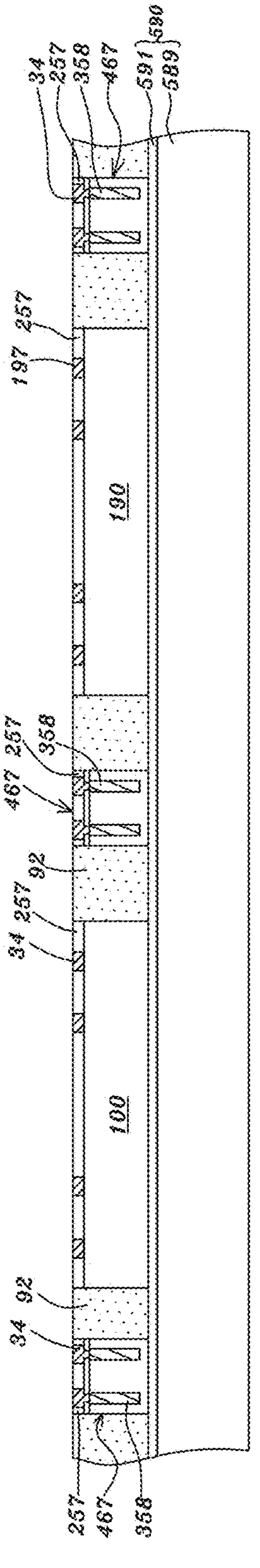

Next, referring to FIG. 22C, a chemical mechanical polishing (CMP), polishing or grinding process may be applied to remove a top portion of the polymer layer 92 and a top portion of the insulating dielectric layer 257 each of the semiconductor integrated-circuit (IC) chips 100, first type of operation units 190 and first type of vertical-through-via (VTV) connectors 467 and to planarize a top surface of the polymer layer 92, a top surface of the copper layer 32 of each of the first type of micro-bumps or micro-pads 34 of each of the semiconductor integrated-circuit (IC) chips 100, a top surface of the copper layer 32 of each of the first type of micro-bumps or micro-pads 197 of each of the first type of operation units 190 and a top surface of the copper layer 32 of each of the first type of micro-bumps or micro-pads 34 of each of the first type of vertical-through-via (VTV) connectors 467. Thereby, the top surface of the copper layer 32 of each of the first type of micro-bumps or micro-pads 34 of each of the semiconductor integrated-circuit (IC) chips 100, the top surface of the copper layer 32 of each of the first type of micro-bumps or micro-pads 197 of each of the first type of operation units 190 and the top surface of the copper layer 32 of each of the first type of micro-bumps or micro-pads 34 of each of the first type of vertical-through-via (VTV) connectors 467 may be exposed.

Figure 22D:
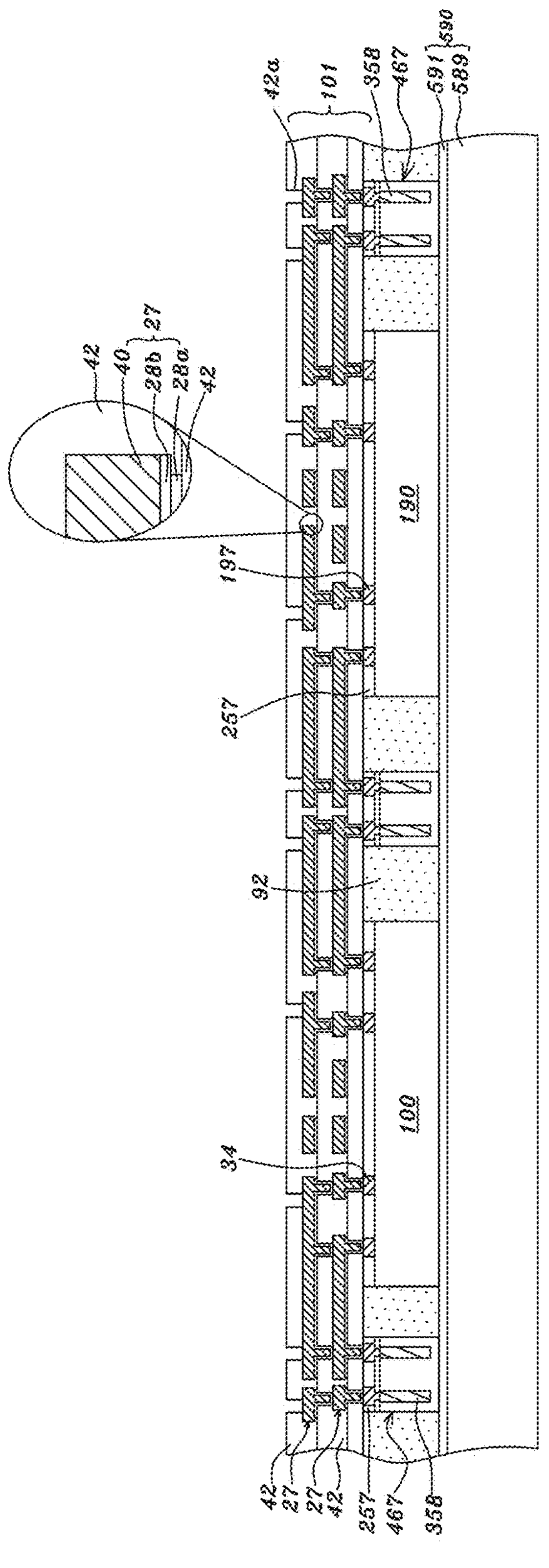

Referring to FIG. 22D, a frontside interconnection scheme for a logic drive or device (FISD) 101 may be formed on the polymer layer 92 and over the semiconductor integrated-circuit (IC) chips 100, first type of operation units 190 and first type of vertical-through-via (VTV) connectors 467. The frontside interconnection scheme for a logic drive or device (FISD) 101 may include one or more interconnection metal layers 27 coupling to the first type of micro-bumps or micro-pads 34 of each of the semiconductor integrated-circuit (IC) chips 100, the first type of micro-bumps or micro-pads 197 of each of the first type of operation units 190 and the first type of micro-bumps or micro-pads 34 of each of the first type of vertical-through-via (VTV) connectors 467, and one or more polymer layers 42, i.e., insulating dielectric layers, each between neighboring two of its interconnection metal layers 27, between a bottommost one of its interconnection metal layers 27 and a polished planar surface composed of the top surface of the polymer layer 92, the top surface of the copper layer 32 of each of the first type of micro-bumps or micro-pads 34 of each of the semiconductor integrated-circuit (IC) chips 100, the top surface of the copper layer 32 of each of the first type of micro-bumps or micro-pads 197 of each of the first type of operation units 190 and the top surface of the copper layer 32 of each of the first type of micro-bumps or micro-pads 34 of each of the first type of vertical-through-via (VTV) connectors 467, or on and above a topmost one of its interconnection metal layers 27, wherein the topmost one of its interconnection metal layers 27 may have multiple metal pads at bottoms of multiple openings 42*a* in the topmost one of its polymer layers 42. Each of the interconnection metal layers 27 may include (1) a copper layer 40 having lower portions in openings in one of the polymer layers 42 having a thickness of between 0.3 μm and 20 μm and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. For the frontside interconnection scheme for a logic drive or device (FISD) 101, each of its interconnection metal layers 27 may have a metal line or trace with a thickness between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm and a width between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm. Each of its polymer layer 42 may be a layer of polyimide, BenzoCycloButene (BCB), parylene, polybenzoxazole (PBO), epoxy-based material or compound, photo epoxy SU-8, elastomer or silicone, having a thickness between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. One of its interconnection metal layers 27 may have two planes used respectively for power and ground planes of a power supply and/or used as a heat dissipater or spreader for the heat dissipation or spreading, wherein each of the two planes may have a thickness, for example, between 5 μm and 50 μm, 5 μm and 30 μm, 5 μm and 20 μm, or 5 μm and 15 μm, or greater than or equal to 5 μm, 10 μm, 20 μm, or 30 μm. The two planes may be layout as interlaced or interleaved shaped structures in a plane or may be layout in a fork shape. For the frontside interconnection scheme for a logic drive or device (FISD) 101, each of its interconnection metal layers 27 may extend horizontally across an edge of each of the semiconductor integrated-circuit (IC) chips 100, first type of operation units 190 and first type of vertical-through-via (VTV) connectors 467. The topmost one of its interconnection metal layers 27 may be patterned with multiple metal pads at bottoms of multiple respective openings in the topmost one of its polymer layers 42.

Figure 22E:
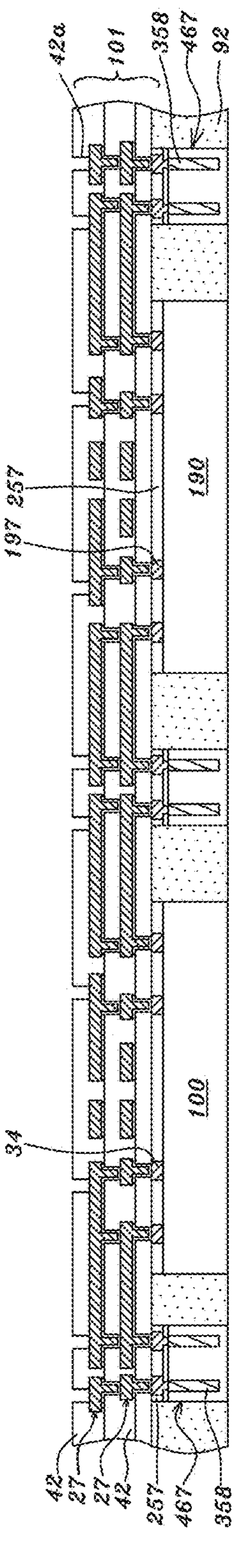

Next, the glass or silicon substrate 589 as seen in FIG. 22D may be released from the sacrificial bonding layer 591. For example, in the case that the sacrificial bonding layer 591 is the material of light-to-heat conversion (LTHC) and the substrate 589 is made of glass, a laser light, such as YAG laser having a wavelength of about 1064 nm, an output power between 20 and 50 W and a spot size of 0.3 mm in diameter at a focal point, may be generated to pass from the backside of the glass substrate 589 to the sacrificial bonding layer 591 through the glass substrate 589 to scan the sacrificial bonding layer 591 at a speed of 8.0 m/s, for example, such that the sacrificial bonding layer 591 may be decomposed and thus the glass substrate 589 may be easily released from the sacrificial bonding layer 591. Next, an adhesive peeling tape (not shown) may be attached to a bottom surface of the remainder of the sacrificial bonding layer 591. Next, the adhesive peeling tape may be peeled off to pull the remainder of the sacrificial bonding layer 591 attached to the adhesive peeling tape off such that the backside of each of the semiconductor integrated-circuit (IC) chips 100, the backside of each of the first type of operation units 190, the backside of each of the first type of vertical-through-via (VTV) connectors 467 and a bottom surface of the polymer layer 92 may be exposed as seen in FIG. 22E.

Figure 22F:
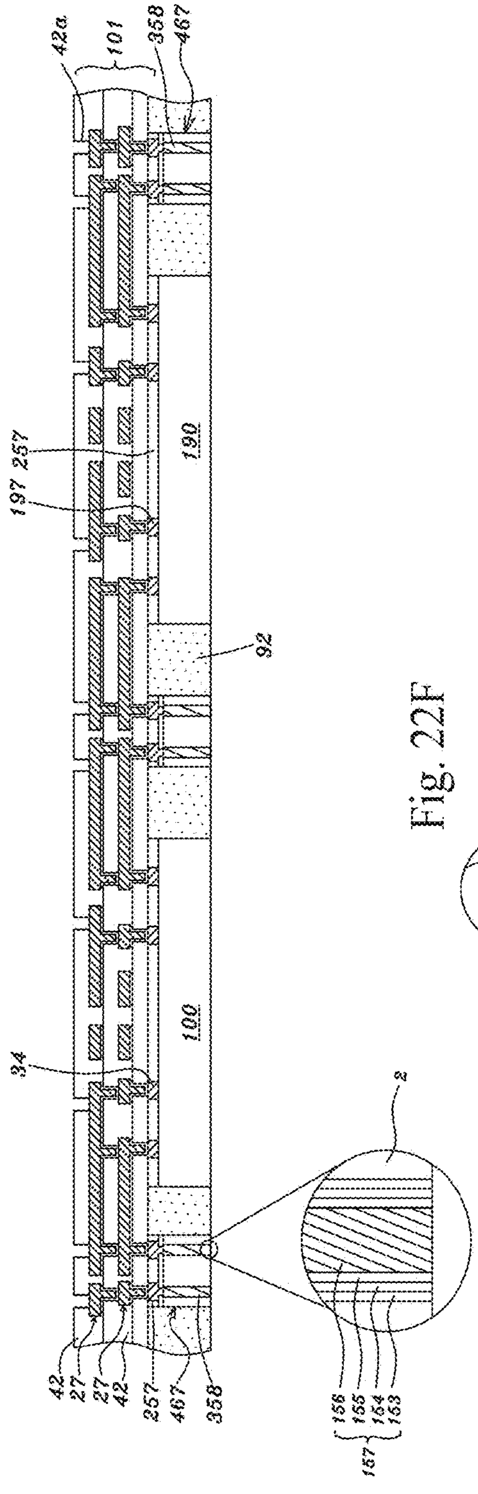

Next, referring to FIG. 22F, a chemical mechanical polishing (CMP), polishing or grinding process may be applied to remove a bottom portion of the polymer layer 92, a bottom portion of each of the semiconductor integrated-circuit (IC) chips 100, a bottom portion of each of the first type of operation units 190 and a bottom portion of each of the first type of vertical-through-via (VTV) connectors 467 and to expose a backside of each of the vertical through vias (VTVs) 358 of each of the first type of vertical-through-via (VTV) connectors 467. For each of the vertical through vias (VTVs) 358 of said each of the first type of vertical-through-via (VTV) connectors 467, if made of one or more of the through silicon vias (TSVs) 157 as illustrated in one of FIGS. 1A, 1C, 1E, 2A, 2C and 2F, its insulating lining layer 153, adhesion layer 154 and seed layer 155 at its backside may be removed to expose a backside of its copper layer 156, which is coplanar with a backside of said each of the first type of vertical-through-via (VTV) connectors 467 and a bottom surface of the polymer layer 92, and its insulating lining layer 153, adhesion layer 154 and seed layer 155 at a sidewall of its copper layer 156 may be left. For each of the vertical through vias (VTVs) 358 of said each of the first type of vertical-through-via (VTV) connectors 467, if made of one or more of the through glass vias (TGVs) 259 as illustrated in one of FIGS. 4A, 4B, 4C, 5A, 5B and 5C, a backside of its copper post 706 may be exposed with being coplanar with a backside of said each of the first type of vertical-through-via (VTV) connectors 467 and the bottom surface of the polymer layer 92; for each of the vertical through vias (VTVs) 358 of said each of the first type of vertical-through-via (VTV) connectors 467, if made of one or more of the through polymer vias (TPVs) 318 as illustrated in FIG. 6 for the fifth alternative, a backside of its metal pad 336 or copper post 318 may be exposed with being coplanar with a backside of said each of the first type of vertical-through-via (VTV) connectors 467 and the bottom surface of the polymer layer 92.

Figure 22G:
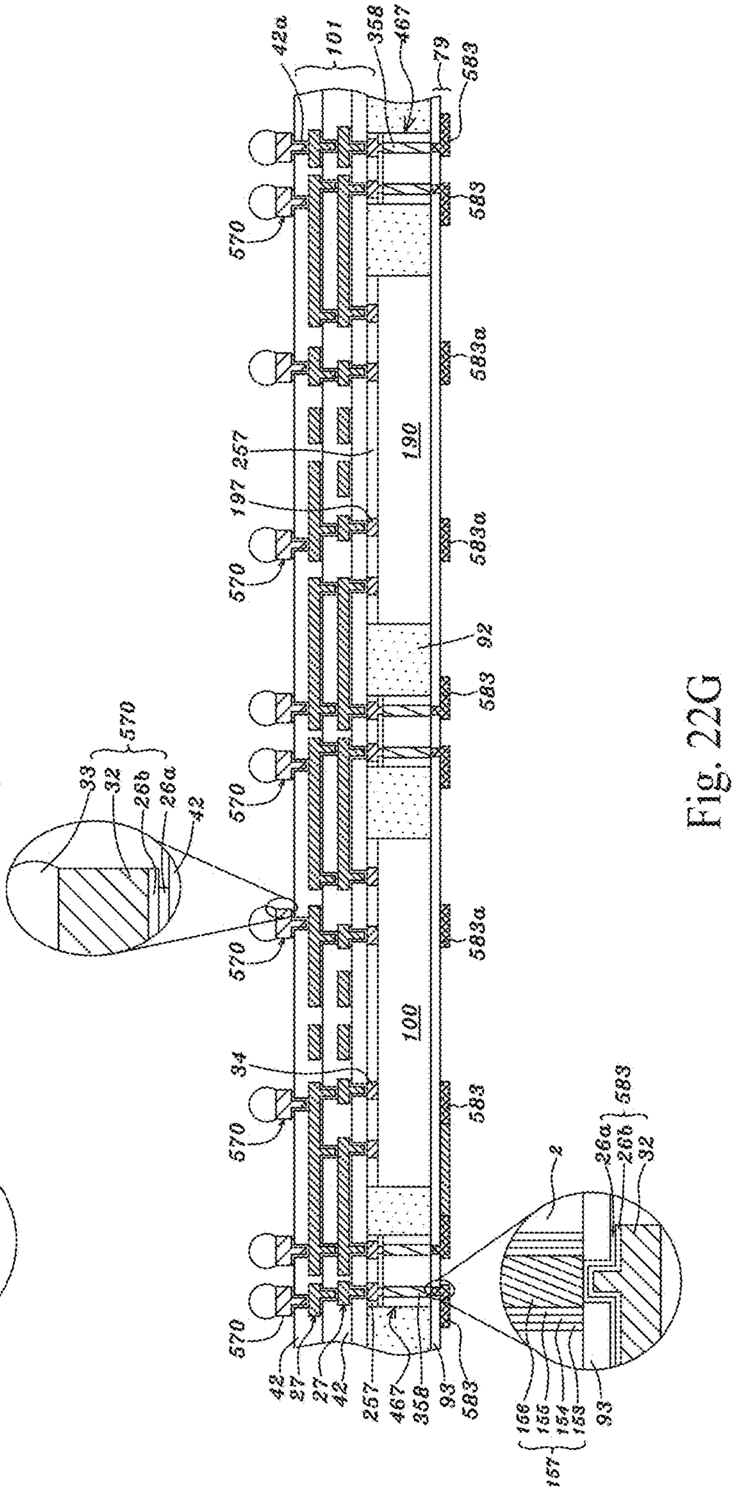

Next, referring to FIG. 22G, a backside interconnection scheme for a logic drive or device (BISD) 79 may be formed on the backside of each of the semiconductor integrated-circuit (IC) chips 100, the backside of each of the first type of operation units 190, the backside of each of the first type of vertical-through-via (VTV) connectors 467 and the bottom surface of the polymer layer 92. The backside interconnection scheme for a logic drive or device (BISD) 79 may include an insulating dielectric layer 93 on the backside of each of the semiconductor integrated-circuit (IC) chips 100, the backside of each of the first type of operation units 190, the backside of each of the first type of vertical-through-via (VTV) connectors 467 and the bottom surface of the polymer layer 92. Each opening in the insulating dielectric layer 93 may be vertically under the backside of one of the vertical through vias (VTVs) 358 of one of the first type of vertical-through-via (VTV) connectors 467. The insulating dielectric layer 93 may be a layer of polymer, such as polyimide, BenzoCycloButene (BCB), parylene, polybenzoxazole (PBO), epoxy-based material or compound, photo epoxy SU-8, elastomer or silicone, having a thickness between 3 and 30 micrometers or between 5 and 15 micrometers. For said one of the first type of vertical-through-via (VTV) connectors 467, if said one of its vertical through vias (VTVs) 358 is made of one or more of the through silicon vias (TSVs) 157 as illustrated in one of FIGS. 1A, 1C, 1E, 2A, 2C and 2E, said each opening in the insulating dielectric layer 93 may be vertically under the backside of the copper layer 156 of said one or more of its through silicon vias (TSVs) 157. For said one of the first type of vertical-through-via (VTV) connectors 467, if said one of its vertical through vias (VTVs) 358 is made of one or more of the through glass vias (TGVs) 259 as illustrated in one of FIGS. 4A, 4B, 4C, 5A, 5B and 5C, said each opening in the insulating dielectric layer 93 may be vertically under the backside of the copper post 706 of said one or more of its through glass vias (TGVs) 259. For said one of the first type of vertical-through-via (VTV) connectors 467, if said one of its vertical through vias (VTVs) 358 is made of one of the through polymer vias (TPVs) as illustrated in FIG. 6, said each opening in the insulating dielectric layer 93 may be vertically under the backside of the metal pad 336 or copper post 318 of said one of its through polymer vias (TPVs). The backside interconnection scheme for a logic drive or device (BISD) 79 may further include an interconnection metal layer on a bottom surface of its insulating dielectric layer 93, coupling to each of the vertical through vias (VTVs) 358 of each of the first type of vertical-through-via (VTV) connectors 467 through one of the opening in its insulating dielectric layer 93. The interconnection metal layer of the backside interconnection scheme for a logic drive or device (BISD) 79 is patterned with multiple metal pads 583, i.e., metal contacts, each formed on the backside of one of the vertical through vias (VTVs) 358 of one of the first type of vertical-through-via (VTV) connectors 467 or formed on the bottom surface of the insulating dielectric layer 93 and vertically under the backside of one of the semiconductor integrated-circuit (IC) chips 100, the backside of one of the first type of operation units 190, the backside of one of the first type of vertical-through-via (VTV) connectors 467 or the bottom surface of the polymer layer 92. Each of the metal pads 583 may be of various types. A first type of metal pad 583 may include (1) an adhesion layer 26*a*, such as titanium (Ti) or titanium nitride (TiN) layer having a thickness between 1 nm and 50 nm, on the backside of the copper layer 156 of one of the through silicon vias (TSVs) 157 for one of the vertical through vias (VTVs) 358 of one of the first type of vertical-through-via (VTV) connectors 467 as illustrated in one of FIGS. 1A, 1C, 1E, 2A, 2C and 2E, the backside of the copper post 706 of one of the through glass vias (TGVs) 259 for one of the vertical through vias (VTVs) 358 of one of the first type of vertical-through-via (VTV) connectors 467 as illustrated in one of FIGS. 4A, 4B, 4C, 5A, 5B and 5C or the backside of the metal pad 336 or copper post 318 of one of the through polymer vias (TPVs) for one of the vertical through vias (VTVs) 358 of one of the first type of vertical-through-via (VTV) connectors 467 as illustrated in FIG. 6 or on the bottom surface of the insulating dielectric layer 93, (2) a seed layer 26*b*, such as copper, on its adhesion layer 26*a*, and (3) a copper layer 32, i.e., copper pad, having a thickness between 1 μm and 60 μm on its seed layer 26*b*. Alternatively, a second type of metal pad 583 may include the adhesion layer 26*a*, seed layer 26*b* and copper layer 32 as mentioned above, and may further include a nickel layer, i.e., nickel pad, having a thickness between 0.5 μm and 10 μm on its copper layer 32. Alternatively, a tin-containing solder bump made of tin or a tin-silver alloy having a thickness between 1 μm and 50 μm may be formed on the copper layer 32 of each of the first type of metal pads 583 or the nickel layer of each of the second type of metal pads 583.

Next, referring to FIG. 22G, multiple metal bumps, pillars or pads 570, i.e., metal contacts, may be formed in an array on the metal pads of the topmost one of the interconnection metal layers 27 of the frontside interconnection scheme for a logic drive or device (FISD) 101 at the bottoms of the respective openings 42*a* in the topmost one of the polymer layers 42 of the frontside interconnection scheme for a logic drive or device (FISD) 101. Each of the metal bumps, pillars or pads 570 may be of various types. A first type of bump, pillar or pad 570 may include (1) an adhesion layer 26*a*, such as titanium (Ti) or titanium nitride (TiN) layer having a thickness between 1 nm and 50 nm, on the topmost one of the interconnection metal layers 27 of the frontside interconnection scheme for a logic drive or device (FISD) 101, (2) a seed layer 26*b*, such as copper, on its adhesion layer 26*a* and (3) a copper layer 32, i.e., copper pad, having a thickness between 1 μm and 60 μm on its seed layer 26*b*. Alternatively, a second type of metal bump, pillar or pad 570 may include the adhesion layer 26*a*, seed layer 26*b* and copper layer 32 as mentioned above, and may further include a tin-containing solder cap 33, i.e., solder bump, made of tin or a tin-silver alloy having a thickness between 1 μm and 50 μm on its copper layer 32. Alternatively, a third type of metal bump, pillar or pad 570 may include a gold layer, i.e., gold bump, having a thickness between 3 and 15 micrometers over the topmost one of the interconnection metal layers 27 of the frontside interconnection scheme for a logic drive or device (FISD) 101.

Figure 22H:
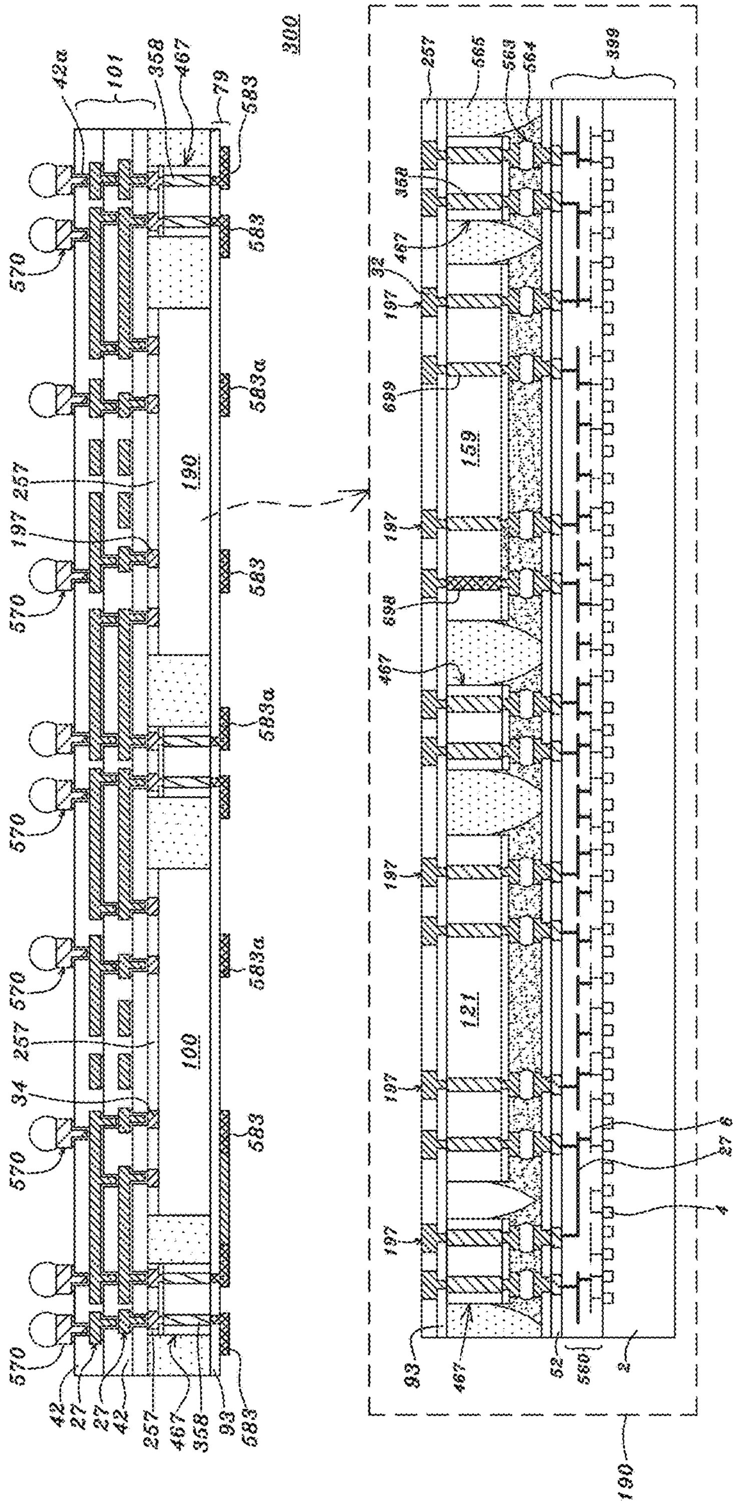

Next, referring to FIG. 22G, the polymer layers 42 of the frontside interconnection scheme for a logic drive or device (FISD) 101, the polymer layer 92 and the insulating dielectric layer 93 may be cut or diced to separate multiple individual chip packages 300 as shown in FIG. 22H each for the standard commodity logic drive as illustrated in FIG. 12A by a laser cutting process or by a mechanical cutting process. For the chip package 300 as seen in FIG. 22H, one or more of the interconnection metal layers 27 of its frontside interconnection scheme for a logic drive or device (FISD) 101 may couples each of its semiconductor integrated-circuit (IC) chips 100, first type of operation units 190 and first type of vertical-through-via (VTV) connectors 467 to the other of its semiconductor integrated-circuit (IC) chips 100, first type of operation units 190 and first type of vertical-through-via (VTV) connectors 467. Each of its semiconductor integrated-circuit (IC) chips 100 and first type of operation units 190 may couple to one of its metal pads 583 through, in sequence, one or more of the interconnection metal layers 27 of its frontside interconnection scheme for a logic drive or device (FISD) 101 and one of the vertical through vias (VTV) 358 of one of its first type of vertical-through-via (VTV) connectors 467 for delivery of a voltage of power supply (Vcc), a voltage of ground reference (Vss), clock signals (CLK) or other signals to said each of its semiconductor integrated-circuit (IC) chips 100, first type of operation units 190 and first type of vertical-through-via (VTV) connectors 467. Each of its semiconductor integrated-circuit (IC) chips 100, first type of operation units 190 and first type of vertical-through-via (VTV) connectors 467 may couple to one or more of its metal bumps, pillars or pads 570 through each of the interconnection metal layers 27 of its frontside interconnection scheme for a logic drive or device (FISD) 101 for delivery of a voltage of power supply (Vcc), a voltage of ground reference (Vss), clock signals (CLK) or other signals to said each of its semiconductor integrated-circuit (IC) chips 100, first type of operation units 190 and first type of vertical-through-via (VTV) connectors 467. One of its metal bumps, pillars or pads 570 vertically over each of its semiconductor integrated-circuit (IC) chips 100 and first type of operation units 190 may couple to one of its metal pads 583 vertically under said each of its semiconductor integrated-circuit (IC) chips 100 and first type of operation units 190 through, in sequence, each of the interconnection metal layers 27 of its frontside interconnection scheme for a logic drive or device (FISD) 101, one of the vertical through vias (VTVs) 358 of one of its first type of vertical-through-via (VTV) connectors 467 and the interconnection metal layer of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Each of its metal bumps, pillars or pads 570 having a number of more than 50 may be vertically aligned with one of its metal pads 583 having a number of more than 50. Each of the vertical through vias (VTVs) 358 of each of its first type of vertical-through-via (VTV) connectors 467 may have a depth, for example, between 30 μm and 2,000 μm.

For the chip package 300 as seen in FIG. 22H, its metal pads 583 arranged in an array may include multiple dummy pads 583*a* each not connecting to any of its semiconductor integrated-circuit (IC) chips 100 and first type of operation units 190 but having mechanical functions for subsequent package-on-package (POP) assembly, formed on the bottom surface of its insulating dielectric layer 93 and vertically under one of its semiconductor integrated-circuit (IC) chips 100, first type of operation units 190 and polymer layer 92. Each of its dummy pads 583*a* may have no connection to any of the vertical through vias (VTVs) 358 of any of its first type of vertical-through-via (VTV) connectors 467.

Figure 22I:
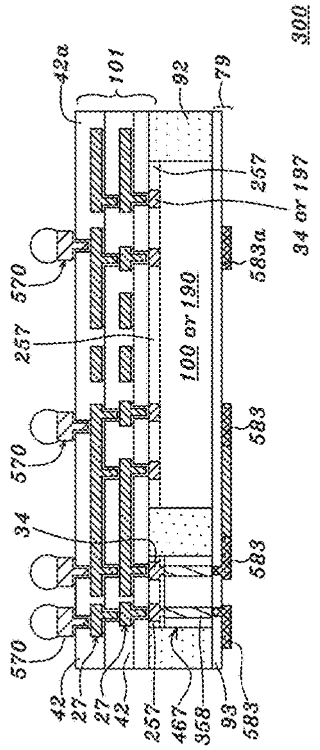
FIG. 22I is a schematically cross-sectional view showing a first type of single-chip/unit package in accordance with a first embodiment of the present application.

Alternatively, FIG. 22I is a schematically cross-sectional view showing a first type of single-chip/unit package in accordance with a first embodiment of the present application. The chip package 300 as seen in FIG. 22I may have a similar structure to that as illustrated in FIG. 22H. For an element indicated by the same reference number shown in FIGS. 22H and 22I, the specification of the element as seen in FIG. 22I may be referred to that of the element as illustrated in FIG. 22H. The difference between the chip packages as illustrated in FIGS. 22H and 22I is that the chip package as seen in FIG. 22I includes only one semiconductor integrated-circuit (IC) chip 100 or first type of operation unit 190 having the same specification as illustrated in FIG. 22A and one or more first type of vertical-through-via (VTV) connectors 467 having the same specification as illustrated in FIG. 22A. For the single-chip/unit package 300 as seen in FIG. 22I, its only one semiconductor integrated-circuit (IC) chip 100 or first type of operation unit 190 may couple to one of its metal pads 583 through, in sequence, one or more of the interconnection metal layers 27 of its frontside interconnection scheme for a logic drive or device (FISD) 101 and one of the vertical through vias (VTVs) 358 of one of its first type of vertical-through-via (VTV) connectors 467 for delivery of a voltage of power supply (Vcc), a voltage of ground reference (Vss), clock signals (CLK) or other signals to its only one semiconductor integrated-circuit (IC) chip 100 or first type of operation unit 190. Each of its only one semiconductor integrated-circuit (IC) chip 100 or first type of operation unit 190 and its first type of vertical-through-via (VTV) connectors 467 may couple to one or more of its metal bumps, pillars or pads 570 through each of the interconnection metal layers 27 of its frontside interconnection scheme for delivery of a voltage of power supply (Vcc), a voltage of ground reference (Vss), clock signals (CLK) or other signals to its only one semiconductor integrated-circuit (IC) chip 100 or first type of operation unit 190. One of its metal bumps, pillars or pads 570 vertically over its only one semiconductor integrated-circuit (IC) chip 100 or first type of operation unit 190 may couple to one of its metal pads 583 vertically under its only one semiconductor integrated-circuit (IC) chip 100 or first type of operation unit 190 through, in sequence, each of the interconnection metal layers 27 of its frontside interconnection scheme for a logic drive or device (FISD) 101, one of the vertical through vias (VTVs) 358 of one of its first type of vertical-through-via (VTV) connectors 467 and the interconnection metal layer of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. For example, its more than twenty first metal contacts, i.e., metal bumps, pillars or pads 570, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first type of vertical-through-via (VTV) connector(s) 467 may have a depth, for example, between 30 μm and 2,000 μm.

2. Second Type of Chip Package for First Embodiment

Figure 23A:
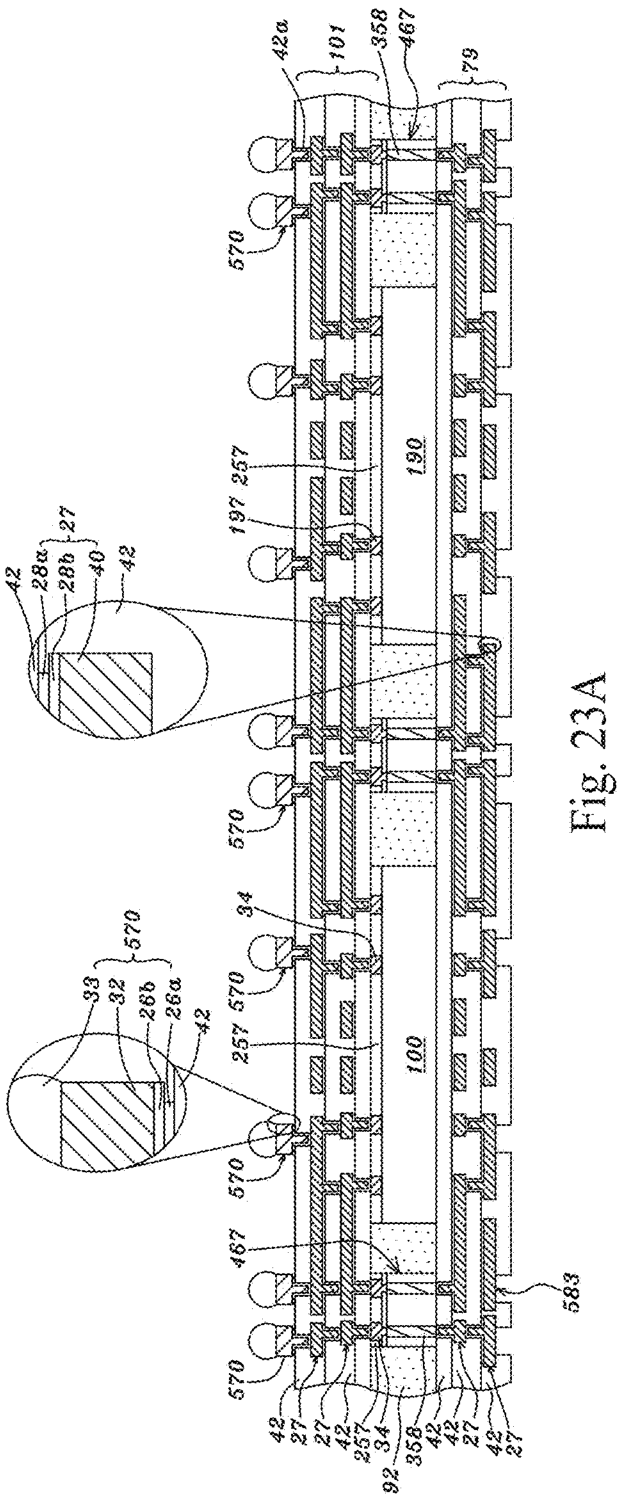
FIGS. 23A and 23B are schematically cross-sectional views showing a process for forming a second type of multichip package in accordance with a first embodiment of the present application.
Figure 23B:
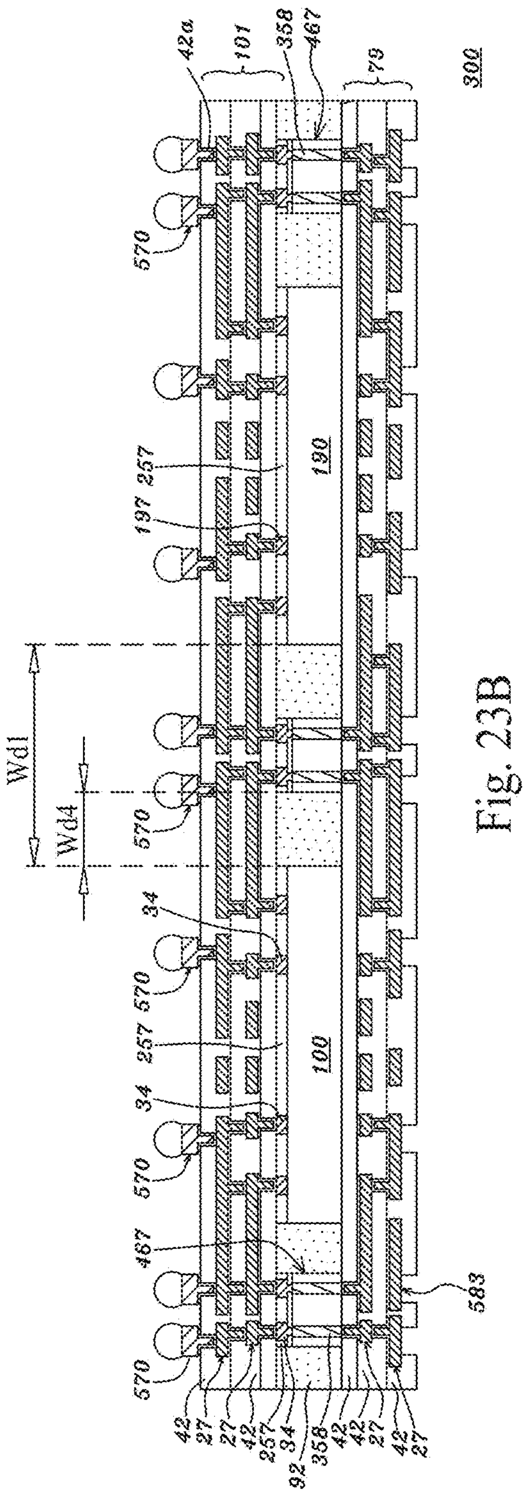

FIGS. 23A and 23B are schematically cross-sectional views showing a process for forming a second type of multichip package in accordance with a first embodiment of the present application. For an element indicated by the same reference number shown in FIGS. 22A-22H, 23A and 23B, the specification of the element as seen in FIG. 23A or 23B may be referred to that of the element as illustrated in FIGS. 22A-22H. After the structure as seen in FIG. 22F is formed, a backside interconnection scheme for a logic drive or device (BISD) 79 may be formed on the backside of each of the semiconductor integrated-circuit (IC) chips 100, the backside of each of the first type of operation units 190, the backside of each of the first type of vertical-through-via (VTV) connectors 467 and the bottom surface of the polymer layer 92. The backside interconnection scheme for a logic drive or device (BISD) 79 may include one or more interconnection metal layers 27 coupling to each of the vertical through vias (VTVs) 358 of each of the first type of vertical-through-via (VTV) connectors 467 and one or more polymer layers 42, i.e., insulating dielectric layers, each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The topmost one of its polymer layers 42 may be between the topmost one of its interconnection metal layers 27 and the backside of each of the semiconductor integrated-circuit (IC) chips 100, between the topmost one of its interconnection metal layers 27 and the backside of each of the first type of operation units 190, between the topmost one of its interconnection metal layers 27 and the backside of each of the first type of vertical-through-via (VTV) connectors 467 and between the topmost one of its interconnection metal layers 27 and the bottom surface of the polymer layer 92, wherein each opening in the topmost one of its polymer layers 42 may be vertically under the backside of one of the vertical through vias (VTVs) 358 of one of the first type of vertical-through-via (VTV) connectors 467. For the backside interconnection scheme for a logic drive or device (BISD) 79, each of its interconnection metal layers 27 may extend horizontally across an edge of each of the semiconductor integrated-circuit (IC) chips 100, first type of operation units 190 and first type of vertical-through-via (VTV) connectors 467. The bottommost one of its interconnection metal layers 27 may be patterned with multiple metal pads 583 aligned with multiple respective openings in the bottommost one of its polymer layers 42.

Referring to FIG. 23A, for the backside interconnection scheme for a logic drive or device (BISD) 79, each of its polymer layers 42 may be a layer of polyimide, BenzoCycloButene (BCB), parylene, polybenzoxazole (PBO), epoxy-based material or compound, photo epoxy SU-8, elastomer or silicone, having a thickness between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more upper portions in openings in one of its polymer layers 42 having a thickness between 0.3 μm and 20 μm, and an lower portion having a thickness 0.3 μm and 20 μm under said one of its polymer layers 42, (2) an adhesion layer 28*a*, such as titanium or titanium nitride having a thickness between 1 nm and 50 nm, at a top and sidewall of each of the one or more upper portions of the copper layer 40 of said each of the metal traces or lines and at a top of the lower portion of the copper layer 40 of said each of the metal traces or lines, and (3) a seed layer 28*b*, such as copper, between the copper layer 40 and adhesion layer 28*a* of said each of the metal traces or lines, wherein the lower portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, lpm, 2 μm, 3 μm, 5 μm, 7 μm or 10 μm, and a width between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, lpm, 2 μm, 3 μm, 5 μm, 7 μm or 10 μm. Each of its interconnection metal layers 27 may have two planes used respectively for power and ground planes of a power supply and/or used as a heat dissipater or spreader for the heat dissipation or spreading, wherein each of the two planes may have a thickness, for example, between 5 μm and 50 μm, 5 μm and 30 μm, 5 μm and 20 μm, or 5 μm and 15 μm; or thicker than or equal to 5 μm, 10 μm, 20 μm, or 30 μm. The two planes may be layout as interlaced or interleaved shaped structures in a plane or may be layout in a fork shape.

Referring to FIG. 23A, each of the metal pads 583 may be of various types. A first type of metal pad 583 may include (1) an adhesion layer 28*a*, such as titanium (Ti) or titanium nitride (TiN) layer having a thickness between 1 nm and 50 nm, on a bottom surface of a second bottommost one of the polymer layers 42 of the backside interconnection scheme for a logic drive or device (BISD) 79, (2) a seed layer 28*b*, such as copper, on a bottom surface of its adhesion layer 28*a*, and (3) a copper layer 40, i.e., copper pad, having a thickness between 0.3 μm and 20 μm on a bottom surface of its seed layer 28*b* and at a top of one of the openings in the bottommost one of its polymer layers 42. Alternatively, a second type of metal pad 583 may include the adhesion layer 28*a*, seed layer 28*b* and copper layer 40 as mentioned above, and may further include a nickel layer, i.e., nickel pad, having a thickness between 0.5 μm and 10 μm on a bottom surface of its copper layer 32 and in one of the openings in the bottommost one of its polymer layers 42. Alternatively, a tin-containing solder bump made of tin or a tin-silver alloy having a thickness between 1 μm and 50 μm may be formed under the bottom surface of the copper layer 32 of each of the first type of metal pads 583 or a bottom surface of the nickel layer of each of the second type of metal pads 583.

Next, referring to FIG. 23A, metal bumps, pillars or pads 570 may be formed in an array on the metal pads of the topmost one of the interconnection metal layers 27 of the frontside interconnection scheme for a logic drive or device (FISD) 101 at the bottoms of the respective openings 42*a* in the topmost one of the polymer layers 42 of the frontside interconnection scheme for a logic drive or device (FISD) 101. Each of the metal bumps, pillars or pads 570 may be of one of the first through third types having the same specifications as the first through third types of metal bumps, pillars or pads 570 as illustrated in FIGS. 22G, respectively.

Next, referring to FIG. 23A, the polymer layers 42 of the frontside interconnection scheme for a logic drive or device (FISD) 101, the polymer layer 92 and the polymer layers 42 of the backside interconnection scheme for a logic drive or device (BISD) 79 may be cut or diced to separate multiple individual chip packages 300 as shown in FIG. 23B each for the standard commodity logic drive as illustrated in FIG. 12A by a laser cutting process or by a mechanical cutting process. For the chip package 300 as seen in FIG. 23B, each of its semiconductor integrated-circuit (IC) chips 100 and first type of operation units 190 may couple to one of its metal pads 583 through, in sequence, one or more of the interconnection metal layers 27 of its frontside interconnection scheme for a logic drive or device (FISD) 101, one of the vertical through vias (VTVs) 358 of one of its first type of vertical-through-via (VTV) connectors 467 and each of the interconnection metal layer 27 of its backside interconnection scheme for a logic drive or device (BISD) 79 for delivery of a voltage of power supply (Vcc), a voltage of ground reference (Vss), clock signals (CLK) or other signals to said each of its semiconductor integrated-circuit (IC) chips 100 and first type of operation units 190. One of its metal bumps, pillars or pads 570 vertically over each of its semiconductor integrated-circuit (IC) chips 100 and first type of operation units 190 may couple to one of its metal pads 583 vertically under said each of its semiconductor integrated-circuit (IC) chips 100 and first type of operation units 190 through, in sequence, each of the interconnection metal layers 27 of its frontside interconnection scheme for a logic drive or device (FISD) 101, one of the vertical through vias (VTVs) 358 of one of its first type of vertical-through-via (VTV) connectors 467 and each of the interconnection metal layers 27 of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. Each of the vertical through vias (VTVs) 358 of each of its first type of vertical-through-via (VTV) connectors 467 may have a depth, for example, between 30 μm and 2,000 μm.

Figure 23C:
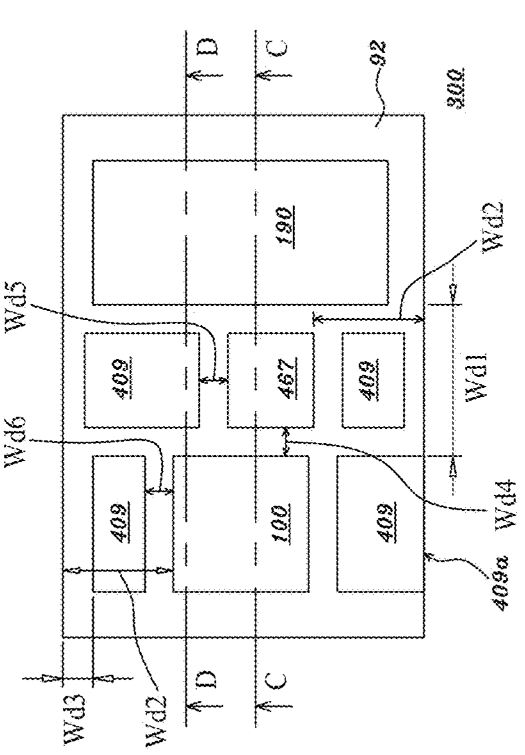
Figure 23D:
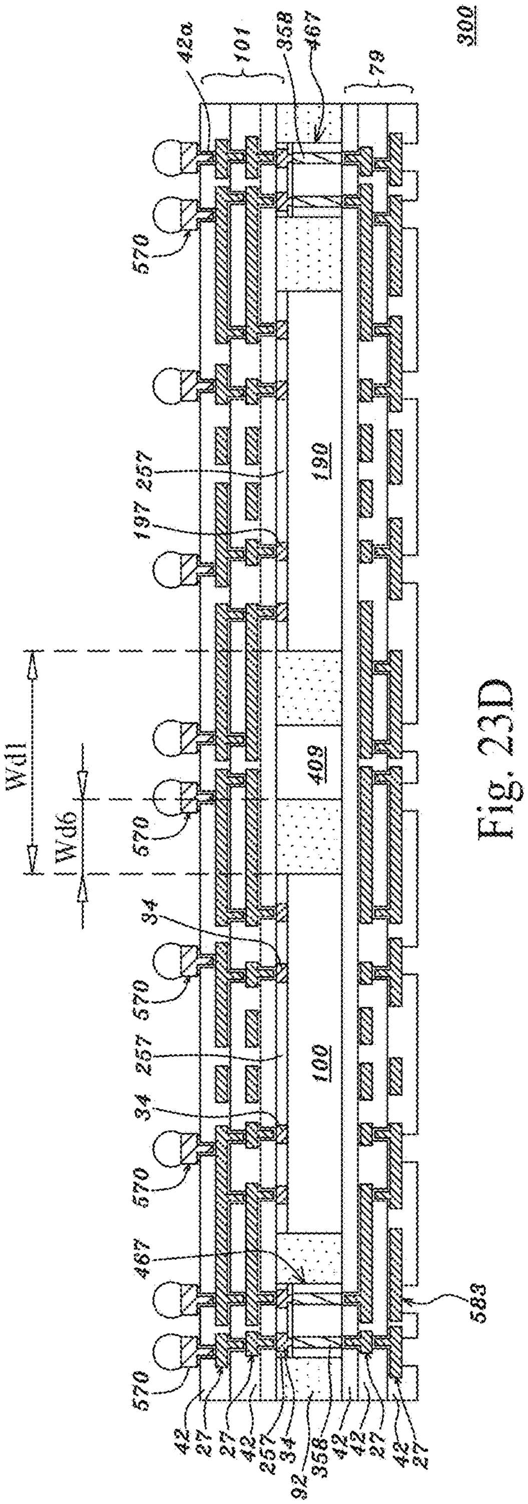
FIG. 23D is a schematically cross-sectional view along a cross-sectional line D-D on FIG. 23C.

Alternatively, the chip packages 300 may further include multiple dummy chips 409 each arranged between two of its semiconductor integrated-circuit (IC) chips 100, first type of operation units 190 and first type of vertical-through-via (VTV) connectors 467, between its edge and one of its first type of semiconductor chips 100 or between its edge and one of its first type of vertical-through-via (VTV) connectors 467, as seen in FIGS. 23C and 23D, wherein each of the dummy chips 409 may not provide any electrical function.

FIG. 23C is a schematically top view showing a second type of multichip package in accordance with a first embodiment of the present application, wherein FIG. 23B is a schematically cross-sectional view along a cross-sectional line C-C on FIG. 23C, and FIG. 23D is a schematically cross-sectional view along a cross-sectional line D-D on FIG. 23C. For an element indicated by the same reference number shown in FIGS. 22A-22H and 23A-23D, the specification of the element as seen in FIG. 23C or 23D may be referred to that of the element as illustrated in FIG. 22A-22H, 23A or 23B. For a process for fabricating the chip packages 300, multiple dummy chips 409 may be further provided to have a backside side of each of the dummy chips 409 attached to the sacrificial bonding layer 591 in the step as illustrated in FIG. 22A. Next, in the step as illustrated in FIG. 22B, the polymer layer 92 may be formed further over a frontside of each of the dummy chips 409 and in multiple gaps each between one of the semiconductor integrated-circuit (IC) chips 100, first type of operation units 190 and first type of vertical-through-via (VTV) connectors 467 and one of the dummy chips 409. Next, in the step as illustrated in FIG. 22C, the chemical mechanical polishing (CMP), polishing or grinding process may be performed further to remove a top portion of each of the dummy chips 409 and to planarize the frontside of each of the dummy chips 409 with the top surface of the polymer layer 92. Next, in the step as illustrated in FIG. 22D, the bottommost one of the polymer layers 42 of the frontside interconnection scheme for a logic drive or device (FISD) 101 may be further formed on the frontside of each of the dummy chips 409. Next, in the step as illustrated in FIG. 22E, the temporary substrate (T-sub) 590 as shown in FIG. 22D may be removed further from the backside of each of the dummy chips 409. Next, in the step as illustrated in FIG. 22F, the chemical mechanical polishing (CMP), polishing or grinding process may be applied further to remove a bottom portion of each of the dummy chips 409. Next, in the step as illustrated in FIG. 23A, the topmost one of the polymer layers 42 of the backside interconnection scheme for a logic drive or device (BISD) 79 may be further formed on the backside of each of the dummy chips 409. Next, in the step as illustrated in FIG. 23A, one or more of the metal bumps, pillars or pads 570 may be formed vertically over each of the dummy chips 409. Next, referring to FIG. 23A, the polymer layers 42 of the front side interconnection scheme for a logic drive or device (FISD) 101, the polymer layer 92, one or more of the dummy chips 409 and the polymer layers 42 of the backside interconnection scheme for a logic drive or device (BISD) 79 may be cut or diced to separate the individual chip packages 300 as shown in each of FIGS. 23B-23D by a laser cutting process or by a mechanical cutting process, and thus each of said one or more of the dummy chips 409 may have a sidewall 409*a* exposed and not covered by the polymer layer 92. For each of the chip packages 300 as seen in FIGS. 23B-23D, when a width or distance Wd1 between neighboring two of its semiconductor integrated-circuit (IC) chips 100, first type of operation units 190 and first type of vertical-through-via (VTV) connectors 467 may range from 500 to 2500 micrometers or from 700 to 1800 micrometers or may be greater than 600, 800, 1200 or 1500 micrometers, one of its dummy chips 409 may be arranged between said neighboring two of its semiconductor integrated-circuit (IC) chips 100, first type of operation units 190 and first type of vertical-through-via (VTV) connectors 467.

When a width or distance Wd2 between one of its semiconductor integrated-circuit (IC) chips 100, first type of operation units 190 and first type of vertical-through-via (VTV) connectors 467 and its edge may range from 500 to 2500 micrometers or from 700 to 1800 micrometers or may be greater than 600, 800, 1200 or 1500 micrometers, one of its dummy chips 409 may be arranged between said one of its semiconductor integrated-circuit (IC) chips 100, first type of operation units 190 and first type of vertical-through-via (VTV) connectors 467 and its edge. A width or distance Wd3 between one of its dummy chips 409 and its edge may range from 30 to 300 micrometers, from 50 to 200 micrometers or from 80 to 120 micrometers or may be smaller than 300 or 200 micrometers. A width or distance Wd4 between one of its semiconductor integrated-circuit (IC) chips 100 and first type of operation units 190 and one of its first type of vertical-through-via (VTV) connectors 467 may range from 30 to 300 micrometers, from 50 to 200 micrometers or from 80 to 120 micrometers or may be smaller than 300 or 200 micrometers. A width or distance Wd5 between one of its first type of vertical-through-via (VTV) connectors 467 and one of its dummy chips 409 may range from 30 to 300 micrometers, from 50 to 200 micrometers or from 80 to 120 micrometers or may be smaller than 300 or 200 micrometers. A width or distance Wd6 between one of its semiconductor integrated-circuit (IC) chips 100 and first type of operation units 190 and one of its dummy chips 409 may range from 30 to 300 micrometers, from 50 to 200 micrometers or from 80 to 120 micrometers or may be smaller than 300 or 200 micrometers.

Figure 23E:
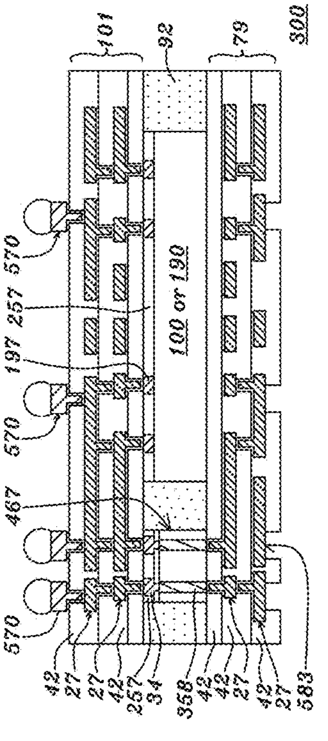
FIG. 23E is a schematically cross-sectional view showing a second type of single-chip/unit package in accordance with a first embodiment of the present application.

Alternatively, FIG. 23E is a schematically cross-sectional view showing a second type of single-chip/unit package in accordance with a first embodiment of the present application. The chip package 300 as seen in FIG. 23E may have a similar structure to that as illustrated in FIG. 23B. For an element indicated by the same reference number shown in FIGS. 22A-22I, 23A, 23B and 23E, the specification of the element as seen in FIG. 23E may be referred to that of the element as illustrated in FIG. 22A-22I, 23A or 23B. The difference between the chip packages as illustrated in FIGS. 23B and 23E is that the chip package as seen in FIG. 23E may include only one semiconductor integrated-circuit (IC) chip 100 or first type of operation unit 190 having the same specification as illustrated in FIG. 22A and one or more first type of vertical-through-via (VTV) connectors 467 having the same specification as illustrated in FIG. 22A. For the single-chip/unit package 300 as seen in FIG. 23E, its only one semiconductor integrated-circuit (IC) chip 100 or first type of operation unit 190 may couple to one of its metal pads 583 through, in sequence, one or more of the interconnection metal layers 27 of its frontside interconnection scheme for a logic drive or device (FISD) 101, one of the vertical through vias (VTVs) 358 of one of its first type of vertical-through-via (VTV) connectors 467 and each of the interconnection metal layer 27 of its backside interconnection scheme for a logic drive or device (BISD) 79 for delivery of a voltage of power supply (Vcc), a voltage of ground reference (Vss), clock signals (CLK) or other signals to its only one semiconductor integrated-circuit (IC) chip 100 or first type of operation unit 190. One of its metal bumps, pillars or pads 570 vertically over its only one semiconductor integrated-circuit (IC) chip 100 or first type of operation unit 190 may couple to one of its metal pads 583 vertically under its only one semiconductor integrated-circuit (IC) chip 100 or first type of operation unit 190 through, in sequence, each of the interconnection metal layers 27 of its frontside interconnection scheme for a logic drive or device (FISD) 101, one of the vertical through vias (VTVs) 358 of one of its first type of vertical-through-via (VTV) connectors 467 and each of the interconnection metal layers 27 of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. For example, its more than twenty first metal contacts, i.e., metal bumps, pillars or pads 570, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first type of vertical-through-via (VTV) connector(s) 467 may have a depth, for example, between 30 μm and 2,000 μm.

Figure 24A:
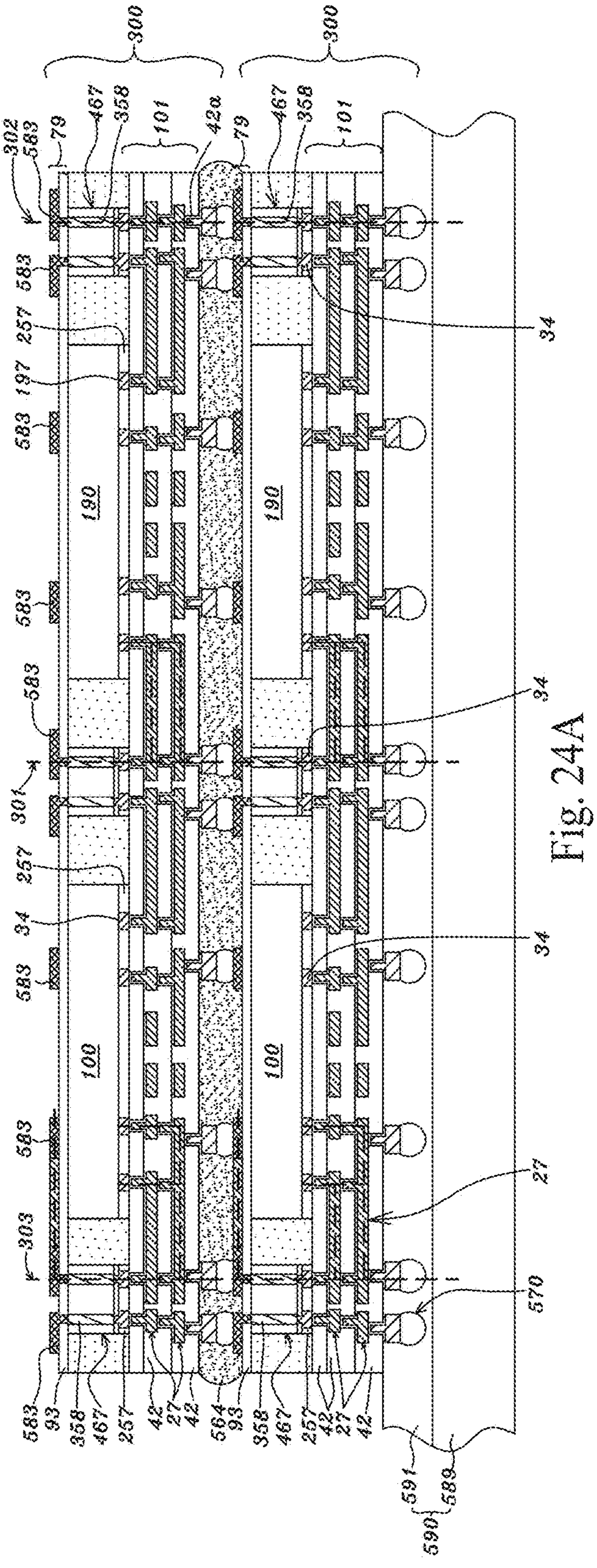
FIGS. 24A and 24B are schematically cross-sectional views showing a process for forming various package-on-package (POP) assemblies for multiple first type of chip packages in accordance with a first embodiment of the present application.
Figure 24B:
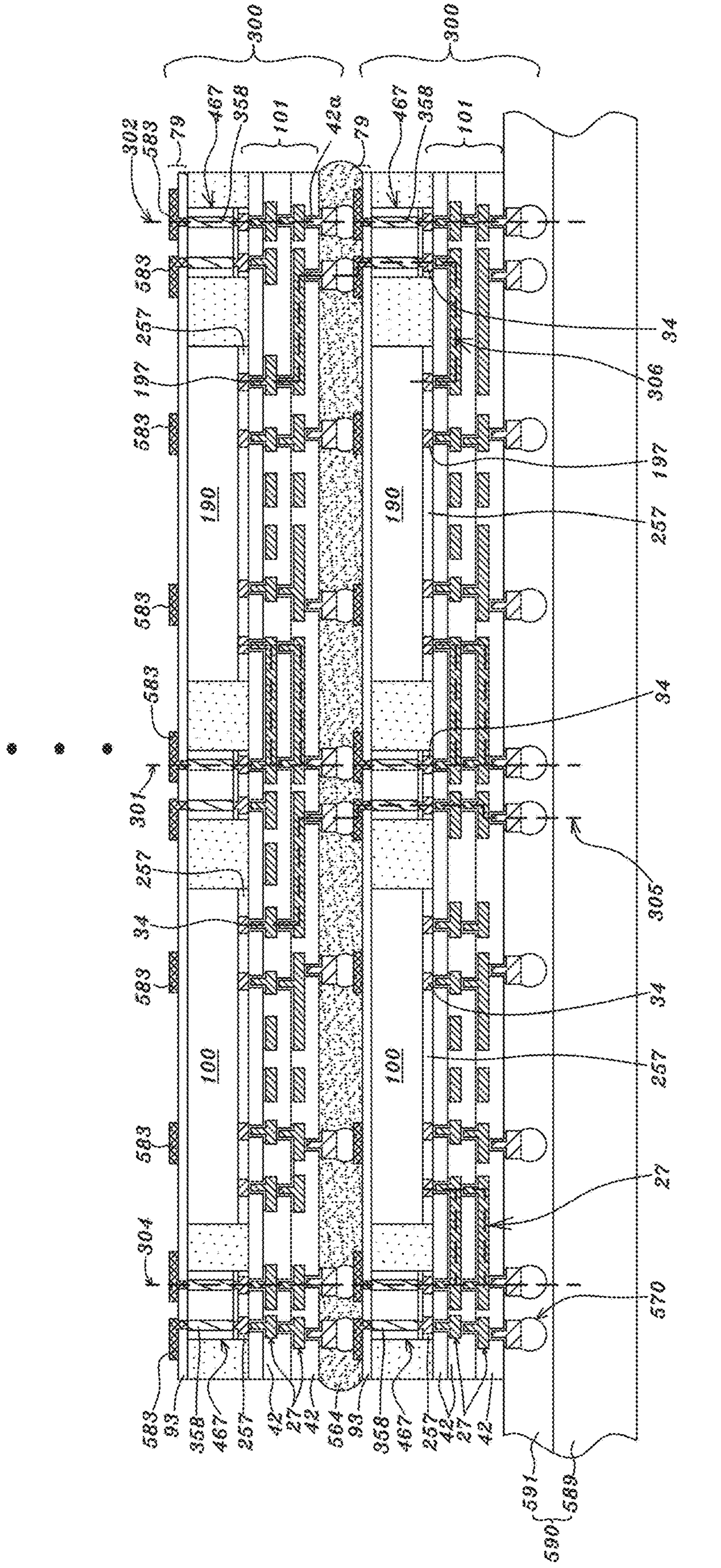

3. Package-On-Package (POP) Assembly for First Type of Chip Packages for First Embodiment FIGS. 24A and 24B are schematically cross-sectional views showing a process for forming various package-on-package (POP) assemblies for multiple first type of chip packages in accordance with a first embodiment of the present application. Multiple first type of chip packages 300 as illustrated in FIG. 22H may be provided to be stacked together to form a package-on-package (POP) assembly as seen in FIG. 24A.

Referring to FIG. 24A, the temporary substrate (T-Sub) 590 as illustrated in FIG. 22A may be first provided. Next, the bottommost one of the first type of chip packages 300 as illustrated in FIG. 22H or 22I may be flipped to be attached onto the temporary substrate (T-sub) 590, wherein the bottommost one of the first type of chip packages 300 may have the metal bumps, pillars or pads 570 embedded in the sacrificial bonding layer 591 of the temporary substrate (T-Sub) 590. The sacrificial bonding layer 591 may have a top surface in contact with a bottom surface of the bottommost one of the polymer layers 42 of the frontside interconnection scheme for a logic drive or device (FISD) 101 of the bottommost one of the first type of chip packages 300.

Next, referring to FIG. 24A, in a first step, an upper one of the first type of chip packages 300 as illustrated in FIG. 22H may be flipped to have its metal bumps, pillars or pads 570 to be bonded respectively to the metal pads 583 of a lower one of the first type of chip packages 300 as illustrated in FIG. 22H or the tin-containing solder bumps on the metal pads 583 of the lower one of the first type of chip packages 300 as illustrated in FIG. 22H. Alternatively, an upper one of the first type of chip packages 300 as illustrated in FIG. 22I may be flipped to have its metal bumps, pillars or pads 570 to be bonded respectively to the metal pads 583 of a lower one of the first type of chip packages 300 as illustrated in FIG. 22I or the tin-containing solder bumps on the metal pads 583 of the lower one of the first type of chip packages 300 as illustrated in FIG. 22I. For example, for a first case, each of the metal bumps, pillars or pads 570 of the upper one of the first type of chip packages 300 may be of the second type, having the solder cap 33 to be bonded onto the copper layer 32 of one of the first type of metal pads 583 of the lower one of the first type of chip packages 300. For a second case, each of the metal bumps, pillars or pads 570 of the upper one of the first type of chip packages 300 may be of the second type, having the solder cap 33 to be bonded onto the tin-containing solder bumps on one of the metal pads 583 of the lower one of the first type of chip packages 300. For a third case, each of the metal bumps, pillars or pads 570 of the upper one of the first type of chip packages 300 may be of the first type, having the copper layer 32 to be bonded onto the tin-containing solder bump on one of the metal pads 583 of the lower one of the first type of chip packages 300. It is noted that the lower one of the first type of chip packages 300 may have the dummy pads 583*a* in a first group each coupling to one of the metal bumps, pillars or pads 570 of the upper one of the first type of chip packages 300 at a voltage (Vss) of ground reference and the dummy pads 583*a* in a second group each coupling to one of the metal bumps, pillars or pads 570 of the upper one of the first type of chip packages 300 without any electrical function.

Next, referring to FIG. 24A, in a second step, an underfill 564 may be filled into a gap between the upper and lower ones of the first type of chip packages 300 to enclose the metal bumps, pillars or pads 570 of the upper one of the first type of chip packages 300.

Next, referring to FIG. 24A, the above first and second steps may be alternately repeated multiple times to stack, one by one, multiple of the first type of chip packages 300 as illustrated in FIG. 22H or 22I having the number greater than or equal to two, such as four or eight.

Next, referring to FIG. 24A, the temporary substrate (T-sub) 590 may be released as illustrated in FIG. 22E from the bottommost one of the first type of chip packages 300 to expose the metal bumps, pillars or pads 570 of the bottommost one of the first type of chip packages 300.

For the package-on-package (POP) assembly as illustrated in FIG. 24A, the interconnection metal layers 27 of the frontside interconnection scheme for a logic drive or device (FISD) 101 of each of its first type of chip packages 300 may have the same circuit layout as those of each of the other(s) of its first type of chip packages 300 and the interconnection metal layer of the backside interconnection scheme for a logic drive or device (BISD) 79 of each of its first type of chip packages 300 may have the same circuit layout as that of each of the other(s) of its first type of chip packages 300. Each of the metal bumps, pillars or pads 570 of each of its first type of chip packages 300 may be vertically aligned with one of the metal pads 583 of said each of its first type of chip packages 300, one of the metal bumps, pillars or pads 570 of each of the other(s) of its first type of chip packages 300 and one of the metal pads 583 of each of the other(s) of its first type of chip packages 300. One of the vertical through vias (VTVs) 358 of one of the first type of vertical-through-via (VTV) connectors 467 of each of its first type of chip packages 300 may be vertically aligned with and couple to one of the vertical through vias (VTVs) 358 of one of the first type of vertical-through-via (VTV) connectors 467 of one of the other(s) of its first type of chip packages 300, one of the metal bumps, pillars or pads 570 of each of its first type of chip packages 300 and one of the metal pads 583 of each of its first type of chip packages 300, and may further couple to one or more of the semiconductor integrated-circuit (IC) chips 100 of each of its first type of chip packages 300 and/or one or more of the first type of operation units 190 of each of its first type of chip packages 300, as seen for a first interconnect 301 for delivery of a voltage of power supply (Vcc), a voltage of ground reference (Vss), clock signals (CLK) or other signals to said one or more of the semiconductor integrated-circuit (IC) chips 100 and/or said one or more of the first type of operation units 190. Alternatively, one of the vertical through vias (VTVs) 358 of one of the first type of vertical-through-via (VTV) connectors 467 of each of its first type of chip packages 300 may be vertically aligned with and couple to one of the vertical through vias (VTVs) 358 of one of the first type of vertical-through-via (VTV) connectors 467 of each of the other(s) of its first type of chip packages 300, one of the metal bumps, pillars or pads 570 of each of its first type of chip packages 300 and one of the metal pads 583 of each of its first type of chip packages 300, but may not couple to any of the semiconductor integrated-circuit (IC) chips 100 of any of its first type of chip packages 300 and any of the first type of operation units 190 of any of its first type of chip packages 300, as seen for a second interconnect 302 for delivery of a voltage of power supply (Vcc), a voltage of ground reference (Vss), clock signals (CLK) or other signals. Alternatively, one of the vertical through vias (VTVs) 358 of one of the first type of vertical-through-via (VTV) connectors 467 of the lower one of its first type of chip packages 300 may be vertically aligned with and couple to one of the vertical through vias (VTVs) 358 of one of the first type of vertical-through-via (VTV) connectors 467 of the upper one of its first type of chip packages 300 and may further couple to one or more of the semiconductor integrated-circuit (IC) chips 100 of each of the lower and upper ones of its first type of chip packages 300 and/or one or more of the first type of operation units 190 of each of the lower and upper ones of its first type of chip packages 300, as seen for a third interconnect 303 for delivery of a voltage of power supply (Vcc), a voltage of ground reference (Vss), clock signals (CLK) or other signals to said one or more of the semiconductor integrated-circuit (IC) chips 100 and/or said one or more of the first type of operation units 190, wherein the third interconnect 303 may encompass one of the metal pads 583 of the lower one of its first type of chip packages 300 and one of the metal bumps, pillars or pads 570 of the upper one of its first type of chip packages 300 bonded between said one or more of the semiconductor integrated-circuit (IC) chips 100 of the upper and lower ones of its first type of chip packages 300 or between said one or more of the first type of operation units 190 of the upper and lower ones of its first type of chip packages 300, coupling to said one of the vertical through vias (VTVs) 358 of said one of the first type of vertical-through-via (VTV) connectors 467 of the lower one of its first type of chip packages 300 and said one of the vertical through vias (VTVs) 358 of said one of the first type of vertical-through-via (VTV) connectors 467 of the upper one of its first type of chip packages 300 and coupling to said one or more of the semiconductor integrated-circuit (IC) chips 100 of said each of the lower and upper ones of its first type of chip packages 300 and/or said one or more of the first type of operation units 190 of said each of the lower and upper ones of its first type of chip packages 300.

Alternatively, the interconnection metal layers 27 of the frontside interconnection scheme for a logic drive or device (FISD) 101 of each of its first type of chip packages 300 may have a different circuit layout from those of each of the other(s) of its first type of chip packages 300, as seen in FIG. 24B. For an element indicated by the same reference number shown in FIGS. 24A and 24B, the specification of the element as seen in FIG. 24B may be referred to that of the element as illustrated in FIG. 24A. For the package-on-package (POP) assembly as illustrated in FIG. 24B, one of the vertical through vias (VTVs) 358 of one of the first type of vertical-through-via (VTV) connectors 467 of each of its first type of chip packages 300 may be vertically aligned with and couple to one of the vertical through vias (VTVs) 358 of one of the first type of vertical-through-via (VTV) connectors 467 of one of the other(s) of its first type of chip packages 300, one of the metal bumps, pillars or pads 570 of each of its first type of chip packages 300 and one of the metal pads 583 of each of its first type of chip packages 300, may couple to one or more of the semiconductor integrated-circuit (IC) chips 100 of the lower one of its first type of chip packages 300 and/or one or more of the first type of operation units 190 of the lower one of its first type of chip packages 300 and may not couple to any of the semiconductor integrated-circuit (IC) chips 100 of the upper one of its first type of chip packages 300 and any of the first type of operation units 190 of the upper one of its first type of chip packages 300, as seen for a fourth interconnect 304 for delivery of a voltage of power supply (Vcc), a voltage of ground reference (Vss), clock signals (CLK) or other signals to said one or more of the semiconductor integrated-circuit (IC) chips 100 and/or said one or more of the first type of operation units 190. One of the vertical through vias (VTVs) 358 of one of the first type of vertical-through-via (VTV) connectors 467 of the lower one of its first type of chip packages 300, one of the metal pads 583 of the lower one of its first type of chip packages 300 and one of the metal bumps, pillars or pads 570 of the upper one of its first type of chip packages 300 may couple one or more of the semiconductor integrated-circuit (IC) chips 100 of the upper one of its first type of chip packages 300 and/or one or more of the first type of operation units 190 of the upper one of its first type of chip packages 300 to one of the metal bumps, pillars or pads 570 of the lower one of its first type of chip packages 300 but may not couple to any of the semiconductor integrated-circuit (IC) chips 100 of the lower one of its first type of chip packages 300 and any of the first type of operation units 190 of the lower one of its first type of chip packages 300 and to any of the metal pads 583 of the upper one of its first type of chip packages 300, as seen for a fifth interconnect 305 for delivery of a voltage of power supply (Vcc), a voltage of ground reference (Vss), clock signals (CLK) or other signals to said one or more of the semiconductor integrated-circuit (IC) chips 100 and/or said one or more of the first type of operation units 190. One of the vertical through vias (VTVs) 358 of one of the first type of vertical-through-via (VTV) connectors 467 of the lower one of its first type of chip packages 300, one of the metal pads 583 of the lower one of its first type of chip packages 300 and one of the metal bumps, pillars or pads 570 of the upper one of its first type of chip packages 300 may couple one or more of the semiconductor integrated-circuit (IC) chips 100 of the upper one of its first type of chip packages 300 and/or one or more of the first type of operation units 190 of the upper one of its first type of chip packages 300 to one or more of the semiconductor integrated-circuit (IC) chips 100 of the lower one of its first type of chip packages 300 and/or one or more of the first type of operation units 190 of the lower one of its first type of chip packages 300 but may not couple to any of the metal bumps, pillars or pads 570 of the lower one of its first type of chip packages 300 and any of the metal pads 583 of the upper one of its first type of chip packages 300, as seen for delivery of a voltage of power supply (Vcc), a voltage of ground reference (Vss), clock signals (CLK) or other signals to said one or more of the semiconductor integrated-circuit (IC) chips 100 of the upper one of its first type of chip packages 300 and/or said one or more of the first type of operation units 190 of the upper one of its first type of chip packages 300 or to said one or more of the semiconductor integrated-circuit (IC) chips 100 of the lower one of its first type of chip packages 300 and/or said one or more of the first type of operation units 190 of the lower one of its first type of chip packages 300.

Figure 25:
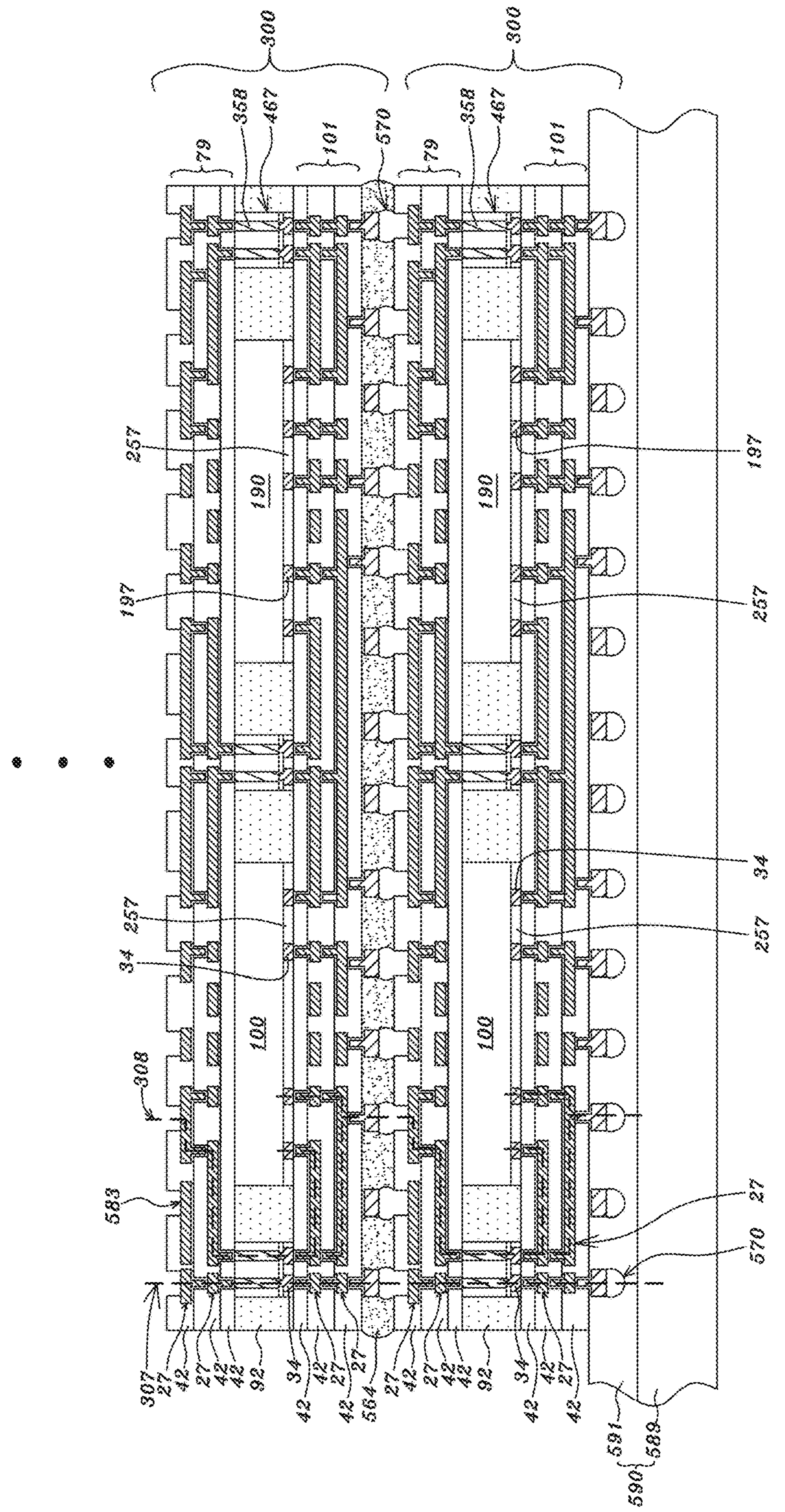
FIG. 25 is a schematically cross-sectional view showing a process for forming a package-on-package (POP) assembly for multiple second type of chip packages in accordance with a first embodiment of the present application.

4. Package-On-Package (POP) Assembly for Second Type of Chip Packages for First Embodiment FIG. 25 is a schematically cross-sectional view showing a process for forming a package-on-package (POP) assembly for multiple second type of chip packages in accordance with a first embodiment of the present application. Multiple second type of chip packages 300 as illustrated in FIG. 23B may be provided to be stacked together to form a package-on-package (POP) assembly as seen in FIG. 25.

Referring to FIG. 25, the temporary substrate (T-Sub) 590 as illustrated in FIG. 22A may be first provided. Next, the bottommost one of the second type of chip packages 300 as illustrated in FIG. 23B or 23E may be flipped to be attached onto the temporary substrate (T-sub) 590, wherein the bottommost one of the second type of chip packages 300 may have the metal bumps, pillars or pads 570 embedded in the sacrificial bonding layer 591 of the temporary substrate (T-Sub) 590. The sacrificial bonding layer 591 may have a top surface in contact with a bottom surface of the bottommost one of the polymer layers 42 of the frontside interconnection scheme for a logic drive or device (FISD) 101 of the bottommost one of the second type of chip packages 300.

Next, referring to FIG. 25, in a first step, an upper one of the second type of chip packages 300 as illustrated in FIG. 23B may be flipped to have the metal bumps, pillars or pads 570 to be bonded respectively to the metal pads 583 of a lower one of the second type of chip packages 300 as illustrated in FIG. 23B or the tin-containing solder bumps on the metal pads 583 of the lower one of the second type of chip packages 300 as illustrated in FIG. 23B. Alternatively, an upper one of the second type of chip packages 300 as illustrated in FIG. 23E may be flipped to have the metal bumps, pillars or pads 570 to be bonded respectively to the metal pads 583 of a lower one of the second type of chip packages 300 as illustrated in FIG. 23E or the tin-containing solder bumps on the metal pads 583 of the lower one of the second type of chip packages 300 as illustrated in FIG. 23E. The first step may have the same specification or details as that illustrated in FIG. 24A.

Next, referring to FIG. 25, in a second step, an underfill 564 may be filled into a gap between the upper and lower ones of the second type of chip packages 300 to enclose the metal bumps, pillars or pads 570 of the upper one of the second type of chip packages 300.

Next, referring to FIG. 25, the above first and second steps may be alternately repeated multiple times to stack, one by one, multiple of the second type of chip packages 300 as illustrated in FIG. 23B or 23C having the number greater than or equal to two, such as four or eight.

Next, referring to FIG. 25, the temporary substrate (T-sub) 590 may be released as illustrated in FIG. 22E from the bottommost one of the second type of chip packages 300 to expose the metal bumps, pillars or pads 570 of the bottommost one of the second type of chip packages 300.

For the package-on-package (POP) assembly as illustrated in FIG. 25, the interconnection metal layers 27 of the frontside interconnection scheme for a logic drive or device (FISD) 101 of each of its second type of chip packages 300 may have the same circuit layout as those of each of the other(s) of its second type of chip packages 300 and the interconnection metal layers 27 of the backside interconnection scheme for a logic drive or device (BISD) 79 of each of its second type of chip packages 300 may have the same circuit layout as those of each of the other(s) of its second type of chip packages 300. Each of the metal bumps, pillars or pads 570 of each of its second type of chip packages 300 may be vertically aligned with one of the metal pads 583 of said each of its second type of chip packages 300, one of the metal bumps, pillars or pads 570 of each of the other(s) of its second type of chip packages 300 and one of the metal pads 583 of each of the other(s) of its second type of chip packages 300. One of the vertical through vias (VTVs) 358 of one of the first type of vertical-through-via (VTV) connectors 467 of each of its second type of chip packages 300 may be vertically aligned with and couple to one of the vertical through vias (VTVs) 358 of one of the first type of vertical-through-via (VTV) connectors 467 of one of the other(s) of its second type of chip packages 300, one of the metal bumps, pillars or pads 570 of each of its second type of chip packages 300 and one of the metal pads 583 of each of its second type of chip packages 300, but may not couple to any of the semiconductor integrated-circuit (IC) chips 100 of any of its second type of chip packages 300 and any of the first type of operation units 190 of any of its second type of chip packages 300, as seen for a seventh interconnect 307 for delivery of a voltage of power supply (Vcc), a voltage of ground reference (Vss), clock signals (CLK) or other signals. Alternatively, one of the vertical through vias (VTVs) 358 of one of the first type of vertical-through-via (VTV) connectors 467 of the lower one of its second type of chip packages 300 may be vertically aligned with and couple to one of the vertical through vias (VTVs) 358 of one of the first type of vertical-through-via (VTV) connectors 467 of the upper one of its second type of chip packages 300 and may further couple to one or more of the semiconductor integrated-circuit (IC) chips 100 of each of the lower and upper ones of its second type of chip packages 300 and/or one or more of the first type of operation units 190 of each of the lower and upper ones of its second type of chip packages 300, as seen for an eighth interconnect 308 for delivery of a voltage of power supply (Vcc), a voltage of ground reference (Vss), clock signals (CLK) or other signals to said one or more of the semiconductor integrated-circuit (IC) chips 100 and/or said one or more of the first type of operation units 190, wherein the eighth interconnect 308 may encompass one of the metal pads 583 of the lower one of its second type of chip packages 300 and one of the metal bumps, pillars or pads 570 of the upper one of its second type of chip packages 300 bonded between said one or more of the semiconductor integrated-circuit (IC) chips 100 of the upper and lower ones of its second type of chip packages 300 or between said one or more of the first type of operation units 190 of the upper and lower ones of its second type of chip packages 300, coupling to said one of the vertical through vias (VTVs) 358 of said one of the first type of vertical-through-via (VTV) connectors 467 of the lower one of its second type of chip packages 300 and said one of the vertical through vias (VTVs) 358 of said one of the first type of vertical-through-via (VTV) connectors 467 of the upper one of its second type of chip packages 300 and coupling to said one or more of the semiconductor integrated-circuit (IC) chips 100 of said each of the lower and upper ones of its second type of chip packages 300 and/or said one or more of the first type of operation units 190 of said each of the lower and upper ones of its second type of chip packages 300.

Specification for Fan-Out Interconnection Scheme for Logic Drive or Device (FOISD)

Figure 26:
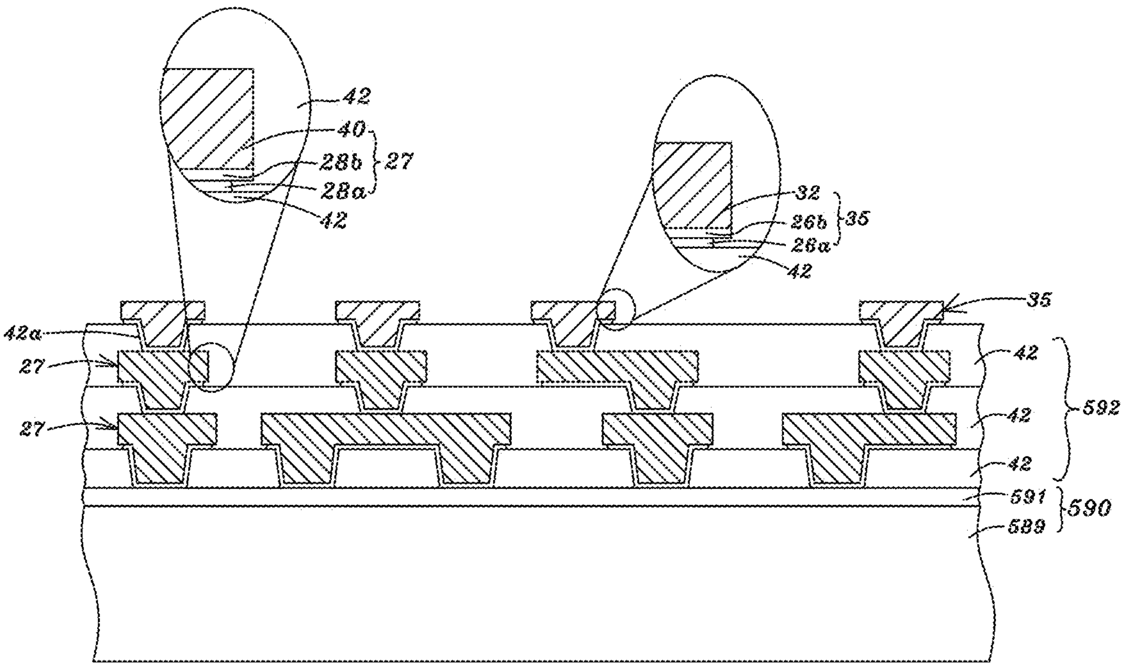
FIG. 26 is a schematically cross-sectional view showing a fan-out interconnection scheme in accordance with various embodiments of the present application.

FIG. 26 is a schematically cross-sectional view showing a fan-out interconnection scheme in accordance with various embodiments of the present application. Referring to FIG. 26, the temporary substrate (T-Sub) 590 as illustrated in FIG. 22A may be first provided. Next, a fan-out interconnection scheme for a logic drive or device (FOISD) 592 may be formed on the sacrificial bonding layer 591 of the temporary substrate (T-Sub) 590. The fan-out interconnection scheme for a logic drive or device (FOISD) 592 may include one or more interconnection metal layers 27 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the sacrificial bonding layer 591. The topmost one of its interconnection metal layers 27 may have multiple metal pads at bottoms of multiple openings 42*a* in the topmost one of its polymer layers 42.

Referring to FIG. 26, for the fan-out interconnection scheme for a logic drive or device (FOISD) 592, each of its polymer layers 42 may be a layer of polyimide, BenzoCycloButene (BCB), parylene, polybenzoxazole (PBO), epoxy-based material or compound, photo epoxy SU-8, elastomer or silicone, having a thickness between, for example, 0.3 μm and 20 μm, 0.5 μm and 10 μm, 1 μm and 5 μm, or 1 μm and 10 μm or thicker than or equal to 0.3 μm, 0.5 μm, 0.7 μm, 1 μm, 1.5 μm, 2 μm or 3 μm. Each of its interconnection metal layers 27 may be provided with multiple metal traces or lines each including (1) a copper layer 40 having one or more lower portions in openings in one of its polymer layers 42 having a thickness between 0.3 μm and 20 μm, and an upper portion having a thickness 0.3 μm and 20 μm over said one of its polymer layers 42, (2) an adhesion layer 28*a*, such as titanium or titanium nitride having a thickness between 1 nm and 50 nm, at a bottom and sidewall of each of the one or more lower portions of the copper layer 40 of said each of the metal traces or lines and at a bottom of the upper portion of the copper layer 40 of said each of the metal traces or lines, and (3) a seed layer 28*b*, such as copper, between the copper layer 40 and adhesion layer 28*a* of said each of the metal traces or lines, wherein the upper portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 20 μm, 0.5 μm and 10 μm, 1 μm and 5 μm, 1 μm and 10 μm, or 2 μm and 10 μm, or thicker than or equal to 0.3 μm, 0.5 μm, 0.7 μm, 1 μm, 1.5 μm, 2 μm or 3 μm, and a width between, for example, 0.3 μm and 20 μm, 0.5 μm and 10 μm, 1 μm and 5 μm, 1 μm and 10 μm, or 2 μm and 10 μm, or wider than or equal to 0.3 μm, 0.5 μm, 0.7 μm, 1 μm, 1.5 μm, 2 μm or 3 μm.

Next, referring to FIG. 26. the fan-out interconnection scheme for a logic drive or device (FOISD) may further include multiple micro-bumps or micro-pads 35 on the metal pads of the topmost one of the interconnection metal layers 27 of the fan-out interconnection scheme for a logic drive or device (FOISD) 592. Each of its micro-bumps or micro-pads 35 may be of various types. A first type of micro-bump or micro-pad 35 may include (1) an adhesion layer 26*a*, such as titanium (Ti) or titanium nitride (TiN) layer having a thickness between 1 nm and 50 nm, on the copper layer 40 of the topmost one of the interconnection metal layers 27 of the fan-out interconnection scheme for a logic drive or device (FOISD) 592, (2) a seed layer 26*b*, such as copper, on its adhesion layer 26*a* and (3) a copper layer 32 having a thickness between 1 μm and 60 μm on its seed layer 26*b*.

Alternatively, referring to FIG. 26, a second type of micro-bump or micro-pad 35 may include the adhesion layer 26*a*, seed layer 26*b* and copper layer 32 as mentioned above, and may further include a tin-containing solder cap made of tin or a tin-silver alloy having a thickness between 1 μm and 50 μm on its copper layer 32.

Alternatively, referring to FIG. 26, a third type of micro-bump or micro-pad 35 may be a thermal compression bump, including the adhesion layer 26*a* and seed layer 26*b* as mentioned above, and further including, as seen as the third type of micro-bump or micro-pad 34 in any of FIGS. 28A, 29A, 35A and 36A, a copper layer 37 having a thickness t3 between 2 μm and 20 μm and a largest transverse dimension w3, such as diameter in a circular shape, between 1 μm and 25 μm on its seed layer 26*b* and a solder cap 38 made of a tin-silver alloy, a tin-gold alloy, a tin-copper alloy, a tin-indium alloy, indium or tin, which has a thickness between 1 μm and 15 μm and a largest transverse dimension, such as diameter in a circular shape, between 1 μm and 15 μm on its copper layer 37. A pitch between neighboring two of the third type of micro-bumps or micro-pads 35 may be between 5 and 30 micrometers or between 10 and 25 micrometers.

Alternatively, referring to FIG. 26, a fourth type of micro-bump or micro-pad 35 may be a thermal compression pad, including the adhesion layer 26*a* and seed layer 26*b* as mentioned above, and further including, as seen in any of FIGS. 28A, 29A, 35A and 36A, a copper layer 48 having a thickness t2 between 1 μm and 20 μm or between 2 μm and 10 μm and a largest transverse dimension w2, such as diameter in a circular shape, between 5 μm and 50 μm, on its seed layer 26*b* and a solder cap 49 made of a tin-silver alloy, a tin-gold alloy, a tin-copper alloy, a tin-indium alloy, indium, tin or gold, which has a thickness between 0.1 μm and 5 μm on its copper layer 48. A pitch between neighboring two of the fourth type of micro-bumps or micro-pads 35 may be between 5 and 30 micrometers or between 10 and 25 micrometers.

Second Embodiment for Chip Package Based on Fan-out Interconnection Scheme for Logic Drive or Device (FOISD)

1. First Type of Chip Package for Second Embodiment

FIGS. 27A-27G are schematically cross-sectional views showing a process for forming a first type of multichip package in accordance with a second embodiment of the present application. FIGS. 28A and 28B are schematically cross-sectional views showing a process of bonding a thermal compression bump of a semiconductor integrated-circuit chip to a thermal compression pad of a fan-out interconnection scheme for a logic drive or device (FOISD) in accordance with an embodiment of the present application. FIGS. 29A and 29B are schematically cross-sectional views showing a process of bonding a thermal compression bump of a first type of vertical-through-via (VTV) connector to a thermal compression pad of a fan-out interconnection scheme for a logic drive or device (FOISD) in accordance with an embodiment of the present application.

Figure 27A:
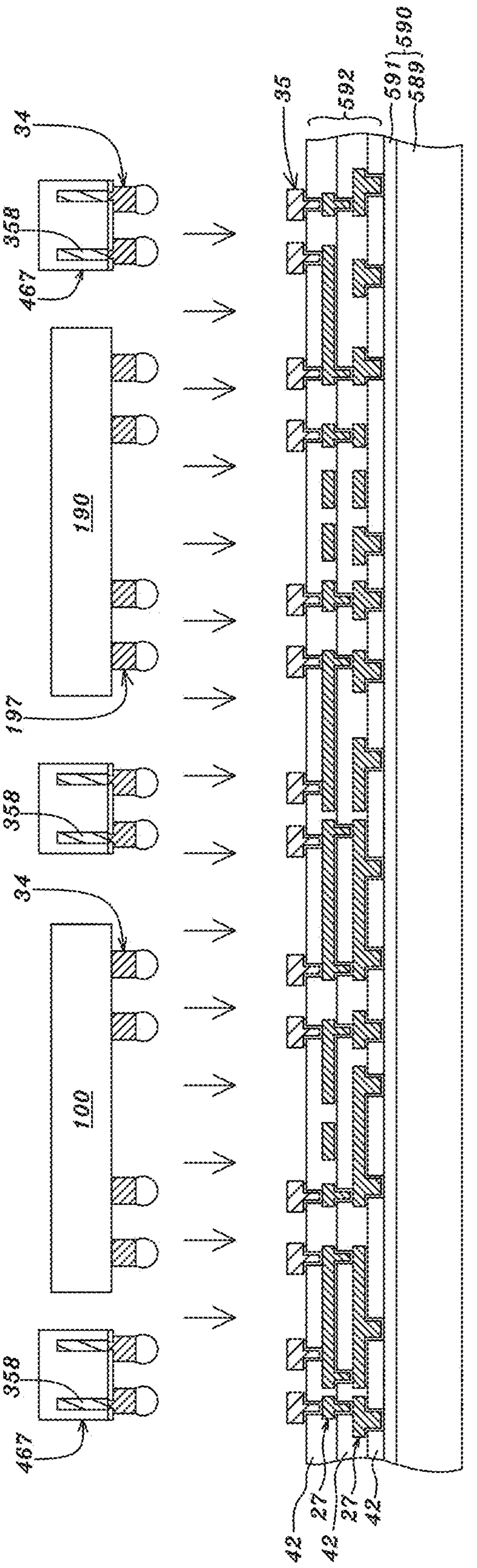
FIGS. 27A-27G are schematically cross-sectional views showing a process for forming a first type of multichip package in accordance with a second embodiment of the present application.
Figures 28A, 28B, 29A, 29B:
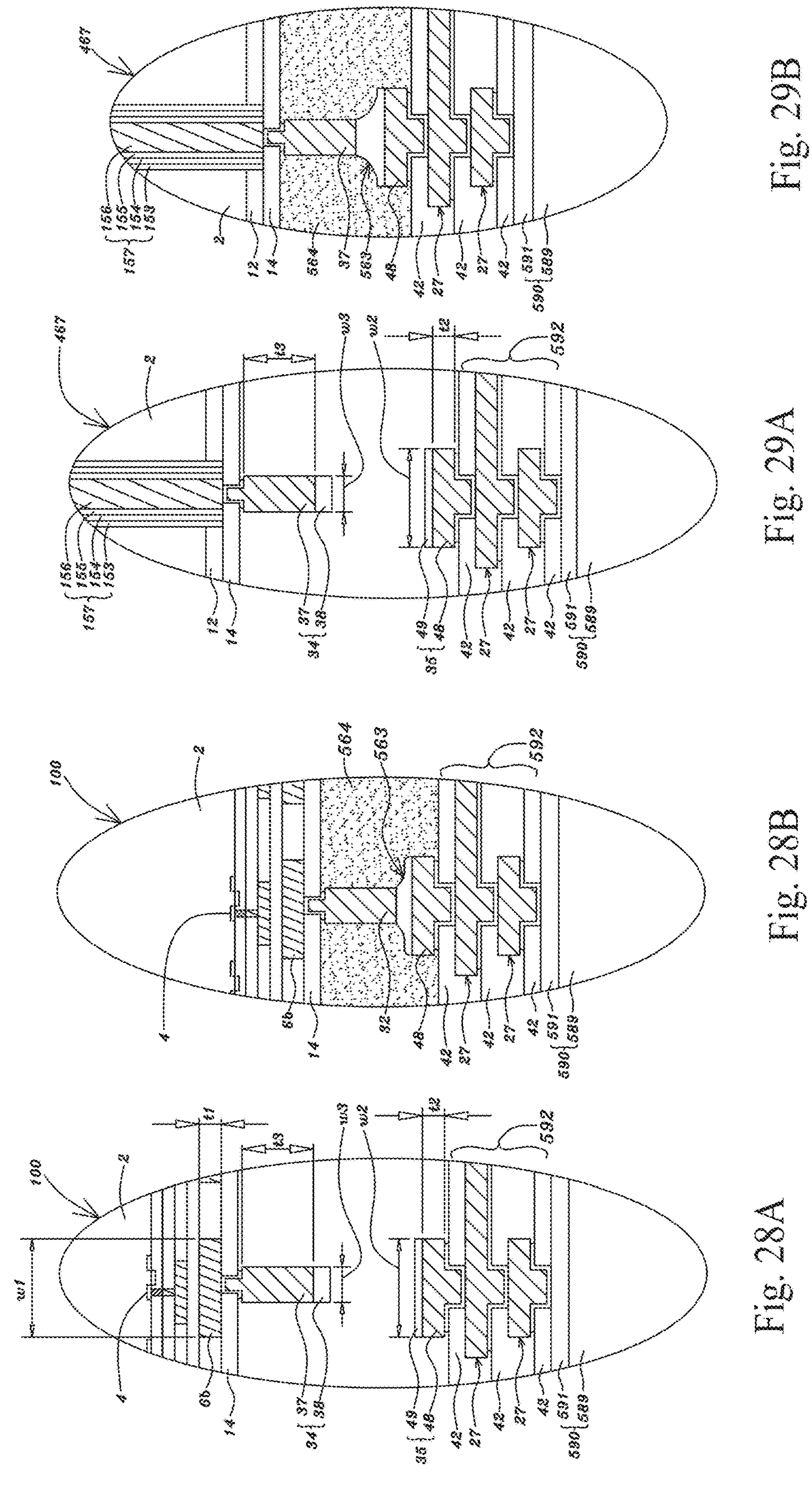
FIGS. 28A and 28B are schematically cross-sectional views showing a process of bonding a thermal compression bump of a semiconductor integrated-circuit chip to a thermal compression pad of a fan-out interconnection scheme for a logic drive or device (FOISD) in accordance with an embodiment of the present application.
FIGS. 29A and 29B are schematically cross-sectional views showing a process of bonding a thermal compression bump of a first type of vertical-through-via (VTV) connector to a thermal compression pad of a fan-out interconnection scheme for a logic drive or device (FOISD) in accordance with an embodiment of the present application.

Referring to FIG. 27A, multiple semiconductor integrated-circuit (IC) chips 100, each of which may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip, each may be provided with the first and/or second interconnection scheme(s) 560 and/or 588 and first, second or third type of micro-bumps or micro-pads 34 as illustrated in FIG. 14A or 14B. Each of the semiconductor integrated-circuit (IC) chips 100 may have the same specification as illustrated in FIG. 14A or 14B. Further, referring to FIG. 27A, multiple first type of operation units 190, each of which may have the same specification as illustrated in FIG. 17F, 17G, 19G or 19H, each may be provided with the first, second or third type of micro-bumps or micro-pads 197. Further, multiple first type of vertical-through-via (VTV) connectors 467 each may have the same specification as illustrated in FIG. 1A, 1C, 1E, 2A, 2C or 2E, provided with the first, second or third type of micro-bumps or micro-pads 34, may have the same specification as illustrated in FIG. 4A, 4B, 4C, 5A, 5B or 5C, provided with the fifth type of micro-bumps or micro-pads 34, or may have the same specification as illustrated in FIG. 6, provided with the sixth type of micro-bumps or micro-pads 34. Further, a fan-out interconnection scheme for a logic drive or device (FOISD) 592, which may have the same specification as illustrated in FIG. 26, may be provided with the first, second or fourth type of micro-bumps or micro-pads 35.

For a first case, referring to FIGS. 27A, 27B, 28A, 28B, 29A and 29B, each of the semiconductor integrated-circuit (IC) chips 100, first type of operation units 190 and first type of vertical-through-via (VTV) connectors 467 may have the third type of micro-bumps or micro-pads 34 or 197 to be bonded to the fourth type of micro-bumps or micro-pads 35 of the fan-out interconnection scheme for a logic drive or device (FOISD) 592. For example, the third type of micro-bumps or micro-pads 34 or 197 of said each of the semiconductor integrated-circuit (IC) chips 100, first type of operation units 190 and first type of vertical-through-via (VTV) connectors 467 may have the solder caps 38 to be thermally compressed, at a temperature between 240 and 300 degrees Celsius, at a pressure between 0.3 and 3 Mpa and for a time period between 3 and 15 seconds, onto the metal caps 49 of the fourth type of micro-bumps or micro-pads 35 of the fan-out interconnection scheme for a logic drive or device (FOISD) 592 into multiple bonded contacts 563 therebetween. Each of the third type of micro-bumps or micro-pads 34 or 197 of said each of the semiconductor integrated-circuit (IC) chips 100, first type of operation units 190 and first type of vertical-through-via (VTV) connectors 467 may have the copper layer 37 having the thickness t3 greater than the thickness t2 of the copper layer 48 of each of the fourth type of micro-bumps or micro-pads 35 of the fan-out interconnection scheme for a logic drive or device (FOISD) 592 and having the largest transverse dimension w3 equal to between 0.7 and 0.1 times of the largest transverse dimension w2 of the copper layer 48 of each of the fourth type of micro-bumps or micro-pads 35 of the fan-out interconnection scheme for a logic drive or device (FOISD) 592. Alternatively, each of the third type of micro-bumps or micro-pads 34 or 197 of said each of the semiconductor integrated-circuit (IC) chips 100, first type of operation units 190 and first type of vertical-through-via (VTV) connectors 467 may be provided with the copper layer 37 having a cross-sectional area equal to between 0.5 and 0.01 times of the cross-sectional area of the copper layer 48 of each of the fourth type of micro-bumps or micro-pads 35 of the fan-out interconnection scheme for a logic drive or device (FOISD) 592. A bonded solder between the copper layers 37 and 48 of each of the bonded contacts 563 may be mostly kept on a top surface of the copper layer 48 of one of the fourth type of micro-bumps or micro-pads 35 of the fan-out interconnection scheme for a logic drive or device (FOISD) 592 and extends out of the edge of the copper layer 48 of said one of the fourth type of micro-bumps or micro-pads 35 of the fan-out interconnection scheme for a logic drive or device (FOISD) 592 less than 0.5 micrometers. Thus, a short between neighboring two of the bonded contacts 563 even in a fine-pitched fashion may be avoided.

Referring to FIGS. 27A, 27B, 28A and 28B, for said each of the semiconductor integrated-circuit (IC) chips 100, its third type of micro-bumps or micro-pads 34 may be formed respectively on a front surface of the metal pads 6*b* provided by the frontmost one of the interconnection metal layers 27 of its second interconnection scheme 588 or by, if the second interconnection scheme 588 is not provided for said each of the semiconductor integrated-circuit (IC) chips 100, the frontmost one of the interconnection metal layers 6 of its first interconnection scheme 560, wherein each of its third type of micro-bumps or micro-pads 34 may be provided with the copper layer 37 having the thickness t3 greater than the thickness t1 of each of its metal pads 6*b* and having the largest transverse dimension w3 equal to between 0.7 and 0.1 times of the largest transverse dimension w1 of each of its metal pads 6*b*; alternatively, each of its third type of micro-bumps or micro-pads 34 may be provided with the copper layer 37 having a cross-sectional area equal to between 0.5 and 0.01 times of the cross-sectional area of each of its metal pads 6*b*; each of its metal pads 6*b* may have a thickness t1 between 1 and 10 micrometers or between 2 and 10 micrometers and a largest transverse dimension w1, such as diameter in a circular shape, between 1 μm and 25 μm.

Figure 27B:
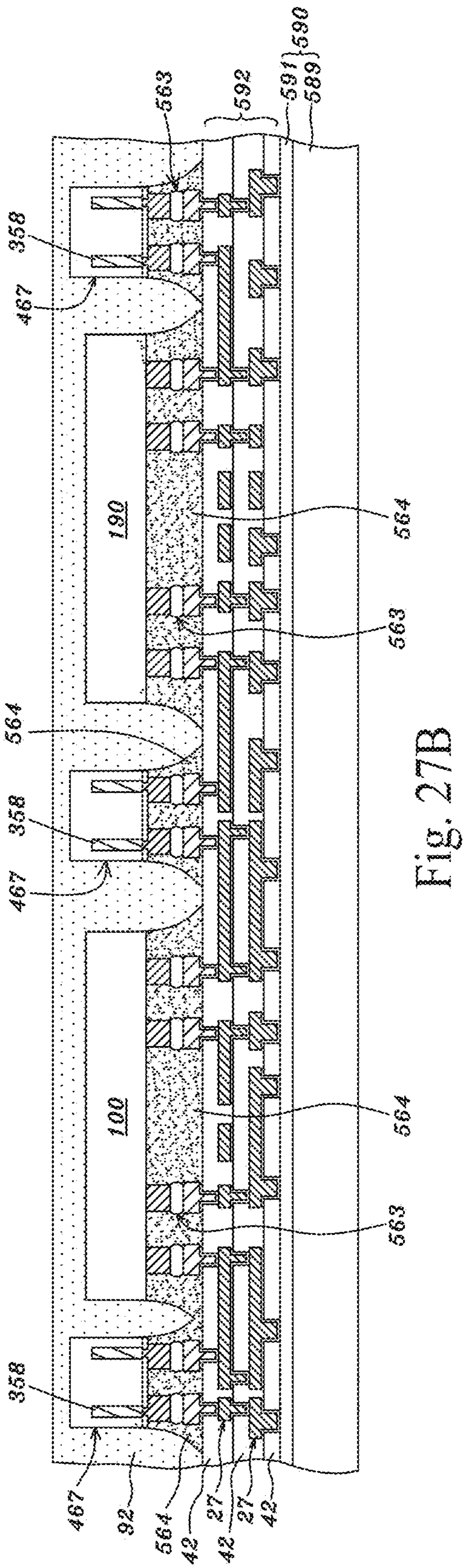

Alternatively, for a second case, referring to FIGS. 27A and 27B, each of the semiconductor integrated-circuit (IC) chips 100, first type of operation units 190 and first type of vertical-through-via (VTV) connectors 467 may have the second type of micro-bumps or micro-pads 34 or 197 each having the solder cap 33 to be bonded to the copper layer 32 of one of the first type of micro-bumps or micro-pads 35 of the fan-out interconnection scheme for a logic drive or device (FOISD) 592 into a bonded contact 563 therebetween. Each of the second type of micro-bumps or micro-pads 34 or 197 of said each of the semiconductor integrated-circuit (IC) chips 100, first type of operation units 190 and first type of vertical-through-via (VTV) connectors 467 may have the copper layer 32 having a thickness greater than that of the copper layer 32 of each of the first type of micro-bumps or micro-pads 35 of the fan-out interconnection scheme for a logic drive or device (FOISD) 592.

Alternatively, for a third case, referring to FIGS. 27A and 27B, each of the semiconductor integrated-circuit (IC) chips 100, first type of operation units 190 and first type of vertical-through-via (VTV) connectors 467 may have the first type of micro-bumps or micro-pads 34 or 197 each having the copper layer 32 to be bonded to the solder cap 33 of one of the second type of micro-bumps or micro-pads 35 of the fan-out interconnection scheme for a logic drive or device (FOISD) 592 into a bonded contact 563 therebetween. Each of the first type of micro-bumps or micro-pads 34 or 197 of said each of the semiconductor integrated-circuit (IC) chips 100, first type of operation units 190 and first type of vertical-through-via (VTV) connectors 467 may have the copper layer 32 having a thickness greater than that of the copper layer 32 of each of the second type of micro-bumps or micro-pads 35 of the fan-out interconnection scheme for a logic drive or device (FOISD) 592.

Alternatively, for a fourth case, referring to FIGS. 27A and 27B, each of the semiconductor integrated-circuit (IC) chips 100, first type of operation units 190 and first type of vertical-through-via (VTV) connectors 467 may have the second type of micro-bumps or micro-pads 34 or 197 each having the solder cap 33 to be bonded to the solder cap 33 of one of the second type of micro-bumps or micro-pads 35 of the fan-out interconnection scheme for a logic drive or device (FOISD) 592 into a bonded contact 563 therebetween. Each of the second type of micro-bumps or micro-pads 34 or 197 of said each of the semiconductor integrated-circuit (IC) chips 100, first type of operation units 190 and first type of vertical-through-via (VTV) connectors 467 may have the copper layer 32 having a thickness greater than that of the copper layer 32 of each of the second type of micro-bumps or micro-pads 35 of the fan-out interconnection scheme for a logic drive or device (FOISD) 592.

Alternatively, for a fifth case, referring to FIGS. 27A and 27B, each of the first type of vertical-through-via (VTV) connectors 467 may be flipped with the fifth type of micro-bumps or micro-pads 34 each having the solder layer 719 to be bonded to the copper layer 32 of one of the first type of micro-bumps or micro-pads 35 of the fan-out interconnection scheme for a logic drive or device (FOISD) 592 into a bonded contact 563 therebetween.

Alternatively, for a sixth case, referring to FIGS. 27A and 27B, each of the first type of vertical-through-via (VTV) connectors 467 may be flipped with the fifth type of micro-bumps or micro-pads 34 each having the solder layer 719 to be bonded to the solder cap 33 of one of the second type of micro-bumps or micro-pads 35 of the fan-out interconnection scheme for a logic drive or device (FOISD) 592 into a bonded contact 563 therebetween.

Alternatively, for a seventh case, referring to FIGS. 27A and 27B, each of the first type of vertical-through-via (VTV) connectors 467 may be flipped with the sixth type of micro-bumps or micro-pads 34 each having the solder ball 321 to be bonded to the copper layer 32 of one of the first type of micro-bumps or micro-pads 35 of the fan-out interconnection scheme for a logic drive or device (FOISD) 592 into a bonded contact 563 therebetween.

Alternatively, for an eighth case, referring to FIGS. 27A and 27B, each of the first type of vertical-through-via (VTV) connectors 467 may be flipped with the sixth type of micro-bumps or micro-pads 34 each having the solder ball 321 to be bonded to the solder cap 33 of one of the second type of micro-bumps or micro-pads 35 of the fan-out interconnection scheme for a logic drive or device (FOISD) 592 into a bonded contact 563 therebetween.

Next, referring to FIG. 27B, an underfill 564, such as a layer of polymer or epoxy resins or compounds, may be filled into a gap between each of the semiconductor integrated-circuit (IC) chips 100, first type of operation units 190 and first type of vertical-through-via (VTV) connectors 467 and the fan-out interconnection scheme for a logic drive or device (FOISD) 592 to enclose the bonded contacts 563 therebetween. The underfill 564 may be cured at temperature equal to or above 100, 120 or 150 degrees Celsius.

Next, referring to FIG. 27B, a polymer layer 92, e.g., resin or compound, may be applied to fill a gap between each neighboring two of the semiconductor integrated-circuit (IC) chips 100, first type of operation units 190 and first type of vertical-through-via (VTV) connectors 467 and to cover a backside of each of the semiconductor integrated-circuit (IC) chips 100, first type of operation units 190 and first type of vertical-through-via (VTV) connectors 467 by methods, for example, spin-on coating, screen-printing, dispensing or molding. The polymer layer 92 may have the same specification or material as that illustrated in FIG. 22B.

Figure 27C:
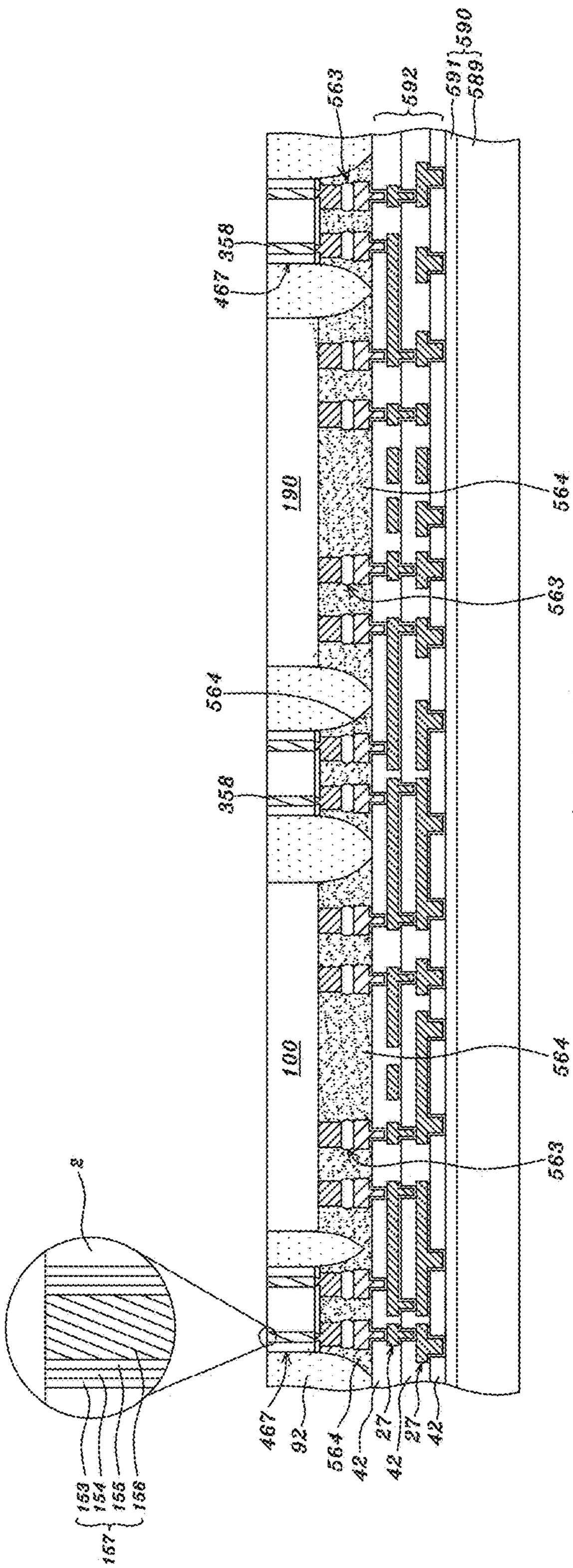

Next, referring to FIG. 27C, a chemical mechanical polishing (CMP), polishing or grinding process may be applied to remove a top portion of the polymer layer 92, a top portion of each of the semiconductor integrated-circuit (IC) chips 100, a top portion of each of the first type of operation units 190 and a top portion of each of the first type of vertical-through-via (VTV) connectors 467 and to expose a backside of each of the vertical through vias (VTVs) 358 of each of the first type of vertical-through-via (VTV) connectors 467. For each of the vertical through vias (VTVs) 358 of said each of the first type of vertical-through-via (VTV) connectors 467, if made of one or more of the through silicon vias (TSVs) 157 as illustrated in one of FIGS. 1A, 1C, 1E, 2A, 2C and 2F, its insulating lining layer 153, adhesion layer 154 and seed layer 155 at its backside may be removed to expose a backside of its copper layer 156, which is coplanar with a backside of said each of the first type of vertical-through-via (VTV) connectors 467 and a top surface of the polymer layer 92, and its insulating lining layer 153, adhesion layer 154 and seed layer 155 at a sidewall of its copper layer 156 may be left. For each of the vertical through vias (VTVs) 358 of said each of the first type of vertical-through-via (VTV) connectors 467, if made of one or more of the through glass vias (TGVs) 259 as illustrated in one of FIGS. 4A, 4B, 4C, 5A, 5B and 5C, a backside of its copper post 706 may be exposed with being coplanar with a backside of said each of the first type of vertical-through-via (VTV) connectors 467 and the top surface of the polymer layer 92; for each of the vertical through vias (VTVs) 358 of said each of the first type of vertical-through-via (VTV) connectors 467, if made of one or more of the through polymer vias (TPVs) 318 as illustrated in FIG. 6 for the fifth alternative, a backside of its metal pad 336 or copper post 318 may be exposed with being coplanar with a backside of said each of the first type of vertical-through-via (VTV) connectors 467 and the top surface of the polymer layer 92.

Figure 27D:
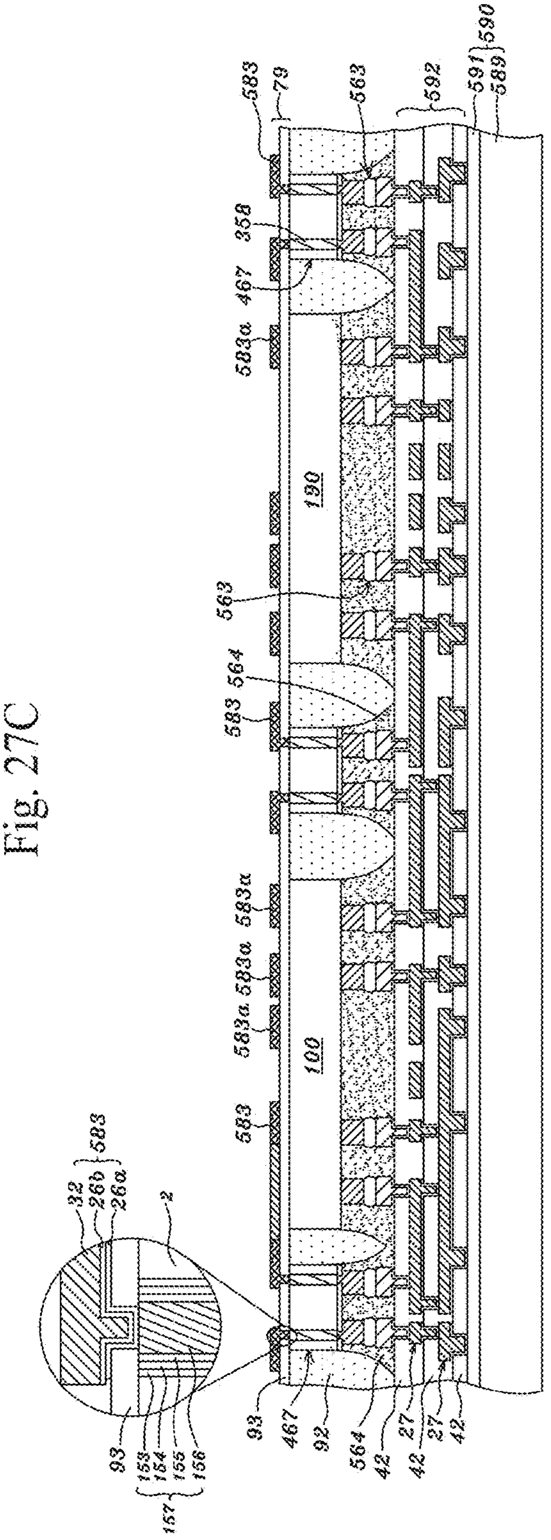

Next, referring to FIG. 27D, a backside interconnection scheme for a logic drive or device (BISD) 79 may be formed on the backside of each of the semiconductor integrated-circuit (IC) chips 100, the backside of each of the first type of operation units 190, the backside of each of the first type of vertical-through-via (VTV) connectors 467 and the top surface of the polymer layer 92. The backside interconnection scheme for a logic drive or device (BISD) 79 may include an insulating dielectric layer 93 on the backside of each of the semiconductor integrated-circuit (IC) chips 100, the backside of each of the first type of operation units 190, the backside of each of the first type of vertical-through-via (VTV) connectors 467 and the top surface of the polymer layer 92. Each opening in the insulating dielectric layer 93 may be vertically over the backside of one of the vertical through vias (VTVs) 358 of one of the first type of vertical-through-via (VTV) connectors 467. For said one of the first type of vertical-through-via (VTV) connectors 467, if said one of its vertical through vias (VTVs) 358 is made of one or more of the through silicon vias (TSVs) 157 as illustrated in one of FIGS. 1A, 1C, 1E, 2A, 2C and 2E, said each opening in the insulating dielectric layer 93 may be vertically over the backside of the copper layer 156 of said one or more of its through silicon vias (TSVs) 157. For said one of the first type of vertical-through-via (VTV) connectors 467, if said one of its vertical through vias (VTVs) 358 is made of one or more of the through glass vias (TGVs) 259 as illustrated in one of FIGS. 4A, 4B, 4C, 5A, 5B and 5C, said each opening in the insulating dielectric layer 93 may be vertically over the backside of the copper post 706 of said one or more of its through glass vias (TGVs) 259. For said one of the first type of vertical-through-via (VTV) connectors 467, if said one of its vertical through vias (VTVs) 358 is made of one of the through polymer vias (TPVs) as illustrated in FIG. 6, said each opening in the insulating dielectric layer 93 may be vertically over the backside of the metal pad 336 or copper post 318 of said one of its through polymer vias (TPVs). The backside interconnection scheme for a logic drive or device (BISD) 79 may further include an interconnection metal layer on a top surface of its insulating dielectric layer 93, coupling to each of the vertical through vias (VTVs) 358 of each of the first type of vertical-through-via (VTV) connectors 467 through one of the opening in its insulating dielectric layer 93. The interconnection metal layer of the backside interconnection scheme for a logic drive or device (BISD) 79 is patterned with multiple metal pads 583 each formed on the backside of one of the vertical through vias (VTVs) 358 of one of the first type of vertical-through-via (VTV) connectors 467 or formed on the bottom surface of the insulating dielectric layer 93 and vertically under the backside of one of the semiconductor integrated-circuit (IC) chips 100, the backside of one of the first type of operation units 190, the backside of one of the first type of vertical-through-via (VTV) connectors 467 or the bottom surface of the polymer layer 92. The insulating dielectric layer 93 and metal pads 583 may have the same specification or material as those illustrated in FIG. 22G. Alternatively, a tin-containing solder bump made of tin or a tin-silver alloy having a thickness between 1 μm and 50 μm may be formed on each of the metal pads 583 as illustrated in FIG. 22G.

Figure 27E:
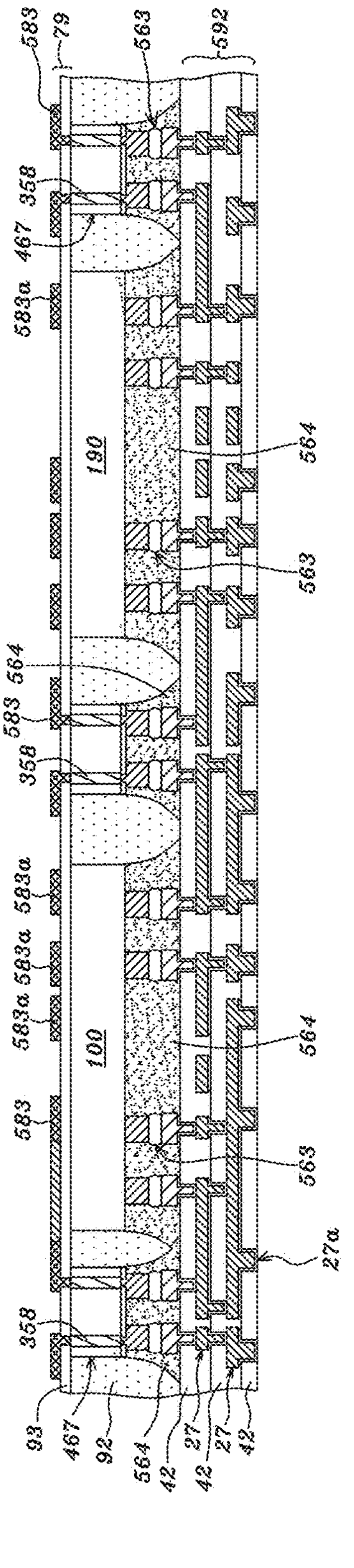

Next, the temporary substrate (T-sub) 590 as seen in FIG. 27D may be released as illustrated in FIGS. 22E and 22E from the fan-out interconnection scheme for a logic drive or device (FOISD) 592 to expose a bottom surface of each metal via 27*a* of the bottommost one of the interconnection metal layers 27 of the fan-out interconnection scheme for a logic drive or device (FOISD) 592 and a bottom surface of the bottommost one of the polymer layers 42 of the fan-out interconnection scheme for a logic drive or device (FOISD) 592 as seen in FIG. 27E, wherein the bottom surface of each metal via 27*a* of the bottommost one of the interconnection metal layers 27 of the fan-out interconnection scheme for a logic drive or device (FOISD) 592 may be coplanar with the bottom surface of the bottommost one of the polymer layers 42 of the fan-out interconnection scheme for a logic drive or device (FOISD) 592.

Figure 27F:
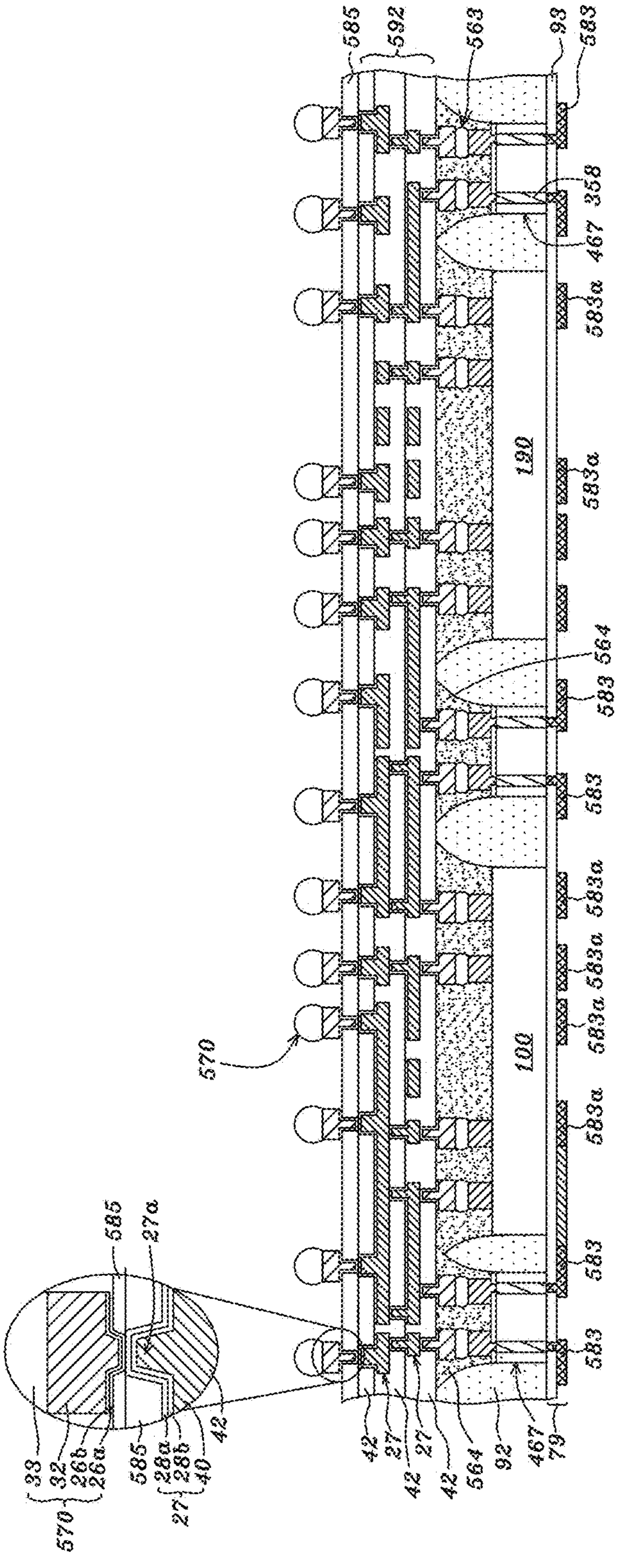

Next, referring to FIG. 27F, the structure as seen in FIG. 27E is flipped to form an insulating dielectric layer 585, such as polymer, on the top surface of the topmost one of the polymer layers 42 of the fan-out interconnection scheme for a logic drive or device (FOISD) 592, wherein each opening in the insulating dielectric layer 585 may be vertically over and expose the top surface of one of the metal via 27*a* of the topmost one of the interconnection metal layers 27 of the fan-out interconnection scheme for a logic drive or device (FOISD) 592 and then to form multiple metal bumps, pillars or pads 570 in an array on the metal vias 27*a* of the topmost one of the interconnection metal layers 27 of the fan-out interconnection scheme for a logic drive or device (FOISD) 592 at bottoms of the respective openings in the insulating dielectric layer 585. The insulating dielectric layer 585 may be a layer of polymer, such as polyimide, BenzoCycloButene (BCB), parylene, polybenzoxazole (PBO), epoxy-based material or compound, photo epoxy SU-8, elastomer or silicone, having a thickness between 3 and 30 micrometers or between 5 and 15 micrometers. Each of the metal bumps, pillars or pads 570 may be of one of the first through third types having the same specifications as the first through third types of metal bumps, pillars or pads 570 as illustrated in FIG. 22G respectively, wherein each of the metal bumps or pillars 570 may be of the first or second type, including the adhesion layer 26*a*, such as titanium (Ti) or titanium nitride (TiN) layer having a thickness between 1 nm and 50 nm, on one of the metal vias 27*a* of the topmost one of the interconnection metal layers 27 of the fan-out interconnection scheme for a logic drive or device (FOISD) 592, or of the third type, including the gold layer, i.e., gold bump, having a thickness between 3 and 15 micrometers over one of the metal vias 27*a* of the topmost one of the interconnection metal layers 27 of the fan-out interconnection scheme for a logic drive or device (FOISD) 592.

Figure 27G:
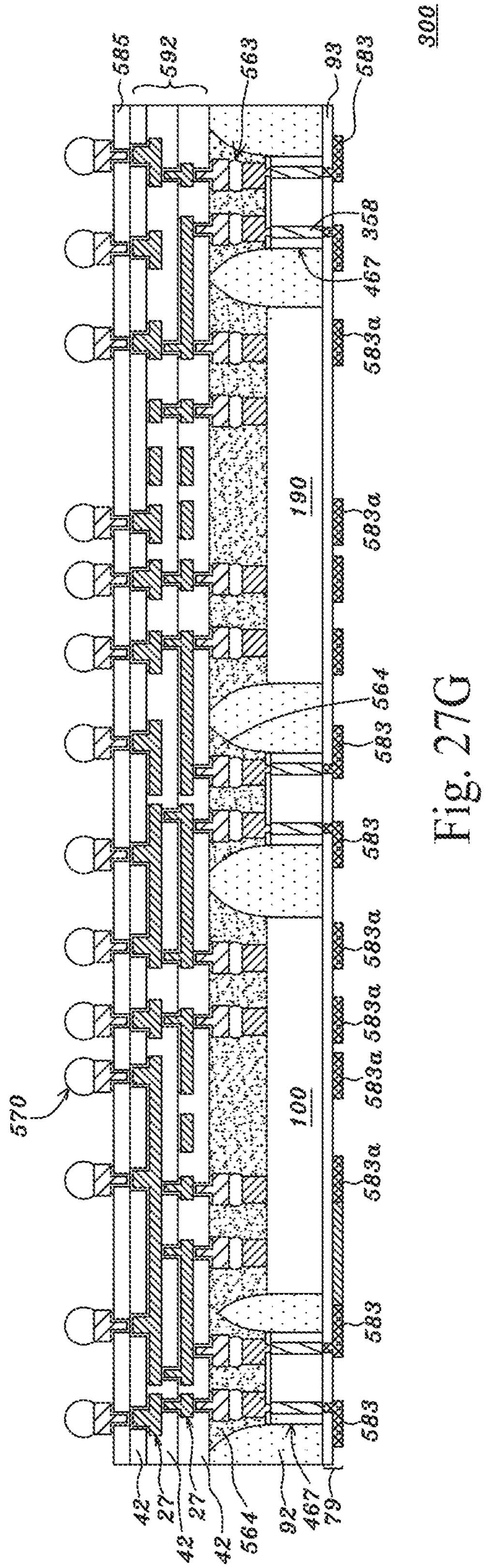

Next, the insulating dielectric layer 585, the polymer layers 42 of the fan-out interconnection scheme for a logic drive or device (FOISD) 592, the polymer layer 92 and the insulating dielectric layer 93 may be cut or diced to separate multiple individual chip packages 300 as shown in FIG. 27G each for the standard commodity logic drive as illustrated in FIG. 12A by a laser cutting process or by a mechanical cutting process. For the chip package 300 as seen in FIG. 27G, one or more of the interconnection metal layers 27 of its fan-out interconnection scheme for a logic drive or device (FOISD) 592 may couples each of its semiconductor integrated-circuit (IC) chips 100, first type of operation units 190 and first type of vertical-through-via (VTV) connectors 467 to the other of its semiconductor integrated-circuit (IC) chips 100, first type of operation units 190 and first type of vertical-through-via (VTV) connectors 467 for delivery of a voltage of power supply (Vcc), a voltage of ground reference (Vss), clock signals (CLK) or other signals to said each of its semiconductor integrated-circuit (IC) chips 100, first type of operation units 190 and first type of vertical-through-via (VTV) connectors 467. Each of its semiconductor integrated-circuit (IC) chips 100 and first type of operation units 190 may couple to one of its metal pads 583 through, in sequence, one or more of the interconnection metal layers 27 of its fan-out interconnection scheme for a logic drive or device (FOISD) 592 and one of the vertical through vias (VTV) 358 of one of its first type of vertical-through-via (VTV) connectors 467 for delivery of a voltage of power supply (Vcc), a voltage of ground reference (Vss), clock signals (CLK) or other signals to said each of its semiconductor integrated-circuit (IC) chips 100 and first type of operation units 190. Each of its semiconductor integrated-circuit (IC) chips 100, first type of operation units 190 and first type of vertical-through-via (VTV) connectors 467 may couple to one or more of its metal bumps, pillars or pads 570 through each of the interconnection metal layers 27 of its fan-out interconnection scheme for a logic drive or device (FOISD) 592 for delivery of a voltage of power supply (Vcc), a voltage of ground reference (Vss), clock signals (CLK) or other signals to said each of its semiconductor integrated-circuit (IC) chips 100, first type of operation units 190 and first type of vertical-through-via (VTV) connectors 467. One of its metal bumps, pillars or pads 570 vertically over each of its semiconductor integrated-circuit (IC) chips 100 and first type of operation units 190 may couple to one of its metal pads 583 vertically under said each of its semiconductor integrated-circuit (IC) chips 100 and first type of operation units 190 through, in sequence, each of the interconnection metal layers 27 of its fan-out interconnection scheme for a logic drive or device (FOISD) 592, one of the vertical through vias (VTVs) 358 of one of its first type of vertical-through-via (VTV) connectors 467 and the interconnection metal layer of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. Each of the vertical through vias (VTVs) 358 of each of its first type of vertical-through-via (VTV) connectors 467 may have a depth, for example, between 30 μm and 2,000 μm.

For the chip package 300 as seen in FIG. 27G, its metal pads 583 arranged in an array may include multiple dummy pads 583*a* each not connecting to any of its semiconductor integrated-circuit (IC) chips 100 and first type of operation units 190 but having mechanical functions for subsequent package-on-package (POP) assembly, formed on the bottom surface of its insulating dielectric layer 93 and vertically under one of its semiconductor integrated-circuit (IC) chips 100, first type of operation units 190 and polymer layer 92. Each of its dummy pads 583*a* may have no connection to any of the vertical through vias (VTVs) 358 of any of its first type of vertical-through-via (VTV) connectors 467.

Figure 27H:
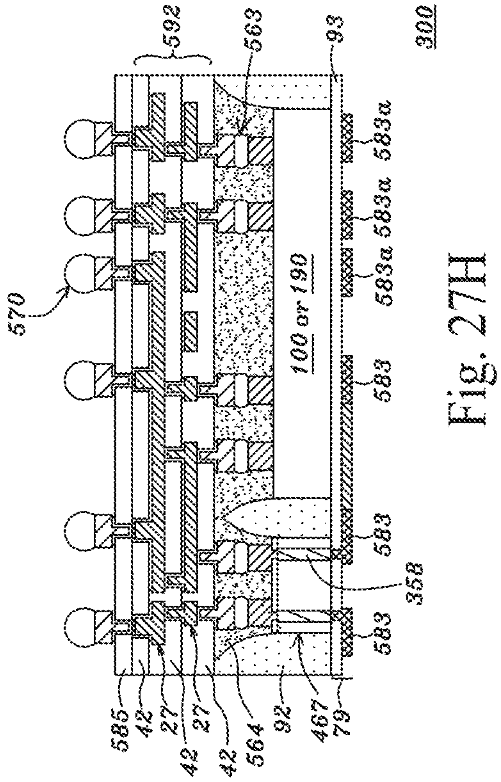
FIG. 27H is a schematically cross-sectional view showing a second type of single-chip/unit package in accordance with a first embodiment of the present application.

Alternatively, FIG. 27H is a schematically cross-sectional view showing a second type of single-chip/unit package in accordance with a first embodiment of the present application. The chip package 300 as seen in FIG. 27H may have a similar structure to that as illustrated in FIG. 27G. For an element indicated by the same reference number shown in FIGS. 27G and 27H, the specification of the element as seen in FIG. 27H may be referred to that of the element as illustrated in FIG. 27G. The difference between the chip packages as illustrated in FIGS. 27G and 27H is that the chip package as seen in FIG. 27H includes only one semiconductor integrated-circuit (IC) chip 100 or first type of operation unit 190 having the same specification as illustrated in FIG. 27A and one or more first type of vertical-through-via (VTV) connectors 467 having the same specification as illustrated in FIG. 27A. For the single-chip/unit package 300 as seen in FIG. 27H, its only one semiconductor integrated-circuit (IC) chip 100 or first type of operation unit 190 may couple to one of its metal pads 583 through, in sequence, one or more of the interconnection metal layers 27 of its fan-out interconnection scheme for a logic drive or device (FOISD) 592 and one of the vertical through vias (VTVs) 358 of one of its first type of vertical-through-via (VTV) connectors 467 for delivery of a voltage of power supply (Vcc), a voltage of ground reference (Vss), clock signals (CLK) or other signals to its only one semiconductor integrated-circuit (IC) chip 100 or first type of operation unit 190. Each of its only one semiconductor integrated-circuit (IC) chip 100 or first type of operation unit 190 and its first type of vertical-through-via (VTV) connectors 467 may couple to one or more of its metal bumps, pillars or pads 570 through each of the interconnection metal layers 27 of its fan-out interconnection scheme for a logic drive or device (FOISD) 592 for delivery of a voltage of power supply (Vcc), a voltage of ground reference (Vss), clock signals (CLK) or other signals to its only one semiconductor integrated-circuit (IC) chip 100 or first type of operation unit 190. One of its metal bumps, pillars or pads 570 vertically over its only one semiconductor integrated-circuit (IC) chip 100 or first type of operation unit 190 may couple to one of its metal pads 583 vertically under its only one semiconductor integrated-circuit (IC) chip 100 or first type of operation unit 190 through, in sequence, each of the interconnection metal layers 27 of its fan-out interconnection scheme for a logic drive or device (FOISD) 592, one of the vertical through vias (VTVs) 358 of one of its first type of vertical-through-via (VTV) connectors 467 and the interconnection metal layer of its backside interconnection scheme for a logic drive or device (BISD) 79 for delivery of a voltage of power supply (Vcc), a voltage of ground reference (Vss), clock signals (CLK) or other signals to its only one semiconductor integrated-circuit (IC) chip 100 or first type of operation unit 190. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. For example, its more than twenty first metal contacts, i.e., metal bumps, pillars or pads 570, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first type of vertical-through-via (VTV) connector(s) 467 may have a depth, for example, between 30 μm and 2,000 μm.

2. Second Type of Chip Package for Second Embodiment

Figure 30A:
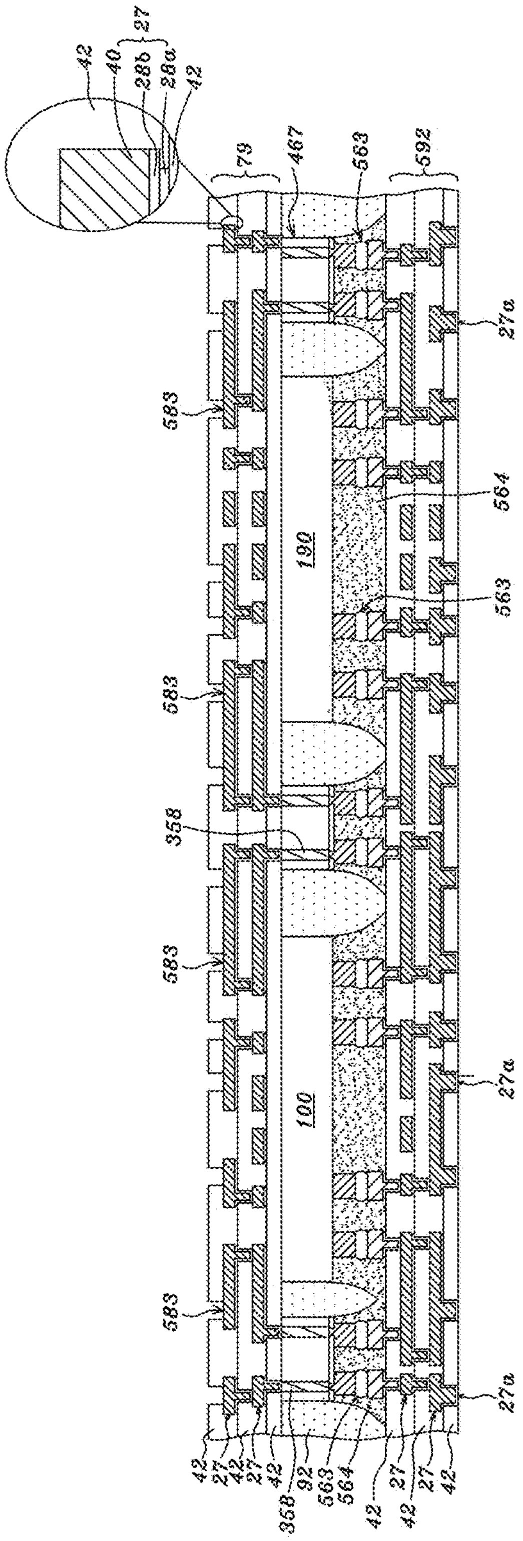
FIGS. 30A-30C are schematically cross-sectional views showing a process for forming a second type of multichip package in accordance with a second embodiment of the present application.
Figure 30B:
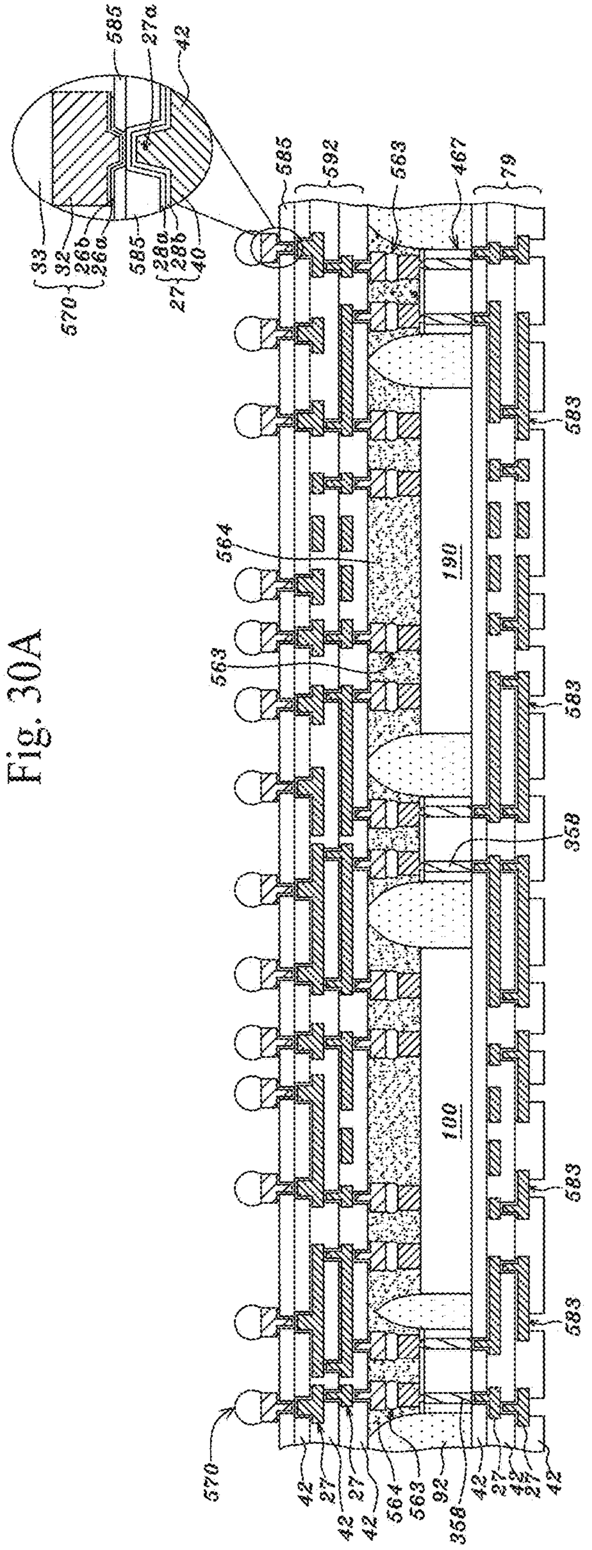
Figure 30C:
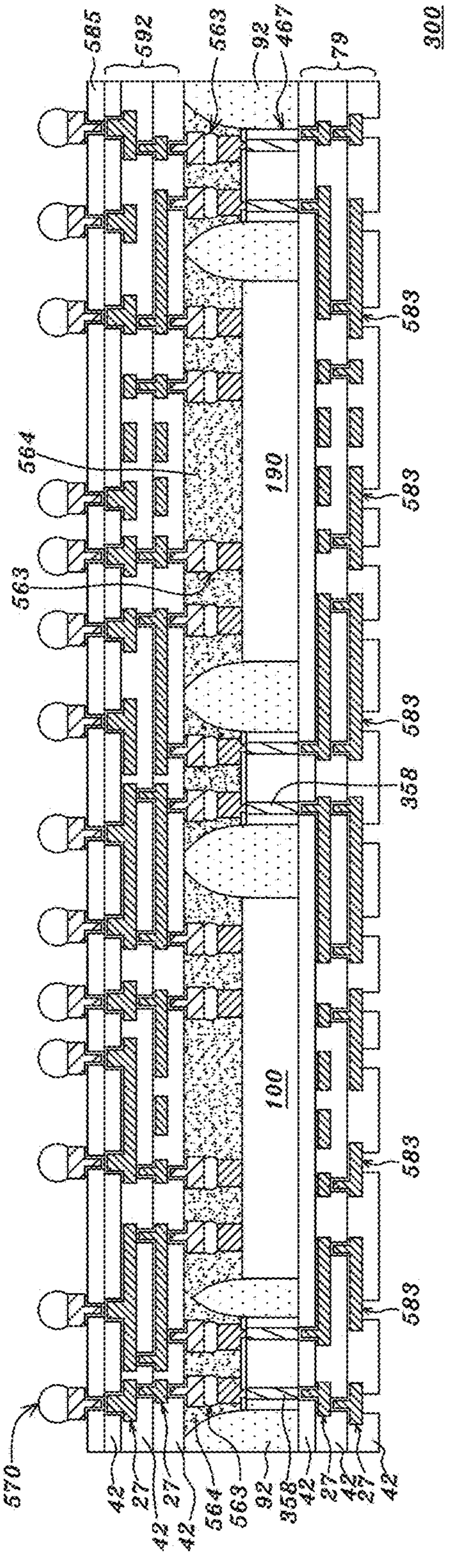

FIGS. 30A-30C are schematically cross-sectional views showing a process for forming a second type of multichip package in accordance with a second embodiment of the present application. After the structure as seen in FIG. 27E is formed, the backside interconnection scheme for a logic drive or device (BISD) 79 as illustrated in FIG. 23A may be formed over the backside of each of the semiconductor integrated-circuit (IC) chips 100, first type of operation units 190 and first type of vertical-through-via (VTV) connectors 467 and on the top surface of the polymer layer 92. The backside interconnection scheme for a logic drive or device (BISD) 79 may include one or more interconnection metal layers 27 coupling to each of the vertical through vias (VTVs) 358 of each of the first type of vertical-through-via (VTV) connectors 467 and one or more polymer layers 42, i.e., insulating dielectric layers, each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the backside of each of the semiconductor integrated-circuit (IC) chips 100, between the bottommost one of its interconnection metal layers 27 and the backside of each of the first type of operation units 190, between the bottommost one of its interconnection metal layers 27 and the backside of each of the first type of vertical-through-via (VTV) connectors 467 and between the bottommost one of its interconnection metal layers 27 and the top surface of the polymer layer 92, wherein each opening in the bottommost one of its polymer layers 42 may be vertically over the backside of one of the vertical through vias (VTVs) 358 of one of the first type of vertical-through-via (VTV) connectors 467. For the backside interconnection scheme for a logic drive or device (BISD) 79, each of its interconnection metal layers 27 may extend horizontally across an edge of each of the semiconductor integrated-circuit (IC) chips 100, first type of operation units 190 and first type of vertical-through-via (VTV) connectors 467. The topmost one of its interconnection metal layers 27 may be patterned with multiple metal pads 583 aligned with multiple respective openings in the topmost one of its polymer layers 42.

Referring to FIG. 30A, for the backside interconnection scheme for a logic drive or device (BISD) 79, each of its polymer layers 42 may be a layer of polyimide, BenzoCycloButene (BCB), parylene, polybenzoxazole (PBO), epoxy-based material or compound, photo epoxy SU-8, elastomer or silicone, having a thickness between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more lower portions in openings in one of its polymer layers 42 having a thickness between 0.3 μm and 20 μm, and an upper portion having a thickness 0.3 μm and 20 μm on said one of its polymer layers 42, (2) an adhesion layer 28*a*, such as titanium or titanium nitride having a thickness between 1 nm and 50 nm, at a bottom and sidewall of each of the one or more lower portions of the copper layer 40 of said each of the metal traces or lines and at a bottom of the upper portion of the copper layer 40 of said each of the metal traces or lines, and (3) a seed layer 28*b*, such as copper, between the copper layer 40 and adhesion layer 28*a* of said each of the metal traces or lines, wherein the upper portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm, and a width between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. Each of its interconnection metal layers 27 may have two planes used respectively for power and ground planes of a power supply and/or used as a heat dissipater or spreader for the heat dissipation or spreading, wherein each of the two planes may have a thickness, for example, between 5 μm and 50 μm, 5 μm and 30 μm, 5 μm and 20 μm, or 5 μm and 15 μm; or thicker than or equal to 5 μm, 10 μm, 20 μm, or 30 μm. The two planes may be layout as interlaced or interleaved shaped structures in a plane or may be layout in a fork shape.

Referring to FIG. 30A, each of the metal pads 583 may be of various types. A first type of metal pad 583 may include (1) an adhesion layer 28*a*, such as titanium (Ti) or titanium nitride (TiN) layer having a thickness between 1 nm and 50 nm, on a top surface of a second topmost one of the polymer layers 42 of the backside interconnection scheme for a logic drive or device (BISD) 79, (2) a seed layer 28*b*, such as copper, on a top surface of its adhesion layer 28*a*, and (3) a copper layer 40, i.e., copper pad, having a thickness between 0.3 μm and 20 μm on a top surface of its seed layer 28*b* and at a bottom of one of the openings in the topmost one of its polymer layers 42. Alternatively, a second type of metal pad 583 may include the adhesion layer 28*a*, seed layer 28*b* and copper layer 40 as mentioned above, and may further include a nickel layer, i.e., nickel pad, having a thickness between 0.5 μm and 10 μm on a top surface of its copper layer 32 and in one of the openings in the topmost one of its polymer layers 42. Alternatively, a tin-containing solder bump made of tin or a tin-silver alloy having a thickness between 1 μm and 50 μm may be formed on the top surface of the copper layer 32 of each of the first type of metal pads 583 or a top surface of the nickel layer of each of the second type of metal pads 583.

Next, the structure as seen in FIG. 30A may be flipped as seen in FIG. 30B to form the insulating dielectric layer 585 and the metal bumps, pillars or pads 570. Referring to FIG. 30B, the step for forming the insulating dielectric layer 585 and the metal bumps, pillars or pads 570 may have the same specifications as that illustrated in FIG. 27F. For an element indicated by the same reference number shown in FIGS. 27F and 30B, the specification of the element as seen in FIG. 30B may be referred to that of the element as illustrated in FIG. 27F.

Next, the insulating dielectric layer 585, the polymer layers 42 of the fan-out interconnection scheme for a logic drive or device (FOISD) 592, the polymer layer 92 and the polymer layers 42 of the backside interconnection scheme for a logic drive or device (BISD) 79 may be cut or diced to separate multiple individual chip packages 300 as shown in FIG. 30C each for the standard commodity logic drive as illustrated in FIG. 12A by a laser cutting process or by a mechanical cutting process. For the chip package 300 as seen in FIG. 30C, each of its semiconductor integrated-circuit (IC) chips 100 and first type of operation units 190 may couple to one of its metal pads 583 through, in sequence, one or more of the interconnection metal layers 27 of its fan-out interconnection scheme for a logic drive or device (FOISD) 592, one of the vertical through vias (VTVs) 358 of one of its first type of vertical-through-via (VTV) connectors 467 and each of the interconnection metal layer 27 of its backside interconnection scheme for a logic drive or device (BISD) 79 for delivery of a voltage of power supply (Vcc), a voltage of ground reference (Vss), clock signals (CLK) or other signals to said each of its semiconductor integrated-circuit (IC) chips 100 and first type of operation units 190. One of its metal bumps, pillars or pads 570 vertically over each of its semiconductor integrated-circuit (IC) chips 100 and first type of operation units 190 may couple to one of its metal pads 583 vertically under said each of its semiconductor integrated-circuit (IC) chips 100 and first type of operation units 190 through, in sequence, each of the interconnection metal layers 27 of its fan-out interconnection scheme for a logic drive or device (FOISD) 592, one of the vertical through vias (VTVs) 358 of one of its first type of vertical-through-via (VTV) connectors 467 and each of the interconnection metal layers 27 of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. Each of the vertical through vias (VTVs) 358 of each of its first type of vertical-through-via (VTV) connectors 467 may have a depth, for example, between 30 μm and 2,000 μm.

Figure 30D:
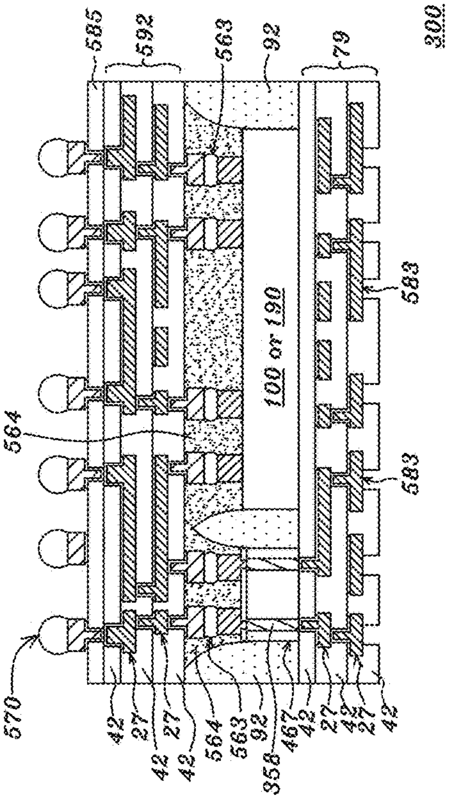
FIG. 30D is a schematically cross-sectional view showing a second type of single-chip/unit package in accordance with a second embodiment of the present application.

Alternatively, FIG. 30D is a schematically cross-sectional view showing a second type of single-chip/unit package in accordance with a second embodiment of the present application. The chip package 300 as seen in FIG. 30D may have a similar structure to that as illustrated in FIG. 30C. For an element indicated by the same reference number shown in FIGS. 30C and 30D, the specification of the element as seen in FIG. 30D may be referred to that of the element as illustrated in FIG. 30C. The difference between the chip packages as illustrated in FIGS. 30C and 30D is that the chip package as seen in FIG. 30D includes only one semiconductor integrated-circuit (IC) chip 100 or first type of operation unit 190 having the same specification as illustrated in FIG. 27A and one or more first type of vertical-through-via (VTV) connectors 467 having the same specification as illustrated in FIG. 27A. For the single-chip/unit package 300 as seen in FIG. 30D, its only one semiconductor integrated-circuit (IC) chip 100 or first type of operation unit 190 may couple to one of its metal pads 583 through, in sequence, one or more of the interconnection metal layers 27 of its fan-out interconnection scheme for a logic drive or device (FOISD) 592, one of the vertical through vias (VTVs) 358 of one of its first type of vertical-through-via (VTV) connectors 467 and each of the interconnection metal layers 27 of its backside interconnection scheme for delivery of a voltage of power supply (Vcc), a voltage of ground reference (Vss), clock signals (CLK) or other signals to its only one semiconductor integrated-circuit (IC) chip 100 and first type of operation unit 190. One of its metal bumps, pillars or pads 570 vertically over its only one semiconductor integrated-circuit (IC) chip 100 or first type of operation unit 190 may couple to one of its metal pads 583 vertically under its only one semiconductor integrated-circuit (IC) chip 100 or first type of operation unit 190 through, in sequence, each of the interconnection metal layers 27 of its fan-out interconnection scheme for a logic drive or device (FOISD) 592, one of the vertical through vias (VTVs) 358 of one of its first type of vertical-through-via (VTV) connectors 467 and each of the interconnection metal layers 27 of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. For example, its more than twenty first metal contacts, i.e., metal bumps, pillars or pads 570, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first type of vertical-through-via (VTV) connector(s) 467 may have a depth, for example, between 30 μm and 2,000 μm.

Figure 31:
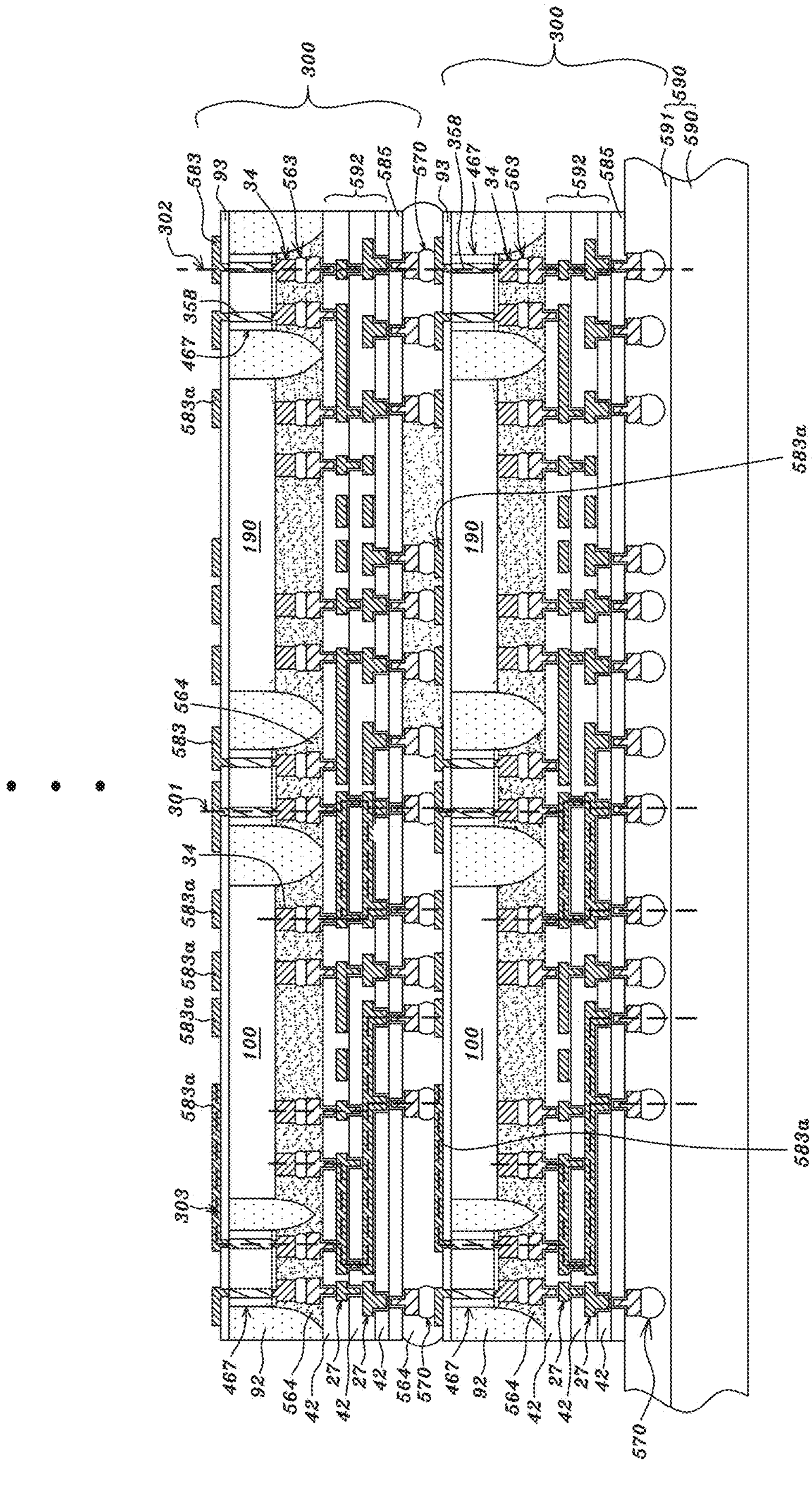
FIG. 31 is a schematically cross-sectional view showing a process for forming a package-on-package (POP) assembly for multiple first type of chip packages in accordance with a second embodiment of the present application.

3. Package-On-Package (POP) Assembly for First Type of Chip Packages for Second Embodiment FIG. 31 is a schematically cross-sectional view showing a process for forming a package-on-package (POP) assembly for multiple first type of chip packages in accordance with a second embodiment of the present application. Multiple first type of chip packages 300 as illustrated in FIG. 27H may be provided to be stacked together to form a package-on-package (POP) assembly as seen in FIG. 31.

Referring to FIG. 31, the temporary substrate (T-Sub) 590 as illustrated in FIG. 22A may be first provided. Next, the bottommost one of the first type of chip packages 300 as illustrated in FIG. 27G may be flipped to be attached onto the temporary substrate (T-sub) 590, wherein the bottommost one of the first type of chip packages 300 may have the metal bumps, pillars or pads 570 embedded in the sacrificial bonding layer 591 of the temporary substrate (T-Sub) 590. The sacrificial bonding layer 591 may have a top surface in contact with a bottom surface of the insulating dielectric layer 585 of the bottommost one of the first type of chip packages 300.

Next, referring to FIG. 31, in a first step, an upper one of the first type of chip packages 300 as illustrated in FIG. 27G may be flipped to have its metal bumps, pillars or pads 570 to be bonded respectively to the metal pads 583 of a lower one of the first type of chip packages 300 as illustrated in FIG. 27G or the tin-containing solder bumps on the metal pads 583 of the lower one of the first type of chip packages 300 as illustrated in FIG. 27G. Alternatively, an upper one of the first type of chip packages 300 as illustrated in FIG. 27H may be flipped to have its metal bumps, pillars or pads 570 to be bonded respectively to the metal pads 583 of a lower one of the first type of chip packages 300 as illustrated in FIG. 27H or the tin-containing solder bumps on the metal pads 583 of the lower one of the first type of chip packages 300 as illustrated in FIG. 27H. The first step may have the same specification or details as that illustrated in FIG. 24A. It is noted that the lower one of the first type of chip packages 300 may have the dummy pads 583*a* in a first group each coupling to one of the metal bumps, pillars or pads 570 of the upper one of the first type of chip packages 300 at a voltage (Vss) of ground reference and the dummy pads 583*a* in a second group each coupling to one of the metal bumps, pillars or pads 570 of the upper one of the first type of chip packages 300 without any electrical function.

Next, referring to FIG. 31, in a second step, an underfill 564 may be filled into a gap between the upper and lower ones of the first type of chip packages 300 to enclose the metal bumps, pillars or pads 570 of the upper one of the first type of chip packages 300.

Next, referring to FIG. 31, the above first and second steps may be alternately repeated multiple times to stack, one by one, multiple of the first type of chip packages 300 as illustrated in FIG. 27G or 27H having the number greater than or equal to two, such as four or eight.

Next, referring to FIG. 31, the temporary substrate (T-sub) 590 may be released as illustrated in FIG. 22E from the bottommost one of the first type of chip packages 300 to expose the metal bumps, pillars or pads 570 of the bottommost one of the first type of chip packages 300.

For the package-on-package (POP) assembly as illustrated in FIG. 31, the interconnection metal layers 27 of the fan-out interconnection scheme for a logic drive or device (FOISD) 592 of each of its first type of chip packages 300 may have the same circuit layout as those of each of the other(s) of its first type of chip packages 300 and the interconnection metal layer of the backside interconnection scheme for a logic drive or device (BISD) 79 of each of its first type of chip packages 300 may have the same circuit layout as that of each of the other(s) of its first type of chip packages 300. Each of the metal bumps, pillars or pads 570 of each of its first type of chip packages 300 may be vertically aligned with one of the metal pads 583 of said each of its first type of chip packages 300, one of the metal bumps, pillars or pads 570 of each of the other(s) of its first type of chip packages 300 and one of the metal pads 583 of each of the other(s) of its first type of chip packages 300. The package-on-package (POP) assembly as illustrated in FIG. 31 may be provided with the first, second and third interconnects 301, 302 and 303 as illustrated in FIG. 24A for delivery of a voltage of power supply (Vcc), a voltage of ground reference (Vss), clock signals (CLK) or other signals.

Alternatively, for the package-on-package (POP) assembly as illustrated in FIG. 31, the interconnection metal layers 27 of the fan-out interconnection scheme for a logic drive or device (FOISD) 592 of each of its first type of chip packages 300 may have a different circuit layout from those of each of the other(s) of its first type of chip packages 300 in order to provide the fourth, fifth, sixth interconnects 304, 305 and 306 as illustrated in FIG. 24B for delivery of a voltage of power supply (Vcc), a voltage of ground reference (Vss), clock signals (CLK) or other signals.

Figure 32:
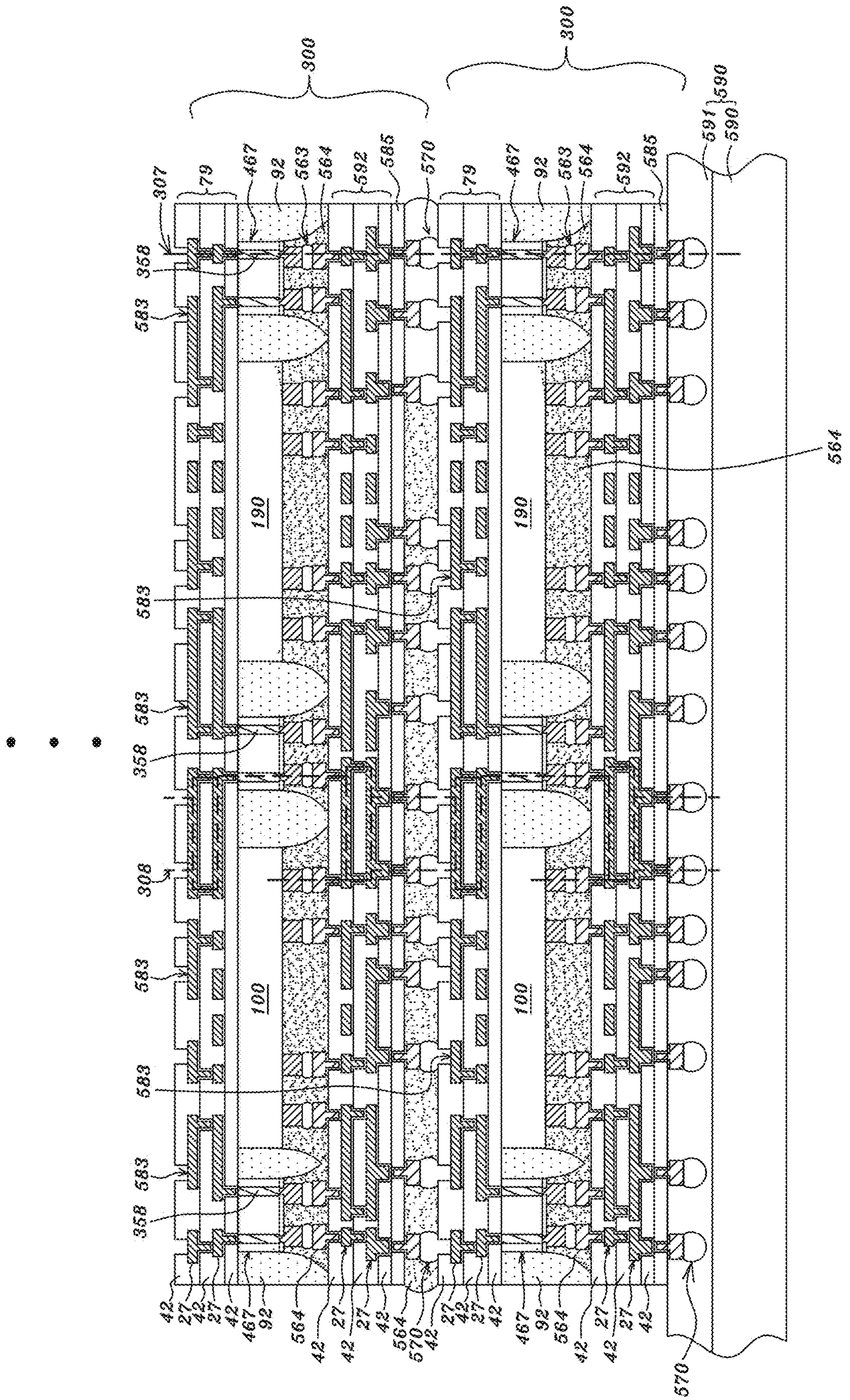
FIG. 32 is a schematically cross-sectional view showing a process for forming a package-on-package (POP) assembly for multiple second type of chip packages in accordance with a second embodiment of the present application.

4. Package-On-Package (POP) Assembly for Second Type of Chip Packages for Second Embodiment FIG. 32 is a schematically cross-sectional view showing a process for forming a package-on-package (POP) assembly for multiple second type of chip packages in accordance with a second embodiment of the present application. Multiple second type of chip packages 300 as illustrated in FIG. 30C may be provided to be stacked together to form a package-on-package (POP) assembly as seen in FIG. 32.

Referring to FIG. 32, the temporary substrate (T-Sub) 590 as illustrated in FIG. 22A may be first provided. Next, the bottommost one of the second type of chip packages 300 as illustrated in FIG. 30C may be flipped to be attached onto the temporary substrate (T-sub) 590, wherein the bottommost one of the second type of chip packages 300 may have the metal bumps, pillars or pads 570 embedded in the sacrificial bonding layer 591 of the temporary substrate (T-Sub) 590. The sacrificial bonding layer 591 may have a top surface in contact with a bottom surface of the insulating dielectric layer 585 of the bottommost one of the second type of chip packages 300.

Next, referring to FIG. 32, in a first step, an upper one of the second type of chip packages 300 as illustrated in FIG. 30C may be flipped to have the metal bumps, pillars or pads 570 to be bonded respectively to the metal pads 583 of a lower one of the second type of chip packages 300 as illustrated in FIG. 30C or the tin-containing solder bumps on the metal pads 583 of the lower one of the second type of chip packages 300 as illustrated in FIG. 30C. Alternatively, an upper one of the second type of chip packages 300 as illustrated in FIG. 30D may be flipped to have the metal bumps, pillars or pads 570 to be bonded respectively to the metal pads 583 of a lower one of the second type of chip packages 300 as illustrated in FIG. 30D or the tin-containing solder bumps on the metal pads 583 of the lower one of the second type of chip packages 300 as illustrated in FIG. 30D. The first step may have the same specification or details as that illustrated in FIG. 24A.

Next, referring to FIG. 32, in a second step, an underfill 564 may be filled into a gap between the upper and lower ones of the second type of chip packages 300 to enclose the metal bumps, pillars or pads 570 of the upper one of the second type of chip packages 300.

Next, referring to FIG. 32, the above first and second steps may be alternately repeated multiple times to stack, one by one, multiple of the second type of chip packages 300 as illustrated in FIG. 30C or 30D having the number greater than or equal to two, such as four or eight.

Next, referring to FIG. 32, the temporary substrate (T-sub) 590 may be released as illustrated in FIG. 22E from the bottommost one of the second type of chip packages 300 to expose the metal bumps, pillars or pads 570 of the bottommost one of the second type of chip packages 300.

For the package-on-package (POP) assembly as illustrated in FIG. 32, the interconnection metal layers 27 of the fan-out interconnection scheme for a logic drive or device (FOISD) 592 of each of its second type of chip packages 300 may have the same circuit layout as those of each of the other(s) of its second type of chip packages 300 and the interconnection metal layers 27 of the backside interconnection scheme for a logic drive or device (BISD) 79 of each of its second type of chip packages 300 may have the same circuit layout as those of each of the other(s) of its second type of chip packages 300. Each of the metal bumps, pillars or pads 570 of each of its second type of chip packages 300 may be vertically aligned with one of the metal pads 583 of said each of its second type of chip packages 300, one of the metal bumps, pillars or pads 570 of each of the other(s) of its second type of chip packages 300 and one of the metal pads 583 of each of the other(s) of its second type of chip packages 300. The package-on-package (POP) assembly as illustrated in FIG. 32 may be provided with the seventh and eighth interconnects 307 and 308 as illustrated in FIG. 25 for delivery of a voltage of power supply (Vcc), a voltage of ground reference (Vss), clock signals (CLK) or other signals.

Specification for Interposer

1. First Type of Interposer

Figure 33A:
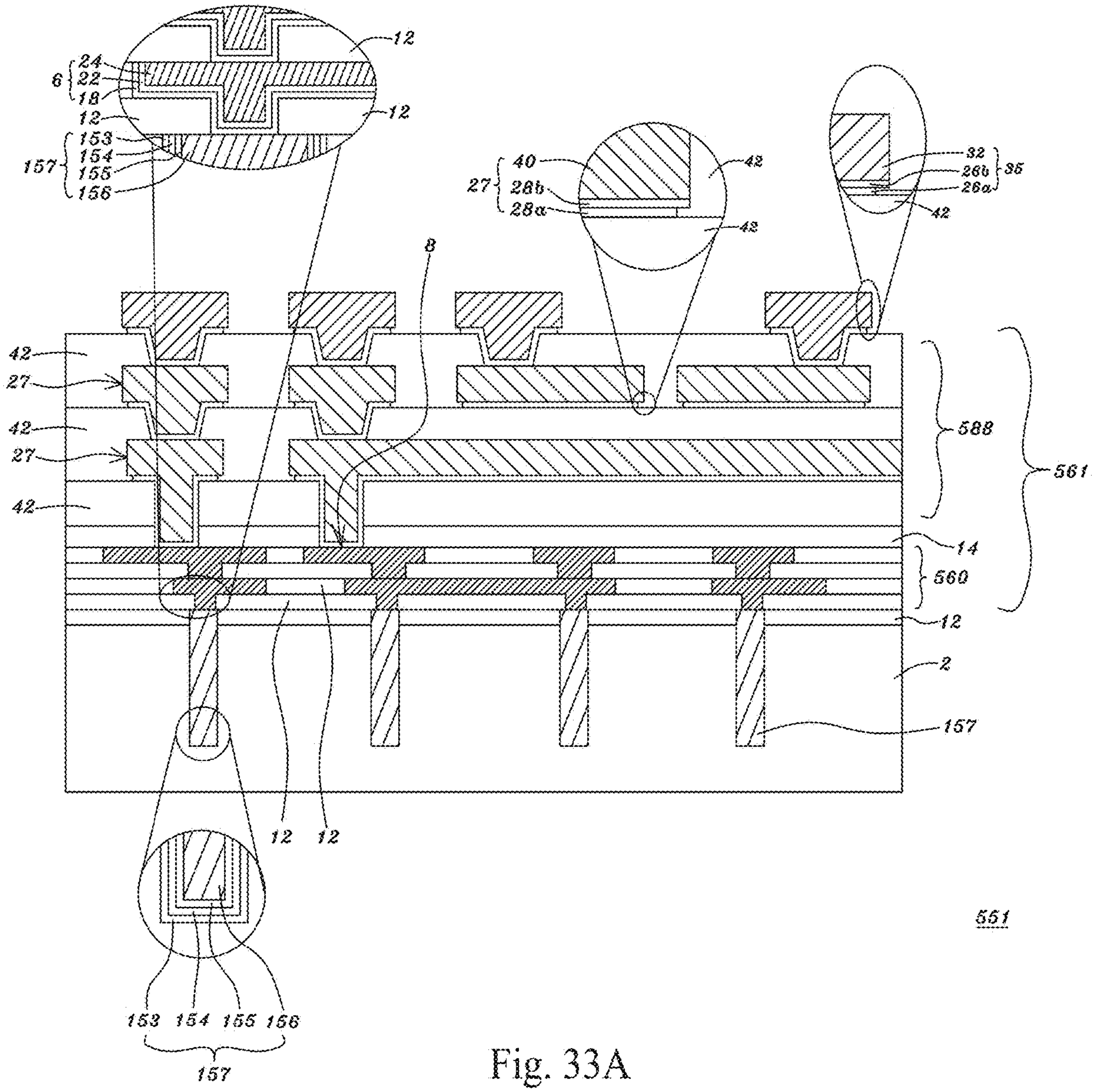
FIG. 33A is a schematically cross-sectional view showing a first type of interposer in accordance with an embodiment of the present application.

FIG. 33A is a schematically cross-sectional view showing a first type of interposer in accordance with an embodiment of the present application. Referring to FIG. 33A, the first type of interposer 551 may have the same specifications as the first or second type of fine-line interconnection bridge (FIB) 690 illustrated in FIG. 13A or 13B. For an element indicated by the same reference number shown in FIGS. 13A, 13B and 33A, the specification of the element as seen in FIG. 33A may be referred to that of the element as illustrated in FIG. 13A or 13B. The difference between the first type of interposer 551 and the first or second type of fine-line interconnection bridge (FIB) 690 is that the first type of interposer 551 further includes (1) another insulating dielectric layer 12 on a top surface of its semiconductor substrate 2 and under the bottommost one of the insulating dielectric layers 12 of its first interconnection scheme 560, (2) multiple through silicon vias (TSVs) 157 each in its semiconductor substrate 2 and passing through an opening in its another insulating dielectric layer 12 as illustrated in FIGS. 1A-1F, wherein each of the through silicon vias (TSVs) 157 may have a top surface substantially coplanar with a top surface of its another insulating dielectric layer 12 and couple to one or more of the interconnection metal layers 6 of its first interconnection scheme 560 and (3) multiple micro-bumps or micro-pads 35 each being of one of the first through fourth types having the same specifications as the first through fourth types of micro-bumps or micro-pads 35 respectively as illustrated in FIG. 26 and having the adhesion layer 26*a*, such as titanium (Ti) or titanium nitride (TiN) layer having a thickness between 1 nm and 50 nm, on one of the metal pads of the topmost one of the interconnection metal layers 27 of its second interconnection scheme 588 or on one of the metal pads 8 of the topmost one of the interconnection metal layers 6 of its first interconnection scheme 560 at a bottom of one of the openings in its passivation layer 14.

2. Second Type of Interposer

Figure 33B:
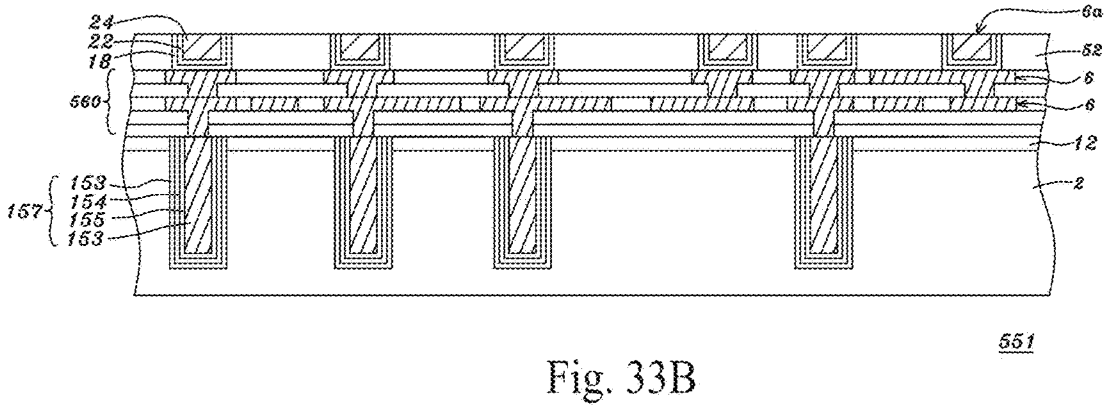
FIG. 33B is a schematically cross-sectional view showing a second type of interposer in accordance with an embodiment of the present application.

FIG. 33B is a schematically cross-sectional view showing a second type of interposer in accordance with an embodiment of the present application. Referring to FIG. 33B, the second type of interposer 551 may have the same specifications as the first type of interposer illustrated in FIG. 33A. For an element indicated by the same reference number shown in FIGS. 33A and 33B, the specification of the element as seen in FIG. 33B may be referred to that of the element as illustrated in FIG. 33A. The difference between the first and second types of interposers 551 is that the second type of interposer 551 may further include (1) an insulating bonding layer 52 at its active side and on the topmost one of the insulating dielectric layers 12 of its first interconnection scheme 560 and (2) multiple metal pads 6*a* at its active side and in multiple openings 52*a* in its insulating bonding layer 52 and on the topmost one of the interconnection metal layers 6 of its first interconnection scheme 560, instead of the passivation layer 14, second interconnection scheme 560 and micro-bumps or micro-pads 35 as seen in FIG. 33A. The insulating bonding layer 52 and metal pads 6*a* may have the same specifications and materials as those illustrated in FIG. 14D.

Third Embodiment for Chip Package Based on Interposer

1. First Type of Chip Package for Third Embodiment

Figure 35A:
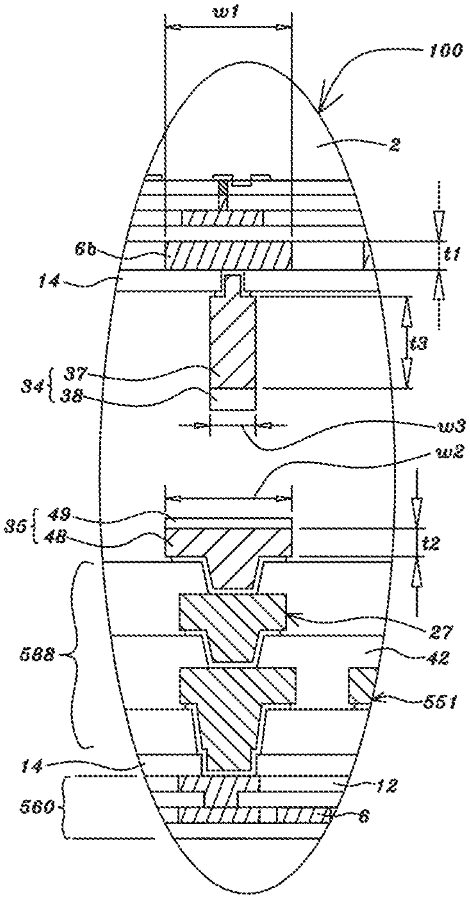
FIGS. 35A and 35B are schematically cross-sectional views showing a process of bonding a thermal compression bump of a semiconductor integrated-circuit (IC) chip to a thermal compression pad of an interposer in accordance with an embodiment of the present application.
Figure 35B:
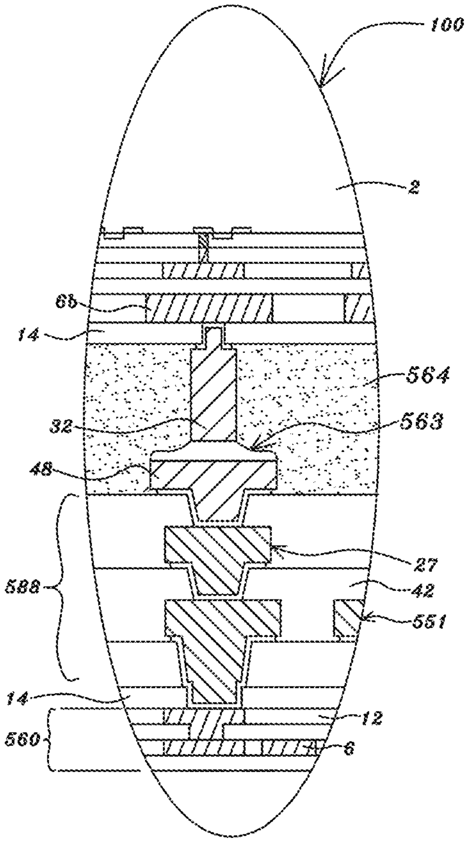
Figure 36B:
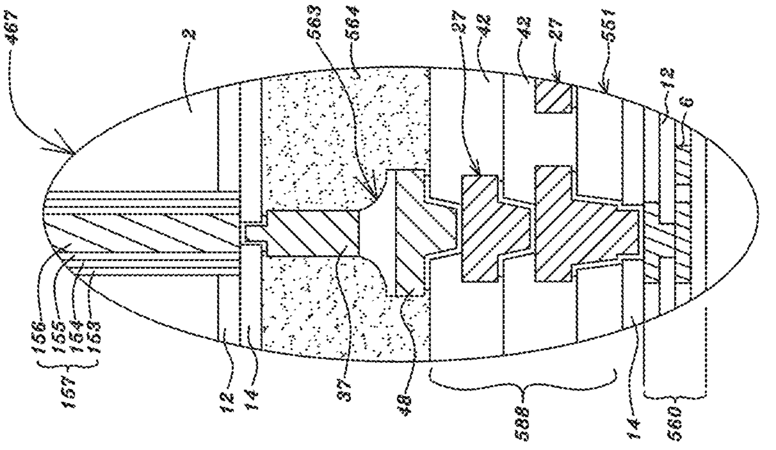
FIGS. 36A and 36B are schematically cross-sectional views showing a process of bonding a thermal compression bump of a first type of vertical-through-via (VTV) connector to a thermal compression pad of an interposer in accordance with an embodiment of the present application.
Figure 36A:
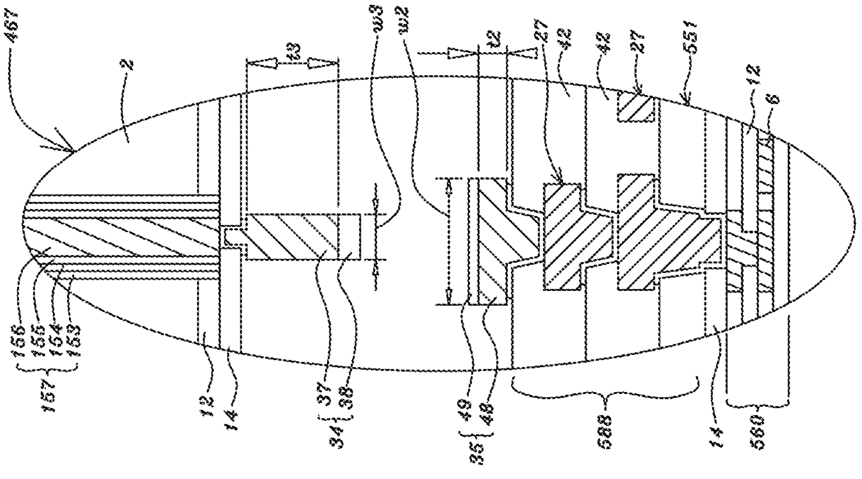

FIGS. 34A-34H are schematically cross-sectional views showing a process for forming a first type of multichip package in accordance with a third embodiment of the present application. For the first type of interposer 551, an interconnection scheme 561 shown in FIGS. 34A-34H may represent its first interconnection scheme 560 and second interconnection scheme 588 as seen in FIG. 33A or, if the second interconnection scheme 588 is not provided for the first type of interposer 551, represent its first interconnection scheme 560 as seen in FIG. 33A. FIGS. 35A and 35B are schematically cross-sectional views showing a process of bonding a thermal compression bump of a semiconductor integrated-circuit (IC) chip to a thermal compression pad of an interposer in accordance with an embodiment of the present application. FIGS. 36A and 36B are schematically cross-sectional views showing a process of bonding a thermal compression bump of a first type of vertical-through-via (VTV) connector to a thermal compression pad of an interposer in accordance with an embodiment of the present application.

Figure 34A:
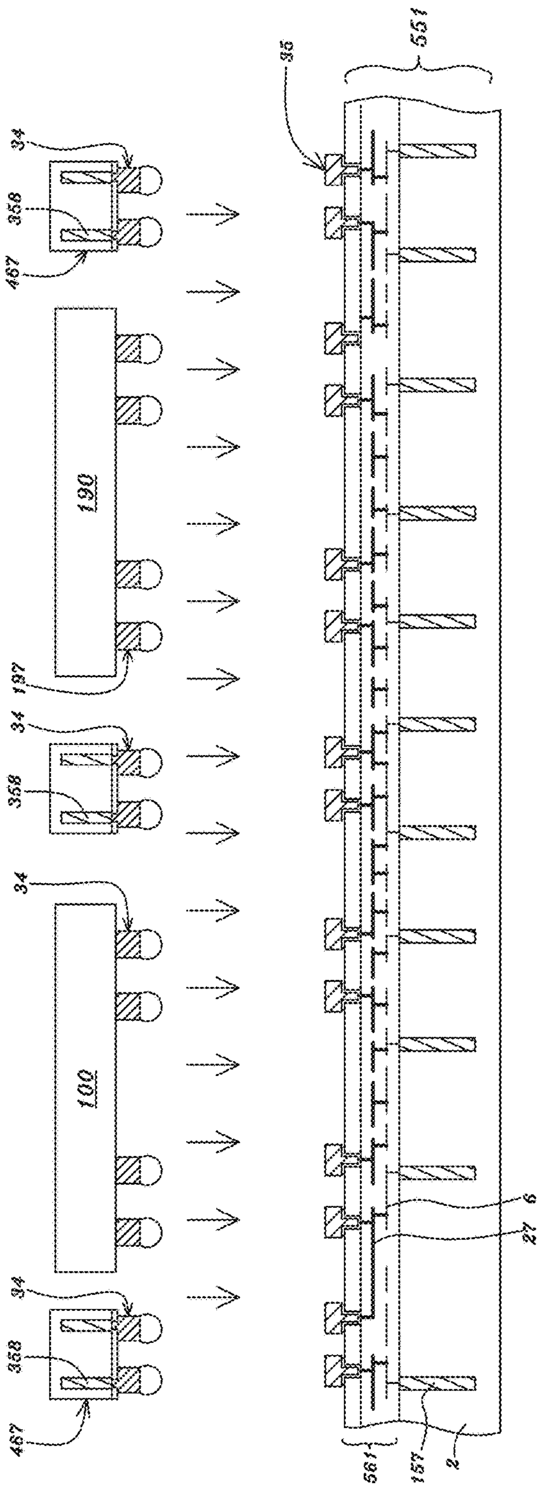
FIGS. 34A-34H are schematically cross-sectional views showing a process for forming a first type of multichip package in accordance with a third embodiment of the present application.

Referring to FIG. 34A, multiple semiconductor integrated-circuit (IC) chips 100, each of which may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip, each may have the same specification as illustrated in FIG. 14A or 14B, provided with the first, second or third type of micro-bumps or micro-pads 34. Further, referring to FIG. 27A, multiple first type of operation units 190, each of which may have the same specification as illustrated in FIG. 17F, 17G, 19G or 19H, each may be provided with the first, second or third type of micro-bumps or micro-pads 197. Further, multiple first type of vertical-through-via (VTV) connectors 467 each may have the same specification as illustrated in FIG. 1A, 1C, 1E, 2A, 2C or 2E, provided with the first, second or third type of micro-bumps or micro-pads 34, may have the same specification as illustrated in FIG. 4A, 4B, 4C, 5A, 5B or 5C, provided with the fifth type of micro-bumps or micro-pads 34, or may have the same specification as illustrated in FIG. 6, provided with the sixth type of micro-bumps or micro-pads 34. Further, a first type of interposer 551, which may have the same specification as illustrated in FIG. 33A, may be provided with the first, second or fourth type of micro-bumps or micro-pads 35.

The step of bonding each of the micro-bumps or micro-pads 34 or 197 of each of the semiconductor integrated-circuit (IC) chips 100, first type of operation units 190 and first type of vertical-through-via (VTV) connectors 467 to one of the micro-bumps or micro-pads 35 of the first type of interposer 551 as seen in FIGS. 34A, 34B, 35A, 35B, 36A and 36B may be referred to the step of bonding each of the micro-bumps or micro-pads 34 or 197 of each of the semiconductor integrated-circuit (IC) chips 100, first type of operation units 190 and first type of vertical-through-via (VTV) connectors 467 to one of the micro-bumps or micro-pads 35 of the fan-out interconnection scheme for a logic drive or device (FOISD) 592 for each of the first through eighth cases as illustrated in FIGS. 27A, 27B, 28A, 28B, 29A and 29B.

Figure 34B:
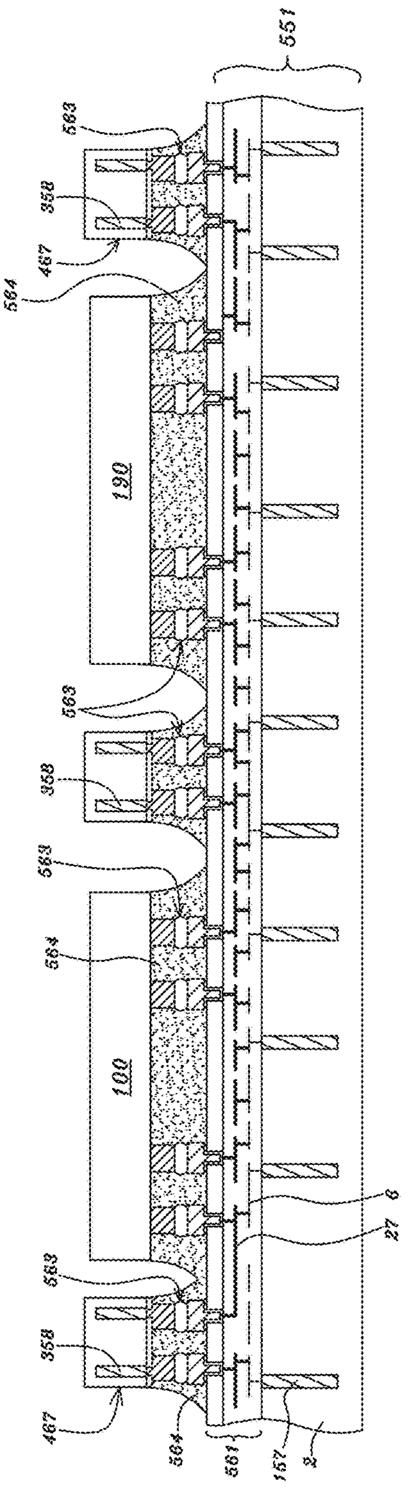

Next, referring to FIG. 34B, an underfill 564, such as a layer of polymer or epoxy resins or compounds, may be filled into a gap between each of the semiconductor integrated-circuit (IC) chips 100, first type of operation units 190 and first type of vertical-through-via (VTV) connectors 467 and the first type of interposer 551 to enclose the bonded contacts 563 therebetween. The underfill 564 may be cured at temperature equal to or above 100, 120 or 150 degrees Celsius.

Figure 34C:
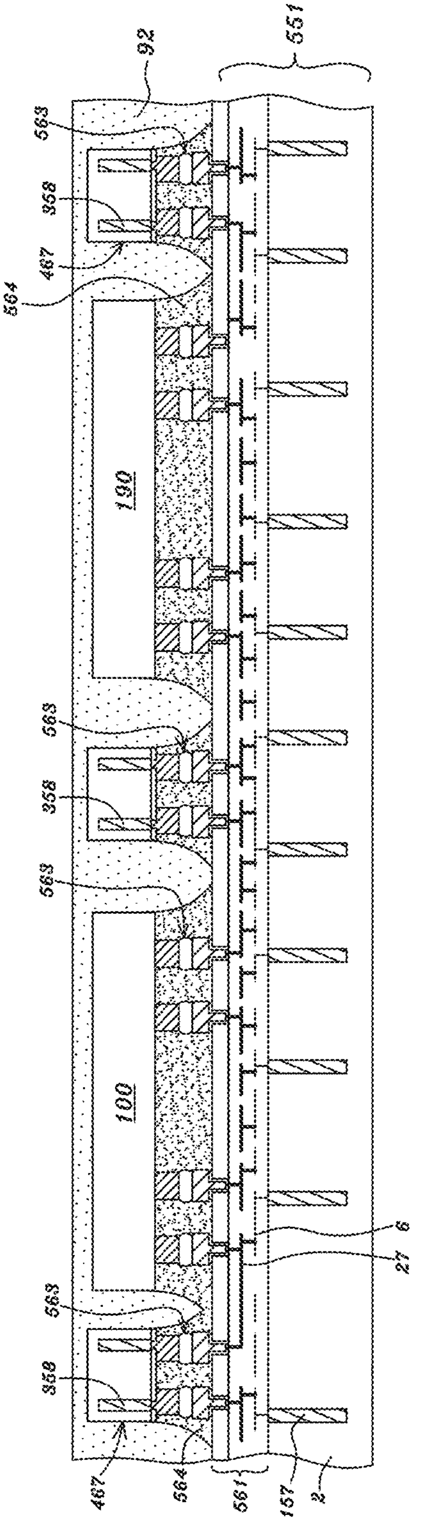

Next, referring to FIG. 34C, a polymer layer 92, e.g., resin or compound, may be applied to fill a gap between each neighboring two of the semiconductor integrated-circuit (IC) chips 100, first type of operation units 190 and first type of vertical-through-via (VTV) connectors 467 and to cover a backside of each of the semiconductor integrated-circuit (IC) chips 100, first type of operation units 190 and first type of vertical-through-via (VTV) connectors 467 by methods, for example, spin-on coating, screen-printing, dispensing or molding. The polymer layer 92 may have the same specification or material as that illustrated in FIG. 22B.

Figure 34D:
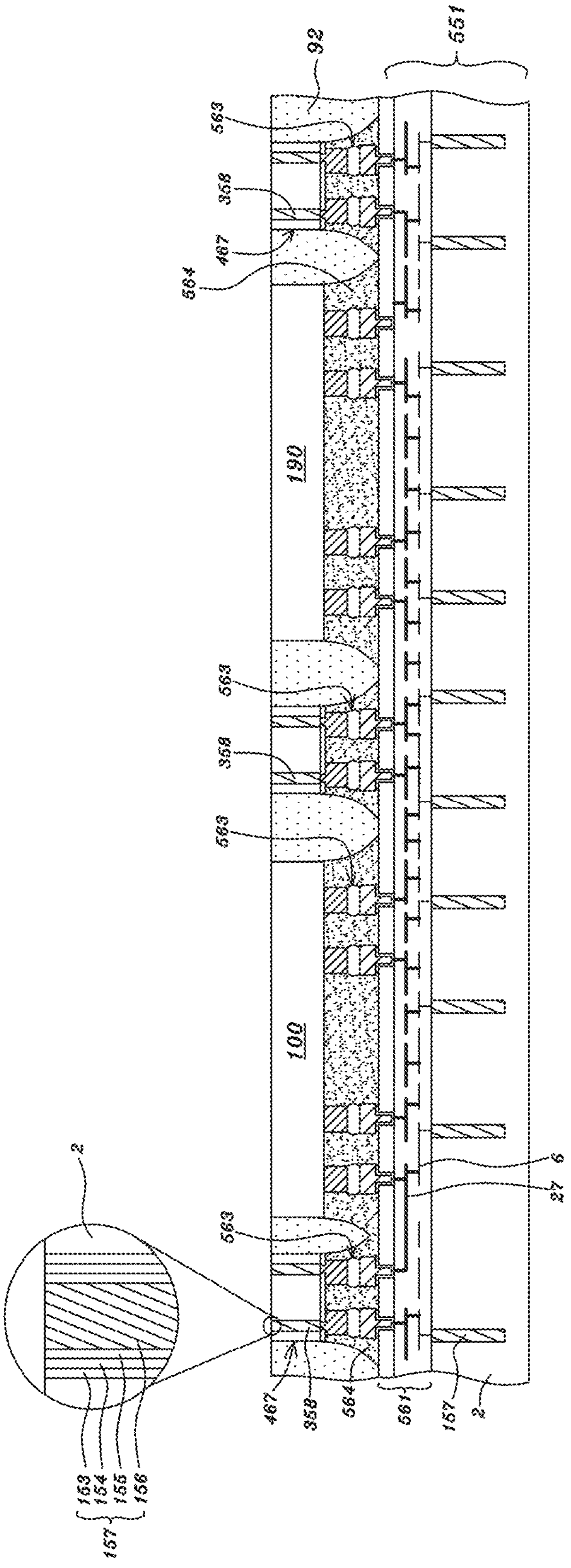

Next, referring to FIG. 34D, a chemical mechanical polishing (CMP), polishing or grinding process may be applied to remove a top portion of the polymer layer 92, a top portion of each of the semiconductor integrated-circuit (IC) chips 100, a top portion of each of the first type of operation units 190 and a top portion of each of the first type of vertical-through-via (VTV) connectors 467 and to expose a backside of each of the vertical through vias (VTVs) 358 of each of the first type of vertical-through-via (VTV) connectors 467. Each of the vertical through vias (VTVs) 358 of said each of the first type of vertical-through-via (VTV) connectors 467 may have the same specifications as that illustrated in FIG. 27C.

Figure 34E:
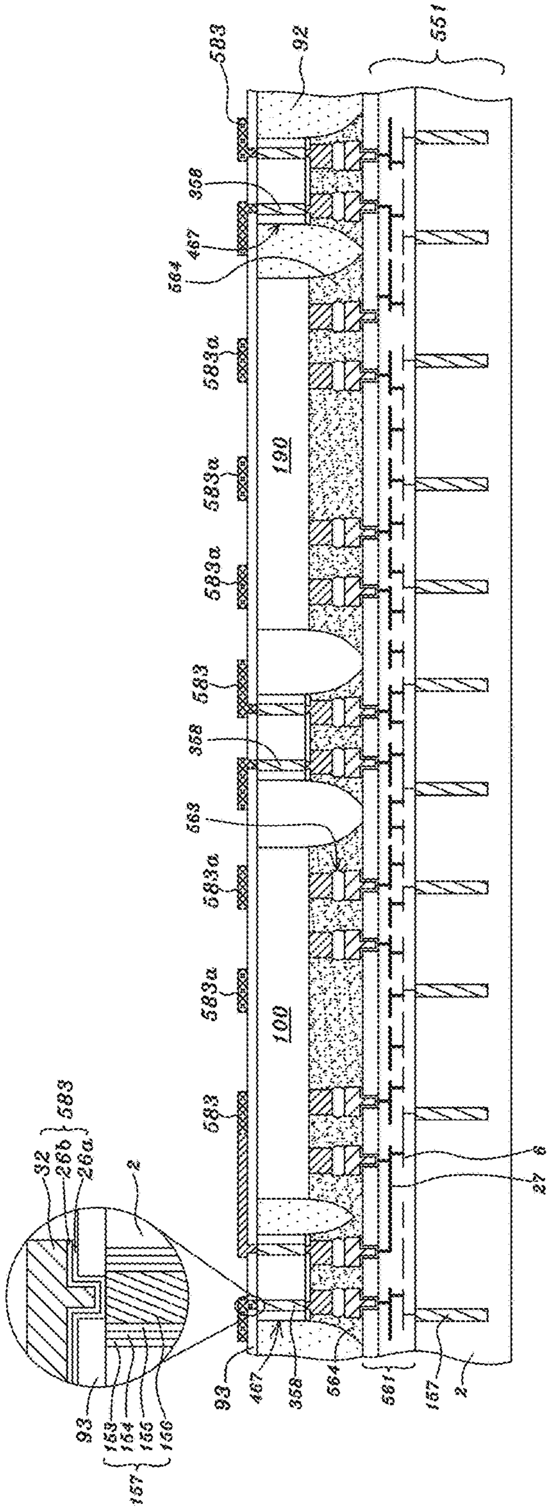

Next, referring to FIG. 34E, a backside interconnection scheme for a logic drive or device (BISD) 79 may be formed on the backside of each of the semiconductor integrated-circuit (IC) chips 100, the backside of each of the first type of operation units 190, the backside of each of the first type of vertical-through-via (VTV) connectors 467 and the top surface of the polymer layer 92. The backside interconnection scheme for a logic drive or device (BISD) 79 may have the same specifications as that illustrated in FIG. 27D.

Figure 34F:
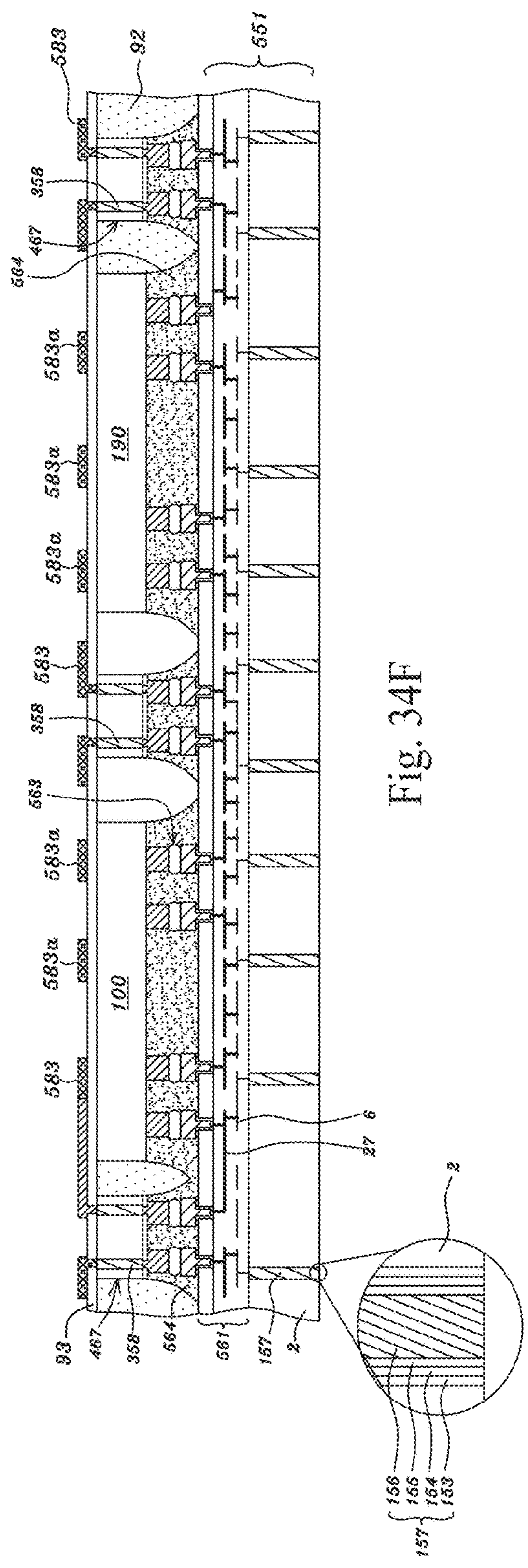

Next, referring to FIG. 34F, a chemical mechanical polishing (CMP), polishing or grinding process may be applied to remove a bottom portion of the semiconductor substrate 2 of the first type of interposer 551 and to expose a backside of the copper layer 156 of each of the through silicon vias (TSVs) 157 of the first type of interposer 551. For each of the through silicon vias (TSVs) 157 of the first type of interposer 551, its insulating lining layer 153, adhesion layer 154 and seed layer 155 at its backside may be removed to expose a backside of its copper layer 156, which may be coplanar with a backside of the semiconductor substrate 2 of the first type of interposer 551, and its insulating lining layer 153, adhesion layer 154 and seed layer 155 at a sidewall of its copper layer 156 may be left.

Figure 34G:
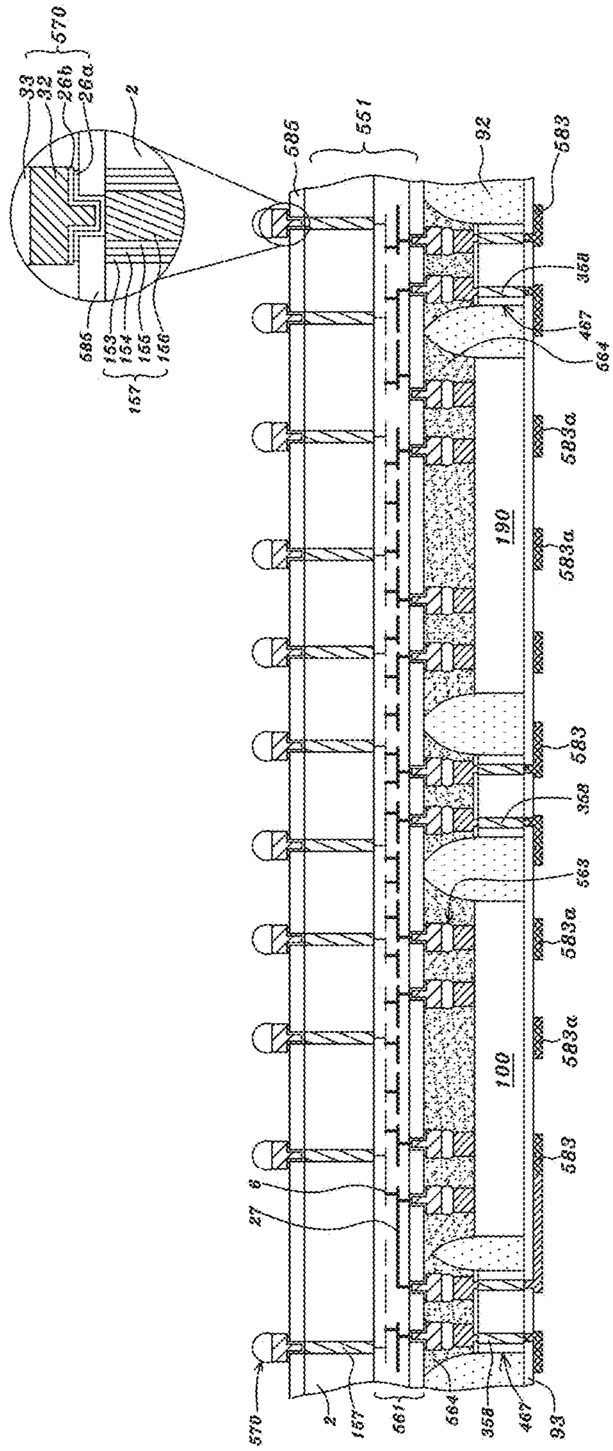

Next, referring to FIG. 34G, the structure as seen in FIG. 34F is flipped to form an insulating dielectric layer 585 on the backside of the semiconductor substrate 2 of the first type of interposer 551, wherein each opening in the insulating dielectric layer 585 may be vertically under the backside of the copper layer 156 of one of the through silicon vias (TSVs) 157 of the first type of interposer 551, and multiple metal bumps, pillars or pads 570 in an array each on the backside of the copper layer 156 of one of the through silicon vias (TSVs) 157 of the first type of interposer 551 at a top of one of the openings in the insulating dielectric layer 585. The insulating dielectric layer 585 may be a layer of polymer, such as polyimide, BenzoCycloButene (BCB), parylene, polybenzoxazole (PBO), epoxy-based material or compound, photo epoxy SU-8, elastomer or silicone, having a thickness between 3 and 30 micrometers or between 5 and 15 micrometers. Each of the metal bumps, pillars or pads 570 may be of one of the first through third types having the same specifications as the first through third types of metal bumps, pillars or pads 570 as illustrated in FIG. 22G respectively, wherein each of the metal bumps or pillars 570 may be of the first or second type, including the adhesion layer 26*a*, such as titanium (Ti) or titanium nitride (TiN) layer having a thickness between 1 nm and 50 nm, on the backside of the copper layer 156 of one of the through silicon vias (TSVs) 157 of the first type of interposer 551, or of the third type, including the gold layer, i.e., gold bump, having a thickness between 3 and 15 micrometers over the backside of the copper layer 156 of one of the through silicon vias (TSVs) 157 of the first type of interposer 551.

Figure 34H:
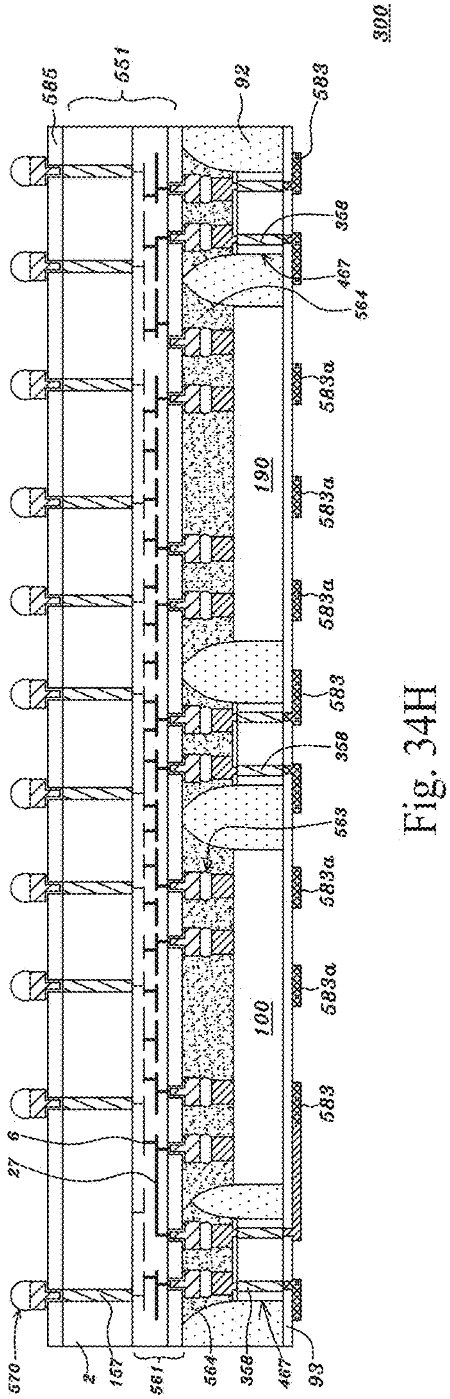

Next, the insulating dielectric layer 585, first type of interposer 551, polymer layer 92 and insulating dielectric layer 93 may be cut or diced to separate multiple individual chip packages 300 as shown in FIG. 34H each for the standard commodity logic drive as illustrated in FIG. 12A by a laser cutting process or by a mechanical cutting process. For the chip package 300 as seen in FIG. 34H, one or more of the interconnection metal layers 6 and/or 27 of the first and/or second interconnection schemes 560 and/or 588 of its first type of interposer 551 may couples each of its semiconductor integrated-circuit (IC) chips 100, first type of operation units 190 and first type of vertical-through-via (VTV) connectors 467 to the other of its semiconductor integrated-circuit (IC) chips 100, first type of operation units 190 and first type of vertical-through-via (VTV) connectors 467. Each of its semiconductor integrated-circuit (IC) chips 100 and first type of operation units 190 may couple to one of its metal pads 583 through, in sequence, one or more of the interconnection metal layers 6 and/or 27 of the first and/or second interconnection schemes 560 and/or 588 of its first type of interposer 551 and one of the vertical through vias (VTV) 358 of one of its first type of vertical-through-via (VTV) connectors 467. Each of its semiconductor integrated-circuit (IC) chips 100, first type of operation units 190 and first type of vertical-through-via (VTV) connectors 467 may couple to one of its metal bumps, pillars or pads 570 through, in sequence, each of the interconnection metal layers 6 and/or 27 of the first and/or second interconnection schemes 560 and/or 588 of its first type of interposer 551 and one of the through silicon vias (TSVs) 157 of its first type of interposer 551. One of its metal bumps, pillars or pads 570 vertically over each of its semiconductor integrated-circuit (IC) chips 100 and first type of operation units 190 may couple to one of its metal pads 583 vertically under said each of its semiconductor integrated-circuit (IC) chips 100 and first type of operation units 190 through, in sequence, one of the through silicon vias (TSVs) 157 of its first type of interposer 551, each of the interconnection metal layers 6 and/or 27 of the first and/or second interconnection schemes 560 and/or 588 of its first type of interposer 551, one of the vertical through vias (VTVs) 358 of one of its first type of vertical-through-via (VTV) connectors 467 and the interconnection metal layer of its backside interconnection scheme for a logic drive or device (BISD) 79. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. Each of the vertical through vias (VTVs) 358 of each of its first type of vertical-through-via (VTV) connectors 467 may have a depth, for example, between 30 μm and 2,000 μm.

For the chip package 300 as seen in FIG. 34H, its metal pads 583 arranged in an array may include multiple dummy pads 583*a* each not connecting to any of its semiconductor integrated-circuit (IC) chips 100 and first type of operation units 190 but having mechanical functions for subsequent package-on-package (POP) assembly, formed on the bottom surface of its insulating dielectric layer 93 and vertically under one of its semiconductor integrated-circuit (IC) chips 100, first type of operation units 190 and polymer layer 92. Each of its dummy pads 583*a* may have no connection to any of the vertical through vias (VTVs) 358 of any of its first type of vertical-through-via (VTV) connectors 467.

Figure 37A:
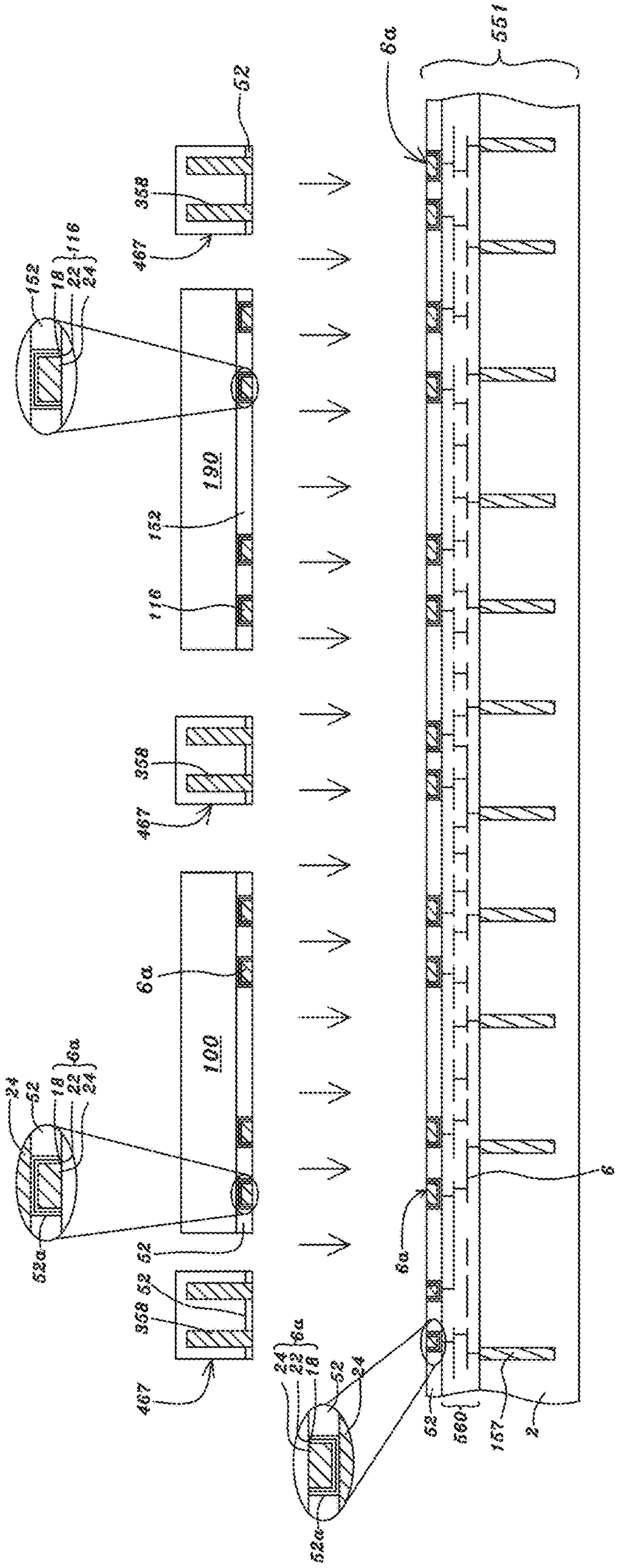
FIGS. 37A-37C are schematically cross-sectional views showing another process for forming a first type of multichip package in accordance with a third embodiment of the present application.
Figure 37B:
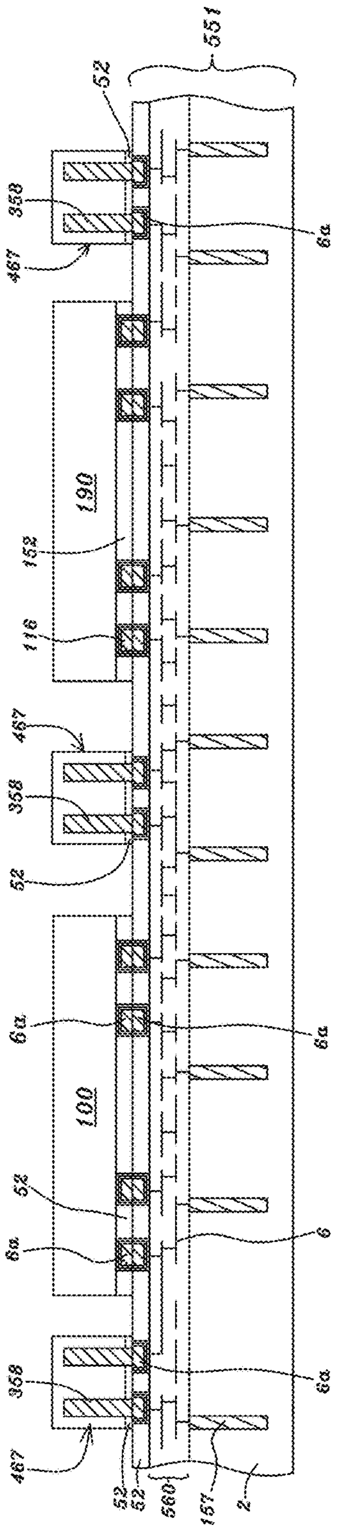
Figure 37C:
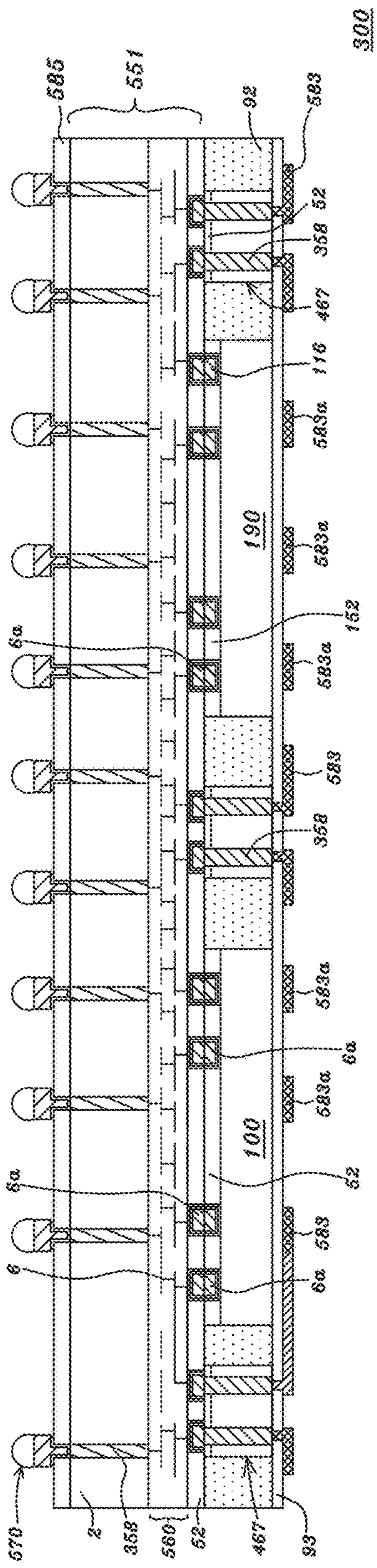

Alternatively, FIGS. 37A-37C are schematically cross-sectional views showing another process for forming a first type of multichip package in accordance with a third embodiment of the present application. The process for forming the first type of multichip package as seen in FIGS. 37A-37C may be referred to that as illustrated in FIGS. 34A-34H. For an element indicated by the same reference number shown in FIGS. 34A-34H and 37A-37C, the specification of the element as seen in FIG. 37A-37C may be referred to that of the element as illustrated in FIG. 34A-34H. The difference between the processes as seen in FIGS. 34A-34H and 37A-37C is mentioned as below: in the process as seen in FIGS. 37A-37C, each of the semiconductor integrated-circuit (IC) chips 100 as seen in FIG. 37A may have the same specification as illustrated in FIG. 14D, provided with the insulating bonding layer 52 and metal pads 6*a*; multiple second type of operation units 190, each of which may have the same specification as illustrated in FIG. 20A, 20B, 21A or 21B, each may be provided with the insulating bonding layer 152 and metal pads 116; multiple second type of vertical-through-via (VTV) connectors 467 each may have the same specification as illustrated in FIG. 1B, 1D, 1F, 2B, 2D or 2F, provided with the insulating bonding layer 52 and metal pads 6*a*; a second type of interposer 551, which may have the same specification as illustrated in FIG. 33B, may be provided with the insulating bonding layer 52 and metal pads 6*a*, wherein each neighboring two of the metal pads 6*a* of the second type of interposer 551 may have a pitch between 3 and 10 micrometers or between 4 and 7 micrometers.

Next, referring to FIGS. 37A and 37B, each of the semiconductor integrated-circuit (IC) chips 100 may be provided with the insulating bonding layer 52 to be bonded to the insulating bonding layer 52 of the second type of interposer 551 and the metal pads 6*a*, each neighboring two of which may have a pitch between 3 and 10 micrometers or between 4 and 7 micrometers, to be bonded to the metal pads 6*a* of the second type of interposer 551. Each of the second type of operation units 190 may be provided with the insulating bonding layer 152 to be bonded to the insulating bonding layer 52 of the second type of interposer 551 and the metal pads 116, each neighboring two of which may have a pitch between 3 and 10 micrometers or between 4 and 7 micrometers, to be bonded to the metal pads 6*a* of the second type of interposer 551. Each of the second type of vertical-through-via (VTV) connectors 467 may be provided with the insulating bonding layer 52 to be bonded to the insulating bonding layer 52 of the second type of interposer 551 and the metal pads 6*a*, each neighboring two of which may have a pitch between 3 and 10 micrometers or between 4 and 7 micrometers, to be bonded to the metal pads 6*a* of the second type of interposer 551.

Referring to FIGS. 37A and 37B, before the semiconductor integrated-circuit (IC) chips 100, second type of operation units 190 and second type of vertical-through-via (VTV) connectors 467 are bonded to the second type of interposer 551, a joining surface, i.e., silicon oxide, of the insulating bonding layer 52 of the second type of interposer 551 may be activated with nitrogen plasma for increasing a hydrophilic property thereof, and then the joining surface of the insulating bonding layer 52 of the second type of interposer 551 may be rinsed with deionized water for water adsorption and cleaning. Further, a joining surface, i.e., silicon oxide, of the insulating bonding layer 52 of each of the semiconductor integrated-circuit (IC) chips 100, a joining surface, i.e., silicon oxide, of the insulating bonding layer 152 of each of the second type of operation units 190 and a joining surface, i.e., silicon oxide, of the insulating bonding layer 52 of each of the second type of vertical-through-via (VTV) connectors 467 may be activated with nitrogen plasma for increasing a hydrophilic property thereof, and then the joining surface of the insulating bonding layer 52 of each of the semiconductor integrated-circuit (IC) chips 100, the joining surface of the insulating bonding layer 152 of each of the second type of operation units 190 and the joining surface of the insulating bonding layer 52 of each of the second type of vertical-through-via (VTV) connectors 467 may be rinsed with deionized water for water adsorption and cleaning.

Next, referring to FIGS. 37A and 37B, the semiconductor integrated-circuit (IC) chips 100, second type of operation units 190 and second type of vertical-through-via (VTV) connectors 467 may be bonded to the second type of interposer 551 by (1) picking up each of the semiconductor integrated-circuit (IC) chips 100 to be placed on the second type of interposer 551 with each of the metal pads 6*a* of each of the semiconductor integrated-circuit (IC) chips 100 in contact with one of the metal pads 6*a* of the second type of interposer 551 and with the joining surface of the insulating bonding layer 52 of each of the semiconductor integrated-circuit (IC) chips 100 in contact with the joining surface of the insulating bonding layer 52 of the second type of interposer 551, (2) picking up each of the second type of operation units 190 to be placed on the second type of interposer 551 with each of the metal pads 116 of each of the second type of operation units 190 in contact with one of the metal pads 6*a* of the second type of interposer 551 and with the joining surface of the insulating bonding layer 152 of each of the second type of operation units 190 in contact with the joining surface of the insulating bonding layer 52 of the second type of interposer 551, (3) picking up each of the second type of vertical-through-via (VTV) connectors 467 to be placed on the second type of interposer 551 with each of the vertical through vias (VTVs) 358 of each of the second type of vertical-through-via (VTV) connectors 467 in contact with one of the metal pads 6*a* of the second type of interposer 551 and with the joining surface of the insulating bonding layer 52 of each of the second type of vertical-through-via (VTV) connectors 467 in contact with the joining surface of the insulating bonding layer 52 of the second type of interposer 551, and (4) next performing a direct bonding process including (a) oxide-to-oxide bonding at a temperature between 100 and 200 degrees Celsius and for a time period between 5 and 20 minutes to bond the joining surface of the insulating bonding layer 52 of each of the semiconductor integrated-circuit (IC) chips 100, the joining surface of the insulating bonding layer 152 of each of the second type of operation units 190 and the joining surface of the insulating bonding layer 52 of each of the second type of vertical-through-via (VTV) connectors 467 to the joining surface of the insulating bonding layer 52 of the second type of interposer 551 and (b) copper-to-copper bonding at a temperature between 300 and 350 degrees Celsius and for a time period between 10 and 60 minutes to bond the copper layer 24 of each of the metal pads 6*a* of each of the semiconductor integrated-circuit (IC) chips 100 to the copper layer 24 of one of the metal pads 6*a* of the second type of interposer 551, to bond the copper layer 24 of each of the metal pads 116 of each of the second type of operation units 190 to the copper layer 24 of one of the metal pads 6*a* of the second type of interposer 551 and to bond the copper layer 24 of each of the vertical through vias (VTVs) 358 of each of the second type of vertical-through-via (VTV) connectors 467 to the copper layer 24 of one of the metal pads 6*a* of the second type of interposer 551. The oxide-to-oxide bonding may be caused by water desorption from reaction between the joining surface of the insulating bonding layer 52 of each of the semiconductor integrated-circuit (IC) chips 100 and the joining surface of the insulating bonding layer 52 of the second type of interposer 551, between the joining surface of the insulating bonding layer 152 of each of the second type of operation units 190 and the joining surface of the insulating bonding layer 52 of the second type of interposer 551 and between the joining surface of the insulating bonding layer 52 of each of the second type of vertical-through-via (VTV) connectors 467 and the joining surface of the insulating bonding layer 52 of the second type of interposer 551. The copper-to-copper bonding may be caused by metal inter-diffusion between the copper layer 24 of the metal pads 6*a* of each of the semiconductor integrated-circuit (IC) chips 100 and the copper layer 24 of the metal pads 6*a* of the second type of interposer 551, between the copper layer 24 of the metal pads 116 of each of the second type of operation units 190 and the copper layer 24 of the metal pads 6*a* of the second type of interposer 551 and between the copper layer 24 of the vertical through vias (VTVs) 358 of each of the second type of vertical-through-via (VTV) connectors 467 and the copper layer 24 of the metal pads 6*a* of the second type of interposer 551.

Next, the following process may be performed as illustrated in FIGS. 34C-34H to form a chip package 300 as shown in FIG. 37C. For an element indicated by the same reference number shown in FIGS. 34A-34H and 37A-37C, the specification of the element as seen in FIG. 37C may be referred to that of the element as illustrated in FIG. 34A-34H, 37A or 37B. For the chip package 300 as seen in FIG. 37C, one or more of the interconnection metal layers 6 of the first interconnection scheme 560 of its second type of interposer 551 may couples each of its semiconductor integrated-circuit (IC) chips 100, second type of operation units 190 and second type of vertical-through-via (VTV) connectors 467 to the other of its semiconductor integrated-circuit (IC) chips 100, second type of operation units 190 and second type of vertical-through-via (VTV) connectors 467 for delivery of a voltage of power supply (Vcc), a voltage of ground reference (Vss), clock signals (CLK) or other signals to said each of its semiconductor integrated-circuit (IC) chips 100, second type of operation units 190 and second type of vertical-through-via (VTV) connectors 467. Each of its semiconductor integrated-circuit (IC) chips 100 and second type of operation units 190 may couple to one of its metal pads 583 through, in sequence, one or more of the interconnection metal layers 6 of the first interconnection scheme 560 of its second type of interposer 551 and one of the vertical through vias (VTV) 358 of one of its second type of vertical-through-via (VTV) connectors 467 for delivery of a voltage of power supply (Vcc), a voltage of ground reference (Vss), clock signals (CLK) or other signals to said each of its semiconductor integrated-circuit (IC) chips 100 and second type of operation units 190. Each of its semiconductor integrated-circuit (IC) chips 100, second type of operation units 190 and second type of vertical-through-via (VTV) connectors 467 may couple to one or more of its metal bumps, pillars or pads 570 through, in sequence, each of the interconnection metal layers 6 of the first interconnection scheme 560 of its second type of interposer 551 and one of the through silicon vias (TSVs) 157 of its second type of interposer 551 for delivery of a voltage of power supply (Vcc), a voltage of ground reference (Vss), clock signals (CLK) or other signals to said each of its semiconductor integrated-circuit (IC) chips 100, second type of operation units 190 and second type of vertical-through-via (VTV) connectors 467. One of its metal bumps, pillars or pads 570 vertically over each of its semiconductor integrated-circuit (IC) chips 100 and second type of operation units 190 may couple to one of its metal pads 583 vertically under said each of its semiconductor integrated-circuit (IC) chips 100 and second type of operation units 190 through, in sequence, one of the through silicon vias (TSVs) 157 of its second type of interposer 551, each of the interconnection metal layers 6 of the first interconnection scheme 560 of its second type of interposer 551, one of the vertical through vias (VTVs) 358 of one of its second type of vertical-through-via (VTV) connectors 467 and the interconnection metal layer of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. Each of the vertical through vias (VTVs) 358 of each of its second type of vertical-through-via (VTV) connectors 467 may have a depth, for example, between 30 μm and 2,000 μm.

For the chip package 300 as seen in FIG. 37C, its metal pads 583 arranged in an array may include multiple dummy pads 583*a* each not connecting to any of its semiconductor integrated-circuit (IC) chips 100 and second type of operation units 190 but having mechanical functions for subsequent package-on-package (POP) assembly, formed on the bottom surface of its insulating dielectric layer 93 and vertically under one of its semiconductor integrated-circuit (IC) chips 100, second type of operation units 190 and polymer layer 92. Each of its dummy pads 583*a* may have no connection to any of the vertical through vias (VTVs) 358 of any of its second type of vertical-through-via (VTV) connectors 467.

Figure 34I:
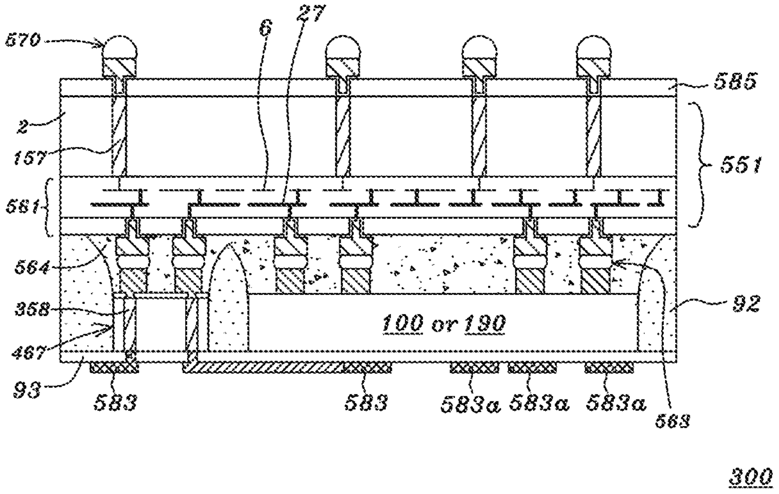
FIG. 34I is a schematically cross-sectional view showing a first type of single-chip/unit package in accordance with a third embodiment of the present application.

Alternatively, FIG. 34I is a schematically cross-sectional view showing a first type of single-chip/unit package in accordance with a third embodiment of the present application. The chip package 300 as seen in FIG. 34I may have a similar structure to that as illustrated in FIG. 34H. For an element indicated by the same reference number shown in FIGS. 34H and 34I, the specification of the element as seen in FIG. 34I may be referred to that of the element as illustrated in FIG. 34H. The difference between the chip packages as illustrated in FIGS. 34H and 34I is that the chip package as seen in FIG. 34I includes only one semiconductor integrated-circuit (IC) chip 100 or first type of operation unit 190 having the same specification as illustrated in FIG. 34A and one or more first type of vertical-through-via (VTV) connectors 467 having the same specification as illustrated in FIG. 34A. For the single-chip/unit package 300 as seen in FIG. 34I, its only one semiconductor integrated-circuit (IC) chip 100 or first type of operation unit 190 may couple to one of its metal pads 583 through, in sequence, one or more of the interconnection metal layers 6 and/or 27 of the first and/or second interconnection schemes 560 and/or 588 of its first type of interposer 551 and one of the vertical through vias (VTVs) 358 of one of its first type of vertical-through-via (VTV) connectors 467 for delivery of a voltage of power supply (Vcc), a voltage of ground reference (Vss), clock signals (CLK) or other signals to its only one semiconductor integrated-circuit (IC) chip 100 or first type of operation unit 190. Each of its only one semiconductor integrated-circuit (IC) chip 100 or first type of operation unit 190 and its first type of vertical-through-via (VTV) connectors 467 may couple to one or more of its metal bumps, pillars or pads 570 through, in sequence, each of the interconnection metal layers 6 and/or 27 of the first and/or second interconnection schemes 560 and/or 588 of its first type of interposer 551 and one of the through silicon vias (TSVs) 157 of its first type of interposer 551 for delivery of a voltage of power supply (Vcc), a voltage of ground reference (Vss), clock signals (CLK) or other signals to said each of its only one semiconductor integrated-circuit (IC) chip 100 or first type of operation unit 190 and its first type of vertical-through-via (VTV) connectors 467. One of its metal bumps, pillars or pads 570 vertically over its only one semiconductor integrated-circuit (IC) chip 100 or first type of operation unit 190 may couple to one of its metal pads 583 vertically under its only one semiconductor integrated-circuit (IC) chip 100 or first type of operation unit 190 through, in sequence, one of the through silicon vias (TSVs) 157 of its first type of interposer 551, each of the interconnection metal layers 6 and/or 27 of the first and/or second interconnection schemes 560 and/or 588 of its first type of interposer 551, one of the vertical through vias (VTVs) 358 of one of its first type of vertical-through-via (VTV) connectors 467 and the interconnection metal layer of its backside interconnection scheme for a logic drive or device (BISD) 79 for delivery of a voltage of power supply (Vcc), a voltage of ground reference (Vss), clock signals (CLK) or other signals to. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. For example, its more than twenty first metal contacts, i.e., metal bumps, pillars or pads 570, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first type of vertical-through-via (VTV) connector(s) 467 may have a depth, for example, between 30 μm and 2,000 μm.

Figure 37D:
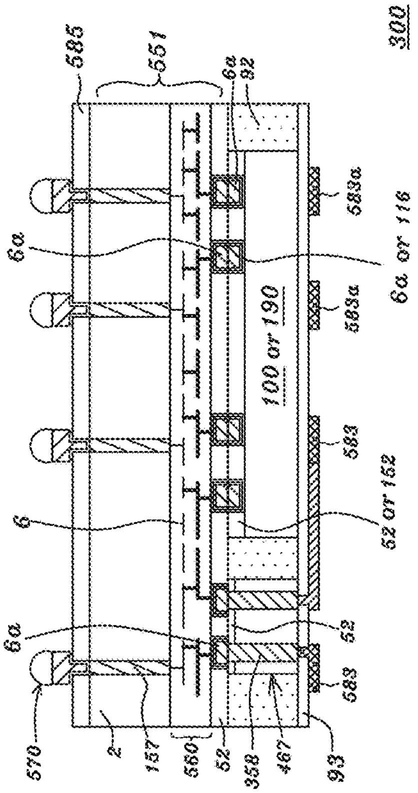
FIG. 37D is a schematically cross-sectional view showing another first type of single-chip/unit package in accordance with a third embodiment of the present application.

Alternatively, FIG. 37D is a schematically cross-sectional view showing another first type of single-chip/unit package in accordance with a third embodiment of the present application. The chip package 300 as seen in FIG. 37D may have a similar structure to that as illustrated in FIG. 37C. For an element indicated by the same reference number shown in FIGS. 37C and 37D, the specification of the element as seen in FIG. 37D may be referred to that of the element as illustrated in FIG. 37C. The difference between the chip packages as illustrated in FIGS. 37C and 37D is that the chip package as seen in FIG. 37D includes only one semiconductor integrated-circuit (IC) chip 100 or second type of operation unit 190 having the same specification as illustrated in FIG. 37A and one or more second type of vertical-through-via (VTV) connectors 467 having the same specification as illustrated in FIG. 37A. For the single-chip/unit package 300 as seen in FIG. 37D, its only one semiconductor integrated-circuit (IC) chip 100 or second type of operation unit 190 may couple to one of its metal pads 583 through, in sequence, one or more of the interconnection metal layers 6 of the first second interconnection scheme 560 of its second type of interposer 551 and one of the vertical through vias (VTVs) 358 of one of its second type of vertical-through-via (VTV) connectors 467 for delivery of a voltage of power supply (Vcc), a voltage of ground reference (Vss), clock signals (CLK) or other signals to its only one semiconductor integrated-circuit (IC) chip 100 or second type of operation unit 190. Each of its only one semiconductor integrated-circuit (IC) chip 100 or second type of operation unit 190 and its second type of vertical-through-via (VTV) connectors 467 may couple to one or more of its metal bumps, pillars or pads 570 through, in sequence, each of the interconnection metal layers 6 of the first interconnection scheme 560 of its second type of interposer 551 and one of the through silicon vias (TSVs) 157 of its second type of interposer 551 for delivery of a voltage of power supply (Vcc), a voltage of ground reference (Vss), clock signals (CLK) or other signals to said each of its only one semiconductor integrated-circuit (IC) chip 100 or second type of operation unit 190 and its second type of vertical-through-via (VTV) connectors 467. One of its metal bumps, pillars or pads 570 vertically over its only one semiconductor integrated-circuit (IC) chip 100 or second type of operation unit 190 may couple to one of its metal pads 583 vertically under its only one semiconductor integrated-circuit (IC) chip 100 or second type of operation unit 190 through, in sequence, one of the through silicon vias (TSVs) 157 of its second type of interposer 551, each of the interconnection metal layers 6 of the first interconnection scheme 560 of its second type of interposer 551, one of the vertical through vias (VTVs) 358 of one of its second type of vertical-through-via (VTV) connectors 467 and the interconnection metal layer of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. For example, its more than twenty first metal contacts, i.e., metal bumps, pillars or pads 570, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its second type of vertical-through-via (VTV) connector(s) 467 may have a depth, for example, between 30 μm and 2,000 μm.

2. Second Type of Chip Package for Third Embodiment

Figure 38A:
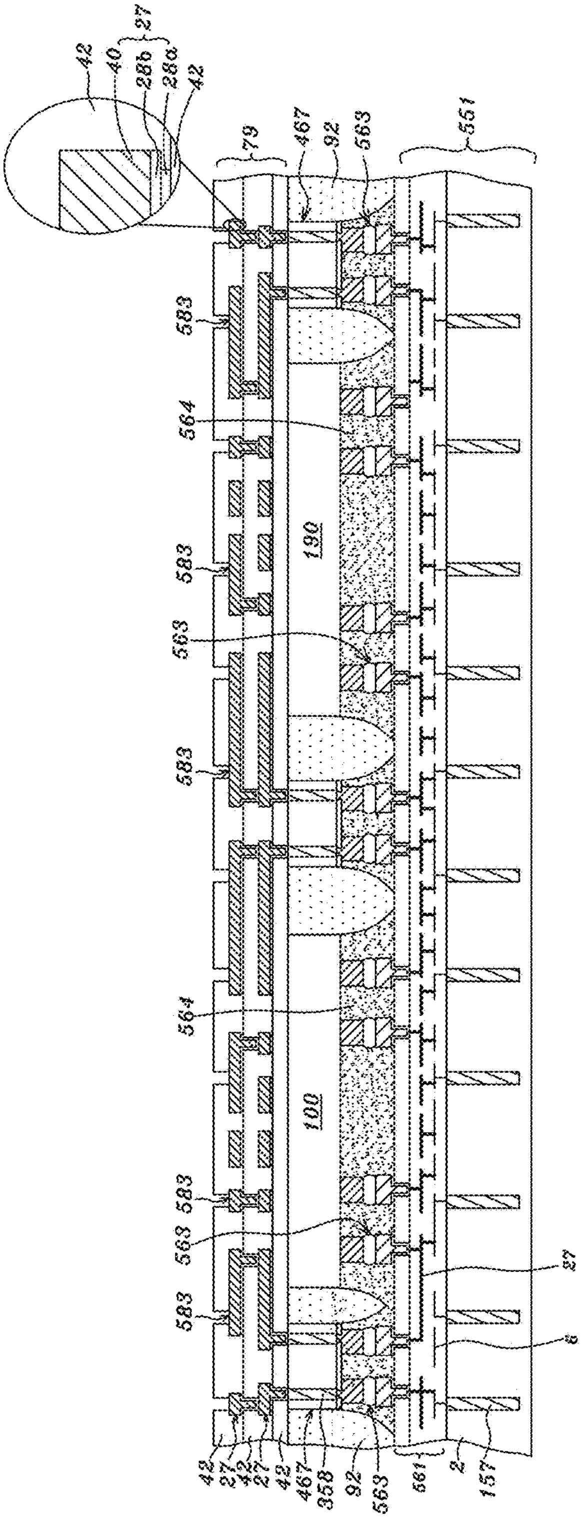
FIGS. 38A and 38B are schematically cross-sectional views showing a process for forming a second type of multichip packages in accordance with a third embodiment of the present application.
Figure 38B:
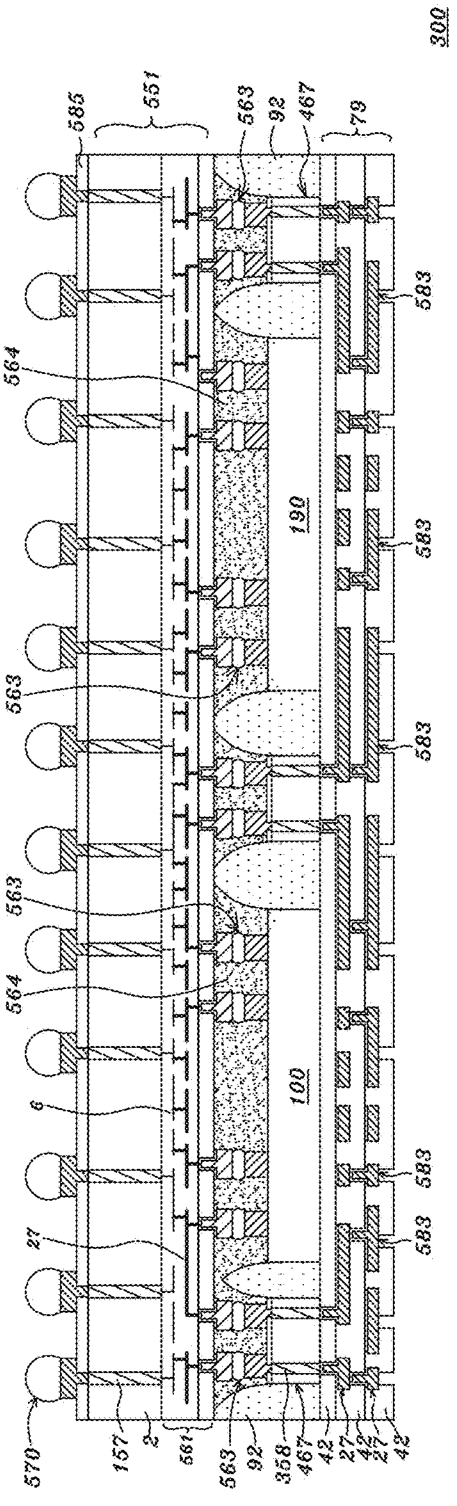

FIGS. 38A and 38B are schematically cross-sectional views showing a process for forming a second type of multichip packages in accordance with a third embodiment of the present application. Referring to FIG. 38A, after the structure as seen in FIG. 34D is formed, the backside interconnection scheme for a logic drive or device (BISD) 79 as illustrated in FIG. 30A may be formed on the backside of each of the semiconductor integrated-circuit (IC) chips 100, the backside of each of the first type of operation units 190, the backside of each of the first type of vertical-through-via (VTV) connectors 467 and the top surface of the polymer layer 92. The backside interconnection scheme for a logic drive or device (BISD) 79 may have the same specifications as that illustrated in FIG. 30A.

Next, the following process may be performed as illustrated in FIGS. 34F-34H to form a chip package 300 as shown in FIG. 38B. For an element indicated by the same reference number shown in FIGS. 34A-34H, 38A and 38B, the specification of the element as seen in FIG. 38A or 38B may be referred to that of the element as illustrated in FIG. 34A-34H. For the chip package 300 as seen in FIG. 38B, one of its metal bumps, pillars or pads 570 vertically over each of its semiconductor integrated-circuit (IC) chips 100 and first type of operation units 190 may couple to one of its metal pads 583 vertically under said each of its semiconductor integrated-circuit (IC) chips 100 and first type of operation units 190 through, in sequence, one of the through silicon vias (TSVs) 157 of its first type of interposer 551, each of the interconnection metal layers 6 and/or 27 of the first and/or second interconnection schemes 560 and/or 588 of its first type of interposer 551, one of the vertical through vias (VTVs) 358 of one of its first type of vertical-through-via (VTV) connectors 467 and each of the interconnection metal layers 27 of its backside interconnection scheme for a logic drive or device (BISD) 79. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. Each of the vertical through vias (VTVs) 358 of each of its first type of vertical-through-via (VTV) connectors 467 may have a depth, for example, between 30 μm and 2,000 μm.

Figure 39A:
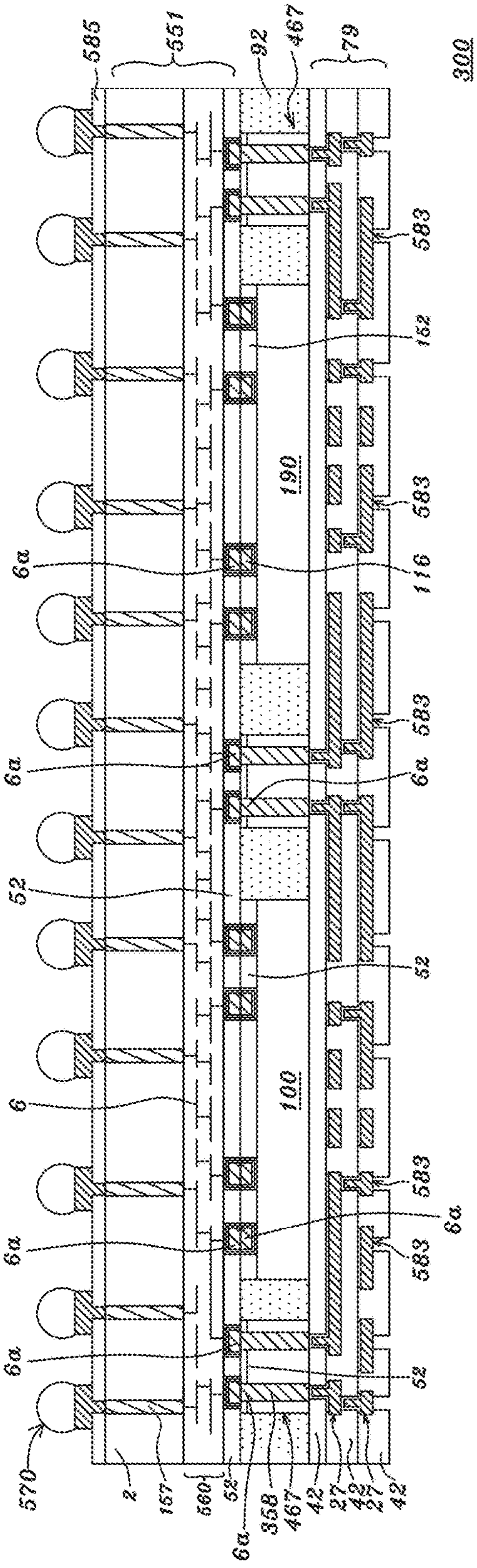
FIG. 39A is a schematically cross-sectional views showing another second type of multichip packages in accordance with a third embodiment of the present application.

FIG. 39A is a schematically cross-sectional views showing another second type of multichip packages in accordance with a third embodiment of the present application. The process for forming the second type of multichip package as seen in FIG. 39A is similar to and may be referred to that for forming the first type of multichip package as illustrated in FIGS. 37A-37C. For an element indicated by the same reference number shown in FIGS. 37A-37C and 39A, the specification of the element as seen in FIG. 39A may be referred to that of the element as illustrated in FIG. 37A-37C. The difference therebetween is mentioned as below: after the chemical mechanical polishing (CMP), polishing or grinding process is applied as illustrated in FIG. 34D, the step for forming the backside interconnection scheme for a logic drive or device (BISD) 79 as illustrated in FIGS. 34E and 37C may be replaced with the step for forming the backside interconnection scheme for a logic drive or device (BISD) 79 as illustrated in FIG. 30A on the backside of each of the semiconductor integrated-circuit (IC) chips 100, the backside of each of the second type of operation units 190, the backside of each of the second type of vertical-through-via (VTV) connectors 467 and the top surface of the polymer layer 92 to form the second type of multichip package as seen in FIG. 39A. The backside interconnection scheme for a logic drive or device (BISD) 79 of the second type of multichip package as seen in FIG. 39A may have the same specifications as that illustrated in FIGS. 30A and 23A. For the chip package 300 as seen in FIG. 39A, one of its metal bumps, pillars or pads 570 vertically over each of its semiconductor integrated-circuit (IC) chips 100 and second type of operation units 190 may couple to one of its metal pads 583 vertically under said each of its semiconductor integrated-circuit (IC) chips 100 and second type of operation units 190 through, in sequence, one of the through silicon vias (TSVs) 157 of its second type of interposer 551, each of the interconnection metal layers 6 of the first interconnection scheme 560 of its second type of interposer 551, one of the vertical through vias (VTVs) 358 of one of its second type of vertical-through-via (VTV) connectors 467 and each of the interconnection metal layers 27 of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. Each of the vertical through vias (VTVs) 358 of each of its second type of vertical-through-via (VTV) connectors 467 may have a depth, for example, between 30 μm and 2,000 μm.

Figure 38C:
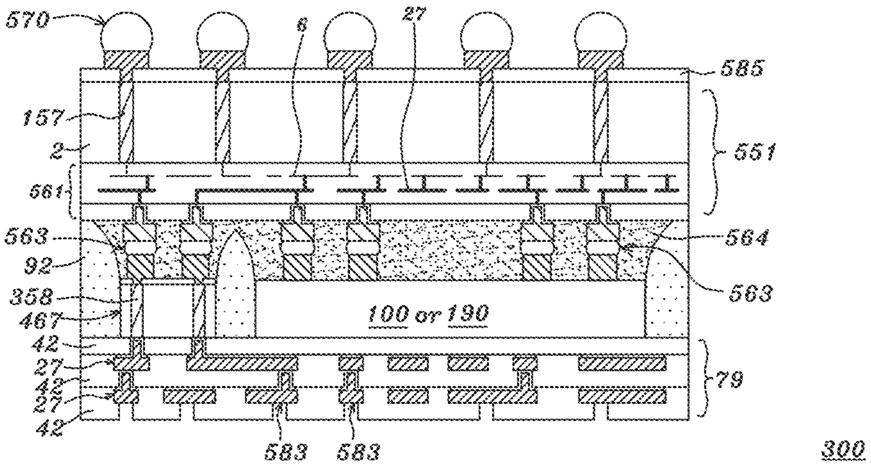
FIG. 38C is a schematically cross-sectional view showing a second type of single-chip/unit package in accordance with a third embodiment of the present application.

Alternatively, FIG. 38C is a schematically cross-sectional view showing a second type of single-chip/unit package in accordance with a third embodiment of the present application. The chip package 300 as seen in FIG. 38C may have a similar structure to that as illustrated in FIG. 38B. For an element indicated by the same reference number shown in FIGS. 38B and 38C, the specification of the element as seen in FIG. 38B may be referred to that of the element as illustrated in FIG. 38C. The difference between the chip packages as illustrated in FIGS. 38B and 38C is that the chip package as seen in FIG. 38C includes only one semiconductor integrated-circuit (IC) chip 100 or first type of operation unit 190 having the same specification as illustrated in FIG. 34A and one or more first type of vertical-through-via (VTV) connectors 467 having the same specification as illustrated in FIG. 34A. For the single-chip/unit package 300 as seen in FIG. 38C, its only one semiconductor integrated-circuit (IC) chip 100 or first type of operation unit 190 may couple to one of its metal pads 583 through, in sequence, one or more of the interconnection metal layers 6 and/or 27 of the first and/or second interconnection schemes 560 and/or 588 of its first type of interposer 551, one of the vertical through vias (VTVs) 358 of one of its first type of vertical-through-via (VTV) connectors 467 and each of the interconnection metal layer 27 of its backside interconnection scheme for a logic drive or device (BISD) 79 for delivery of a voltage of power supply (Vcc), a voltage of ground reference (Vss), clock signals (CLK) or other signals to its only one semiconductor integrated-circuit (IC) chip 100 or first type of operation unit 190. One of its metal bumps, pillars or pads 570 vertically over its only one semiconductor integrated-circuit (IC) chip 100 or first type of operation unit 190 may couple to one of its metal pads 583 vertically under its only one semiconductor integrated-circuit (IC) chip 100 or first type of operation unit 190 through, in sequence, one of the through silicon vias (TSVs) 157 of its first type of interposer 551, each of the interconnection metal layers 6 and/or 27 of the first and/or second interconnection schemes 560 and/or 588 of its first type of interposer 551, one of the vertical through vias (VTVs) 358 of one of its first type of vertical-through-via (VTV) connectors 467 and each of the interconnection metal layers 27 of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. For example, its more than twenty first metal contacts, i.e., metal bumps, pillars or pads 570, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first type of vertical-through-via (VTV) connector(s) 467 may have a depth, for example, between 30 μm and 2,000 μm.

Figure 39B:
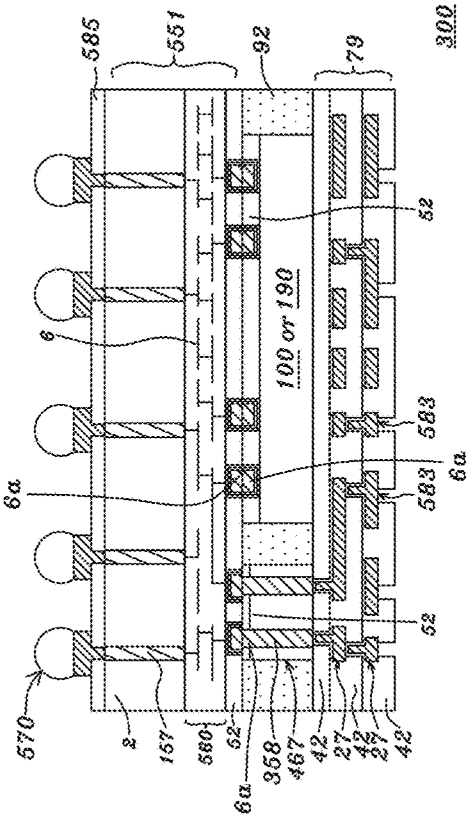
FIG. 39B is a schematically cross-sectional view showing another second type of single-chip/unit package in accordance with a third embodiment of the present application.

Alternatively, FIG. 39B is a schematically cross-sectional view showing another second type of single-chip/unit package in accordance with a third embodiment of the present application. The chip package 300 as seen in FIG. 39B may have a similar structure to that as illustrated in FIG. 39A. For an element indicated by the same reference number shown in FIGS. 39A and 39B, the specification of the element as seen in FIG. 39B may be referred to that of the element as illustrated in FIG. 39A. The difference between the chip packages as illustrated in FIGS. 39A and 39B is that the chip package as seen in FIG. 39B includes only one semiconductor integrated-circuit (IC) chip 100 or second type of operation unit 190 having the same specification as illustrated in FIG. 37A and one or more second type of vertical-through-via (VTV) connectors 467 having the same specification as illustrated in FIG. 37A. For the single-chip/unit package 300 as seen in FIG. 39B, its only one semiconductor integrated-circuit (IC) chip 100 or second type of operation unit 190 may couple to one of its metal pads 583 through, in sequence, one or more of the interconnection metal layers 6 of the first second interconnection scheme 560 of its second type of interposer 551, one of the vertical through vias (VTVs) 358 of one of its second type of vertical-through-via (VTV) connectors 467 and each of the interconnection metal layer 27 of its backside interconnection scheme for a logic drive or device (BISD) 79 for delivery of a voltage of power supply (Vcc), a voltage of ground reference (Vss), clock signals (CLK) or other signals to its only one semiconductor integrated-circuit (IC) chip 100 or second type of operation unit 190. One of its metal bumps, pillars or pads 570 vertically over its only one semiconductor integrated-circuit (IC) chip 100 or second type of operation unit 190 may couple to one of its metal pads 583 vertically under its only one semiconductor integrated-circuit (IC) chip 100 or second type of operation unit 190 through, in sequence, one of the through silicon vias (TSVs) 157 of its second type of interposer 551, each of the interconnection metal layers 6 of the first interconnection scheme 560 of its second type of interposer 551, one of the vertical through vias (VTVs) 358 of one of its second type of vertical-through-via (VTV) connectors 467 and each of the interconnection metal layer 27 of its backside interconnection scheme for a logic drive or device (BISD) 79 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. For example, its more than twenty first metal contacts, i.e., metal bumps, pillars or pads 570, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its second type of vertical-through-via (VTV) connector(s) 467 may have a depth, for example, between 30 μm and 2,000 μm.

Figure 40A:
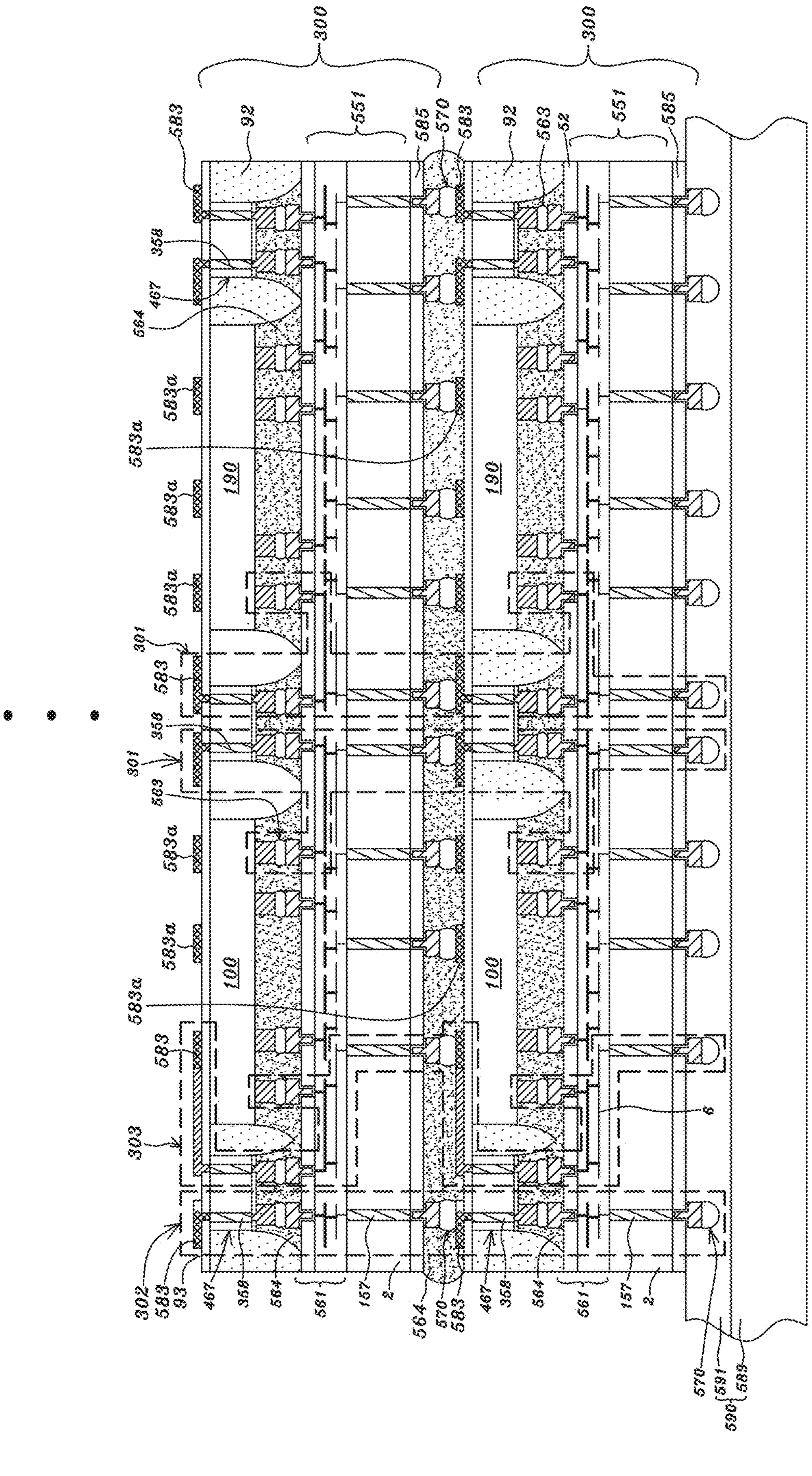
FIGS. 40A and 40B are schematically cross-sectional views showing a process for forming various package-on-package (POP) assemblies for multiple first type of chip packages in accordance with a third embodiment of the present application.
Figure 40B:
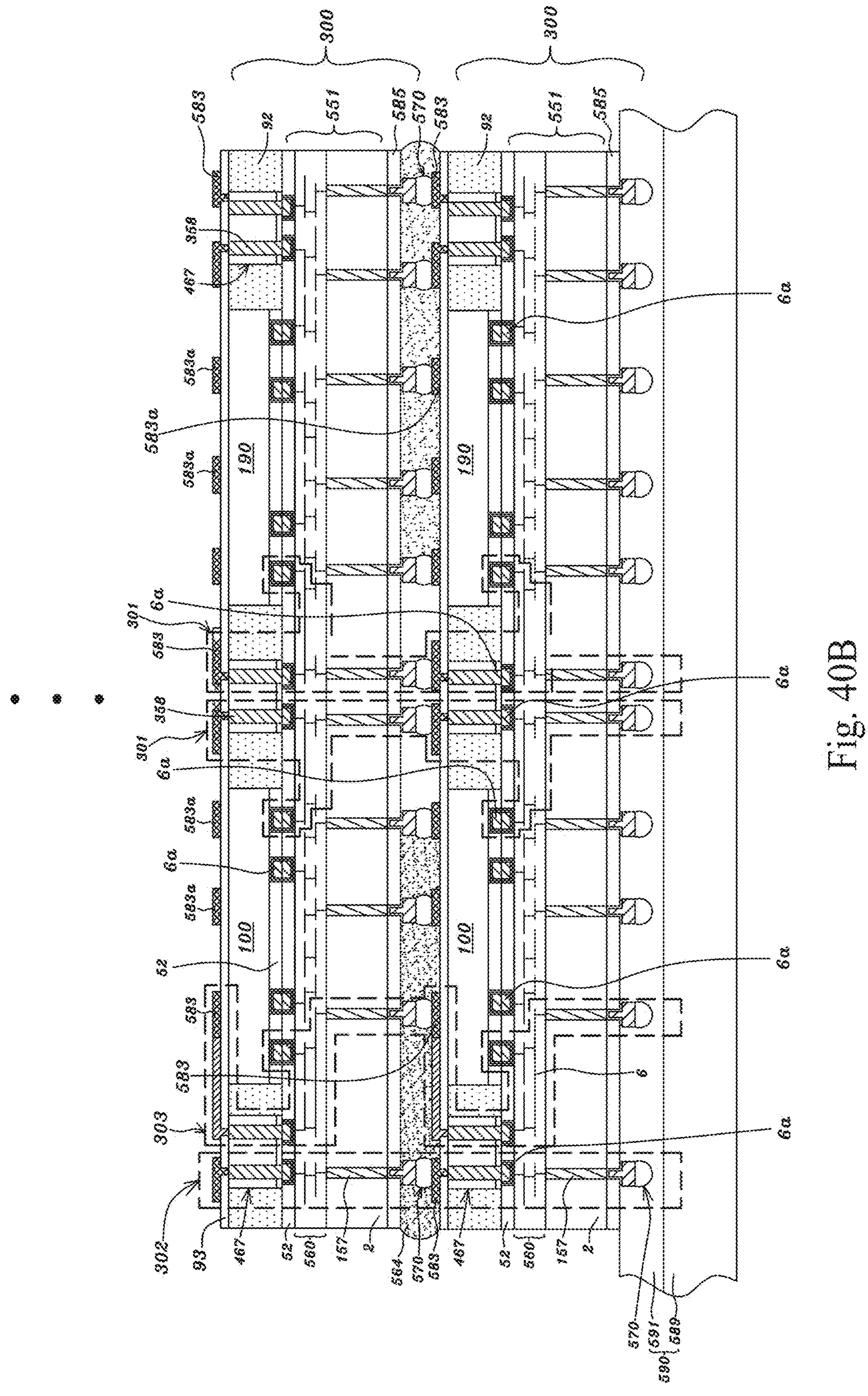

3. Package-On-Package (POP) Assembly for First Type of Chip Packages for Third Embodiment FIGS. 40A and 40B are schematically cross-sectional views showing a process for forming various package-on-package (POP) assemblies for multiple first type of chip packages in accordance with a third embodiment of the present application. Multiple first type of chip packages 300 as illustrated in FIG. 34H may be provided to be stacked together to form a package-on-package (POP) assembly as seen in FIG. 40A. Multiple first type of chip packages 300 as illustrated in FIG. 37C may be provided to be stacked together to form a package-on-package (POP) assembly as seen in FIG. 40B.

Referring to each of FIGS. 40A and 40B, the temporary substrate (T-Sub) 590 as illustrated in FIG. 22A may be first provided. Next, the bottommost one of the first type of chip packages 300 as illustrated in FIG. 34H or 37C may be flipped to be attached onto the temporary substrate (T-sub) 590, wherein the bottommost one of the first type of chip packages 300 may have the metal bumps, pillars or pads 570 embedded in the sacrificial bonding layer 591 of the temporary substrate (T-Sub) 590. The sacrificial bonding layer 591 may have a top surface in contact with a bottom surface of the insulating dielectric layer 585 of the bottommost one of the first type of chip packages 300.

Next, referring to each of FIGS. 40A and 40B, in a first step, an upper one of the first type of chip packages 300 as illustrated in Fig. FIG. 34H or 37C may be flipped to have its metal bumps, pillars or pads 570 to be bonded respectively to the metal pads 583 of a lower one of the first type of chip packages 300 as illustrated in FIG. 34H or 37C or the tin-containing solder bumps on the metal pads 583 of the lower one of the first type of chip packages 300 as illustrated in FIG. 34H or 37C. Alternatively, an upper one of the first type of chip packages 300 as illustrated in FIG. 34I or 37D may be flipped to have its metal bumps, pillars or pads 570 to be bonded respectively to the metal pads 583 of a lower one of the first type of chip packages 300 as illustrated in FIG. 34I or 37D or the tin-containing solder bumps on the metal pads 583 of the lower one of the first type of chip packages 300 as illustrated in FIG. 34I or 37D. The first step may have the same specification or details as that illustrated in FIG. 24A. It is noted that the lower one of the first type of chip packages 300 may have the dummy pads 583*a* in a first group each coupling to one of the metal bumps, pillars or pads 570 of the upper one of the first type of chip packages 300 at a voltage (Vss) of ground reference and the dummy pads 583*a* in a second group each coupling to one of the metal bumps, pillars or pads 570 of the upper one of the first type of chip packages 300 without any electrical function.

Next, referring to each of FIGS. 40A and 40B, in a second step, an underfill 564 may be filled into a gap between the upper and lower ones of the first type of chip packages 300 to enclose the metal bumps, pillars or pads 570 of the upper one of the first type of chip packages 300.

Next, referring to each of FIGS. 40A and 40B, the above first and second steps may be alternately repeated multiple times to stack, one by one, multiple of the first type of chip packages 300 as illustrated in FIG. 34H, 34I, 37C or 37D having the number greater than or equal to two, such as four or eight.

Next, referring to each of FIGS. 40A and 40B, the temporary substrate (T-sub) 590 may be released as illustrated in FIG. 22E from the bottommost one of the first type of chip packages 300 to expose the metal bumps, pillars or pads 570 of the bottommost one of the first type of chip packages 300.

For the package-on-package (POP) assembly as illustrated in FIG. 40A, the interconnection metal layers 6 and/or 27 of the first and/or second interconnection schemes 560 and/or 588 of the first type of interposer 551 of each of its first type of chip packages 300 may have the same circuit layout as those of each of the other(s) of its first type of chip packages 300 and the interconnection metal layer of the backside interconnection scheme for a logic drive or device (BISD) 79 of each of its first type of chip packages 300 may have the same circuit layout as that of each of the other(s) of its first type of chip packages 300. Each of the metal bumps, pillars or pads 570 of each of its first type of chip packages 300 may be vertically aligned with one of the metal pads 583 of said each of its first type of chip packages 300, one of the through silicon vias (TSVs) 157 of the first type of interposer 551 of said each of its first type of chip packages 300, one of the metal bumps, pillars or pads 570 of each of the other(s) of its first type of chip packages 300, one of the metal pads 583 of each of the other(s) of its first type of chip packages 300 and one of the through silicon vias (TSVs) 157 of the first type of interposer 551 of each of the other(s) of its first type of chip packages 300. The package-on-package (POP) assembly as illustrated in FIG. 40A may be provided with the first, second and third interconnects 301, 302 and 303 as illustrated in FIG. 24A for delivery of a voltage of power supply (Vcc), a voltage of ground reference (Vss), clock signals (CLK) or other signals.

Alternatively, for the package-on-package (POP) assembly as illustrated in FIG. 40A, the interconnection metal layers 6 and/or 27 of the first and/or second interconnection schemes 560 and/or 588 of the first type of interposer 551 of each of its first type of chip packages 300 may have a different circuit layout from those of each of the other(s) of its first type of chip packages 300 in order to provide the fourth, fifth, sixth interconnects 304, 305 and 306 as illustrated in FIG. 24B for delivery of a voltage of power supply (Vcc), a voltage of ground reference (Vss), clock signals (CLK) or other signals.

For the package-on-package (POP) assembly as illustrated in FIG. 40B, the interconnection metal layers 6 of the first second interconnection scheme 560 of the second type of interposer 551 of each of its first type of chip packages 300 may have the same circuit layout as those of each of the other(s) of its first type of chip packages 300 and the interconnection metal layer of the backside interconnection scheme for a logic drive or device (BISD) 79 of each of its first type of chip packages 300 may have the same circuit layout as that of each of the other(s) of its first type of chip packages 300. Each of the metal bumps, pillars or pads 570 of each of its first type of chip packages 300 may be vertically aligned with one of the metal pads 583 of said each of its first type of chip packages 300, one of the through silicon vias (TSVs) 157 of the second type of interposer 551 of said each of its first type of chip packages 300, one of the metal bumps, pillars or pads 570 of each of the other(s) of its first type of chip packages 300, one of the metal pads 583 of each of the other(s) of its first type of chip packages 300 and one of the through silicon vias (TSVs) 157 of the second type of interposer 551 of each of the other(s) of its first type of chip packages 300. The package-on-package (POP) assembly as illustrated in FIG. 40B may be provided with the first, second and third interconnects 301, 302 and 303 as illustrated in FIG. 24A for delivery of a voltage of power supply (Vcc), a voltage of ground reference (Vss), clock signals (CLK) or other signals.

Alternatively, for the package-on-package (POP) assembly as illustrated in FIG. 40B, the interconnection metal layers 6 of the first interconnection scheme 560 of the second type of interposer 551 of each of its first type of chip packages 300 may have a different circuit layout from those of each of the other(s) of its first type of chip packages 300 in order to provide the fourth, fifth, sixth interconnects 304, 305 and 306 as illustrated in FIG. 24B for delivery of a voltage of power supply (Vcc), a voltage of ground reference (Vss), clock signals (CLK) or other signals.

Figure 41A:
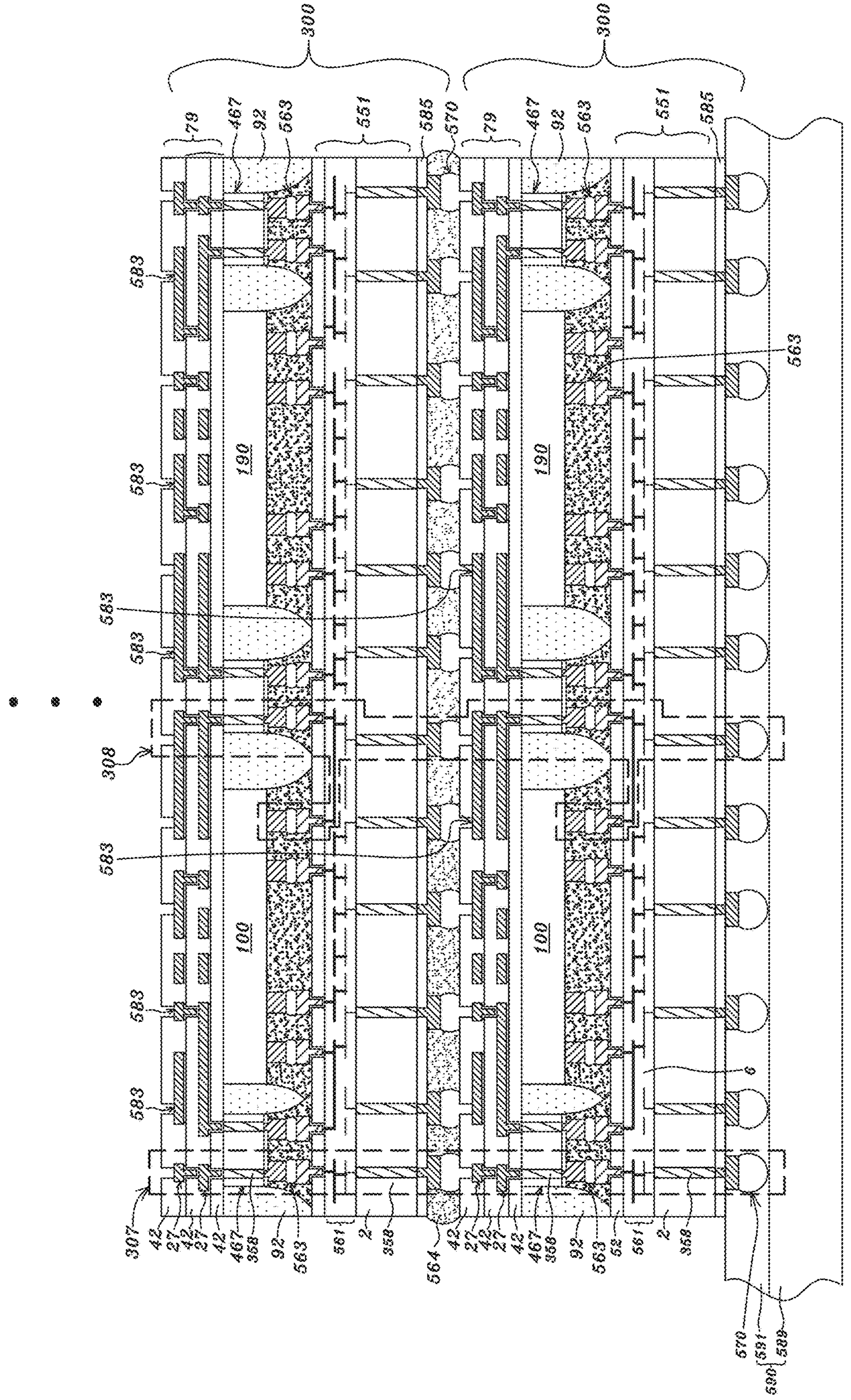
FIGS. 41A and 41B are schematically cross-sectional views showing a process for forming various package-on-package (POP) assemblies for multiple second type of chip packages in accordance with a third embodiment of the present application.
Figure 41B:
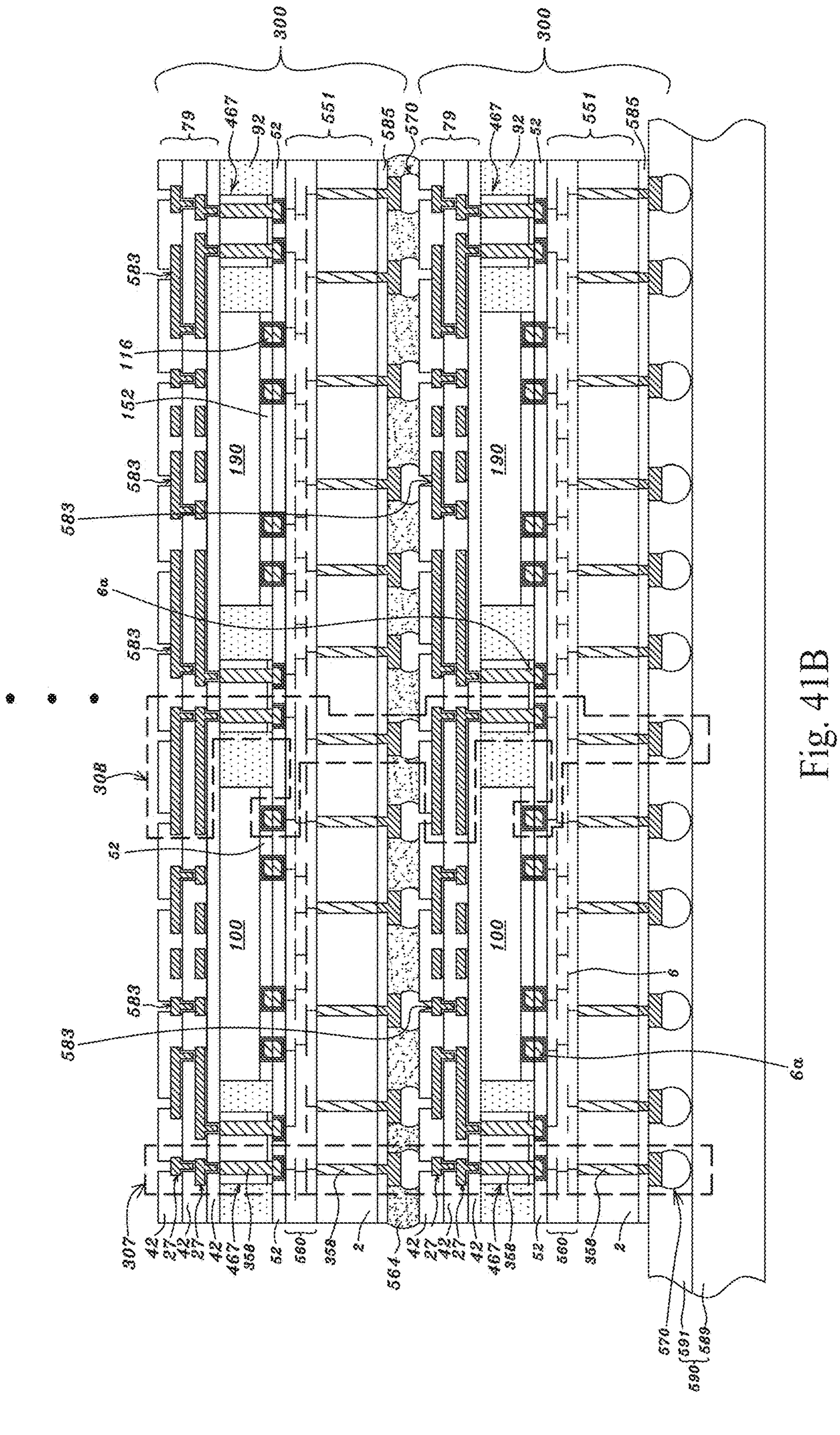

4. Package-On-Package (POP) Assembly for Second Type of Chip Packages for Third Embodiment FIGS. 41A and 41B are schematically cross-sectional views showing a process for forming various package-on-package (POP) assemblies for multiple second type of chip packages in accordance with a third embodiment of the present application. Multiple second type of chip packages 300 as illustrated in FIG. 38B may be provided to be stacked together to form a package-on-package (POP) assembly as seen in FIG. 41A. Multiple second type of chip packages 300 as illustrated in FIG. 39A may be provided to be stacked together to form a package-on-package (POP) assembly as seen in FIG. 41B.

Referring to each of FIGS. 41A and 41B, the temporary substrate (T-Sub) 590 as illustrated in FIG. 22A may be first provided. Next, the bottommost one of the second type of chip packages 300 as illustrated in FIG. 38B, 38C, 39A or 39B may be flipped to be attached onto the temporary substrate (T-sub) 590, wherein the bottommost one of the second type of chip packages 300 may have the metal bumps, pillars or pads 570 embedded in the sacrificial bonding layer 591 of the temporary substrate (T-Sub) 590. The sacrificial bonding layer 591 may have a top surface in contact with a bottom surface of the insulating dielectric layer 585 of the bottommost one of the second type of chip packages 300.

Next, referring to each of FIGS. 41A and 41B, in a first step, an upper one of the second type of chip packages 300 as illustrated in FIG. 38B or 39A may be flipped to have the metal bumps, pillars or pads 570 to be bonded respectively to the metal pads 583 of a lower one of the second type of chip packages 300 as illustrated in FIG. 38B or 39A or the tin-containing solder bumps on the metal pads 583 of the lower one of the first type of chip packages 300 as illustrated in FIG. 38B or 39A. Alternatively, an upper one of the second type of chip packages 300 as illustrated in FIG. 38C or 39B may be flipped to have the metal bumps, pillars or pads 570 to be bonded respectively to the metal pads 583 of a lower one of the second type of chip packages 300 as illustrated in FIG. 38C or 39B or the tin-containing solder bumps on the metal pads 583 of the lower one of the first type of chip packages 300 as illustrated in FIG. 38C or 39B. The first step may have the same specification or details as that illustrated in FIG. 24A.

Next, referring to each of FIGS. 41A and 41B, in a second step, an underfill 564 may be filled into a gap between the upper and lower ones of the second type of chip packages 300 to enclose the metal bumps, pillars or pads 570 of the upper one of the second type of chip packages 300.

Next, referring to each of FIGS. 41A and 41B, the above first and second steps may be alternately repeated multiple times to stack, one by one, multiple of the second type of chip packages 300 as illustrated in FIG. 38B, 38C, 39A or 39B having the number greater than or equal to two, such as four or eight.

Next, referring to each of FIGS. 41A and 41B, the temporary substrate (T-sub) 590 may be released as illustrated in FIG. 22E from the bottommost one of the second type of chip packages 300 to expose the metal bumps, pillars or pads 570 of the bottommost one of the second type of chip packages 300.

For the package-on-package (POP) assembly as illustrated in FIG. 41A, the interconnection metal layers 6 and/or 27 of the first and/or second interconnection schemes 560 and/or 588 of the first type of interposer 551 of each of its second type of chip packages 300 may have the same circuit layout as those of each of the other(s) of its second type of chip packages 300 and the interconnection metal layers 27 of the backside interconnection scheme for a logic drive or device (BISD) 79 of each of its second type of chip packages 300 may have the same circuit layout as those of each of the other(s) of its second type of chip packages 300. Each of the metal bumps, pillars or pads 570 of each of its second type of chip packages 300 may be vertically aligned with one of the metal pads 583 of said each of its second type of chip packages 300, one of the through silicon vias (TSVs) 157 of the first type of interposer 551 of said each of its second type of chip packages 300, one of the metal bumps, pillars or pads 570 of each of the other(s) of its second type of chip packages 300, one of the metal pads 583 of each of the other(s) of its second type of chip packages 300 and one of the through silicon vias (TSVs) 157 of the first type of interposer 551 of each of the other(s) of its second type of chip packages 300. The package-on-package (POP) assembly as illustrated in FIG. 41A may be provided with the seventh and eighth interconnects 307 and 308 as illustrated in FIG. 25 for delivery of a voltage of power supply (Vcc), a voltage of ground reference (Vss), clock signals (CLK) or other signals.

For the package-on-package (POP) assembly as illustrated in FIG. 41B, the interconnection metal layers 6 of the first interconnection scheme 560 of the second type of interposer 551 of each of its second type of chip packages 300 may have the same circuit layout as those of each of the other(s) of its second type of chip packages 300 and the interconnection metal layers 27 of the backside interconnection scheme for a logic drive or device (BISD) 79 of each of its second type of chip packages 300 may have the same circuit layout as those of each of the other(s) of its second type of chip packages 300. Each of the metal bumps, pillars or pads 570 of each of its second type of chip packages 300 may be vertically aligned with one of the metal pads 583 of said each of its second type of chip packages 300, one of the through silicon vias (TSVs) 157 of the second type of interposer 551 of said each of its second type of chip packages 300, one of the metal bumps, pillars or pads 570 of each of the other(s) of its second type of chip packages 300, one of the metal pads 583 of each of the other(s) of its second type of chip packages 300 and one of the through silicon vias (TSVs) 157 of the second type of interposer 551 of each of the other(s) of its second type of chip packages 300. The package-on-package (POP) assembly as illustrated in FIG. 41B may be provided with the seventh and eighth interconnects 307 and 308 as illustrated in FIG. 25 for delivery of a voltage of power supply (Vcc), a voltage of ground reference (Vss), clock signals (CLK) or other signals.

Fourth Embodiment for Chip Package Based on Interconnection Substrate (IS) Embedded with Fine-line Interconnection Bridge (FIB)

1. First Type of Chip Package for Fourth Embodiment

Figure 43A:
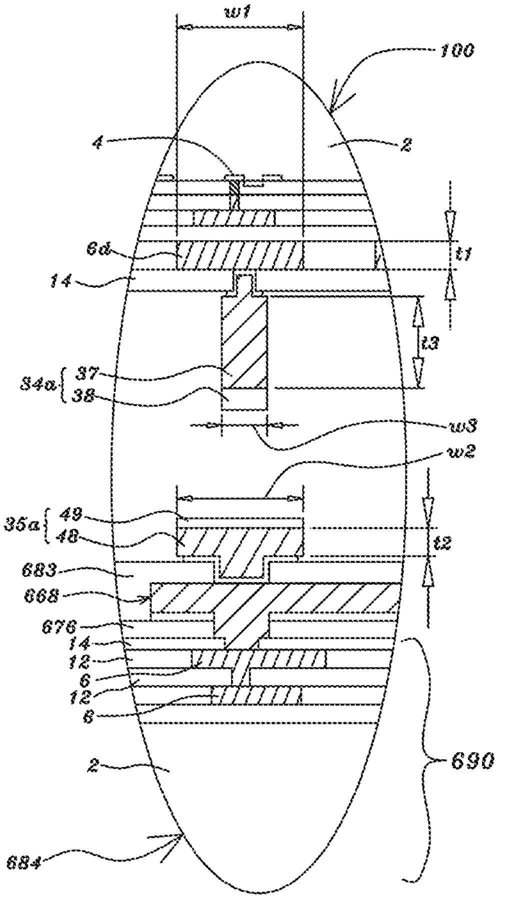
FIGS. 43A and 43B are schematically cross-sectional views showing a process of bonding a thermal compression bump for a high-density, small-size bump of a semiconductor chip to a thermal compression pad for a high-density, small-size pad of an interconnection substrate in accordance with an embodiment of the present application.
Figure 43B:
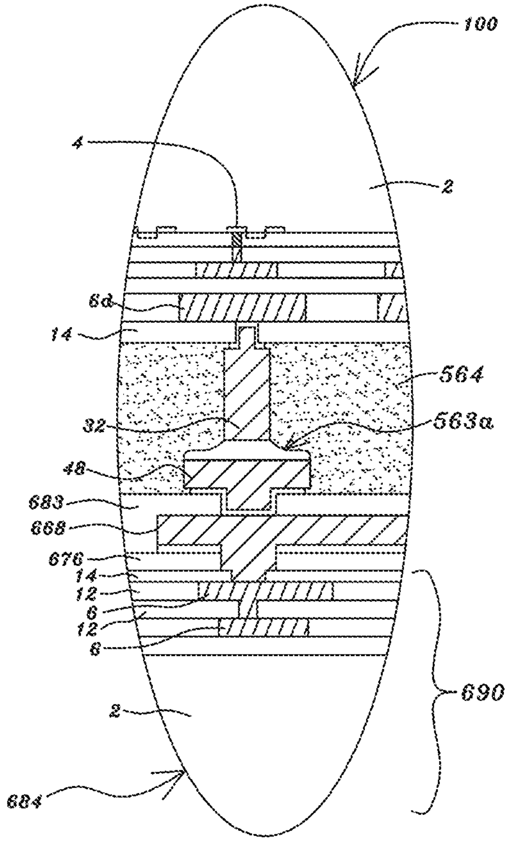
Figure 43C:
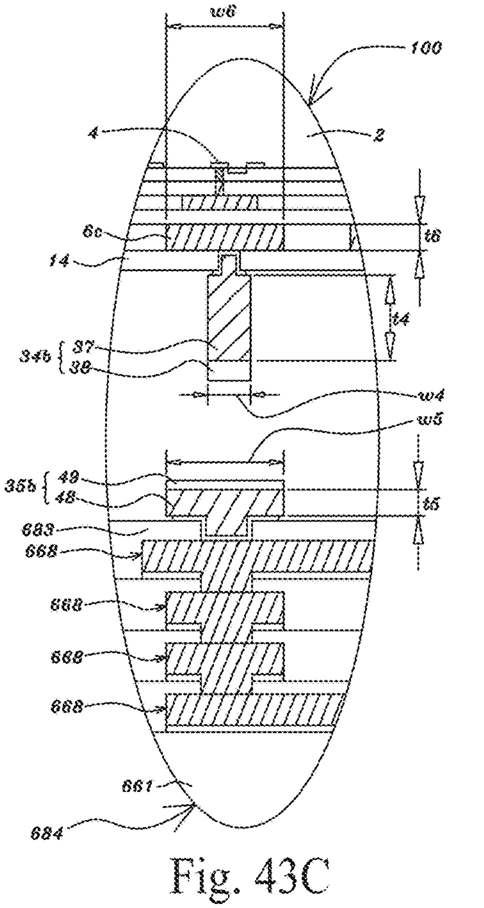
FIGS. 43C and 43D are schematically cross-sectional views showing a process of bonding a thermal compression bump for a low-density, large-size bump of a semiconductor chip to a thermal compression pad for a low-density, large-size pad of an interconnection substrate in accordance with an embodiment of the present application.
Figure 43D:
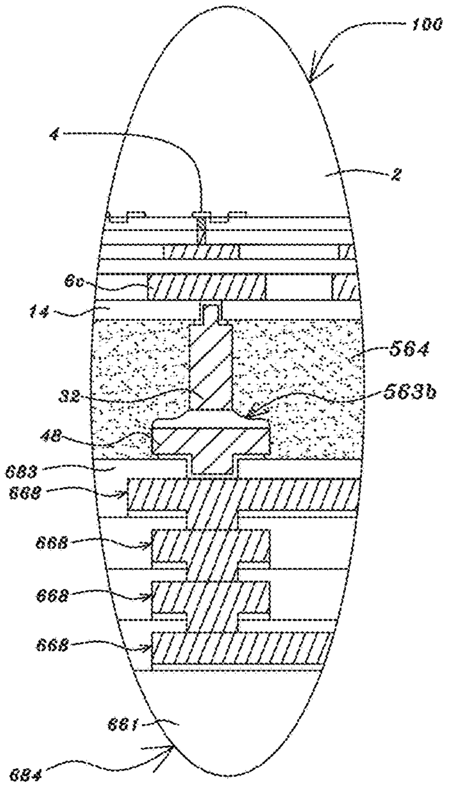
Figure 44A:
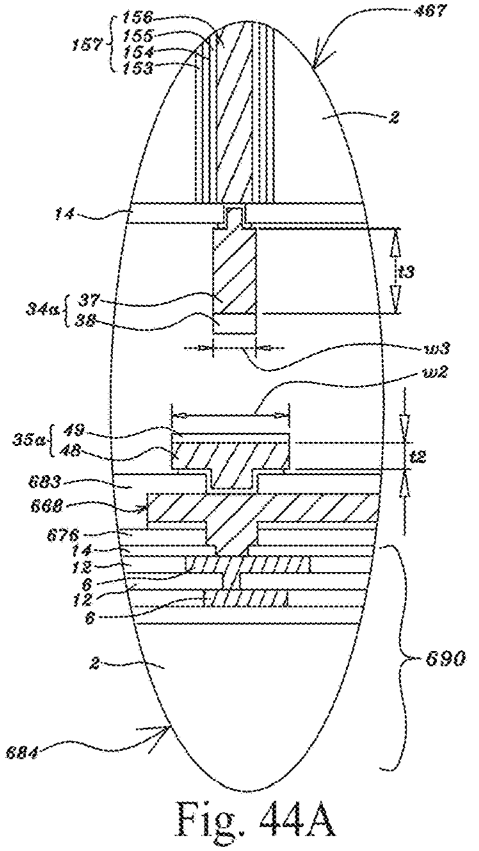
FIGS. 44A and 44B are schematically cross-sectional views showing a process of bonding a thermal compression bump for a high-density, small-size bump of a vertical-through-via (VTV) connector to a thermal compression pad for a high-density, small-size pad of an interconnection substrate in accordance with an embodiment of the present application.
Figure 44B:
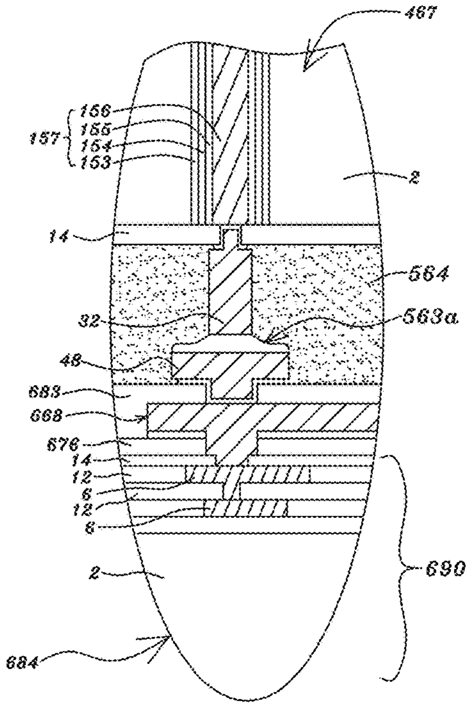
Figure 44C:
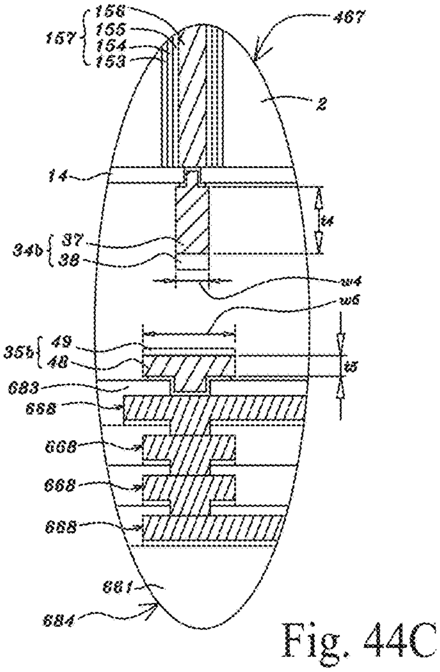
FIGS. 44C and 44D are schematically cross-sectional views showing a process of bonding a thermal compression bump for a low-density, large-size bump of a vertical-through-via (VTV) connector to a thermal compression pad for a low-density, large-size pad of an interconnection substrate in accordance with an embodiment of the present application.
Figure 44D:
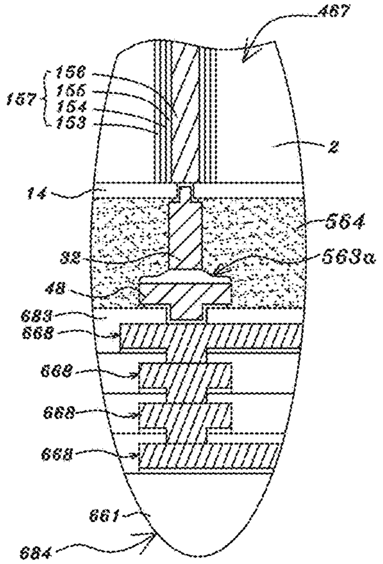

FIGS. 42A-42E are schematically cross-sectional views showing a process for forming a first type of multichip package in accordance with a fourth embodiment of the present application. FIGS. 43A and 43B are schematically cross-sectional views showing a process of bonding a thermal compression bump for a high-density, small-size bump of a semiconductor chip to a thermal compression pad for a high-density, small-size pad of an interconnection substrate in accordance with an embodiment of the present application. FIGS. 43C and 43D are schematically cross-sectional views showing a process of bonding a thermal compression bump for a low-density, large-size bump of a semiconductor chip to a thermal compression pad for a low-density, large-size pad of an interconnection substrate in accordance with an embodiment of the present application. FIGS. 44A and 44B are schematically cross-sectional views showing a process of bonding a thermal compression bump for a high-density, small-size bump of a vertical-through-via (VTV) connector to a thermal compression pad for a high-density, small-size pad of an interconnection substrate in accordance with an embodiment of the present application. FIGS. 44C and 44D are schematically cross-sectional views showing a process of bonding a thermal compression bump for a low-density, large-size bump of a vertical-through-via (VTV) connector to a thermal compression pad for a low-density, large-size pad of an interconnection substrate in accordance with an embodiment of the present application.

Figure 42A:
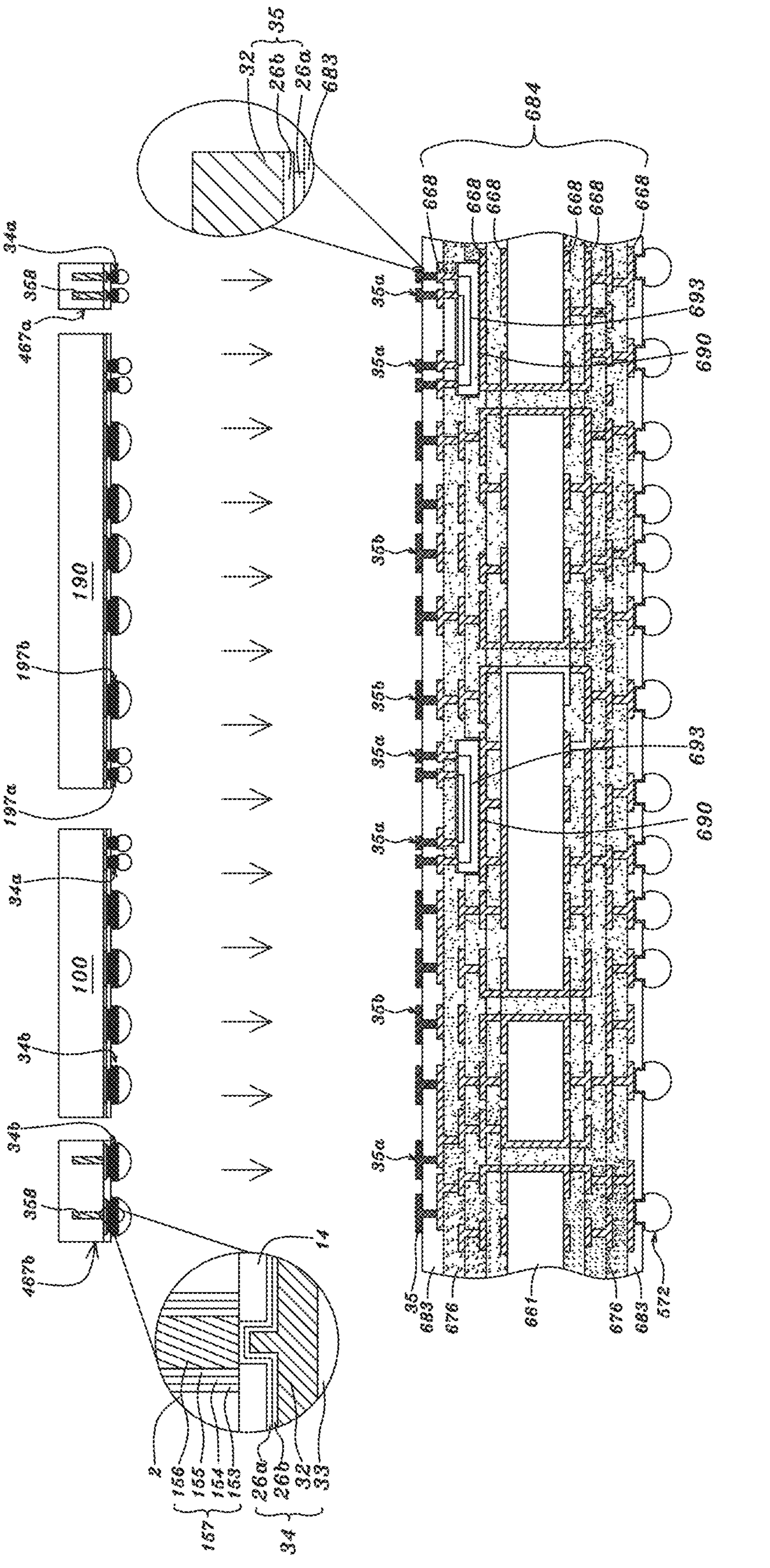
FIGS. 42A-42E are schematically cross-sectional views showing a process for forming a first type of multichip package in accordance with a fourth embodiment of the present application.

Referring to FIG. 42A, an interconnection substrate (IS) 684 may be provided with (1) a core layer 661, such as FR4, containing epoxy or bismaleimide-triazine (BT) resin, wherein FR4 may be a composite material composed of woven fiberglass cloth and an epoxy resin binder, (2) multiple interconnection metal layers 668, made of copper, over and under the core layer 661, (3) multiple polymer layers 676 over and under the core layer 661, wherein each of the polymer layers 676 is between neighboring two of the interconnection metal layers 668, and (4) two solder masks 683 at the top and bottom of the interconnection substrate 684 to cover the topmost and bottommost ones of the interconnection metal layers 668 respectively, wherein the topmost and bottommost ones of the interconnection metal layers 668 may include multiple metal pads at bottoms and tops of multiple openings in the topmost and bottommost ones of solder masks 683 respectively. The interconnection substrate (IS) 684 may further include one or more fine-line interconnection bridges (FIBs) 690 (only one is shown), each as illustrated in FIG. 13A or 13B, embedded in the interconnection bridge (IS) 684. For the interconnection bridge (IS) 684, each of its fine-line interconnection bridges (FIBs) 690 may have a backside attached to a top surface of a lower one of its interconnection metal layers 668 over its core layer 661. A middle one or ones of its interconnection metal layers 668 over its core layer 661 may surround four sidewalls of each of its fine-line interconnection bridges (FIBs) 690. An upper one or ones of its interconnection metal layers 668 over its core layer 661 may be over each of its fine-line interconnection bridges (FIBs) 690 and couple to the first type of micro-bumps or micro-pads 34 of each of its fine-line interconnection bridges (FIBs) 690. For the interconnection substrate (IS) 684, each of its interconnection metal layers 668 may be made of copper and have a thickness, for example, between 5 and 100 micrometer, between 5 and 50 micrometers or between 10 and 50 micrometers, and thicker than that of each of the interconnection metal layers 6 of each of its fine-line interconnection bridges (FIBs) 690.

Referring to FIG. 42A, the interconnection substrate (IS) 684 may further include multiple micro-bumps or micro-pads 35 on the metal pads of the topmost one of its interconnection metal layers 668. Each of its micro-bumps or micro-pads 35 may be of various types. Each of its first type of micro-bumps or micro-pads 35 may include (1) an adhesion layer 26*a*, such as titanium (Ti) or titanium nitride (TiN) layer having a thickness between 1 nm and 50 nm, on the metal pads of the topmost one of its interconnection metal layers 668, (2) a seed layer 26*b*, such as copper, on the adhesion layer 26*a* and (3) a copper layer 32 having a thickness between 1 μm and 60 μm on the seed layer 26*b*. Alternatively, each of its second type of micro-bumps or micro-pads 35 may include the adhesion layer 26*a*, seed layer 26*b* and copper layer 32 as mentioned above, and may further include a tin-containing solder cap made of tin or a tin-silver alloy having a thickness between 1 μm and 50 μm on the copper layer 32. Alternatively, each of its third type of micro-bumps or micro-pads 35 may be thermal compression pads, including the adhesion layer 26*a* and seed layer 26*b* as mentioned above, and further including, as seen in FIGS. 43A and 44A, a copper layer 48 having a thickness t2 between 1 μm and 10 μm or between 2 and 10 micrometers and a largest transverse dimension w2, such as diameter in a circular shape, between 1 μm and 15 μm, such as 5 μm, on the seed layer 26*b* and a metal cap 49 made of a tin-silver alloy, a tin-gold alloy, a tin-copper alloy, a tin-indium alloy, indium, tin or gold, which has a thickness between 0.1 μm and 5 μm, such as 1 μm, on the copper layer 48. A pitch between neighboring two of its third type of micro-bumps or micro-pads 35 may be between 3 μm and 20 μm. Alternatively, each of its fourth type of micro-bumps or micro-pads 35 may be thermal compression pads, including the adhesion layer 26*a* and seed layer 26*b* as mentioned above, and further including, as seen in FIGS. 43C and 44C, a copper layer 48 having a thickness t5 between 1 μm and 10 μm or between 2 and 10 micrometers and a largest transverse dimension w5, such as diameter in a circular shape, greater than 25 μm or between 25 μm and 150 μm, on the seed layer 26*b* and a metal cap 49 made of a tin-silver alloy, a tin-gold alloy, a tin-copper alloy, a tin-indium alloy, indium, tin or gold, which has a thickness between 0.1 μm and 5 μm, such as 1 μm, and a largest transverse dimension, such as diameter in a circular shape, greater than 25 μm or between 25 μm and 150 μm, on the copper layer 48. A pitch between neighboring two of its fourth type of micro-bumps or micro-pads 35 may be greater than 25 μm, 30 μm or 50 μm.

Referring to FIG. 42A, for the interconnection substrate (IS) 684, its micro-bumps or micro-pads 35 may be shaped like micro-pads that are divided into two groups, i.e., a first group 35*a* for high-density, small-size micro-pads (HDP) and a second group 35*b* for low-density, large-size copper pads (LDP). Its first group of micro-pads 35*a* may have some each arranged vertically over one of its fine-line interconnection bridges (FIBs) 690 and coupled to one of the metal pads 691 and 692 (shown in FIG. 13A or 13B) of said one of its fine-line interconnection bridges (FIBs) 690, which are provided by the topmost one of the insulating dielectric layers 6 of the first interconnection scheme 560 of said one of its fine-line interconnection bridges (FIBs) 690 (shown in FIG. 13A) or the topmost one of the insulating dielectric layers 27 of the second interconnection scheme 588 of said one of its fine-line interconnection bridges (FIBs) 690 (shown in FIG. 13B), through, in sequence, the upper one or ones of its interconnection metal layers 668 and one of the first type of micro-bumps or micro-pads 34 of said one of its fine-line interconnection bridges (FIBs) 690. Thereby, one of its first group of micro-pads 35 may couple to another of its first group of micro-pads 35 through one of the metal lines or traces 693 of one of its fine-line interconnection bridges (FIBs) 690, which is provided by one or more of the insulating dielectric layers 6 of the first interconnection scheme 560 of said one of its fine-line interconnection bridges (FIBs) 690 (shown in FIG. 13A) and/or one or more of the insulating dielectric layers 27 of the second interconnection scheme 588 of said one of its fine-line interconnection bridges (FIBs) 690 (shown in FIG. 13B). Its second group of metal pads 35*b* are arranged not vertically over each of its fine-line interconnection bridges (FIBs) 690 and have some each coupled to the interconnection metal layers 668 horizontally around and under one or more of its fine-line interconnection bridges (FIBs) 690.

Referring to FIG. 42A, multiple of the semiconductor integrated-circuit chips 100, each of which may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS.

12A and 12B, or (8) a power management integrated-circuit (IC) chip, each may have the same specification as illustrated in FIG. 14A or 14B, provided with the first, second or third type of micro-bumps or micro-pads 34 that may be divided into two groups, i.e., a first group 34a for high-density, small-size micro-bumps (HDB) and a second group 34b for low-density, large-size micro-bumps (LDB). Further, referring to FIG. 27A, multiple first type of operation units 190, each of which may have the same specification as illustrated in FIG. 17F, 17G, 19G or 19H, each may be provided with the first, second or third type of micro-bumps or micro-pads 197 that may be divided into two groups, i.e., a first group 197a for high-density, small-size micro-bumps (HDB) and a second group 197b for low-density, large-size micro-bumps (LDB). Further, multiple first type of vertical-through-via (VTV) connectors 467 may be provided in two groups, i.e., a first group of vertical-through-via (VTV) connectors 467a (only one is shown) and a second group of vertical-through-via (VTV) connectors 467b (only one is shown). Each of the first group of vertical-through-via (VTV) connectors 467a may have the same specification as illustrated in FIG. 1A, 1C, 1E, 2A, 2C or 2E, provided with the first, second or third type of micro-bumps or micro-pads 34 in a first group 34a for high-density, small-size micro-bumps (HDB), may have the same specification as illustrated in FIG. 4A, 4B, 4C, 5A, 5B or 5C, provided with the fifth type of micro-bumps or micro-pads 34 in a first group 34a for high-density, small-size micro-bumps (HDB), or may have the same specification as illustrated in FIG. 6, provided with the sixth type of micro-bumps or micro-pads 34 in a first group 34a for high-density, small-size micro-bumps (HDB). Each of the second group of vertical-through-via (VTV) connectors 467b may have the same specification as illustrated in FIG. 1A, 1C, 1E, 2A, 2C or 2E, provided with the first, second or third type of micro-bumps or micro-pads 34 in a second group 34b for low-density, large-size micro-bumps (LDB), may have the same specification as illustrated in FIG. 4A, 4B, 4C, 5A, 5B or 5C, provided with the fifth type of micro-bumps or micro-pads 34 in a second group 34b for low-density, large-size micro-bumps (LDB), or may have the same specification as illustrated in FIG. 6, provided with the sixth type of micro-bumps or micro-pads 34 in a second group 34b for low-density, large-size micro-bumps (LDB).

For each of the semiconductor integrated-circuit (IC) chips 100, first type of operation units 190 and first group of vertical-through-via (VTV) connectors 467a as seen in FIG. 42A, each of its first group of micro-bumps or micro-pads 34a or 197a may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The smallest space between neighboring two of its first group of micro-bumps or micro-pads 34a or 197a may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

For each of the semiconductor integrated-circuit (IC) chips 100, first type of operation units 190 and second group of vertical-through-via (VTV) connectors 467b as seen in FIG. 42A, each of its second group of micro-bumps or micro-pads 34b or 197b may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The smallest space between neighboring two of its second group of micro-bumps or micro-pads 34b or 197b may be between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm.

Referring to FIG. 42A, the ratio of the largest dimension in a horizontal cross section of each of the second group of micro-bumps or micro-pads 34b or 197b of each of the semiconductor integrated-circuit (IC) chips 100, first type of operation units 190 and second group of vertical-through-via (VTV) connectors 467b to that of each of the first group of micro-bumps or micro-pads 34a or 197a of each of the semiconductor integrated-circuit (IC) chips 100, first type of operation units 190 and first group of vertical-through-via (VTV) connectors 467a may be between 1.1 and 5 or greater than 1.2, 1.5 or 2, for example. The ratio of the smallest space between neighboring two of the second group of micro-bumps or micro-pads 34b or 197b of each of the semiconductor integrated-circuit (IC) chips 100, first type of operation units 190 and second group of vertical-through-via (VTV) connectors 467b to that between neighboring two of the first group of micro-bumps or micro-pads 34a or 197a of each of the semiconductor integrated-circuit (IC) chips 100, first type of operation units 190 and first group of vertical-through-via (VTV) connectors 467a may be between 1.1 and 5 or greater than 1.2, 1.5 or 2, for example.

For the interconnection substrate (IS) 684 as seen in FIG. 42A, each of its first group of micro-pads 35a may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The smallest space between neighboring two of its first group of micro-pads 35a may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

For the interconnection substrate (IS) 684 as seen in FIG. 42A, each of its second group of micro-pads 35b may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The smallest space between neighboring two of its second group of micro-pads 35b may be between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm.

For the interconnection substrate (IS) 684 as seen in FIG. 42A, the ratio of the largest dimension in a horizontal cross section of each of its second group of micro-pads 35b to that of each of its first group of micro-pads 35a may be between 1.1 and 5 or greater than 1.2, 1.5 or 2, for example. The ratio of the smallest space between neighboring two of its second group of micro-pads 35b to that between neighboring two of its first group of micro-pads 35a may be between 1.1 and 5 or greater than 1.2, 1.5 or 2, for example.

For a first case, referring to FIGS. 42A, 42B, 43A-43D and 44A-44D, each of the semiconductor integrated-circuit (IC) chips 100, first type of operation units 190 and first group of vertical-through-via (VTV) connectors 467*a* may have the third type of micro-bumps or micro-pads 34 or 197 for the first group of micro-bumps or micro-pads 34*a* or 197*a* each to be bonded to one of the third type of micro-bumps or micro-pads 35 for the first group of micro-pads 35*a* of the interconnection substrate (IS) 684, and each of the semiconductor integrated-circuit (IC) chips 100, first type of operation units 190 and second group of vertical-through-via (VTV) connectors 467*b* may have the third type of micro-bumps or micro-pads 34 or 197 for the second group of micro-bumps or micro-pads 34*b* or 197*b* each to be bonded to one of the fourth type of micro-bumps or micro-pads 35 for the second group of micro-pads 35*b* of the interconnection substrate (IS) 684.

For example, referring to FIGS. 43A, 43B, 44A and 44B, each of the third type of micro-bumps or micro-pads 34 or 197 for the first group of micro-bumps or micro-pads 34*a* or 197*a* of each of the semiconductor integrated-circuit (IC) chips 100, first type of operation units 190 and first group of vertical-through-via (VTV) connectors 467*a* may have the solder cap 38 to be thermally compressed, at a temperature between 240 and 300 degrees Celsius, at a pressure between 0.3 and 3 Mpa and for a time period between 3 and 15 seconds, onto the metal cap 49 of one of the third type of micro-bumps or micro-pads 35 for the first group of micro-pads 35*a* of the interconnection substrate (IS) 684 into a high-density bonded contact 563*a* therebetween. Each of the third type of micro-bumps or micro-pads 34 or 197 for the first group of micro-bumps or micro-pads 34*a* or 197*a* of each of the semiconductor integrated-circuit (IC) chips 100, first type of operation units 190 and first group of vertical-through-via (VTV) connectors 467*a* may include the copper layer 37 having the thickness t3 greater than the thickness t2 of the copper layer 48 of each of the third type of micro-bumps or micro-pads 35 for the first group of micro-pads 35*a* of the interconnection substrate (IS) 684 and having the largest transverse dimension w3 equal to between 0.7 and 0.1 times of the largest transverse dimension w2 of the copper layer 48 of the underlying one of the third type of micro-bumps or micro-pads 35 for the first group of micro-pads 35*a* of the interconnection substrate (IS) 684. Alternatively, each of the third type of micro-bumps or micro-pads 34 or 197 for the first group of micro-bumps or micro-pads 34*a* or 197*a* of each of the semiconductor integrated-circuit (IC) chips 100, first type of operation units 190 and first group of vertical-through-via (VTV) connectors 467*a* may be provided with the copper layer 37 having a cross-sectional area equal to between 0.5 and 0.01 times of the cross-sectional area of the copper layer 48 of the underlying one of the third type of micro-bumps or micro-pads 35 for the first group of micro-pads 35*a* of the interconnection substrate (IS) 684.

Further, referring to FIGS. 43C, 43D, 44C and 44D for the first case, each of the third type of micro-bumps or micro-pads 34 or 197 for the second group of micro-bumps or micro-pads 34*b* or 197*b* of each of the semiconductor integrated-circuit (IC) chips 100, first type of operation units 190 and second group of vertical-through-via (VTV) connectors 467*b* may have the solder cap 38 to be thermally compressed, at a temperature between 240 and 300 degrees Celsius, at a pressure between 0.3 and 3 Mpa and for a time period between 3 and 15 seconds, onto the metal cap 49 of one of the fourth type of micro-bumps or micro-pads 35 for the second group of micro-pads 35*b* of the interconnection substrate (IS) 684 into a low-density bonded contact 563*b* therebetween. Each of the third type of micro-bumps or micro-pads 34 or 197 for the second group of micro-bumps or micro-pads 34*b* or 197*b* of each of the semiconductor integrated-circuit (IC) chips 100, first type of operation units 190 and second group of vertical-through-via (VTV) connectors 467*b* may include the copper layer 37 having the thickness t4 greater than the thickness t5 of the copper layer 48 of each of the fourth type of micro-bumps or micro-pads 35 for the second group of micro-pads 35*b* of the interconnection substrate (IS) 684 and having the largest transverse dimension w4 equal to between 0.7 and 0.1 times of the largest transverse dimension w5 of the copper layer 48 of the underlying one of the fourth type of micro-bumps or micro-pads 35 for the second group of micro-pads 35*b* of the interconnection substrate (IS) 684. Alternatively, each of the third type of micro-bumps or micro-pads 34 or 197 for the second group of micro-bumps or micro-pads 34*b* or 197*b* of each of the semiconductor integrated-circuit (IC) chips 100, first type of operation units 190 and second group of vertical-through-via (VTV) connectors 467*b* may be provided with the copper layer 37 having a cross-sectional area equal to between 0.5 and 0.01 times of the cross-sectional area of the copper layer 48 of the underlying one of the fourth type of micro-bumps or micro-pads 35 for the second group of micro-pads 35*b* of the interconnection substrate (IS) 684.

Thereby, referring to FIGS. 43B, 43D, 44B and 44D for the first case, a bonded solder between the copper layers 37 and 48 of each of the high-density and low-density bonded contacts 563*a* and 563*b* may be mostly kept on a top surface of the copper layer 48 of the underlying one of the third or fourth type of micro-bumps or micro-pads 35 for the first or second group of micro-pads 35*a* or 35*b* of the interconnection substrate (IS) 684 and extends out of the edge of the copper layer 48 of the underlying one of the third or fourth type of micro-bumps or micro-pads 35 for the first or second group of micro-pads 35*a* or 35*b* of the interconnection substrate (IS) 684 less than 0.5 micrometers. Thus, a short between neighboring two of the high-density and low-density bonded contacts 563*a* and 563*b* even in a fine-pitched fashion may be avoided.

Further, referring to FIGS. 43A and 43B for the first case, for each of the semiconductor integrated-circuit (IC) chips 100, each of its third type of micro-bumps or micro-pads 34 for the first group of micro-bumps or micro-pads 34*a* may be formed on a bottom surface of one of metal pads 6*d* provided by the bottommost one, i.e., the topmost one as seen in FIG. 14A or 14B, of the interconnection metal layers 27 of its second interconnection scheme 588 or by, if the second interconnection scheme 588 is not provided for said each of the semiconductor integrated-circuit chips 100, the bottommost one, i.e., the topmost one as seen in FIG. 14A or 14B, of the interconnection metal layers 6 of its first interconnection scheme 560, wherein each of its third type of micro-bumps or micro-pads 34 for the first group of micro-bumps or micro-pads 34*a* may be provided with the copper layer 37 having the thickness t3 greater than the thickness t1 of the overlying one of its metal pads 6*d* and having the largest transverse dimension w3 equal to between 0.7 and 0.1 times of the largest transverse dimension w1 of the overlying one of its metal pads 6*d*; alternatively, each of its third type of micro-bumps or micro-pads 34 for the first group of micro-bumps or micro-pads 34*a* may be provided with the copper layer 37 having a cross-sectional area equal to between 0.5 and 0.01 times of the cross-sectional area of the overlying one of its metal pads 6*d*; each of its metal pads 6*d* may have a thickness t1 between 1 and 10 micrometers or between 2 and 10 micrometers and a largest transverse dimension w1, such as diameter in a circular shape, between 1 μm and 15 μm, such as 5 μm.

Further, referring to FIGS. 43C and 43D, for each of the semiconductor integrated-circuit (IC) chips 100, each of its third type of micro-bumps or micro-pads 34 for the second group of micro-bumps or micro-pads 34*a* may be formed on a bottom surface of one of metal pads 6*c* provided by the bottommost one, i.e., the topmost one as seen in FIG. 14A or 14B, of the interconnection metal layers 27 of its second interconnection scheme 588 or by, if the second interconnection scheme 588 is not provided for said each of the semiconductor integrated-circuit chips 100, the bottommost one, i.e., the topmost one as seen in FIG. 14A or 14B, of the interconnection metal layers 6 of its first interconnection scheme 560, wherein each of its third type of micro-bumps or micro-pads 34 for the second group of micro-bumps or micro-pads 34*a* may be provided with the copper layer 37 having the thickness t4 greater than the thickness t6 of the overlying one of its metal pads 6*c* and having the largest transverse dimension w4 equal to between 0.7 and 0.1 times of the largest transverse dimension w6 of the overlying one of its metal pads 6*c*; alternatively, each of its third type of micro-bumps or micro-pads 34 for the second group of micro-bumps or micro-pads 34*a* may be provided with the copper layer 37 having a cross-sectional area equal to between 0.5 and 0.01 times of the cross-sectional area of the overlying one of its metal pads 6*c*; each of its metal pads 6*c* may have a thickness t6 between 1 and 10 micrometers or between 2 and 10 micrometers and a largest transverse dimension w6, such as diameter in a circular shape, between 30 μm and 250 μm, such as 40 μm.

Figure 42B:
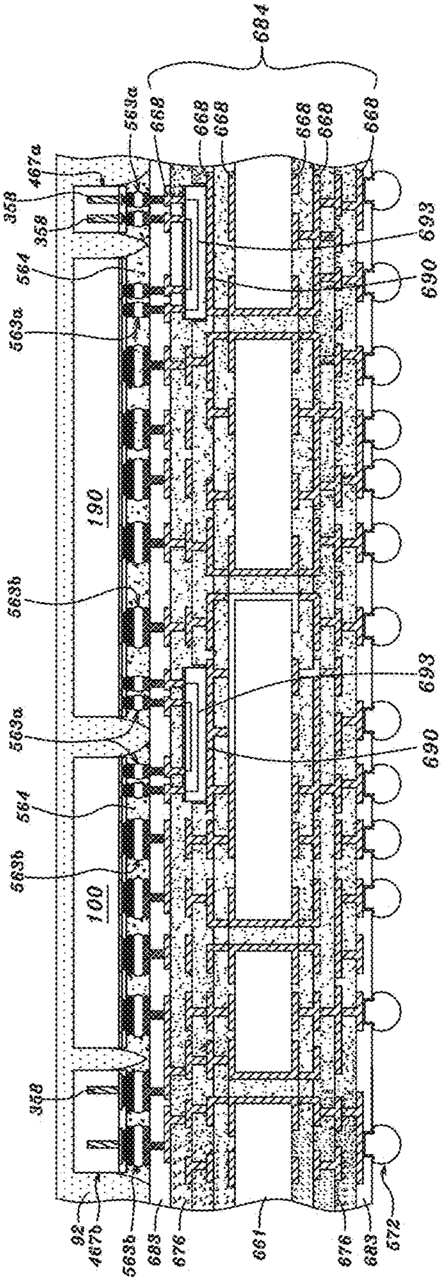

Alternatively, for a second case, referring to FIGS. 42A and 42B, each of the semiconductor integrated-circuit (IC) chips 100, first type of operation units 190 and first group of vertical-through-via (VTV) connectors 467*a* may be provided with the second type of micro-bumps or micro-pads 34 or 197 for the first group of micro-bumps or micro-pads 34*a* or 197*a* each having the solder cap 33 to be bonded to the copper layer 32 of one of the first type of micro-bumps or micro-pads 35 for the first group of micro-pads 35*a* of the interconnection substrate (IS) 684 into a high-density bonded contact 563*a* therebetween; each of the semiconductor integrated-circuit (IC) chips 100, first type of operation units 190 and second group of vertical-through-via (VTV) connectors 467*a* may be provided with the second type of micro-bumps or micro-pads 34 or 197 for the second group of micro-bumps or micro-pads 34*b* or 197*b* each having the solder cap 33 to be bonded to the copper layer 32 of one of the first type of micro-bumps or micro-pads 35 for the second group of micro-pads 35*b* of the interconnection substrate (IS) 684 into a low-density bonded contact 563*b* therebetween. Each of the second type of micro-bumps or micro-pads 34 for the first and second groups of micro-bumps or micro-pads 34*a* or 34*b* of each of the semiconductor integrated-circuit (IC) chips 100, first type of operation units 190 and first and second groups of vertical-through-via (VTV) connectors 467*a* and 467*b* may include the copper layer 32 having a thickness greater than that of the copper layer 32 of each of the first type of micro-bumps or micro-pads 35 for the first and second groups of micro-pads 35*a* and 35*b* of the interconnection substrate (IS) 684.

Alternatively, for a third case, referring to FIGS. 42A and 42B, each of the semiconductor integrated-circuit (IC) chips 100, first type of operation units 190 and first group of vertical-through-via (VTV) connectors 467*a* may be provided with the first type of micro-bumps or micro-pads 34 or 197 for the first group of micro-bumps or micro-pads 34*a* or 197*a* each having the copper layer 32 to be bonded to the solder cap 33 of one of the second type of micro-bumps or micro-pads 35 for the first group of micro-pads 35*a* of the interconnection substrate (IS) 684 into a high-density bonded contact 563*a* therebetween; each of the semiconductor integrated-circuit (IC) chips 100, first type of operation units 190 and second group of vertical-through-via (VTV) connectors 467*a* may be provided with the first type of micro-bumps or micro-pads 34 or 197 for the second group of micro-bumps or micro-pads 34*b* or 197*b* each having the copper layer 32 to be bonded to the solder cap 33 of one of the second type of micro-bumps or micro-pads 35 for the second group of micro-pads 35*b* of the interconnection substrate (IS) 684 into a low-density bonded contact 563*b* therebetween. Each of the first type of micro-bumps or micro-pads 34 for the first and second groups of micro-bumps or micro-pads 34*a* or 34*b* of each of the semiconductor integrated-circuit (IC) chips 100, first type of operation units 190 and first and second groups of vertical-through-via (VTV) connectors 467*a* and 467*b* may include the copper layer 32 having a thickness greater than that of the copper layer 32 of each of the second type of micro-bumps or micro-pads 35 for the first and second groups of micro-pads 35*a* and 35*b* of the interconnection substrate (IS) 684.

Alternatively, for a fourth case, referring to FIGS. 42A and 42B, each of the semiconductor integrated-circuit (IC) chips 100, first type of operation units 190 and first group of vertical-through-via (VTV) connectors 467*a* may be provided with the second type of micro-bumps or micro-pads 34 or 197 for the first group of micro-bumps or micro-pads 34*a* or 197*a* each having the solder cap 33 to be bonded to the solder cap 33 of one of the second type of micro-bumps or micro-pads 35 for the first group of micro-pads 35*a* of the interconnection substrate (IS) 684 into a high-density bonded contact 563*a* therebetween; each of the semiconductor integrated-circuit (IC) chips 100, first type of operation units 190 and second group of vertical-through-via (VTV) connectors 467*a* may be provided with the second type of micro-bumps or micro-pads 34 or 197 for the second group of micro-bumps or micro-pads 34*b* or 197*b* each having the solder cap 33 to be bonded to the solder cap 33 of one of the second type of micro-bumps or micro-pads 35 for the second group of micro-pads 35*b* of the interconnection substrate (IS) 684 into a low-density bonded contact 563*b* therebetween. Each of the second type of micro-bumps or micro-pads 34 for the first and second groups of micro-bumps or micro-pads 34*a* or 34*b* of each of the semiconductor integrated-circuit (IC) chips 100, first type of operation units 190 and first and second groups of vertical-through-via (VTV) connectors 467*a* and 467*b* may include the copper layer 32 having a thickness greater than that of the copper layer 32 of each of the second type of micro-bumps or micro-pads 35 for the first and second groups of micro-pads 35*a* and 35*b* of the interconnection substrate (IS) 684.

Alternatively, for a fifth case, referring to FIGS. 42A and 42B, each of the first group of vertical-through-via (VTV) connectors 467*a* may be provided with the fifth type of micro-bumps or micro-pads 34 for the first group of micro-bumps or micro-pads 34*a* each having the solder layer 719 to be bonded to the copper layer 32 of one of the first type of micro-bumps or micro-pads 35 for the first group of micro-pads 35*a* of the interconnection substrate (IS) 684 into a high-density bonded contact 563*a* therebetween; each of the second group of vertical-through-via (VTV) connectors 467*a* may be provided with the fifth type of micro-bumps or micro-pads 34 for the second group of micro-bumps or micro-pads 34*b* each having the solder layer 719 to be bonded to the copper layer 32 of one of the first type of micro-bumps or micro-pads 35 for the second group of micro-pads 35*b* of the interconnection substrate (IS) 684 into a low-density bonded contact 563*b* therebetween.

Alternatively, for a sixth case, referring to FIGS. 42A and 42B, each of the first group of vertical-through-via (VTV) connectors 467*a* may be provided with the fifth type of micro-bumps or micro-pads 34 for the first group of micro-bumps or micro-pads 34*a* each having the solder layer 719 to be bonded to the solder cap 33 of one of the second type of micro-bumps or micro-pads 35 for the first group of micro-pads 35*a* of the interconnection substrate (IS) 684 into a high-density bonded contact 563*a* therebetween; each of the second group of vertical-through-via (VTV) connectors 467*a* may be provided with the fifth type of micro-bumps or micro-pads 34 for the second group of micro-bumps or micro-pads 34*b* each having the solder layer 719 to be bonded to the solder cap 33 of one of the second type of micro-bumps or micro-pads 35 for the second group of micro-pads 35*b* of the interconnection substrate (IS) 684 into a low-density bonded contact 563*b* therebetween.

Alternatively, for a seventh case, referring to FIGS. 42A and 42B, each of the first group of vertical-through-via (VTV) connectors 467*a* may be provided with the sixth type of micro-bumps or micro-pads 34 for the first group of micro-bumps or micro-pads 34*a* each having the solder ball 321 to be bonded to the copper layer 32 of one of the first type of micro-bumps or micro-pads 35 for the first group of micro-pads 35*a* of the interconnection substrate (IS) 684 into a high-density bonded contact 563*a* therebetween; each of the second group of vertical-through-via (VTV) connectors 467*a* may be provided with the sixth type of micro-bumps or micro-pads 34 for the second group of micro-bumps or micro-pads 34*b* each having the solder ball 321 to be bonded to the copper layer 32 of one of the first type of micro-bumps or micro-pads 35 for the second group of micro-pads 35*b* of the interconnection substrate (IS) 684 into a low-density bonded contact 563*b* therebetween.

Alternatively, for an eighth case, referring to FIGS. 42A and 42B, each of the first group of vertical-through-via (VTV) connectors 467*a* may be provided with the sixth type of micro-bumps or micro-pads 34 for the first group of micro-bumps or micro-pads 34*a* each having the solder ball 321 to be bonded to the solder cap 33 of one of the second type of micro-bumps or micro-pads 35 for the first group of micro-pads 35*a* of the interconnection substrate (IS) 684 into a high-density bonded contact 563*a* therebetween; each of the second group of vertical-through-via (VTV) connectors 467*a* may be provided with the sixth type of micro-bumps or micro-pads 34 for the second group of micro-bumps or micro-pads 34*b* each having the solder ball 321 to be bonded to the solder cap 33 of one of the second type of micro-bumps or micro-pads 35 for the second group of micro-pads 35*b* of the interconnection substrate (IS) 684 into a low-density bonded contact 563*b* therebetween.

Referring to FIG. 42B, each of the high-density bonded contacts 563*a* may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The smallest space between neighboring two of the high-density bonded contacts 563*a* may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. Each of the low-density bonded contacts 563*b* may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The smallest space between neighboring two of the low-density bonded contacts 563*b* may be between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The ratio of the largest dimension in a horizontal cross section of each of the low-density bonded contacts 563*b* to that of each of the high-density bonded contacts 563*a* may be between 1.1 and 5 or greater than 1.2, 1.5 or 2, for example. The ratio of the smallest space between neighboring two of the low-density bonded contacts 563*b* to that between neighboring two of the high-density bonded contacts 563*a* may be between 1.1 and 5 or greater than 1.2, 1.5 or 2, for example.

Next, referring to FIG. 42B, an underfill 564, such as a layer of polymer or epoxy resins or compounds, may be filled into a gap between each of the semiconductor integrated-circuit (IC) chips 100, first type of operation units 190 and first and second groups of vertical-through-via (VTV) connectors 467*a* and 467*b* and the interconnection substrate (IS) 684 to enclose the high-density and low-density bonded contacts 563*a* and 563*b* therebetween. The underfill 564 may be cured at temperature equal to or above 100, 120 or 150 degrees Celsius.

Next, referring to FIG. 34B, a polymer layer 92 may be applied to fill a gap between each neighboring two of the semiconductor integrated-circuit (IC) chips 100, first type of operation units 190 and first and second groups of vertical-through-via (VTV) connectors 467*a* and 467*b* and to cover a backside of each of the semiconductor integrated-circuit (IC) chips 100, first type of operation units 190 and first and second groups of vertical-through-via (VTV) connectors 467*a* and 467*b* by methods, for example, spin-on coating, screen-printing, dispensing or molding. The polymer layer 92 may have the same specification or material as that illustrated in FIG. 22B.

Figure 42C:
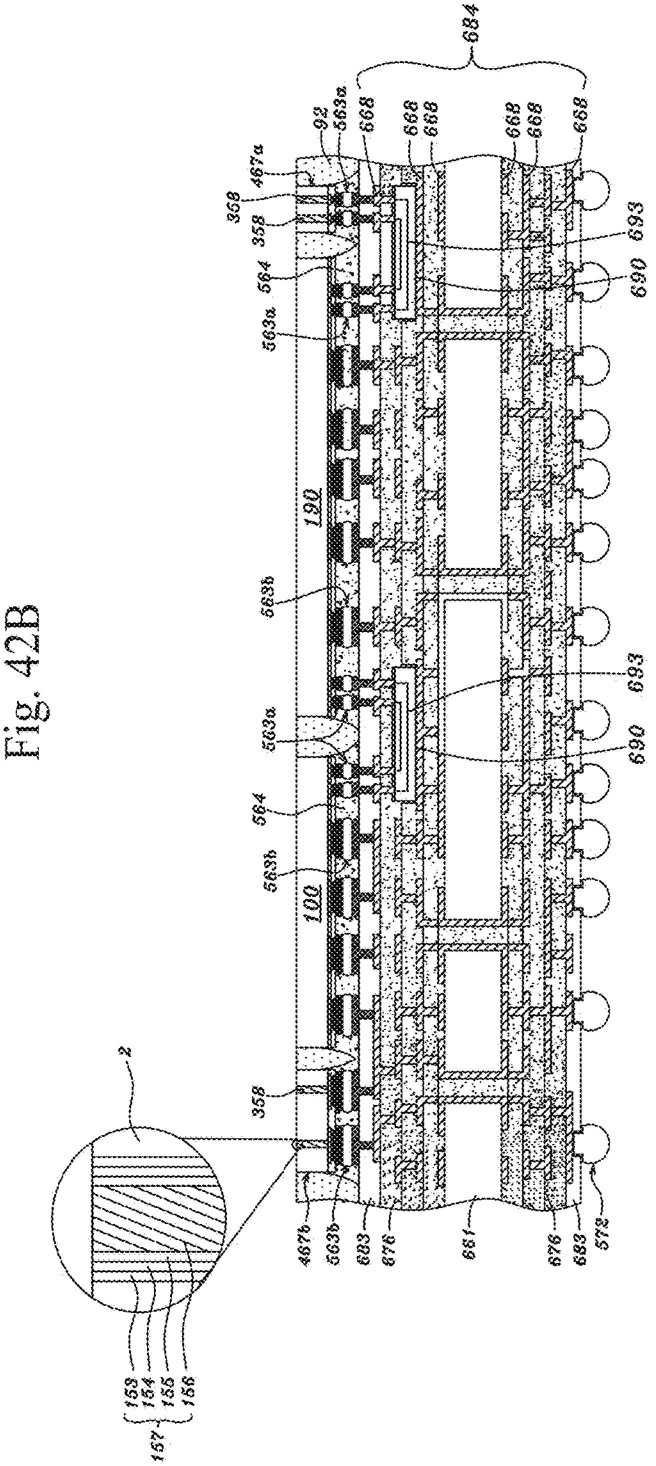

Next, referring to FIG. 42C, a chemical mechanical polishing (CMP), polishing or grinding process may be applied to remove a top portion of the polymer layer 92, a top portion of each of the semiconductor integrated-circuit (IC) chips 100, a top portion of each of the first type of operation units 190 and a top portion of each of the first and second groups of vertical-through-via (VTV) connectors 467*a* and 467*b* and to expose a backside of each of the vertical through vias (VTVs) 358 of each of the first and second groups of vertical-through-via (VTV) connectors 467*a* and 467*b*. Each of the vertical through vias (VTVs) 358 of said each of the first and second groups of vertical-through-via (VTV) connectors 467*a* and 467*b* may have the same specifications as that the first type of vertical-through-via (VTV) connector 467 illustrated in FIG. 27C.

Figure 42D:
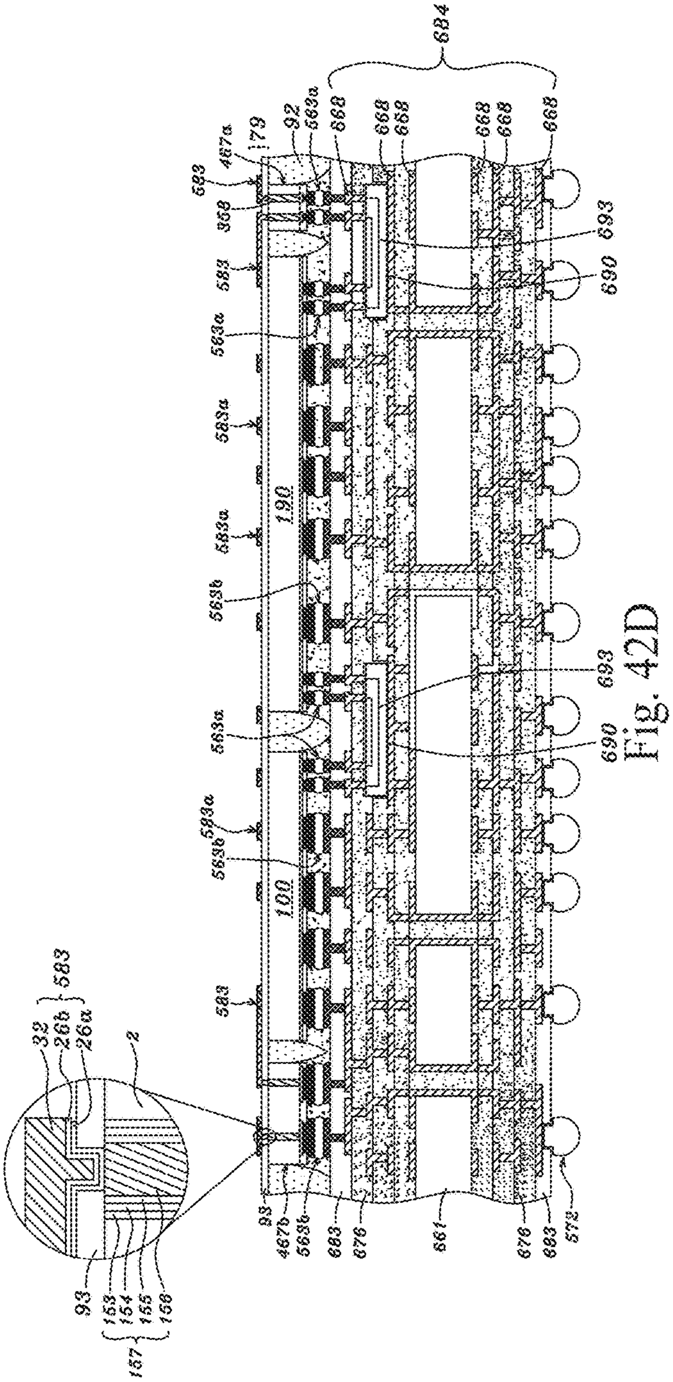

Next, referring to FIG. 42D, a backside interconnection scheme for a logic drive or device (BISD) 79 may be formed on the backside of each of the semiconductor integrated-circuit (IC) chips 100, the backside of each of the first type of operation units 190, the backside of each of the first and second groups of vertical-through-via (VTV) connectors 467*a* and 467*b* and the top surface of the polymer layer 92. The backside interconnection scheme for a logic drive or device (BISD) 79 may have the same specifications as that illustrated in FIG. 27D.

Next, referring to FIG. 42D, multiple metal bumps 572, such as solder bumps, may be formed on multiple metal pads of the bottommost one of the interconnection metal layers 668 of the interconnection substrate (IS) 684 by a screen printing method or a solder-ball mounting method, and then by a solder reflow process. The metal bumps 572 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. Each of the metal bumps 572 may have a height, from a backside surface of the interconnection substrate (IS) 684, for example between 5 μm and 150 μm, between 5 μm and 120 μm, between 10 μm and 100 μm, between 10 μm and 60 μm, between 10 μm and 40 μm, between 10 μm and 30 μm or greater than or equal to 75 μm, 50 μm, 30 μm, 20 μm, 15 μm or 10 μm and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60 μm, between 10 μm and 40 μm, between 10 μm and 30 μm or greater than or equal to 100 μm, 60 μm, 50 μm, 40 μm, 30 μm, 20 μm, 15 μm or 10 μm. The smallest space from one of the metal bumps 572 to its nearest neighboring one of the metal bumps 572 is, for example, between 5 μm and 150 μm, between 5 μm and 120 μm, between 10 μm and 100 μm, between 10 μm and 60 μm, between 10 μm and 40 μm, between 10 μm and 30 μm or greater than or equal to 60 μm, 50 μm, 40 μm, 30 μm, 20 μm, 15 μm or 10 μm.

Figure 42E:
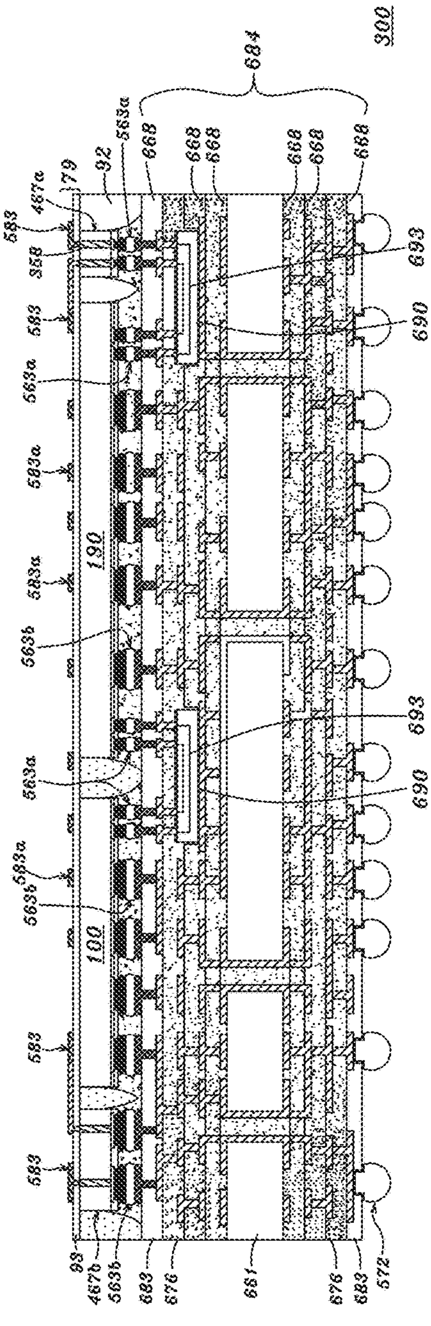

Next, the insulating dielectric layer 93, the polymer layer 92 and the polymer layers 676 and solder masks 683 of the interconnection substrate (IS) 684 may be cut or diced to separate multiple individual chip packages 300, i.e., chip-on-interconnection-substrate (COIS) packages, as shown in FIG. 42E each for the standard commodity logic drive as illustrated in FIG. 12A by a laser cutting process or by a mechanical cutting process. For the chip package 300 as seen in FIG. 42E, neighboring two of its semiconductor integrated-circuit (IC) chips 100, first type of operation units 190 and first group of vertical-through-via (VTV) connectors 467*a* may couple to each other through, in sequence, one of its high-density bonded contacts 563*a* under one of said neighboring two of its semiconductor integrated-circuit (IC) chips 100, first type of operation units 190 and first group of vertical-through-via (VTV) connectors 467*a*, one or more of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684 and one of its high-density bonded contacts 563*a* under the other of said neighboring two of its semiconductor integrated-circuit (IC) chips 100, first type of operation units 190 and first group of vertical-through-via (VTV) connectors 467*a* for delivery of a voltage of power supply (Vcc), a voltage of ground reference (Vss), clock signals (CLK) or other signals from one of said neighboring two of its semiconductor integrated-circuit (IC) chips 100, first type of operation units 190 and first group of vertical-through-via (VTV) connectors 467*a* to the other of said neighboring two of its semiconductor integrated-circuit (IC) chips 100, first type of operation units 190 and first group of vertical-through-via (VTV) connectors 467*a*. One of its semiconductor integrated-circuit (IC) chips 100 and first type of operation units 190 may couple to one of its second group of vertical-through-via (VTV) connectors 467*b* through, in sequence, one of its low-density bonded contacts 563*b* under said one of its semiconductor integrated-circuit (IC) chips 100 and first type of operation units 190, one or more of the interconnection metal layers 668 of its interconnection substrate (IS) 684, one of the metal lines or traces 693 of one of the fine-line interconnection bridges (FIBs) 690 of its interconnection substrate (IS) 684 and one of its low-density bonded contacts 563*b* under said one of its second group of vertical-through-via (VTV) connectors 467*b* for delivery of a voltage of power supply (Vcc), a voltage of ground reference (Vss), clock signals (CLK) or other signals to said one of its semiconductor integrated-circuit (IC) chips 100 and first type of operation units 190. Each of its semiconductor integrated-circuit (IC) chips 100 and first type of operation units 190 may couple to one of its metal pads 583 (1) through, in sequence, one of its low-density bonded contacts 563*b* under said each of its semiconductor integrated-circuit (IC) chips 100 and first type of operation units 190, one or more of the interconnection metal layers 668 of its interconnection substrate (IS) 684, one of its low-density bonded contacts 563*b* under one of its second group of vertical-through-via (VTV) connectors 467*b* and one of the vertical through vias (VTVs) 358 of said one of its second group of vertical-through-via (VTV) connectors 467*b*, or (2) through, in sequence, one of its high-density bonded contacts 563*a* under said each of its semiconductor integrated-circuit (IC) chips 100 and first type of operation units 190, one or more of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684, one of its high-density bonded contacts 563*a* under one of its first group of vertical-through-via (VTV) connectors 467*a* and one of the vertical through vias (VTVs) 358 of said one of its first group of vertical-through-via (VTV) connectors 467*a* for delivery of a voltage of power supply (Vcc), a voltage of ground reference (Vss), clock signals (CLK) or other signals to said each of its semiconductor integrated-circuit (IC) chips 100 and first type of operation units 190. Each of its semiconductor integrated-circuit (IC) chips 100, first type of operation units 190 and second group of vertical-through-via (VTV) connectors 467*b* may couple to one or more of its metal bumps 572 through, in sequence, one of its low-density bonded contacts 563*b* under said each of its semiconductor integrated-circuit (IC) chips 100, first type of operation units 190 and second group of vertical-through-via (VTV) connectors 467*b* and each of the interconnection metal layers 668 of its interconnection substrate (IS) 684 for delivery of a voltage of power supply (Vcc), a voltage of ground reference (Vss), clock signals (CLK) or other signals to said each of its semiconductor integrated-circuit (IC) chips 100, first type of operation units 190 and second group of vertical-through-via (VTV) connectors 467*b*. Each of its first group of vertical-through-via (VTV) connectors 467*a* may couple to one or more of its metal bumps 572 through, in sequence, one of its high-density bonded contacts 563*a* under said each of its first group of vertical-through-via (VTV) connectors 467*a*, one or more of the interconnection metal layers 668 of its interconnection substrate (IS) 684, one of the metal lines or traces 693 of one of the fine-line interconnection bridges (FIBs) 690 of its interconnection substrate (IS) 684 and multiple of the interconnection metal layers 668 of its interconnection substrate (IS) 684 for delivery of a voltage of power supply (Vcc), a voltage of ground reference (Vss), clock signals (CLK) or other signals to said each of its first group of vertical-through-via (VTV) connectors 467*a*. One of its metal bumps 572 vertically under one of its semiconductor integrated-circuit (IC) chips 100 and first type of operation units 190 may couple to one of its metal pads 583 vertically over said one of its semiconductor integrated-circuit (IC) chips 100 and first type of operation units 190 (1) through, in sequence, each of the interconnection metal layers 668 of its interconnection substrate (IS) 684, one of its low-density bonded contacts 563*b* under one of its second group of vertical-through-via (VTV) connectors 467*b*, one of the vertical through vias (VTVs) 358 of said one of its second group of vertical-through-via (VTV) connectors 467*b* and the interconnection metal layer of its backside interconnection scheme for a logic drive or device (BISD) 79, or (2) through, in sequence, multiple of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684, one of its high-density bonded contacts 563*a* under one of its first group of vertical-through-via (VTV) connectors 467*a*, one of the vertical through vias (VTVs) 358 of said one of its first group of vertical-through-via (VTV) connectors 467*a* and the interconnection metal layer of its backside interconnection scheme for a logic drive or device (BISD) 79 for delivery of a voltage of power supply (Vcc), a voltage of ground reference (Vss), clock signals (CLK) or other signals. Each of its metal bumps 572 having a number of more than 20 may be vertically aligned with one of its metal pads 583 having a number of more than 20. Alternatively, each of its metal bumps 572 having a number of more than 50 may be vertically aligned with one of its metal pads 583 having a number of more than 50. Each of the vertical through vias (VTVs) 358 of each of its first and second groups of vertical-through-via (VTV) connectors 467*a* and 467*b* may have a depth, for example, between 30 μm and 2,000 μm.

For the chip package 300 as seen in FIG. 42E, its metal pads 583 arranged in an array may include multiple dummy pads 583*a* each not connecting to any of its semiconductor integrated-circuit (IC) chips 100 and first type of operation units 190 but having mechanical functions for subsequent package-on-package (POP) assembly, formed on the bottom surface of its insulating dielectric layer 93 and vertically under one of its semiconductor integrated-circuit (IC) chips 100, first type of operation units 190 and polymer layer 92. Each of its dummy pads 583*a* may have no connection to any of the vertical through vias (VTVs) 358 of any of its first and second groups of vertical-through-via (VTV) connectors 467*a* and 467*b*.

Figure 42F:
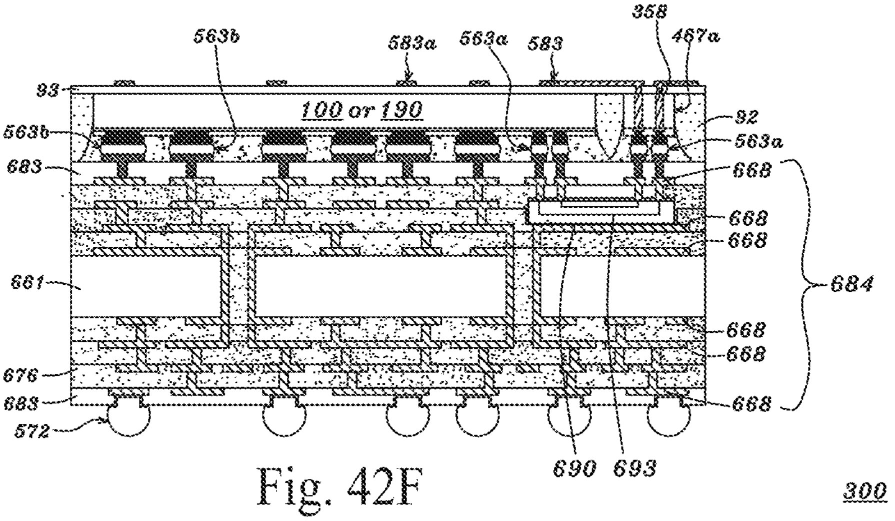
FIG. 42F is a schematically cross-sectional view showing a first type of single-chip/unit package in accordance with a fourth embodiment of the present application.

Alternatively, FIG. 42F is a schematically cross-sectional view showing a first type of single-chip/unit package in accordance with a fourth embodiment of the present application. The chip package 300 as seen in FIG. 42F may have a similar structure to that as illustrated in FIG. 42E. For an element indicated by the same reference number shown in FIGS. 42E and 42F, the specification of the element as seen in FIG. 42F may be referred to that of the element as illustrated in FIG. 42E. The difference between the chip packages as illustrated in FIGS. 42E and 42F is that the chip package as seen in FIG. 42F includes only one semiconductor integrated-circuit (IC) chip 100 or first type of operation unit 190 having the same specification as illustrated in FIG. 42A and one or more first group of vertical-through-via (VTV) connectors 467 having the same specification as illustrated in FIG. 42A. For the single-chip/unit package 300 as seen in FIG. 42F, its only one semiconductor integrated-circuit (IC) chip 100 or first type of operation unit 190 may couple to one of its metal pads 583 through, in sequence, one of its high-density bonded contacts 563*a* under its only one semiconductor integrated-circuit (IC) chip 100 or first type of operation unit 190, one or more of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684, one of its high-density bonded contacts 563*a* under one of its first group of vertical-through-via (VTV) connectors 467*a* and one of the vertical through vias (VTVs) 358 of said one of its first group of vertical-through-via (VTV) connectors 467*a* for delivery of a voltage of power supply (Vcc), a voltage of ground reference (Vss), clock signals (CLK) or other signals to its only one semiconductor integrated-circuit (IC) chip 100 or first type of operation unit 190. Its only one semiconductor integrated-circuit (IC) chip 100 or first type of operation unit 190 may couple to one or more of its metal bumps 572 through one of its low-density bonded contacts 563*b* under its only one semiconductor integrated-circuit (IC) chip 100 or first type of operation unit 190 and each of the interconnection metal layers 668 of its interconnection substrate (IS) 684 for delivery of a voltage of power supply (Vcc), a voltage of ground reference (Vss), clock signals (CLK) or other signals to its only one semiconductor integrated-circuit (IC) chip 100 or first type of operation unit 190. One of its metal bumps 572 vertically under its only one semiconductor integrated-circuit (IC) chip 100 or first type of operation unit 190 may couple to one of its metal pads 583 vertically over its only one semiconductor integrated-circuit (IC) chip 100 or first type of operation unit 190 through, in sequence, multiple of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684, one of its high-density bonded contacts 563*a* under one of its first group of vertical-through-via (VTV) connectors 467*a*, one of the vertical through vias (VTVs) 358 of said one of its first group of vertical-through-via (VTV) connectors 467*a* and the interconnection metal layer of its backside interconnection scheme for a logic drive or device (BISD) 79 for delivery of a voltage of power supply (Vcc), a voltage of ground reference (Vss), clock signals (CLK) or other signals. Each of its metal bumps 572 having a number of more than 20 may be vertically aligned with one of its metal pads 583 having a number of more than 20. Alternatively, each of its metal bumps 572 having a number of more than 50 may be vertically aligned with one of its metal pads 583 having a number of more than 50. For example, its more than twenty first metal contacts, i.e., metal bumps 572, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first group of vertical-through-via (VTV) connectors 467*a* may have a depth, for example, between 30 μm and 2,000 μm.

2. Second Type of Chip Package for Fourth Embodiment

Figure 45A:
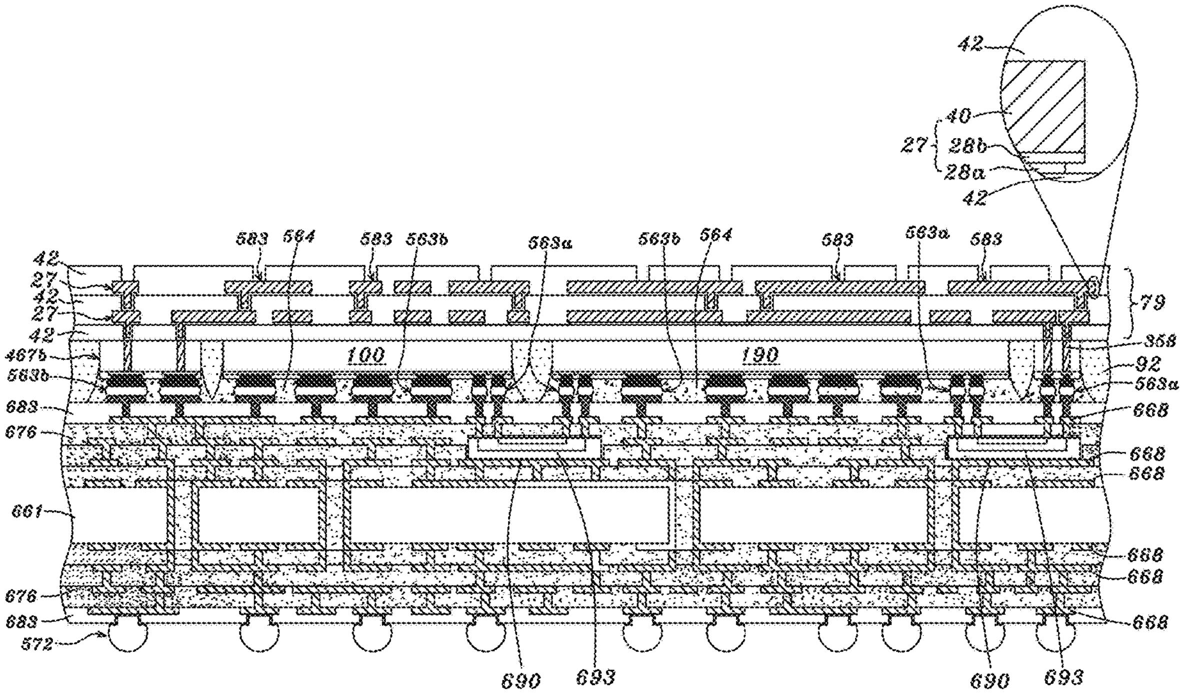
FIGS. 45A and 45B are schematically cross-sectional views showing a process for forming a second type of multichip package in accordance with a fourth embodiment of the present application.
Figure 45B:
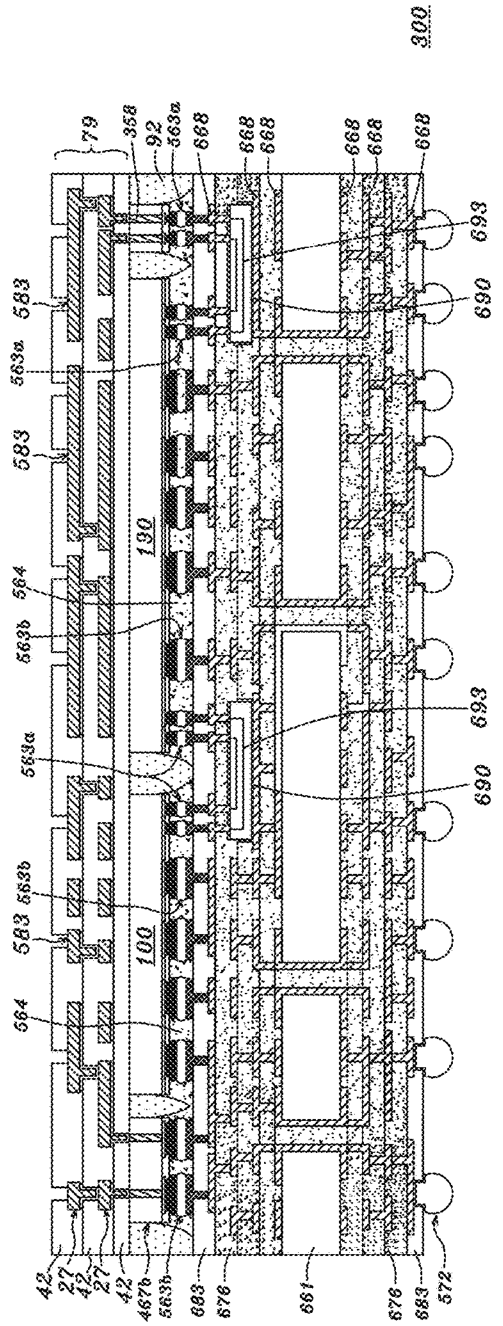

FIGS. 45A and 45B are schematically cross-sectional views showing a process for forming a second type of multichip package in accordance with a fourth embodiment of the present application. Referring to FIG. 45A, after the structure as seen in FIG. 42C is formed, the backside interconnection scheme for a logic drive or device (BISD) 79 as illustrated in FIG. 30A may be formed on the backside of each of the semiconductor integrated-circuit (IC) chips 100, the backside of each of the first type of operation units 190, the backside of each of the first and second groups of vertical-through-via (VTV) connectors 467*a* and 467*b* and the top surface of the polymer layer 92. The backside interconnection scheme for a logic drive or device (BISD) 79 may have the same specifications as that illustrated in FIG. 30A.

Next, referring to FIG. 45A, multiple metal bumps 572 may be formed on multiple metal pads of the bottommost one of the interconnection metal layers 668 of the interconnection substrate (IS) 684, as illustrated in FIG. 42D. The specification of the metal bumps 572 may be referred to that as illustrated in FIG. 42D.

Next, the polymer layers 42 of the backside interconnection scheme for a logic drive or device (BISD) 79, the polymer layer 92 and the polymer layers 676 and solder masks 683 of the interconnection substrate (IS) 684 may be cut or diced to separate multiple individual chip packages 300 as shown in FIG. 45B each for the standard commodity logic drive as illustrated in FIG. 12A by a laser cutting process or by a mechanical cutting process. For the chip package 300 as seen in FIG. 45B, each of its semiconductor integrated-circuit (IC) chips 100 and first type of operation units 190 may couple to one of its metal pads 583 (1) through, in sequence, one of its low-density bonded contacts 563*b* under said each of its semiconductor integrated-circuit (IC) chips 100 and first type of operation units 190, one or more of the interconnection metal layers 668 of its interconnection substrate (IS) 684, one of its low-density bonded contacts 563*b* under one of its second group of vertical-through-via (VTV) connectors 467*b*, one of the vertical through vias (VTVs) 358 of said one of its second group of vertical-through-via (VTV) connectors 467*b* and each of the interconnection metal layers 27 of its backside interconnection scheme for a logic drive or device (BISD) 79, or (2) through, in sequence, one of its high-density bonded contacts 563*a* under said each of its semiconductor integrated-circuit (IC) chips 100 and first type of operation units 190, one or more of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684, one of its high-density bonded contacts 563*a* under one of its first group of vertical-through-via (VTV) connectors 467*a*, one of the vertical through vias (VTVs) 358 of said one of its first group of vertical-through-via (VTV) connectors 467*a* and each of the interconnection metal layers 27 of its backside interconnection scheme for a logic drive or device (BISD) 79 for delivery of a voltage of power supply (Vcc), a voltage of ground reference (Vss), clock signals (CLK) or other signals to said each of its semiconductor integrated-circuit (IC) chips 100 and first type of operation units 190. One of its metal bumps 572 vertically under one of its semiconductor integrated-circuit (IC) chips 100 and first type of operation units 190 may couple to one of its metal pads 583 vertically over said one of its semiconductor integrated-circuit (IC) chips 100 and first type of operation units 190 (1) through, in sequence, each of the interconnection metal layers 668 of its interconnection substrate (IS) 684, one of its low-density bonded contacts 563*b* under one of its second group of vertical-through-via (VTV) connectors 467*b*, one of the vertical through vias (VTVs) 358 of said one of its second group of vertical-through-via (VTV) connectors 467*b* and each of the interconnection metal layers 27 of its backside interconnection scheme for a logic drive or device (BISD) 79, or (2) through, in sequence, multiple of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684, one of its high-density bonded contacts 563*a* under one of its first group of vertical-through-via (VTV) connectors 467*a*, one of the vertical through vias (VTVs) 358 of said one of its first group of vertical-through-via (VTV) connectors 467*a* and each of the interconnection metal layers 27 of its backside interconnection scheme for a logic drive or device (BISD) 79 for delivery of a voltage of power supply (Vcc), a voltage of ground reference (Vss), clock signals (CLK) or other signals. Each of its metal bumps 572 having a number of more than 20 may be vertically aligned with one of its metal pads 583 having a number of more than 20. Alternatively, each of its metal bumps 572 having a number of more than 50 may be vertically aligned with one of its metal pads 583 having a number of more than 50. For example, its more than twenty first metal contacts, i.e., metal bumps 572, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first and second groups of vertical-through-via (VTV) connectors 467*a* and 467*b* may have a depth, for example, between 30 μm and 2,000 μm.

Figure 45C:
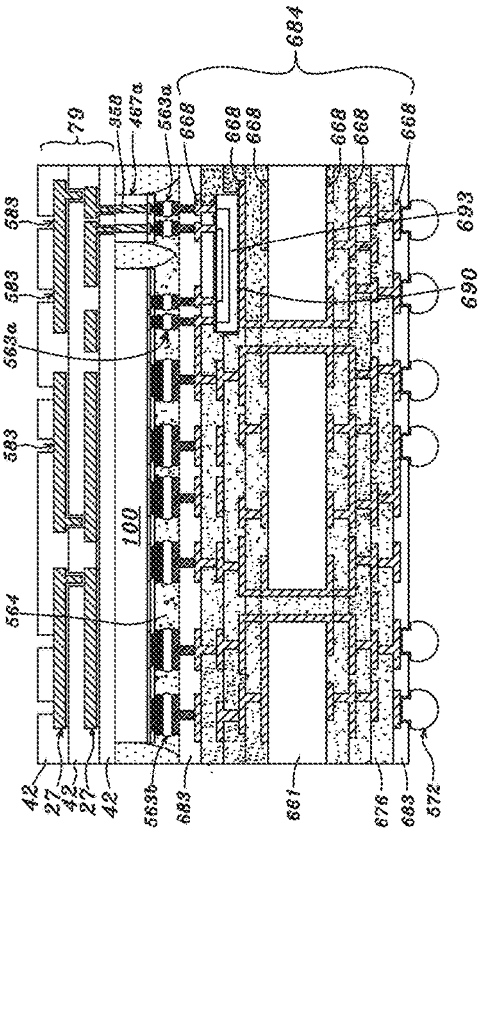
FIG. 45C is a schematically cross-sectional view showing a second type of single-chip/unit package in accordance with a fourth embodiment of the present application.

Alternatively, FIG. 45C is a schematically cross-sectional view showing a second type of single-chip/unit package in accordance with a fourth embodiment of the present application. The chip package 300 as seen in FIG. 45C may have a similar structure to that as illustrated in FIG. 45B. For an element indicated by the same reference number shown in FIGS. 45B and 45C, the specification of the element as seen in FIG. 45C may be referred to that of the element as illustrated in FIG. 45B. The difference between the chip packages as illustrated in FIGS. 45B and 45C is that the chip package as seen in FIG. 45C includes only one semiconductor integrated-circuit (IC) chip 100 or first type of operation unit 190 having the same specification as illustrated in FIG. 42A and one or more first group of vertical-through-via (VTV) connectors 467 having the same specification as illustrated in FIG. 42A. For the single-chip/unit package 300 as seen in FIG. 45C, its only one semiconductor integrated-circuit (IC) chip 100 or first type of operation unit 190 may couple to one of its metal pads 583 through, in sequence, one of its high-density bonded contacts 563*a* under its only one semiconductor integrated-circuit (IC) chip 100 or first type of operation unit 190, one or more of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684, one of its high-density bonded contacts 563*a* under one of its first group of vertical-through-via (VTV) connectors 467*a*, one of the vertical through vias (VTVs) 358 of said one of its first group of vertical-through-via (VTV) connectors 467*a* and each of the interconnection metal layers of its backside interconnection scheme for a logic drive or device (BISD) 79 for delivery of a voltage of power supply (Vcc), a voltage of ground reference (Vss), clock signals (CLK) or other signals to its only one semiconductor integrated-circuit (IC) chip 100 or first type of operation unit 190. One of its metal bumps 572 vertically under its only one semiconductor integrated-circuit (IC) chip 100 or first type of operation unit 190 may couple to one of its metal pads 583 vertically over its only one semiconductor integrated-circuit (IC) chip 100 or first type of operation unit 190 through, in sequence, multiple of the interconnection metal layers 668 of its interconnection substrate (IS) 684, one of the metal lines or traces 693 of one of the fine-line interconnection bridges (FIBs) 690 of its interconnection substrate (IS) 684, one or more of the interconnection metal layers 668 of its interconnection substrate (IS) 684, one of its high-density bonded contacts 563*a* under one of its first group of vertical-through-via (VTV) connectors 467*a*, one of the vertical through vias (VTVs) 358 of said one of its first group of vertical-through-via (VTV) connectors 467*a* and each of the interconnection metal layers 27 of its backside interconnection scheme for a logic drive or device (BISD) 79 for delivery of a voltage of power supply (Vcc), a voltage of ground reference (Vss), clock signals (CLK) or other signals. Each of its metal bumps 572 having a number of more than 20 may be vertically aligned with one of its metal pads 583 having a number of more than 20. Alternatively, each of its metal bumps 572 having a number of more than 50 may be vertically aligned with one of its metal pads 583 having a number of more than 50. For example, its more than twenty first metal contacts, i.e., metal bumps 572, may be vertically over its only one semiconductor integrated-circuit (IC) chip 100 and its more than twenty second metal contacts, i.e., metal pads 583, may be vertically under its only one semiconductor integrated-circuit (IC) chip 100. Each of the vertical through vias (VTVs) 358 of each of its first group of vertical-through-via (VTV) connectors 467*a* may have a depth, for example, between 30 μm and 2,000 μm.

Figure 46:
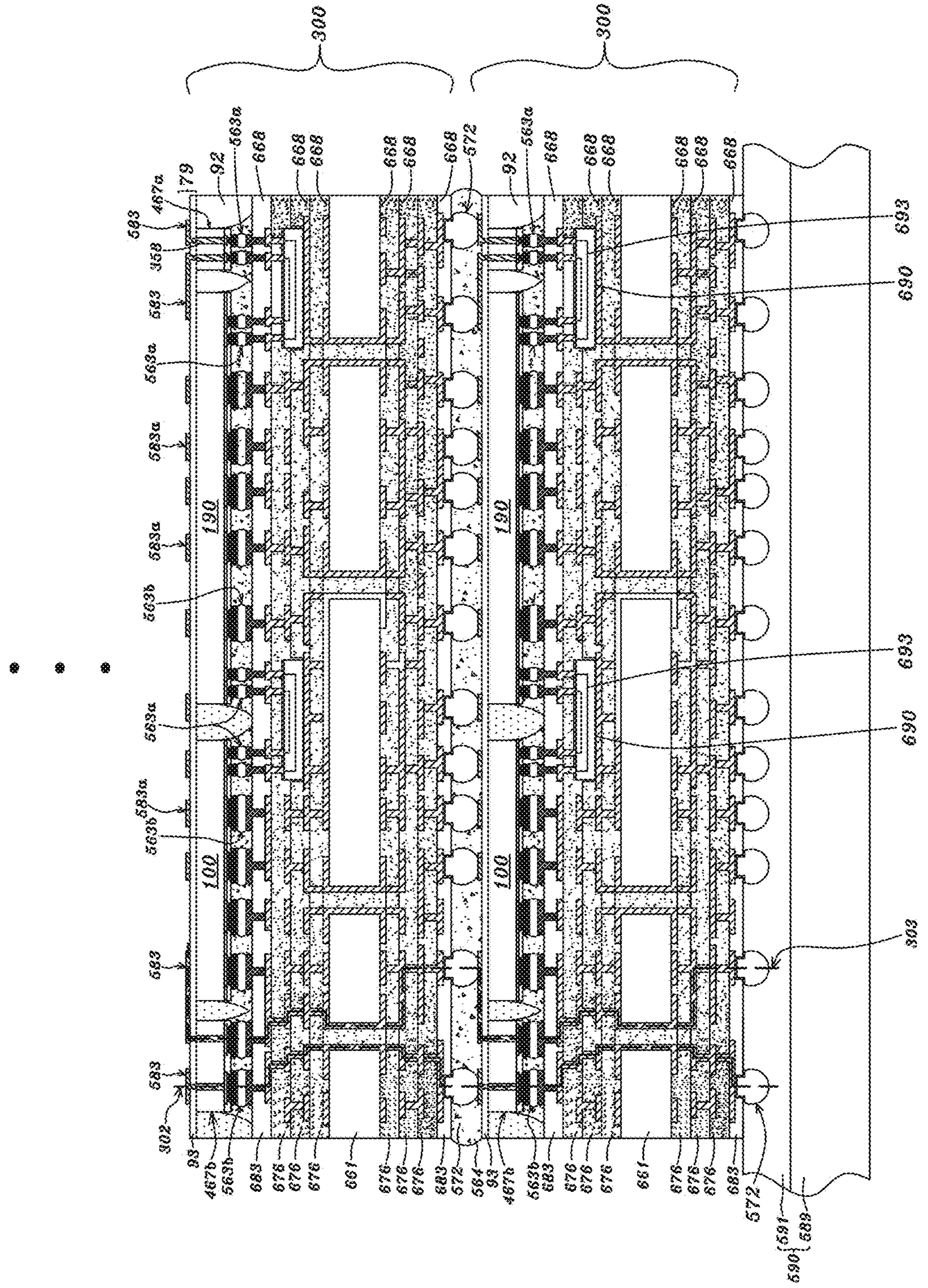
FIG. 46 is schematically a cross-sectional view showing a process for forming a package-on-package (POP) assembly for multiple first type of chip packages in accordance with a fourth embodiment of the present application.

3. Package-on-package (POP) Assembly for First Type of Chip Packages for Fourth Embodiment FIG. 46 is schematically a cross-sectional view showing a process for forming a package-on-package (POP) assembly for multiple first type of chip packages in accordance with a fourth embodiment of the present application. Multiple first type of chip packages 300 as illustrated in FIG. 42E may be provided to be stacked together to form a package-on-package (POP) assembly as seen in FIG. 46.

Referring to FIG. 46, the temporary substrate (T-Sub) 590 as illustrated in FIG. 22A may be first provided. Next, the bottommost one of the first type of chip packages 300 as illustrated in FIG. 42E may be attached onto the temporary substrate (T-sub) 590, wherein the bottommost one of the first type of chip packages 300 may have the metal bumps 572 embedded in the sacrificial bonding layer 591 of the temporary substrate (T-Sub) 590. The sacrificial bonding layer 591 may have a top surface in contact with a bottom surface of the bottom one of the solder masks 683 of the bottommost one of the first type of chip packages 300.

Next, referring to FIG. 46, in a first step, an upper one of the first type of chip packages 300 as illustrated in FIG. 42E may have the metal bumps 572 to be bonded respectively to the metal pads 583 of a lower one of the first type of chip packages 300 as illustrated in FIG. 42E or the tin-containing solder bumps on the metal pads 583 of the lower one of the first type of chip packages 300 as illustrated in FIG. 42E. Alternatively, an upper one of the first type of chip packages 300 as illustrated in FIG. 42F may have the metal bumps 572 to be bonded respectively to the metal pads 583 of a lower one of the first type of chip packages 300 as illustrated in either of FIG. 42F or the tin-containing solder bumps on the metal pads 583 of the lower one of the first type of chip packages 300 as illustrated in FIG. 42F. It is noted that the lower one of the first type of chip packages 300 may have the dummy pads 583*a* in a first group each coupling to one of the metal bumps 572 of the upper one of the first type of chip packages 300 at a voltage (Vss) of ground reference and the dummy pads 583*a* in a second group each coupling to one of the metal bumps 572 of the upper one of the first type of chip packages 300 without any electrical function.

Next, referring to FIG. 46, in a second step, an underfill 564 may be filled into a gap between the upper and lower ones of the first type of chip packages 300 to enclose the metal bumps 572 of the upper one of the first type of chip packages 300.

Next, referring to FIG. 46, the above first and second steps may be alternately repeated multiple times to stack, one by one, multiple of the first type of chip packages 300 as illustrated in FIG. 42E having the number greater than or equal to two, such as four or eight.

Next, referring to FIG. 46, the temporary substrate (T-sub) 590 may be released as illustrated in FIG. 22E from the bottommost one of the first type of chip packages 300 to expose the metal bumps 572 of the bottommost one of the first type of chip packages 300.

For the package-on-package (POP) assembly as illustrated in FIG. 46, the interconnection metal layers 668 of the interconnection substrate (IS) 684 and first or second type of fine-line interconnection bridge (FIB) 690 of each of its first type of chip packages 300 may have the same circuit layout as those of each of the other(s) of its first type of chip packages 300 and the interconnection metal layer of the backside interconnection scheme for a logic drive or device (BISD) 79 of each of its first type of chip packages 300 may have the same circuit layout as that of each of the other(s) of its first type of chip packages 300. Each of the metal bumps 572 of each of its first type of chip packages 300 may be vertically aligned with one of the metal pads 583 of said each of its first type of chip packages 300, one of the metal bumps 572 of each of the other(s) of its first type of chip packages 300 and one of the metal pads 583 of each of the other(s) of its first type of chip packages 300. The package-on-package (POP) assembly as illustrated in FIG. 46 may be provided with the first, second and third interconnects 301, 302 and 303 as illustrated in FIG. 24A for delivery of a voltage of power supply (Vcc), a voltage of ground reference (Vss), clock signals (CLK) or other signals.

Alternatively, for the package-on-package (POP) assembly as illustrated in FIG. 46, the interconnection metal layers 668 and first or second type of fine-line interconnection bridge (FIB) 690 of the interconnection substrate (IS) 684 of each of its first type of chip packages 300 may have a different circuit layout from those of each of the other(s) of its first type of chip packages 300 and the interconnection metal layer of the backside interconnection scheme for a logic drive or device (BISD) 79 of each of its first type of chip packages 300 may have a different circuit layout from that of each of the other(s) of its first type of chip packages 300 in order to provide the fourth, fifth, sixth interconnects 304, 305 and 306 as illustrated in FIG. 24B for delivery of a voltage of power supply (Vcc), a voltage of ground reference (Vss), clock signals (CLK) or other signals.

Figure 47:
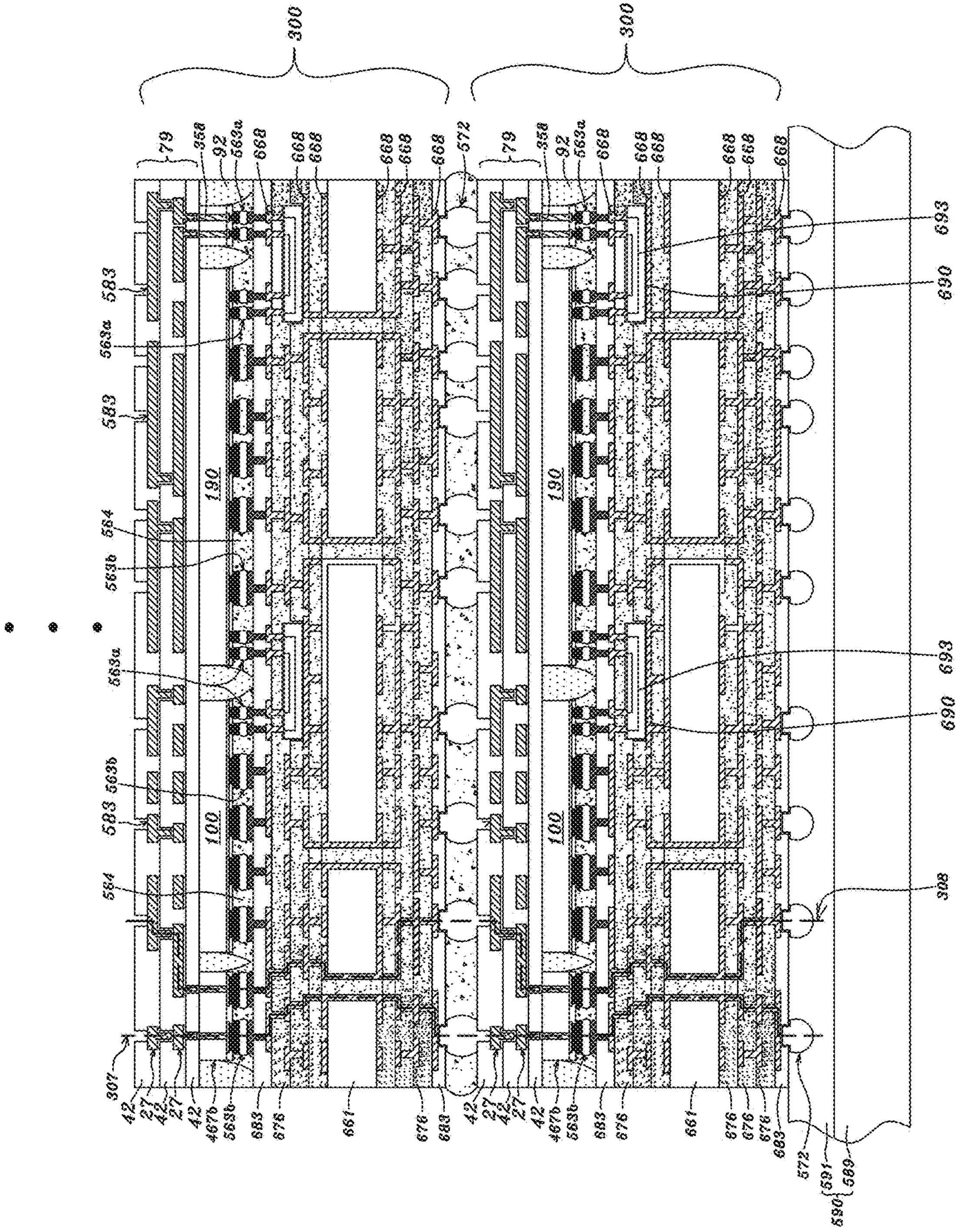
FIG. 47 is a schematically cross-sectional view showing a process for forming a package-on-package (POP) assembly for multiple second type of chip packages in accordance with a fourth embodiment of the present application.

4. Package-On-Package (POP) Assembly for Second Type of Chip Packages for Fourth Embodiment FIG. 47 is a schematically cross-sectional view showing a process for forming a package-on-package (POP) assembly for multiple second type of chip packages in accordance with a fourth embodiment of the present application. Multiple second type of chip packages 300 as illustrated in FIG. 45B may be provided to be stacked together to form a package-on-package (POP) assembly as seen in FIG. 47.

Referring to FIG. 47, the temporary substrate (T-Sub) 590 as illustrated in FIG. 22A may be first provided. Next, the bottommost one of the second type of chip packages 300 as illustrated in FIG. 45B may be attached onto the temporary substrate (T-sub) 590, wherein the bottommost one of the second type of chip packages 300 may have the metal bumps 572 embedded in the sacrificial bonding layer 591 of the temporary substrate (T-Sub) 590. The sacrificial bonding layer 591 may have a top surface in contact with a bottom surface of the bottom one of the solder masks 683 of the bottommost one of the second type of chip packages 300.

Next, referring to FIG. 47, in a first step, an upper one of the second type of chip packages 300 as illustrated in FIG. 45B may have the metal bumps 572 to be bonded respectively to the metal pads 583 of a lower one of the second type of chip packages 300 as illustrated in FIG. 45B or the tin-containing solder bumps on the metal pads 583 of the lower one of the second type of chip packages 300 as illustrated in FIG. 45B. Alternatively, an upper one of the second type of chip packages 300 as illustrated in FIG. 45C may have the metal bumps 572 to be bonded respectively to the metal pads 583 of a lower one of the second type of chip packages 300 as illustrated in either of FIG. 45C or the tin-containing solder bumps on the metal pads 583 of the lower one of the second type of chip packages 300 as illustrated in FIG. 45C.

Next, referring to FIG. 47, in a second step, an underfill 564 may be filled into a gap between the upper and lower ones of the second type of chip packages 300 to enclose the metal bumps 572 of the upper one of the second type of chip packages 300.

Next, referring to FIG. 47, the above first and second steps may be alternately repeated multiple times to stack, one by one, multiple of the second type of chip packages 300 as illustrated in FIG. 45B having the number greater than or equal to two, such as four or eight.

Next, referring to FIG. 47, the temporary substrate (T-sub) 590 may be released as illustrated in FIG. 22E from the bottommost one of the second type of chip packages 300 to expose the metal bumps 572 of the bottommost one of the second type of chip packages 300. The package-on-package (POP) assembly as illustrated in FIG. 47 may be provided with the seventh and eighth interconnects 307 and 308 as illustrated in FIG. 25 for delivery of a voltage of power supply (Vcc), a voltage of ground reference (Vss), clock signals (CLK) or other signals.

For the package-on-package (POP) assembly as illustrated in FIG. 47, the interconnection metal layers 668 of the interconnection substrate (IS) 684 of each of its second type of chip packages 300 may have the same circuit layout as those of each of the other(s) of its second type of chip packages 300 and the interconnection metal layers 27 of the backside interconnection scheme for a logic drive or device (BISD) 79 of each of its second type of chip packages 300 may have the same circuit layout as those of each of the other(s) of its second type of chip packages 300. Each of the metal bumps 572 of each of its second type of chip packages 300 may be vertically aligned with one of the metal pads 583 of said each of its second type of chip packages 300, one of the metal bumps 572 of each of the other(s) of its second type of chip packages 300 and one of the metal pads 583 of each of the other(s) of its second type of chip packages 300.

Alternatively, for the package-on-package (POP) assembly as illustrated in FIG. 47, the interconnection metal layers 668 of the interconnection substrate (IS) 684 of each of its second type of chip packages 300 may have a different circuit layout from those of each of the other(s) of its second type of chip packages 300 and the interconnection metal layer of the backside interconnection scheme for a logic drive or device (BISD) 79 of each of its second type of chip packages 300 may have a different circuit layout from that of each of the other(s) of its second type of chip packages 300.

Fifth Embodiment for Chip Package

1. Chip Package for Fifth Embodiment

Figure 48A:
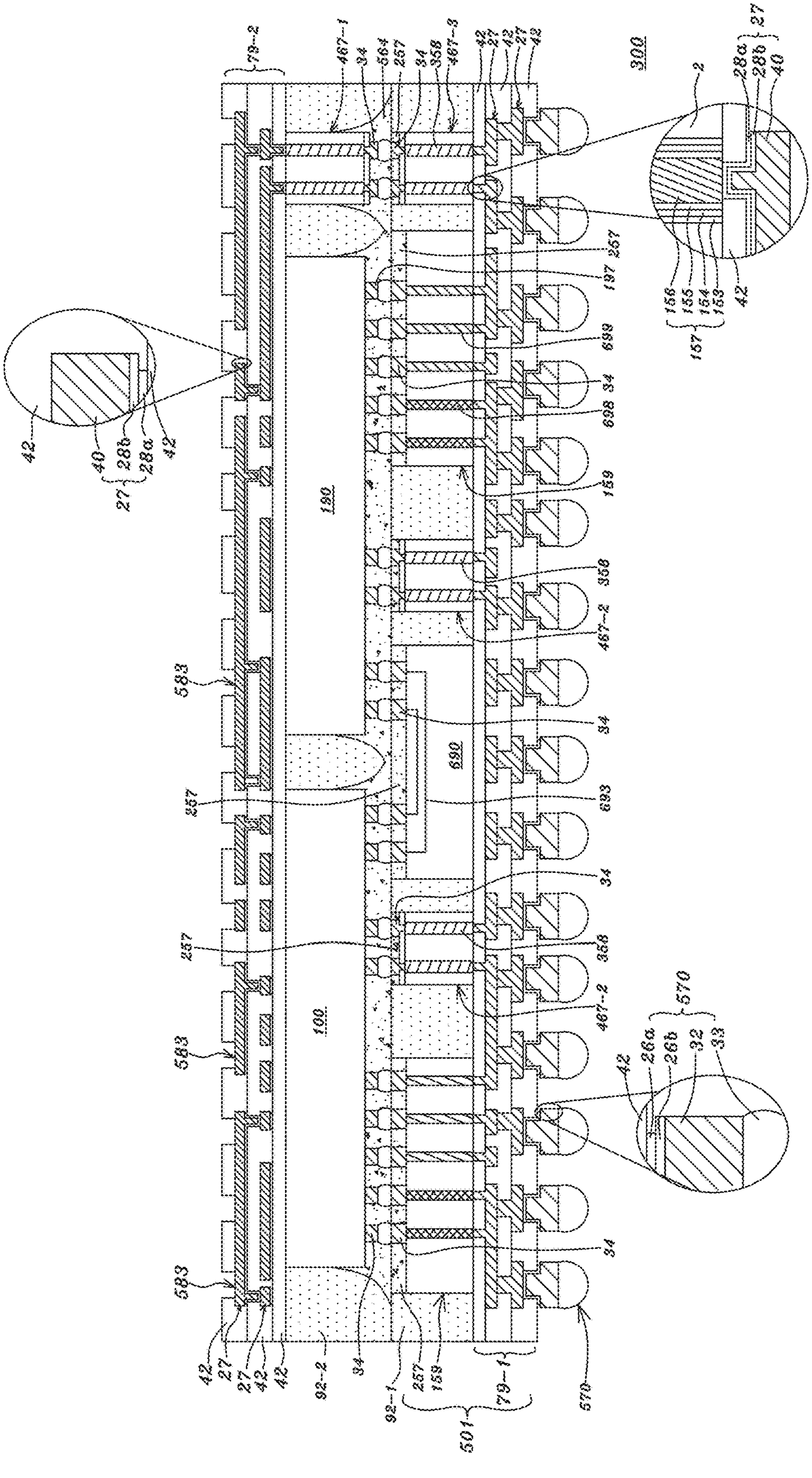
FIG. 48A is a schematically cross-sectional view showing a multichip package in accordance with a fifth embodiment of the present application.

FIG. 48A is a schematically cross-sectional view showing a multichip package in accordance with a fifth embodiment of the present application. Referring to FIG. 48A, a chip package 300 may be fabricated for the standard commodity logic drive as illustrated in FIG. 12A, including a circuit substrate 501, one or more semiconductor integrated-circuit (IC) chips 100 bonded to the circuit substrate 501, one or more first type of operation units 190 bonded to the circuit substrate 501 and one or more first type of vertical-through-via (VTV) connectors 467-1 bonded to the circuit substrate 501.

Referring to FIG. 48A, the circuit substrate 501 may include (1) one or more first or second type of fine-line interconnection bridges (FIBs) 690 each having the same specification as illustrated in FIG. 13A or 13B respectively, provided with the first type of micro-bumps or micro-pads 34, (2) multiple first type of vertical-through-via (VTV) connectors 467-2 and 467-3 each having the same specification as illustrated in FIG. 1A, 1C, 1E, 2A, 2C or 2E, provided with the first type of micro-bumps or micro-pads 34, and (3) multiple first or second type of memory modules 159 each having the same specification as illustrated in FIG. 15A or 15B respectively, provided with the first type of micro-bumps or micro-pads 34. Alternatively, each of the first type of vertical-through-via (VTV) connectors 467-2 and 467-3 may have the same specification as illustrated in FIG. 4A, 4B, 4C, 5A, 5B or 5C, but its fifth type of micro-bumps or micro-pads 34 is replaced with the first type of micro-bumps or micro-pads 34 as illustrated in FIG. 1A. Alternatively, each of the first type of vertical-through-via (VTV) connectors 467-2 or 467-3 may have the same specification as illustrated in FIG. 6, but its sixth type of micro-bumps or micro-pads 34 is replaced with the first type of micro-bumps or micro-pads 34 as illustrated in FIG. 1A.

Referring to FIG. 48A, each of the first or second type of fine-line interconnection bridges (FIBs) 690 may further include an insulating dielectric layer 257, such as polymer layer, on its first or second interconnection scheme 560 or 588 as seen in FIG. 13A or 13B, covering a sidewall of the copper layer 32 of each of its first type of micro-bumps or micro-pads 34, wherein its insulating dielectric layer 257 may have a top surface coplanar with a top surface of the copper layer 32 of each of its first type of micro-bumps or micro-pads 34. Each of the first type of vertical-through-via (VTV) connectors 467-2 and 467-3 may further include an insulating dielectric layer 257, such as polymer layer, at a top thereof, covering a sidewall of the copper layer 32 of each of its first type of micro-bumps or micro-pads 34, wherein its insulating dielectric layer 257 may have a top surface coplanar with a top surface of the copper layer 32 of each of its first type of micro-bumps or micro-pads 34. Each of the first or second type of memory modules 159 may further include an insulating dielectric layer 257, such as polymer layer, on a top surface of its control chip 688, as seen in FIG. 15A or 15B as a bottom surface of its control chip 688, covering a sidewall of the copper layer 32 of each of its first type of micro-bumps or micro-pads 34 on the top surface of its control chip 688, as seen in FIG. 15A or 15B on the bottom surface of its control chip 688, wherein its insulating dielectric layer 257 may have a top surface coplanar with a top surface of the copper layer 32 of each of its first type of micro-bumps or micro-pads 34. The insulating dielectric layer 257 of each of the first or second type of fine-line interconnection bridges (FIBs) 690, first type of vertical-through-via (VTV) connectors 467-2 and 467-3 and first or second type of memory modules 159 may have the same specification and material as that illustrated in FIG. 22A.

Referring to FIG. 48A, the circuit substrate 501 may further include a polymer layer 92-1 around sidewalls of each of the first or second type of fine-line interconnection bridges (FIBs) 690, first type of vertical-through-via (VTV) connectors 467-2 and 467-3 and first or second type of memory modules 159. The polymer layer 92-1 may have a top surface coplanar with the top surface of the copper layer 32 of each of the first type of micro-bumps or micro-pads 34 of each of the first or second type of fine-line interconnection bridges (FIBs) 690, first type of vertical-through-via (VTV) connectors 467-2 and 467-3 and first or second type of memory modules 159 and the top surface of the insulating dielectric layer 257 of each of the first or second type of fine-line interconnection bridges (FIBs) 690, first type of vertical-through-via (VTV) connectors 467-2 and 467-3 and first or second type of memory modules 159. The polymer layer 92-1 may have a bottom surface coplanar with a backside of each of the first or second type of fine-line interconnection bridges (FIBs) 690, first type of vertical-through-via (VTV) connectors 467-2 and 467-3 and first or second type of memory modules 159. In particular, the bottom surface of polymer layer 92-1 may be coplanar with a backside of each of the vertical through vias (VTVs) 358 of each of the first type of vertical-through-via (VTV) connectors 467-2 or 467-3 and a backside of the copper layer 156 of each of the through silicon vias 157 of the bottommost one of the memory chips 251 of each of the first or second type of memory modules 159, as seen in FIG. 15A or 15B as the topmost one of the memory chips 251 of the first or second type of memory module 159. For each of the vertical through vias (VTVs) 358 of said each of the first type of vertical-through-via (VTV) connectors 467-2 and 467-3, if made of one or more of the through silicon vias (TSVs) 157 as illustrated in one of FIGS. 1A, 1C, 1E, 2A, 2C and 2F, a backside of its copper layer 156 may be coplanar with the backside of said each of the first type of vertical-through-via (VTV) connectors 467-2 and 467-3 and the bottom surface of the polymer layer 92-1. For each of the vertical through vias (VTVs) 358 of said each of the first type of vertical-through-via (VTV) connectors 467-2 and 467-3, if made of one or more of the through glass vias (TGVs) 259 as illustrated in one of FIGS. 4A, 4B, 4C, 5A, 5B and 5C, a backside of its copper post 706 may be coplanar with a backside of said each of the first type of vertical-through-via (VTV) connectors 467-2 and 467-3 and the bottom surface of the polymer layer 92-1. For each of the vertical through vias (VTVs) 358 of said each of the first type of vertical-through-via (VTV) connectors 467-2 and 467-3, if made of one or more of the through polymer vias (TPVs) 318 as illustrated in FIG. 6 for the fifth alternative, a backside of its metal pad 336 or copper post 318 may be coplanar with a backside of said each of the first type of vertical-through-via (VTV) connectors 467-2 and 467-3 and the bottom surface of the polymer layer 92.

Referring to FIG. 48A, the circuit substrate 501 may further include a first backside interconnection scheme for a logic drive or device (BISD) 79-1 on the backside of each of the first or second type of fine-line interconnection bridges (FIBs) 690, first type of vertical-through-via (VTV) connectors 467-2 and 467-3 and first or second type of memory modules 159 and on the bottom surface of the polymer layer 92-1. The first backside interconnection scheme for a logic drive or device (BISD) 79-1 may include one or more interconnection metal layers 27 coupling to each of the vertical through vias (VTVs) 358 of each of the first type of vertical-through-via (VTV) connectors 467-2 and 467-3 and the backside of the copper layer 156 of each of the through silicon vias 157 of the bottommost one of the memory chips 251 of each of the first or second type of memory modules 159 and one or more polymer layers 42, i.e., insulating dielectric layers, each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The topmost one of its polymer layers 42 may be between the topmost one of its interconnection metal layers 27 and the backside of each of the first or second type of fine-line interconnection bridges (FIBs) 690, between the topmost one of its interconnection metal layers 27 and the backside of each of the first type of vertical-through-via (VTV) connectors 467-2 and 467-3, between the topmost one of its interconnection metal layers 27 and the first or second type of memory modules 159 and between the topmost one of its interconnection metal layers 27 and the bottom surface of the polymer layer 92-1, wherein each opening in the topmost one of its polymer layers 42 may be vertically under the backside of one of the vertical through vias (VTVs) 358 of one of the first type of vertical-through-via (VTV) connectors 467-2 and 467-3 or the backside of the copper layer 156 of one of the through silicon vias 157 of the bottommost one of the memory chips 251 of one of the first or second type of memory modules 159. For the first backside interconnection scheme for a logic drive or device (BISD) 79-1, each of its interconnection metal layers 27 may extend horizontally across an edge of each of the first or second type of fine-line interconnection bridges (FIBs) 690, first type of vertical-through-via (VTV) connectors 467-2 and 467-3 and first or second type of memory modules 159. The interconnection metal layers 27 and polymer layers 42 of the first backside interconnection scheme for a logic drive or device (BISD) 79-1 may have the same specifications and material as those of the interconnection metal layers 27 and polymer layers 42 of the backside interconnection scheme for a logic drive or device (BISD) 79 illustrated in FIG. 23A.

Referring to FIG. 48A, each of the semiconductor integrated-circuit (IC) chips 100 may be (1) an application specific integrated-circuit (ASIC) logic chip, (2) a field-programmable-gate-array (FPGA) integrated-circuit (IC) chip 200 as illustrated in FIG. 9 or dedicated programmable interconnection (DPI) integrated-circuit (IC) chip 410 as illustrated in FIG. 10, (3) a processing and/or computing integrated-circuit (IC) chip, such as graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip, digital-signal-processing (DSP) integrated-circuit (IC) chip, (4) a memory integrated-circuit (IC) chip, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip, (5) an auxiliary and supporting (AS) integrated-circuit (IC) chip 411 as illustrated in FIG. 11, (6) an IAC IC chip 402 as illustrated in FIG. 12A, (7) a dedicated I/O chip 265 or dedicated control and I/O chip 260 as illustrated in FIGS. 12A and 12B, or (8) a power management integrated-circuit (IC) chip, having the same specification as illustrated in FIG. 14A or 14B, provided with the second type of micro-bumps or micro-pads 34 each having the solder cap 33 to be bonded to the copper layer 32 of one of the first type of micro-bumps or micro-pads 34 of one of the first or second type of fine-line interconnection bridges (FIBs) 690, first type of vertical-through-via (VTV) connectors 467-2 and first or second type of memory modules 159, or provided with the third type of micro-bumps or micro-pads 34 each having the solder cap 38 to be bonded to the copper layer 32 of one of the first type of micro-bumps or micro-pads 34 of one of the first or second type of fine-line interconnection bridges (FIBs) 690, first type of vertical-through-via (VTV) connectors 467-2 and first or second type of memory modules 159.

Referring to FIG. 48A, each of the first type of operation units 190 may have the same specification as illustrated in FIG. 17F, 17G, 19G or 19H, provided with the second type of micro-bumps or micro-pads 197 each having the solder cap 33 to be bonded to the copper layer 32 of one of the first type of micro-bumps or micro-pads 34 of one of the first or second type of fine-line interconnection bridges (FIBs) 690, first type of vertical-through-via (VTV) connectors 467-2 and first or second type of memory modules 159, or provided with the third type of micro-bumps or micro-pads 197 each having the solder cap 38 to be bonded to the copper layer 32 of one of the first type of micro-bumps or micro-pads 34 of one of the first or second type of fine-line interconnection bridges (FIBs) 690, first type of vertical-through-via (VTV) connectors 467-2 and first or second type of memory modules 159.

Referring to FIG. 48A, each of the first type of vertical-through-via (VTV) connectors 467-1 may have the same specification as illustrated in FIG. 1A, 1C, 1E, 2A, 2C or 2E, provided with the second type of micro-bumps or micro-pads 34 each having the solder cap 33 to be bonded to the copper layer 32 of one of the first type of micro-bumps or micro-pads 34 of one of the first type of vertical-through-via (VTV) connectors 467-3, or provided with the third type of micro-bumps or micro-pads 34 each having the solder cap 38 to be bonded to the copper layer 32 of one of the first type of micro-bumps or micro-pads 34 of one of the first type of vertical-through-via (VTV) connectors 467-3. Alternatively, each of the first type of vertical-through-via (VTV) connectors 467-1 may have the same specification as illustrated in FIG. 4A, 4B, 4C, 5A, 5B or 5C, provided with the fifth type of micro-bumps or micro-pads 34 each having the solder layer 719 to be bonded to the copper layer 32 of one of the first type of micro-bumps or micro-pads 34 of one of the first type of vertical-through-via (VTV) connectors 467-3. Alternatively, each of the first type of vertical-through-via (VTV) connectors 467-1 may have the same specification as illustrated in FIG. 6, provided with the sixth type of micro-bumps or micro-pads 34 each having the solder ball 321 to be bonded to the copper layer 32 of one of the first type of micro-bumps or micro-pads 34 of one of the first type of vertical-through-via (VTV) connectors 467-3.

Referring to FIG. 48A, the chip package 300 may further include an underfill 564, such as a layer of polymer or epoxy resins or compounds, between each of the semiconductor integrated-circuit (IC) chips 100 and the circuit substrate 501, enclosing the second or third type of micro-bumps or micro-pads 34 of said each of the semiconductor integrated-circuit (IC) chips 100, between each of the first type of operation units 190 and the circuit substrate 501, enclosing the second or third type of micro-bumps or micro-pads 34 of said each of the first type of operation units 190 and between each of the first type of vertical-through-via (VTV) connectors 467-1 and the circuit substrate 501, enclosing the second, third, fifth or sixth type of micro-bumps or micro-pads 34 of said each of the first type of vertical-through-via (VTV) connectors 467-1.

Referring to FIG. 48A, the chip package 300 may further include a polymer layer 92-2 around sidewalls of each of the semiconductor integrated-circuit (IC) chips 100, first type of operation units 190 and first type of vertical-through-via (VTV) connectors 467-1. The polymer layer 92-2 may have a top surface coplanar with a backside of each of the semiconductor integrated-circuit (IC) chips 100, first type of operation units 190 and first type of vertical-through-via (VTV) connectors 467-1. In particular, the top surface of polymer layer 92-2 may be coplanar with a backside of each of the vertical through vias (VTVs) 358 of each of the first type of vertical-through-via (VTV) connectors 467-1. For each of the vertical through vias (VTVs) 358 of said each of the first type of vertical-through-via (VTV) connectors 467-1, if made of one or more of the through silicon vias (TSVs) 157 as illustrated in one of FIGS. 1A, 1C, 1E, 2A, 2C and 2F, a backside of its copper layer 156 may be coplanar with the backside of said each of the first type of vertical-through-via (VTV) connectors 467-1 and the top surface of the polymer layer 92-2. For each of the vertical through vias (VTVs) 358 of said each of the first type of vertical-through-via (VTV) connectors 467-1, if made of one or more of the through glass vias (TGVs) 259 as illustrated in one of FIGS. 4A, 4B, 4C, 5A, 5B and 5C, a backside of its copper post 706 may be coplanar with a backside of said each of the first type of vertical-through-via (VTV) connectors 467-1 and the top surface of the polymer layer 92-2. For each of the vertical through vias (VTVs) 358 of said each of the first type of vertical-through-via (VTV) connectors 467-1, if made of one or more of the through polymer vias (TPVs) 318 as illustrated in FIG. 6 for the fifth alternative, a backside of its metal pad 336 or copper post 318 may be coplanar with a backside of said each of the first type of vertical-through-via (VTV) connectors 467-1 and the top surface of the polymer layer 92-2.

Referring to FIG. 48A, the chip package 300 may further include a second backside interconnection scheme for a logic drive or device (BISD) 79-2 on the backside of each of the semiconductor integrated-circuit (IC) chips 100, first type of operation units 190 and first type of vertical-through-via (VTV) connectors 467-1 and on the top surface of the polymer layer 92-2. The second backside interconnection scheme for a logic drive or device (BISD) 79-2 may include one or more interconnection metal layers 27 coupling to each of the vertical through vias (VTVs) 358 of each of the first type of vertical-through-via (VTV) connectors 467-1 and one or more polymer layers 42, i.e., insulating dielectric layers, each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the backside of each of the semiconductor integrated-circuit (IC) chips 100, between the bottommost one of its interconnection metal layers 27 and the backside of each of the first type of operation units 190, between the bottommost one of its interconnection metal layers 27 and the backside of each of the first type of vertical-through-via (VTV) connectors 467-1 and between the bottommost one of its interconnection metal layers 27 and the top surface of the polymer layer 92-2, wherein each opening in the bottommost one of its polymer layers 42 may be vertically over the backside of one of the vertical through vias (VTVs) 358 of one of the first type of vertical-through-via (VTV) connectors 467-1. For the second backside interconnection scheme for a logic drive or device (BISD) 79-2, each of its interconnection metal layers 27 may extend horizontally across an edge of each of the semiconductor integrated-circuit (IC) chips 100, first type of operation units 190 and first type of vertical-through-via (VTV) connectors 467-1. The topmost one of its interconnection metal layers 27 may be patterned with multiple metal pads 583 aligned with multiple respective openings in the topmost one of its polymer layers 42. The interconnection metal layers 27, polymer layers 42 and metal pads 583 of the second backside interconnection scheme for a logic drive or device (BISD) 79-2 may have the same specifications and material as those of the interconnection metal layers 27, polymer layers 42 and metal pads 583 of the backside interconnection scheme for a logic drive or device (BISD) 79 illustrated in FIG. 30A.

Referring to FIG. 48A, the chip package 300 may further include multiple metal bumps, pillars or pads 570 in an array on the bottommost one of the interconnection metal layers 27 of the first backside interconnection scheme for a logic drive or device (BISD) 79-1 at tops of the respective openings in the bottommost one of the polymer layers 42 of the first backside interconnection scheme for a logic drive or device (BISD) 79-1. Each of the metal bumps, pillars or pads 570 may be of one of the first through third types having the same specifications as the first through third types of metal bumps, pillars or pads 570 as illustrated in FIG. 22G respectively, wherein each of the metal bumps or pillars 570 may be of the first or second type, including the adhesion layer 26*a*, such as titanium (Ti) or titanium nitride (TiN) layer having a thickness between 1 nm and 50 nm, on the bottommost one of the interconnection metal layers 27 of the first backside interconnection scheme for a logic drive or device (BISD) 79-1, or of the third type, including the gold layer, i.e., gold bump, having a thickness between 3 and 15 micrometers under the bottommost one of the interconnection metal layers 27 of the first backside interconnection scheme for a logic drive or device (BISD) 79-1.

For the chip package seen in FIG. 48A, each of its semiconductor integrated-circuit (IC) chips 100 and first type of operation units 190 may couple to one of the other(s) of its semiconductor integrated-circuit (IC) chips 100 and first type of operation units 190 through a metal line or trace 693 of one of its fine-line interconnection bridges (FIBs) 690, which is provided by one or more of the insulating dielectric layers 6 of the first interconnection scheme 560 of said one of its fine-line interconnection bridges (FIBs) 690 (shown in FIG. 13A) and/or one or more of the insulating dielectric layers 27 of the second interconnection scheme 588 of said one of its fine-line interconnection bridges (FIBs) 690 (shown in FIG. 13B), for delivery of a voltage of power supply (Vcc), a voltage of ground reference (Vss), clock signals (CLK) or other signals to said each of its semiconductor integrated-circuit (IC) chips 100 and first type of operation units 190. Each of its semiconductor integrated-circuit (IC) chips 100 and first type of operation units 190 may couple to one of its metal pads 583 (1) through, in sequence, one of the vertical through vias (VTV) 358 of one of its first type of vertical-through-via (VTV) connectors 467-2, one or more of the interconnection metal layers 27 of its first backside interconnection scheme for a logic drive or device (BISD) 79-1, one of the vertical through vias (VTV) 358 of one of its first type of vertical-through-via (VTV) connectors 467-3, one of the vertical through vias (VTV) 358 of one of its first type of vertical-through-via (VTV) connectors 467-1 and each of the interconnection metal layers 27 of its second backside interconnection scheme for a logic drive or device (BISD) 79-2, or (2) through, in sequence, one of the dedicated vertical bypasses 698 or vertical interconnects 699 of one of the first or second type of memory modules 159, one or more of the interconnection metal layers 27 of its first backside interconnection scheme for a logic drive or device (BISD) 79-1, one of the vertical through vias (VTV) 358 of one of its first type of vertical-through-via (VTV) connectors 467-3, one of the vertical through vias (VTV) 358 of one of its first type of vertical-through-via (VTV) connectors 467-1 and each of the interconnection metal layers 27 of its second backside interconnection scheme for a logic drive or device (BISD) 79-2, for delivery of a voltage of power supply (Vcc), a voltage of ground reference (Vss), clock signals (CLK) or other signals to said each of its semiconductor integrated-circuit (IC) chips 100 and first type of operation units 190. Each of its semiconductor integrated-circuit (IC) chips 100 and first type of operation units 190 may couple to one of its metal bumps, pillars or pads 570 (1) through, in sequence, one of the vertical through vias (VTV) 358 of one of its first type of vertical-through-via (VTV) connectors 467-2 and each of the interconnection metal layers 27 of its first backside interconnection scheme for a logic drive or device (BISD) 79-1, or (2) through, in sequence, one of the dedicated vertical bypasses 698 or vertical interconnects 699 of one of the first or second type of memory modules 159 and each of the interconnection metal layers 27 of its first backside interconnection scheme for a logic drive or device (BISD) 79-1, for delivery of a voltage of power supply (Vcc), a voltage of ground reference (Vss), clock signals (CLK) or other signals to said each of its semiconductor integrated-circuit (IC) chips 100 and first type of operation units 190. One of its metal bumps, pillars or pads 570 vertically under each of its semiconductor integrated-circuit (IC) chips 100 and first type of operation units 190 may couple to one of its metal pads 583 vertically over said each of its semiconductor integrated-circuit (IC) chips 100 and first type of operation units 190 through, in sequence, each of the interconnection metal layers 27 of its first backside interconnection scheme for a logic drive or device (BISD) 79-1, one of the vertical through vias (VTV) 358 of one of its first type of vertical-through-via (VTV) connectors 467-3, one of the vertical through vias (VTV) 358 of one of its first type of vertical-through-via (VTV) connectors 467-1 and each of the interconnection metal layers 27 of its second backside interconnection scheme for a logic drive or device (BISD) 79-2 for delivery of a voltage of power supply (Vcc), a voltage of ground reference (Vss), clock signals (CLK) or other signals. Each of its metal bumps, pillars or pads 570 having a number of more than 20 may be vertically aligned with one of its metal pads 583 having a number of more than 20. Alternatively, each of its metal bumps, pillars or pads 570 having a number of more than 50 may be vertically aligned with one of its metal pads 583 having a number of more than 50. Each of the vertical through vias (VTVs) 358 of each of its first type of vertical-through-via (VTV) connectors 467-1, 467-2 and 467-3 may have a depth, for example, between 30 μm and 2,000 μm.

2. Package-on-package (POP) Assembly for Chip Packages for Fifth Embodiment

Figure 48B:
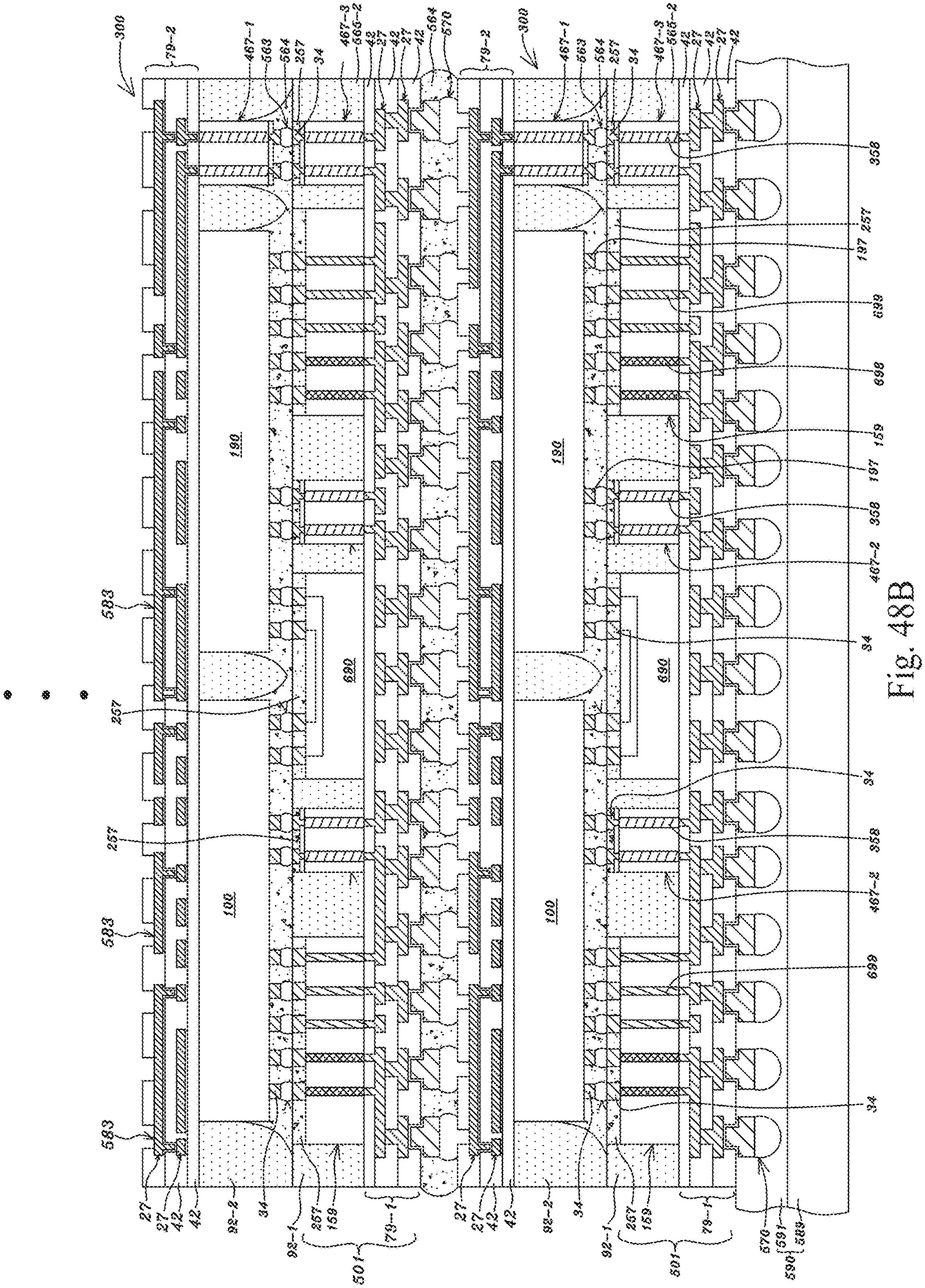
FIG. 48B is a schematically cross-sectional view showing a process for forming a package-on-package (POP) assembly for multiple chip packages in accordance with a fifth embodiment of the present application.

FIG. 48B is a schematically cross-sectional view showing a process for forming a package-on-package (POP) assembly for multiple chip packages in accordance with a fifth embodiment of the present application. Multiple chip packages 300 as illustrated in FIG. 48A may be provided to be stacked together to form a package-on-package (POP) assembly as seen in FIG. 48B.

Referring to FIG. 48B, the temporary substrate (T-Sub) 590 as illustrated in FIG. 22A may be first provided. Next, the bottommost one of the second type of chip packages 300 as illustrated in FIG. 48A may be flipped to be attached onto the temporary substrate (T-sub) 590, wherein the bottommost one of the second type of chip packages 300 may have the metal bumps, pillars or pads 570 embedded in the sacrificial bonding layer 591 of the temporary substrate (T-Sub) 590. The sacrificial bonding layer 591 may have a top surface in contact with a bottom surface of the bottommost one of the polymer layers 42 of the first backside interconnection scheme for a logic drive or device (BISD) 79 of the bottommost one of the second type of chip packages 300.

Next, referring to FIG. 48B, in a first step, an upper one of the second type of chip packages 300 as illustrated in FIG. 48A may have the metal bumps, pillars or pads 570 to be bonded respectively to the metal pads 583 of a lower one of the second type of chip packages 300 as illustrated in FIG. 48A or the tin-containing solder bumps on the metal pads 583 of the lower one of the second type of chip packages 300 as illustrated in FIG. 48A. The first step may have the same specification or details as that illustrated in FIG. 24A.

Next, referring to FIG. 48B, in a second step, an underfill 564 may be filled into a gap between the upper and lower ones of the second type of chip packages 300 to enclose the metal bumps, pillars or pads 570 of the upper one of the second type of chip packages 300.

Next, referring to FIG. 48B, the above first and second steps may be alternately repeated multiple times to stack, one by one, multiple of the second type of chip packages 300 as illustrated in FIG. 48A having the number greater than or equal to two, such as four or eight.

Next, referring to FIG. 48B, the temporary substrate (T-sub) 590 may be released as illustrated in FIG. 22E from the bottommost one of the second type of chip packages 300 to expose the metal bumps, pillars or pads 570 of the bottommost one of the second type of chip packages 300.

Applications

For an aspect, for each of the chip packages 300 as seen in FIGS. 22I, 23E, 27H, 30D, 34I, 37D, 38C, 39B, 42F and 45C, its only one semiconductor integrated-circuit (IC) chip 100 may be an application-specific integrated circuit (ASIC) chip, field-programmable-gate-array (FPGA) integrated-circuit (IC) chip, graphic-processing-unit (GPU) chip, central-processing-unit (CPU) chip, tensor-processing-unit (TPU) chip, neural-processing-unit (NPU) chip, digital-signal-processing (DSP) chip, high bandwidth static-random-access-memory (SRAM) chip, high bandwidth dynamic-random-access-memory (DRAM) chip, or non-volatile memory (NVM) chip such as NAND and/or NOR flash memory chip, high bandwidth resistive-random-access-memory (RRAM) chip, high bandwidth magnetoresistive-random-access-memory (MRAM) chip, auxiliary and supporting (AS) integrated-circuit (IC) chip 411 as illustrated in FIG. 11, or dedicated I/O or dedicated control and I/O chip 265 or 260 as illustrated in FIGS. 12A and 12B.

For another aspect, for each of the chip packages 300 as seen in FIGS. 22H, 23B, 27G, 30C, 34H, 37C, 38B, 39A, 42E, 45B and 48A, its semiconductor integrated-circuit (IC) chips 100 may be a combination of ones selected from an application-specific integrated circuit (ASIC) chip, field-programmable-gate-array (FPGA) integrated-circuit (IC) chip 200 as illustrated in FIG. 9, graphic-processing-unit (GPU) chip, central-processing-unit (CPU) chip, tensor-processing-unit (TPU) chip, neural-processing-unit (NPU) chip, digital-signal-processing (DSP) chip, high bandwidth static-random-access-memory (SRAM) chip, high bandwidth dynamic-random-access-memory (DRAM) chip, and non-volatile memory (NVM) chip such as NAND and/or NOR flash memory chip, high bandwidth resistive-random-access-memory (RRAM) chip, high bandwidth magnetoresistive-random-access-memory (MRAM) chip, auxiliary and supporting (AS) integrated-circuit (IC) chip 411 as illustrated in FIG. 11 and dedicated I/O or dedicated control and I/O chip 265 or 260 as illustrated in FIGS. 12A and 12B. For an example, two of its first or second type of semiconductor chips 100 may be (1) two field-programmable-gate-array (FPGA) integrated-circuit (IC) chips 200 respectively for a first scenario, (2) an field-programmable-gate-array (FPGA) integrated-circuit (IC) chip 200 and central-processing-unit (CPU) chip respectively for a second scenario, (3) an field-programmable-gate-array (FPGA) integrated-circuit (IC) chip 200 and graphic-processing-unit (GPU)

chip respectively for a third scenario, (4) a central-processing-unit (CPU) chip and graphic-processing-unit (GPU) chip respectively for a fourth scenario, (5) an field-programmable-gate-array (FPGA) integrated-circuit (IC) chip 200 and auxiliary and supporting (AS) integrated-circuit (IC) chip 411 for a fifth scenario, or (6) an field-programmable-gate-array (FPGA) integrated-circuit (IC) chip 200 and dedicated I/O or dedicated control and I/O chip 265 or 260 for a sixth scenario, coupling to each other through the interconnection metal layers 27 of its frontside interconnection scheme for a logic drive or device (FISD) 101 as seen in FIG. 22H or 23C, through the interconnection metal layers 27 of its fan-out interconnection scheme for a logic drive or device (FOISD) 592 as seen in FIG. 27G or 30C, through the interconnection metal layers 6 and/or 27 of its interposer 551 as seen in FIG. 25H, 28C, 29H or 30C, through the metal lines or traces 693 of one of the fine-line interconnection bridge (FIB) 690 of its interconnection substrate (IS) 684 as seen in FIG. 42E or 45B, or through the metal lines or traces 693 of one of the fine-line interconnection bridge (FIB) 690 of its circuit substrate 501 as seen in FIG. 48B. For another example, its semiconductor integrated-circuit (IC) chips 100 may include (1) three or more field-programmable-gate-array (FPGA) integrated-circuit (IC) chips 200 for a seventh scenario, (2) an field-programmable-gate-array (FPGA) integrated-circuit (IC) chip 200, central-processing-unit (CPU) chip and graphic-processing-unit (GPU) chip for an eighth scenario, (3) a field-programmable-gate-array (FPGA) integrated-circuit (IC) chip 200, graphic-processing-unit (GPU) chip, central-processing-unit (CPU) chip and tensor-processing-unit (TPU) chip for a ninth scenario, or (4) a field-programmable-gate-array (FPGA) integrated-circuit (IC) chip 200, graphic-processing-unit (GPU) chip, central-processing-unit (CPU) chip and neural-processing-unit (NPU) chip for a tenth scenario, each two of which may couple to each other through the interconnection metal layers 27 of its frontside interconnection scheme for a logic drive or device (FISD) 101 as seen in FIG. 22H or 23C, through the interconnection metal layers 27 of its fan-out interconnection scheme for a logic drive or device (FOISD) 592 as seen in FIG. 27G or 30C, through the interconnection metal layers 6 and/or 27 of its interposer 551 as seen in FIG. 25H, 28C, 29H or 30C, through the metal lines or traces 693 of one of the fine-line interconnection bridge (FIB) 690 of its interconnection substrate (IS) 684 as seen in FIG. 42E or 45B, or through the metal lines or traces 693 of one of the fine-line interconnection bridge (FIB) 690 of its circuit substrate 501 as seen in FIG. 48B. Its semiconductor integrated-circuit (IC) chips 100 may further include a NAND and/or NOR flash non-volatile memory chip, high-bandwidth DRAM memory (HBM) chip, high-bandwidth SRAM memory (HBM) chip, high bandwidth resistive-random-access-memory (RRAM) chip and/or high bandwidth magnetoresistive-random-access-memory (MRAM) chip, each having multiple first small I/O circuits coupling to multiple second small I/O circuits of (1) one of the field-programmable-gate-array (FPGA) integrated-circuit (IC) chips 200 for the first scenario, (2) one of the field-programmable-gate-array (FPGA) integrated-circuit (IC) chip 200 and central-processing-unit (CPU) chip for the second scenario, (3) one of the field-programmable-gate-array (FPGA) integrated-circuit (IC) chip 200 and graphic-processing-unit (GPU) chip for the third scenario, (4) one of the central-processing-unit (CPU) chip and graphic-processing-unit (GPU) chip for the fourth scenario, (5) one of the field-programmable-gate-array (FPGA) integrated-circuit (IC) chip 200 and auxiliary and supporting (AS) integrated-circuit (IC) chip 411 for the fifth scenario, (6) one of the field-programmable-gate-array (FPGA) integrated-circuit (IC) chip 200 and dedicated I/O or dedicated control and I/O chip 265 or 260 for the sixth scenario, (7) one of the field-programmable-gate-array (FPGA) integrated-circuit (IC) chips 200 for the seventh scenario, (8) one of the field-programmable-gate-array (FPGA) integrated-circuit (IC) chip 200, central-processing-unit (CPU) chip and graphic-processing-unit (GPU) chip for the eighth scenario, (9) one of the field-programmable-gate-array (FPGA) integrated-circuit (IC) chip 200, graphic-processing-unit (GPU) chip, central-processing-unit (CPU) chip and tensor-processing-unit (TPU) chip for the ninth scenario, or (10) one of the field-programmable-gate-array (FPGA) integrated-circuit (IC) chip 200, graphic-processing-unit (GPU) chip, central-processing-unit (CPU) chip and neural-processing-unit (NPU) chip for the tenth scenario, through the interconnection metal layers 27 of its fan-out interconnection scheme for a logic drive or device (FOISD) 592 as seen in FIG. 27G or 30C, through the interconnection metal layers 6 and/or 27 of its interposer 551 as seen in FIG. 25H, 28C, 29H or 30C, through the metal lines or traces 693 of one of the fine-line interconnection bridge (FIB) 690 of its interconnection substrate (IS) 684 as seen in FIG. 42E or 45B, or through the metal lines or traces 693 of one of the fine-line interconnection bridge (FIB) 690 of its circuit substrate 501 as seen in FIG. 48B, for data transmission therebetween with a data bit width of equal to or greater than 64, 128, 256, 512, 1024, 2048, 4096, 8K, or 16K, wherein each of the first and second small I/O circuits may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively each of the first and second small input/output (I/O) circuits may have an I/O power efficiency smaller than 0.5 pico-Joules per bit, per switch or per voltage swing, or between 0.01 and 0.5 pico-Joules per bit, per switch or per voltage swing. For each of the first, second, third, fifth, six, seventh, eighth, ninth and tenth scenarios, its NAND and/or NOR flash non-volatile memory chip, high bandwidth resistive-random-access-memory (RRAM) chip and/or high bandwidth magnetoresistive-random-access-memory (MRAM) chip may be used to configure programmable logic functions or operations and/or programmable interconnections of its field-programmable-gate-array (FPGA) integrated-circuit (IC) chip(s) 200. A first data stored in its NAND and/or NOR flash non-volatile memory chip, high bandwidth resistive-random-access-memory (RRAM) chip and/or high bandwidth magnetoresistive-random-access-memory (MRAM) chip may be used for configuring its field-programmable-gate-array (FPGA) integrated-circuit (IC) chip(s) 200 to perform a logic operation, wherein each of its field-programmable-gate-array (FPGA) integrated-circuit (IC) chip(s) 200 may comprise, as seen in FIG. 7, a first static-random-access-memory (SRAM) cell 490 configured to store a second data, e.g., one of D0-D3, associated with the first data, and a multiplexer 211 comprising a first set of input points for a first input data set A0 and A1 for the logic operation and a second set of input points for a second input data set D0-D3 for a look-up table (LUT) 210 having a data associated with the second data, wherein the multiplexer 211 is configured to select, in accordance with the first input data set A0 and A1, a first input data from the second input data set D0-D3 for the look-up table (LUT) 210 as an output data Dout for the logic operation. A third data stored in its NAND and/or NOR flash non-volatile memory chip, high bandwidth resistive-random-access-memory (RRAM) chip and/or high bandwidth magnetoresistive-random-access-memory (MRAM) chip may be used for configuring its field-programmable-gate-array (FPGA) integrated-circuit (IC) chip(s) 200 to perform programmable interconnection, wherein each of its field-programmable-gate-array (FPGA) integrated-circuit (IC) chip(s) 200 may comprise, as seen in FIG. 8, a second static-random-access-memory (SRAM) cell 362 configured to store a fourth data associated with the third data, a cross-point switch 379 having an input point for a second input data associated with the fourth data, and four programmable interconnects 361 coupling to the cross-point switch 379, wherein the cross-point switch 379 is configured to control, in accordance with the second input data, connection from one of the four programmable interconnects 361 to the other one, two or three of the four programmable interconnects 361. For the sixth scenario, its dedicated I/O or dedicated control and I/O chip 265 or 260 may have multiple third small I/O circuits coupling respectively to multiple fourth small I/O circuits of its field-programmable-gate-array (FPGA) integrated-circuit (IC) chip 200, wherein each of the third and fourth small I/O circuits may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively each of the small input/output (I/O) circuits of its dedicated I/O or dedicated control and I/O chip 265 or 260 and field-programmable-gate-array (FPGA) integrated-circuit (IC) chip 200 may have an I/O power efficiency smaller than 0.5 pico-Joules per bit, per switch or per voltage swing, or between 0.01 and 0.5 pico-Joules per bit, per switch or per voltage swing; further, its dedicated I/O or dedicated control and I/O chip 265 or 260 may include multiple large input/output (I/O) circuits each coupling between one of the third small I/O circuits and one of its metal bumps, pillars or pads 570, wherein each of the large input/output (I/O) circuits may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits may have an I/O power efficiency greater than 3, 5 or 10 pico-Joules per bit, per switch or per voltage swing. For the fifth scenario, its auxiliary and supporting (AS) integrated-circuit (IC) chip 411 may include multiple non-volatile memory cells configured to store a password or key and a cryptography block or circuit configured (1) to encrypt, in accordance with the password or key, CPM data from the memory cells 490 for the look-up tables (LUT) 210 of the programmable logic cells (LC) 2014 of its field-programmable-gate-array (FPGA) integrated-circuit (IC) chip 200 or the memory cells 362 of the programmable switch cells 379 of its field-programmable-gate-array (FPGA) integrated-circuit (IC) chip 200 as encrypted CPM data, and (2) to decrypt, in accordance with the password or key, encrypted CPM data as decrypted CPM data to be passed to the memory cells 490 for the look-up tables (LUT) 210 of the programmable logic cells (LC) 2014 of its field-programmable-gate-array (FPGA) integrated-circuit (IC) chip 200 or the memory cells 362 of the programmable switch cells 379 of its field-programmable-gate-array (FPGA) integrated-circuit (IC) chip 200. For the fifth scenario, its auxiliary and supporting (AS) integrated-circuit (IC) chip 411 may include a regulating block configured to regulate a voltage of power supply from an input voltage of 12, 5, 3.3 or 2.5 volts to an output voltage of 3.3, 2.5, 1.8, 1.5, 1.35, 1.2, 1.0, 0.75 or 0.5 volts to be delivered to its field-programmable-gate-array (FPGA) integrated-circuit (IC) chip 200.

For another aspect, for each of the package-on-package (POP) assemblies as illustrated in FIGS. 24A, 24B, 25, 31, 32, 40A, 40B, 41A, 41B, 46 and 47, a first one of its chip packages 300 may include the semiconductor integrated-circuit (IC) chip(s) 100 which may be one or a combination of ones selected from an application-specific integrated circuit (ASIC) chip, field-programmable-gate-array (FPGA) integrated-circuit (IC) chip 200 as illustrated in FIG. 9, graphic-processing-unit (GPU) chip, central-processing-unit (CPU) chip, tensor-processing-unit (TPU) chip, neural-processing-unit (NPU) chip and digital-signal-processing (DSP) chip; a second one of its chip packages 300 may include the first or second type of semiconductor chip(s) 100 which may be one or a combination of ones selected from a high bandwidth static-random-access-memory (SRAM) chip, high bandwidth dynamic-random-access-memory (DRAM) chip, and non-volatile memory (NVM) chip such as NAND and/or NOR flash memory chip, high bandwidth resistive-random-access-memory (RRAM) chip, high bandwidth magnetoresistive-random-access-memory (MRAM) chip, auxiliary and supporting (AS) integrated-circuit (IC) chip 411 as illustrated in FIG. 11, or dedicated I/O or dedicated control and I/O chip 265 or 260 as illustrated in FIGS. 12A and 12B. The first one of its chip packages 300 may be an upper one of its chip packages 300 stacked over a lower one of its chip packages 300, i.e., the second one of its chip packages 300; alternatively, the second one of its chip packages 300 may be an upper one of its chip packages 300 stacked over a lower one of its chip packages 300, i.e., the first one of its chip packages 300. In a case, the non-volatile memory (NVM) chip(s), such as NAND and/or NOR flash memory chip(s), high bandwidth resistive-random-access-memory (RRAM) chip(s) or high bandwidth magnetoresistive-random-access-memory (MRAM) chip(s), of the second one of its chip packages 300 may be used to configure programmable logic functions or operations and/or programmable interconnections of the field-programmable-gate-array (FPGA) integrated-circuit (IC) chip(s) 200 of the first one of its chip packages 300. A first data stored in the non-volatile memory chip(s) of the second one of its chip packages 300 may be used for configuring the field-programmable-gate-array (FPGA) integrated-circuit (IC) chip(s) 200 of the first one of its chip packages 300 to perform a logic operation, wherein each of the field-programmable-gate-array (FPGA) integrated-circuit (IC) chip(s) 200 of the first one of its chip packages 300 may comprise, as seen in FIG. 7, a first static-random-access-memory (SRAM) cell 490 configured to store a second data, e.g., one of D0-D3, associated with the first data, and a multiplexer 211 comprising a first set of input points for a first input data set A0 and A1 for the logic operation and a second set of input points for a second input data set D0-D3 for a look-up table (LUT) 210 having a data associated with the second data, wherein the multiplexer 211 is configured to select, in accordance with the first input data set A0 and A1, a first input data from the second input data set D0-D3 for the look-up table (LUT) 210 as an output data Dout for the logic operation. A third data stored in the non-volatile memory chip(s) of the second one of its chip packages 300 may be used for configuring its field-programmable-gate-array (FPGA) integrated-circuit (IC) chip(s) 200 of the first one of its chip packages 300 to perform programmable interconnection, wherein each of the field-programmable-gate-array (FPGA) integrated-circuit (IC) chip(s) 200 of the first one of its chip packages 300 may comprise, as seen in FIG. 8, a second static-random-access-memory (SRAM) cell 362 configured to store a fourth data associated with the third data, a cross-point switch 379 having an input point for a second input data associated with the fourth data, and four programmable interconnects 361 coupling to the cross-point switch 379, wherein the cross-point switch 379 is configured to control, in accordance with the second input data, connection from one of the four programmable interconnects 361 to the other one, two or three of the four programmable interconnects 361. Further, the non-volatile memory (NVM) chip(s), such as NAND and/or NOR flash memory chip(s), high bandwidth resistive-random-access-memory (RRAM) chip(s) or high bandwidth magnetoresistive-random-access-memory (MRAM) chip(s), of the second one of its chip packages 300 may include multiple first small I/O circuits coupling to multiple second small I/O circuits of the field-programmable-gate-array (FPGA) integrated-circuit (IC) chip(s) 200 of the first one of its chip packages 300 for data transmission therebetween with a data bit width of equal to or greater than 64, 128, 256, 512, 1024, 2048, 4096, 8K, or 16K, wherein each of the first and second small I/O circuits may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively each of the first and second small input/output (I/O) circuits may have an I/O power efficiency smaller than 0.5 pico-Joules per bit, per switch or per voltage swing, or between 0.01 and 0.5 pico-Joules per bit, per switch or per voltage swing. Further, the dedicated I/O or dedicated control and I/O chip 265 or 260 of the second one of its chip packages 300 may include multiple third small I/O circuits coupling to multiple fourth small I/O circuits of the field-programmable-gate-array (FPGA) integrated-circuit (IC) chip(s) 200 of the first one of its chip packages 300, wherein each of the third and fourth small I/O circuits may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF; alternatively each of the small input/output (I/O) circuits of its dedicated I/O or dedicated control and I/O chip 265 or 260 and field-programmable-gate-array (FPGA) integrated-circuit (IC) chip 200 may have an I/O power efficiency smaller than 0.5 pico-Joules per bit, per switch or per voltage swing, or between 0.01 and 0.5 pico-Joules per bit, per switch or per voltage swing; further, its dedicated I/O or dedicated control and I/O chip 265 or 260 may include multiple large input/output (I/O) circuits each coupling between one of the third small I/O circuits and one of the metal bumps, pillars or pads 570 of the second one of its chip packages 300, wherein each of the large input/output (I/O) circuits may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits may have an I/O power efficiency greater than 3, 5 or 10 pico-Joules per bit, per switch or per voltage swing. Further, the auxiliary and supporting (AS) integrated-circuit (IC) chip 411 of the second one of its chip packages 300 may include multiple non-volatile memory cells configured to store a password or key and a cryptography block or circuit configured (1) to encrypt, in accordance with the password or key, CPM data from the memory cells 490 for the look-up tables (LUT) 210 of the programmable logic cells (LC) 2014 of the field-programmable-gate-array (FPGA) integrated-circuit (IC) chip 200 of the first one of its chip packages 300 or the memory cells 362 of the programmable switch cells 379 of the field-programmable-gate-array (FPGA) integrated-circuit (IC) chip 200 of the first one of its chip packages 300 as encrypted CPM data, and (2) to decrypt, in accordance with the password or key, encrypted CPM data as decrypted CPM data to be passed to the memory cells 490 for the look-up tables (LUT) 210 of the programmable logic cells (LC) 2014 of the field-programmable-gate-array (FPGA) integrated-circuit (IC) chip 200 of the first one of its chip packages 300 or the memory cells 362 of the programmable switch cells 379 of the field-programmable-gate-array (FPGA) integrated-circuit (IC) chip 200 of the first one of its chip packages 300. Further, the auxiliary and supporting (AS) integrated-circuit (IC) chip 411 of the second one of its chip packages 300 may include a regulating block configured to regulate a voltage of power supply from an input voltage of 12, 5, 3.3 or 2.5 volts to an output voltage of 3.3, 2.5, 1.8, 1.5, 1.35, 1.2, 1.0, 0.75 or 0.5 volts to be delivered to the field-programmable-gate-array (FPGA) integrated-circuit (IC) chip 200 of the first one of its chip packages 300.

Figure 49:
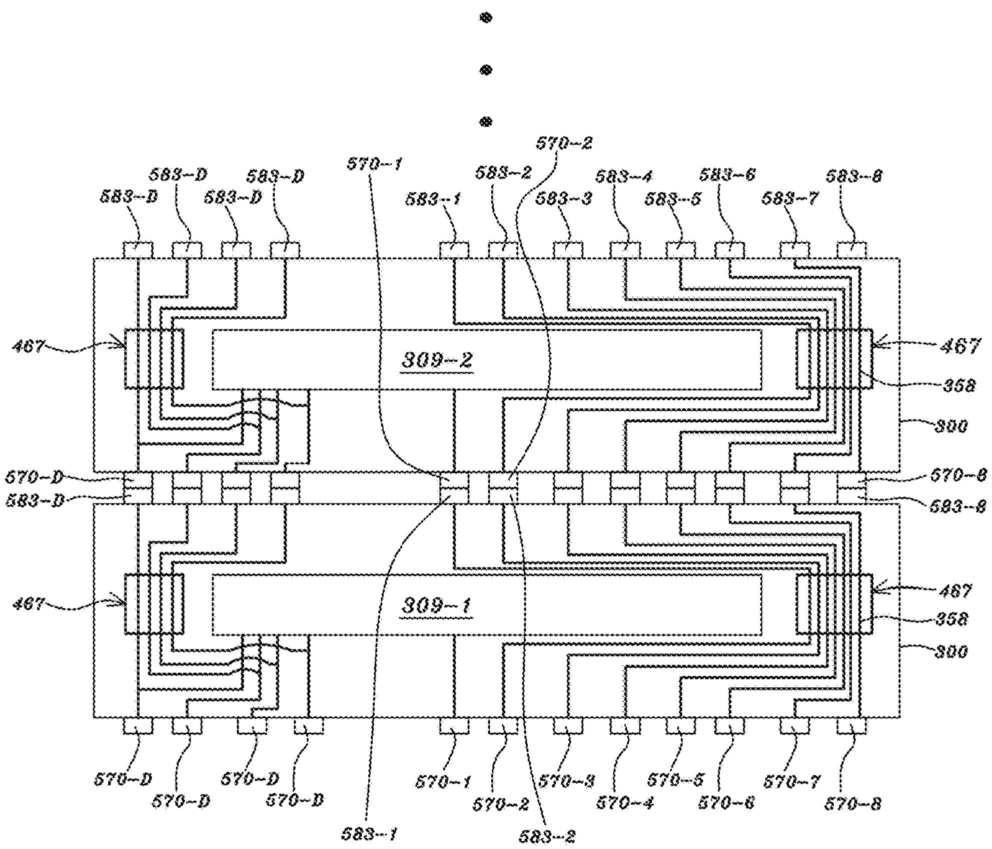
FIG. 49 is a circuit diagram showing a method for controlling each semiconductor integrated-circuit (IC) chip of a package-on-package assembly in accordance with an embodiment of the present application.

Method for Controlling Semiconductor Integrated-Circuit (IC) Chip of Each of Chip Packages of Package-on-package (POP) Assembly FIG. 49 is a circuit diagram showing a method for controlling each semiconductor integrated-circuit (IC) chip of a package-on-package assembly in accordance with an embodiment of the present application. Referring to FIG. 49, for each of the package-on-package (POP) assemblies as illustrated in FIGS. 24A, 24B, 25, 31, 32, 40A, 40B, 41A, 41B, 46 and 47, one of the semiconductor integrated-circuit (IC) chips 100 of each of its chip packages 300 may be a memory integrated-circuit (IC) chip 309, such as non-volatile NAND chip, non-volatile NOR flash chip, non-volatile magnetoresistive random-access-memory (MRAM) integrated-circuit (IC) chip, non-volatile resistive random access memory (RRAM) integrated-circuit (IC) chip, non-volatile phase-change random-access-memory (PCM) integrated-circuit (IC) chip, non-volatile ferroelectric-random-access-memory (FRAM) integrated-circuit (IC) chip or high bandwidth dynamic random-access-memory (DRAM) or static random-access-memory (SRAM) memory (HBM) chip. In this case, said each of the package-on-package (POP) assemblies may include multiple of the chip packages 300 having the number of 2, 4, 8, 16 or 32, for example, vertically stacked together. The memory integrated-circuit (IC) chips 309 of its chip packages 300 may be defined, from bottom to top, with reference numbers 309-1, 309-2 . . . and so on. The metal bumps, pillars or pads 570 of said each of its chip packages 300 may include a first metal bump, pillar or pad 570-1 for controlling enabling of the memory integrated-circuit (IC) chip 309, wherein the first metal bump, pillar or pad 570-1 of each of its chip packages 300 may be vertically aligned with the first metal bump, pillar pad 570-1 of each of the others of its chip packages 300. The metal pads 583 of each of its chip packages 300 may include a first metal pad 583-1 vertically aligned with the first metal bump, pillar pad 570-1 thereof, wherein the first metal bump, pillar pad 570-1 of an upper one of its chip packages 300 may be bonded to the first metal pad 583-1 of a lower one of its chip packages 300. The metal bumps, pillars or pads 570 of each of its chip packages 300 may include a second metal bump, pillar or pad 570-2, adjacent to the first metal bump, pillar or pad 570-1, coupling to the first metal pad 583-1 thereof through one of the vertical through vias (VTVs) 358 of a right one of the vertical-through-via (VTV) connectors 467 thereof, wherein the second metal bump, pillar or pad 570-2 of each of its chip packages 300 may be vertically aligned with the second metal bump, pillar pad 570-2 of each of the others of its chip packages 300. The metal pads 583 of each of its chip packages 300 may include a second metal pad 583-2 vertically aligned with the second metal bump, pillar pad 570-2 thereof, wherein the second metal bump, pillar pad 570-2 of an upper one of its chip packages 300 may be bonded to the second metal pad 583-2 of a lower one of its chip packages 300. Thereby, the first metal bump, pillar or pad 570-1 of the bottommost one of its chip packages 300 may couple to the memory integrated-circuit (IC) chips 309-1 of the bottommost one of its chip packages 300 for controlling enabling of the memory integrated-circuit (IC) chip 309-1; the second metal bump, pillar or pad 570-2 of the bottommost one of its chip packages 300 may couple to the memory integrated-circuit (IC) chip 309-2 of the second bottommost one of its chip packages 300 through, in sequence, the first metal pad 583-1 of the bottommost one of its chip packages 300 and the first metal bump, pillar or pad 570-1 of the second bottommost one of its chip packages 300 for controlling enabling of the memory integrated-circuit (IC) chip 309-2. The second through eighth metal bumps, pillars or pads 570-2, 570-3, 570-4, 570-5, 570-6, 570-7 and 570-8 of each of its chip packages 300 may couple to the first through seventh metal pads 583-1, 583-2, 583-3, 583-4, 583-5, 583-6 and 583-7 thereof respectively, not vertically aligned with the second through eighth metal bumps, pillars or pads 570-2, 570-3, 570-4, 570-5, 570-6, 570-7 and 570-8 respectively, and may be vertically aligned with the second through eighth metal pads 583-2, 583-3, 583-4, 583-5, 583-6, 583-7 and 583-8 respectively. Thus, the third through eighth metal bumps, pillars or pads 570-3, 570-4, 570-5, 570-6, 570-7 and 570-8 of the bottommost one of its chip packages 300 may couple to the memory integrated-circuit (IC) chips 309-3, 309-4, 309-5, 309-6, 309-7 and 309-8 for controlling enabling of the memory integrated-circuit (IC) chips 309-3, 309-4, 309-5, 309-6, 309-7 and 309-8, respectively.

Referring to FIG. 49, the metal bumps, pillars or pads 570 of said each of its chip packages 300 may include a group of metal bumps, pillars or pads 570-D each coupling to one of a group of metal pads 583-D of said each of its chip packages 300 through one of the vertical through vias (VTVs) 358 of a left one of the vertical-through-via (VTV) connectors 467 of said each of its chip packages 300, vertically aligned with said one of the group of metal pads 583-D and coupling to the memory integrated-circuit (IC) chip 309-1, 309-2, 309-3, 309-4, 309-5, 309-6, 309-7 or 309-8 of said each of its chip packages 300 for transmitting data to/from the memory integrated-circuit (IC) chip 309-1, 309-2, 309-3, 309-4, 309-5, 309-6, 309-7 or 309-8 of said each of its chip packages 300. Each of the group of metal bumps, pillars or pads 570-D of an upper one of its chip packages 300 may be bonded to one of the group of metal pad 583-D of a lower one of its chip packages 300. Thereby, each of the group of metal bumps, pillars or pads 570-D of the bottommost one of its chip packages 300 may couple to the memory integrated-circuit (IC) chip 309-1, 309-2, 309-3, 309-4, 309-5, 309-6, 309-7 or 309-8 of each of its chip packages 300 for transmitting data to/from the memory integrated-circuit (IC) chip 309-1, 309-2, 309-3, 309-4, 309-5, 309-6, 309-7 or 309-8 of each of its chip packages 300.

Accordingly, referring to FIG. 49, for each of the package-on-package (POP) assemblies as illustrated in FIGS. 24A, 24B, 25, 31, 32, 40A, 40B, 41A, 41B, 46 and 47, the memory integrated-circuit (IC) chip 309-1, 309-2, 309-3, 309-4, 309-5, 309-6, 309-7 or 309-8 of each of its chip packages 300 may be enabled by one of the first through eighth metal bumps, pillars or pads 570-1, 570-2, 570-3, 570-4, 570-5, 570-6, 570-7 and 570-8 of the bottommost one of its chip packages 300 and may be accessed through each of the group of metal bumps, pillars or pads 570-D.

Figure 50:
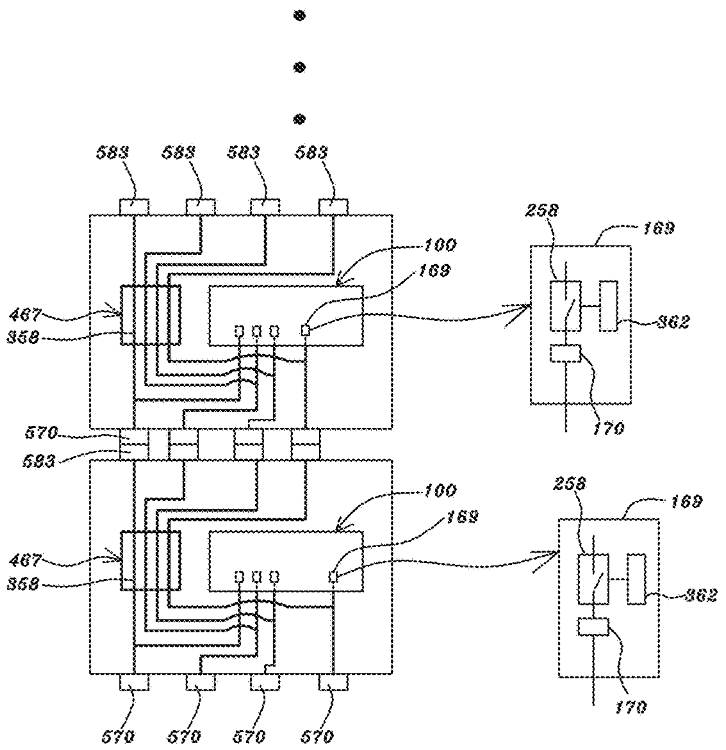
FIG. 50 is a circuit diagram showing a method for controlling each semiconductor integrated-circuit (IC) chip of a package-on-package assembly in accordance with an embodiment of the present application.
Figure 51:
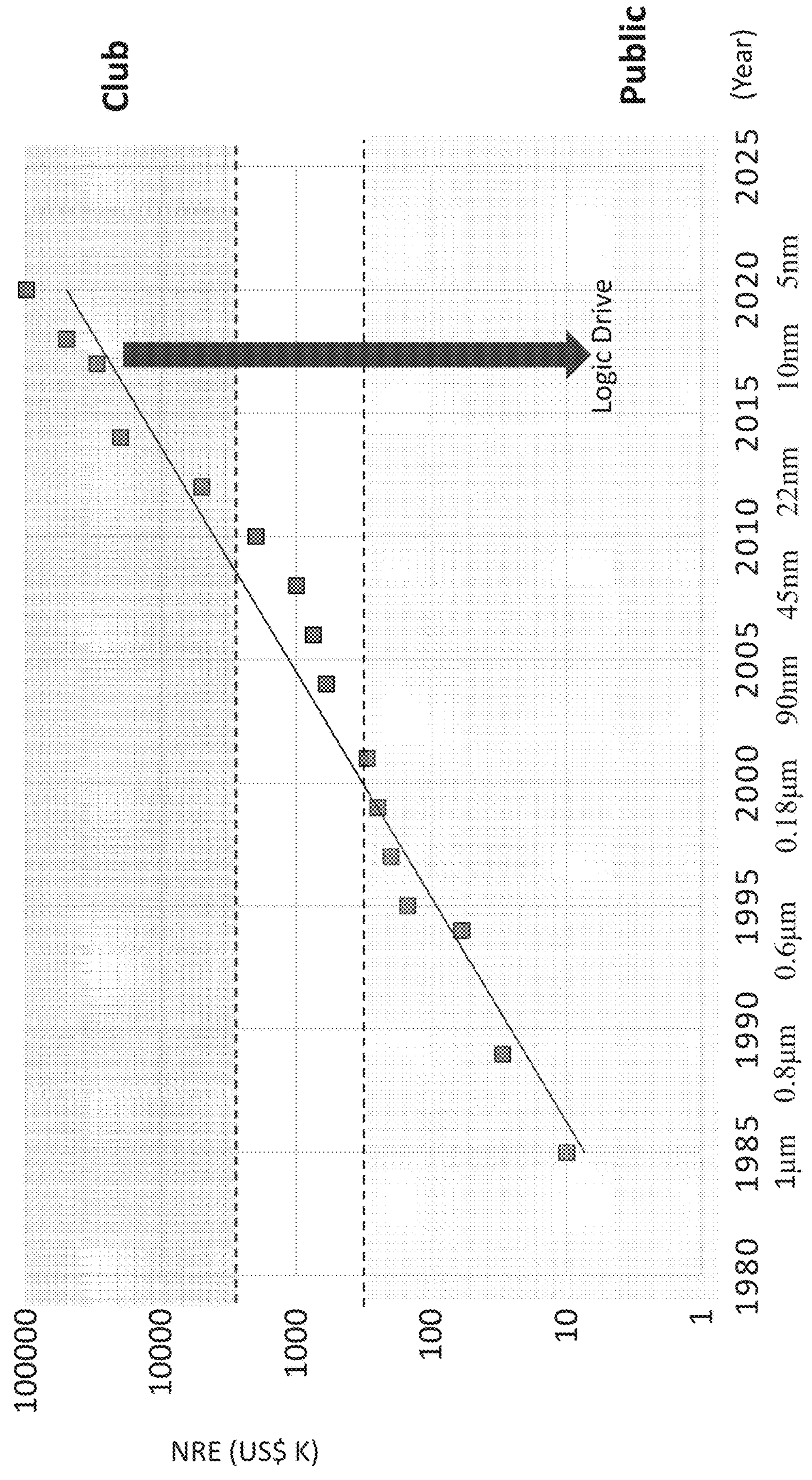
FIG. 51 is a chart showing a trend of relationship between non-recurring engineering (NRE) costs and technology nodes.

Alternatively, FIG. 50 is a circuit diagram showing a method for controlling each semiconductor integrated-circuit (IC) chip of a package-on-package assembly in accordance with an embodiment of the present application. Referring to FIG. 50, for each of the package-on-package (POP) assemblies as illustrated in FIGS. 24A, 24B, 25, 31, 32, 40A, 40B, 41A, 41B, 46 and 47, each of the semiconductor integrated-circuit (IC) chips 100 of each of its chip packages 300 may include multiple switchable input/output (I/O) blocks 169 therein each having an input/output circuit 170 coupling to one of the metal bumps, pillars or pads 570 of said each of its chip packages 300 and to one of the metal pads 583 of said each of its chip packages 300, wherein said one of the metal bumps, pillars or pads 570 may be vertically aligned with said one of the metal pads 583. Each of the switchable input/output (I/O) blocks 169 may include a memory cell 362 configured to store a programming code therein and a programmable switch 258 configured to control, in accordance with data associated with the programming code stored in the memory cell 362, coupling between its input/output circuit 170 and an internal circuit of said each of the semiconductor integrated-circuit (IC) chip. The memory cell 362 may be of a first type, i.e., volatile memory cell such as static random-access memory (SRAM) cell, may be associated with data saved or stored in a non-volatile memory cell, such as ferroelectric random-access-memory (FRAM) cell, magnetoresistive random access memory (MRAM) cell, resistive random access memory (RRAM) cell, anti-fuse or e-fuse. Alternatively, the memory cell 362 may be of a second type, i.e., non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor. Thereby, for said each of the switchable input/output (I/O) blocks 169, its programmable switch 258 may be programmed by its memory cell 362 to control data on said one of the metal bumps, pillars or pads 570 and said one of the metal pads 583 to be transmitted to the internal circuit through its I/O circuit 170.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A chip package comprising:

a first interconnection scheme comprising a first interconnection metal layer, a first insulating dielectric layer under the first interconnection metal layer and at a bottom of the first interconnection scheme and a bottom of the chip package and a second insulating dielectric layer over the first interconnection metal layer and the first insulating dielectric layer;

a plurality of first metal bumps at the bottom of the chip package and under and in contact with the first interconnection scheme;

a first interconnection bridge over the first interconnection scheme, wherein the first interconnection bridge comprises:

a first silicon substrate, a second interconnection scheme over the first silicon substrate, wherein the second interconnection scheme comprises a third insulating dielectric layer over the first silicon substrate, a fourth insulating dielectric layer on a top surface of the third insulating dielectric layer, a second interconnection metal layer over the first silicon substrate, in a first opening in the fourth insulating dielectric layer, extending horizontally on the top surface of the third insulating dielectric layer and downwards into a second opening in the third insulating dielectric layer, a third interconnection metal layer over the second interconnection metal layer, a fifth insulating dielectric layer between the second and third interconnection metal layers and a sixth insulating dielectric layer on the third interconnection metal layer, wherein the second interconnection metal layer comprises a first copper layer having a sidewall over the top surface of the third insulating dielectric layer and further comprises a first adhesion metal layer at a bottom of the first copper layer, at the sidewall of the first copper layer, on the top surface of the third insulating dielectric layer, vertically between the first copper layer and the top surface of the third insulating dielectric layer and horizontally between the sidewall of the first copper layer and the fourth insulating dielectric layer, a first metal contact at a top of the second interconnection scheme and a top of the first interconnection bridge, wherein the first metal contact extends on a top surface of the sixth insulating dielectric layer and downwards into a third opening in the sixth insulating dielectric layer and is in contact with the third interconnection metal layer, a second metal contact at the top of the second interconnection scheme and the top of the first interconnection bridge and coupling to the first metal contact through the second interconnection scheme, wherein the second metal contact extends on the top surface of the sixth insulating dielectric layer and downwards into a fourth opening in the sixth insulating dielectric layer and is in contact with the third interconnection metal layer, wherein each of the first and second metal contacts comprises a second copper layer at the top of the first interconnection bridge, and a first polymer layer at the top of the second interconnection scheme and in contact with a sidewall of each of the first and second metal contacts;

a first electronic component over the first interconnection scheme and at a same first horizontal level as the first interconnection bridge, wherein the first electronic component comprises a second silicon substrate and a first decoupling capacitor comprising a first electrode having a portion vertically in the second silicon substrate;

a metal interconnect in a extending vertically for vertical interconnection over the first interconnection scheme, coupling to the first interconnection scheme and at the same first horizontal level as the first interconnection bridge and the first electronic component, wherein the metal interconnect is in a space beyond and extending horizontally from a sidewall of the first interconnection bridge;

a second polymer layer in the space and on the first interconnection scheme, wherein the second polymer layer is at the same first horizontal level as the first interconnection bridge, the first electronic component and the metal interconnect, wherein the second polymer layer contacts a sidewall of the first interconnection bridge and a sidewall of the first electronic component and has a top surface coplanar with a top surface of the first polymer layer of the first interconnection bridge;

a first integrated-circuit (IC) chip over the first interconnection bridge and the second polymer layer and extending horizontally across over a first edge of the first interconnection bridge, wherein the first integrated-circuit (IC) chip comprises a second metal bump at a bottom of the first integrated-circuit (IC) chip and coupling to the first metal contact of the first interconnection bridge, wherein the second metal bump comprises tin, and wherein the first integrated-circuit (IC) chip has a first height from a bottom of the second metal bump to a top surface of the first integrated-circuit (IC) chip; and a first multichip package over the first interconnection bridge and the second polymer layer, extending horizontally across over a second edge of the first interconnection bridge and at a same second horizontal level as the first integrated-circuit (IC) chip, wherein the second edge of the first interconnection bridge is horizontally opposite to the first edge of the first interconnection bridge, wherein the first multichip package comprises:

a second integrated-circuit (IC) chip comprising a third silicon substrate and a first through silicon via (TSV) vertically in the third silicon substrate, wherein the second integrated-circuit (IC) chip is a logic chip, a plurality of third integrated-circuit (IC) chips stacked over the second integrated-circuit (IC) chip, wherein a bottommost one of the plurality of third integrated-circuit (IC) chips is bonded to the second integrated-circuit (IC) chip and wherein the plurality of third integrated-circuit (IC) chips comprise a plurality of memory integrated-circuit (IC) chips and are bonded together as a stack, wherein the bottommost one of the plurality of third integrated-circuit (IC) chips comprises a fourth silicon substrate, a first transistor at a bottom of the fourth silicon substrate and a third interconnection scheme under the fourth silicon substrate, a third polymer layer vertically over the second integrated-circuit (IC) chip and at a same third horizontal level as the plurality of third integrated-circuit (IC) chips, wherein the third polymer layer has a sidewall vertically coplanar with a sidewall of the second integrated-circuit (IC) chip, and a third metal bump at a bottom of the first multichip package and coupling to the second metal contact of the first interconnection bridge, wherein the third metal bump of the first multichip package comprises tin and couples to the second metal bump of the first integrated-circuit (IC) chip through, in sequence, the second metal contact, the second interconnection scheme and the first metal contact, wherein the first multichip package has a second height from a bottom of the third metal bump to a top surface of the first multichip package, wherein the second height of the first multichip package is substantially equal to the first height of the first integrated-circuit (IC) chip, wherein the top surface of the first multichip package is coplanar with the top surface of the first integrated-circuit (IC) chip.

2. The chip package of claim 1 further comprising a fifth silicon substrate in the space and over the first interconnection scheme, wherein the metal interconnect is vertically in the fifth silicon substrate.

3. The chip package of claim 1, wherein the metal interconnect comprises copper.

4. The chip package of claim 1, wherein the first integrated-circuit (IC) chip is a logic chip.

5. The chip package of claim 1, wherein the first integrated-circuit (IC) chip is a graphic processing unit (GPU) integrated-circuit (IC) chip.

6. The chip package of claim 1, wherein the plurality of memory integrated-circuit (IC) chips comprise a plurality of dynamic random-access-memory (DRAM) chips bonded together.

7. The chip package of claim 1, wherein the first interconnection metal layer comprises a metal line having a thickness between 1 and 10 micrometers.

8. The chip package of claim 1, wherein the first decoupling capacitor further comprises a second electrode having a portion vertically in the second silicon substrate and a dielectric layer having a portion between the portion of the first electrode and the portion of the second electrode and in contact with the portion of the first electrode and the portion of the second electrode.

9. The chip package of claim 8, wherein the dielectric layer of the first decoupling capacitor comprises an oxide material.

10. The chip package of claim 8, wherein the portion of the first electrode and the portion of the second electrode extend in a vertical direction perpendicular to a top surface of the second silicon substrate.

11. The chip package of claim 8, wherein the first electronic component is under the first integrated-circuit (IC) chip and comprises a plurality of third metal contacts at a top of the first electronic component, wherein two of the plurality of third metal contacts couple to the first and second electrodes of the first decoupling capacitor respectively and two of the plurality of third metal contacts couple to the first integrated-circuit (IC) chip.

12. The chip package of claim 11, wherein the first electronic component further comprises a plurality of second through silicon vias (TSVs) vertically in the second silicon substrate, wherein said two of the plurality of third metal contacts coupling to the first and second electrodes of the first decoupling capacitor respectively further couple to two of the plurality of second through silicon vias (TSVs) respectively, and wherein said two of the plurality of third metal contacts coupling to the first integrated-circuit (IC) chip further couple to the first interconnection scheme through two of the plurality of second through silicon vias (TSVs) respectively.

13. The chip package of claim 8, wherein the first electronic component is under the first multichip package and comprises a plurality of third metal contacts at a top of the first electronic component, wherein two of the plurality of third metal contacts couple to the first and second electrodes of the first decoupling capacitor respectively and two of the plurality of third metal contacts couple to the first multichip package.

14. The chip package of claim 13, wherein the first electronic component further comprises a plurality of second through silicon vias (TSVs) vertically in the second silicon substrate, wherein said two of the plurality of third metal contacts coupling to the first and second electrodes of the first decoupling capacitor respectively further couple to two of the plurality of second through silicon vias (TSVs) respectively, and wherein said two of the plurality of third metal contacts coupling to the first multichip package further couple to the first interconnection scheme through two of the plurality of second through silicon vias (TSVs) respectively.

15. The chip package of claim 1, wherein the first electronic component further comprises a second through silicon via (TSV) vertically in the second silicon substrate and coupling to the first electrode of the first decoupling capacitor.

16. The chip package of claim 1, wherein the portion of the first electrode has a depth between 5 and 30 micrometers in the second silicon substrate.

17. The chip package of claim 1, wherein the first electrode of the first decoupling capacitor comprises titanium.

18. The chip package of claim 1, wherein the first electronic component further comprises a third metal contact at a top of the first electronic component and a fourth polymer layer at the top of the first electronic component and in contact with a sidewall of the third metal contact, wherein the second polymer layer has a top surface coplanar with a top surface of the fourth polymer layer of the first electronic component, wherein the third metal contact comprises a third copper layer at the top of the first electronic component.

19. The chip package of claim 1, wherein the first electrode of the first decoupling capacitor couples to a voltage (Vss) of ground reference.

20. The chip package of claim 1 further comprising a second electronic component over the first interconnection scheme and at the same first horizontal level as the first interconnection bridge, the first electronic component, the second polymer layer and the metal interconnect, wherein the second electronic component comprises a fifth silicon substrate and a second decoupling capacitor comprising a second electrode having a portion vertically in the fifth silicon substrate, wherein the first electronic component is vertically under and couples to the first integrated-circuit (IC) chip and the second electronic component is vertically under and couples to the first multichip package.

21. The chip package of claim 1, wherein the metal interconnect comprises a copper interconnect extending in a vertical direction and has a vertical dimension between 30 and 200 micrometers.

22. The chip package of claim 1, wherein the first interconnection scheme further comprises a fourth interconnection metal layer under the first interconnection metal layer and a seventh insulating dielectric layer between the first and fourth interconnection metal layers, wherein the first insulating dielectric layer is under the fourth interconnection metal layer.

23. The chip package of claim 1, wherein the second insulating dielectric layer is at a top of the first interconnection scheme and under and in contact with the first interconnection bridge, the first electronic component and the second polymer layer.

24. The chip package of claim 1, wherein the first interconnection metal layer extends horizontally on a bottom surface of the second insulating dielectric layer and upwards into a fifth opening in the second insulating dielectric layer, wherein the first interconnection metal layer comprises a third copper layer having a sidewall under the bottom surface of the second insulating dielectric layer and further comprises a second adhesion metal layer at a top of the third copper layer, on the bottom surface of the second insulating dielectric layer and vertically between the third copper layer and the bottom surface of the second insulating dielectric layer, wherein the second adhesion metal layer is not at the sidewall of the third copper layer.

25. The chip package of claim 24, wherein the second adhesion metal layer of the first interconnection metal layer comprises titanium.

26. The chip package of claim 1, wherein each of the plurality of first metal bumps has an upper portion in a fifth opening in the first insulating dielectric layer and coupling to the first interconnection metal layer of the first interconnection scheme and a lower portion under the fifth opening in the first insulating dielectric layer and under, in contact with and protruding from a bottom surface of the first insulating dielectric layer, wherein said each of the plurality of first metal bumps comprises a third copper layer, a second adhesion metal layer at a top of the third copper layer and a tin-containing cap under the third copper layer, wherein the second adhesion metal layer has a material different from the third copper layer.

27. The chip package of claim 1, wherein the first interconnection bridge has a bottom surface coplanar with a bottom surface of the first electronic component and a bottom surface of the second polymer layer, wherein the first interconnection scheme is in contact with the bottom surface of the first interconnection bridge, the bottom surface of the first electronic component and the bottom surface of the second polymer layer and extends horizontally across under an edge of the first electronic component and the first and second edges of the first interconnection bridge.

28. The chip package of claim 1, wherein the third interconnection metal layer of the second interconnection scheme of the first interconnection bridge comprises a conductive metal layer and a second adhesion metal layer at a bottom of the conductive metal layer and not at a sidewall of the conductive metal layer.

29. The chip package of claim 1, wherein the bottommost one of the plurality of third integrated-circuit (IC) chips further comprises a fourth metal bump at a bottom of the bottommost one of the plurality of third integrated-circuit (IC) chips, wherein the fourth metal bump is bonded to the second integrated-circuit (IC) chip, wherein the fourth metal bump comprises a third copper layer and a tin-containing layer under the third copper layer.

30. The chip package of claim 29, wherein the second integrated-circuit (IC) chip further comprises a fifth metal bump at a top of the second integrated-circuit (IC) chip and bonded to the fourth metal bump, wherein the fifth metal bump comprises a fourth copper layer.

31. The chip package of claim 1, wherein the second integrated-circuit (IC) chip further comprises a first insulating bonding layer at its top and a first bonding pad in a fifth opening in the first insulating bonding layer, wherein the first bonding pad comprises a third copper layer in the fifth opening in the first insulating bonding layer and the first insulating bonding layer comprises silicon and oxygen, and wherein the bottommost one of the plurality of third integrated-circuit (IC) chips further comprises a second insulating bonding layer under the third interconnection scheme of the bottommost one of the plurality of third integrated-circuit (IC) chips, at a bottom of the bottommost one of the plurality of third integrated-circuit (IC) chips and having a bottom surface bonded to and in contact with a top surface of the first insulating bonding layer, wherein the second insulating bonding layer comprises silicon and oxygen, and wherein the bottommost one of the plurality of third integrated-circuit (IC) chips further comprises a second bonding pad in a sixth opening in the second insulating bonding layer, wherein the second bonding pad comprises a fourth copper layer in the sixth opening in the second insulating bonding layer and having a bottom surface bonded to and in contact with a top surface of the third copper layer of the first bonding pad.

32. The chip package of claim 1, wherein the third polymer layer comprises a molding compound.

33. The chip package of claim 1 further comprising an underfill under the first integrated-circuit (IC) chip and in contact with the second metal bump.

34. The chip package of claim 1 further comprising an underfill under the first multichip package and in contact with the third metal bump.

35. The chip package of claim 1, wherein the first integrated-circuit (IC) chip is a graphic processing unit (GPU) integrated-circuit (IC) chip and the plurality of third integrated-circuit (IC) chips comprise a plurality of dynamic random-access-memory (DRAM) chips bonded together.

36. The chip package of claim 1, wherein the first interconnection scheme, the first interconnection bridge, the first electronic component, the metal interconnect and the second polymer layer are provided by a circuit substrate of the chip package, wherein the first integrated-circuit (IC) chip and the first multichip package are over and bonded to the circuit substrate, wherein the chip package further comprises a second multichip package bonded to the circuit substrate and comprising a fourth integrated-circuit (IC) chip and a fifth integrated-circuit (IC) chip over and bonded to the fourth integrated-circuit (IC) chip.

37. The chip package of claim 36, wherein the fourth integrated-circuit (IC) chip comprises a first insulating bonding layer at its top and a first bonding pad in a fifth opening in the first insulating bonding layer, wherein the first bonding pad comprises a third copper layer in the fifth opening in the first insulating bonding layer and the first insulating bonding layer comprises silicon and oxygen, and wherein the fifth integrated-circuit (IC) chip comprises a second insulating bonding layer at its bottom, wherein the second insulating bonding layer comprises silicon and oxygen and has a bottom surface bonded to and in contact with a top surface of the first insulating bonding layer, and wherein the fifth integrated-circuit (IC) chip comprises a second bonding pad in a sixth opening in the second insulating bonding layer, wherein the second bonding pad comprises a fourth copper layer in the sixth opening in the second insulating bonding layer and having a bottom surface bonded to and in contact with a top surface of the third copper layer of the first bonding pad.

38. The chip package of claim 36, wherein the circuit substrate further comprises a second interconnection bridge therein over the first interconnection scheme, wherein the first interconnection scheme extends horizontally across under the first and second edges of the first interconnection bridge, an edge of the second interconnection bridge and an edge of the first electronic component, wherein the second polymer layer surrounds a plurality of sidewalls of each of the first and second interconnection bridges and the first electronic component.

39. The chip package of claim 1, wherein the bottommost one of the plurality of third integrated-circuit (IC) chips comprises a second through silicon via (TSV) vertically in the fourth silicon substrate.

40. The chip package of claim 1, wherein the plurality of memory integrated-circuit (IC) chips comprise four or more memory integrated-circuit (IC) chips bonded together.

41. The chip package of claim 1, wherein the plurality of memory integrated-circuit (IC) chips comprise eight or more memory integrated-circuit (IC) chips bonded together.

42. The chip package of claim 1 further comprising a fourth polymer layer over the first interconnection bridge and the second polymer layer and at the same second horizontal level as the first integrated-circuit (IC) chip and first multichip package, wherein the fourth polymer layer has a top surface coplanar with the top surface of the first integrated-circuit (IC) chip and the top surface of the first multichip package.

43. The chip package of claim 42, wherein the fourth polymer layer comprises a molding compound.

44. The chip package of claim 1, wherein the second polymer layer comprises a molding compound.

* * * * *